(12) United States Patent
Chen et al.

(10) Patent No.: US 12,525,558 B2
(45) Date of Patent: *Jan. 13, 2026

(54) THREE-DIMENSIONAL MEMORY DEVICES AND METHODS FOR FORMING THE SAME

(71) Applicant: YANGTZE MEMORY TECHNOLOGIES CO., LTD., Wuhan (CN)

(72) Inventors: Liang Chen, Wuhan (CN); Wei Liu, Wuhan (CN); Yanhong Wang, Wuhan (CN); Zhiliang Xia, Wuhan (CN); Wenxi Zhou, Wuhan (CN); Kun Zhang, Wuhan (CN); Yuancheng Yang, Wuhan (CN); Shiqi Huang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 761 days.

This patent is subject to a terminal disclaimer.

(21) Appl. No.: 17/480,897

(22) Filed: Sep. 21, 2021

(65) Prior Publication Data
US 2023/0005857 A1 Jan. 5, 2023

Related U.S. Application Data

(63) Continuation of application No. PCT/CN2021/103764, filed on Jun. 30, 2021.

(51) Int. Cl.
*H01L 23/00* (2006.01)
*H01L 25/00* (2006.01)
(Continued)

(52) U.S. Cl.
CPC .............. *H01L 24/08* (2013.01); *H01L 24/80* (2013.01); *H01L 25/0657* (2013.01);
(Continued)

(58) Field of Classification Search
CPC ..... H01L 24/08; H01L 25/0657; H01L 25/18; H01L 2224/08145; H01L 2224/80895;
(Continued)

(56) References Cited

U.S. PATENT DOCUMENTS 6,306,713 B1  10/2001  Hu et al.
10,283,493 B1  5/2019  Nishida
(Continued)

FOREIGN PATENT DOCUMENTS

CN  102770940 A  11/2012
CN  103871837 A  6/2014
(Continued)

OTHER PUBLICATIONS

International Search Report issued in corresponding International Application No. PCT/CN2021/103710, mailed Mar. 30, 2022, 4 pages.
(Continued)

*Primary Examiner* — Eugene Lee
(74) *Attorney, Agent, or Firm* — BAYES PLLC

(57) ABSTRACT

In certain aspects, a three-dimensional (3D) memory device includes a first semiconductor structure, a second semiconductor structure, a third semiconductor structure, a first bonding interface between the first semiconductor structure and the second semiconductor structure, and a second bonding interface between the second semiconductor structure and the third semiconductor structure. The first semiconductor structure includes an array of NAND memory strings and a first semiconductor layer in contact with sources of the array of NAND memory strings. The second semiconductor structure includes a first peripheral circuit of the array of NAND memory strings including a first transistor, and a second semiconductor layer in contact with the first transistor. A third semiconductor structure includes a second
(Continued)

peripheral circuit of the array of NAND memory strings including a second transistor, and a third semiconductor layer in contact with the second transistor. The first peripheral circuit is between the first bonding interface and the second semiconductor layer. The third semiconductor layer is between the second peripheral circuit and the second bonding interface.

20 Claims, 112 Drawing Sheets

(51) Int. Cl.
  *H01L 25/065* (2023.01)
  *H01L 25/18* (2023.01)
(52) U.S. Cl.
  CPC .............. *H01L 25/18* (2013.01); *H01L 25/50* (2013.01); *H01L 2224/08145* (2013.01); *H01L 2224/80895* (2013.01); *H01L 2224/80896* (2013.01); *H01L 2924/1431* (2013.01); *H01L 2924/14511* (2013.01)
(58) Field of Classification Search
  CPC ... H01L 2224/80896; H01L 2924/1431; H01L 2924/14511
  See application file for complete search history.

(56) References Cited

U.S. PATENT DOCUMENTS

| | | | |
|---|---|---|---|
| 10,354,980 B1* | 7/2019 | Mushiga | H01L 21/76898 |
| 10,355,100 B1 | 7/2019 | Ueda et al. | |
| 10,600,781 B1* | 3/2020 | Xiao | G11C 5/06 |
| 10,665,580 B1 | 5/2020 | Hosoda et al. | |
| 11,031,377 B2* | 6/2021 | Liu | H01L 24/80 |
| 11,527,545 B2 | 12/2022 | Fulford et al. | |
| 11,569,215 B2 | 1/2023 | Kim et al. | |
| 11,600,609 B2 | 3/2023 | Sung et al. | |
| 11,929,119 B2* | 3/2024 | Chen | H10B 43/35 |
| 12,057,421 B2* | 8/2024 | Ahn | H01L 25/18 |
| 2008/0153200 A1 | 6/2008 | Sitaram | |
| 2010/0264423 A1 | 10/2010 | Wood et al. | |
| 2011/0143506 A1* | 6/2011 | Lee | H01L 23/481 |
| | | | 438/238 |
| 2014/0175637 A1 | 6/2014 | Stuber et al. | |
| 2015/0129878 A1 | 5/2015 | Shin et al. | |
| 2015/0160550 A1 | 6/2015 | Kim et al. | |
| 2017/0179146 A1 | 6/2017 | Park et al. | |
| 2018/0175034 A1 | 6/2018 | Goktepeli et al. | |
| 2018/0204820 A1 | 7/2018 | Zhai et al. | |
| 2018/0261623 A1* | 9/2018 | Higashi | H10B 43/50 |
| 2018/0308559 A1 | 10/2018 | Kim et al. | |
| 2018/0358371 A1* | 12/2018 | Hwang | H10B 43/40 |
| 2019/0043836 A1* | 2/2019 | Fastow | H01L 25/0657 |
| 2019/0067322 A1 | 2/2019 | Chen et al. | |
| 2019/0221557 A1 | 7/2019 | Kim et al. | |
| 2020/0058617 A1 | 2/2020 | Wu et al. | |
| 2020/0066703 A1 | 2/2020 | Kim et al. | |
| 2020/0098571 A1 | 3/2020 | Matsuo | |
| 2020/0098776 A1 | 3/2020 | Sugisaki | |
| 2020/0194452 A1 | 6/2020 | Xiao | |
| 2020/0328176 A1* | 10/2020 | Liu | H01L 25/18 |
| 2020/0328180 A1 | 10/2020 | Cheng et al. | |
| 2020/0328186 A1 | 10/2020 | Liu | |
| 2020/0350014 A1 | 11/2020 | Liu | |
| 2020/0350322 A1 | 11/2020 | Liu et al. | |
| 2020/0381408 A1* | 12/2020 | Liu | H10B 41/27 |
| 2020/0411509 A1 | 12/2020 | Yang et al. | |
| 2021/0066277 A1 | 3/2021 | Kim et al. | |
| 2021/0074717 A1 | 3/2021 | Lim et al. | |
| 2021/0082896 A1 | 3/2021 | Harashima et al. | |
| 2021/0134748 A1 | 5/2021 | Liu | |
| 2021/0210460 A1* | 7/2021 | He | H01L 24/94 |
| 2022/0077126 A1 | 3/2022 | Choi et al. | |
| 2022/0122932 A1 | 4/2022 | Oh et al. | |
| 2022/0123006 A1* | 4/2022 | Ahn | H10B 43/27 |
| 2022/0130846 A1 | 4/2022 | Kim et al. | |

FOREIGN PATENT DOCUMENTS

| | | |
|---|---|---|
| CN | 107799529 A | 3/2018 |
| CN | 110870062 A | 3/2018 |
| CN | 107946215 A | 4/2018 |
| CN | 108352298 A | 7/2018 |
| CN | 108604572 A | 9/2018 |
| CN | 108735760 A | 11/2018 |
| CN | 109155235 A | 1/2019 |
| CN | 109817636 A | 5/2019 |
| CN | 111968685 A | 5/2019 |
| CN | 110192269 A | 8/2019 |
| CN | 110249427 A | 9/2019 |
| CN | 110720145 A | 1/2020 |
| CN | 110931489 A | 3/2020 |
| CN | 110945652 A | 3/2020 |
| CN | 111316440 A | 6/2020 |
| CN | 111326514 A | 6/2020 |
| CN | 111357108 A | 6/2020 |
| CN | 111788687 A | 10/2020 |
| CN | 110998844 A | 4/2021 |
| CN | 112614831 A | 4/2021 |
| CN | 112635441 A | 4/2021 |
| JP | 2004342753 A | 12/2004 |
| JP | 2010192611 A | 9/2010 |
| KR | 20080059804 A | 7/2008 |
| TW | 202119601 A | 5/2021 |
| WO | 2021068229 A1 | 4/2021 |

OTHER PUBLICATIONS

International Search Report issued in corresponding International Application No. PCT/CN2021/103785, mailed Mar. 30, 2022, 5 pages.
International Search Report issued in corresponding International Application No. PCT/CN2021/115218, mailed May 7, 2022, 4 pages.
Supplemental European Search Report issued in corresponding EP Application No. 21 94 7574, mailed on Jan. 5, 2024, 9 pages.
International Search Report issued in corresponding International Application No. PCT/CN2021/103610, mailed Mar. 28, 2022, 5 pages.
International Search Report issued in corresponding International Application No. PCT/CN2021/103697, mailed Mar. 28, 2022, 5 pages.
International Search Report issued in corresponding International Application No. PCT/CN2021/103764, mailed Mar. 28, 2022, 5 pages.
International Search Report issued in corresponding International Application No. PCT/CN2021/103730, mailed Mar. 28, 2022, 4 pages.
International Search Report issued in corresponding International Application No. PCT/CN2021/103767, mailed Mar. 28, 2022, 4 pages.
International Search Report issued in corresponding International Application No. PCT/CN2021/103762, mailed Mar. 28, 2022, 5 pages.
International Search Report issued in corresponding International Application No. PCT/CN2021/103794, mailed Mar. 28, 2022, 5 pages.

\* cited by examiner

100

101

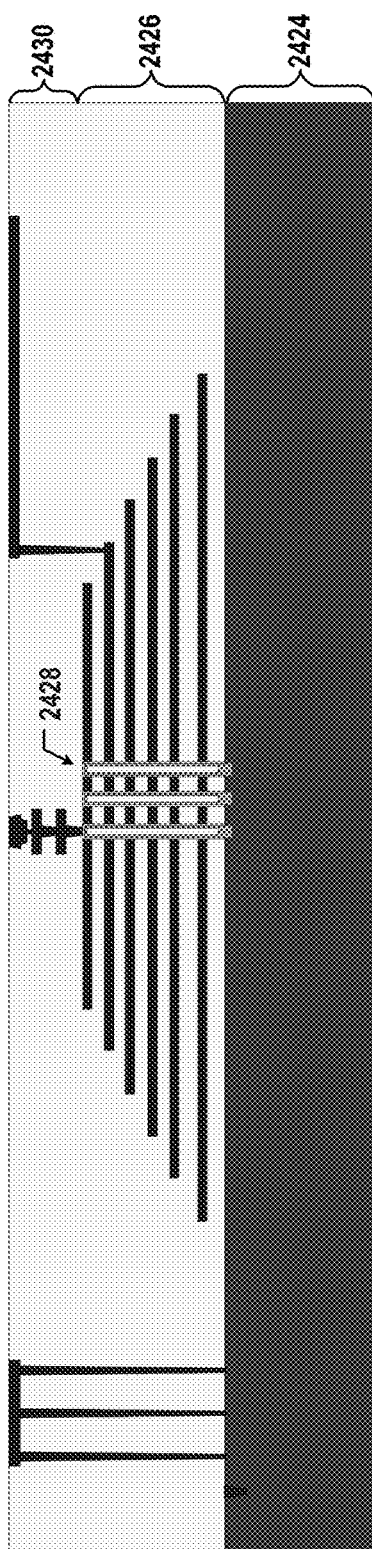
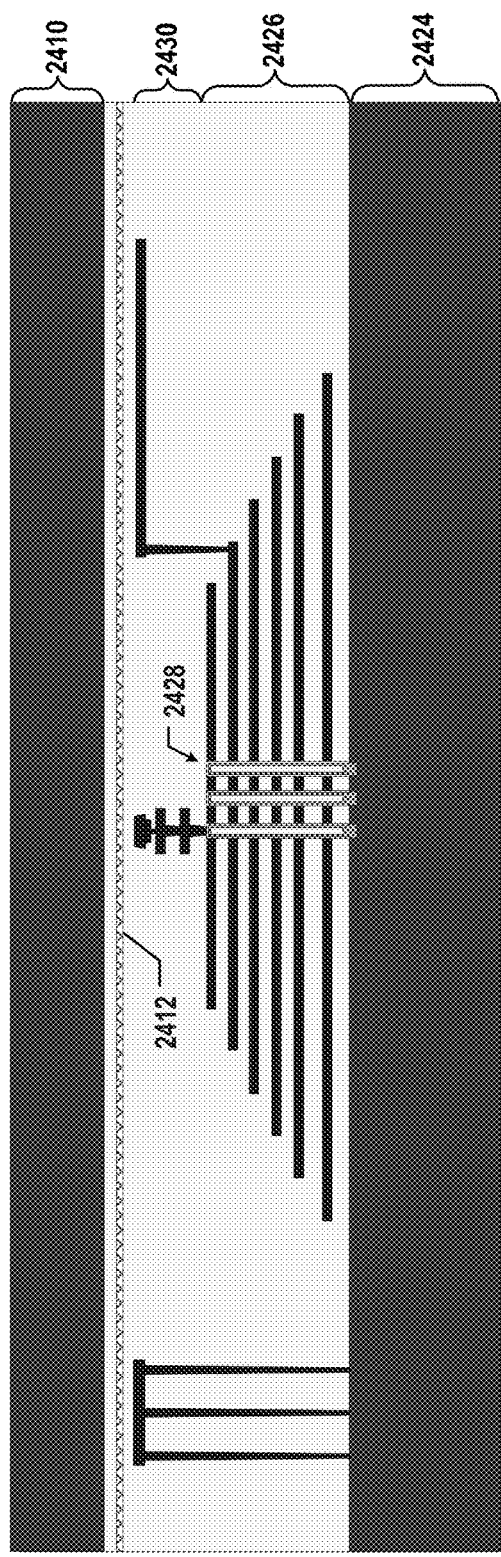
FIG. 24A
FIG. 24B

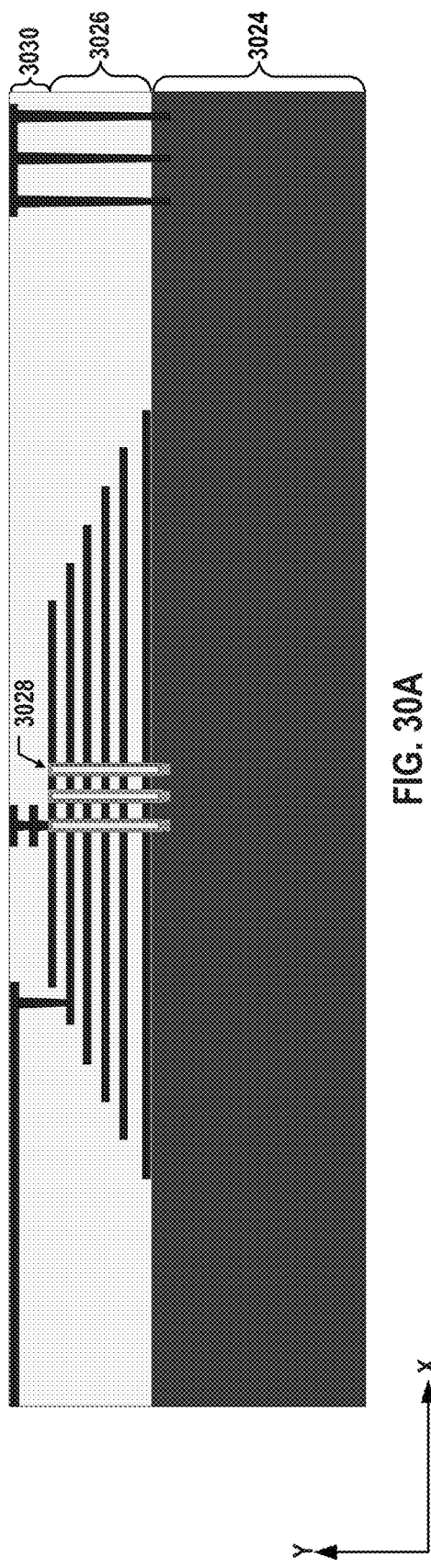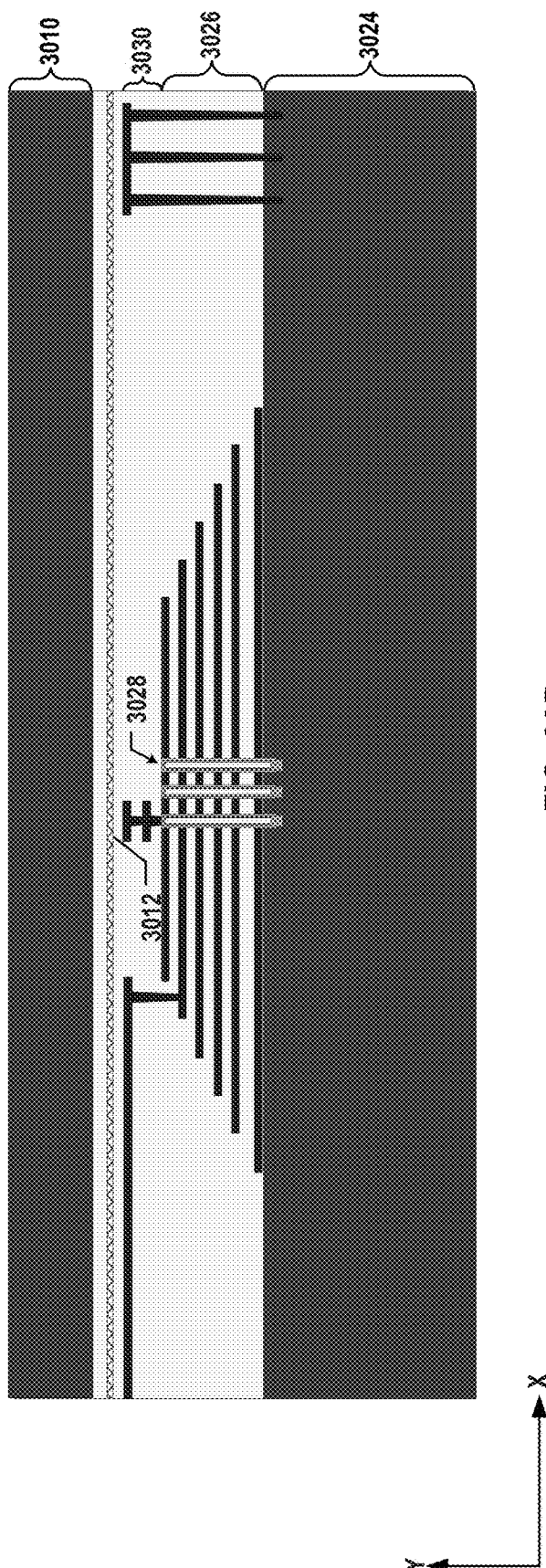

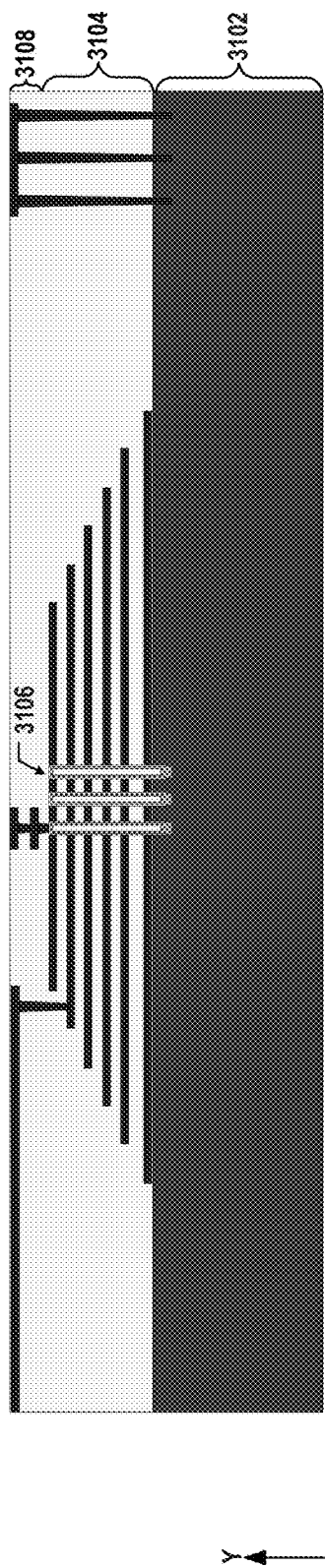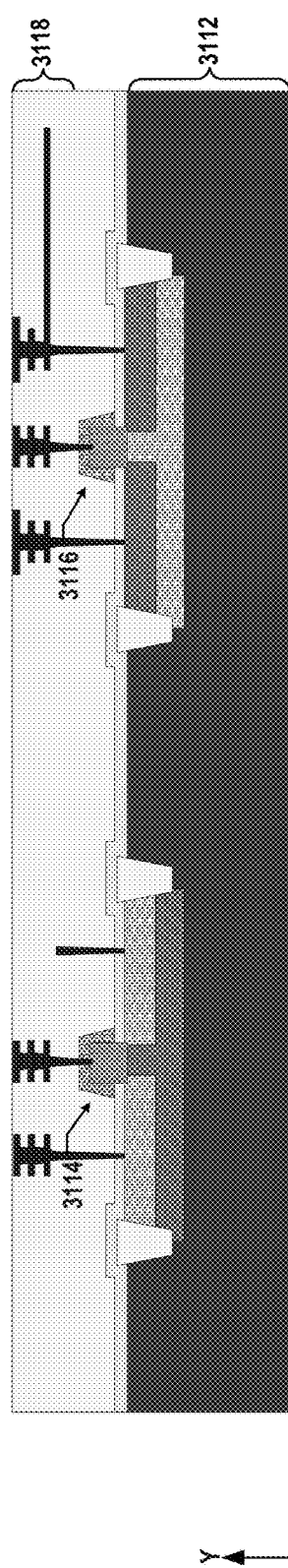
FIG. 31A
FIG. 31B
FIG. 31C

3500

3501

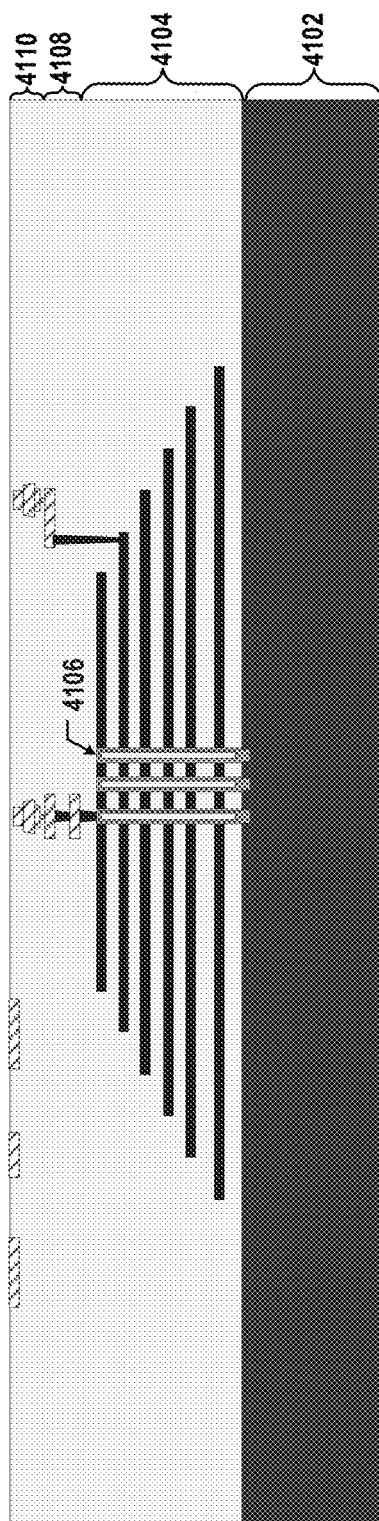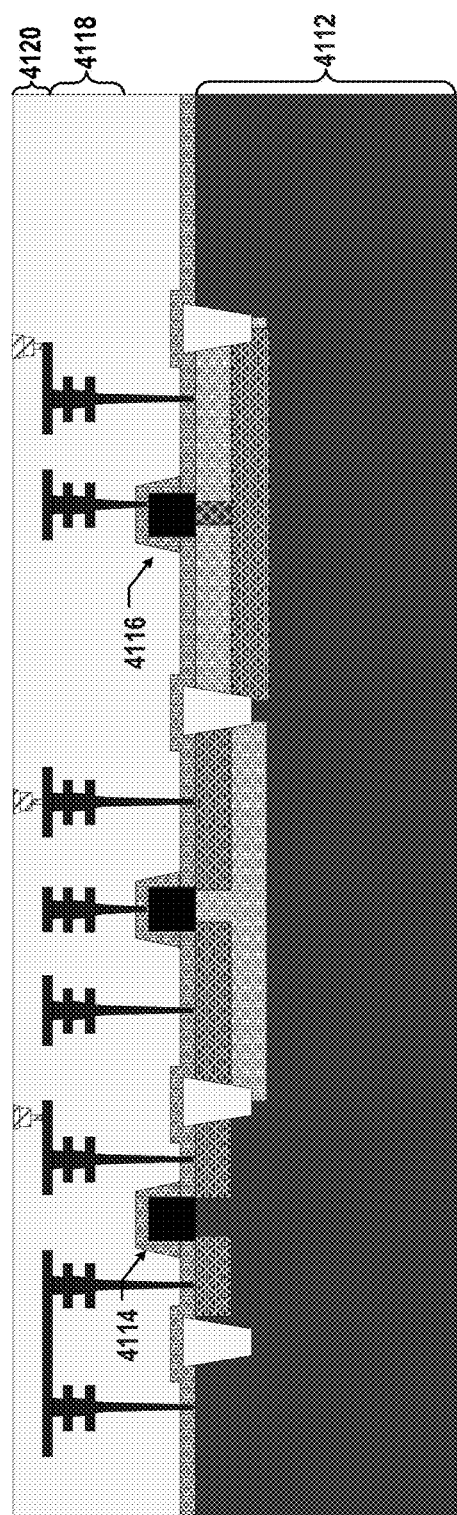
FIG. 41A
FIG. 41B

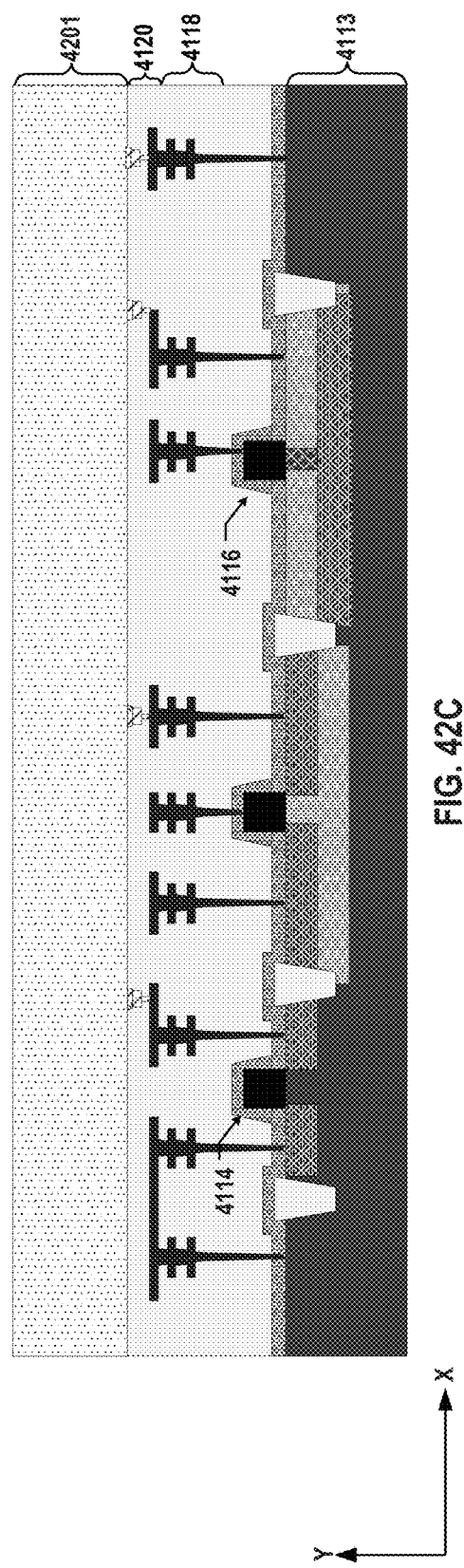
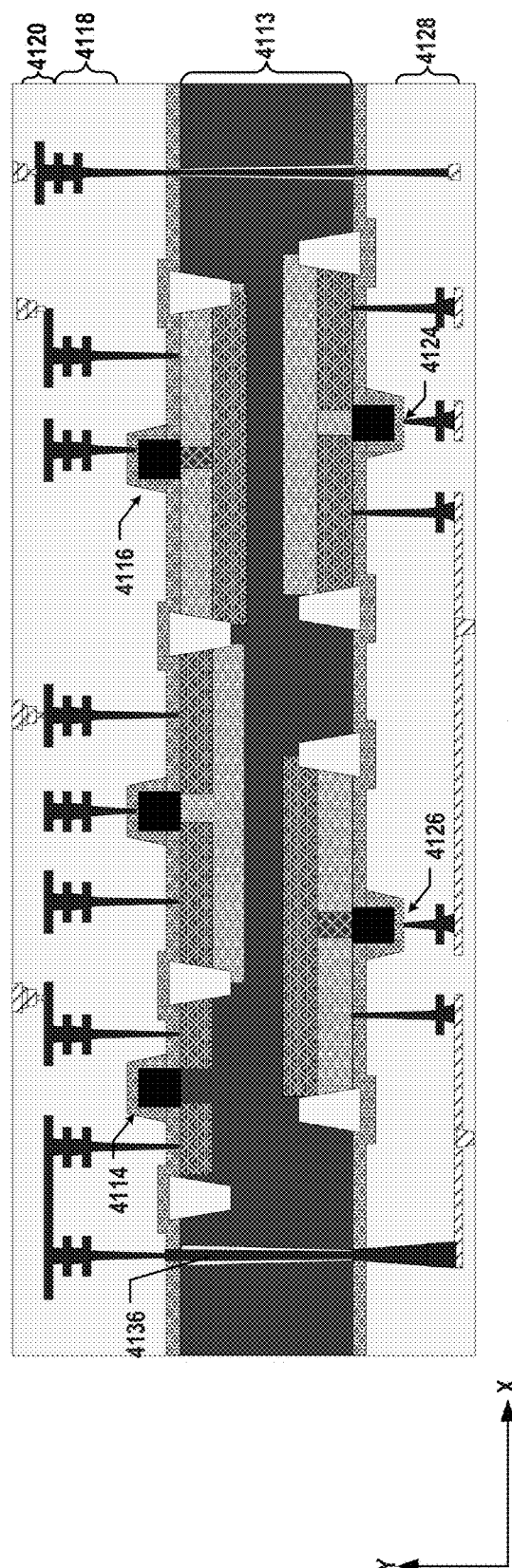
FIG. 42C
FIG. 42D

THREE-DIMENSIONAL MEMORY DEVICES AND METHODS FOR FORMING THE SAME

CROSS-REFERENCE TO RELATED APPLICATIONS

This application is a continuation of International Application No. PCT/CN2021/103697, filed on Jun. 30, 2021, entitled "THREE-DIMENSIONAL MEMORY DEVICES AND METHODS FOR FORMING THE SAME," which is hereby incorporated by reference in its entirety. This application is also related to U.S. application Ser. No. 17/480,821, filed on Sep. 21, 2021, entitled "THREE-DIMENSIONAL MEMORY DEVICES AND METHODS FOR FORMING THE SAME," issued as U.S. Pat. No. 12,020,750, U.S. application Ser. No. 17/480,852, filed on Sep. 21, 2021, entitled "THREE-DIMENSIONAL MEMORY DEVICES AND METHODS FOR FORMING THE SAME," U.S. Application Ser. No. 17/480,931, filed on Sep. 21, 2021, entitled "THREE-DIMENSIONAL MEMORY DEVICES AND METHODS FOR FORMING THE SAME," U.S. application Ser. No. 17/480,949, filed on Sep. 21, 2021, entitled "THREE-DIMENSIONAL MEMORY DEVICES AND METHODS FOR FORMING THE SAME," issued as U.S. Pat. No. 12,113,037, U.S. application Ser. No. 17/480,975, filed on Sep. 21, 2021, entitled "THREE-DIMENSIONAL MEMORY DEVICES AND METHODS FOR FORMING THE SAME," issued as U.S. Pat. No. 11,929,119, U.S. application Ser. No. 17/480,998, filed on Sep. 21, 2021, entitled "THREE-DIMENSIONAL MEMORY DEVICES AND METHODS FOR FORMING THE SAME," issued as U.S. Pat. No. 12,069,854, U.S. application Ser. No. 17/481,020, filed on Sep. 21, 2021, entitled "THREE-DIMENSIONAL MEMORY DEVICES AND METHODS FOR FORMING THE SAME," issued as U.S. Pat. No. 11,996,152, U.S. application Ser. No. 17/481,040, filed on Sep. 21, 2021, entitled "THREE-DIMENSIONAL MEMORY DEVICES AND METHODS FOR FORMING THE SAME," all of which are hereby incorporated by reference in their entireties.

BACKGROUND

The present disclosure relates to memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral circuits for facilitating operations of the memory array.

SUMMARY

In one aspect, a 3D memory device includes a first semiconductor structure, a second semiconductor structure, a third semiconductor structure, a first bonding interface between the first semiconductor structure and the second semiconductor structure, and a second bonding interface between the second semiconductor structure and the third semiconductor structure. The first semiconductor structure includes an array of NAND memory strings and a first semiconductor layer in contact with sources of the array of NAND memory strings. The second semiconductor structure includes a first peripheral circuit of the array of NAND memory strings including a first transistor, and a second semiconductor layer in contact with the first transistor. A third semiconductor structure includes a second peripheral circuit of the array of NAND memory strings including a second transistor, and a third semiconductor layer in contact with the second transistor. The first peripheral circuit is between the first bonding interface and the second semiconductor layer. The third semiconductor layer is between the second peripheral circuit and the second bonding interface.

In another aspect, a system includes a memory device configured to store data. The memory device includes a first semiconductor structure, a second semiconductor structure, a third semiconductor structure, a first bonding interface between the first semiconductor structure and the second semiconductor structure, and a second bonding interface between the second semiconductor structure and the third semiconductor structure. The first semiconductor structure includes an array of NAND memory strings and a first semiconductor layer in contact with sources of the array of NAND memory strings. The second semiconductor structure includes a first peripheral circuit of the array of NAND memory strings including a first transistor, and a second semiconductor layer in contact with the first transistor. A third semiconductor structure includes a second peripheral circuit of the array of NAND memory strings including a second transistor, and a third semiconductor layer in contact with the second transistor. The first peripheral circuit is between the first bonding interface and the second semiconductor layer. The third semiconductor layer is between the second peripheral circuit and the second bonding interface. The system also includes a memory controller coupled to the memory device and configured to control the array of memory cells through the first peripheral circuit and the second peripheral circuit.

In still another aspect, a method for forming a 3D memory device is disclosed. An array of NAND memory strings is formed on a first substrate. A first transistor is formed on a second substrate. A second transistor is formed on a third substrate. The first substrate and second substrate are bonded in a face-to-face manner. The third substrate and the second substrate are bonded in a back-to-back manner.

In yet another aspect, a method for forming a 3D memory device is disclosed. An array of NAND memory strings is formed on a first substrate. A first transistor is formed on a first side of a second substrate. A semiconductor layer is formed on a second side of the second substrate opposite to the first side. The semiconductor layer includes single crystalline silicon. A second transistor is formed on the semiconductor layer. The first substrate and the second substrate are bonded in a face-to-face manner.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIGS. 24A-24F illustrate a fabrication process for forming the 3D memory devices in FIGS. 22A and 22B, according to some aspects of the present disclosure.

FIGS. 30A-30F illustrate a fabrication process for forming the 3D memory devices in FIGS. 28A and 28B, according to some aspects of the present disclosure.

FIGS. 31A-31F illustrate another fabrication process for forming the 3D memory devices in FIGS. 28A and 28B, according to some aspects of the present disclosure.

FIGS. 41A-41E illustrate a fabrication process for forming the 3D memory devices in FIGS. 39A and 39B, according to some aspects of the present disclosure.

FIGS. 42A-42I illustrate another fabrication process for forming the 3D memory devices in FIGS. 39A and 39B, according to some aspects of the present disclosure.

Figure 1A:
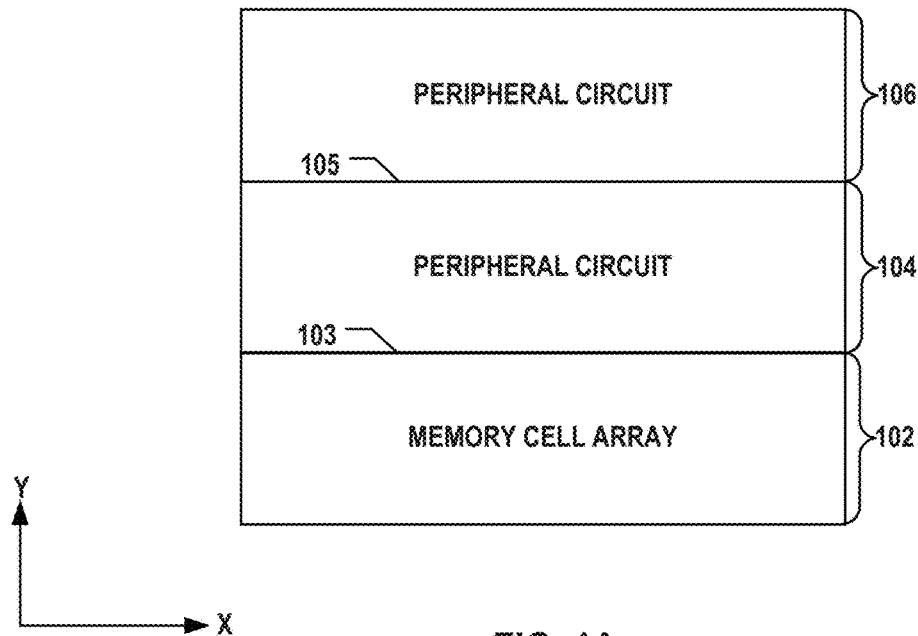
FIG. 1A illustrates a schematic view of a cross-section of a 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

With the development of 3D memory devices, such as 3D NAND Flash memory devices, the more stacked layers (e.g., more word lines and the resulting more memory cells) require more peripheral circuits (and the components, e.g., transistors, forming the peripheral circuits) for operating the 3D memory devices. For example, the number and/or size of page buffers needs to increase to match the increased number of memory cells. In another example, the number of string drivers in the word line driver is proportional to the number of word lines in the 3D NAND Flash memory. Thus, the continuous increase of the word lines also increases the area occupied by the word line driver, as well as the complexity of metal routings, sometimes even the number of metal layers. Moreover, in some 3D memory devices in which the memory cell array and peripheral circuits are fabricated on different substrates and bonded together, the continuous increase of peripheral circuits' areas makes it the bottleneck for reducing the total chip size since the memory cell array can be scaled up vertically by increasing the number of levels instead of increasing the planar size.

Thus, it is desirable to reduce the planar areas occupied by the peripheral circuits of the 3D memory devices with the increased numbers of peripheral circuits and the transistors thereof. However, scaling down the transistor size of the peripheral circuits following the advanced complementary metal-oxide-semiconductor (CMOS) technology node trend used for the logic devices would cause a significant cost increase and higher leakage current, which are undesirable for memory devices. Moreover, because the 3D NAND Flash memory devices require a relatively high voltage (e.g., above 5 V) in certain memory operations, such as program and erase, unlike logic devices, which can reduce its working voltage as the CMOS technology node advances, the voltage provided to the memory peripheral circuits cannot be reduced. As a result, scaling down the memory peripheral circuit sizes by following the trend for advancing the CMOS technology nodes, like the normal logic devices, becomes infeasible.

To address one or more of the aforementioned issues, the present disclosure introduces various solutions in which the peripheral circuits of a memory device are disposed in different planes (levels, tiers) in the vertical direction, i.e., stacked over one another, to reduce the planar chip size of the peripheral circuits, as well as the total chip size of the memory device. In some implementations, the memory cell array (e.g., NAND memory strings), the memory peripheral circuits provided with a relatively high voltage (e.g., above 5 V), and the memory peripheral circuits provided with a relatively low voltage (e.g., below 1.3 V) are disposed in different planes in the vertical direction, i.e., stacked over one another, to further reduce the chip size. The 3D memory device architectures and fabrication processes disclosed in the present disclosure can be easily scaled up vertically to stack more peripheral circuits in different planes to further reduce the chip size.

The peripheral circuits can be separated into different planes in the vertical direction based on different performance requirements, for example, the voltages applied to the transistors thereof, which affect the dimensions of the transistors (e.g., gate dielectric thickness), dimensions of the substrates in which the transistors are formed (e.g., substrate thickness), and thermal budgets (e.g., the interconnect material). Thus, peripheral circuits with different dimension requirements (e.g., gate dielectric thickness and substrate thickness) and thermal budgets can be fabricated in different processes to reduce the design and process constraints from each other, thereby improving the device performance and fabrication complexity.

According to some aspects of the present disclosure, the memory cell array and various peripheral circuits with different performance and dimension requirements can be fabricated in parallel on different substrates and then stacked over one another using various joining technologies, such as hybrid bonding, transfer bonding, etc. As a result, the fabrication cycle of the memory device can be further reduced. Moreover, since the thermal budgets of the different devices become independent to each other, interconnect materials with desirable electric performance but low thermal budget, such as copper, can be used in interconnecting the memory cells and transistors of the peripheral circuits, thereby further improving the device performance. Bonding technologies can introduce additional benefits as well. In some implementations, hybrid bonding in a face-to-face manner achieves millions of parallel short interconnects between the bonded semiconductor structures to increase the throughput and input/output (I/O) speed of the memory devices. In some implementations, transfer bonding re-uses a single wafer to transfer thin semiconductor layers thereof onto different memory devices for forming transistors thereon, which can reduce the cost of the memory devices.

The 3D memory device architectures and fabrication processes disclosed in the present disclosure have the flexibility to allow various substrate materials suitable for different memory cell array designs, such as NAND memory strings suitable for gate-induced drain leakage (GIDL) erase operations or P-type bulk erase operations. In some implementations, single crystalline silicon (a.k.a. single-crystal silicon or monocrystalline silicon) with superior carrier electronic properties—the lack of grain boundaries allows better charge carrier flow and prevents electron recombination—is used as the substrate material of the NAND memory string array to achieve faster memory operations. In some implementations, polysilicon (a.k.a. polycrystalline silicon) is used as the substrate material of the NAND memory string array for GIDL erase operations.

The 3D memory device architectures and fabrication processes disclosed in the present disclosure also have the flexibility to allow various device pad-out schemes to meet different needs and different designs of the memory cell array. In some implementations, the pad-out interconnect layer is formed from the side of the semiconductor structure that has the peripheral circuits to shorten the interconnect distance between the pad-out interconnect layer and the transistors of the peripheral circuits to reduce the parasitic capacitance from the interconnects and improve the electric performance. In some implementations, the pad-out interconnect layer is formed on a thinned substrate in which the memory cell array is formed to enable inter-layer vias (LLVs, e.g., submicron-level) for pad-out interconnects with high I/O throughput and low fabrication complicity.

FIG. 1A illustrates a schematic view of a cross-section of a 3D memory device 100, according to some aspects of the present disclosure. 3D memory device 100 represents an example of a bonded chip. In some implementations, at least some of the components of 3D memory device 100 (e.g., memory cell array and peripheral circuits) are formed separately on different substrates in parallel and then jointed to form a bonded chip (a process referred to herein as a "parallel process"). In some implementations, at least one semiconductor layer is attached onto another semiconductor structure using transferring bonding, then some of the components of 3D memory device 100 (e.g., memory cell array and peripheral circuits) are formed on the attached semiconductor layer (a process referred to herein as a "series process"). It is understood that in some examples, the components of 3D memory device 100 (e.g., memory cell array and peripheral circuits) may be formed by a hybrid process that combines the parallel process and the series process.

It is noted that x- and y-axes are added in FIG. 1A to further illustrate the spatial relationships of the components of a semiconductor device. A substrate of a semiconductor device, e.g., 3D memory device 100, includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device is determined relative to the substrate of the semiconductor device in the y-direction (the vertical direction or thickness direction) when the substrate is positioned in the lowest plane of the semiconductor device in the y-direction. The same notion for describing the spatial relationships is applied throughout the present disclosure.

3D memory device 100 can include a first semiconductor structure 102 including an array of memory cells (also referred to herein as a "memory cell array"). In some implementations, the memory cell array includes an array of NAND Flash memory cells. For ease of description, a NAND Flash memory cell array may be used as an example for describing the memory cell array in the present disclosure. But it is understood that the memory cell array is not limited to NAND Flash memory cell array and may include any other suitable types of memory cell arrays, such as NOR Flash memory cell array, phase change memory (PCM) cell array, resistive memory cell array, magnetic memory cell array, spin transfer torque (STT) memory cell array, to name a few.

First semiconductor structure 102 can be a NAND Flash memory device in which memory cells are provided in the form of an array of 3D NAND memory strings and/or an array of two-dimensional (2D) NAND memory cells. NAND memory cells can be organized into pages or fingers, which are then organized into blocks in which each NAND memory cell is coupled to a separate line called a bit line (BL). All cells with the same vertical position in the NAND memory cell can be coupled through the control gates by a word line (WL). In some implementations, a memory plane contains a certain number of blocks that are coupled through the same bit line. First semiconductor structure 102 can include one or more memory planes, and the peripheral circuits that are needed to perform all the read/program (write)/erase operations can be included in a second semiconductor structure 104 and a third semiconductor structure 106.

In some implementations, the array of NAND memory cells is an array of 2D NAND memory cells, each of which includes a floating-gate transistor. The array of 2D NAND memory cells includes a plurality of 2D NAND memory strings, each of which includes a plurality of memory cells connected in series (resembling a NAND gate) and two select transistors, according to some implementations. Each 2D NAND memory string is arranged in the same plane (i.e., referring to herein a flat, two-dimensional (2D) surface, different from the term "memory plane" in the present discourse) on the substrate, according to some implementations. In some implementations, the array of NAND memory cells is an array of 3D NAND memory strings, each of which extends vertically above the substrate (in 3D) through a stack structure, e.g., a memory stack. Depending on the 3D NAND technology (e.g., the number of layers/tiers in the memory stack), a 3D NAND memory string typically includes a certain number of NAND memory cells, each of which includes a floating-gate transistor or a charge-trap transistor.

As shown in FIG. 1A, 3D memory device 100 can also include a second semiconductor structure 104 and a third semiconductor structure 106 each including some of the peripheral circuits of the memory cell array in first semiconductor structure 102. That is, the peripheral circuits of the memory cell array can be separated into at least two other semiconductor structures (e.g., 104 and 106 in FIG. 1A). The peripheral circuits (a.k.a. control and sensing circuits) can include any suitable digital, analog, and/or mixed-signal circuits used for facilitating the operations of the memory cell array. For example, the peripheral circuits can include one or more of a page buffer, a decoder (e.g., a row decoder and a column decoder), a sense amplifier, a driver (e.g., a word line driver), an I/O circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). The peripheral circuits in second and third semiconductor structures 104 and 106 can use CMOS technology, e.g., which can be implemented with logic processes in any suitable technology nodes.

As shown in FIG. 1A, first, second, and third semiconductor structures 102, 104, and 106 are stacked over one another in different planes, according to some implementations. As a result, the memory cell array in first semiconductor structure 102, the peripheral circuits in second semiconductor structure 104, and the peripheral circuits in third semiconductor structure 106 can be stacked over one another in different planes to reduce the planar size of 3D memory device 100, compared with memory devices in which all the peripheral circuits are disposed in the same plane.

As shown in FIG. 1A, 3D memory device 100 further includes a first bonding interface 103 vertically between first semiconductor structure 102 and second semiconductor structure 104, as well as a second bonding interface 105 vertically between second semiconductor structure 104 and third semiconductor structure 106. First and second bonding interface 103 or 105 can be an interface between two semiconductor structures formed by any suitable bonding technologies as described below in detail, such as hybrid bonding, anodic bonding, fusion bonding, transfer bonding, adhesive bonding, eutectic bonding, to name a few. In some implementations as shown in FIG. 1A, second semiconductor structure 104 is bonded to other two semiconductor structures 102 and 106 on opposite sides thereof. That is, second semiconductor structure 104 can be vertically between first and third semiconductor structures 102 and 106.

In some implementations, each of second and third semiconductor structures 104 and 106 does not include any memory cell. In other words, each of second and third semiconductor structures 104 and 106 only includes peripheral circuits, but not the memory cell array, according to some implementations. As a result, the memory cell array can be only included in first semiconductor structure 102, but not second or third semiconductor structure 104 or 106. Further, the number of semiconductor structures including peripheral circuits can be different from the number of semiconductor structures including memory cell array. In some implementations, the number of semiconductor structures including peripheral circuits is larger than the number of semiconductor structures including memory cell array. For example, as shown in FIG. 1A, the number of semiconductor structures including peripheral circuits is 2 (i.e., 104 and 106), while the number of semiconductor structures including memory cell array is 1 (i.e., 102).

Figure 1B:
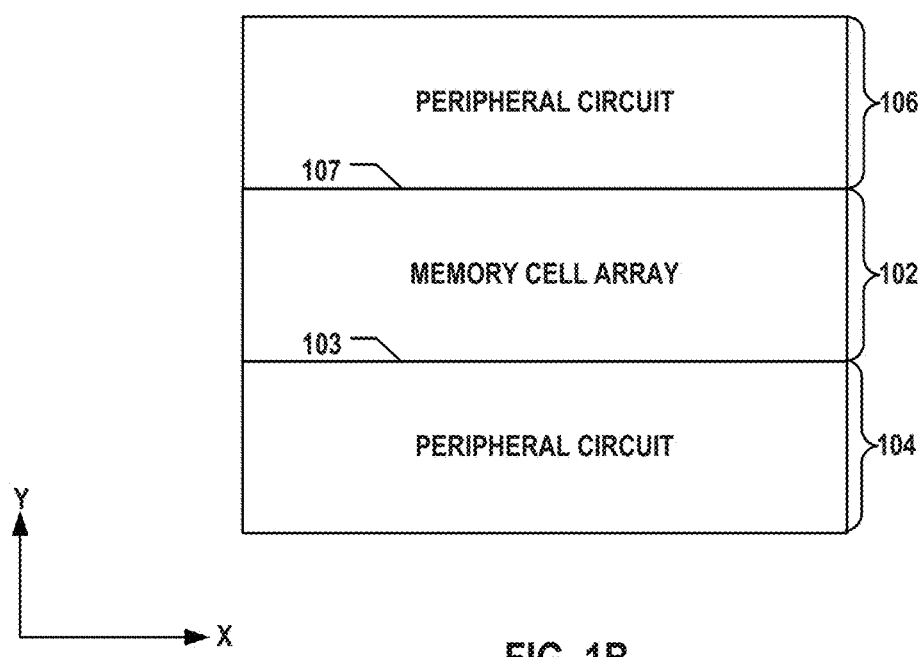
FIG. 1B illustrates a schematic view of a cross-section of another 3D memory device, according to some aspects of the present disclosure.

It is understood that the relative positions of stacked first, second, and third semiconductor structures 102, 104, and 106 are not limited and may vary in different examples. FIG. 1B illustrates a schematic view of a cross-section of another exemplary 3D memory device 101, according to some implementations. Different from 3D memory device 100 in FIG. 1A in which second semiconductor structure 104 including some of the peripheral circuits is vertically between first semiconductor structure 102 including the memory cell array and third semiconductor structure 106 including some of the peripheral circuits, in 3D memory device 101 in FIG. 1B, first semiconductor structure 102 including the memory cell array is between second and third semiconductor structures 104 and 106 each including some of the peripheral circuits. Nevertheless, first bonding interface 103 can still be formed vertically between first and second semiconductor structures 102 and 104 in 3D memory device 101. Instead of having a second bonding interface 105 vertically between second and third semiconductor structures 104 and 106, 3D memory device 100 can include a third bonding interface 107 vertically between first and third semiconductor structures 102 and 106. Similar to first and second bonding interfaces 103 and 105, third bonding interface 107 can be an interface between two semiconductor structures formed by any suitable bonding technologies as described below in detail, such as hybrid bonding, anodic bonding, fusion bonding, transfer bonding, adhesive bonding, eutectic bonding, to name a few. In some implementations as shown in FIG. 1B, first semiconductor structure 102 is bonded to other two semiconductor structures 104 and 106 on opposite sides thereof.

As described below in detail, some or all of first, second, and third semiconductor structures 102, 104, and 106 can be fabricated separately (and in parallel in some implementations) by the parallel process, such that the thermal budget of fabricating one of first, second, and third semiconductor structures 102, 104, and 106 does not limit the processes of fabricating another one of first, second, and third semiconductor structures 102, 104, and 106. Moreover, a large number of interconnects (e.g., bonding contacts and/or interlayer vias (ILVs)/through substrate vias (TSVs)) can be formed across bonding interfaces 103, 105, and 107 to make direct, short-distance (e.g., micron- or submicron-level) electrical connections between adjacent semiconductor structures 102, 104, and 106, as opposed to the long-distance (e.g., millimeter or centimeter-level) chip-to-chip data bus on the circuit board, such as printed circuit board (PCB), thereby eliminating chip interface delay and achieving high-speed I/O throughput with reduced power consumption. Data transfer among the memory cell array and the different peripheral circuits in different semiconductor structures 102, 104, and 106 can be performed through the interconnects (e.g., bonding contacts and/or ILVs/TSVs) across bonding interfaces 103, 105, and 107. By vertically integrating first, second, and third semiconductor structures 102, 104, and 106, the chip size can be reduced, and the memory cell density can be increased.

Figure 1C:
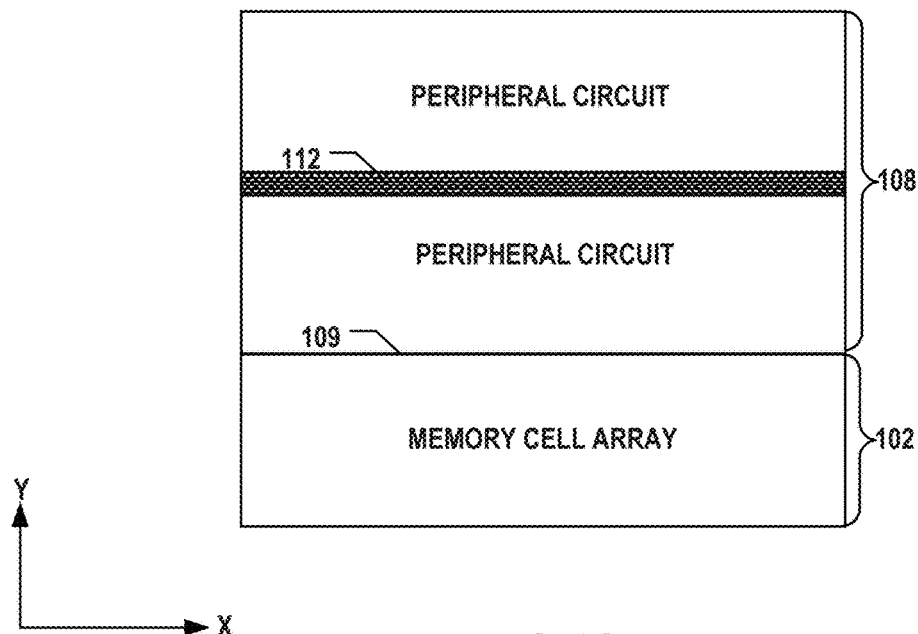
FIG. 1C illustrates a schematic view of a cross-section of still another 3D memory device, according to some aspects of the present disclosure.

It is also understood that the number of bonding interfaces in a 3D memory device is not limited and may vary in different examples. FIG. 1C illustrates a schematic view of a cross-section of still another exemplary 3D memory device 120, according to some implementations. Similar to 3D memory devices 100 and 101, the memory cell array and at least two portions of the peripheral circuits can be stacked over one another in different planes in 3D memory device 120. However, different from 3D memory devices 100 and 101 that include two bonding interfaces 103 and 105 or 103 and 107, 3D memory device 120 includes a single bonding interface 109 vertically between first semiconductor structure 102 in which the memory array is disposed and a fourth semiconductor structure 108 in which the two separate portions of the peripheral circuits are disposed, according to some implementations. That is, the two vertically separated portions of the peripheral circuits are not separated by bonding interface(s) as a result of a bonding process, but instead, are disposed on opposite sides of a same semiconductor layer 112 (e.g., a thinned silicon substrate) in fourth semiconductor structure 108. Depending on the thickness of semiconductor layer 112, interconnects (e.g., ILVs in the submicron-level or TSVs in the micron- or tens micron-level) can be formed through semiconductor layer 112 to make direct, short-distance (e.g., submicron- to tens micron-levels) electrical connections between the different portions of the peripheral circuits on opposite sides of semiconductor layer 112 in fourth semiconductor structure 108.

Figure 1D:
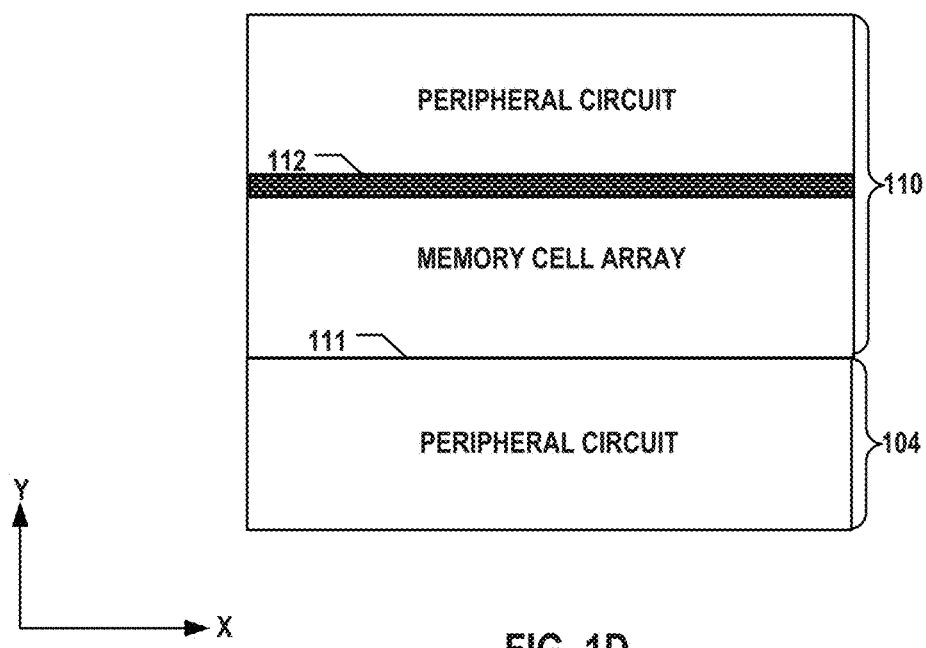
FIG. 1D illustrates a schematic view of a cross-section of yet another 3D memory device, according to some aspects of the present disclosure.

It is further understood that the types of devices disposed on opposite sides of semiconductor layer 112 are not limited and may vary in different examples. FIG. 1D illustrates a schematic view of a cross-section of yet another exemplary 3D memory device 121, according to some implementations. Similar to 3D memory devices 100, 101, and 120, the memory cell array and at least two portions of the peripheral circuits can be stacked over one another in different planes in 3D memory device 121. Different from 3D memory device 120 in FIG. 1C in which both peripheral circuits are formed on opposite sides of semiconductor layer 112, in 3D memory device 121, the memory cell array and some of the peripheral circuits are formed on opposite sides of semiconductor layer 112 in a fifth semiconductor structure 110. That is, 3D memory device 121 can include a single bonding interface 111 vertically between second semiconductor structure 104 (or third semiconductor structure 106) having some of the peripheral circuits and fifth semiconductor structure 110 in which the memory cell array and some of the peripheral circuits are disposed, according to some implementations. Similar to 3D memory device 120, depending on the thickness of semiconductor layer 112, interconnects (e.g., ILVs in the submicron-level or TSVs in the micron- or tens micron-level) can be formed through semiconductor layer 112 to make direct, short-distance (e.g., submicron- to tens micron-levels) electrical connections between some of the peripheral circuits and the memory cell array on opposite sides of semiconductor layer 112 in fifth semiconductor structure 110. It is understood that the numbers of stacked semiconductor structures in 3D memory devices 100, 101, 120, and 121 are not limited by the examples shown in FIGS. 1A-1D, and additional semiconductor structure(s) may be further stacked above, below, or between semiconductor structures shown in FIGS. 1A-1D in the vertical direction.

Figure 2:
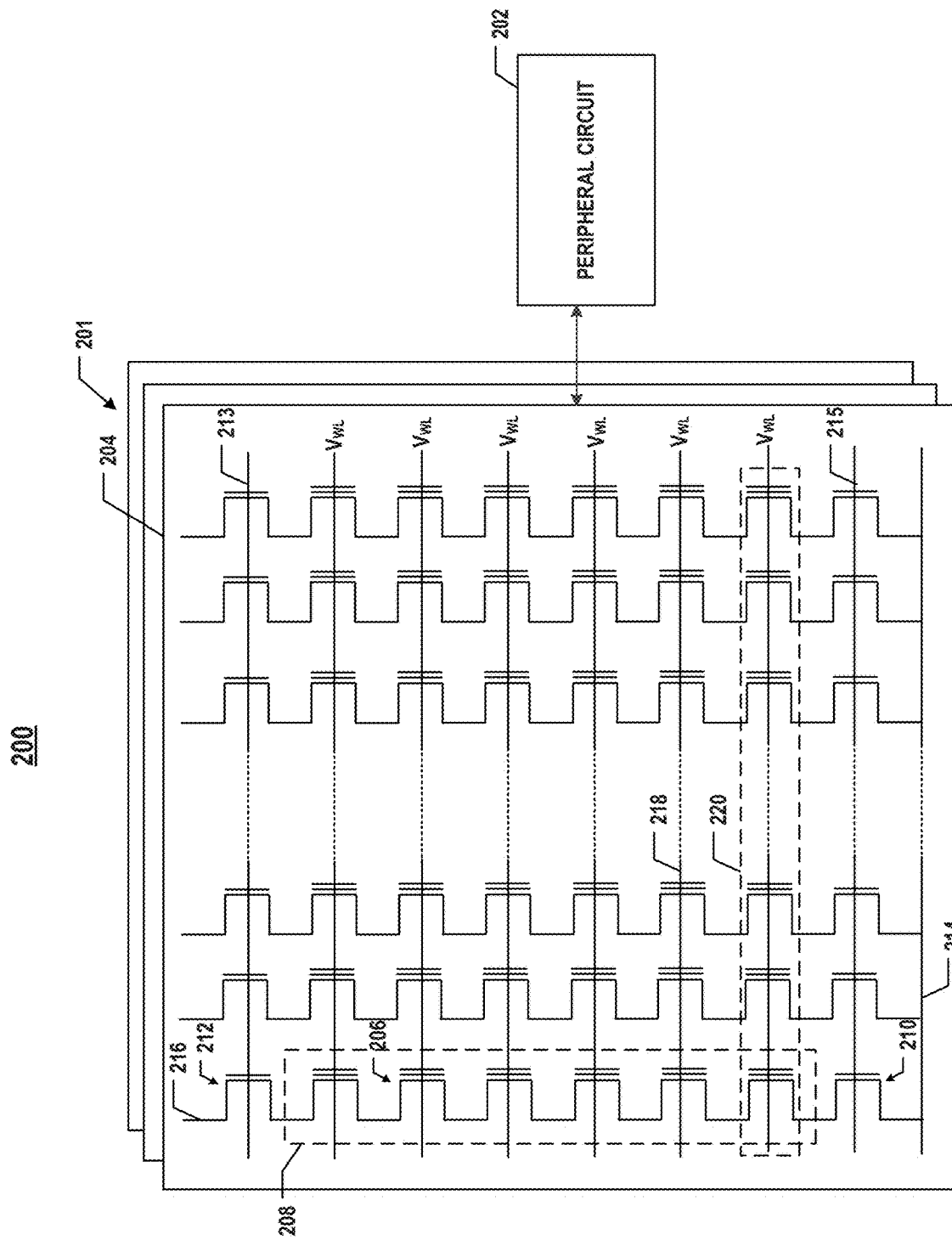
FIG. 2 illustrates a schematic circuit diagram of a memory device including peripheral circuits, according to some aspects of the present disclosure.

FIG. 2 illustrates a schematic circuit diagram of a memory device 200 including peripheral circuits, according to some aspects of the present disclosure. Memory device 200 can include a memory cell array 201 and peripheral circuits 202 coupled to memory cell array 201. 3D memory devices 100, 101, 120, and 121 may be examples of memory device 200 in which memory cell array 201 and at least two portions of peripheral circuits 202 may be included in various stacked semiconductor structures 102, 104, 106, 108, and 110. Memory cell array 201 can be a NAND Flash memory cell array in which memory cells 206 are provided in the form of an array of NAND memory strings 208 each extending vertically above a substrate (not shown). In some implementations, each NAND memory string 208 includes a plurality of memory cells 206 coupled in series and stacked vertically. Each memory cell 206 can hold a continuous, analog value, such as an electrical voltage or charge, that depends on the number of electrons trapped within a region of memory cell 206. Each memory cell 206 can be either a floating gate type of memory cell including a floating-gate transistor or a charge trap type of memory cell including a charge-trap transistor.

In some implementations, each memory cell 206 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 206 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 2, each NAND memory string 208 can include a source select gate (SSG) transistor 210 at its source end and a drain select gate (DSG) transistor 212 at its drain end. SSG transistor 210 and DSG transistor 212 can be configured to activate selected NAND memory strings 208 (columns of the array) during read and program operations. In some implementations, SSG transistors 210 of NAND memory strings 208 in the same block 204 are coupled through a same source line (SL) 214, e.g., a common SL, for example, to the ground. DSG transistor 212 of each NAND memory string 208 is coupled to a respective bit line 216 from which data can be read or programmed via an output bus (not shown), according to some implementations. In some implementations, each NAND memory string 208 is configured to be selected or deselected by applying a select voltage (e.g., above the threshold voltage of DSG transistor 212) or a deselect voltage (e.g., 0 V) to respective DSG transistor 212 through one or more DSG lines 213 and/or by applying a select voltage (e.g., above the threshold voltage of SSG transistor 210) or a deselect voltage (e.g., 0 V) to respective SSG transistor 210 through one or more SSG lines 215.

As shown in FIG. 2, NAND memory strings 208 can be organized into multiple blocks 204, each of which can have a common source line 214. In some implementations, each block 204 is the basic data unit for erase operations, i.e., all memory cells 206 on the same block 204 are erased at the same time. Memory cells 206 of adjacent NAND memory strings 208 can be coupled through word lines 218 that select which row of memory cells 206 is affected by read and program operations. In some implementations, each word line 218 is coupled to a page 220 of memory cells 206, which is the basic data unit for program and read operations. The size of one page 220 in bits can correspond to the number of NAND memory strings 208 coupled by word line 218 in one block 204. Each word line 218 can include a plurality of control gates (gate electrodes) at each memory cell 206 in respective page 220 and a gate line coupling the control gates.

Figure 8A:
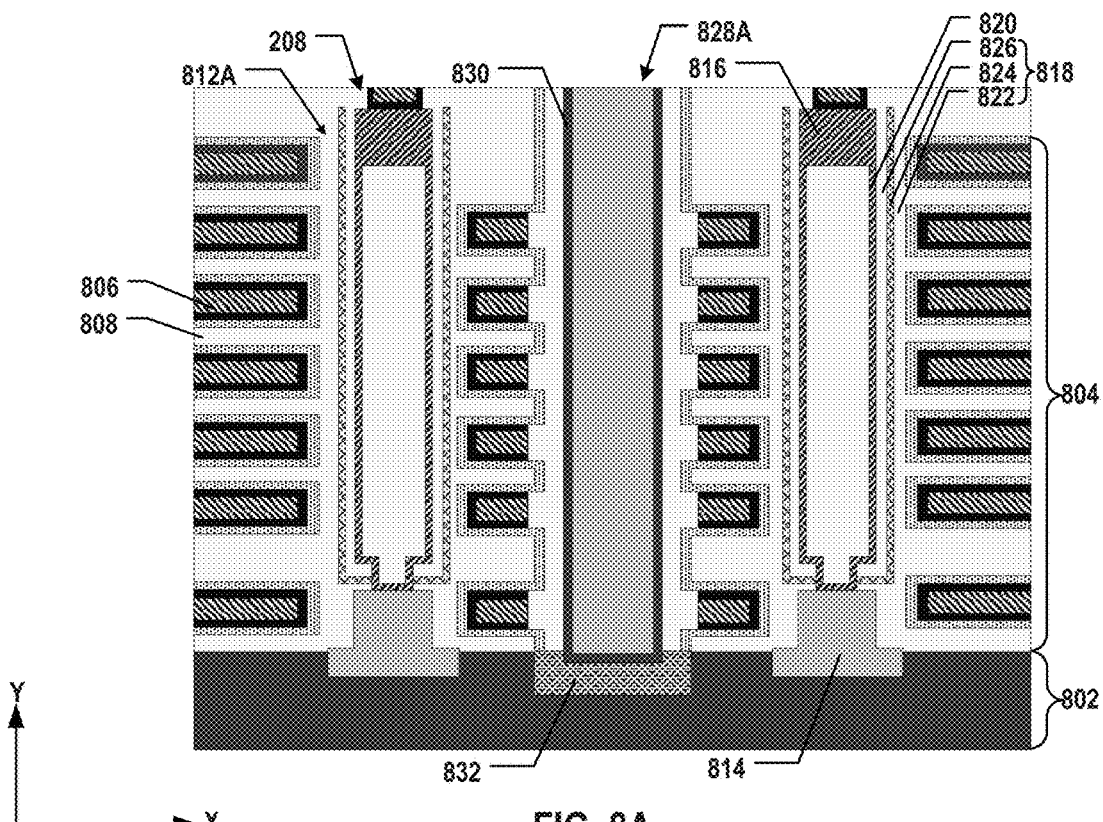
FIGS. 8A-8C illustrate side views of various NAND memory strings in 3D memory devices, according to various aspects of the present disclosure.
Figure 8B:
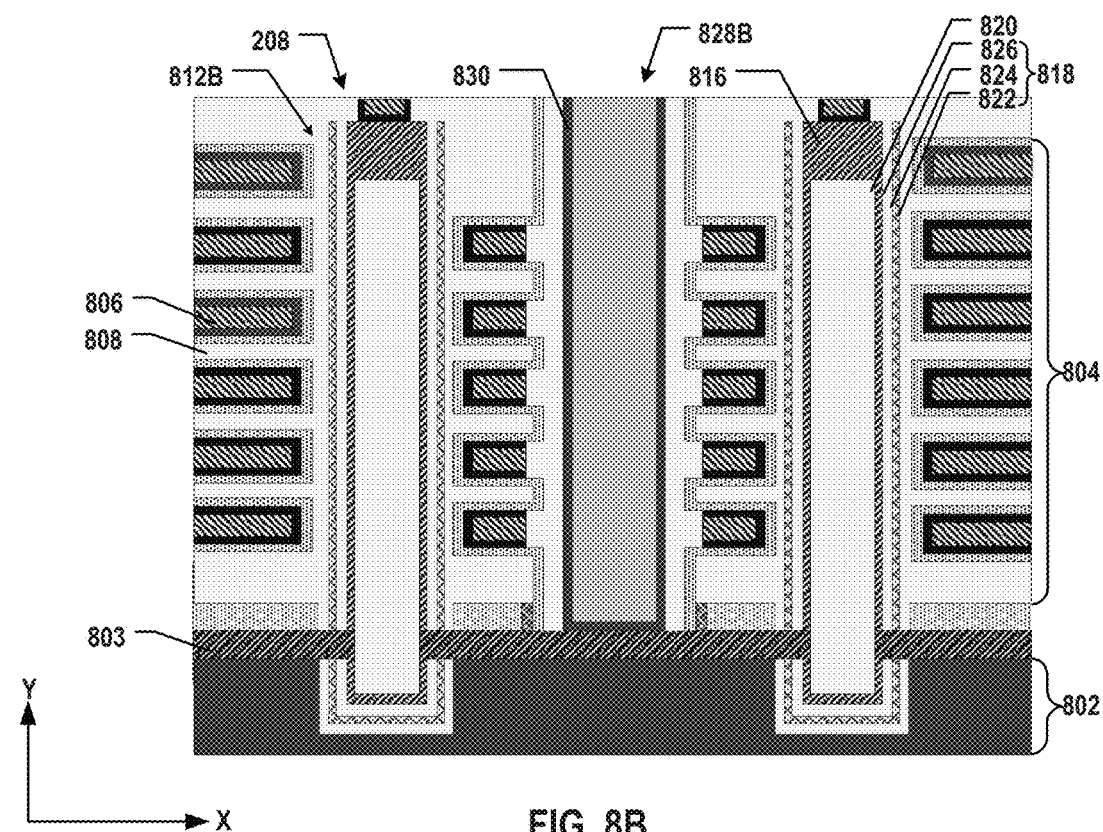
Figure 8C:
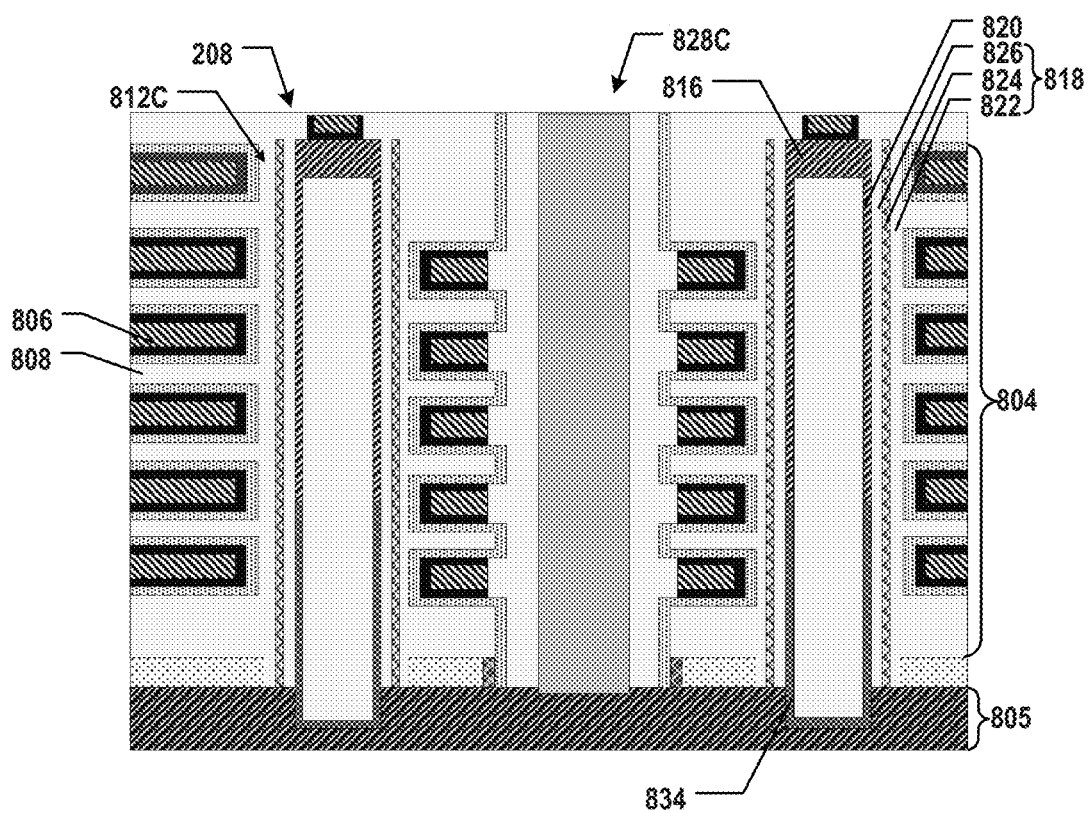

FIGS. 8A-8C illustrate side views of various NAND memory strings 208 in 3D memory devices, according to various aspects of the present disclosure. As shown in FIG. 8A, NAND memory string 208 can extend vertically through a memory stack 804 above a substrate 802. Substrate 802 can be a semiconductor layer including silicon (e.g., single crystalline silicon, c-silicon), silicon germanium (SiGe), gallium arsenide (GaAs), germanium (Ge), silicon on insulator (SOI), germanium on insulator (GOI), or any other suitable semiconductor materials. In some implementations, substrate 802 includes single crystalline silicon.

Memory stack 804 can include interleaved gate conductive layers 806 and dielectric layers 808. The number of the pairs of gate conductive layers 806 and dielectric layers 808 in memory stack 804 can determine the number of memory cells 206 in memory cell array 201. Gate conductive layer 806 can include conductive materials including, but not limited to, tungsten (W), cobalt (Co), copper (Cu), aluminum (Al), polysilicon, doped silicon, silicides, or any combination thereof. In some implementations, each gate conductive layer 806 includes a metal layer, such as a tungsten layer. In some implementations, each gate conductive layer 806 includes a doped polysilicon layer. Each gate conductive layer 806 can include control gates surrounding the memory cells, the gates of DSG transistors 212, or the gates of SSG transistors 210, and can extend laterally as DSG line 213 at the top of memory stack 804, SSG line 215 at the bottom of memory stack 804, or word line 218 between DSG line 213 and SSG line 215.

As shown in FIG. 8A, NAND memory string 208 includes a channel structure 812A extending vertically through memory stack 804. In some implementations, channel structure 812A includes a channel hole filled with semiconductor material(s) (e.g., as a semiconductor channel 820) and dielectric material(s) (e.g., as a memory film 818). In some implementations, semiconductor channel 820 includes silicon, such as polysilicon. In some implementations, memory film 818 is a composite dielectric layer including a tunneling layer 826, a storage layer 824 (also known as a "charge trap/storage layer"), and a blocking layer 822. Channel structure 812A can have a cylinder shape (e.g., a pillar shape). Semiconductor channel 820, tunneling layer 826, storage layer 824, blocking layer 822 are arranged radially from the center toward the outer surface of the pillar in this order, according to some implementations. Tunneling layer 826 can include silicon oxide, silicon oxynitride, or any combination thereof. Storage layer 824 can include silicon nitride, silicon oxynitride, silicon, or any combination thereof. Blocking layer 822 can include silicon oxide, silicon oxynitride, high dielectric constant (high-k) dielectrics, or any combination thereof. In one example, memory film 818 may include a composite layer of silicon oxide/silicon oxynitride/silicon oxide (ONO). Channel structure 812A can further include a channel plug 816 on the drain end of NAND memory string 208. Channel plug 816 can include polysilicon and be in contact with semiconductor channel 820.

As shown in FIG. 8A, NAND memory string 208 can further include a semiconductor plug 814 on the source end thereof, which is in contact with semiconductor channel 820 of channel structure 812A. Semiconductor plug 814, also known as selective epitaxial growth (SEG), can be selectively grown from substrate 802 and thus, has the same material as substrate 802, such as single crystalline silicon. Channel structure 812A in contact with semiconductor plug 814 on the source end of NAND memory string 208 (e.g., at the bottom of NAND memory string 208 shown in FIG. 8A, a.k.a. a bottom plug) is referred to herein as a "bottom plug channel structure" 812A.

As shown in FIG. 8A, a slit structure 828A can extend vertically through memory stack 804 and be in contact with substrate 802. Slit structure 828A can include a source contact 830 having conductive materials, such as polysilicon, metals, metal compounds (e.g., titanium nitride (TiN), tantalum nitride (TaN), etc.), or silicides, as well as a well 832 (e.g., a P-well and/or an N-well) in substrate 802. In some implementations, source contact 830 and well 832 of slit structure 828A, part of substrate 802 between slit structure 828A and channel structure 812A, and semiconductor plug 814 function as parts of source line 214 coupled to the source of NAND memory string 208, for example, for applying an erase voltage to the source of NAND memory string 208 during erase operations.

Different from bottom plug channel structure 812A in FIG. 8A, as shown in FIG. 8B, NAND memory string 208 includes a sidewall plug channel structure 812B and is free of semiconductor plug 814 on the source end thereof, according to some implementations. Instead, a sidewall semiconductor layer 803 vertically between substrate 802 and memory stack 804 can be in contact with the sidewall of semiconductor channel 820 of channel structures 812B. Sidewall semiconductor layer 803 can include semiconductor materials, such as polysilicon. Also different from slit structure 828A in FIG. 8A, as shown in FIG. 8B, a slit structure 828B does not include well 832, and source contact 830 of slit structure 828B is in contact with sidewall semiconductor layer 803, according to some implementations. In some implementations, source contact 830 of slit structure 828B and sidewall semiconductor layer 803 collectively function as parts of source line 214 coupled to the source of NAND memory string 208, for example, for applying an erase voltage to the source of NAND memory string 208 during erase operations.

As shown in FIG. 8C, in some implementations, substrate 802 (e.g., having single crystalline silicon) is replaced with a semiconductor layer 805 in contact with semiconductor channel 820 of a bottom open channel structure 812C on the source end of NAND memory string 208. Parts of memory film 818 of channel structure 812C on the source end can be removed to expose semiconductor channel 820 to contact semiconductor layer 805. In some implementations, part of semiconductor channel 820 on the source end of NAND memory string 208 is doped to form a doped region 834 that is in contact with semiconductor layer 805. Semiconductor layer 805 can include semiconductor materials, such as polysilicon. In some implementations, semiconductor layer 805 includes N-type doped polysilicon to enable GILD erase operations. Also different from slit structures 828A and 828B in FIGS. 8A and 8B, as shown in FIG. 8C, a slit structure 828C does not include source contact 830 and thus, does not function as part of source line 214, according to some implementations. Instead, source contacts (not shown) may be formed on an opposite side of semiconductor layer 805 with respect to channel structure 812C, such that the source contacts and parts of semiconductor layer 805 may function as parts of source line 214 coupled to the source of NAND memory string 208, for example, for applying an erase voltage to the source of NAND memory string 208 during erase operations.

Figure 3:
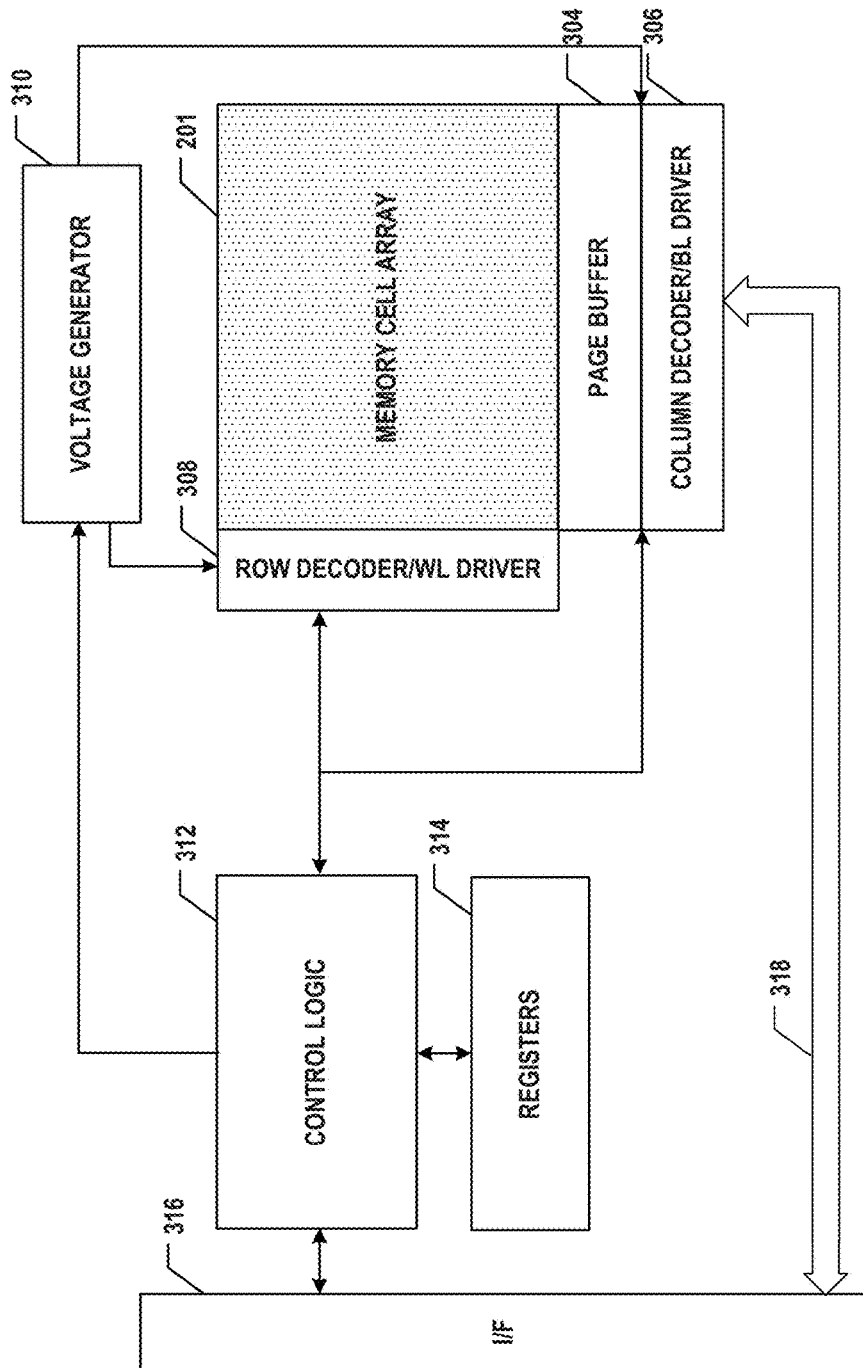
FIG. 3 illustrates a block diagram of a memory device including a memory cell array and peripheral circuits, according to some aspects of the present disclosure.

Referring to FIG. 2, peripheral circuits 202 can be coupled to memory cell array 201 through bit lines 216, word lines 218, source lines 214, SSG lines 215, and DSG lines 213. As described above, peripheral circuits 202 can include any suitable circuits for facilitating the operations of memory cell array 201 by applying and sensing voltage signals and/or current signals through bit lines 216 to and from each target memory cell 206 through word lines 218, source lines 214, SSG lines 215, and DSG lines 213. Peripheral circuits 202 can include various types of peripheral circuits formed using CMOS technologies. For example, FIG. 3 illustrates some exemplary peripheral circuits 202 including a page buffer 304, a column decoder/bit line driver 306, a row decoder/word line driver 308, a voltage generator 310, control logic 312, registers 314, an interface (I/F) 316, and a data bus 318. It is understood that in some examples, additional peripheral circuits 202 may be included as well.

Page buffer 304 can be configured to buffer data read from or programmed to memory cell array 201 according to the control signals of control logic 312. In one example, page buffer 304 may store one page of program data (write data) to be programmed into one page 220 of memory cell array 201. In another example, page buffer 304 also performs program verify operations to ensure that the data has been properly programmed into memory cells 206 coupled to selected word lines 218.

Row decoder/word line driver 308 can be configured to be controlled by control logic 312 and select block 204 of memory cell array 201 and a word line 218 of selected block 204. Row decoder/word line driver 308 can be further configured to drive memory cell array 201. For example, row decoder/word line driver 308 may drive memory cells 206 coupled to the selected word line 218 using a word line voltage generated from voltage generator 310.

Column decoder/bit line driver 306 can be configured to be controlled by control logic 312 and select one or more 3D NAND memory strings 208 by applying bit line voltages generated from voltage generator 310. For example, column decoder/bit line driver 306 may apply column signals for selecting a set of N bits of data from page buffer 304 to be outputted in a read operation.

Control logic 312 can be coupled to each peripheral circuit 202 and configured to control operations of peripheral circuits 202. Registers 314 can be coupled to control logic 312 and include status registers, command registers, and address registers for storing status information, command operation codes (OP codes), and command addresses for controlling the operations of each peripheral circuit 202.

Interface 316 can be coupled to control logic 312 and configured to interface memory cell array 201 with a memory controller (not shown). In some implementations, interface 316 acts as a control buffer to buffer and relay control commands received from the memory controller and/or a host (not shown) to control logic 312 and status information received from control logic 312 to the memory controller and/or the host. Interface 316 can also be coupled to page buffer 304 and column decoder/bit line driver 306 via data bus 318 and act as an I/O interface and a data buffer to buffer and relay the program data received from the memory controller and/or the host to page buffer 304 and the read data from page buffer 304 to the memory controller and/or the host. In some implementations, interface 316 and data bus 318 are parts of an I/O circuit of peripheral circuits 202.

Voltage generator 310 can be configured to be controlled by control logic 312 and generate the word line voltages (e.g., read voltage, program voltage, pass voltage, local voltage, and verification voltage) and the bit line voltages to be supplied to memory cell array 201. In some implementations, voltage generator 310 is part of a voltage source that provides voltages at various levels of different peripheral circuits 202 as described below in detail. Consistent with the scope of the present disclosure, in some implementations, the voltages provided by voltage generator 310, for example, to row decoder/word line driver 308, column decoder/bit line driver 306, and page buffer 304 are above certain levels that are sufficient to perform the memory operations. For example, the voltages provided to the page buffer circuits in page buffer 304 and/or the logic circuits in control logic 312 may be between 1.3 V and 5 V, such as 3.3 V, and the voltages provided to the driving circuits in row decoder/word line driver 308 and/or column decoder/bit line driver 306 may be between 5 V and 30 V.

Figure 4A:
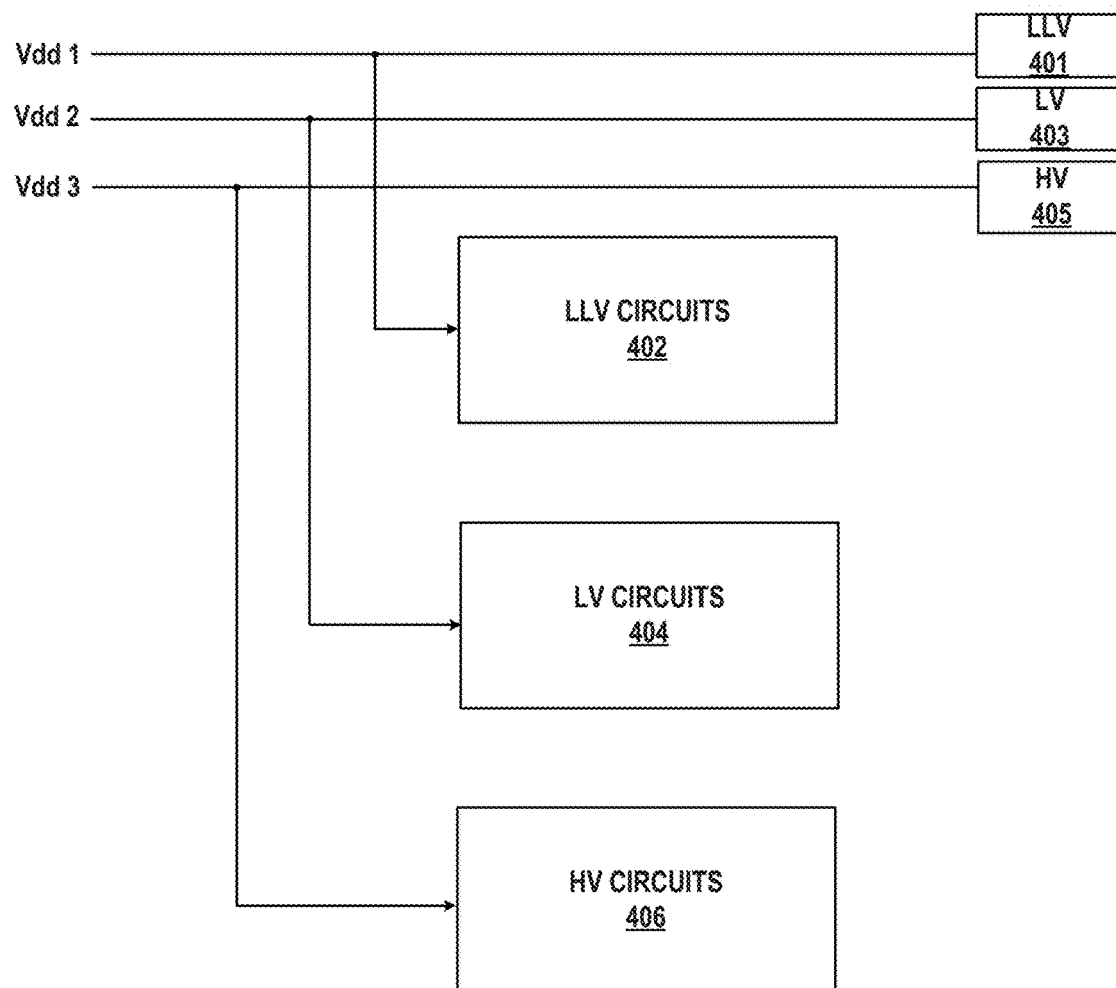
FIG. 4A illustrates a block diagram of peripheral circuits provided with various voltages, according to some aspects of the present disclosure.

Different from logic devices (e.g., microprocessors), memory devices, such as 3D NAND Flash memory, require a wide range of voltages to be supplied to different memory peripheral circuits. For example, FIG. 4A illustrates a block diagram of peripheral circuits provided with various voltages, according to some aspects of the present disclosure. In some implementations, a memory device (e.g., memory device 200) includes a low low voltage (LLV) source 401, a low voltage (LV) source 403, and a high voltage (HV) source 405, each of which is configured to provide a voltage at a respective level (Vdd1, Vdd2, or Vdd3). For example, Vdd3>Vdd2>Vdd1. Each voltage source 401, 403, or 405 can receive a voltage input at a suitable level from an external power source (e.g., a battery). Each voltage source 401, 403, or 405 can also include voltage converters and/or voltage regulators to convert the external voltage input to the respective level (Vdd1, Vdd2, or Vdd3) and maintain and output the voltage at the respective level (Vdd1, Vdd2, or Vdd3) through a corresponding power rail. In some implementations, voltage generator 310 of memory device 200 is part of voltage sources 401, 403, and 405.

In some implementations, LLV source 401 is configured to provide a voltage below 1.3 V, such as between 0.9 V and 1.2 V (e.g., 0.9 V, 0.95 V, 1 V, 1.05 V, 1.1 V, 1.15 V, 1.2 V, any range bounded by the lower end by any of these values, or in any range defined by any two of these values). In one example, the voltage is 1.2 V. In some implementations, LV source 403 is configured to provide a voltage between 1.3 V and 3.3 V (e.g., 1.3 V, 0. 1.4 V, 1.5 V, 1.6 V, 1.7 V, 1.8 V, 1.9 V, 2 V, 2.1 V, 2.2 V, 2.3 V, 2.4 V, 2.5 V, 2.6 V, 2.7 V, 2.8 V, 2.9 V, 3 V, 3.1 V, 3.2 V, 3.3 V, any range bounded by the lower end by any of these values, or in any range defined by any two of these values). In one example, the voltage is 3.3 V. In some implementations, HV source 405 is configured to provide a voltage greater than 3.3 V, such as between 5 V and 30 V (e.g., 5 V, 6 V, 7 V, 8 V, 9 V, 10 V, 11 V, 12 V, 13 V, 14 V, 15 V, 16 V, 17 V, 18 V, 19 V, 20 V, 21 V, 22 V, 23 V, 24 V, 25 V, 26 V, 27 V, 28 V, 29 V, 30 V, any range bounded by the lower end by any of these values, or in any range defined by any two of these values). It is understood that the voltage ranges described above with respect to HV source 405, LV source 403, and LLV source 401 are for illustrative purposes and non-limiting, and any other suitable voltage ranges may be provided by HV source 405, LV source 403, and LLV source 401.

Based on their suitable voltage levels (Vdd1, Vdd 2, or Vdd3), the memory peripheral circuits (e.g., peripheral circuits 202) can be categories into LLV circuits 402, LV circuits 404, and HV circuits 406, which can be coupled to LLV source 401, LV source 403, and HV source 405, respectively. In some implementations, HV circuits 406 includes one or more driving circuits that are coupled to the memory cell array (e.g., memory cell array 201) through word lines, bit lines, SSG lines, DSG lines, source lines, etc., and configured to drive the memory cell array by applying a voltage at a suitable level to the word lines, bit lines, SSG lines, DSG lines, source lines, etc., when performing memory operations (e.g., read, program, or erase). In one example, HV circuit 406 may include word line driving circuits (e.g., in row decoder/word line driver 308) that are coupled to word lines and apply a program voltage (Vprog) or a pass voltage (Vpass) in the range of, for example, 5 V and 30 V, to the word lines during program operations. In another example, HV circuit 406 may include bit line driving circuits (e.g., in column decoder/bit line driver 306) that are coupled to bit lines and apply an erase voltage (Veras) in the range of, for example, 5 V and 30 V, to bit lines during erase operations. In some implementations, LV circuits 404 include page buffer circuits (e.g., in latches of page buffer 304) and are configured to buffer the data read from or programmed to the memory cell array. For example, the page buffer may be provided with a voltage of, for example, 3.3 V, by LV source 403. LV circuits 404 can also include logic circuits (e.g., in control logic 312). In some implementations, LLV circuits 402 include an I/O circuit (e.g., in interface 316 and/or data bus 318) configured to interface the memory cell array with a memory controller. For example, the I/O circuit may be provided with a voltage of, for example, 1.2 V, by LLV source 401.

Figure 4B:
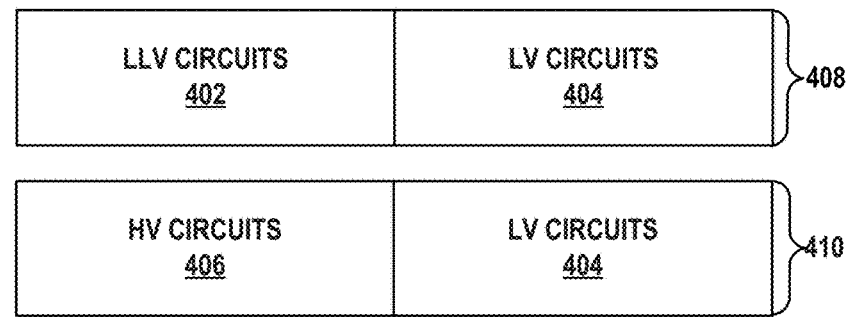
FIG. 4B illustrates a schematic diagram of peripheral circuits provided with various voltages arranged in separate semiconductor structures, according to some aspects of the present disclosure.

As described above, to reduce the total area occupied by the memory peripheral circuits, peripheral circuits 202 can be separately formed in different planes based on different performance requirements, such as the applied voltages. For example, FIG. 4B illustrates a schematic diagram of peripheral circuits provided with various voltages arranged in separate semiconductor structures, according to some aspects of the present disclosure. In some implementations, LLV circuits 402 and HV circuits 406 are separated, for example, in semiconductor structures 408 and 410, respectively, due to their significant difference in voltages and the resulting difference in device dimensions, such as different semiconductor layer (e.g., substrate or thinned substrate) thicknesses and different gate dielectric thicknesses. In one example, the thickness of the semiconductor layer (e.g., a substrate or a thinned substrate) in which HV circuits 406 are formed in semiconductor structure 410 may be larger than the thickness of the semiconductor layer (e.g., a substrate or a thinned substrate) in which LLV circuits 402 are formed in semiconductor structure 408. In another example, the thickness of the gate dielectric of transistors forming HV circuits 406 may be larger than the thickness of the gate dielectric of transistors forming LLV circuits 402. For example, the thickness difference may be at least 5-fold. It is understood that stacked LLV circuits 402 and HV circuits 406 in different planes may be formed in two semiconductor structure 408 or 410 separated by bonding interface(s) (e.g., in FIGS. 1A and 1B) or on opposite sides of a semiconductor layer (e.g., in FIGS. 1C and 1D).

LV circuits 404 can be formed in either semiconductor structure 408 or 410, or in another semiconductor, i.e., in the same plane as LLV circuits 402 or HV circuits 406, or a different plane from LLV circuits 402 and HV circuits 406. As shown in FIG. 4B, in some implementations, some of LV circuits 404 are formed in semiconductor structure 408, i.e., in the same plane as LLV circuits 402, while some of LV circuits 404 are formed in semiconductor structure 410, i.e., in the same plane as HV circuits 406. That is, LV circuits 404 can be separated into different planes as well. The thickness of the gate dielectric of transistors forming LV circuits 404 in semiconductor structure 408 can be the same as the thickness of the gate dielectric of transistors forming LV circuits 404 in semiconductor structure 410, for example, when the same voltage is applied to LV circuits 404 in different semiconductor structures 408 and 410. In some implementations, the same voltage is applied to both LV circuits 404 in semiconductor structure 408 and the LV circuits 404 in semiconductor structure 410, such that the voltage applied to HV circuits 406 in semiconductor structure 410 is higher than the voltage applied to LV circuits 404 in semiconductor structure 408 or 410, which is in turn higher than the voltage applied to LLV circuits 402 in semiconductor structure 408. Moreover, since the voltage applied to LV circuits 404 is between the voltages applied to HV circuits 406 and LLV circuits 402, the thickness of the gate dielectric of transistors forming LV circuits 404 is between the thickness of the gate dielectric of transistors forming HV circuits 406 and the thickness of the gate dielectric of transistors forming LLV circuits 402, according to some implementations. For example, the gate dielectric thickness of transistors forming LV circuits 404 may be larger than the gate dielectric thickness of transistors forming LLV circuits 402, but smaller than the gate dielectric thickness of transistors forming HV circuits 406.

Figure 7:
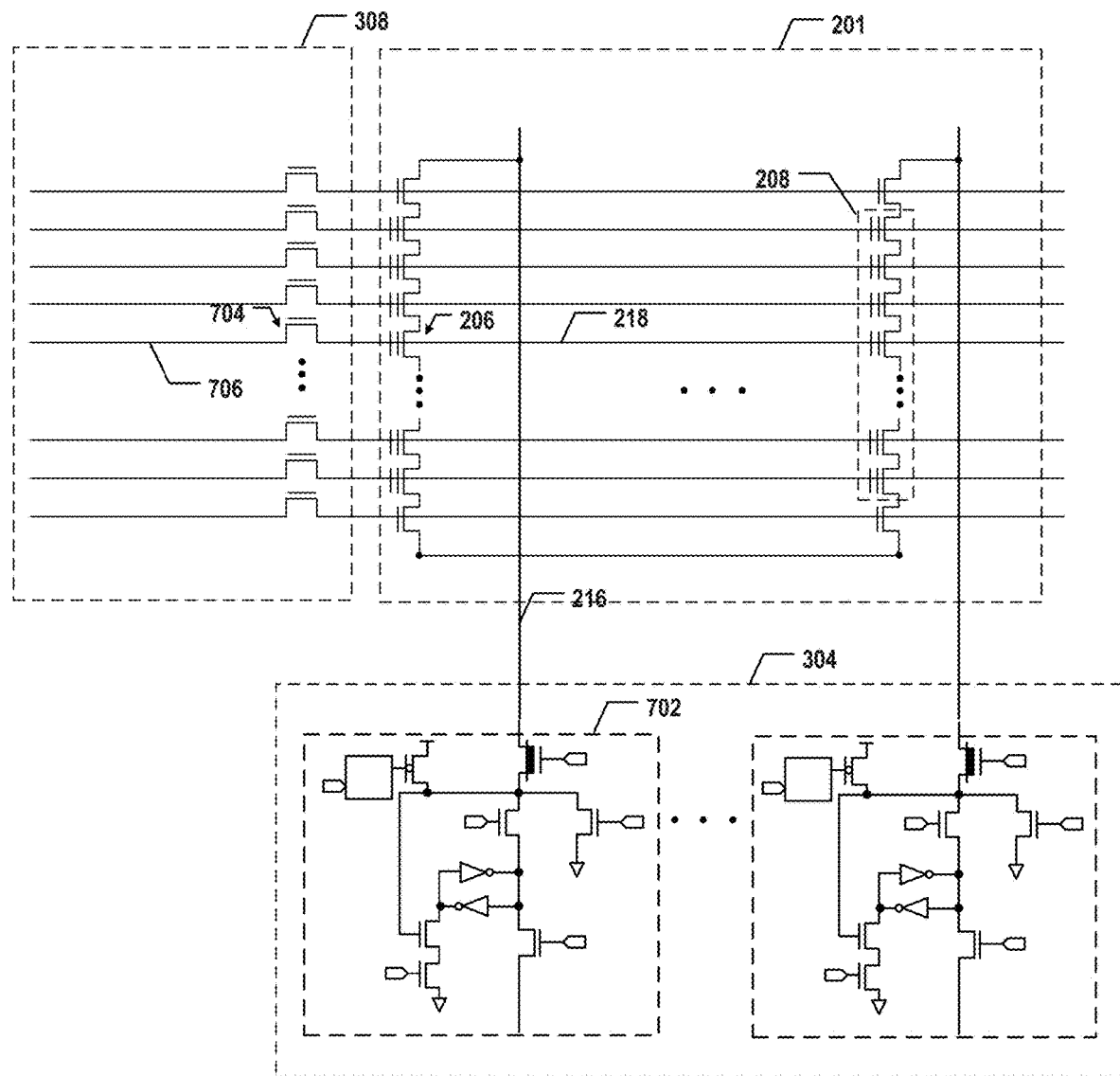
FIG. 7 illustrates a circuit diagram of a word line driver and a page buffer, according to some aspects of the present disclosure.

Based on the different performance requirements (e.g., associated with different applied voltages), peripheral circuits 202 can be separated into at least two stacked semiconductor structures 408 and 410 in different planes. In some implementations, the I/O circuits in interface 316 and/or data bus 318 (as LLV circuits 402) and logic circuits in control logic 312 (as part of LV circuits) are disposed in semiconductor structure 408, while the page buffer circuits in page buffer 304 and driving circuits in row decoder/word line driver 308 and column decoder/bit line driver 306 are disposed in semiconductor structure 410. For example, FIG. 7 illustrates a circuit diagram of word line driver 308 and page buffer 304, according to some aspects of the present disclosure.

In some implementations, page buffer 304 includes a plurality of page buffer circuits 702 each coupled to one NAND memory string 208 via a respective bit line 216. That is, memory device 200 can include bit lines 216 respectively coupled to NAND memory strings 208, and page buffer 304 can include page buffer circuits 702 respectively coupled to bit lines 216 and NAND memory strings 208. Each page buffer circuit 702 can include one or more latches, switches, supplies, nodes (e.g., data nodes and I/O nodes), current mirrors, verify logic, sense circuits, etc. In some implementations, each page buffer circuit 702 is configured to store sensing data corresponding to read data, which is received from a respective bit line 216, and output the stored sensing data to at the time of the read operation; each page buffer circuit 702 is also configured to store program data and output the stored program data to a respective bit line 216 at the time of the program operation.

In some implementations, word line driver 308 includes a plurality of string drivers 704 (a.k.a. driving circuits) respectively coupled to word lines 218. Word line driver 308 can also include a plurality of local word lines 706 (LWLs) respectively coupled to string drivers 704. Each string driver 704 can include a gate coupled to a decoder (not shown), a source/drain coupled to a respective local word line 706, and another source/drain coupled to a respective word line 218. In some memory operations, the decoder can select certain string drivers 704, for example, by applying a voltage signal greater than the threshold voltage of string drivers 704, and a voltage (e.g., program voltage, pass voltage, or erase voltage) to each local word line 706, such that the voltage is applied by each selected string driver 704 to a respective word line 218. In contrast, the decoder can also deselect certain string drivers 704, for example, by applying a voltage signal smaller than the threshold voltage of string drivers 704, such that each deselected string driver 704 floats a respective word line 218 during the memory operation.

In some implementations, page buffer circuits 702 include parts of LV circuits 404 disposed in semiconductor structures 408 and/or 410. In one example, since the number of page buffer circuits 702 increases as the number of bit numbers increases, which may occupy a large area for memory devices with large numbers of memory cells, page buffer circuits 702 may be split to semiconductor structures 408 and 410. In some implementations, string drivers 704 include parts of HV circuits 406 disposed in semiconductor structure 410.

Figure 5A:
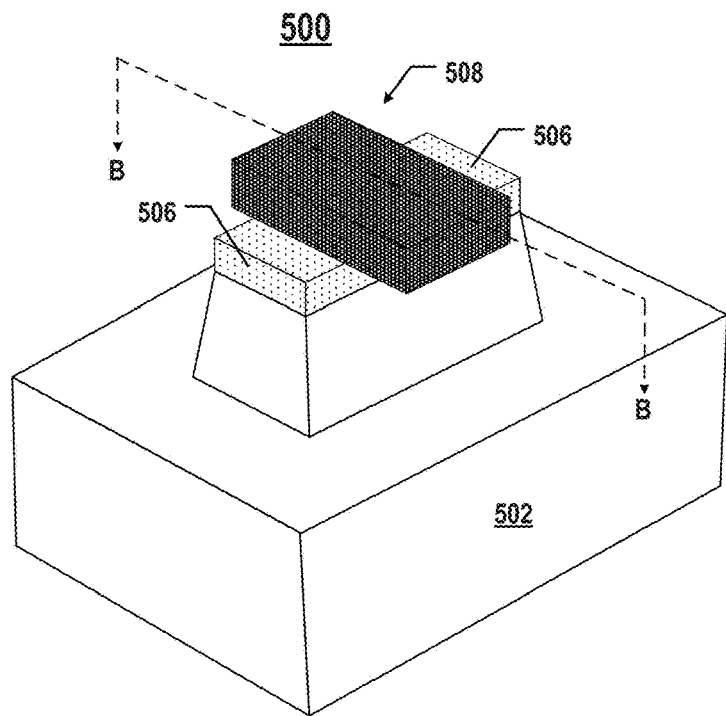
FIGS. 5A and 5B illustrate a perspective view and a side view, respectively, of a planar transistor, according to some aspects of the present disclosure.
Figure 5B:
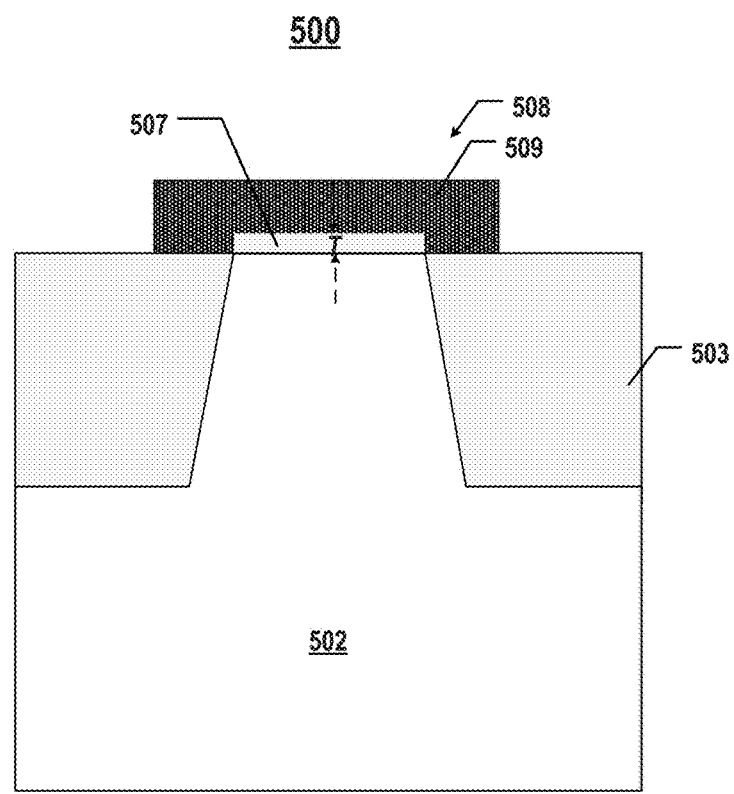
Figure 6A:
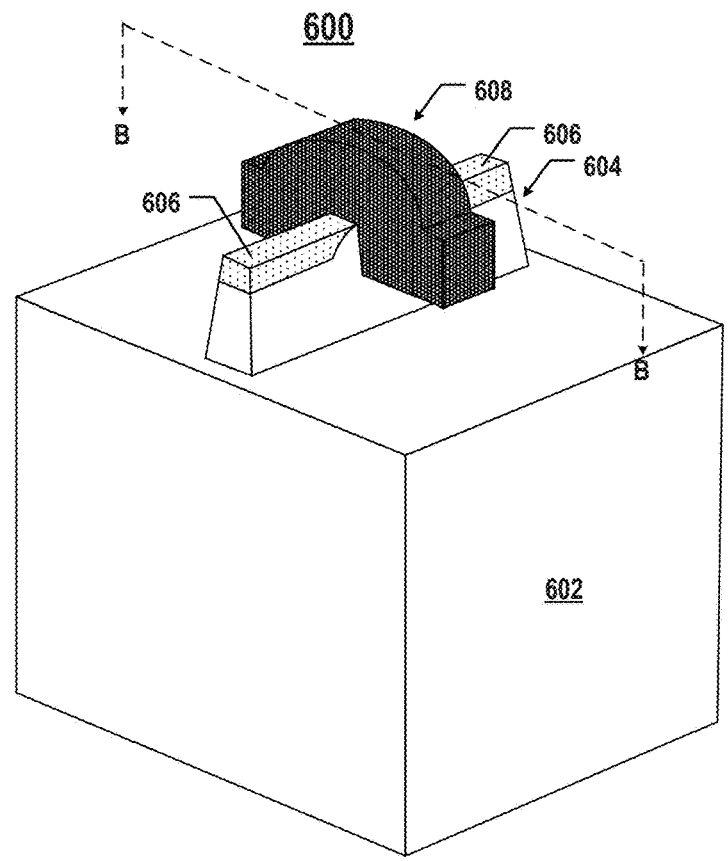
FIGS. 6A and 6B illustrate a perspective view and a side view, respectively, of a 3D transistor, according to some aspects of the present disclosure.
Figure 6B:
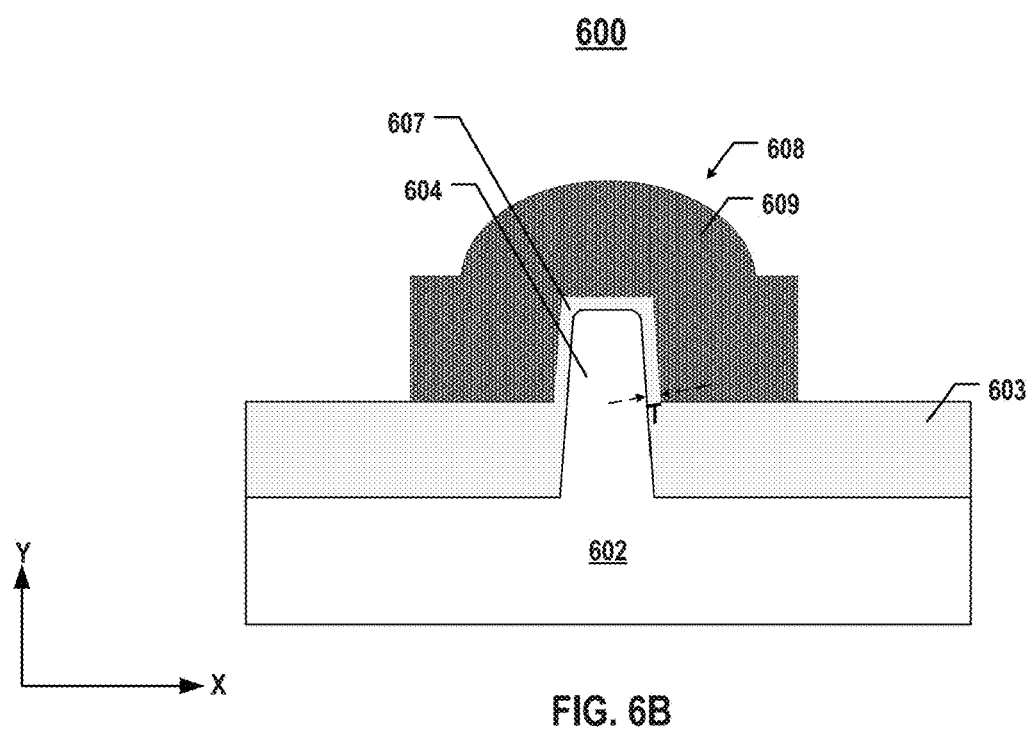

Consistent with the scope of the present disclosure. each peripheral circuit 202 can include a plurality of transistors as the basic building units thereof. The transistors can be metal-oxide-semiconductor field-effect-transistors (MOSFETs) in 2D (2D transistors, a.k.a. planar transistors) or 3D (3D transistors). For example, FIGS. 5A and 5B illustrate a perspective view and a side view, respectively, of a planar transistor 500, according to some aspects of the present disclosure, and FIGS. 6A and 6B illustrate a perspective view and a side view, respectively, of a 3D transistor 600, according to some aspects of the present disclosure. FIG. 5B illustrates the side view of the cross-section of planar transistor 500 in FIG. 5A in the BB plane, and FIG. 6B illustrates the side view of the cross-section of 3D transistor 600 in FIG. 6A in the BB plane.

As shown in FIGS. 5A and 5B, planar transistor 500 can be a MOSFET on a substrate 502, which can include silicon (e.g., single crystalline silicon, c-Si), SiGe, GaA), Ge, SOI, or any other suitable materials. Trench isolations 503, such as shallow trench isolations (STI), can be formed in substrate 502 and between adjacent planar transistors 500 to reduce current leakage. Trench isolations 503 can include any suitable dielectric materials, such as silicon oxide, silicon nitride, silicon oxynitride, or high dielectric constant (high-k) dielectrics (e.g., aluminum oxide, hafnium oxide, zirconium oxide, etc.). In some implementations, high-k dielectric materials include any dielectrics having a dielectric constant, or k-value, higher than that of silicon nitride (k>7). In some implementations, trench isolation 503 includes silicon oxide.

As shown in FIGS. 5A and 5B, planar transistor 500 can also include a gate structure 508 on substrate 502. In some implementations, gate structure 508 is on the top surface of substrate 502. As shown in FIG. 5B, gate structure 508 can include a gate dielectric 507 on substrate 502, i.e., above and in contact with the top surface of substrate 502. Gate structure 508 can also include a gate electrode 509 on gate dielectric 507, i.e., above and in contact with gate dielectric 507. Gate dielectric 507 can include any suitable dielectric materials, such as silicon oxide, silicon nitride, silicon oxynitride, or high-k dielectrics. In some implementations, gate dielectric 507 includes silicon oxide, i.e., a gate oxide. Gate electrode 509 can include any suitable conductive materials, such as polysilicon, metals (e.g., W, Cu, Al, etc.), metal compounds (e.g., TiN, TaN, etc.), or silicides. In some implementations, gate electrode 509 includes doped polysilicon, i.e., a gate poly.

As shown in FIG. 5A, planar transistor 500 can further include a pair of a source and a drain 506 in substrate 502. Source and drain 506 can be doped with any suitable P-type dopants, such as boron (B) or Gallium (Ga), or any suitable N-type dopants, such as phosphorus (P) or arsenic (As). Source and drain 506 can be separated by gate structure 508 in the plan view. In other words, gate structure 508 is formed between source and drain 506 in the plan view, according to some implementations. The channel of planar transistor 500 in substrate 502 can be formed laterally between source and drain 506 under gate structure 508 when a gate voltage applied to gate electrode 509 of gate structure 508 is above the threshold voltage of planar transistor 500. As shown in FIGS. 5A and 5B, gate structure 508 can be above and in contact with the top surface of the part of substrate 502 in which the channel can be formed (the active region). That is, gate structure 508 is in contact with only one side of the active region, i.e., in the plane of the top surface of substrate 502, according to some implementations. It is understood, although not shown in FIGS. 5A and 5B, planar transistor 500 may include additional components, such as wells and spacers.

As shown in FIGS. 6A and 6B, 3D transistor 600 can be a MOSFET on a substrate 602, which can include silicon (e.g., single crystalline silicon, c-Si), SiGe, GaAs, Ge, silicon on insulator SOI, or any other suitable materials. In some implementations, substrate 602 includes single crystalline silicon. Trench isolations 603, such as STI, can be formed in substrate 602 and between adjacent 3D transistors 600 to reduce current leakage. Trench isolations 603 can include any suitable dielectric materials, such as silicon oxide, silicon nitride, silicon oxynitride, or high-k dielectrics (e.g., aluminum oxide, hafnium oxide, zirconium oxide, etc.). In some implementations, trench isolation 603 includes silicon oxide.

As shown in FIGS. 6A and 6B, different from planar transistor 500, 3D transistor 600 can further include a 3D semiconductor body 604 above substrate 602. That is, in some implementations, 3D semiconductor body 604 at least partially extends above the top surface of substrate 602 to expose not only the top surface, but also the two side surfaces, of 3D semiconductor body 604. As shown in FIGS. 6A and 6B, for example, 3D semiconductor body 604 may be in a 3D structure, which is also known as a "fin," to expose three sides thereof. 3D semiconductor body 604 is formed from substrate 602 and thus, has the same semiconductor material as substrate 602, according to some implementations. In some implementations, 3D semiconductor body 604 includes single crystalline silicon. Since the channels can be formed in 3D semiconductor body 604, as opposed to substrate 602, 3D semiconductor body 604 may be viewed as the active region for 3D transistor 600.

As shown in FIGS. 6A and 6B, 3D transistor 600 can also include a gate structure 608 on substrate 602. Different from planar transistors 500 in which gate structure 508 is in contact with only one side of the active region, i.e., in the plane of the top surface of substrate 502, gate structure 608 of 3D transistor 600 can be in contact with a plurality of sides of the active region, i.e., in multiple planes of the top surface and side surfaces of the 3D semiconductor body 604. In other words, the active region of 3D transistor 600, i.e., 3D semiconductor body 604, can be at least partially surrounded by gate structure 608.

Gate structure 608 can include a gate dielectric 607 over 3D semiconductor body 604, e.g., in contact with the top surface and two side surfaces of 3D semiconductor body 604. Gate structure 608 can also include a gate electrode 609 over and in contact with gate dielectric 607. Gate dielectric 607 can include any suitable dielectric materials, such as silicon oxide, silicon nitride, silicon oxynitride, or high-k dielectrics. In some implementations, gate dielectric 607 includes silicon oxide, i.e., a gate oxide. Gate electrode 609 can include any suitable conductive materials, such as polysilicon, metals (e.g., W, Cu, Al, etc.), metal compounds (e.g., TiN, TaN, etc.), or silicides. In some implementations, gate electrode 609 includes doped polysilicon, i.e., a gate poly.

As shown in FIG. 6A, 3D transistor 600 can further include a pair of a source and a drain 606 in 3D semiconductor body 604. Source and drain 606 can be doped with any suitable P-type dopants, such as B or Ga, or any suitable N-type dopants, such as P or Ar. Source and drain 606 can be separated by gate structure 608 in the plan view. In other words, gate structure 608 is formed between source and drain 606 in the plan view, according to some implementations. As a result, multiple channels of 3D transistor 600 in 3D semiconductor body 604 can be formed laterally between source and drain 606 surrounded by gate structure 608 when a gate voltage applied to gate electrode 609 of gate structure 608 is above the threshold voltage of 3D transistor 600. Different from planar transistor 500 in which only a single channel can be formed on the top surface of substrate 502, multiple channels can be formed on the top surface and side surfaces of 3D semiconductor body 604 in 3D transistor 600. In some implementations, 3D transistor 600 includes a multi-gate transistor. It is understood, although not shown in FIGS. 6A, and 6B, 3D transistor 600 may include additional components, such as wells, spacers, and stressors (a.k.a. strain elements) at source and drain 606.

It is further understood that FIGS. 6A and 6B illustrate one example of 3D transistors that can be used in memory peripheral circuits, and any other suitable 3D multi-gate transistors may be used in memory peripheral circuits as well, including, for example, a gate all around (GAA) silicon on nothing (SON) transistor, a multiple independent gate FET (MIGET), a trigate FET, a H-gate FET, and a Ω-FET, a quadruple gate FET, a cylindrical FET, or a multi-bridge/stacked nanowire FET.

Regardless of planar transistor 500 or 3D transistor 600, each transistor a memory peripheral circuit can include a gate dielectric (e.g., gate dielectrics 507 and 607) having a thickness T (gate dielectric thickness, e.g., shown in FIGS. 5B and 6B). The gate dielectric thickness T of a transistor can be designed to accommodate the voltage applied to the transistor. For example, referring to FIGS. 4A and 4B, the gate dielectric thickness of transistors in HV circuits 406 (e.g., driving circuits such as string drivers 704) may be larger than the gate dielectric thickness of transistors in LV circuits 404 (e.g., page buffer circuits 702 or logic circuits in control logic 312), which may be in turn larger than the gate dielectric thickness of transistors in LLV circuits 402 (e.g., I/O circuits in interface 316 and data bus 318). In some implementations, the difference between the gate dielectric thickness of transistors in HV circuits 406 and the dielectric thickness of transistors in LLV circuits 402 is at least 5-fold, such as between 5-fold and 50-fold. For example, the gate dielectric thickness of transistors in HV circuits 406 may be at least 5 times larger than the gate dielectric thickness of transistors in LLV circuits 402.

In some implementations, the dielectric thickness of transistors in LLV circuits 402 is between 2 nm and 4 nm (e.g., 2 nm, 2.1 nm, 2.2 nm, 2.3 nm, 2.4 nm, 2.5 nm, 2.6 nm, 2.7 nm, 2.8 nm, 2.9 nm, 3 nm, 3.1 nm, 3.2 nm, 3.3 nm, 3.4 nm, 3.5 nm, 3.6 nm, 3.7 nm, 3.8 nm, 3.9 nm, 4 nm, any range bounded by the lower end by any of these values, or in any range defined by any two of these values). It is understood that the thickness may be commensurate with the LLV voltage range applied to LLV circuits 402, as described above in detail, such as below 1.3 V (e.g., 1.2 V). In some implementations, the dielectric thickness of transistors in LV circuits 404 is between 4 nm and 10 nm (e.g., 4 nm, 4.5 nm, 5 nm, 5.5 nm, 6 nm, 6.5 nm, 7 nm, 7.5 nm, 8 nm, 8.5 nm, 9 nm. 9.5 nm, 10 nm, any range bounded by the lower end by any of these values, or in any range defined by any two of these values). It is understood that the thickness may be commensurate with the LV voltage range applied to LV circuits 404, as described above in detail, such as between 1.3 V and 3.3 V (e.g., 3.3 V). In some implementations, the dielectric thickness of transistors in HV circuits 406 is between 20 nm and 100 nm (e.g., 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, 45 nm, 50 nm, 55 nm, 60 nm, 65 nm, 70 nm, 75 nm, 80 nm, 85 nm, 90 nm, 95 nm, 100 nm, any range bounded by the lower end by any of these values, or in any range defined by any two of these values). It is understood that the thickness may be commensurate with the HV voltage range applied to HV circuits 406, as described above in detail, such as greater than 3.3 V (e.g., between 5 V and 30 V).

Figure 9A:
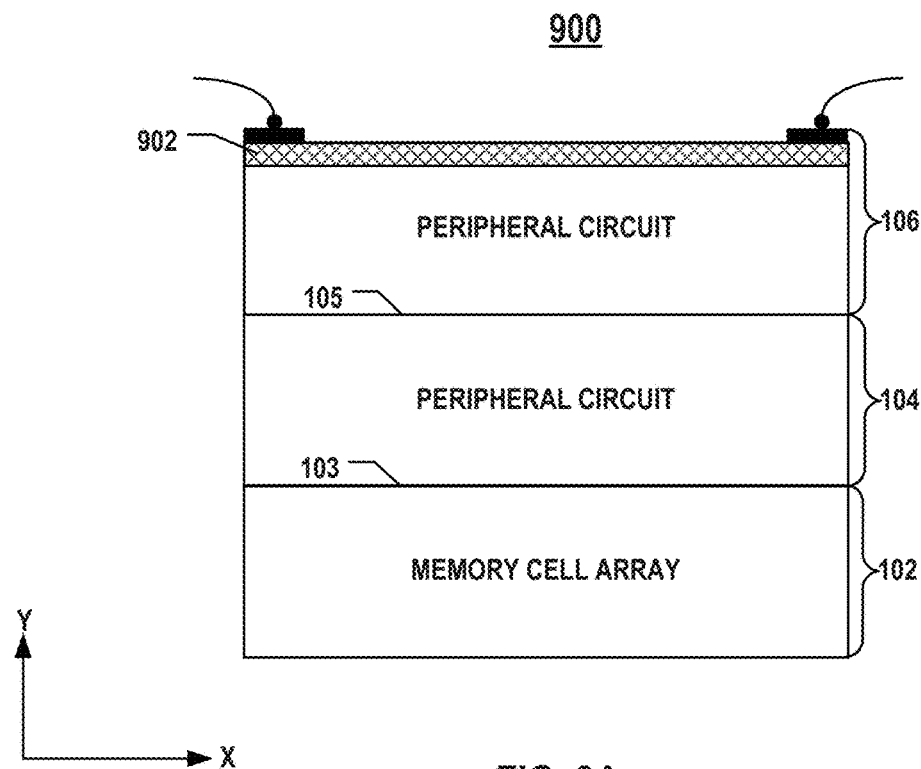
FIGS. 9A and 9B illustrate schematic views of cross-sections of 3D memory devices having three stacked semiconductor structures, according to various aspects of the present disclosure.
Figure 9B:
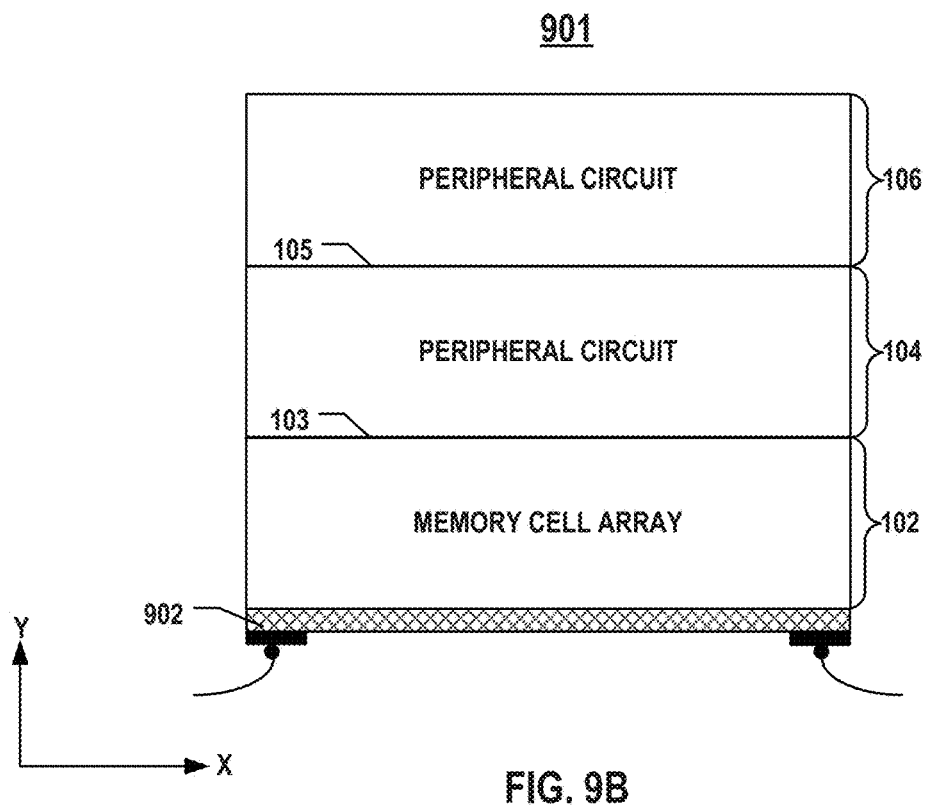

FIGS. 9A and 9B illustrate schematic views of cross-sections of 3D memory devices 900 and 901 having three stacked semiconductor structures, according to various aspects of the present disclosure. 3D memory devices 900 and 901 may be examples of 3D memory device 100 in FIG. 1A in which second semiconductor structure 104 including some of the peripheral circuits is disposed vertically between first semiconductor structure 102 including the memory cell array and third semiconductor structure 106 including some of the peripheral circuits. In other words, as shown in FIGS. 9A and 9B, first semiconductor structure 102 including the memory cell array of 3D memory devices 900 and 901 is disposed on one side of 3D memory devices 900 and 901, third semiconductor structure 106 including some of the peripheral circuits is disposed on another side of 3D memory devices 900 and 901, and second semiconductor structure 104 including some of the peripheral circuits is disposed in the intermediate of 3D memory devices 900 and 901 (i.e., between 3D memory devices 900 and 901) in the vertical direction, according to some implementations. Second and third semiconductor structures 104 and 106 each including peripheral circuits can be immediately adjacent to one another in three stacked semiconductor structures 102, 104, and 106.

The above-mentioned arrangement of first, second, and third semiconductor structures 102, 104, and 106, where first semiconductor structure 102 is on one side of 3D memory devices 900 and 901, are described below in detail with respect to various examples, such as in FIGS. 10A, 10B, 16A, 16B, 22A, 22B, 28A, and 28B. The above-mentioned arrangement of first, second, and third semiconductor structures 102, 104, and 106 can simplify the fabrication process by using the substrate of first semiconductor structure 102 on which the memory cell array is formed as the base substrate to provide the support for processes, such as thinning, bonding, contact formation, etc. applied to second semiconductor structure 104 and/or third semiconductor structure 106 without the need of introducing another handle substrate (carrier wafer). Moreover, the electrical connections between the memory cell array and the peripheral circuits in each of second and third semiconductor structures 104 and 106 can be formed without penetrating the substrate of first semiconductor structure 102 on which the memory cell array is formed, thereby reducing the wiring length and complexity. Furthermore, in some implementations, by arranging the first semiconductor structure 102 having the memory cell array on one side of 3D memory devices 900 and 901, the substrate (e.g., a silicon substrate having single crystalline silicon) of first semiconductor structure 102 on which the memory cell array is formed is able to be relatively easily replaced with a semiconductor layer having a different material (e.g., a polysilicon layer), which is suitable for certain channel structures (e.g., bottom open channel structure 812C) of "charge trap" type of NAND memory strings or "floating gate" type of NAND memory strings.

Moreover, as shown in FIGS. 9A and 9B, 3D memory device 900 or 901 can further include a pad-out interconnect layer 902 for pad-out purposes, i.e., interconnecting with external devices using contact pads on which bonding wires can be soldered. In one example shown in FIG. 9A, third semiconductor structure 106 including some of the peripheral circuits on one side of 3D memory device 900 may include the pad-out interconnect layer 902, such that 3D memory device 900 may be pad-out from the peripheral circuit side to reduce the interconnect distance between contact pads and the peripheral circuits, thereby decreasing the parasitic capacitance from the interconnects and improving the electrical performance of 3D memory device 900. In another example shown in FIG. 9B, first semiconductor structure 102 including the memory cell array on another side of 3D memory device 901 may include pad-out interconnect layer 902, such that 3D memory device 901 may be pad-out from the memory cell array side.

Figure 10A:
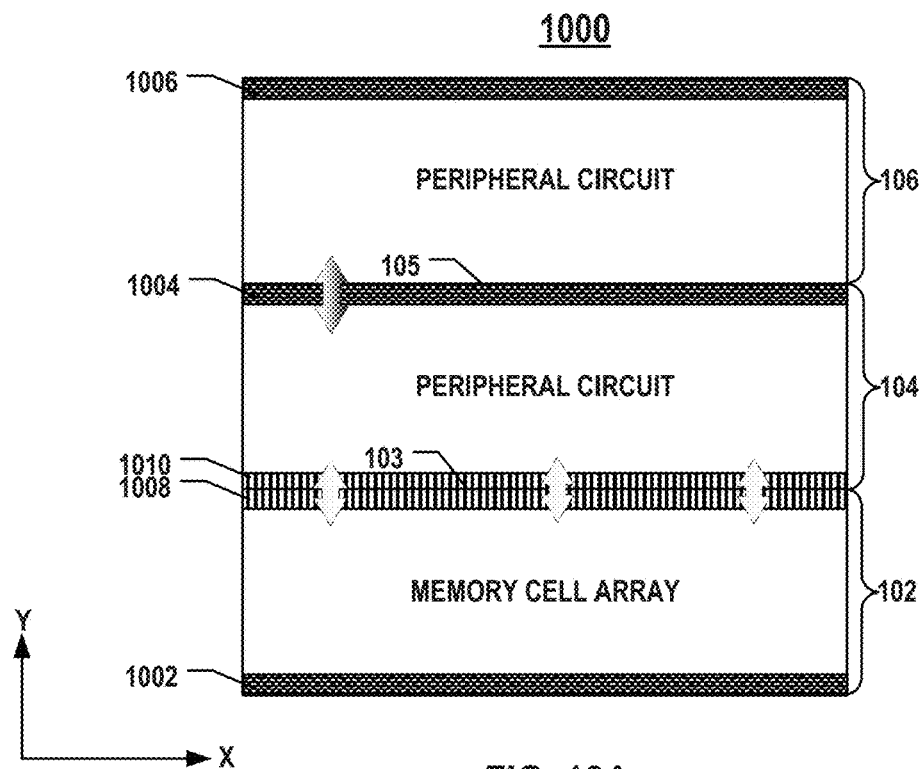
FIGS. 10A and 10B illustrate schematic views of cross-sections of the 3D memory devices in FIGS. 9A and 9B, according to various aspects of the present disclosure.
Figure 10B:
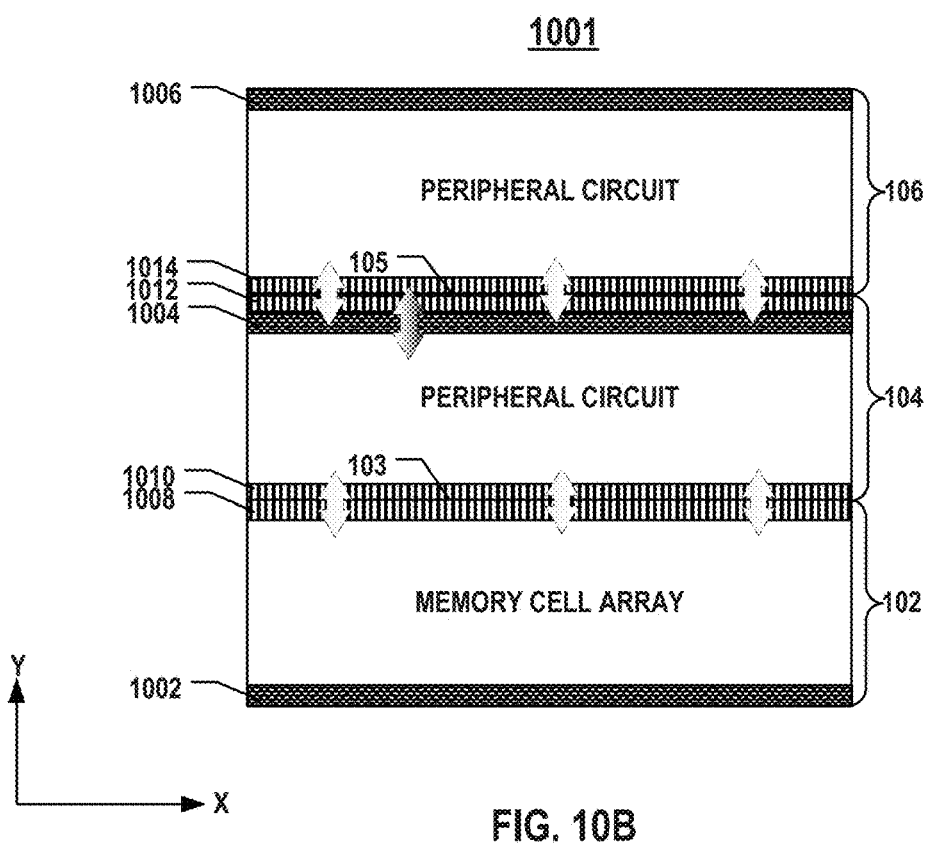

FIGS. 10A and 10B illustrate schematic views of cross-sections of the 3D memory devices in FIGS. 9A and 9B, according to various aspects of the present disclosure. 3D memory devices 1000 and 1001 may be examples of 3D memory devices 900 and 901 in FIGS. 9A and 9B. As shown in FIG. 10A, 3D memory device 1000 can include stacked first, second, and third semiconductor structures 102, 104, and 106. In some implementations, first semiconductor structure 102 on one side of 3D memory device 1000 includes a semiconductor layer 1002, a bonding layer 1008, and a memory cell array vertically between semiconductor layer 1002 and bonding layer 1008. The memory cell array can include an array of NAND memory strings (e.g., NAND memory strings 208 disclosed herein), and the sources of the array of NAND memory strings can be in contact with semiconductor layer 1002 (e.g., as shown in FIGS. 8A-8C). Semiconductor layer 1002 can include semiconductor materials, such as single crystalline silicon (e.g., a silicon substrate or a thinned silicon substrate) or polysilicon (e.g., a deposited layer), for example, depending on the types of channel structures of the NAND memory strings (e.g., bottom plug channel structure 812A, sidewall plug channel structure 812B, or bottom open channel structure 812C). Bonding layer 1008 can include conductive bonding contacts (not shown) and dielectrics electrically isolating the bonding contacts, which can be used, for example, for hybrid bonding as described below in detail.

In some implementations, second semiconductor structure 104 in the intermediate of 3D memory device 1000 (i.e., between first and third semiconductor structures 102 and 106) includes a semiconductor layer 1004, a bonding layer 1010, and some of the peripheral circuits of the memory cell array that are vertically between semiconductor layer 1004 and bonding layer 1010. The transistors (e.g., planar transistors 500 and 3D transistors 600) of the peripheral circuits can be in contact with semiconductor layer 1004. Semiconductor layer 1004 can include semiconductor materials, such as single crystalline silicon (e.g., a layer transferred from a silicon substrate or an SOI substrate). It is understood that in some examples, different from semiconductor layer 1002 in first semiconductor structure 102, semiconductor layer 1004 on which the transistors are formed may include single crystalline silicon, but not polysilicon, due to the superior carrier mobility of single crystalline silicon that is desirable for transistors' performance. Similar to bonding layer 1008 in first semiconductor structure 102, bonding layer 1010 can also include conductive bonding contacts (not shown) and dielectrics electrically isolating the bonding contacts. Bonding interface 103 is vertically between and in contact with bonding layers 1008 and 1010, respectively, according to some implementations. That is, bonding layers 1008 and 1010 can be disposed on opposite sides of bonding interface 103, and the bonding contacts of bonding layer 1008 can be in contact with the bonding contacts of bonding layer 1010 at bonding interface 103. As a result, a large number (e.g., millions) of bonding contacts across bonding interface 103 can make direct, short-distance (e.g., micron-level) electrical connections between adjacent semiconductor structures 102 and 104.

In some implementations, third semiconductor structure 106 on another side of 3D memory device 1000 includes a semiconductor layer 1006 and some of the peripheral circuits of the memory cell array that are vertically between semiconductor layer 1006 and semiconductor layer 1006. The transistors (e.g., planar transistors 500 and/or 3D transistors 600) of the peripheral circuits can be in contact with semiconductor layer 1006. Semiconductor layer 1006 can include semiconductor materials, such as single crystalline silicon (e.g., a silicon substrate or a thinned silicon substrate). It is understood that in some examples, different from semiconductor layer 1002 in first semiconductor structure 102, semiconductor layer 1006 on which the transistors are formed may include single crystalline silicon, but not polysilicon, due to the superior carrier mobility of single crystalline silicon that is desirable for transistors' performance. It is understood that different from bonding interface 103 between first and second semiconductor structures 102 and 104, which is between bonding layers 1008 and 1010 and results from hybrid bonding, bonding interface 105 between second and third semiconductor structures 104 and 106 may result from transfer bonding, as described below in detail, and thus, may not be formed between two bonding layers. That is, third semiconductor structure 106 of 3D memory device 1000 in FIG. 10A does not include a bonding layer with bonding contacts, according to some implementations. As a result, instead of bonding contacts, through contacts (e.g., ILVs/TSVs) across bonding interface 105 and through semiconductor layer 1004 vertically between second and third semiconductor structures 104 and 106 can make direct, short-distance (e.g., submicron-level) electrical connections between adjacent semiconductor structures 104 and 106.

It is understood that in some examples, second and third semiconductor structures 104 and 106 may also include bonding layers 1012 and 1014, respectively, disposed on opposite sides of bonding interface 105, as shown in FIG. 10B. In FIG. 10B, second semiconductor structure 104 of a 3D memory device 1001 can include two bonding layers 1010 and 1012 on two sides thereof, and bonding layer 1012 can be disposed vertically between semiconductor layer 1004 and bonding interface 105. Third semiconductor structure 106 of 3D memory device 1001 can include bonding layer 1014 disposed vertically between bonding interface 105 and the peripheral circuits thereof. Each bonding layer 1012 and 1014 can include conductive bonding contacts (not shown) and dielectrics electrically isolating the bonding contacts. The bonding contacts of bonding layer 1012 can be in contact with the bonding contacts of bonding layer 1014 at bonding interface 105. As a result, bonding contacts across bonding interface 105 in conjunction with through contacts (e.g., ILVs/TSVs) through semiconductor layer 1004 can make direct, short-distance (e.g., micron-level) electrical connections between adjacent semiconductor structures 104 and 106.

As shown in FIGS. 10A and 10B, since third and second semiconductor structures 106 and 104 are bonded in a face-to-back manner (e.g., each semiconductor layer 1006 or 1004 being disposed on the top side of respective third or second semiconductor structure 106 or 104 in FIGS. 10A and 10B), the transistors in third and second semiconductor structures 106 and 104 are disposed toward the same direction (e.g., the negative y-direction in FIG. 10A), according to some implementations. In some implementations, the transistors of the peripheral circuits in third semiconductor structure 106 are disposed vertically between bonding interface 105 and semiconductor layer 1006, and the transistors of the peripheral circuits in second semiconductor structure 104 are disposed vertically between bonding interface 103 and semiconductor layer 1004. Moreover, since first and second semiconductor structures 102 and 104 are bonded in a face-to-face manner (e.g., semiconductor layer 1002 being disposed on the bottom side of first semiconductor structure 102, while semiconductor layer 1004 being disposed on the top side of second semiconductor structure 104 in FIGS. 10A and 10B), the transistors of peripheral circuits in third and second semiconductor structures 106 and 104 are disposed toward the same direction, facing the memory cell array in first semiconductor structure 102, according to some implementations. It is understood that pad-out interconnect layer 902 in FIG. 9A or 9B is omitted from 3D memory devices 1000 and 1001 in FIGS. 10A and 10B for ease of illustration and may be included in 3D memory devices 1000 and 1001 as described above with respect to FIGS. 9A and 9B.

As described above, second and third semiconductor structures 104 and 106 can have peripheral circuits having transistors with different applied voltages. For example, second semiconductor structure 104 may be one example of semiconductor structure 408 including LLV circuits 402 (and LV circuits 404 in some examples) in FIG. 4B, and third semiconductor structure 106 may be one example of semiconductor structure 410 including HV circuits 406 (and LV circuits 404 in some examples) in FIG. 4B, or vice versa. Thus, in some implementations, semiconductor layers 1006 and 1004 in third and second semiconductor structures 106 and 104 have different thicknesses to accommodate the transistors with different applied voltages. In one example, third semiconductor structure 106 may include HV circuits 406 and second semiconductor structure 104 may include LLV circuits 402, and the thickness of semiconductor layer 1006 in third semiconductor structure 106 may be larger than the thickness of semiconductor layer 1004 in second semiconductor structure 104. Moreover, in some implementations, the gate dielectrics of the transistors in third and second semiconductor structures 106 and 104 have different thicknesses as well to accommodate the different applied voltages. In one example, third semiconductor structure 106 may include HV circuits 406 and second semiconductor structure 104 may include LLV circuits 402, and the thickness of the gate dielectrics of the transistors in third semiconductor structure 106 may be larger (e.g., at least 5-fold) than the thickness of the gate dielectrics of the transistors in second semiconductor structure 104. The thicker gate dielectric can sustain a higher working voltage applied to the transistors in third semiconductor structure 106 than the transistors in second semiconductor structure 104 to avoid break down during high voltage operations.

As shown in FIGS. 10A and 10B, the peripheral circuits in second semiconductor structure 104 and/or the peripheral circuits in third semiconductor structures 106 can be disposed between bonding interface 103 and semiconductor layer 1006 of third semiconductor structure 106. The peripheral circuits in second semiconductor structure 104 and/or the peripheral circuits in third semiconductor structures 106 can also be disposed between the memory cell array in first semiconductor structure 102 and semiconductor layer 1006 of third semiconductor structure 106.

Figure 11A:
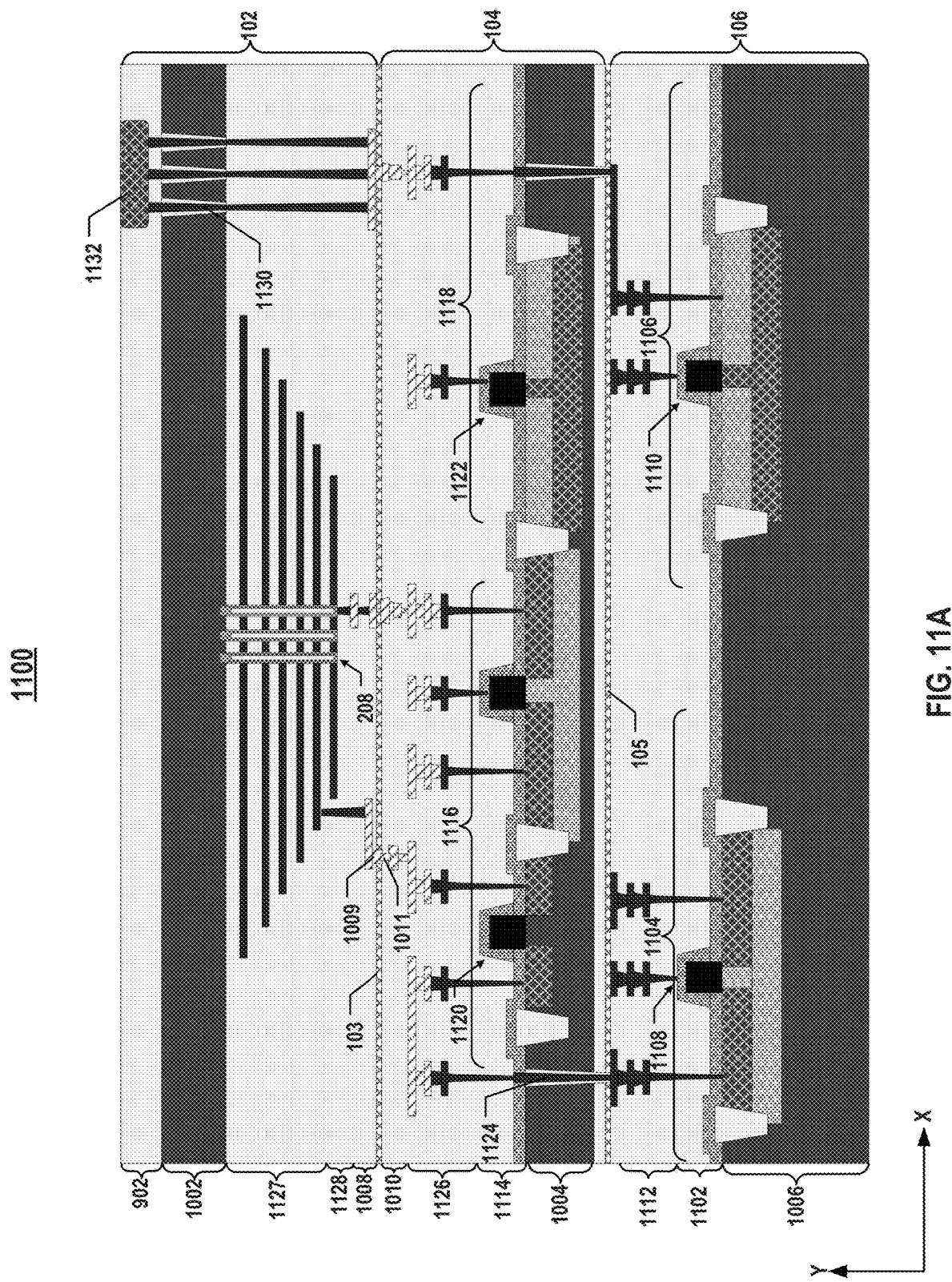
FIGS. 11A-11C illustrate side views of various examples of the 3D memory devices in FIGS. 10A and 10B, according to various aspects of the present disclosure.
Figure 11B:
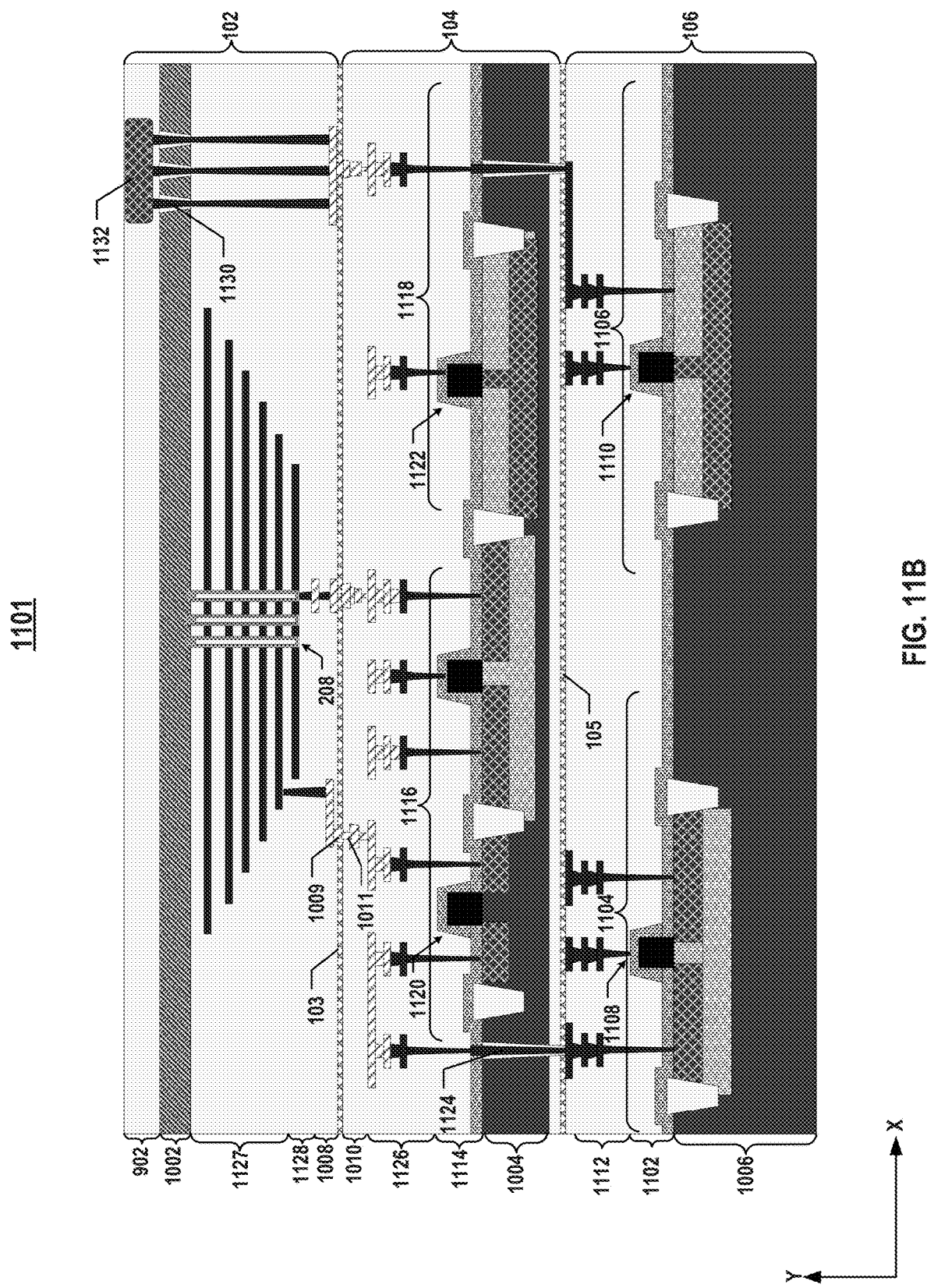
Figure 11C:
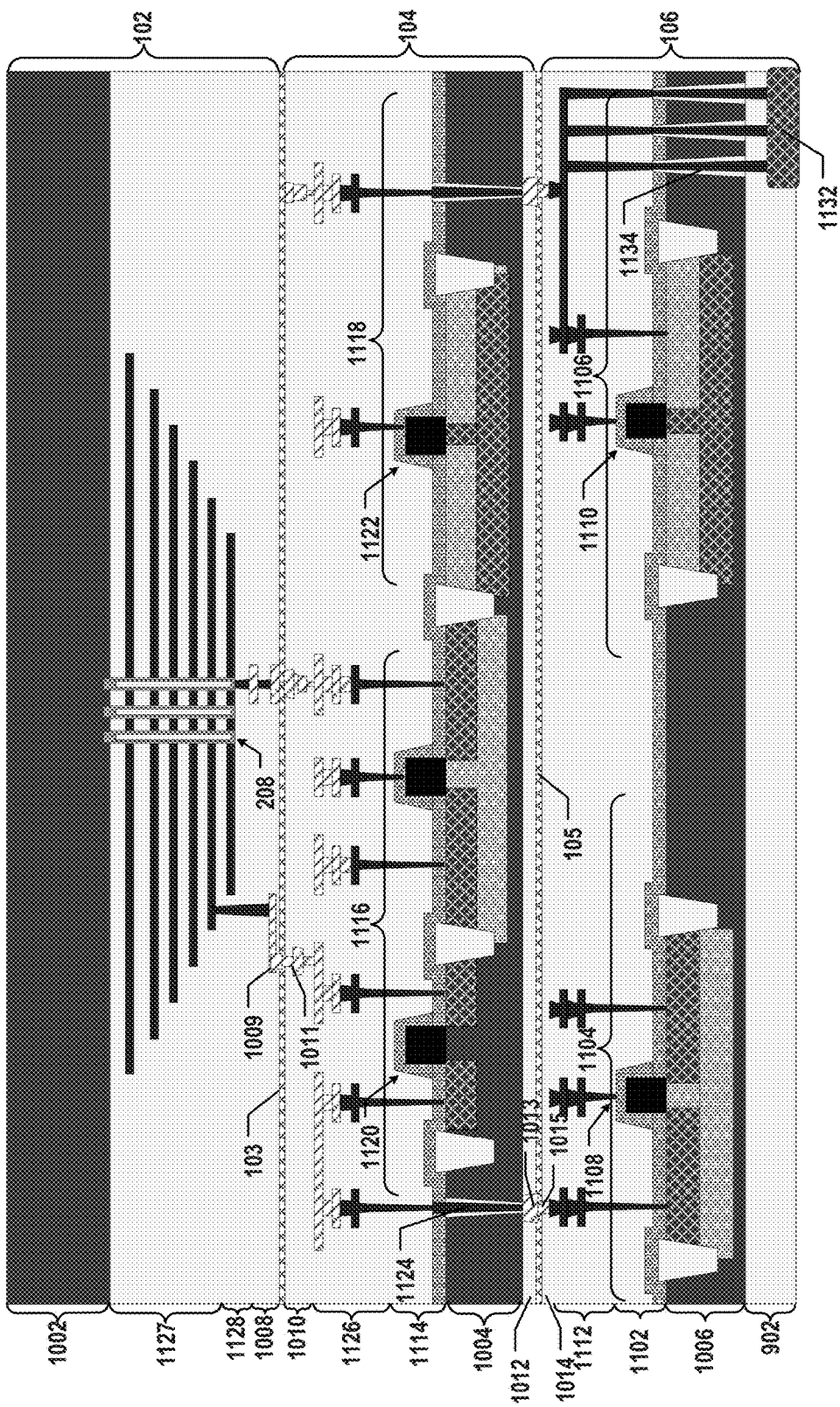

FIGS. 11A-11C illustrate side views of various examples of 3D memory devices 1000 and 1001 in FIGS. 10A and 10B, according to various aspects of the present disclosure. As shown in FIG. 11A, as one example of 3D memory devices 1000 and 1001 in FIGS. 10A and 10B, 3D memory device 1100 is a bonded chip including first semiconductor structure 102, second semiconductor structure 104, and third semiconductor structure 106, which are stacked over one another in different planes in the vertical direction (e.g., they-direction in FIG. 11A), according to some implementations. First and second semiconductor structures 102 and 104 are bonded at bonding interface 103 therebetween, and second and third semiconductor structures 104 and 106 are bonded at bonding interface 105 therebetween, according to some implementations.

As shown in FIG. 11A, third semiconductor structure 106 can include semiconductor layer 1006 having semiconductor materials. In some implementations, semiconductor layer 1006 is a silicon substrate having single crystalline silicon. Third semiconductor structure 106 can also include a device layer 1102 above and in contact with semiconductor layer 1006. In some implementations, device layer 1102 includes a first peripheral circuit 1104 and a second peripheral circuit 1106. First peripheral circuit 1104 can include HV circuits 406, such as driving circuits (e.g., string drivers 704 in row decoder/word line driver 308 and drivers in column decoder/bit line driver 306), and second peripheral circuit 1106 can include LV circuits 404, such as page buffer circuits (e.g., page buffer circuits 702 in page buffer 304) and logic circuits (e.g., in control logic 312). In some implementations, first peripheral circuit 1104 includes a plurality of transistors 1108 in contact with semiconductor layer 1006, and second peripheral circuit 1106 includes a plurality of transistors 1110 in contact with semiconductor layer 1006. Transistors 1108 and 1110 can include any transistors disclosed herein, such as planar transistors 500 and 3D transistors 600. As described above in detail with respect to transistors 500 and 600, in some implementations, each transistor 1108 or 1110 includes a gate dielectric, and the thickness of the gate dielectric of transistor 1108 (e.g., in HV circuit 406) is larger than the thickness of the gate dielectric of transistor 1110 (e.g., in LV circuit 404) due to the higher voltage applied to transistor 1108 than transistor 1110. Trench isolations (e.g., STIs) and doped regions (e.g., wells, sources, and drains of transistors 1108 and 1110) can be formed on or in semiconductor layer 1006 as well.

In some implementations, third semiconductor structure 106 further includes an interconnect layer 1112 above device layer 1102 to transfer electrical signals to and from peripheral circuits 1106 and 1104. As shown in FIG. 11A, interconnect layer 1112 can be vertically between bonding interface 105 and device layer 1102 (including transistors 1108 and 1110 of peripheral circuits 1104 and 1106). Interconnect layer 1112 can include a plurality of interconnects (also referred to herein as "contacts"), including lateral lines and vias. As used herein, the term "interconnects" can broadly include any suitable types of interconnects, such as middle-end-of-line (MEOL) interconnects and back-end-of-line (BEOL) interconnects. The interconnects in interconnect layer 1112 can be coupled to transistors 1108 and 1110 of peripheral circuits 1104 and 1106 in device layer 1102. Interconnect layer 1112 can further include one or more interlayer dielectric (ILD) layers (also known as "intermetal dielectric (IMD) layers") in which the lateral lines and vias can form. That is, interconnect layer 1112 can include lateral lines and vias in multiple ILD layers. In some implementations, the devices in device layer 1102 are coupled to one another through the interconnects in interconnect layer 1112. For example, peripheral circuit 1104 may be coupled to peripheral circuit 1106 through interconnect layer 1112. The interconnects in interconnect layer 1112 can include conductive materials including, but not limited to, W, Co, Cu, Al, silicides, or any combination thereof. The ILD layers in interconnect layer 1112 can include dielectric materials including, but not limited to, silicon oxide, silicon nitride, silicon oxynitride, low dielectric constant (low-k) dielectrics, or any combination thereof. In some implementations, the interconnects in interconnect layer 1112 include W, which has a relatively high thermal budget (compatible with high-temperature processes) and good quality (fewer detects, e.g., voids) among conductive metal materials.

Second semiconductor structure 104 can be bonded on top of third semiconductor structure 106 in a back-to-face manner at bonding interface 105. Second semiconductor structure 104 can include semiconductor layer 1004 having semiconductor materials. In some implementations, semiconductor layer 1004 is a layer of single crystalline silicon transferred from a silicon substrate or an SOI substrate and attached to the top surface of third semiconductor structure 106 by transfer bonding. In some implementations, bonding interface 105 is disposed vertically between interconnect layer 1112 and semiconductor layer 1004 as a result of transfer bonding, which transfers semiconductor layer 1004 from another substrate and bonds semiconductor layer 1004 onto third semiconductor structure 106 as described below in detail. In some implementations, bonding interface 105 is the place at which interconnect layer 1112 and semiconductor layer 1004 are met and bonded. In practice, bonding interface 105 can be a layer with a certain thickness that includes the top surface of interconnect layer 1112 of third semiconductor structure 106 and the bottom surface of semiconductor layer 1004 of second semiconductor structure 104. In some implementations, dielectric layer(s) (e.g., silicon oxide layer) are formed vertically between bonding interface 105 and semiconductor layer 1004 and/or between bonding interface 105 and interconnect layer 1112 to facilitate the transfer bonding of semiconductor layer 1004 onto interconnect layer 1112. Thus, it is understood that bonding interface 105 may include the surfaces of the dielectric layer(s) in some examples.

Second semiconductor structure 104 can include a device layer 1114 above and in contact with semiconductor layer 1004. In some implementations, device layer 1114 includes a third peripheral circuit 1116 and a fourth peripheral circuit 1118. Third peripheral circuit 1116 can include LLV circuits 402, such as I/O circuits (e.g., in interface 316 and data bus 318), and fourth peripheral circuit 1118 can include LV circuits 404, such as page buffer circuits (e.g., page buffer circuits 702 in page buffer 304) and logic circuits (e.g., in control logic 312). In some implementations, third peripheral circuit 1116 includes a plurality of transistors 1120, and fourth peripheral circuit 1118 includes a plurality of transistors 1122 as well. Transistors 1120 and 1122 can include any transistors disclosed herein, such as planar transistors 500 and 3D transistors 600. As described above in detail with respect to transistors 500 and 600, in some implementations, each transistor 1120 or 1122 includes a gate dielectric, and the thickness of the gate dielectric of transistor 1120 (e.g., in LLV circuit 402) is smaller than the thickness of the gate dielectric of transistor 1122 (e.g., in LV circuit 404) due to the lower voltage applied to transistor 1120 than transistor 1122. Trench isolations (e.g., STIs) and doped regions (e.g., wells, sources, and drains of transistors 1120 and 1122) can be formed on or in semiconductor layer 1004 as well.

Moreover, the different voltages applied to different transistors 1120, 1122, 1108, and 1110 in second and third semiconductor structures 104 and 106 can lead to differences of device dimensions between second and third semiconductor structures 104 and 106. In some implementations, the thickness of the gate dielectric of transistor 1108 (e.g., in HV circuit 406) is larger than the thickness of the gate dielectric of transistor 1120 (e.g., in LLV circuit 402) due to the higher voltage applied to transistor 1108 than transistor 1120. In some implementations, the thickness of the gate dielectric of transistor 1122 (e.g., in LV circuit 404) is the same as the thickness of the gate dielectric of transistor 1110 (e.g., in LV circuit 404) due to the same voltage applied to transistor 1122 and transistor 1110. In some implementations, the thickness of semiconductor layer 1006 in which transistor 1108 (e.g., in HV circuit 406) is formed is larger than the thickness of semiconductor layer 1004 in which transistor 1120 (e.g., in LLV circuit 402) is formed due to the higher voltage applied to transistor 1108 than transistor 1120.

As shown in FIG. 11A, second semiconductor structure 104 can further include an interconnect layer 1126 above device layer 1114 to transfer electrical signals to and from peripheral circuits 1116 and 1118. As shown in FIG. 11A, interconnect layer 1126 can be vertically between bonding interface 103 and device layer 1114 (including transistors 1120 and 1122 of peripheral circuits 1116 and 1118). Interconnect layer 1126 can include a plurality of interconnects coupled to transistors 1120 and 1122 of peripheral circuits 1116 and 1118 in device layer 1114. Interconnect layer 1126 can further include one or more ILD layers in which the interconnects can form. That is, interconnect layer 1126 can include lateral lines and vias in multiple ILD layers. In some implementations, the devices in device layer 1114 are coupled to one another through the interconnects in interconnect layer 1126. For example, peripheral circuit 1116 may be coupled to peripheral circuit 1118 through interconnect layer 1126. The interconnects in interconnect layer 1126 can include conductive materials including, but not limited to, W, Co, Cu, Al, silicides, or any combination thereof. The ILD layers in interconnect layer 1126 can include dielectric materials including, but not limited to, silicon oxide, silicon nitride, silicon oxynitride, low-k dielectrics, or any combination thereof.

In some implementations, the interconnects in interconnect layer 1126 include Cu, which has a relatively low resistivity (better electrical performance) among conductive metal materials. As described below with respect to the fabrication process, although Cu has a relatively low thermal budget (incompatible with high-temperature processes), since the fabrication of interconnect layer 1126 can occur after the high-temperature processes in forming device layers 1114 and 1102 in second and third semiconductor structures 104 and 106, as well as being separated from the high-temperature processes in forming first semiconductor structure 102, the interconnects of interconnect layer 1126 having Cu can become feasible.

As shown in FIG. 11A, second semiconductor structure 104 can further include one or more contacts 1124 extending vertically through semiconductor layer 1004. Contact 1124 can extend vertically further through bonding interface 105 to be in contact with the interconnects in interconnect layer 1112. In some implementations, contact 1124 couples the interconnects in interconnect layer 1126 to the interconnects in interconnect layer 1112 to make an electrical connection across bonding interface 105 between second and third semiconductor structures 104 and 106. Contact 1124 can include conductive materials including, but not limited to, W, Co, Cu, Al, silicides, or any combination thereof. In some implementations, contact 1124 includes W. In some implementations, contact 1124 includes a via surrounded by a dielectric spacer (e.g., having silicon oxide) to electrically separate the via from semiconductor layer 1004. Depending on the thickness of semiconductor layer 1004, contact 1124 can be an ILV having a depth (in the vertical direction) in the submicron-level (e.g., between 10 nm and 1 μm), or a TSV having a depth (in the vertical direction) in the micron- or tens micron-level (e.g., between 1 μm and 100 μm).

As shown in FIG. 11A, second semiconductor structure 104 can further include a bonding layer 1010 at bonding interface 103 and above and in contact with interconnect layer 1126. Bonding layer 1010 can include a plurality of bonding contacts 1011 and dielectrics electrically isolating bonding contacts 1011. Bonding contacts 1011 can include conductive materials including, but not limited to, W, Co, Cu, Al, silicides, or any combination thereof. In some implementations, bonding contacts 1011 of bonding layer 1010 include Cu. The remaining area of bonding layer 1010 can be formed with dielectrics including, but not limited to, silicon oxide, silicon nitride, silicon oxynitride, low-k dielectrics, or any combination thereof. Bonding contacts 1011 and surrounding dielectrics in bonding layer 1010 can be used for hybrid bonding (also known as "metal/dielectric hybrid bonding"), which is a direct bonding technology (e.g., forming bonding between surfaces without using intermediate layers, such as solder or adhesives) and can obtain metal-metal (e.g., Cu-to-Cu) bonding and dielectric-dielectric (e.g., $SiO_2$-to-$SiO_2$) bonding simultaneously.

As shown in FIG. 11A, first semiconductor structure 102 can further include a bonding layer 1008 at bonding interface 103, e.g., on the opposite side of bonding interface 103 with respect to bonding layer 1010 in second semiconductor structure 104. Bonding layer 1008 can include a plurality of bonding contacts 1009 and dielectrics electrically isolating bonding contacts 1009. Bonding contacts 1009 can include conductive materials, such as Cu. The remaining area of bonding layer 1008 can be formed with dielectric materials, such as silicon oxide. Bonding contacts 1009 and surrounding dielectrics in bonding layer 1008 can be used for hybrid bonding. In some implementations, bonding interface 103 is the place at which bonding layers 1008 and 1010 are met and bonded. In practice, bonding interface 103 can be a layer with a certain thickness that includes the top surface of bonding layer 1010 of second semiconductor structure 104 and the bottom surface of bonding layer 1008 of first semiconductor structure 102.

Although not shown in FIG. 11A, it is understood that in some examples, similar to bonding interface 103, bonding interface 105 may result from hybrid bonding and thus, be disposed vertically between two bonding layers (e.g., bonding layers 1012 and 1014 of 3D memory device 1001 in FIG. 10B) each including bonding contacts in second and third semiconductor structures 104 and 106, respectively.

As shown in FIG. 11A, first semiconductor structure 102 can further include an interconnect layer 1128 above bonding layer 1008 to transfer electrical signals. Interconnect layer 1128 can include a plurality of interconnects, such as MEOL interconnects and BEOL interconnects. In some implementations, the interconnects in interconnect layer 1128 also include local interconnects, such as bit line contacts and word line contacts. Interconnect layer 1128 can further include one or more ILD layers in which the lateral lines and vias can form. The interconnects in interconnect layer 1128 can include conductive materials including, but not limited to, W, Co, Cu, Al, silicides, or any combination thereof. The ILD layers in interconnect layer 1128 can include dielectric materials including, but not limited to, silicon oxide, silicon nitride, silicon oxynitride, low-k dielectrics, or any combination thereof.

As shown in FIG. 11A, first semiconductor structure 102 can include a memory cell array, such as an array of NAND memory strings 208 above interconnect layer 1128. In some implementations, interconnect layer 1128 is vertically between NAND memory strings 208 and bonding interface 103. Each NAND memory string 208 extends vertically through a plurality of pairs each including a conductive layer and a dielectric layer, according to some implementations. The stacked and interleaved conductive layers and dielectric layers are also referred to herein as a stack structure, e.g., a memory stack 1127. Memory stack 1127 may be an example of memory stack 804 in FIGS. 8A-8C, and the conductive layer and dielectric layer in memory stack 1127 may be examples of gate conductive layers 806 and dielectric layer 808, respectively, in memory stack 804. The interleaved conductive layers and dielectric layers in memory stack 1127 alternate in the vertical direction, according to some implementations. Each conductive layer can include a gate electrode (gate line) surrounded by an adhesive layer and a gate dielectric layer. The adhesive layer can include conductive materials, such as titanium nitride (TiN), which can improve the adhesiveness between the gate electrode and the gate dielectric layer. The gate electrode of the conductive layer can extend laterally as a word line, ending at one or more staircase structures of memory stack 1127.

In some implementations, each NAND memory string 208 is a "charge trap" type of NAND memory string including any suitable channel structures disclosed herein, such as bottom plug channel structure 812A, sidewall plug channel structure 812B, or bottom open channel structure 812C, described above in detail with respect to FIGS. 8A-8C. It is understood that NAND memory strings 208 are not limited to the "charge trap" type of NAND memory strings and may be "floating gate" type of NAND memory strings in other examples.

As shown in FIG. 11A, first semiconductor structure 102 can further include a semiconductor layer 1002 disposed above memory stack 1127 and in contact with the sources of NAND memory strings 208. In some implementations, NAND memory strings 208 are disposed vertically between bonding interface 103 and semiconductor layer 1002. Semiconductor layer 1002 can include semiconductor materials. In some implementations, semiconductor layer 1002 is a thinned silicon substrate having single crystalline silicon on which memory stack 1727 and NAND memory strings 208 (e.g., including bottom plug channel structure 812A or sidewall plug channel structure 812B) are formed. It is understood that in some examples, trench isolations and doped regions (not shown) may be formed in semiconductor layer 1002 as well.

As shown in FIG. 11A, first semiconductor structure 102 can further include a pad-out interconnect layer 902 above and in contact with semiconductor layer 1002. In some implementations, semiconductor layer 1002 is disposed vertically between pad-out interconnect layer 902 and NAND memory strings 208. Pad-out interconnect layer 902 can include interconnects, e.g., contact pads 1132, in one or more ILD layers. Pad-out interconnect layer 902 and interconnect layer 1128 can be formed on opposite sides of semiconductor layer 1002. In some implementations, the interconnects in pad-out interconnect layer 902 can transfer electrical signals between 3D memory device 1100 and external devices, e.g., for pad-out purposes.

As shown in FIG. 11A, first semiconductor structure 102 can further include one or more contacts 1130 extending vertically through semiconductor layer 1002. In some implementations, contact 1130 couples the interconnects in interconnect layer 1128 to contact pads 1132 in pad-out interconnect layer 902 to make an electrical connection through semiconductor layer 1002. Contact 1130 can include conductive materials including, but not limited to, W, Co, Cu, Al, silicides, or any combination thereof. In some implementations, contact 1130 includes W. In some implementations, contact 1130 includes a via surrounded by a dielectric spacer (e.g., having silicon oxide) to electrically separate the via from semiconductor layer 1002. Depending on the thickness of semiconductor layer 1002, contact 1130 can be an ILV having a depth in the submicron-level (e.g., between 10 nm and 1 µm), or a TSV having a depth in the micron- or tens micron-level (e.g., between 1 µm and 100 µm).

As a result, peripheral circuits 1104, 1106, 1116, and 1118 in third and second semiconductor structures 106 and 104 can be coupled to NAND memory strings 208 in first semiconductor structure 102 through various interconnection structures, including interconnect layers 1112, 1126, and 1128, bonding layers 1008 and 1010, as well as contacts 1124. Moreover, peripheral circuits 1104, 1106, 1116, and 1118 and NAND memory strings 208 in 3D memory device 1100 can be further coupled to external devices through contacts 1130 and pad-out interconnect layer 902.

It is understood that the material of semiconductor layer 1002 in first semiconductor structure 102 is not limited to single crystalline silicon as described above with respect to FIG. 11A and may be any other suitable semiconductor materials. For example, as shown in FIG. 11B, a 3D memory device 1101 may include semiconductor layer 1002 having polysilicon in first semiconductor structure 102. NAND memory strings 208 of 3D memory device 1101 in contact with semiconductor layer 1002 having polysilicon can include any suitable channel structures disclosed herein that are in contact with a polysilicon layer, such as bottom open channel structure 812C. In some implementations, NAND memory strings 208 of 3D memory device 1101 are "floating gate" type of NAND memory strings, and semiconductor layer 1002 having polysilicon is in contact with the "floating gate" type of NAND memory strings as the source plate thereof. It is understood that the details of the same components (e.g., materials, fabrication process, functions, etc.) in both 3D memory devices 1100 and 1101 are not repeated for ease of description.

It is also understood that the pad-out of 3D memory devices is not limited to from first semiconductor structure 102 having NAND memory strings 208 as shown in FIGS. 11A and 11B (corresponding to FIG. 9B) and may be from third semiconductor structure 106 having peripheral circuit 1104 (corresponding to FIG. 9A). For example, as shown in FIG. 11C, a 3D memory device 1103 may include pad-out interconnect layer 902 in third semiconductor structure 106. Pad-out interconnect layer 902 can be in contact with semiconductor layer 1006 of third semiconductor structure 106 on which transistors 1108 of peripheral circuit 1104 are formed. In some implementations, third semiconductor structure 106 further includes one or more contacts 1134 extending vertically through semiconductor layer 1006. In some implementations, contact 1134 couples the interconnects in interconnect layer 1112 in third semiconductor structure 106 to contact pads 1132 in pad-out interconnect layer 902 to make an electrical connection through semiconductor layer 1006. Contact 1134 can include conductive materials including, but not limited to, W, Co, Cu, Al, silicides, or any combination thereof. In some implementations, contact 1134 includes W. In some implementations, contact 1134 includes a via surrounded by a dielectric spacer (e.g., having silicon oxide) to electrically separate the via from semiconductor layer 1006. Depending on the thickness of semiconductor layer 1006, contact 1134 can be an ILV having a depth in the submicron-level (e.g., between 10 nm and 1 μm), or a TSV having a depth in the micron- or tens micron-level (e.g., between 1 μm and 100 μm). It is understood that the details of the same components (e.g., materials, fabrication process, functions, etc.) in both 3D memory devices 1100 and 1103 are not repeated for ease of description.

It is further understood that in some examples, similar to bonding interface 103, bonding interface 105 may result from hybrid bonding and thus, be disposed vertically between two bonding layers each including bonding contacts in second and third semiconductor structures 104 and 106, respectively. For example, as shown in FIG. 11C, 3D memory device 1103 may include bonding layers 1012 and 1014 in second and third semiconductor structures 104 and 106, respectively, at bonding interface 105, i.e., on opposite sides of bonding interface 105. Bonding layer 1012 or 1014 can include a plurality of bonding contacts 1013 or 1015 and dielectrics electrically isolating bonding contacts 1013 or 1015. Bonding contacts 1013 and 1015 can include conductive materials, such as Cu. The remaining area of bonding layer 1012 or 1014 can be formed with dielectric materials, such as silicon oxide. Bonding contacts 1013 or 1015 and surrounding dielectrics in bonding layer 1012 or 1014 can be used for hybrid bonding. In some implementations, bonding interface 105 is the place at which bonding layers 1012 and 1014 are met and bonded. In practice, bonding interface 105 can be a layer with a certain thickness that includes the top surface of bonding layer 1014 of third semiconductor structure 106 and the bottom surface of bonding layer 1012 of second semiconductor structure 104. Contact 1124 can be coupled to bonding contacts 1013, and interconnect layer 1112 can be coupled to bonding contacts 1015.

Figure 14:
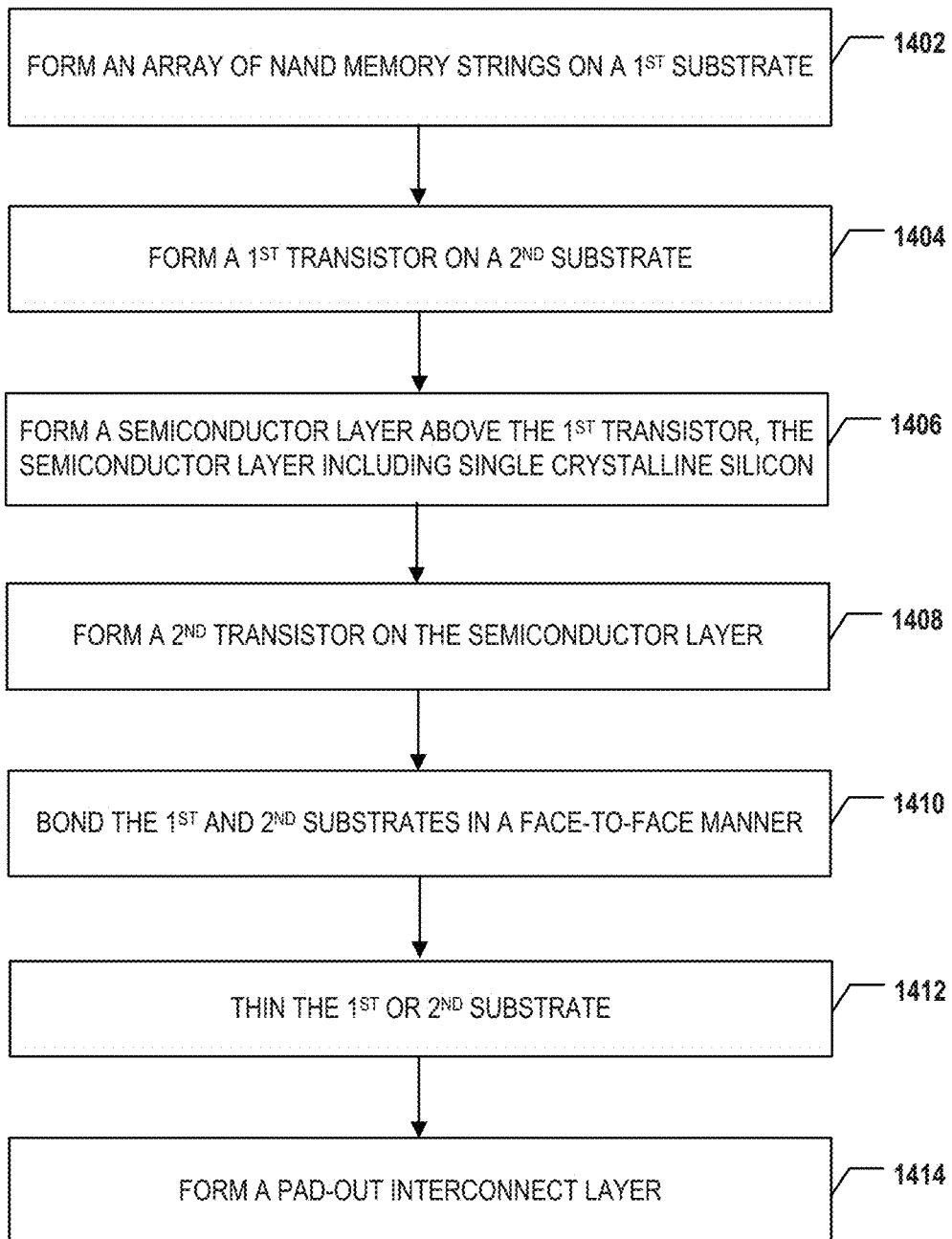
FIG. 14 illustrates a flowchart of a method for forming the 3D memory devices in FIGS. 10A and 10B, according to some aspects of the present disclosure.

FIGS. 12A-12H illustrate a fabrication process for forming the 3D memory devices in FIGS. 10A and 10B, according to some aspects of the present disclosure. FIG. 14 illustrates a flowchart of a method 1400 for forming the 3D memory devices in FIGS. 10A and 10B, according to some aspects of the present disclosure. Examples of the 3D memory devices depicted in FIGS. 12A-12H and 14 include 3D memory devices 1100, 1101, and 1103 depicted in FIGS. 11A-11C. FIGS. 12A-12H and 14 will be described together. It is understood that the operations shown in method 1400 are not exhaustive and that other operations can be performed as well before, after, or between any of the illustrated operations. Further, some of the operations may be performed simultaneously, or in a different order than shown in FIG. 14. For example, operation 1402 may be performed after operation 1408 or in parallel with operations 1404-1408.

Referring to FIG. 14, method 1400 starts at operation 1402, in which an array of NAND memory strings is formed on a first substrate. The first substrate can be a silicon substrate having single crystalline silicon. In some implementations, to form the array of NAND memory strings, a memory stack is formed on the first substrate.

Figure 12A:
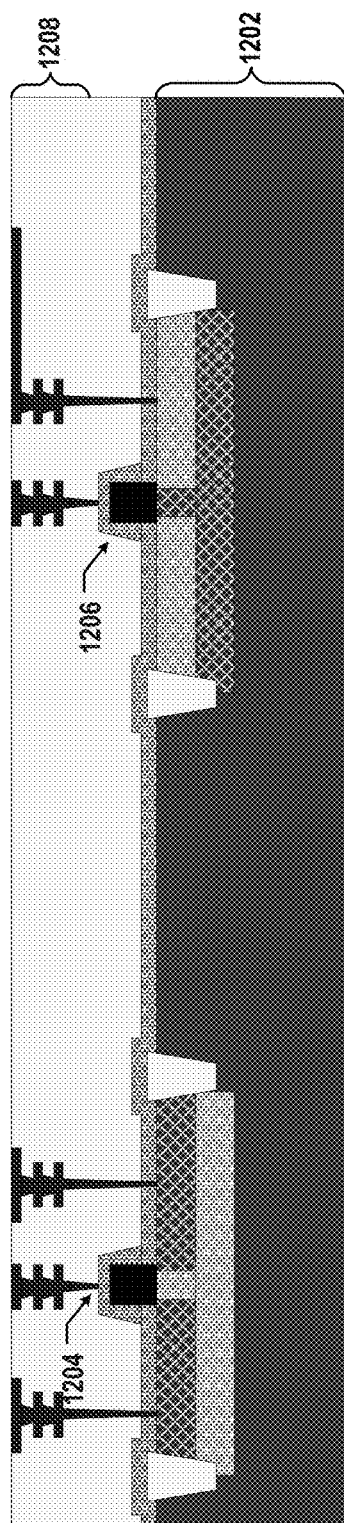
FIGS. 12A-12H illustrate a fabrication process for forming the 3D memory devices in FIGS. 10A and 10B, according to some aspects of the present disclosure.
Figure 12B:
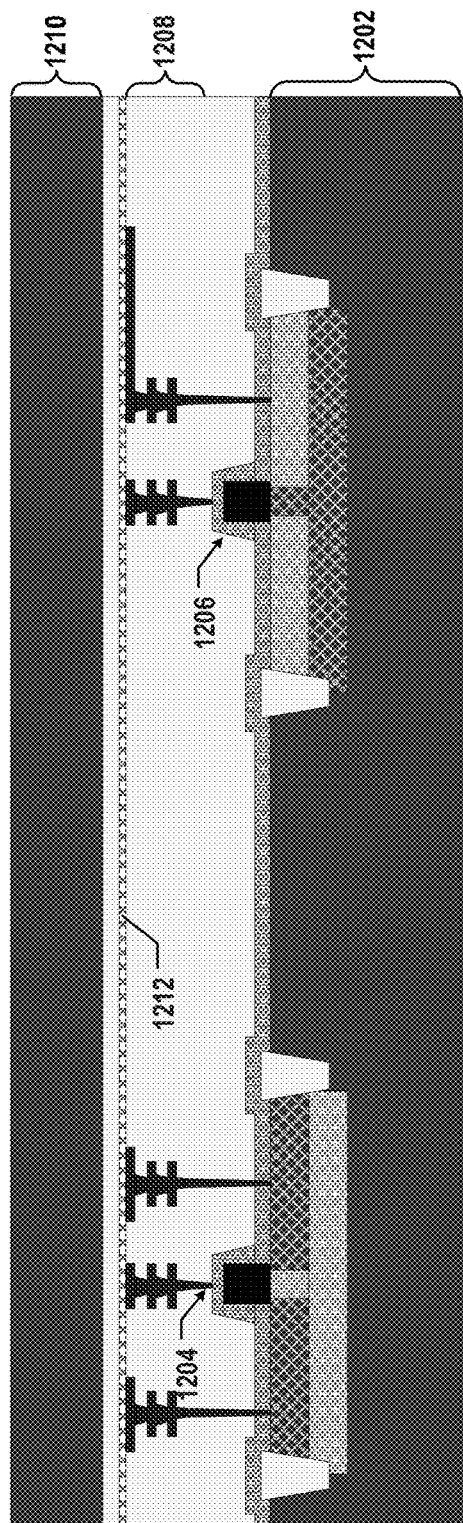
Figure 12C:
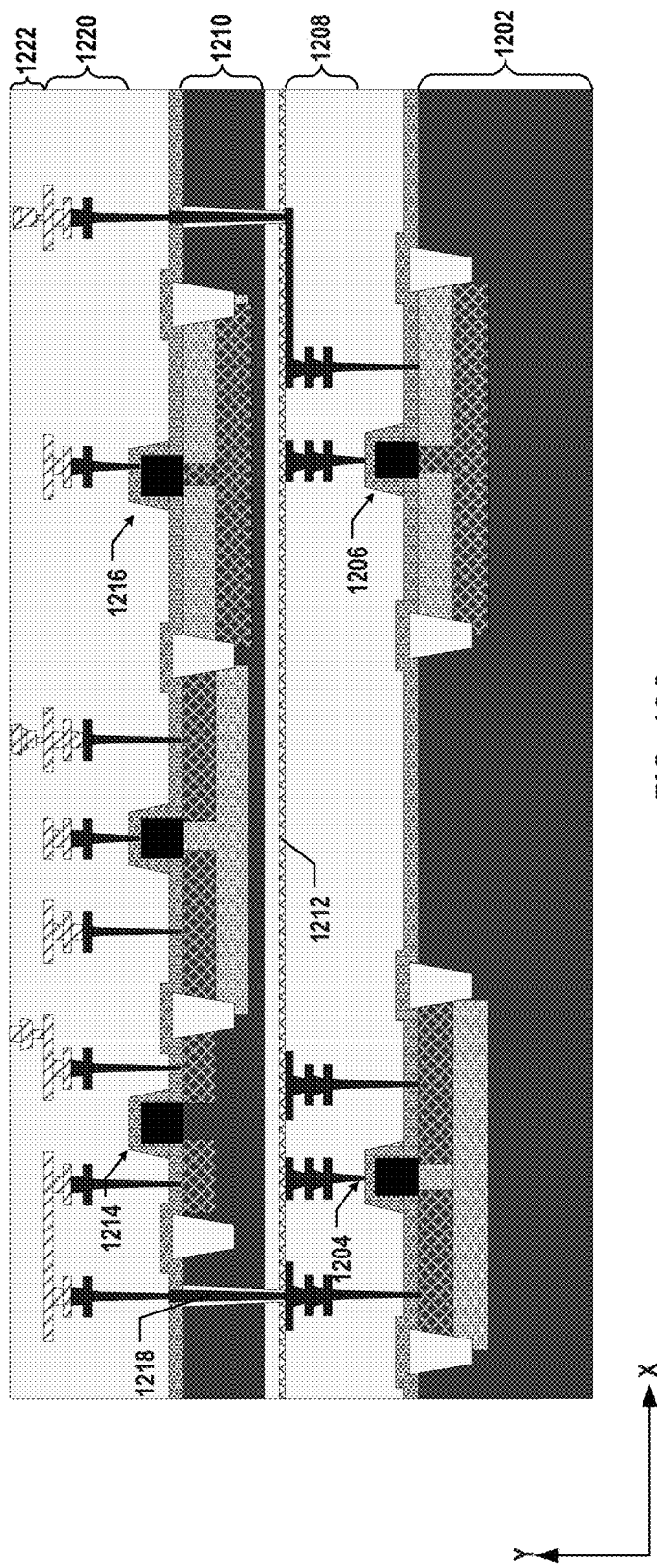
Figure 12D:
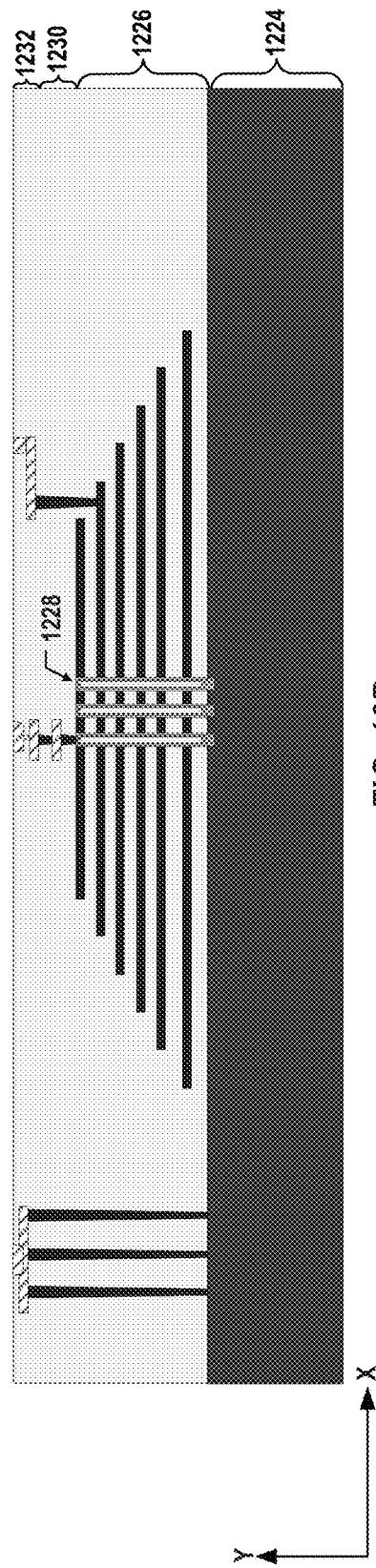

As illustrated in FIG. 12D, a stack structure, such as a memory stack 1226 including interleaved conductive layers and dielectric layers, is formed on a silicon substrate 1224. To form memory stack 1226, in some implementations, a dielectric stack (not shown) including interleaved sacrificial layers (not shown) and the dielectric layers is formed on silicon substrate 1224. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, chemical vapor deposition (CVD), physical vapor deposition (PVD), atomic layer deposition (ALD), or any combination thereof. Memory stack 1226 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that memory stack 1226 may be formed by alternatingly depositing conductive layers (e.g., doped polysilicon layers) and dielectric layers (e.g., silicon oxide layers) without the gate replacement process in some examples. In some implementations, a pad oxide layer (e.g., thermally grown local oxidation of silicon (LOCOS)) including silicon oxide is formed between memory stack 1226 and silicon substrate 1224.

As illustrated in FIG. 12D, NAND memory strings 1228 are formed above silicon substrate 1224, each of which extends vertically through memory stack 1226 to be in contact with silicon substrate 1224. In some implementations, fabrication processes to form NAND memory string 1228 include forming a channel hole through memory stack 1226 (or the dielectric stack) and into silicon substrate 1224 using dry etching/and or wet etching, such as deep reactive-ion etching (DRIE), followed by subsequently filling the channel hole with a plurality of layers, such as a memory film (e.g., a tunneling layer, a storage layer, and a blocking layer) and a semiconductor layer, using thin film deposition processes such as ALD, CVD, PVD, or any combination thereof. It is understood that the details of fabricating NAND memory strings 1228 may vary depending on the types of channel structures of NAND memory strings 1228 (e.g., bottom plug channel structure 812A, sidewall plug channel structure 812B, or bottom open channel structure 812C in FIGS. 8A-8C) and thus, are not elaborated for ease of description.

In some implementations, an interconnect layer is formed above the array of NAND memory strings on the first substrate. The interconnect layer can include a first plurality of interconnects in one or more ILD layers. As illustrated in FIG. 12D, an interconnect layer 1230 is formed above memory stack 1226 and NAND memory strings 1228. Interconnect layer 1230 can include interconnects of MEOL and/or BEOL in a plurality of ILD layers to make electrical connections with NAND memory strings 1228. In some implementations, interconnect layer 1230 includes multiple ILD layers and interconnects therein formed in multiple processes. For example, the interconnects in interconnect layer 1230 can include conductive materials deposited by one or more thin film deposition processes including, but not limited to, CVD, PVD, ALD, electroplating, electroless plating, or any combination thereof. Fabrication processes to form interconnects can also include photolithography, chemical mechanical polishing (CMP), wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 12D can be collectively referred to as interconnect layer 1230.

In some implementations, a first bonding layer is formed above interconnect layer. The first bonding layer can include a plurality of first bonding contacts. As illustrated in FIG. 12D, a bonding layer 1232 is formed above interconnect layer 1230. Bonding layer 1232 can include a plurality of bonding contacts surrounded by dielectrics. In some implementations, a dielectric layer is deposited on the top surface of interconnect layer 1230 by one or more thin film deposition processes including, but not limited to, CVD, PVD, ALD, or any combination thereof. The bonding contacts can then be formed through the dielectric layer and in contact with the interconnects in interconnect layer 1230 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

Method 1400 proceeds to operation 1404, as illustrated in FIG. 14, in which a first transistor is formed on a second substrate. The second substrate can be a silicon substrate having single crystalline silicon. As illustrated in FIG. 12A, a plurality of transistors 1204 and 1206 are formed on a silicon substrate 1202. Transistors 1204 and 1206 can be formed by a plurality of processes including, but not limited to, photolithography, dry/wet etch, thin film deposition, thermal growth, implantation, CMP, and any other suitable processes. In some implementations, doped regions are formed in silicon substrate 1202 by ion implantation and/or thermal diffusion, which function, for example, as wells and source/drain regions of transistors 1204 and 1206. In some implementations, isolation regions (e.g., STIs) are also formed in silicon substrate 1202 by wet/dry etch and thin film deposition. In some implementations, the thickness of gate dielectric of transistor 1204 is different from the thickness of gate dielectric of transistor 1206, for example, by depositing a thicker silicon oxide film in the region of transistor 1204 than the region of transistor 1206, or by etching back part of the silicon oxide film deposited in the region of transistor 1206. It is understood that the details of fabricating transistors 1204 and 1206 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer 1208 is formed above the transistor on the second substrate. The interconnect layer can include a plurality of interconnects in one or more ILD layers. As illustrated in FIG. 12A, an interconnect layer 1208 can be formed above transistors 1204 and 1206. Interconnect layer 1208 can include interconnects of MEOL and/or BEOL in a plurality of ILD layers to make electrical connections with transistors 1204 and 1206. In some implementations, interconnect layer 1208 includes multiple ILD layers and interconnects therein formed in multiple processes. For example, the interconnects in interconnect layer 1208 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 12A can be collectively referred to as interconnect layer 1208. In some implementations, the interconnects in interconnect layer 1208 include W, which has a relatively high thermal budget among conductive metal materials to sustain later high-temperature processes.

Method 1400 proceeds to operation 1406, as illustrated in FIG. 14, in which a semiconductor layer is formed above the first transistor. The semiconductor layer can include single crystalline silicon. In some implementations, to form the semiconductor layer, another substrate and the second substrate are bonded in a face-to-face manner, and the other substrate is thinned to leave the semiconductor layer. The bonding can include transfer bonding. The other substrate can be a silicon substrate having single crystalline silicon.

As illustrated in FIG. 12B, a semiconductor layer 1210, such as a single crystalline silicon layer, is formed above interconnect layer 1208 and transistors 1204 and 1206. Semiconductor layer 1210 can be attached above interconnect layer 1208 to form a bonding interface 1212 vertically between semiconductor layer 1210 and interconnect layer 1208. The lateral dimensions (e.g., the dimension in the x-direction) of semiconductor layer 1210 are the same as those of silicon substrate 1202 or silicon substrate 1224, according to some implementations. In some implementations, to form semiconductor layer 1210, another silicon substrate (not shown in FIG. 12B) and silicon substrate 1202 are bonded in a face-to-face manner (i.e., having the components formed on silicon substrate 1202, such as transistors 1204 and 1206, facing toward the other silicon substrate) using transfer bonding, thereby forming bonding interface 1212. The other silicon substrate can then be thinned using any suitable processes to leave semiconductor layer 1210 attached above interconnect layer 1208. The same "face-to-face" manner as described above is applied throughout the present disclosure in describing other figures.

Figure 48A:
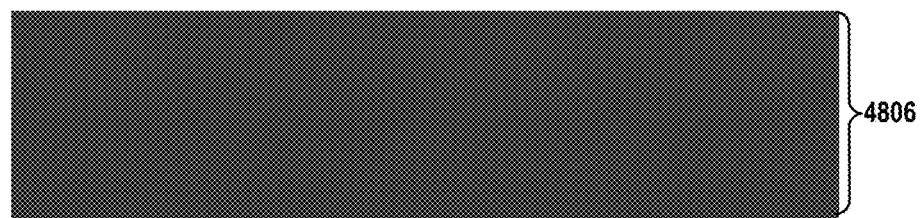
FIGS. 48A-48D illustrate a fabrication process of transfer bonding, according to some aspects of the present disclosure.
Figure 48B:
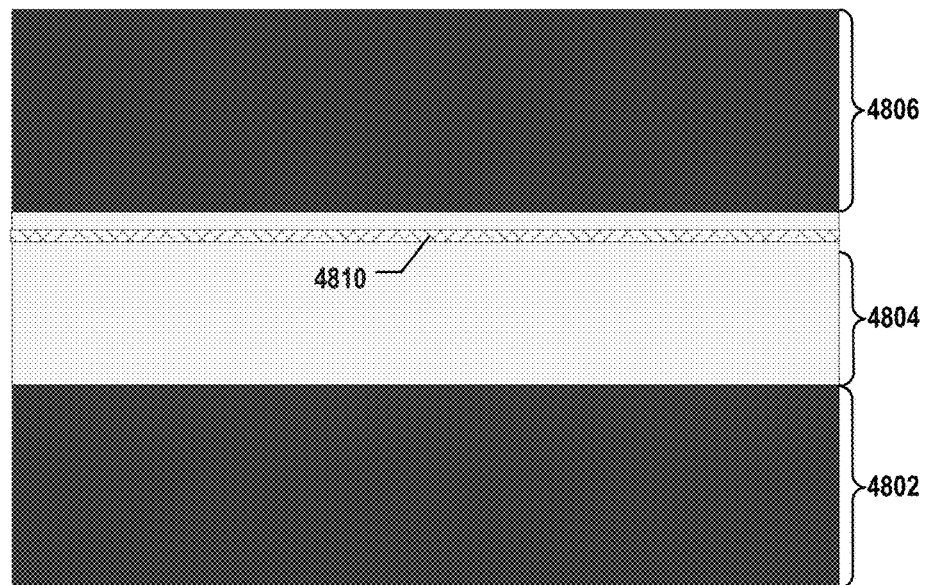

FIGS. 48A-48D illustrate a fabrication process of transfer bonding, according to some aspects of the present disclosure. As illustrated in FIG. 48A, a function layer 4804 can be formed on a base substrate 4802. Function layer 4804 can include device layers, interconnect layers, and/or any suitable layers disclosed herein, such as transistors 1204 and 1206 and interconnect layer 1208 in FIG. 12B. A transfer substrate 4806, such as a silicon substrate having single crystalline silicon, is provided. In some implementations, transfer substrate 4806 is a single crystalline silicon substrate. As illustrated in FIG. 48B, transfer substrate 4806 and base substrate 4802 (and function layer 4804 formed thereon) can be bonded in a face-to-face manner using any suitable substrate/wafer bonding processes including, for example, anodic bonding and fusion (direct) bonding, thereby forming a bonding interface 4810 between transfer substrate 4806 and base substrate 4802. In one example, fusion bonding may be performed between layers of silicon and silicon, silicon and silicon oxide, or silicon oxide and silicon oxide with pressure and heat. In another example, anodic bonding may be performed between layers of silicon oxide (in an ionic glass) and silicon with voltage, pressure, and heat. It is understood that depending on the bonding process, dielectric layers (e.g., silicon oxide layers) may be formed on one or both sides of bonding interface 4810. For example, silicon oxide layers may be formed on the top surfaces of both transfer substrate 4806 and function layer 4804 to allow $SiO_2$—$SiO_2$ bonding using fusion bonding. Or silicon oxide layer may be formed only on function layer 4804 to allow $SiO_2$—Si bonding using anodic bonding or fusion bonding. In some implementations in which a silicon oxide layer is formed on transfer substrate 4806 (e.g., shown in FIG. 48B), transfer substrate 4806 can be flipped upside, such that the silicon oxide layer on transfer substrate 4806 faces down toward base substrate 4802 before the bonding.

Figure 48C:
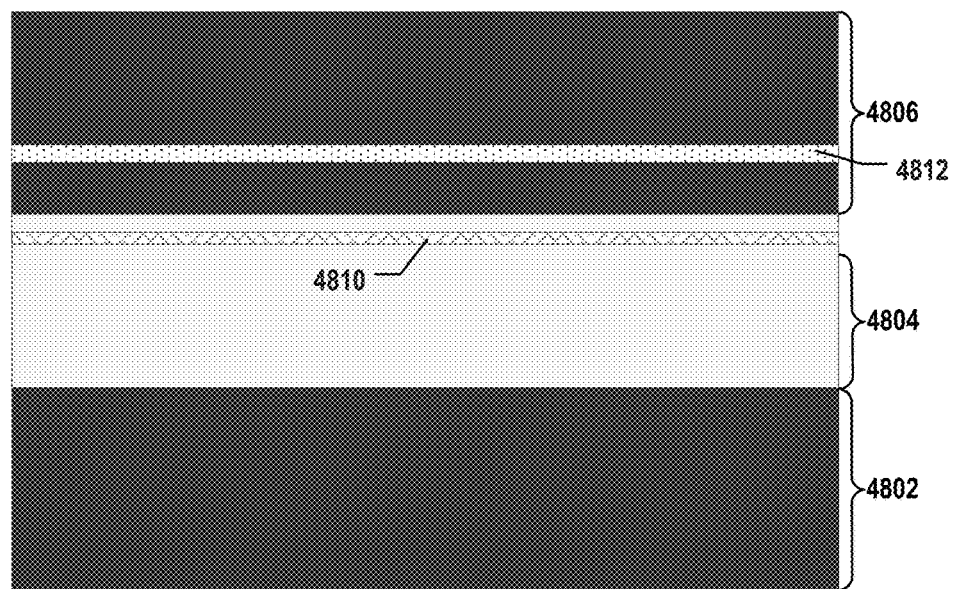
Figure 48D:
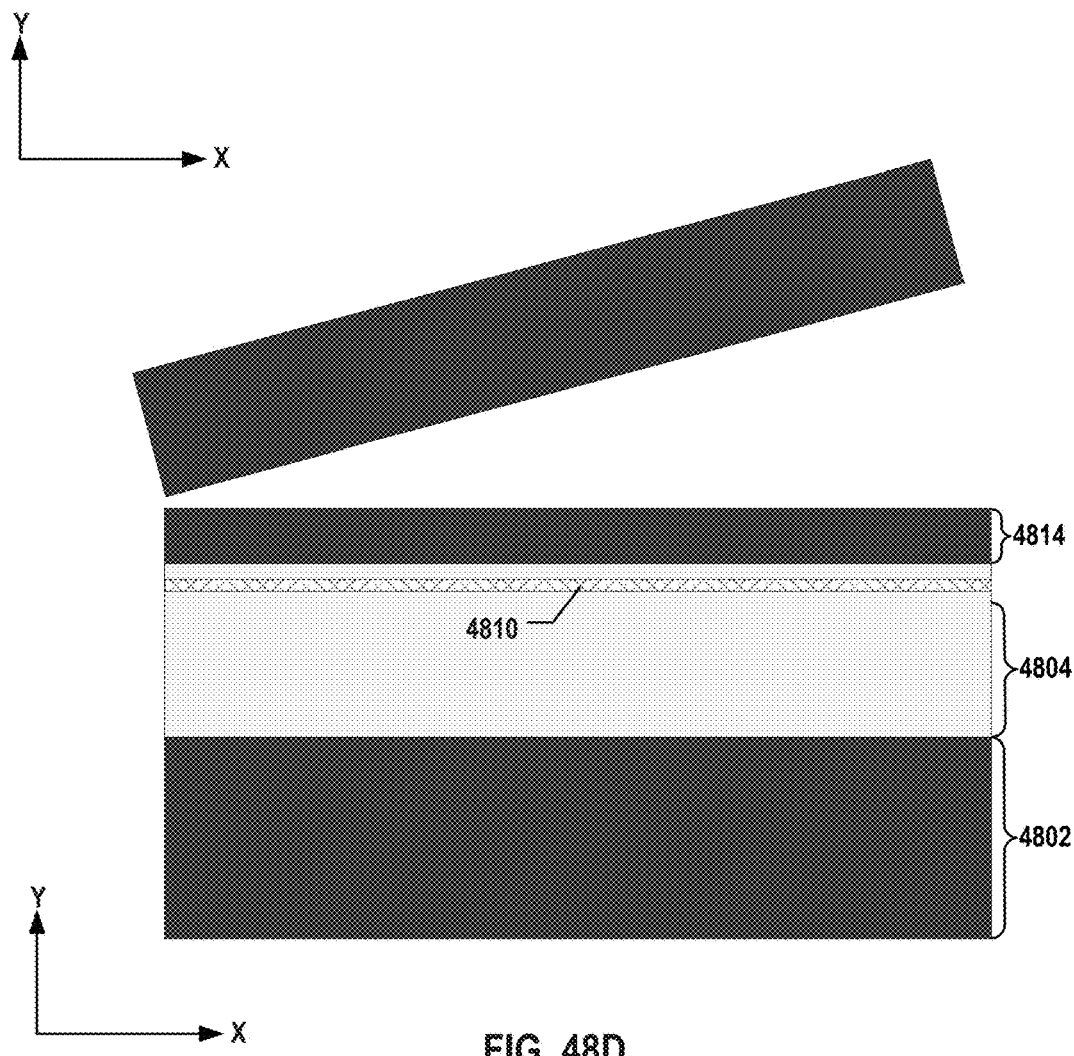

As illustrated in FIG. 48C, a cut layer 4812 can be formed in transfer substrate 4806, for example, using ion implantation. In some implementations, light elements, such as hydrogen ions, are implanted into transfer substrate 4806 to a desired depth, for example, by controlling the energy of the ion impanation process, to form cut layer 4812. As illustrated in FIG. 48D, transfer substrate 4806 can be thinned to leave only a semiconductor layer 4814 vertically between cut layer 4812 and bonding interface 4810. In some implementations, transfer substrate 4806 is split at cut layer 4812 by applying a mechanical force to transfer substrate 4806, i.e., peeling off the remainder of transfer substrate 4806 from semiconductor layer 4814. It is understood that transfer substrate 4806 may be split at cut layer 4812 by any suitable means, not limited to mechanical force alone, such as thermal means, acoustic means, optical means, etc., or any combination thereof. As a result, semiconductor layer 4814 can be transferred from transfer substrate 4806 and bonded onto base substrate 4802 (and function layer 4804) using a transfer bonding process. In some implementations, a planarization process, such as chemical mechanical polishing (CMP), is performed on semiconductor layer 4812 to polish and smooth the top surface of semiconductor layer 4812 and adjust the thickness of semiconductor layer 4812. Semiconductor layer 4814 thus can have the same material as transfer substrate 4806, such as single crystalline silicon. The thickness of semiconductor layer 4814 can be determined by the depth of cut layer 4812, for example, by adjusting the implantation energy, and/or by the planarization process. Moreover, the remainder of transfer substrate 4806 can be re-used in the same manner to form semiconductor layers bonded onto other base substrates, thereby reducing the material cost of the transfer bonding process.

Figure 49A:
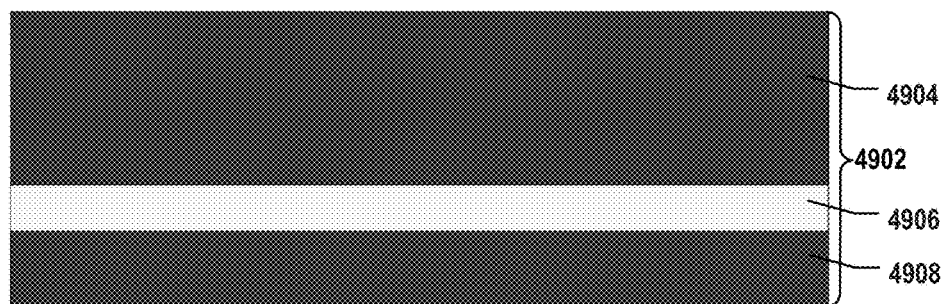
FIGS. 49A-49D illustrate another fabrication process of transfer bonding, according to some aspects of the present disclosure.
Figure 49A:
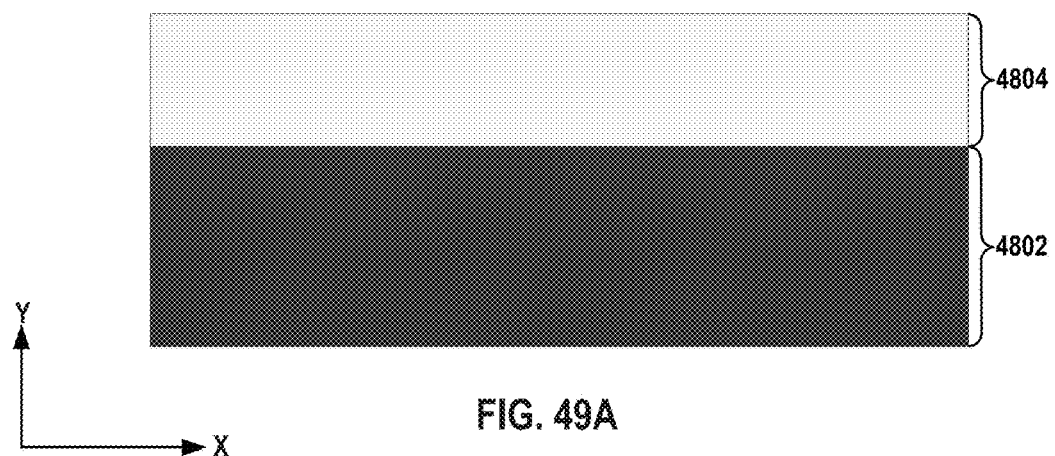
Figure 49B:
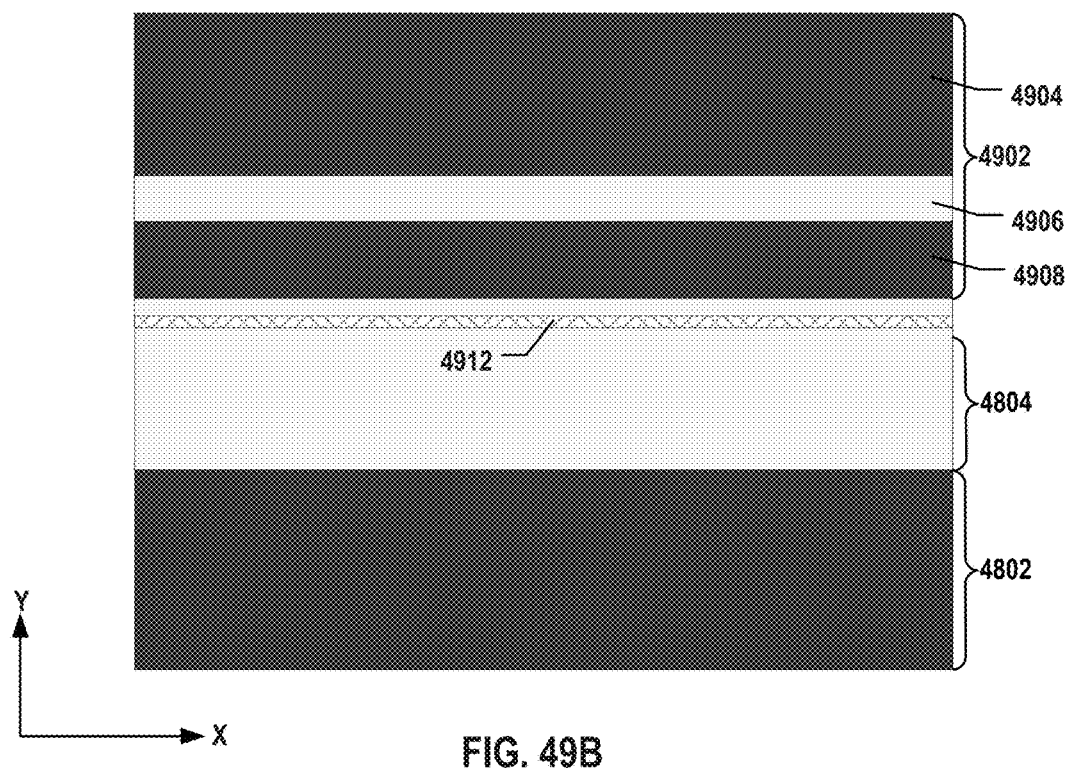

FIGS. 49A-49D illustrate another fabrication process of transfer bonding, according to some aspects of the present disclosure. As illustrated in FIG. 49A, function layer 4804 can be formed on base substrate 4802. Function layer 4804 can include device layers, interconnect layers, and/or any suitable layers disclosed herein, such as transistors 1204 and 1206 and interconnect layer 1208 in FIG. 12B. An SOI substrate 4902, including a base/handle layer 4904, a buried oxide layer (BOx) 4906, and a device layer 4908, can be flipped upside down facing toward base substrate 4802. As illustrated in FIG. 49B, SOI substrate 4902 and base substrate 4802 (and function layer 4804 formed thereon) can be bonded in a face-to-face manner using any suitable substrate/wafer bonding processes including, for example, anodic bonding and fusion (direct) bonding, thereby forming a bonding interface 4912 between SOI substrate 4902 and base substrate 4802. In one example, fusion bonding may be performed between layers of silicon and silicon, silicon and silicon oxide, or silicon oxide and silicon oxide with pressure and heat. In another example, anodic bonding may be performed between layers of silicon oxide (in an ionic glass) and silicon with voltage, pressure, and heat. It is understood that depending on the bonding process, dielectric layers (e.g., silicon oxide layers) may be formed on one or both sides of bonding interface 4912. For example, silicon oxide layers may be formed on the top surfaces of both SOI substrate 4902 and function layer 4804 to allow $SiO_2$—$SiO_2$ bonding using fusion bonding. Or silicon oxide layer may be formed only on function layer 4804 to allow $SiO_2$—Si bonding using anodic bonding or fusion bonding.

Figure 49C:
Figure 49C:
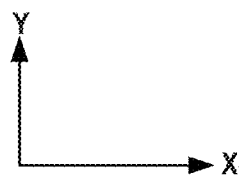
Figure 49D:
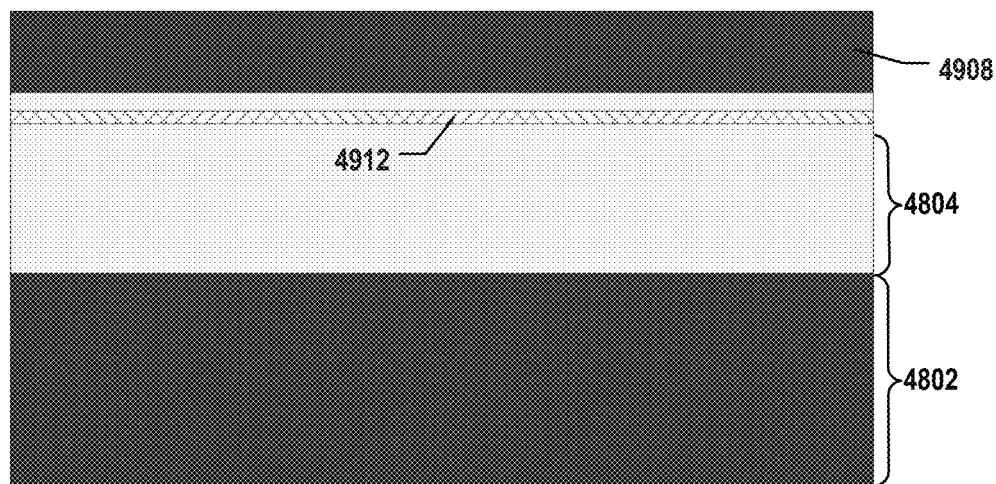
Figure 49D:

As illustrated in FIGS. 49C and 49D, SOI substrate 4902 (shown in FIG. 49B) can be thinned by sequentially removing base/handle layer 4904 and buried oxide layer 4906, for example, using wet/dry etching and/or CMP processes, to leave only device layer 4908 (as a semiconductor layer) at bonding interface 4912. As a result, device layer 4908 can be transferred from SOI substrate 4902 and bonded onto base substrate 4802 (and function layer 4804) as a semiconductor layer using another transfer bonding process. The transferred semiconductor layer thus can have the same material as device layer 4908, such as single crystalline silicon. The thickness of the semiconductor layer can be the same as the thickness of device layer 4908. It is understood that in some examples, device layer 4908 may be further thinned using wet/dry etching and/or CMP processes, such that the transferred semiconductor layer may be thinned than device layer 4908.

Referring to FIG. 14, method 1400 proceeds to operation 1408, in which a second transistor is formed on the semiconductor layer. As illustrated in FIG. 12C, a plurality of transistors 1214 and 1216 are formed on semiconductor layer 1210 having single crystalline silicon. Transistors 1214 and 1216 can be formed by a plurality of processes including, but not limited to, photolithography, dry/wet etch, thin film deposition, thermal growth, implantation, CMP, and any other suitable processes. In some implementations, doped regions are formed in semiconductor layer 1210 by ion implantation and/or thermal diffusion, which function, for example, as wells and source/drain regions of transistors 1214 and 1216. In some implementations, isolation regions (e.g., STIs) are also formed in semiconductor layer 1210 by wet/dry etch and thin film deposition. In some implementations, the thickness of gate dielectric of transistor 1214 is different from the thickness of gate dielectric of transistor 1216, for example, by depositing a thicker silicon oxide film in the region of transistor 1214 than the region of transistor 1216, or by etching back part of the silicon oxide film deposited in the region of transistor 1216. It is understood that the details of fabricating transistors 1214 and 1216 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer 1220 is formed above the transistor on the semiconductor layer. The interconnect layer can include a plurality of interconnects in one or more ILD layers. As illustrated in FIG. 12C, an interconnect layer 1220 can be formed above transistors 1214 and 1216. Interconnect layer 1220 can include interconnects of MEOL and/or BEOL in a plurality of ILD layers to make electrical connections with transistors 1214 and 1216. In some implementations, interconnect layer 1220 includes multiple ILD layers and interconnects therein formed in multiple processes. For example, the interconnects in interconnect layer 1220 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 12C can be collectively referred to as interconnect layer 1220. Different from interconnect layer 1208, in some implementations, the interconnects in interconnect layer 1220 include Cu, which has a relatively low resistivity among conductive metal materials. It is understood that although Cu has a relatively low thermal budget (incompatible with high-temperature processes), using Cu as the conductive materials of the interconnects in interconnect layer 1220 may become feasible since there are no more high-temperature processes after the fabrication of interconnect layer 1220.

In some implementations, a contact through the semiconductor layer is formed. As illustrated in FIG. 12C, one or more contacts 1218 each extending vertically through semiconductor layer 1210 is formed. Contacts 1218 can couple the interconnects in interconnect layers 1220 and 1208. Contacts 1218 can be formed by first patterning contact holes through semiconductor layer 1210 and bonding interface 1212 to be in contact with the interconnects in interconnect layer 1208 using patterning process (e.g., photolithography and dry/wet etch of dielectric materials in the dielectric layer). The contact holes can be filled with a conductor (e.g., W or Cu). In some implementations, filling the contact holes includes depositing a spacer (e.g., a silicon oxide layer) before depositing the conductor.

In some implementations, a second bonding layer is formed above the interconnect layer. The second bonding layer can include a plurality of second bonding contacts. As illustrated in FIG. 12D, a bonding layer 1222 is formed above interconnect layer 1220. Bonding layer 1222 can include a plurality of bonding contacts surrounded by dielectrics. In some implementations, a dielectric layer is deposited on the top surface of interconnect layer 1220 by one or more thin film deposition processes including, but not limited to, CVD, PVD, ALD, or any combination thereof. The bonding contacts can then be formed through the dielectric layer and in contact with the interconnects in interconnect layer 1220 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor. For example, the adhesion layer may improve the adhesiveness of the conductor to avoid defects, the barrier layer may prevent metal ion (e.g., Cu ions) diffusing from the conductor into other structures to cause contamination, and the seed layer may facilitate the deposition of the conductor (e.g., Cu) in the contact holes to improve the deposition quality and speed.

Method 1400 proceeds to operation 1410, as illustrated in FIG. 14, in which the first substrate and the second substrate are bonded in a face-to-face manner. The first bonding contact in the first bonding layer can be in contact with the second bonding contact in the second bonding layer at a bonding interface after bonding the first and second substrates. The bonding can include hybrid bonding.

Figure 12E:
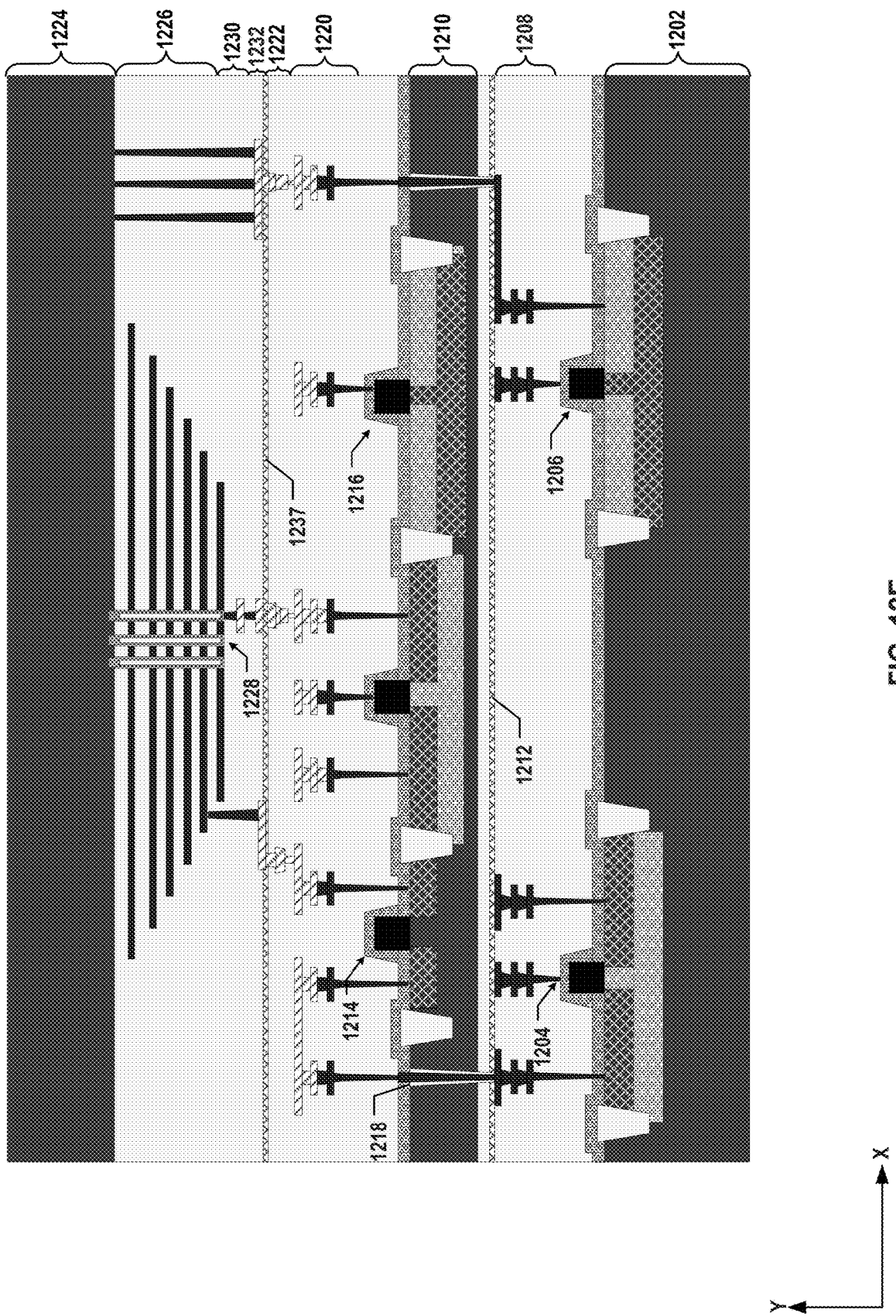

As illustrated in FIG. 12E, silicon substrate 1224 and components formed thereon (e.g., memory stack 1226 and NAND memory strings 1228 formed therethrough) are flipped upside down. Bonding layer 1232 facing down is bonded with bonding layer 1222 facing up, i.e., in a face-to-face manner, thereby forming a bonding interface 1237. That is, silicon substrate 1224 and components formed thereon can be bonded with silicon substrate 1202 and components formed thereon in a face-to-face manner, such that the bonding contacts in bonding layer 1232 are in contact with the bonding contacts in bonding layer 1222 at bonding interface 1237. In some implementations, a treatment process, e.g., plasma treatment, wet treatment and/or thermal treatment, is applied to bonding surfaces prior to bonding. Although not shown in FIG. 12E, it is understood that in some examples, silicon substrate 1202 and components formed thereon (e.g., transistors 1204, 1206, 1214, and 1216) can be flipped upside down, and bonding layer 1222 facing down can be bonded with bonding layer 1232 facing up, i.e., in a face-to-face manner, thereby forming bonding interface 1237 as well.

As a result of the bonding, e.g., hybrid bonding, the bonding contacts on opposite sides of bonding interface 1237 can be inter-mixed. After the bonding, the bonding contacts in bonding layer 1232 and the bonding contacts in bonding layer 1222 are aligned and in contact with one another, such that memory stack 1226 and NAND memory strings 1228 formed therethrough can be coupled to transistors 1214, 1216, 1204, and 1206 through the bonded bonding contacts across bonding interface 1237, according to some implementations.

Figure 12F:
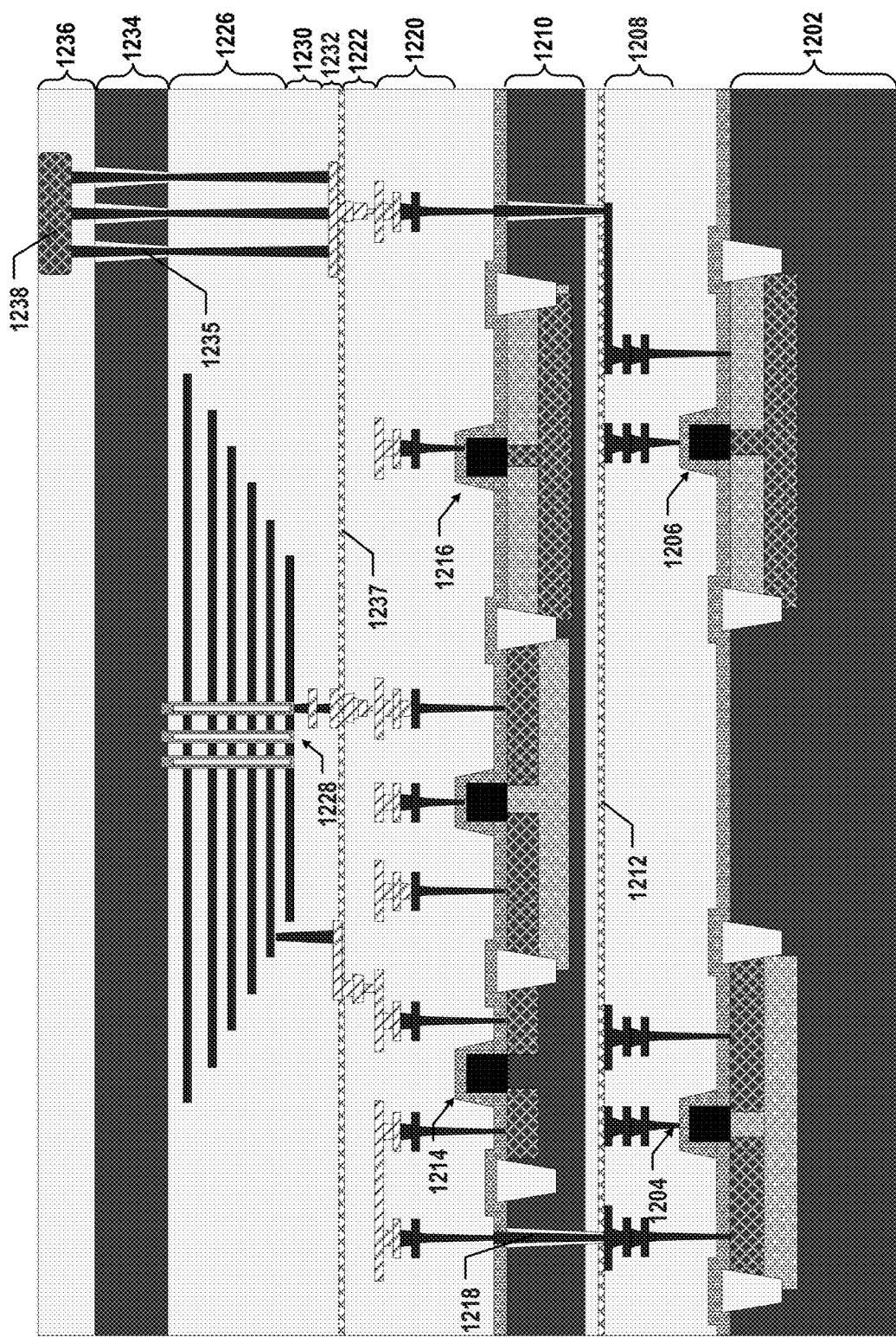

Method 1400 proceeds to operation 1412, as illustrated in FIG. 14, in which the first substrate or the second substrate is thinned. As illustrated in FIG. 12F, silicon substrate 1224 (shown in FIG. 12E) is thinned to become a semiconductor layer 1234 having single crystalline silicon. Silicon substrate 1224 can be thinned by processes including, but not limited to, wafer grinding, dry etch, wet etch, CMP, any other suitable processes, or any combination thereof. It is understood that although not shown in FIG. 12F, in some examples, silicon substrate 1202 may be thinned to become a semiconductor layer having single crystalline silicon.

Method 1400 proceeds to operation 1414, as illustrated in FIG. 14, in which a pad-out interconnect layer is formed. The pad-out interconnect layer can be formed on the thinned second substrate or above the array of NAND memory strings. As illustrated in FIG. 12F, a pad-out interconnect layer 1236 is formed on semiconductor layer 1234 (the thinned silicon substrate 1224) above NAND memory strings 1228. Pad-out interconnect layer 1236 can include interconnects, such as contact pads 1238, formed in one or more ILD layers. Contact pads 1238 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some implementations, after the bonding and thinning, contacts 1235 are formed, extending vertically through semiconductor layer 1234, for example, by wet/dry etching followed by depositing dielectric materials as spacers and conductive materials as conductors. Contacts 1235 can couple contact pads 1238 in pad-out interconnect layer 1236 to the interconnects in interconnect layer 1230. It is understood that in some examples, contacts 1235 may be formed in silicon substrate 1224 before thinning (the formation of semiconductor layer 1234) and be exposed from the backside of silicon substrate 1224 (where the thinning occurs) after the thinning. It is further understood that although not shown in FIG. 12F, in some examples, a pad-out interconnect layer may be formed on the thinned silicon substrate 1202, and contacts may be formed through the thinned silicon substrate 1202 to couple the pad-out interconnect layer and interconnect layer 1208 across the thinned silicon substrate 1202.

Figure 12G:
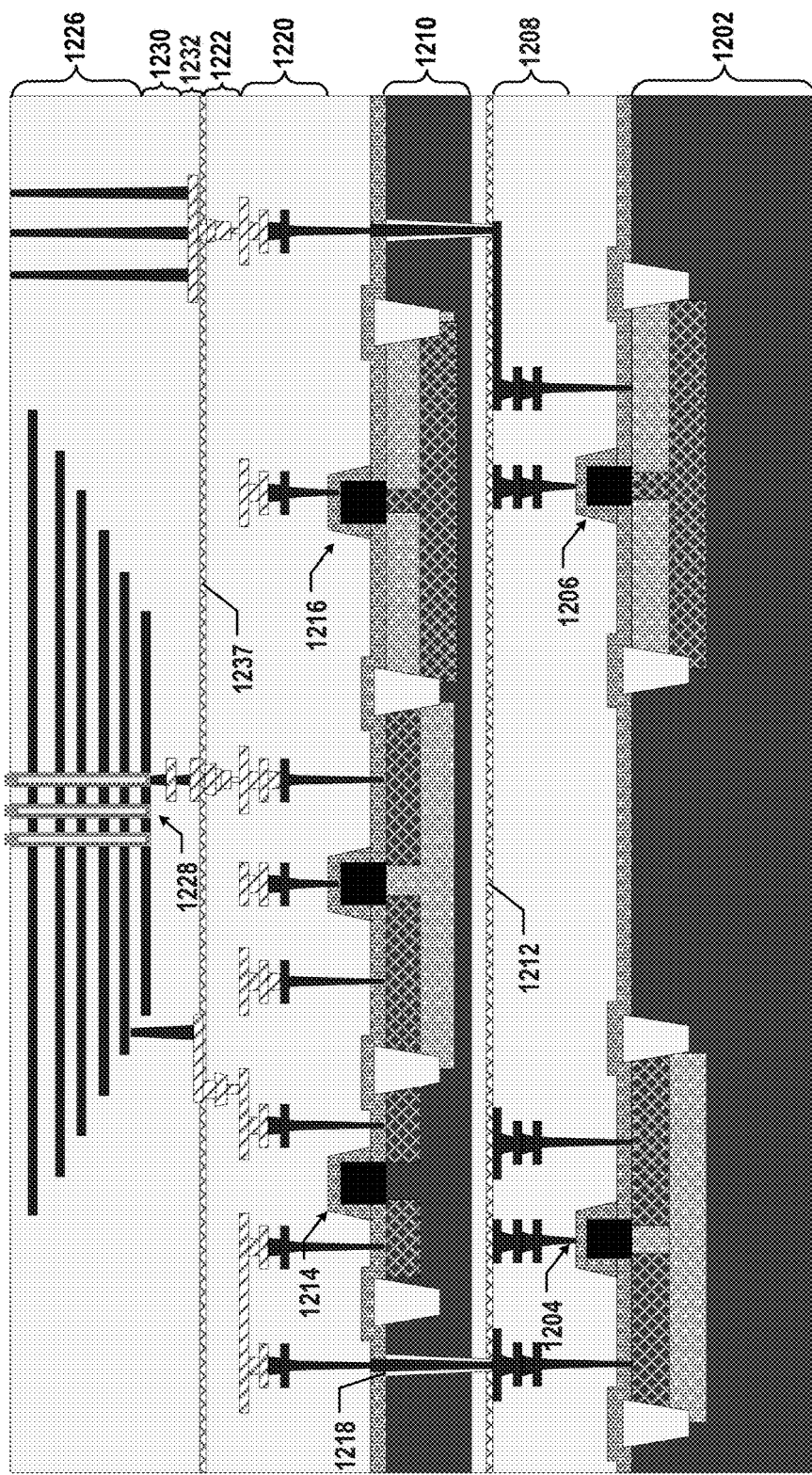
Figure 12H:
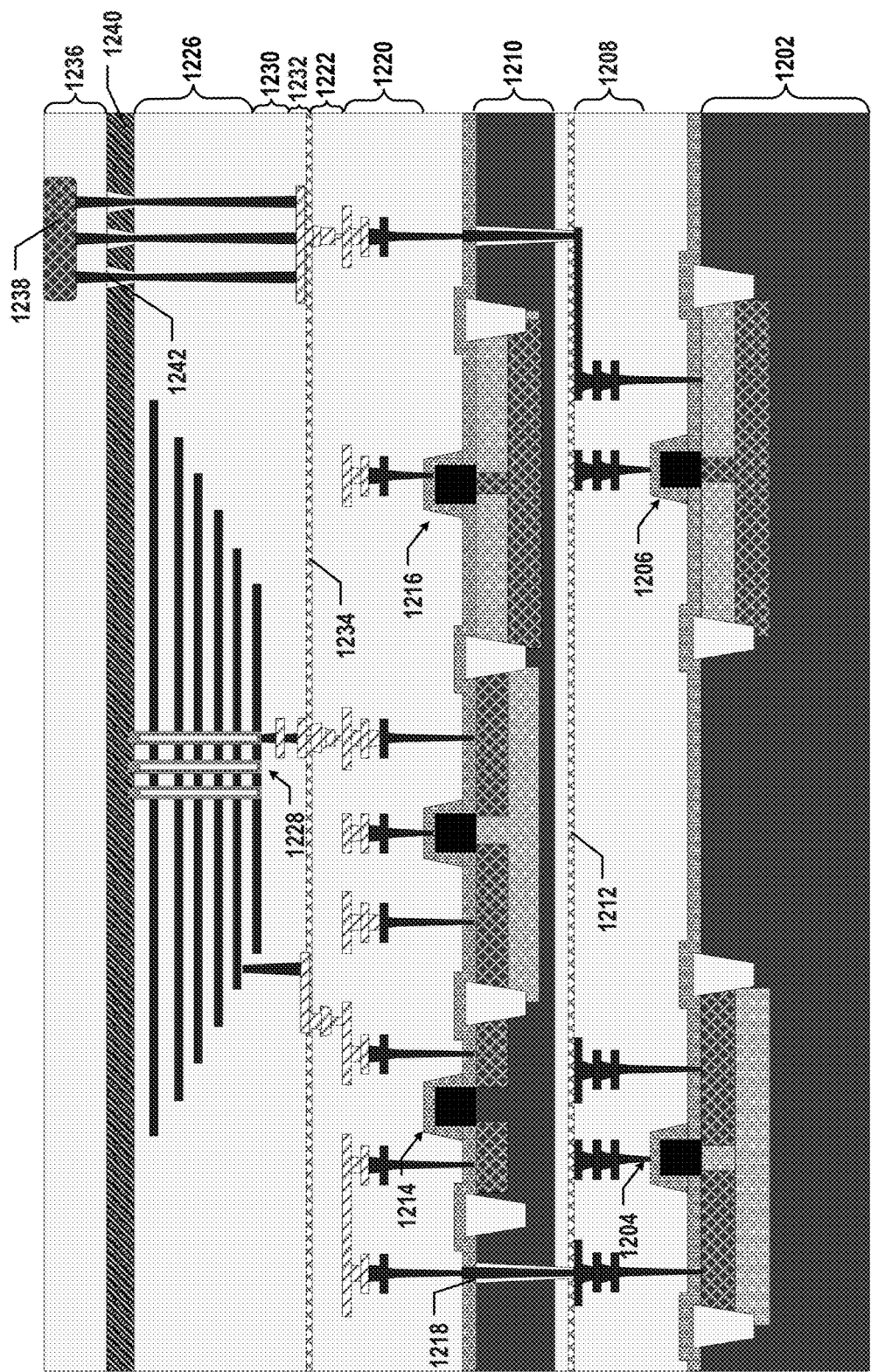

In some implementations, a semiconductor layer having polysilicon is formed. To form the semiconductor layer, the first substrate is removed and replaced with the semiconductor layer. As illustrated in FIG. 12G, silicon substrate 1224 (shown in FIG. 12F) is removed, for example, using wafer grinding, dry etch, wet etch, CMP, any other suitable processes, to expose the channel structures (e.g., bottom open channel structure 812C in FIG. 8C) of NAND memory strings 1228 from the source end. As illustrated in FIG. 12H, a semiconductor layer 1240 having polysilicon is formed to be in contact with the sources of NAND memory strings 1228. Semiconductor layer 1240 can be formed by depositing polysilicon using one or more thin film deposition processes including, but not limited to, CVD, PVD, ALD, or any combination thereof. Similarly, pad-out interconnect layer 1236 including contact pads 1238 can be formed on semiconductor layer 1240. Contacts 1242 can be formed through semiconductor layer 1240 having polysilicon after the formation of semiconductor layer 1240.

Figure 15:
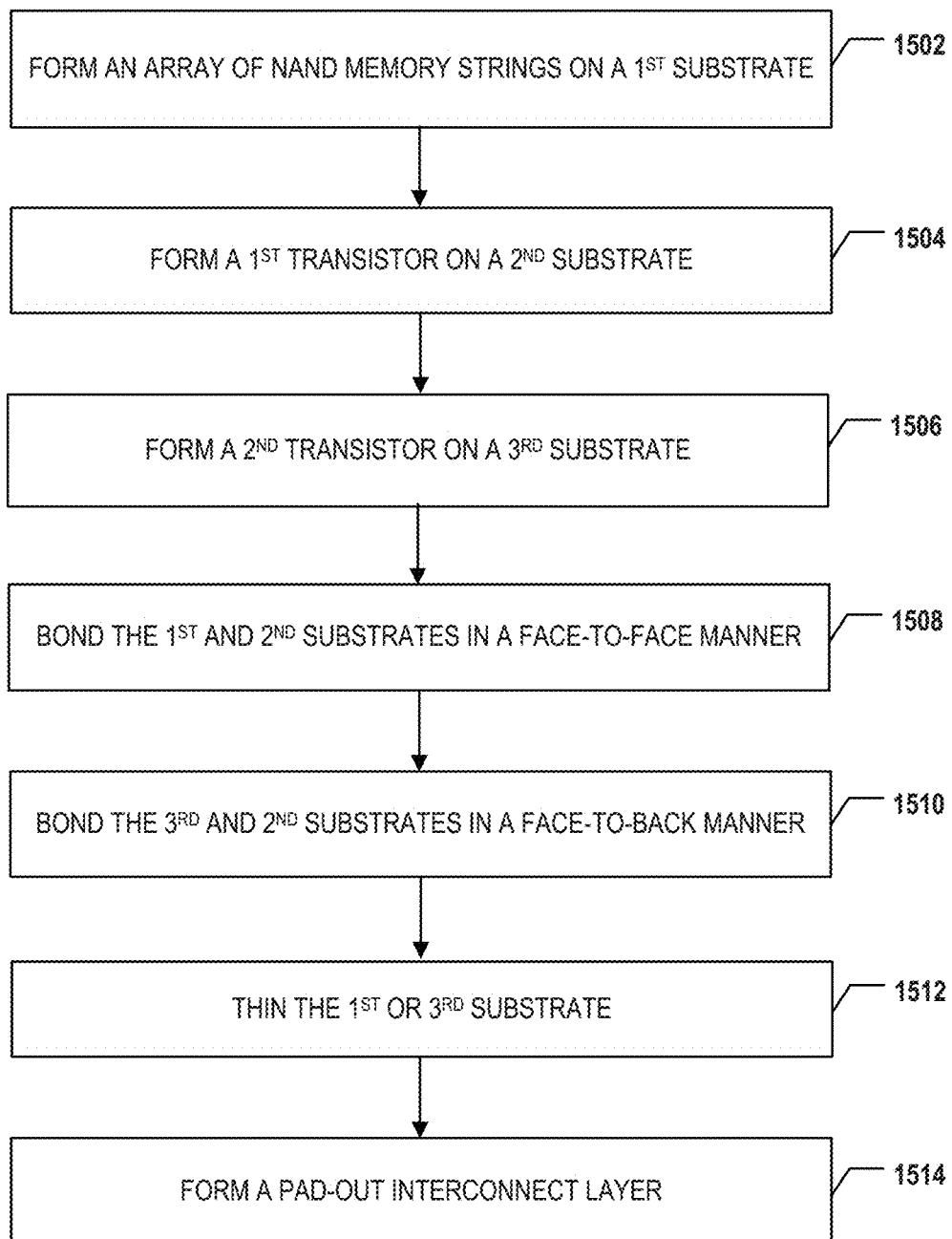
FIG. 15 illustrates a flowchart of a method for forming the 3D memory devices in FIGS. 10A and 10B, according to some aspects of the present disclosure.

FIGS. 13A-13H illustrate another fabrication process for forming the 3D memory devices in FIGS. 10A and 10B, according to some aspects of the present disclosure. FIG. 15 illustrates a flowchart of another method 1500 for forming the 3D memory devices in FIGS. 10A and 10B, according to some aspects of the present disclosure. Examples of the 3D memory devices depicted in FIGS. 13A-13H and 15 include 3D memory devices 1100, 1101, and 1103 depicted in FIGS. 11A-11C. FIGS. 13A-13H and 15 will be described together. It is understood that the operations shown in method 1500 are not exhaustive and that other operations can be performed as well before, after, or between any of the illustrated operations. Further, some of the operations may be performed simultaneously, or in a different order than shown in FIG. 15. For example, operation 1502, 1504, and 1506 may be performed in parallel.

Referring to FIG. 15, method 1500 starts at operation 1502, in which an array of NAND memory strings is formed on a first substrate. The first substrate can be a silicon substrate having single crystalline silicon. In some implementations, to form the array of NAND memory strings, a memory stack is formed on the first substrate.

Figure 13A:
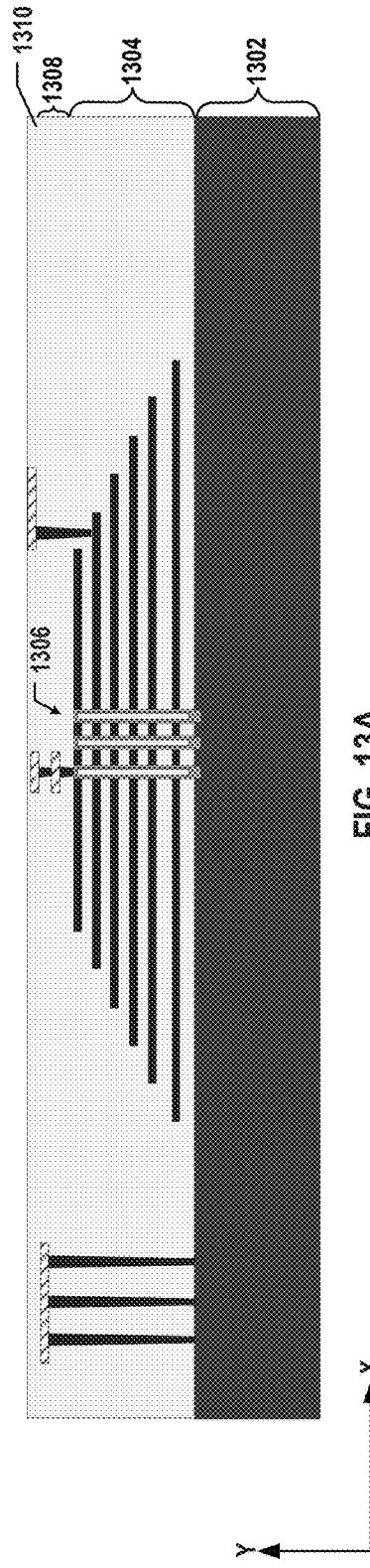
FIGS. 13A-13H illustrate another fabrication process for forming the 3D memory devices in FIGS. 10A and 10B, according to some aspects of the present disclosure.

As illustrated in FIG. 13A, a stack structure, such as a memory stack 1304 including interleaved conductive layers and dielectric layers, is formed on a silicon substrate 1302. To form memory stack 1304, in some implementations, a dielectric stack (not shown) including interleaved sacrificial layers (not shown) and the dielectric layers is formed on silicon substrate 1302. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. Memory stack 1304 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that memory stack 1304 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between memory stack 1304 and silicon substrate 1302.

As illustrated in FIG. 13A, NAND memory strings 1306 are formed above silicon substrate 1302, each of which extends vertically through memory stack 1304 to be in contact with silicon substrate 1302. In some implementations, fabrication processes to form NAND memory string 1306 include forming a channel hole through memory stack 1304 (or the dielectric stack) and into silicon substrate 1302 using dry etching/and or wet etching, such as DRIE, followed by subsequently filling the channel hole with a plurality of layers, such as a memory film (e.g., a tunneling layer, a storage layer, and a blocking layer) and a semiconductor layer, using thin film deposition processes such as ALD, CVD, PVD, or any combination thereof. It is understood that the details of fabricating NAND memory strings 1306 may vary depending on the types of channel structures of NAND memory strings 1306 (e.g., bottom plug channel structure 812A, sidewall plug channel structure 812B, or bottom open channel structure 812C in FIGS. 8A-8C) and thus, are not elaborated for ease of description.

In some implementations, an interconnect layer is formed above the array of NAND memory strings on the first substrate. The interconnect layer can include a first plurality of interconnects in one or more ILD layers. As illustrated in FIG. 13A, an interconnect layer 1308 is formed above memory stack 1304 and NAND memory strings 1306. Interconnect layer 1308 can include interconnects of MEOL and/or BEOL in a plurality of ILD layers to make electrical connections with NAND memory strings 1306. In some implementations, interconnect layer 1308 includes multiple ILD layers and interconnects therein formed in multiple processes. For example, the interconnects in interconnect layer 1308 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 13A can be collectively referred to as interconnect layer 1308.

In some implementations, a first bonding layer is formed above interconnect layer. The first bonding layer can include a plurality of first bonding contacts. As illustrated in FIG. 13A, a bonding layer 1310 is formed above interconnect layer 1308. Bonding layer 1310 can include a plurality of bonding contacts surrounded by dielectrics. In some implementations, a dielectric layer is deposited on the top surface of interconnect layer 1308 by one or more thin film deposition processes including, but not limited to, CVD, PVD, ALD, or any combination thereof. The bonding contacts can then be formed through the dielectric layer and in contact with the interconnects in interconnect layer 1308 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

Figure 13B:
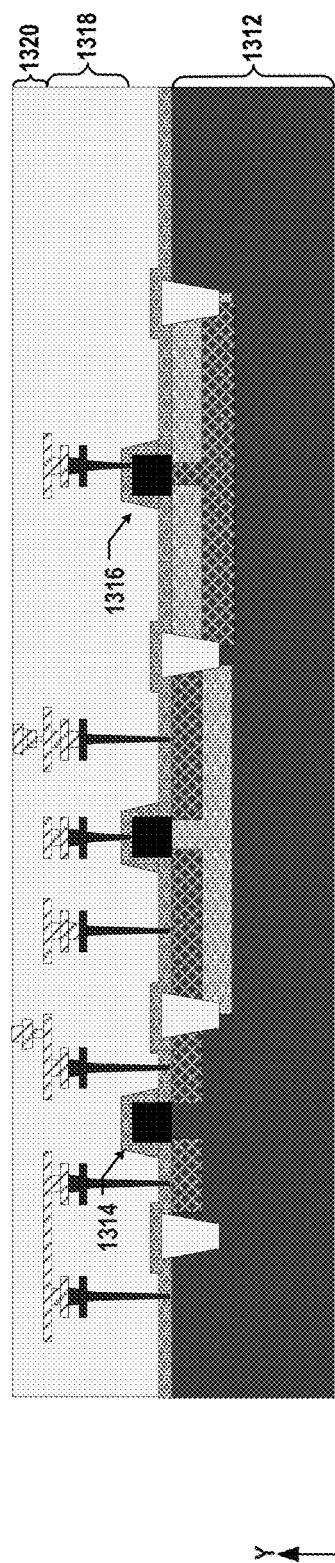

Method 1500 proceeds to operation 1504, as illustrated in FIG. 15, in which a first transistor is formed on a second substrate. The second substrate can be a silicon substrate having single crystalline silicon. As illustrated in FIG. 13B, a plurality of transistors 1314 and 1316 are formed on a silicon substrate 1312. Transistors 1314 and 1316 can be formed by a plurality of processes including, but not limited to, photolithography, dry/wet etch, thin film deposition, thermal growth, implantation, CMP, and any other suitable processes. In some implementations, doped regions are formed in silicon substrate 1312 by ion implantation and/or thermal diffusion, which function, for example, as wells and source/drain regions of transistors 1314 and 1316. In some implementations, isolation regions (e.g., STIs) are also formed in silicon substrate 1312 by wet/dry etch and thin film deposition. In some implementations, the thickness of gate dielectric of transistor 1314 is different from the thickness of gate dielectric of transistor 1316, for example, by depositing a thicker silicon oxide film in the region of transistor 1314 than the region of transistor 1316, or by etching back part of the silicon oxide film deposited in the region of transistor 1316. It is understood that the details of fabricating transistors 1314 and 1316 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer 1318 is formed above the transistor on the second substrate. The interconnect layer can include a plurality of interconnects in one or more ILD layers. As illustrated in FIG. 13B, an interconnect layer 1318 can be formed above transistors 1314 and 1316. Interconnect layer 1318 can include interconnects of MEOL and/or BEOL in a plurality of ILD layers to make electrical connections with transistors 1314 and 1316. In some implementations, interconnect layer 1318 includes multiple ILD layers and interconnects therein formed in multiple processes. For example, the interconnects in interconnect layer 1318 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 13B can be collectively referred to as interconnect layer 1318.

In some implementations, a second bonding layer is formed above interconnect layer. The second bonding layer can include a plurality of second bonding contacts. As illustrated in FIG. 13B, a bonding layer 1320 is formed above interconnect layer 1318. Bonding layer 1320 can include a plurality of bonding contacts surrounded by dielectrics. In some implementations, a dielectric layer is deposited on the top surface of interconnect layer 1318 by one or more thin film deposition processes including, but not limited to, CVD, PVD, ALD, or any combination thereof. The bonding contacts can then be formed through the dielectric layer and in contact with the interconnects in interconnect layer 1318 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

Method 1500 proceeds to operation 1506, as illustrated in FIG. 15, in which a second transistor is formed on a third substrate. The third substrate can be a silicon substrate having single crystalline silicon. In some implementations, any two or all of operations 1502, 1504, and 1506 are performed in parallel to reduce process time.

Figure 13C:
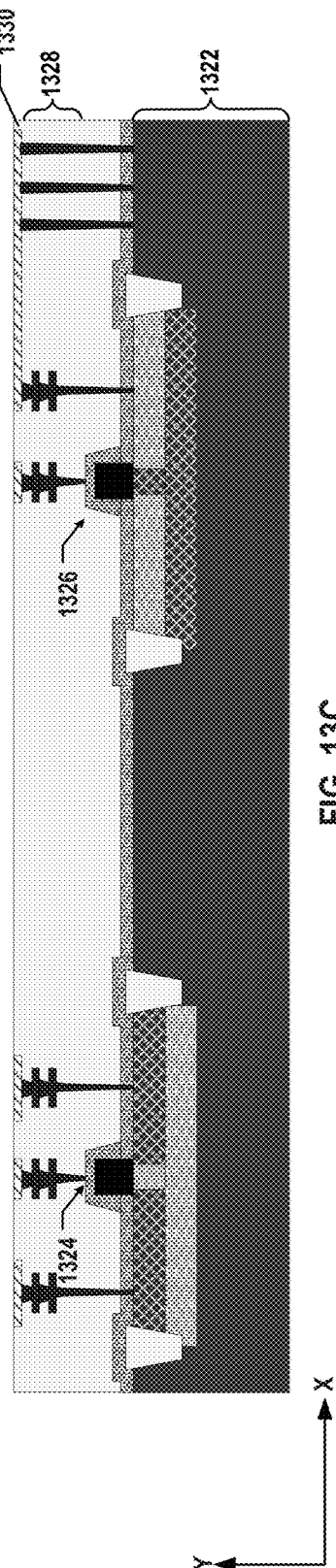

As illustrated in FIG. 13C, a plurality of transistors 1324 and 1326 are formed on a silicon substrate 1322. Transistors 1324 and 1326 can be formed by a plurality of processes including, but not limited to, photolithography, dry/wet etch, thin film deposition, thermal growth, implantation, CMP, and any other suitable processes. In some implementations, doped regions are formed in silicon substrate 1322 by ion implantation and/or thermal diffusion, which function, for example, as wells and source/drain regions of transistors 1324 and 1326. In some implementations, isolation regions (e.g., STIs) are also formed in silicon substrate 1322 by wet/dry etch and thin film deposition. In some implementations, the thickness of gate dielectric of transistor 1324 is different from the thickness of gate dielectric of transistor 1326, for example, by depositing a thicker silicon oxide film in the region of transistor 1324 than the region of transistor 1326, or by etching back part of the silicon oxide film deposited in the region of transistor 1326. It is understood that the details of fabricating transistors 1324 and 1326 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer 1328 is formed above the transistor on the third substrate. The interconnect layer can include a plurality of interconnects in one or more ILD layers. As illustrated in FIG. 13C, an interconnect layer 1328 can be formed above transistors 1324 and 1326. Interconnect layer 1328 can include interconnects of MEOL and/or BEOL in a plurality of ILD layers to make electrical connections with transistors 1324 and 1326. In some implementations, interconnect layer 1328 includes multiple ILD layers and interconnects therein formed in multiple processes. For example, the interconnects in interconnect layer 1328 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 13C can be collectively referred to as interconnect layer 1328.

In some implementations, a third bonding layer is formed above interconnect layer. The third bonding layer can include a plurality of third bonding contacts. As illustrated in FIG. 13C, a bonding layer 1330 is formed above interconnect layer 1328. Bonding layer 1330 can include a plurality of bonding contacts surrounded by dielectrics. In some implementations, a dielectric layer is deposited on the top surface of interconnect layer 1328 by one or more thin film deposition processes including, but not limited to, CVD, PVD, ALD, or any combination thereof. The bonding contacts can then be formed through the dielectric layer and in contact with the interconnects in interconnect layer 1328 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

Method 1500 proceeds to operation 1508, as illustrated in FIG. 15, in which the first substrate and the second substrate are bonded in a face-to-face manner. The first bonding contact in the first bonding layer can be in contact with the second bonding contact in the second bonding layer at a first bonding interface after bonding the first and second substrates. The bonding can include hybrid bonding.

Figure 13D:
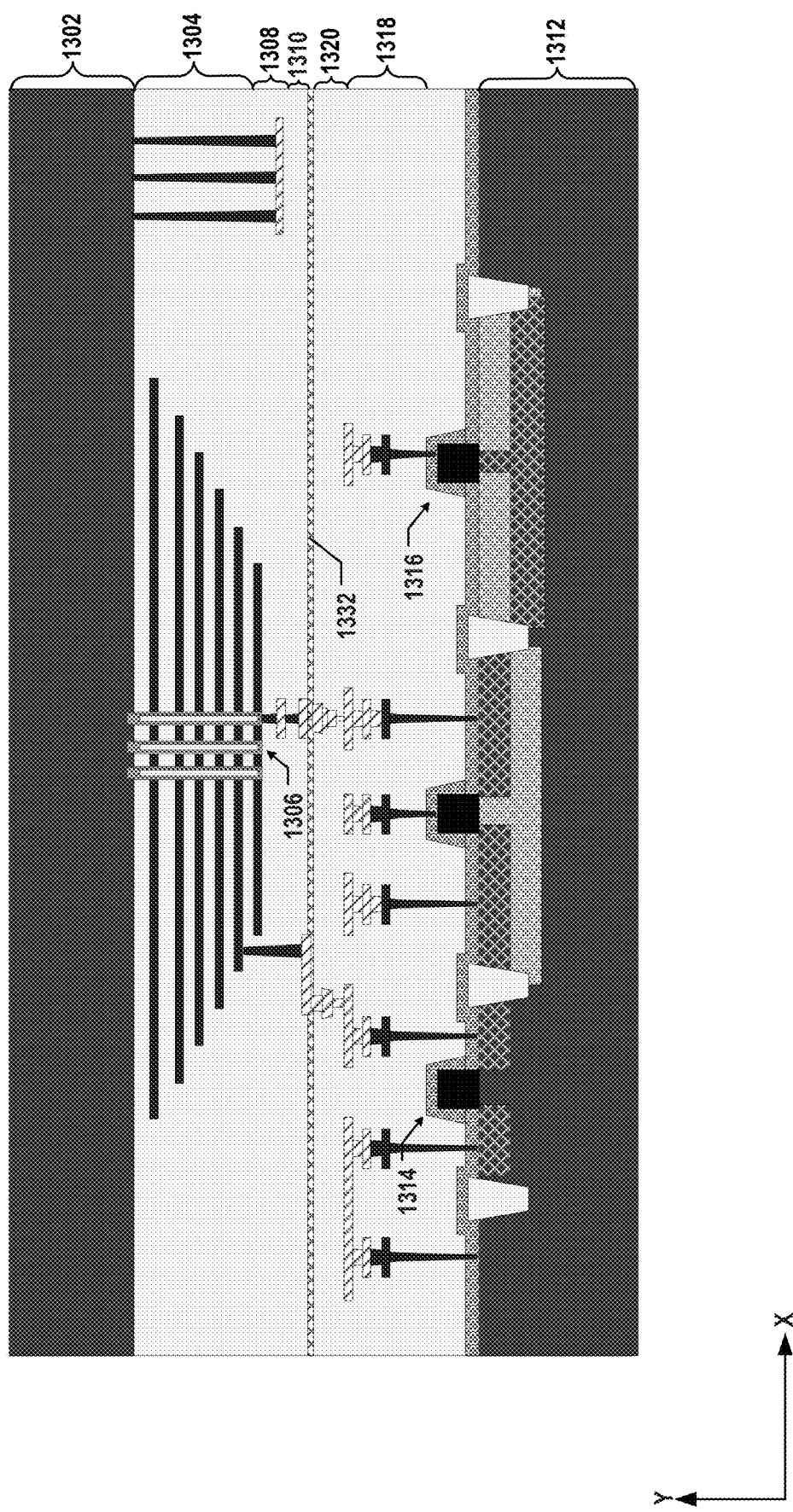

As illustrated in FIG. 13D, silicon substrate 1302 and components formed thereon (e.g., memory stack 1304 and NAND memory strings 1306 formed therethrough) are flipped upside down. Bonding layer 1310 facing down is bonded with bonding layer 1320 facing up, i.e., in a face-to-face manner, thereby forming a bonding interface 1332.

That is, silicon substrate 1302 and components formed thereon can be bonded with silicon substrate 1312 and components formed thereon in a face-to-face manner, such that the bonding contacts in bonding layer 1310 are in contact with the bonding contacts in bonding layer 1320 at bonding interface 1332. In some implementations, a treatment process, e.g., plasma treatment, wet treatment and/or thermal treatment, is applied to bonding surfaces prior to bonding. Although not shown in FIG. 13D, it is understood that in some examples, silicon substrate 1312 and components formed thereon (e.g., transistors 1314 and 1316) can be flipped upside down, and bonding layer 1320 facing down can be bonded with bonding layer 1310 facing up, i.e., in a face-to-face manner, thereby forming bonding interface 1332 as well.

As a result of the bonding, e.g., hybrid bonding, the bonding contacts on opposite sides of bonding interface 1332 can be inter-mixed. After the bonding, the bonding contacts in bonding layer 1310 and the bonding contacts in bonding layer 1320 are aligned and in contact with one another, such that memory stack 1304 and NAND memory strings 1306 formed therethrough can be coupled to transistors 1314 and 1316 through the bonded bonding contacts across bonding interface 1332, according to some implementations.

Figure 13E:
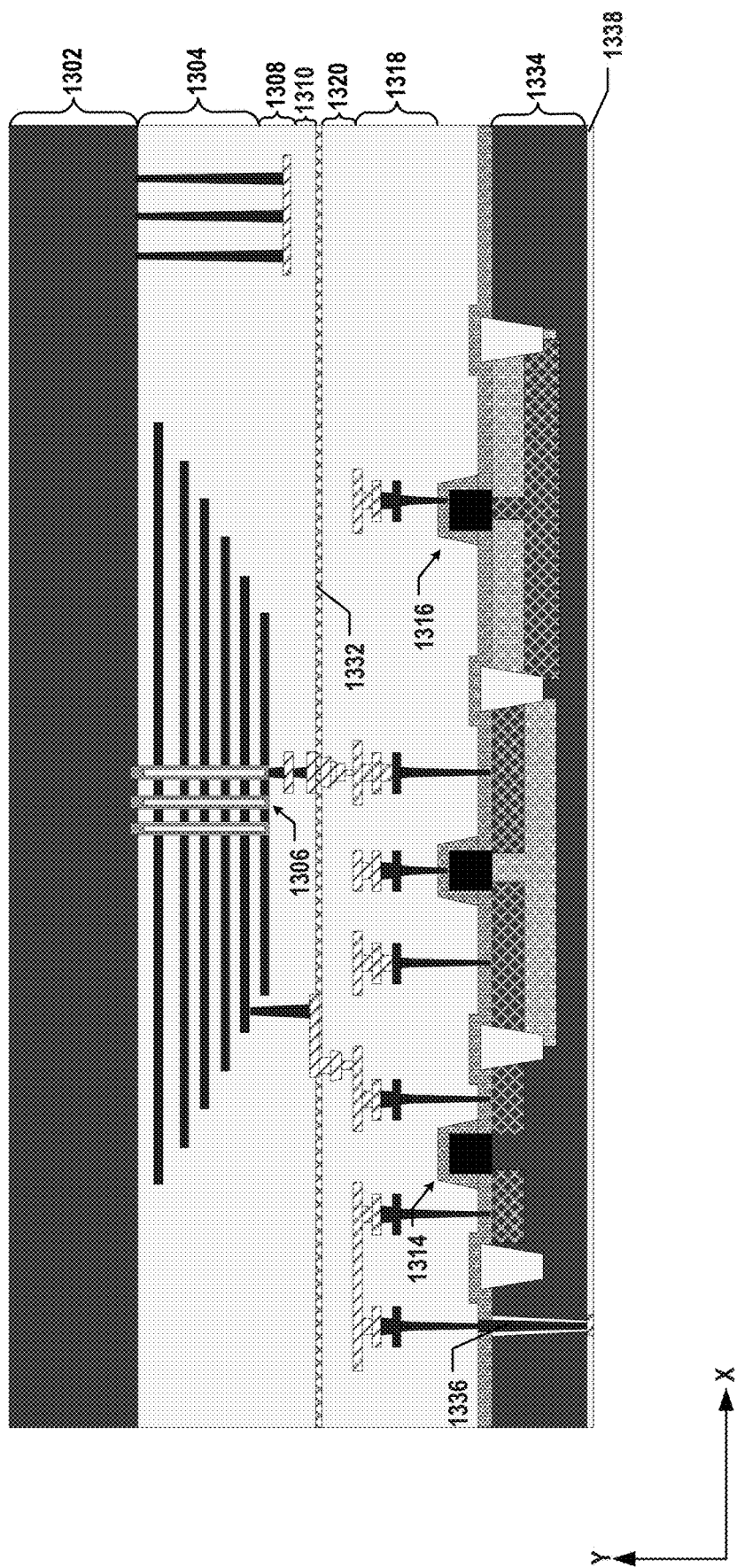

In some implementations, the second substrate is thinned, and a contact through the thinned second substrate is formed. As illustrated in FIG. 13E, silicon substrate 1312 (shown in FIG. 13D) is thinned to become a semiconductor layer 1334 having single crystalline silicon. Silicon substrate 1312 can be thinned by processes including, but not limited to, wafer grinding, dry etch, wet etch, CMP, any other suitable processes, or any combination thereof.

As illustrated in FIG. 13E, one or more contacts 1336 each extending vertically through semiconductor layer 1334 is formed. Contacts 1336 can be coupled to the interconnects in interconnect layer 1318. Contacts 1336 can be formed by first patterning contact holes through semiconductor layer 1334 using patterning process (e.g., photolithography and dry/wet etch of dielectric materials in the dielectric layer). The contact holes can be filled with a conductor (e.g., W or Cu). In some implementations, filling the contact holes includes depositing a spacer (e.g., a silicon oxide layer) before depositing the conductor. It is understood that in some examples, contacts 1336 may be formed in silicon substrate 1312 before thinning (the formation of semiconductor layer 1334, e.g., in FIG. 13B) and be exposed from the backside of silicon substrate 1312 (where the thinning occurs) after the thinning.

In some implementations, a bonding layer is on the thinned second substrate. The bonding layer can include a plurality of bonding contacts. As illustrated in FIG. 13E, a bonding layer 1338 is formed on semiconductor layer 1334, i.e., the backside of silicon substrate 1312 (where the thinning occurs) after the thinning. Bonding layer 1338 can include a plurality of bonding contacts surrounded by dielectrics. In some implementations, a dielectric layer is deposited on the surface of semiconductor layer 1334 by one or more thin film deposition processes including, but not limited to, CVD, PVD, ALD, or any combination thereof. The bonding contacts can then be formed through the dielectric layer and in contact with contacts 1336 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor. It is understood that in some examples, bonding layer 1338 may be a dielectric layer (e.g., a silicon oxide layer) without bonding contacts for fusion bonding, instead of hybrid bonding. It is further understood that in some examples, bonding layer 1338 may be omitted to expose the silicon surface of semiconductor layer 1334 for anodic bonding or fusion bonding, instead of hybrid bonding.

Method 1500 proceeds to operation 1510, as illustrated in FIG. 15, in which the third substrate and the second substrate are bonded in a face-to-back manner. The third bonding contact in the third bonding layer can be in contact with the fourth bonding contact in the fourth bonding layer at a second bonding interface after bonding the third and second substrates. The bonding can include hybrid bonding.

Figure 13F:
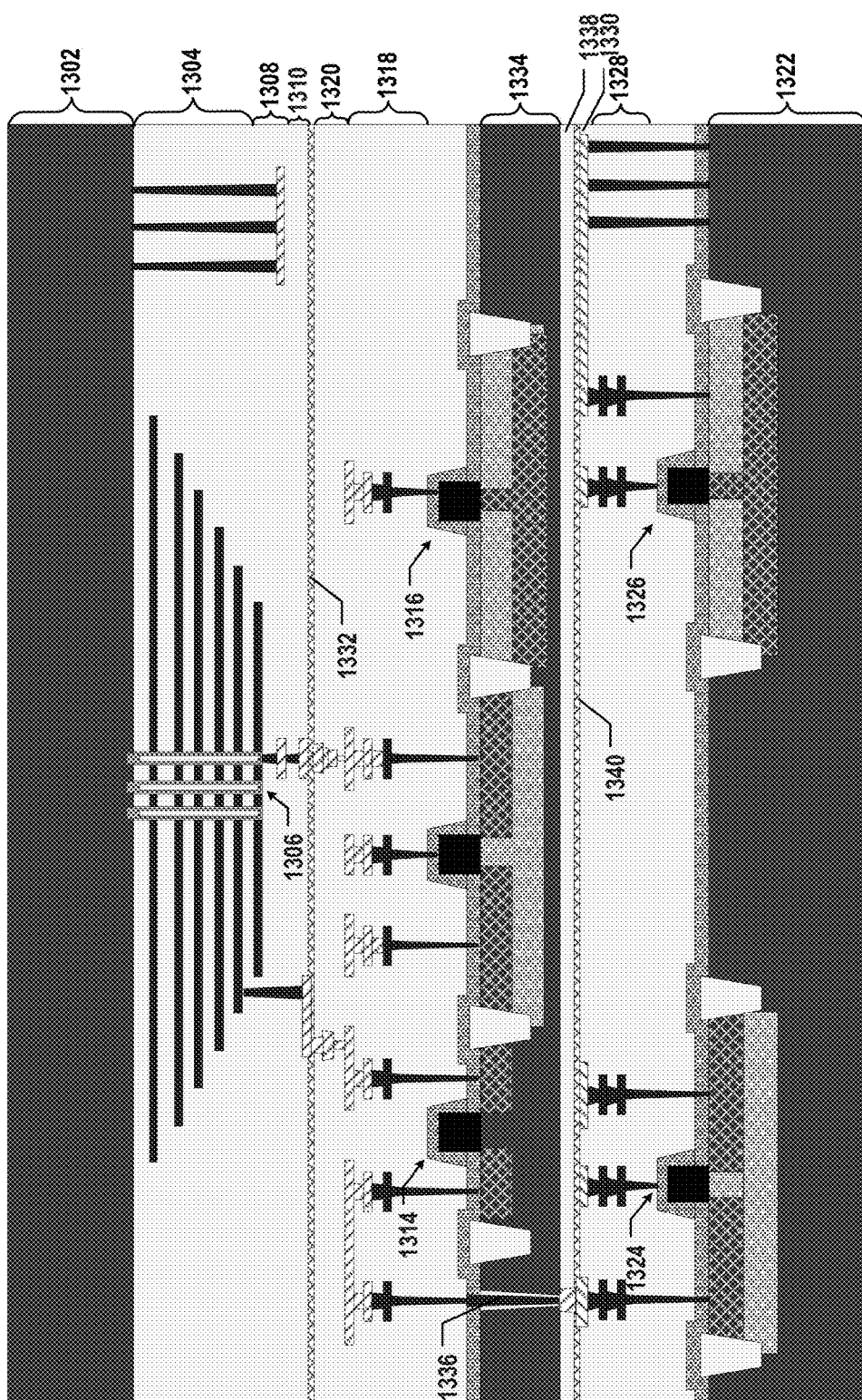

As illustrated in FIG. 13F, silicon substrate 1302 and components formed thereon after bonding with silicon substrate 1312 (e.g., memory stack 1304, NAND memory strings 1306, and transistors 1314 and 1316) are flipped upside down. Bonding layer 1338 facing down is bonded with bonding layer 1330 facing up, i.e., in a face-to-face manner, thereby forming a bonding interface 1340. That is, silicon substrate 1302 and components formed thereon can be bonded with silicon substrate 1322 and components formed thereon in a face-to-face manner, such that the bonding contacts in bonding layer 1338 are in contact with the bonding contacts in bonding layer 1330 at bonding interface 1340. In some implementations, a treatment process, e.g., plasma treatment, wet treatment and/or thermal treatment, is applied to bonding surfaces prior to bonding. Although not shown in FIG. 13F, it is understood that in some examples, silicon substrate 1322 and components formed thereon (e.g., transistors 1324 and 1326) can be flipped upside down, and bonding layer 1330 facing down can be bonded with bonding layer 1338 facing up, i.e., in a face-to-face manner, thereby forming bonding interface 1340 as well.

As a result of the bonding, e.g., hybrid bonding, the bonding contacts on opposite sides of bonding interface 1340 can be inter-mixed. After the bonding, the bonding contacts in bonding layer 1338 and the bonding contacts in bonding layer 1330 are aligned and in contact with one another, such that memory stack 1304, NAND memory strings 1306, and transistors 1314 and 1316 can be coupled to transistors 1324 and 1326 through contacts 1336 through semiconductor layer 1334 and the bonded bonding contacts across bonding interface 1340, according to some implementations. It is understood that in some examples, anodic bonding or fusion bonding, instead of hybrid bonding, may be performed to bond silicon substrates 1302 and 1322 (and components formed thereon) at bonding interface 1340 without bonding contacts in bonding layer 1338.

Figure 13G:
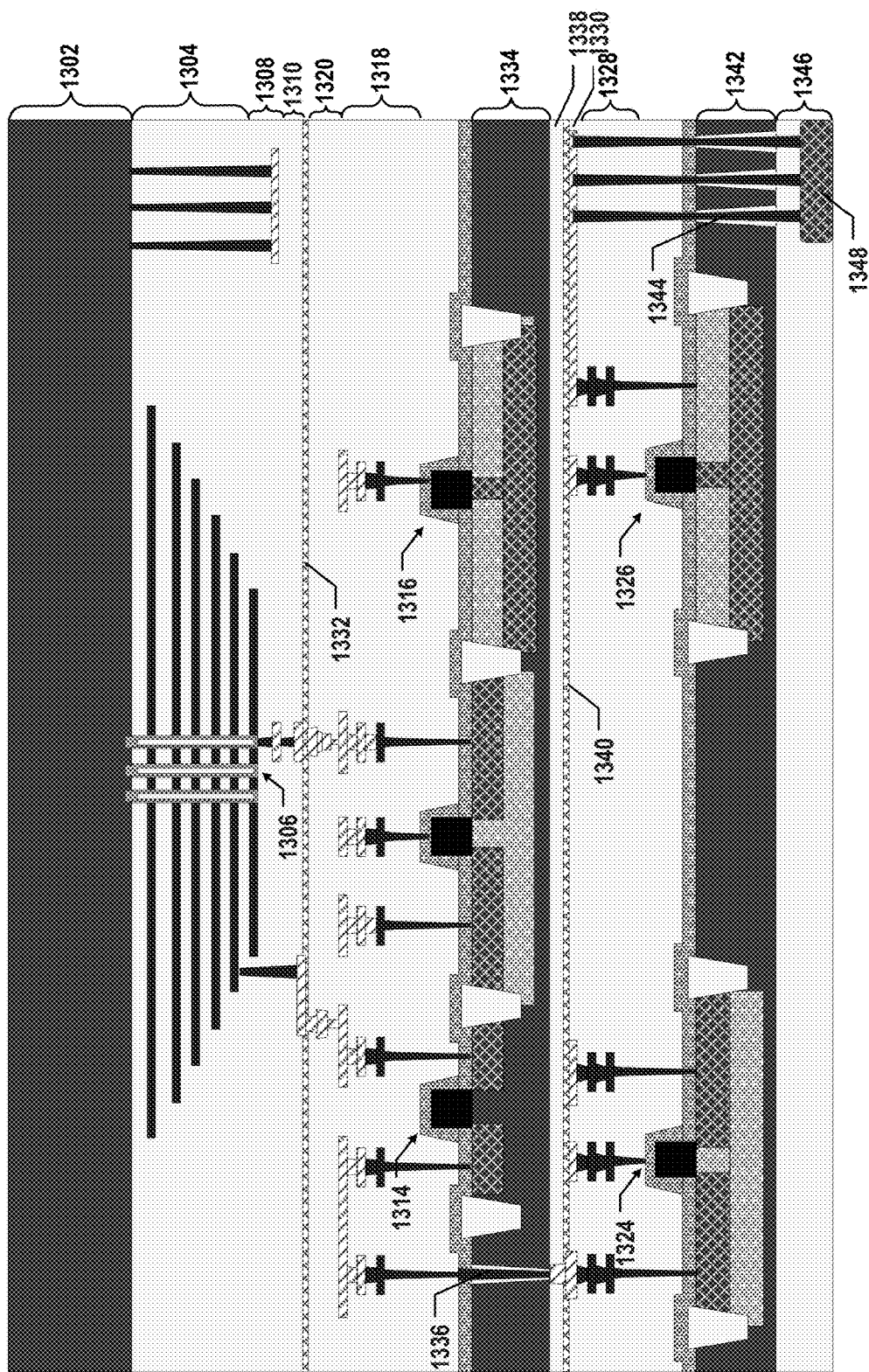

Method 1500 proceeds to operation 1512, as illustrated in FIG. 15, in which the first substrate or the third substrate is thinned. As illustrated in FIG. 13G, silicon substrate 1322 (shown in FIG. 13F) is thinned to become a semiconductor layer 1342 having single crystalline silicon. Silicon substrate 1322 can be thinned by processes including, but not limited to, wafer grinding, dry etch, wet etch, CMP, any other suitable processes, or any combination thereof.

Method 1500 proceeds to operation 1514, as illustrated in FIG. 15, in which a pad-out interconnect layer is formed. The pad-out interconnect layer can be formed on the thinned third substrate or above the array of NAND memory strings. As illustrated in FIG. 13G, a pad-out interconnect layer 1346 is formed on semiconductor layer 1342 (the thinned silicon substrate 1322). Pad-out interconnect layer 1346 can include interconnects, such as contact pads 1348, formed in one or more ILD layers. Contact pads 1348 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some implementations, after the bonding and thinning, contacts 1344 are formed extending vertically through semiconductor layer 1342, for example, by wet/dry etching followed by depositing dielectric materials as spacers and conductive materials as conductors. Contacts 1344 can couple contact pads 1348 in pad-out interconnect layer 1346 to the interconnects in interconnect layer 1328. It is understood that in some examples, contacts 1344 may be formed in silicon substrate 1322 before thinning (the formation of semiconductor layer 1342, e.g., in FIG. 13C) and be exposed from the backside of silicon substrate 1322 (where the thinning occurs) after the thinning.

Figure 13H:
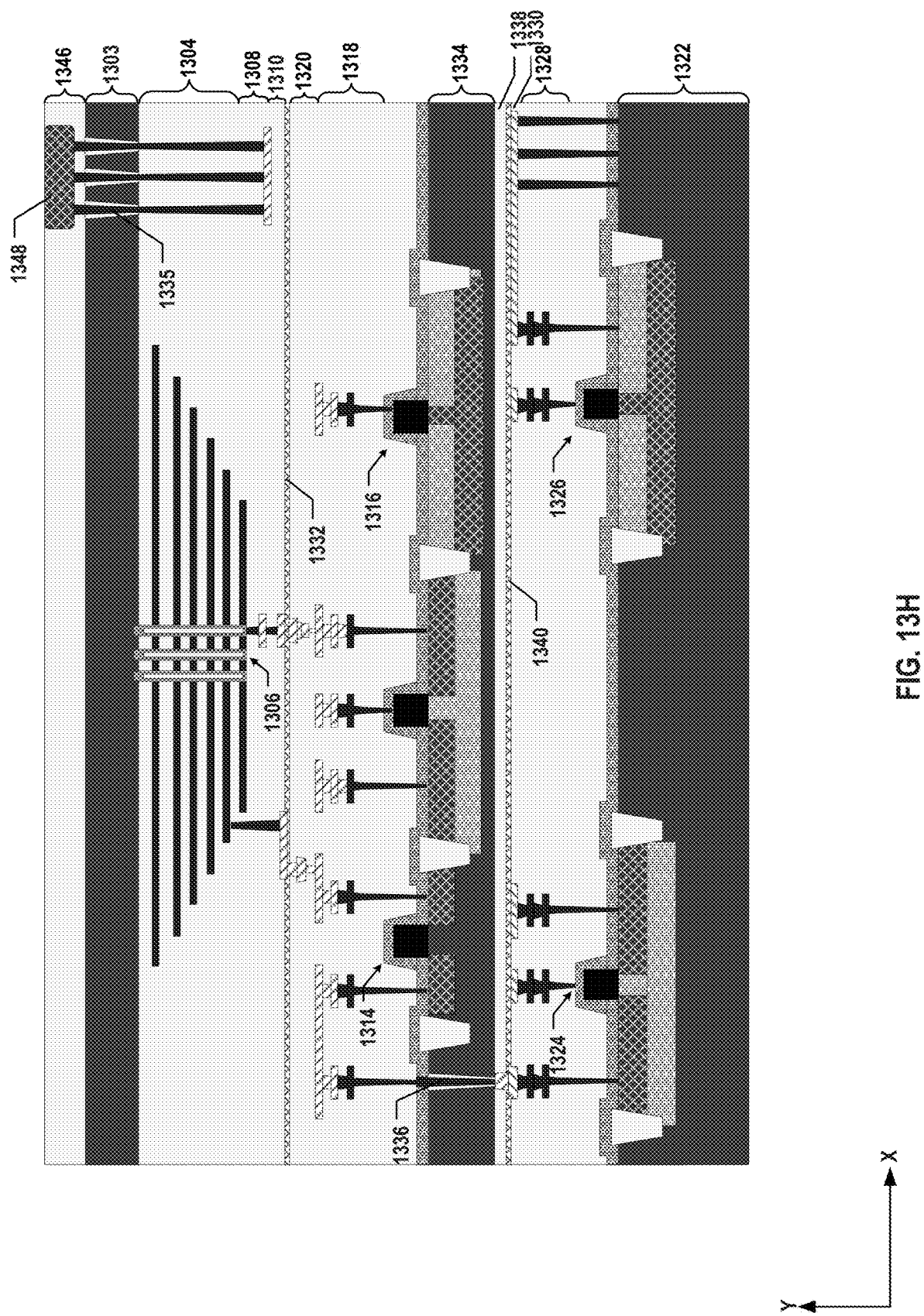

In some implementations, the first substrate is thinned, and the pad-out interconnect layer is formed on the thinned first substrate. As illustrated in FIG. 13H, silicon substrate 1302 (shown in FIG. 13F) is thinned to become a semiconductor layer 1303 having single crystalline silicon. Silicon substrate 1302 can be thinned by processes including, but not limited to, wafer grinding, dry etch, wet etch, CMP, any other suitable processes, or any combination thereof. As illustrated in FIG. 13H, pad-out interconnect layer 1346 is formed on semiconductor layer 1303 (the thinned silicon substrate 1302). Pad-out interconnect layer 1346 can include interconnects, such as contact pads 1348, formed in one or more ILD layers. In some implementations, after the bonding and thinning, contacts 1335 are formed extending vertically through semiconductor layer 1303, for example, by wet/dry etching followed by depositing dielectric materials as spacers and conductive materials as conductors. Contacts 1335 can couple contact pads 1348 in pad-out interconnect layer 1346 to the interconnects in interconnect layer 1308. It is understood that in some examples, contacts 1335 may be formed in silicon substrate 1302 before thinning (i.e., before the formation of semiconductor layer 1303, e.g., in FIG. 13A) without fully penetrating through silicon substrate 1302 and be exposed from the backside of silicon substrate 1302 (where the thinning occurs) after the thinning. It is also understood that in some examples, the first substrate (e.g., silicon substrate 1302 or semiconductor layer 1303 after thinning) may be removed and replaced with a semiconductor layer having polysilicon in a similar manner as described above with respect to FIGS. 12G and 12H.

Figure 16A:
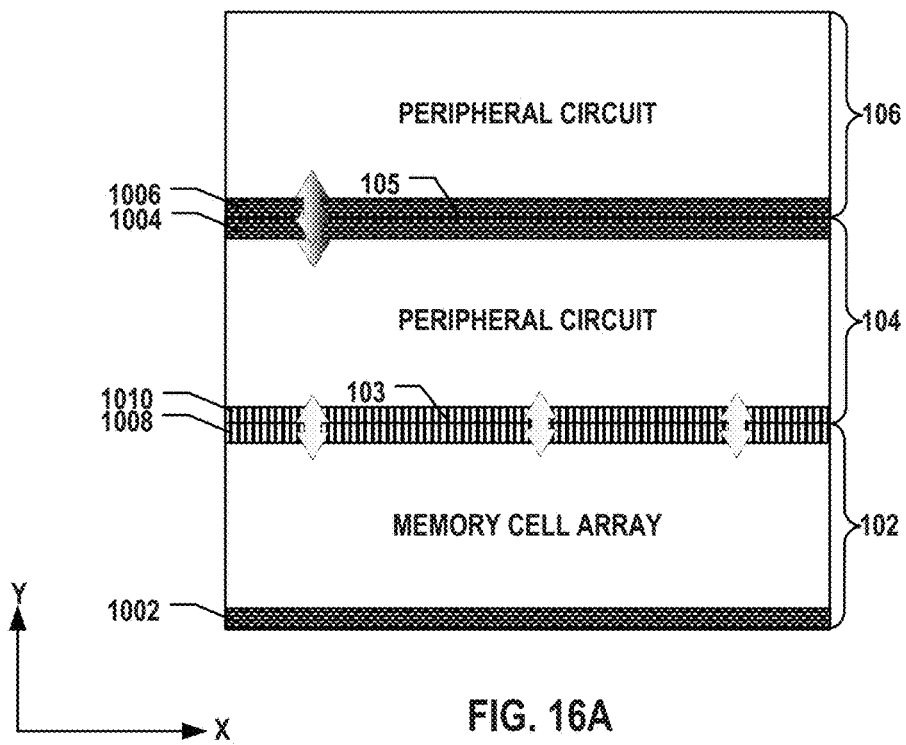
FIGS. 16A and 16B illustrate schematic views of cross-sections of the 3D memory devices in FIGS. 9A and 9B, according to various aspects of the present disclosure.
Figure 16B:
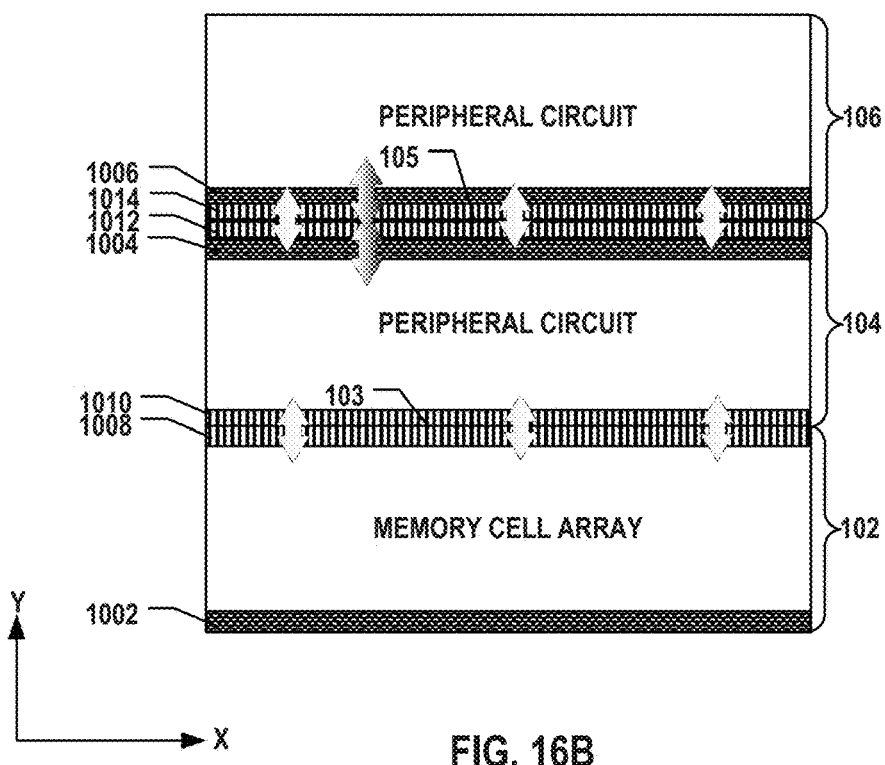

FIGS. 16A and 16B illustrate schematic views of cross-sections of the 3D memory devices in FIGS. 9A and 9B, according to various aspects of the present disclosure. 3D memory devices 1600 and 1601 may be examples of 3D memory devices 900 and 901 in FIGS. 9A and 9B. As shown in FIG. 16A, 3D memory device 1600 can include stacked first, second, and third semiconductor structures 102, 104, and 106. In some implementations, first semiconductor structure 102 on one side of 3D memory device 1600 includes a semiconductor layer 1002, a bonding layer 1008, and a memory cell array vertically between semiconductor layer 1002 and bonding layer 1008. The memory cell array can include an array of NAND memory strings (e.g., NAND memory strings 208 disclosed herein), and the sources of the array of NAND memory strings can be in contact with semiconductor layer 1002 (e.g., as shown in FIGS. 8A-8C). Semiconductor layer 1002 can include semiconductor materials, such as single crystalline silicon (e.g., a silicon substrate or a thinned silicon substrate) or polysilicon (e.g., a deposited layer), for example, depending on the types of channel structures of the NAND memory strings (e.g., bottom plug channel structure 812A, sidewall plug channel structure 812B, or bottom open channel structure 812C). Bonding layer 1008 can include conductive bonding contacts (not shown) and dielectrics electrically isolating the bonding contacts, which can be used, for example, for hybrid bonding as described below in detail.

In some implementations, second semiconductor structure 104 in the intermediate of 3D memory device 1600 includes a semiconductor layer 1004, a bonding layer 1010, and some of the peripheral circuits of the memory cell array that are vertically between semiconductor layer 1004 and bonding layer 1010. The transistors (e.g., planar transistors 500 and 3D transistors 600) of the peripheral circuits can be in contact with semiconductor layer 1004. Semiconductor layer 1004 can include semiconductor materials, such as single crystalline silicon (e.g., a layer transferred from a silicon substrate or an SOI substrate). It is understood that in some examples, different from semiconductor layer 1002 in first semiconductor structure 102, semiconductor layer 1004 on which the transistors are formed may include single crystalline silicon, but not polysilicon, due to the superior carrier mobility of single crystalline silicon that is desirable for transistors' performance. Similar to bonding layer 1008 in first semiconductor structure 102, bonding layer 1010 can also include conductive bonding contacts (not shown) and dielectrics electrically isolating the bonding contacts. Bonding interface 103 is vertically between and in contact with bonding layers 1008 and 1010, respectively, according to some implementations. That is, bonding layers 1008 and 1010 can be disposed on opposite sides of bonding interface 103, and the bonding contacts of bonding layer 1008 can be in contact with the bonding contacts of bonding layer 1010 at bonding interface 103. As a result, a large number (e.g., millions) of bonding contacts across bonding interface 103 can make direct, short-distance (e.g., micron-level) electrical connections between adjacent semiconductor structures 102 and 104.

In some implementations, third semiconductor structure 106 on another side of 3D memory device 1600 includes a semiconductor layer 1006 and some of the peripheral circuits of the memory cell array, such that semiconductor layer 1006 is disposed vertically between the peripheral circuits and bonding interface 105. The transistors (e.g., planar transistors 500 and 3D transistors 600) of the peripheral circuits can be in contact with semiconductor layer 1006. Semiconductor layer 1006 can include semiconductor materials, such as single crystalline silicon (e.g., a silicon substrate or a thinned silicon substrate). It is understood that in some examples, different from semiconductor layer 1002 in first semiconductor structure 102, semiconductor layer 1006 on which the transistors are formed may include single crystalline silicon, but not polysilicon, due to the superior carrier mobility of single crystalline silicon that is desirable for transistors' performance. It is understood that different from bonding interface 103 between first and second semiconductor structures 102 and 104, which is between bonding layers 1008 and 1010 and results from hybrid bonding, bonding interface 105 between second and third semiconductor structures 104 and 106 may result from transfer bonding, as described below in detail, and thus, may not be formed between two bonding layers. That is, third semiconductor structure 106 of 3D memory device 1600 in FIG. 16A does not include a bonding layer with bonding contacts, according to some implementations. As a result, instead of bonding contacts, through contacts (e.g., ILVs/TSVs) across bonding interface 105 and through semiconductor layers 1004 and 1006 vertically between second and third semiconductor structures 104 and 106 can make direct, short-distance (e.g., submicron-level) electrical connections between adjacent semiconductor structures 104 and 106.

It is understood that in some examples, second and third semiconductor structures 104 and 106 may also include bonding layers 1012 and 1014, respectively, disposed on opposite sides of bonding interface 105, as shown in FIG. 16B. In FIG. 16B, second semiconductor structure 104 of a 3D memory device 1601 can include two bonding layers 1010 and 1012 on two sides thereof, and bonding layer 1012 can be disposed vertically between semiconductor layer 1004 and bonding interface 105. Third semiconductor structure 106 of 3D memory device 1601 can include bonding layer 1014 disposed vertically between bonding interface 105 and semiconductor layer 1006. Each bonding layer 1012 or 1014 can include conductive bonding contacts (not shown) and dielectrics electrically isolating the bonding contacts. The bonding contacts of bonding layer 1012 can be in contact with the bonding contacts of bonding layer 1014 at bonding interface 105. As a result, bonding contacts across bonding interface 105 in conjunction with through contacts (e.g., ILVs/TSVs) through semiconductor layers 1004 and 1006 can make direct, short-distance (e.g., micron-level) electrical connections between adjacent semiconductor structures 104 and 106.

As shown in FIGS. 16A and 16B, since third and second semiconductor structures 106 and 104 are bonded in a back-to-back manner (e.g., semiconductor layer 1006 being disposed on the bottom side of third semiconductor structure 106, while semiconductor layer 1004 being disposed on the top side of second semiconductor structure 104 in FIGS. 16A and 16B), the transistors in third and second semiconductor structures 106 and 104 are disposed back-to-back, according to some implementations. In some implementations, semiconductor layer 1006 is disposed vertically between the transistors of the peripheral circuits in third semiconductor structure 106 and bonding interface 105, and the transistors of the peripheral circuits in second semiconductor structure 104 are disposed vertically between bonding interface 103 and semiconductor layer 1004. Moreover, since first and second semiconductor structures 102 and 104 are bonded in a face-to-face manner (e.g., semiconductor layer 1002 being disposed on the bottom side of first semiconductor structure 102, while semiconductor layer 1004 being disposed on the top side of second semiconductor structure 104 in FIGS. 16A and 16B), the transistors of peripheral circuits in second semiconductor structure 104 and the memory cell array in first semiconductor structure 102 are disposed face to face, facing each other, according to some implementations. It is understood that pad-out interconnect layer 902 in FIG. 9A or 9B is omitted from 3D memory devices 1600 and 1601 in FIGS. 16A and 16B for ease of illustration and may be included in 3D memory devices 1600 and 1601 as described above with respect to FIGS. 9A and 9B.

As described above, second and third semiconductor structures 104 and 106 can have peripheral circuits having transistors with different applied voltages. For example, third semiconductor structure 106 may be one example of semiconductor structure 408 including LLV circuits 402 (and LV circuits 404 in some examples) in FIG. 4B, and second semiconductor structure 104 may be one example of semiconductor structure 410 including HV circuits 406 (and LV circuits 404 in some examples) in FIG. 4B, or vice versa. Thus, in some implementations, semiconductor layers 1006 and 1004 in third and second semiconductor structures 106 and 104 have different thicknesses to accommodate the transistors with different applied voltages. In one example, second semiconductor structure 104 may include HV circuits 406 and third semiconductor structure 106 may include LLV circuits 402, and the thickness of semiconductor layer 1006 in third semiconductor structure 106 may be smaller than the thickness of semiconductor layer 1004 in second semiconductor structure 104. Moreover, in some implementations, the gate dielectrics of the transistors in third and second semiconductor structures 106 and 104 have different thicknesses as well to accommodate the different applied voltages. In one example, second semiconductor structure 104 may include HV circuits 406 and third semiconductor structure 106 may include LLV circuits 402, and the thickness of the gate dielectrics of the transistors in second semiconductor structure 104 may be larger (e.g., at least 5-fold) than the thickness of the gate dielectrics of the transistors in third semiconductor structure 106.

Figure 17A:
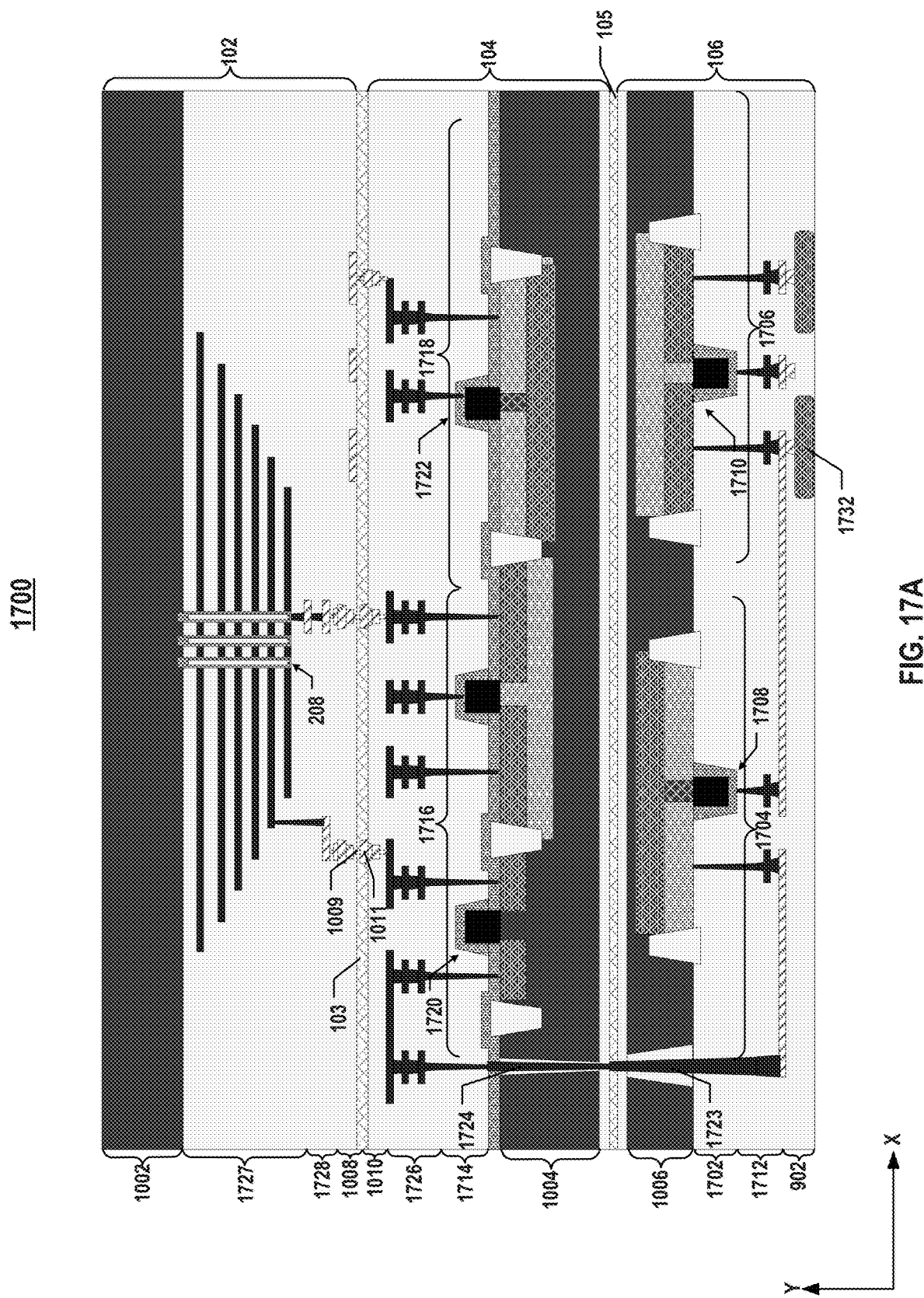
FIGS. 17A-17C illustrate side views of various examples of the 3D memory devices in FIGS. 16A and 16B, according to various aspects of the present disclosure.
Figure 17B:
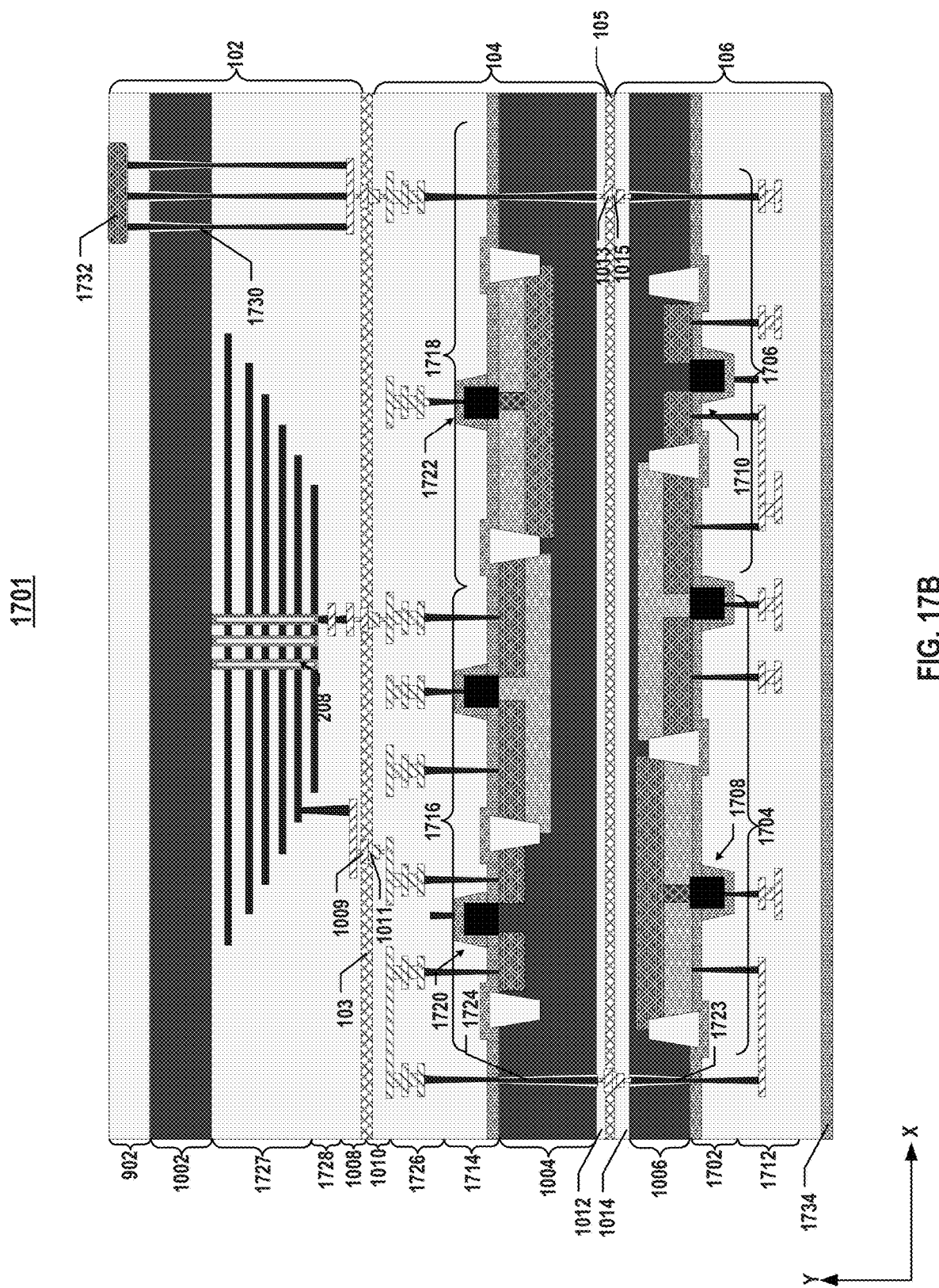
Figure 17C:
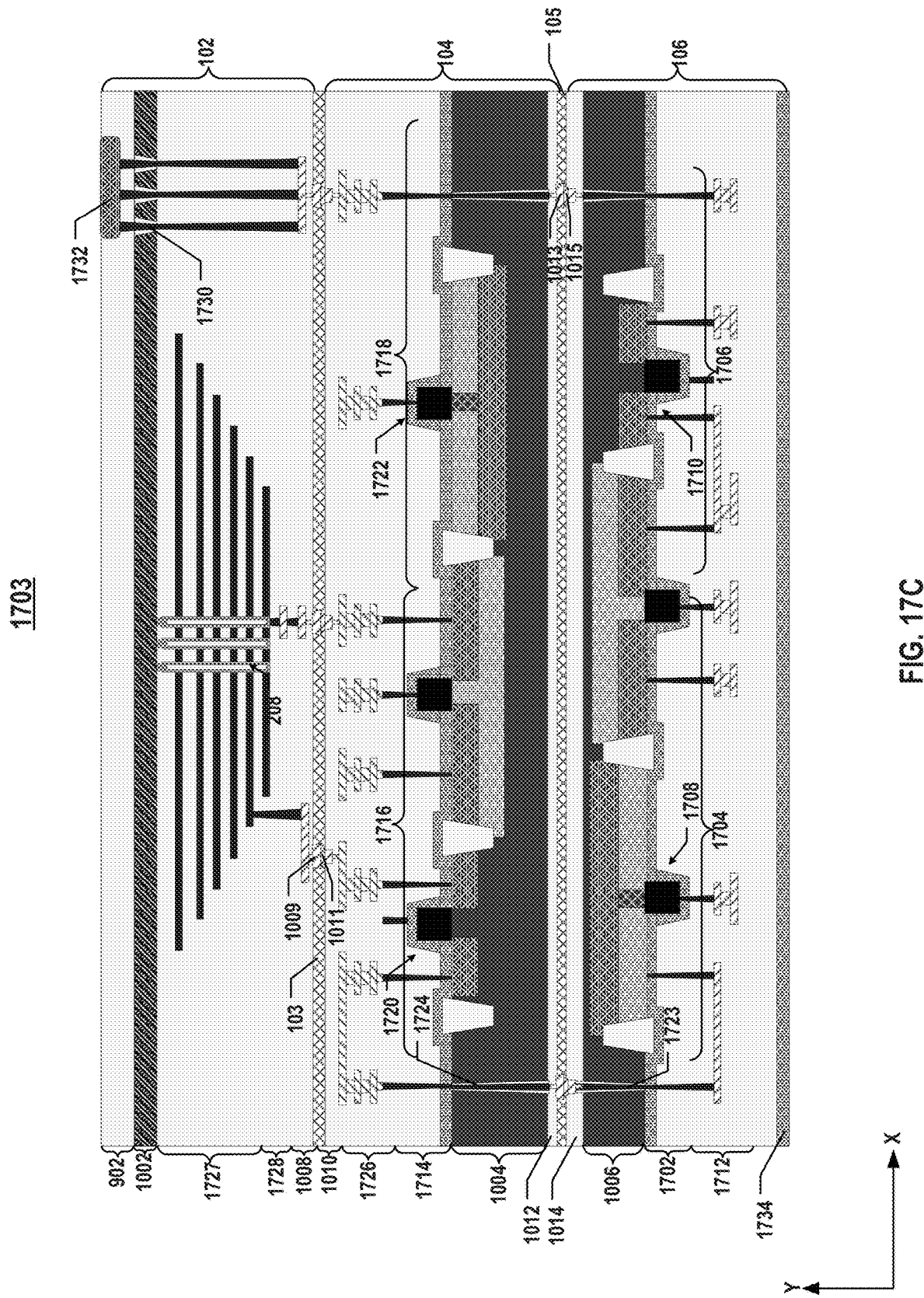

FIGS. 17A-17C illustrate side views of various examples of 3D memory devices 1600 and 1601 in FIGS. 16A and 16B, according to various aspects of the present disclosure. As shown in FIG. 17A, as one example of 3D memory devices 1600 and 1601 in FIGS. 16A and 16B, 3D memory device 1700 is a bonded chip including first semiconductor structure 102, second semiconductor structure 104, and third semiconductor structure 106, which are stacked over one another in different planes in the vertical direction (e.g., the y-direction in FIG. 17A), according to some implementations. First and second semiconductor structures 102 and 104 are bonded at bonding interface 103 therebetween, and second and third semiconductor structures 104 and 106 are bonded at bonding interface 105 therebetween, according to some implementations.

As shown in FIG. 17A, third semiconductor structure 106 can include semiconductor layer 1006 having semiconductor materials. In some implementations, semiconductor layer 1006 is a silicon substrate having single crystalline silicon. In some implementations, semiconductor layer 1006 is a layer of single crystalline silicon transferred from a silicon substrate or an SOI substrate and attached to the backside of second semiconductor structure 104 by transfer bonding. Third semiconductor structure 106 can also include a device layer 1702 above and in contact with semiconductor layer 1006. In some implementations, device layer 1702 includes a first peripheral circuit 1704 and a second peripheral circuit 1706. First peripheral circuit 1704 can include LLV circuits 402, such as I/O circuits (e.g., in interface 316 and data bus 318), and second peripheral circuit 1706 can include LV circuits 404, such as page buffer circuits (e.g., page buffer circuits 702 in page buffer 304) and logic circuits (e.g., in control logic 312). In some implementations, first peripheral circuit 1704 includes a plurality of transistors 1708 in contact with semiconductor layer 1006, and second peripheral circuit 1706 includes a plurality of transistors 1710 in contact with semiconductor layer 1006. Transistors 1708 and 1710 can include any transistors disclosed herein, such as planar transistors 500 and 3D transistors 600. As described above in detail with respect to transistors 500 and 600, in some implementations, each transistor 1708 or 1710 includes a gate dielectric, and the thickness of the gate dielectric of transistor 1708 (e.g., in LLV circuit 402) is smaller than the thickness of the gate dielectric of transistor 1710 (e.g., in LV circuit 404) due to the lower voltage applied to transistor 1708 than transistor 1710. Trench isolations (e.g., STIs) and doped regions (e.g., wells, sources, and drains of transistors 1708 and 1710) can be formed on or in semiconductor layer 1006 as well.

In some implementations, third semiconductor structure 106 further includes an interconnect layer 1712 above device layer 1702 to transfer electrical signals to and from peripheral circuits 1706 and 1704. As shown in FIG. 17A, device layer 1702 (including transistors 1708 and 1710 of peripheral circuits 1704 and 1706) can be disposed vertically between bonding interface 105 and interconnect layer 1712. Interconnect layer 1712 can include a plurality of interconnects. The interconnects in interconnect layer 1712 can be coupled to transistors 1708 and 1710 of peripheral circuits 1704 and 1706 in device layer 1702. Interconnect layer 1712 can further include one or more ILD layers in which the lateral lines and vias can form. That is, interconnect layer 1712 can include lateral lines and vias in multiple ILD layers. In some implementations, the devices in device layer 1702 are coupled to one another through the interconnects in interconnect layer 1712. For example, peripheral circuit 1704 may be coupled to peripheral circuit 1706 through interconnect layer 1712. The interconnects in interconnect layer 1712 can include conductive materials including, but not limited to, W, Co, Cu, Al, silicides, or any combination thereof. The ILD layers in interconnect layer 1712 can include dielectric materials including, but not limited to, silicon oxide, silicon nitride, silicon oxynitride, low-k dielectrics, or any combination thereof.

In some implementations, the interconnects in interconnect layer 1712 include Cu, which has a relatively low resistivity (better electrical performance) among conductive metal materials. As described below with respect to the fabrication process, although Cu has a relatively low thermal budget (incompatible with high-temperature processes), since the fabrication of interconnect layer 1712 can occur after the high-temperature processes in forming device layers 1714 and 1702 in second and third semiconductor structures 104 and 106, as well as being separated from the high-temperature processes in forming first semiconductor structure 102, the interconnects of interconnect layer 1712 having Cu can become feasible.

As shown in FIG. 17A, second semiconductor structure 104 can further include one or more contacts 1723 extending vertically through semiconductor layer 1006. In some implementations, contacts 1723 are coupled to the interconnects in interconnect layer 1712. Contact 1723 can include conductive materials including, but not limited to, W, Co, Cu, Al, silicides, or any combination thereof. In some implementations, contact 1723 includes W. In some implementations, contact 1723 includes a via surrounded by a dielectric spacer (e.g., having silicon oxide) to electrically separate the via from semiconductor layer 1006. Depending on the thickness of semiconductor layer 1006, contact 1723 can be an ILV having a depth in the submicron-level (e.g., between 10 nm and 1 μm), or a TSV having a depth in the micron- or tens micron-level (e.g., between 1 μm and 100 μm).

Second semiconductor structure 104 can be bonded with third semiconductor structure 106 in a back-to-back manner at bonding interface 105. Second semiconductor structure 104 can include semiconductor layer 1004 having semiconductor materials. In some implementations, bonding interface 105 is disposed vertically between interconnect layer 1112 and semiconductor layer 1004 as a result of transfer bonding, which transfers semiconductor layer 1004 from another substrate and bonds semiconductor layer 1004 onto third semiconductor structure 106 as described below in detail. In some implementations, bonding interface 105 is the place at which interconnect layer 1112 and semiconductor layer 1004 are met and bonded. In practice, bonding interface 105 can be a layer with a certain thickness that includes the top surface of interconnect layer 1112 of third semiconductor structure 106 and the bottom surface of semiconductor layer 1004 of second semiconductor structure 104. In some implementations, dielectric layer(s) (e.g., silicon oxide layer) are formed vertically between bonding interface 105 and semiconductor layer 1004 and/or between bonding interface 105 and interconnect layer 1112 to facilitate the transfer bonding of semiconductor layer 1004 onto interconnect layer 1112. Thus, it is understood that bonding interface 105 may include the surfaces of the dielectric layer(s) in some examples.

Second semiconductor structure 104 can include a device layer 1714 below and in contact with semiconductor layer 1004. In some implementations, device layer 1714 includes a third peripheral circuit 1716 and a fourth peripheral circuit 1718. Third peripheral circuit 1716 can include HV circuits 406, such as driving circuits (e.g., string drivers 704 in row decoder/word line driver 308 and drivers in column decoder/bit line driver 306), and fourth peripheral circuit 1718 can include LV circuits 404, such as page buffer circuits (e.g., page buffer circuits 702 in page buffer 304) and logic circuits (e.g., in control logic 312). In some implementations, third peripheral circuit 1716 includes a plurality of transistors 1720, and fourth peripheral circuit 1718 includes a plurality of transistors 1722 as well. Transistors 1720 and 1722 can include any transistors disclosed herein, such as planar transistors 500 and 3D transistors 600. As described above in detail with respect to transistors 500 and 600, in some implementations, each transistor 1720 or 1722 includes a gate dielectric, and the thickness of the gate dielectric of transistor 1720 (e.g., in HV circuit 406) is larger than the thickness of the gate dielectric of transistor 1722 (e.g., in LV circuit 404) due to the higher voltage applied to transistor 1720 than transistor 1722. Trench isolations (e.g., STIs) and doped regions (e.g., wells, sources, and drains of transistors 1720 and 1722) can be formed on or in semiconductor layer 1004 as well.

Moreover, the different voltages applied to different transistors 1720, 1722, 1708, and 1710 in second and third semiconductor structures 104 and 106 can lead to differences of device dimensions between second and third semiconductor structures 104 and 106. In some implementations, the thickness of the gate dielectric of transistor 1720 (e.g., in HV circuit 406) is larger than the thickness of the gate dielectric of transistor 1708 (e.g., in LLV circuit 402) due to the higher voltage applied to transistor 1720 than transistor 1708. In some implementations, the thickness of the gate dielectric of transistor 1722 (e.g., in LV circuit 404) is the same as the thickness of the gate dielectric of transistor 1710 (e.g., in LV circuit 404) due to the same voltage applied to transistor 1722 and transistor 1710. In some implementations, the thickness of semiconductor layer 1006 in which transistor 1708 (e.g., in LLV circuit 402) is formed is smaller than the thickness of semiconductor layer 1004 in which transistor 1720 (e.g., in HV circuit 406) is formed due to the lower voltage applied to transistor 1708 than transistor 1720.

As shown in FIG. 17A, second semiconductor structure 104 can further include an interconnect layer 1726 below device layer 1714 to transfer electrical signals to and from peripheral circuits 1716 and 1718. As shown in FIG. 17A, interconnect layer 1726 can be vertically between bonding interface 103 and device layer 1714 (including transistors 1720 and 1722 of peripheral circuits 1716 and 1718). Interconnect layer 1726 can include a plurality of interconnects coupled to transistors 1720 and 1722 of peripheral circuits 1716 and 1718 in device layer 1714. Interconnect layer 1726 can further include one or more ILD layers in which the interconnects can form. That is, interconnect layer 1126 can include lateral lines and vias in multiple ILD layers. In some implementations, the devices in device layer 1714 are coupled to one another through the interconnects in interconnect layer 1726. For example, peripheral circuit 1716 may be coupled to peripheral circuit 1718 through interconnect layer 1726. The interconnects in interconnect layer 1726 can include conductive materials including, but not limited to, W, Co, Cu, Al, silicides, or any combination thereof. The ILD layers in interconnect layer 1726 can include dielectric materials including, but not limited to, silicon oxide, silicon nitride, silicon oxynitride, low-k dielectrics, or any combination thereof. In some implementations, the interconnects in interconnect layer 1726 include W, which has a relatively high thermal budget (compatible with high-temperature processes) and good quality (fewer detects, e.g., voids) among conductive metal materials.

As shown in FIG. 17A, second semiconductor structure 104 can further include one or more contacts 1724 extending vertically through semiconductor layer 1004. In some implementations, contacts 1724 are coupled to the interconnects in interconnect layer 1726. In some implementations, contact 1724 is in contact with contact 1723, such that contacts 1723 and 1724 couple the interconnects in interconnect layer 1726 to the interconnects in interconnect layer 1712 to make an electrical connection across bonding interface 105 between second and third semiconductor structures 104 and 106 and through semiconductor layers 1004 and 1006. Contact 1724 can include conductive materials including, but not limited to, W, Co, Cu, Al, silicides, or any combination thereof. In some implementations, contact 1724 includes W. In some implementations, contact 1724 includes a via surrounded by a dielectric spacer (e.g., having silicon oxide) to electrically separate the via from semiconductor layer 1004. Depending on the thickness of semiconductor layer 1004, contact 1724 can be an ILV having a depth in the submicron-level (e.g., between 10 nm and 1 μm), or a TSV having a depth in the micron- or tens micron-level (e.g., between 1 μm and 100 μm).

As shown in FIG. 17A, second semiconductor structure 104 can further include a bonding layer 1010 at bonding interface 103 and above and in contact with interconnect layer 1726. Bonding layer 1010 can include a plurality of bonding contacts 1011 and dielectrics electrically isolating bonding contacts 1011. Bonding contacts 1011 can include conductive materials including, but not limited to, W, Co, Cu, Al, silicides, or any combination thereof. In some implementations, bonding contacts 1011 of bonding layer 1010 include Cu. The remaining area of bonding layer 1010 can be formed with dielectrics including, but not limited to, silicon oxide, silicon nitride, silicon oxynitride, low-k dielectrics, or any combination thereof. Bonding contacts 1011 and surrounding dielectrics in bonding layer 1010 can be used for hybrid bonding (also known as "metal/dielectric hybrid bonding"), which is a direct bonding technology (e.g., forming bonding between surfaces without using intermediate layers, such as solder or adhesives) and can obtain metal-metal (e.g., Cu-to-Cu) bonding and dielectric-dielectric (e.g., $SiO_2$-to-$SiO_2$) bonding simultaneously.

As shown in FIG. 17A, first semiconductor structure 102 can further include a bonding layer 1008 at bonding interface 103, e.g., on the opposite side of bonding interface 103 with respect to bonding layer 1010 in second semiconductor structure 104. Bonding layer 1008 can include a plurality of bonding contacts 1009 and dielectrics electrically isolating bonding contacts 1009. Bonding contacts 1009 can include conductive materials, such as Cu. The remaining area of bonding layer 1008 can be formed with dielectric materials, such as silicon oxide. Bonding contacts 1009 and surrounding dielectrics in bonding layer 1008 can be used for hybrid bonding. In some implementations, bonding interface 103 is the place at which bonding layers 1008 and 1010 are met and bonded. In practice, bonding interface 103 can be a layer with a certain thickness that includes the top surface of bonding layer 1010 of second semiconductor structure 104 and the bottom surface of bonding layer 1008 of first semiconductor structure 102.

As shown in FIG. 17A, first semiconductor structure 102 can further include an interconnect layer 1728 below and in contact with bonding layer 1008 to transfer electrical signals. Interconnect layer 1728 can include a plurality of interconnects, such as MEOL interconnects and BEOL interconnects. In some implementations, the interconnects in interconnect layer 1728 also include local interconnects, such as bit line contacts and word line contacts. Interconnect layer 1728 can further include one or more ILD layers in which the lateral lines and vias can form. The interconnects in interconnect layer 1728 can include conductive materials including, but not limited to, W, Co, Cu, Al, silicides, or any combination thereof. The ILD layers in interconnect layer 1728 can include dielectric materials including, but not limited to, silicon oxide, silicon nitride, silicon oxynitride, low-k dielectrics, or any combination thereof.

As shown in FIG. 17A, first semiconductor structure 102 can include a memory cell array, such as an array of NAND memory strings 208 below and in contact with interconnect layer 1728. In some implementations, interconnect layer 1728 is vertically between NAND memory strings 208 and bonding interface 103. Each NAND memory string 208 extends vertically through a plurality of pairs each including a conductive layer and a dielectric layer, according to some implementations. The stacked and interleaved conductive layers and dielectric layers are also referred to herein as a stack structure, e.g., a memory stack 1727. Memory stack 1727 may be an example of memory stack 804 in FIGS. 8A-8C, and the conductive layer and dielectric layer in memory stack 1727 may be examples of gate conductive layers 806 and dielectric layer 808, respectively, in memory stack 804. The interleaved conductive layers and dielectric layers in memory stack 1727 alternate in the vertical direction, according to some implementations. Each conductive layer can include a gate electrode (gate line) surrounded by an adhesive layer and a gate dielectric layer. The gate electrode of the conductive layer can extend laterally as a word line, ending at one or more staircase structures of memory stack 1727.

In some implementations, each NAND memory string 208 is a "charge trap" type of NAND memory string including any suitable channel structures disclosed herein, such as bottom plug channel structure 812A, sidewall plug channel structure 812B, or bottom open channel structure 812C, described above in detail with respect to FIGS. 8A-8C. It is understood that NAND memory strings 208 are not limited to the "charge trap" type of NAND memory strings and may be "floating gate" type of NAND memory strings in other examples.

As shown in FIG. 17A, first semiconductor structure 102 can further include semiconductor layer 1002 disposed below memory stack 1727 and in contact with the sources of NAND memory strings 208. In some implementations, NAND memory strings 208 are disposed vertically between bonding interface 103 and semiconductor layer 1002. Semiconductor layer 1002 can include semiconductor materials. In some implementations, semiconductor layer 1002 is a thinned silicon substrate having single crystalline silicon on which memory stack 1727 and NAND memory strings 208 (e.g., including bottom plug channel structure 812A or sidewall plug channel structure 812B) are formed. It is understood that in some examples, trench isolations and doped regions (not shown) may be formed in semiconductor layer 1002 as well.

As shown in FIG. 17A, third semiconductor structure 106 can further include a pad-out interconnect layer 902 above and in contact with interconnect layer 1712. In some implementations, device layer 1702 having transistors 1708 and 1710 is disposed vertically between pad-out interconnect layer 902 and semiconductor layer 1006. Pad-out interconnect layer 902 can include interconnects, e.g., contact pads 1732, in one or more ILD layers. Pad-out interconnect layer 902 and interconnect layer 1712 can be formed on the same side of semiconductor layer 1006. In some implementations, the interconnects in pad-out interconnect layer 902 can transfer electrical signals between 3D memory device 1700 and external devices, e.g., for pad-out purposes.

As a result, peripheral circuits 1704, 1706, 1716, and 1718 in third and second semiconductor structures 106 and 104 can be coupled to NAND memory strings 208 in first semiconductor structure 102 through various interconnection structures, including interconnect layers 1712, 1726, and 1728, bonding layers 1008 and 1010, as well as contacts 1723 and 1724. Moreover, peripheral circuits 1704, 1706, 1716, and 1718 and NAND memory strings 208 in 3D memory device 1700 can be further coupled to external devices through pad-out interconnect layer 902.

It is understood that in some examples, similar to bonding interface 103, bonding interface 105 may result from hybrid bonding and thus, be disposed vertically between two bonding layers each including bonding contacts in second and third semiconductor structures 104 and 106, respectively. For example, as shown in FIG. 17B, a 3D memory device 1701 may include bonding layers 1012 and 1014 in second and third semiconductor structures 104 and 106, respectively, at bonding interface 105, i.e., on opposite sides of bonding interface 105. Bonding layer 1012 or 1014 can include a plurality of bonding contacts 1013 or 1015 and dielectrics electrically isolating bonding contacts 1013 or 1015. Bonding contacts 1013 and 1015 can include conductive materials, such as Cu. The remaining area of bonding layer 1012 or 1014 can be formed with dielectric materials, such as silicon oxide. Bonding contacts 1013 or 1015 and surrounding dielectrics in bonding layer 1012 or 1014 can be used for hybrid bonding. In some implementations, bonding interface 105 is the place at which bonding layers 1012 and 1014 are met and bonded. In practice, bonding interface 105 can be a layer with a certain thickness that includes the top surface of bonding layer 1014 of third semiconductor structure 106 and the bottom surface of bonding layer 1012 of second semiconductor structure 104. Contact 1723 can be coupled to contact 1724 through bonding contacts 1013 and 1015 of bonding layers 1012 and 1014 across bonding interface 105.

It is also understood that the pad-out of 3D memory devices is not limited to from third semiconductor structure 106 having transistors 1708 and 1710 as shown in FIG. 17A (corresponding to FIG. 9A) and may be from first semiconductor structure 102 having NAND memory strings 208 (corresponding to FIG. 9B). For example, as shown in FIG. 17B, 3D memory device 1701 may include pad-out interconnect layer 902 in first semiconductor structure 102. Pad-out interconnect layer 902 can be in contact with semiconductor layer 1002 of first semiconductor structure 102 on which NAND memory strings 208 are formed. In some implementations, first semiconductor structure 102 further includes one or more contacts 1730 extending vertically through semiconductor layer 1002. In some implementations, contact 1730 couples the interconnects in interconnect layer 1728 in first semiconductor structure 102 to contact pads 1732 in pad-out interconnect layer 902 to make an electrical connection through semiconductor layer 1002. Contact 1730 can include conductive materials including, but not limited to, W, Co, Cu, Al, silicides, or any combination thereof. In some implementations, contact 1730 includes W. In some implementations, contact 1730 includes a via surrounded by a dielectric spacer (e.g., having silicon oxide) to electrically separate the via from semiconductor layer 1002. Depending on the thickness of semiconductor layer 1002, contact 1730 can be an ILV having a depth in the submicron-level (e.g., between 10 nm and 1 μm), or a TSV having a depth in the micron- or tens micron-level (e.g., between 1 μm and 100 μm). In some implementations, in FIG. 17B, third semiconductor structure 106 of 3D memory device 1701 further includes a passivation layer 1734, replacing pad-out interconnect layer 902 in FIG. 17B. Passivation layer 1734 can include dielectric materials, such as silicon nitride and/or silicon oxide. It is understood that the details of the same components (e.g., materials, fabrication process, functions, etc.) in both 3D memory devices 1700 and 1701 are not repeated for ease of description.

It is further understood that the material of semiconductor layer 1002 in first semiconductor structure 102 is not limited to single crystalline silicon as described above with respect to FIGS. 17A and 17B and may be any other suitable semiconductor materials. For example, as shown in FIG. 17C, a 3D memory device 1703 may include semiconductor layer 1002 having polysilicon in first semiconductor structure 102. NAND memory strings 208 of 3D memory device 1703 in contact with semiconductor layer 1002 having polysilicon can include any suitable channel structures disclosed herein that are in contact with a polysilicon layer, such as bottom open channel structure 812C. In some implementations, NAND memory strings 208 of 3D memory device 1703 are "floating gate" type of NAND memory strings, and semiconductor layer 1002 having polysilicon is in contact with the "floating gate" type of NAND memory strings as the source plate thereof. It is understood that the details of the same components (e.g., materials, fabrication process, functions, etc.) in both 3D memory devices 1700 and 1703 are not repeated for ease of description.

Figure 20:
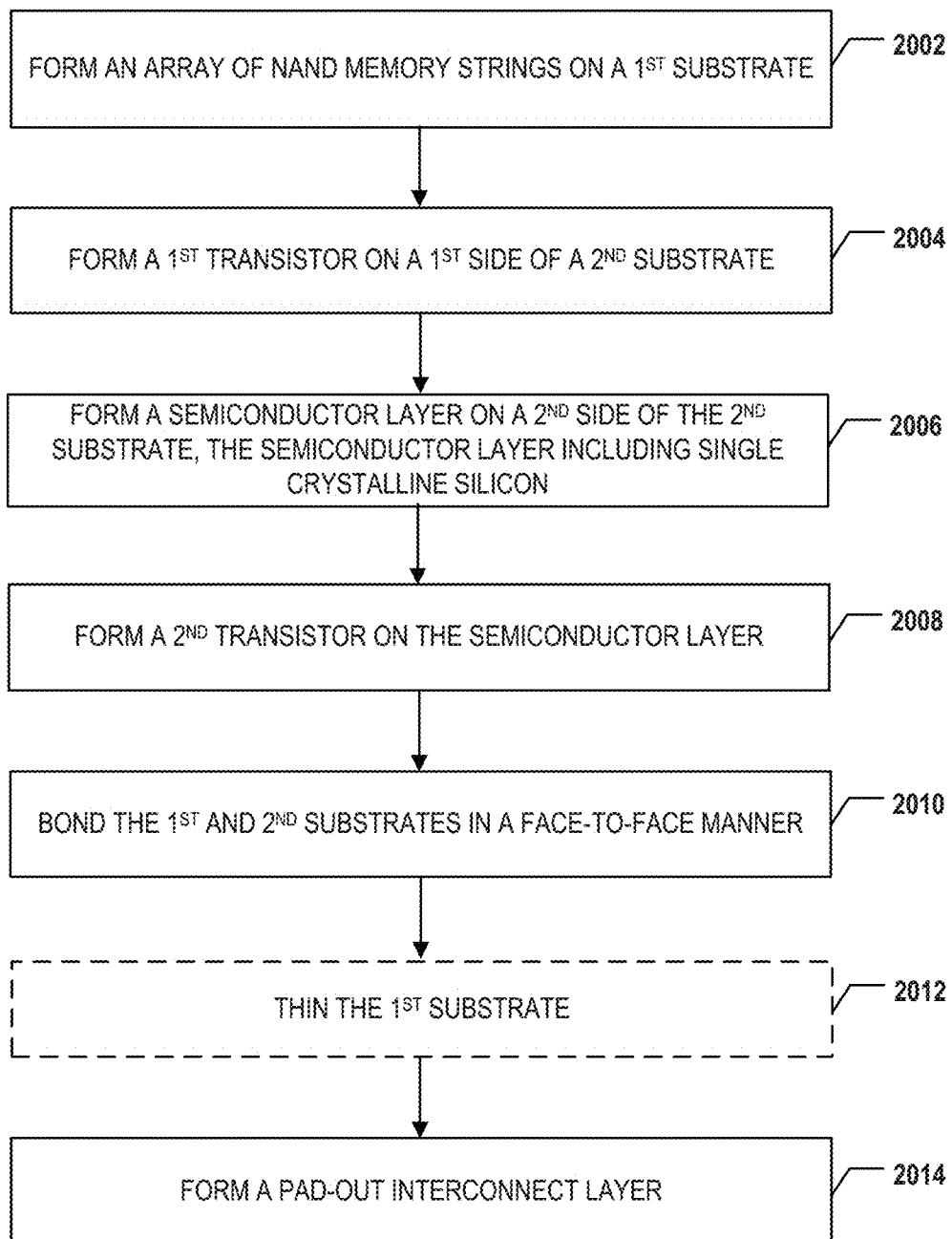
FIG. 20 illustrates a flowchart of a method for forming the 3D memory devices in FIGS. 16A and 16B, according to some aspects of the present disclosure.

FIGS. 18A-18F illustrate a fabrication process for forming the 3D memory devices in FIGS. 16A and 16B, according to some aspects of the present disclosure. FIG. 20 illustrates a flowchart of a method 2000 for forming the 3D memory devices in FIGS. 16A and 16B, according to some aspects of the present disclosure. Examples of the 3D memory devices depicted in FIGS. 18A-18F and 20 include 3D memory devices 1700, 1701, and 1703 depicted in FIGS. 17A-17C. FIGS. 18A-18F and 20 will be described together. It is understood that the operations shown in method 2000 are not exhaustive and that other operations can be performed as well before, after, or between any of the illustrated operations. Further, some of the operations may be performed simultaneously, or in a different order than shown in FIG. 20. In one example, operation 2002 may be performed after operation 2008 or in parallel with operations 2004-

2008. In another example, operation 2010 may be performed before operations 2006 and 2008.

Referring to FIG. 20, method 2000 starts at operation 2002, in which an array of NAND memory strings is formed on a first substrate. The first substrate can be a silicon substrate having single crystalline silicon. In some implementations, to form the array of NAND memory strings, a memory stack is formed on the first substrate.

Figure 18A:
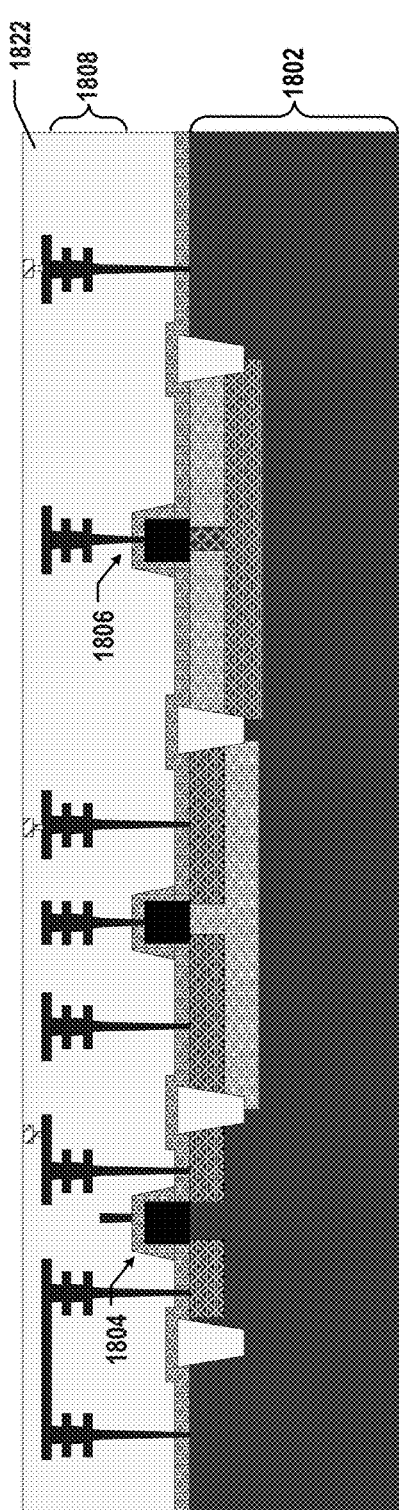
FIGS. 18A-18F illustrate a fabrication process for forming the 3D memory devices in FIGS. 16A and 16B, according to some aspects of the present disclosure.
Figure 18A:
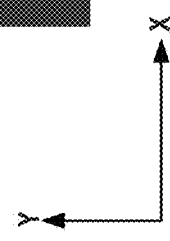
Figure 18B:
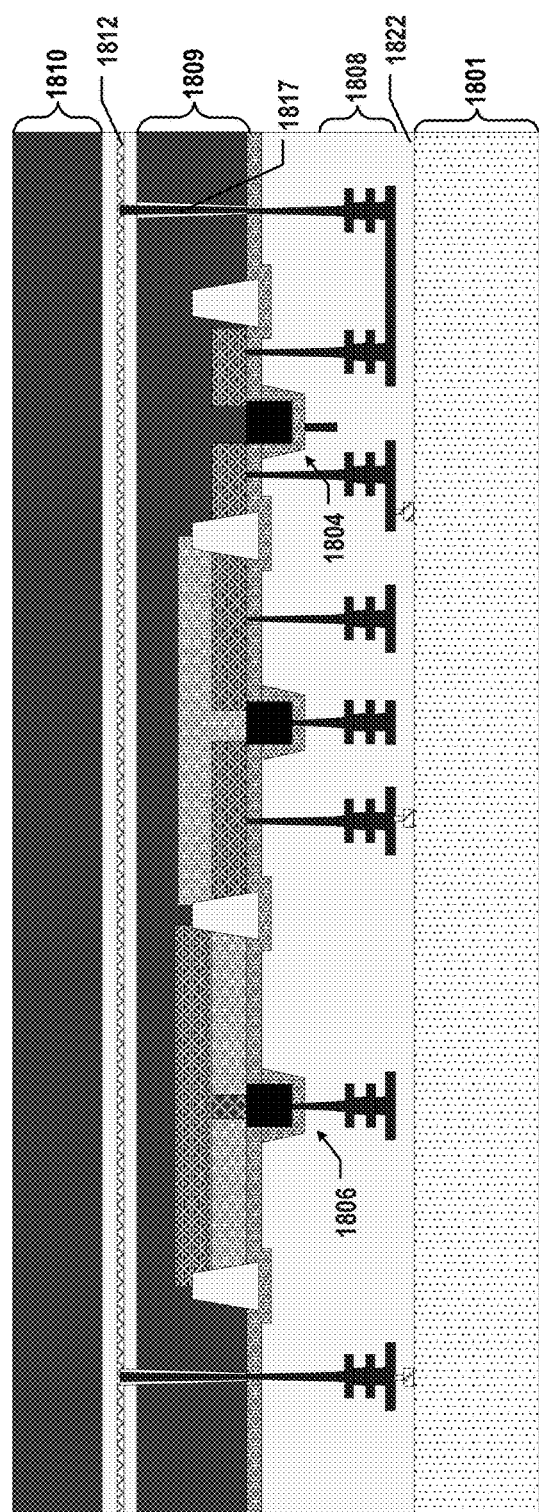
Figure 18B:
Figure 18C:
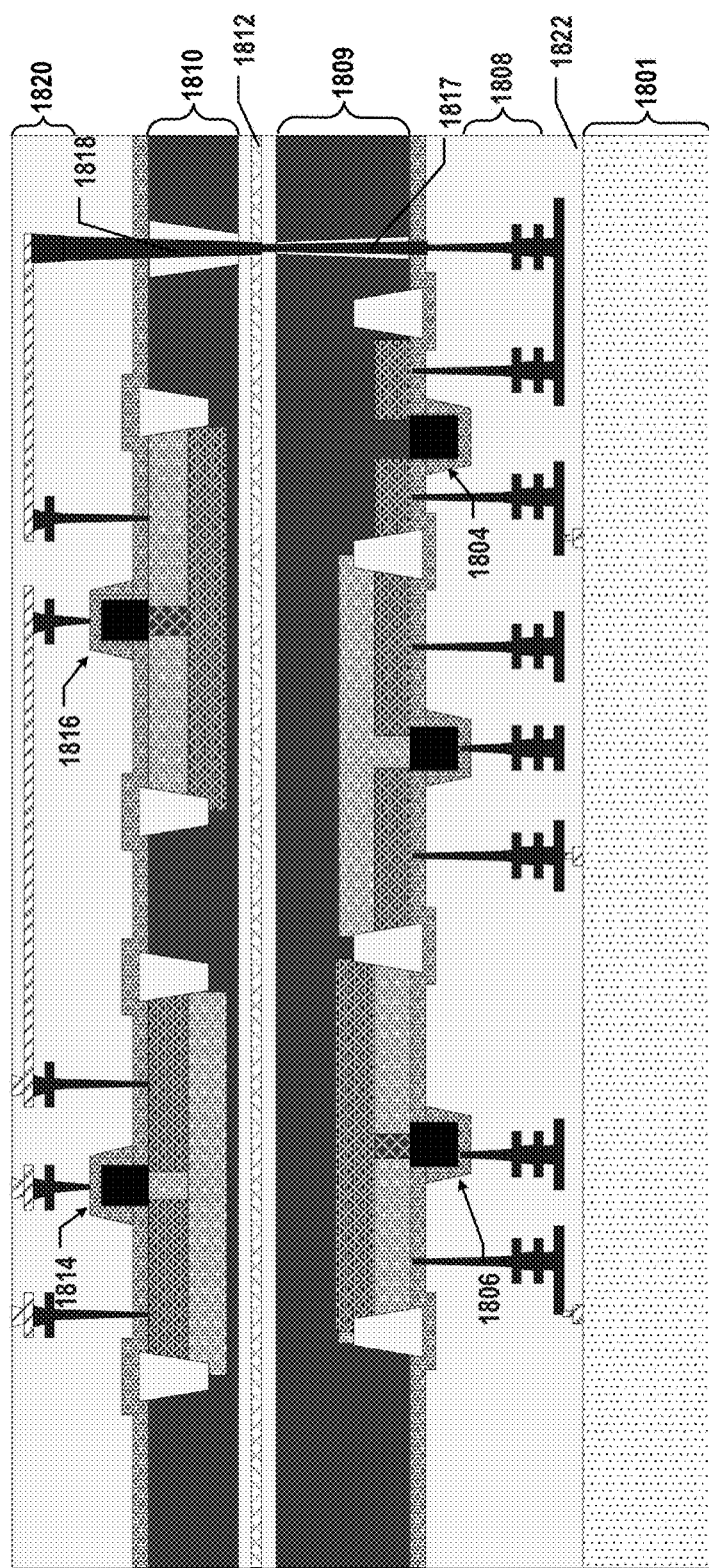
Figure 18D:
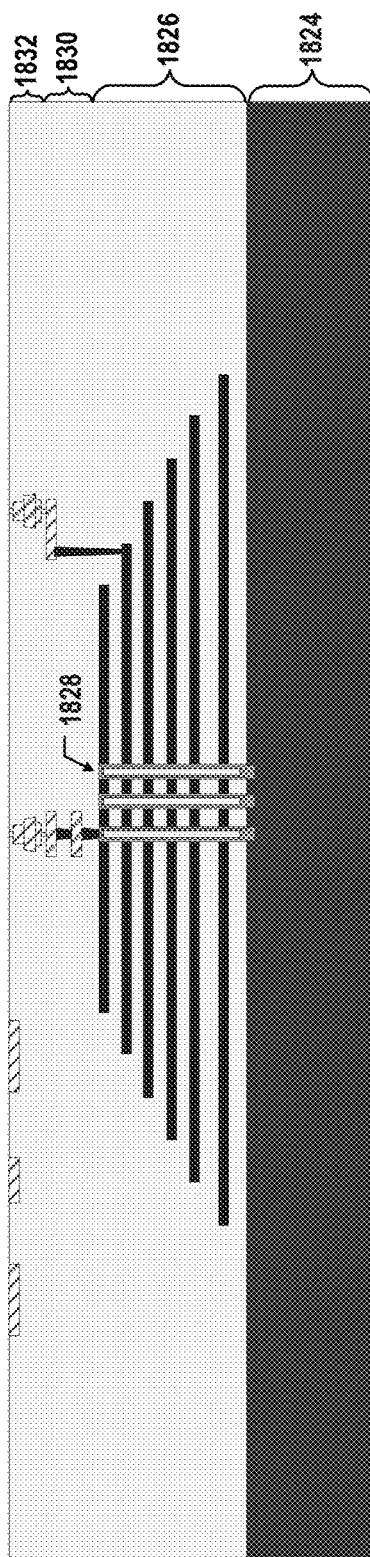

As illustrated in FIG. 18D, a stack structure, such as a memory stack 1826 including interleaved conductive layers and dielectric layers, is formed on a silicon substrate 1824. To form memory stack 1826, in some implementations, a dielectric stack (not shown) including interleaved sacrificial layers (not shown) and the dielectric layers is formed on silicon substrate 1824. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. Memory stack 1826 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that memory stack 1826 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between memory stack 1826 and silicon substrate 1824.

As illustrated in FIG. 18D, NAND memory strings 1828 are formed above silicon substrate 1824, each of which extends vertically through memory stack 1826 to be in contact with silicon substrate 1824. In some implementations, fabrication processes to form NAND memory string 1828 include forming a channel hole through memory stack 1826 (or the dielectric stack) and into silicon substrate 1824 using dry etching/and or wet etching, such as DRIE, followed by subsequently filling the channel hole with a plurality of layers, such as a memory film (e.g., a tunneling layer, a storage layer, and a blocking layer) and a semiconductor layer, using thin film deposition processes such as ALD, CVD, PVD, or any combination thereof. It is understood that the details of fabricating NAND memory strings 1828 may vary depending on the types of channel structures of NAND memory strings 1828 (e.g., bottom plug channel structure 812A, sidewall plug channel structure 812B, or bottom open channel structure 812C in FIGS. 8A-8C) and thus, are not elaborated for ease of description.

In some implementations, an interconnect layer is formed above the array of NAND memory strings on the first substrate. The interconnect layer can include a first plurality of interconnects in one or more ILD layers. As illustrated in FIG. 18D, an interconnect layer 1830 is formed above memory stack 1826 and NAND memory strings 1828. Interconnect layer 1830 can include interconnects of MEOL and/or BEOL in a plurality of ILD layers to make electrical connections with NAND memory strings 1828. In some implementations, interconnect layer 1830 includes multiple ILD layers and interconnects therein formed in multiple processes. For example, the interconnects in interconnect layer 1830 can include conductive materials deposited by one or more thin film deposition processes including, but not limited to, CVD, PVD, ALD, electroplating, electroless plating, or any combination thereof. Fabrication processes to form interconnects can also include photolithography, chemical mechanical polishing (CMP), wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 18D can be collectively referred to as interconnect layer 1830.

In some implementations, a first bonding layer is formed above interconnect layer. The first bonding layer can include a plurality of first bonding contacts. As illustrated in FIG. 18D, a bonding layer 1832 is formed above interconnect layer 1830. Bonding layer 1832 can include a plurality of bonding contacts surrounded by dielectrics. In some implementations, a dielectric layer is deposited on the top surface of interconnect layer 1830 by one or more thin film deposition processes including, but not limited to, CVD, PVD, ALD, or any combination thereof. The bonding contacts can then be formed through the dielectric layer and in contact with the interconnects in interconnect layer 1830 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

Method 2000 proceeds to operation 2004, as illustrated in FIG. 20, in which a first transistor is formed on a first side (e.g., a first surface) of a second substrate. The second substrate can be a silicon substrate having single crystalline silicon. The first side can be the front side on which devices are formed on the second substrate.

As illustrated in FIG. 18A, a plurality of transistors 1804 and 1806 are formed on the front side of a silicon substrate 1802. Transistors 1804 and 1806 can be formed by a plurality of processes including, but not limited to, photolithography, dry/wet etch, thin film deposition, thermal growth, implantation, CMP, and any other suitable processes. In some implementations, doped regions are formed in silicon substrate 1802 by ion implantation and/or thermal diffusion, which function, for example, as wells and source/drain regions of transistors 1804 and 1806. In some implementations, isolation regions (e.g., STIs) are also formed in silicon substrate 1802 by wet/dry etch and thin film deposition. In some implementations, the thickness of gate dielectric of transistor 1804 is different from the thickness of gate dielectric of transistor 1806, for example, by depositing a thicker silicon oxide film in the region of transistor 1804 than the region of transistor 1806, or by etching back part of the silicon oxide film deposited in the region of transistor 1806. It is understood that the details of fabricating transistors 1804 and 1806 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer 1808 is formed above the transistor on the second substrate. The interconnect layer can include a plurality of interconnects in one or more ILD layers. As illustrated in FIG. 18A, an interconnect layer 1808 can be formed above transistors 1804 and 1806. Interconnect layer 1808 can include interconnects of MEOL and/or BEOL in a plurality of ILD layers to make electrical connections with transistors 1804 and 1806. In some implementations, interconnect layer 1808 includes multiple ILD layers and interconnects therein formed in multiple processes. For example, the interconnects in interconnect layer 1808 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 18A can be collectively referred to as interconnect layer 1808. In some implementations, the interconnects in interconnect layer 1808 include W, which has a relatively high thermal budget among conductive metal materials to sustain later high-temperature processes.

In some implementations, a second bonding layer is formed above the interconnect layer. The second bonding layer can include a plurality of second bonding contacts. As illustrated in FIG. 18A, a bonding layer 1822 is formed above interconnect layer 1808. Bonding layer 1822 can include a plurality of bonding contacts surrounded by dielectrics. In some implementations, a dielectric layer is deposited on the top surface of interconnect layer 1808 by one or more thin film deposition processes including, but not limited to, CVD, PVD, ALD, or any combination thereof. The bonding contacts can then be formed through the dielectric layer and in contact with the interconnects in interconnect layer 1808 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

Method 2000 proceeds to operation 2006, as illustrated in FIG. 20, in which a semiconductor layer is formed on a second side (e.g., a second surface) of the second substrate opposite to the first side. The semiconductor layer can include single crystalline silicon. The second side can be the backside of the second substrate. In some implementations, to form the semiconductor layer, another substrate and the second substrate are bonded in a face-to-back manner, and the other substrate is thinned to leave the semiconductor layer. The bonding can include transfer bonding. The other substrate can be a silicon substrate having single crystalline silicon.

In some implementations, the second substrate is thinned prior to forming the semiconductor layer, such that the semiconductor layer is formed on the second side of the thinned second substrate. As illustrated in FIG. 18B, silicon substrate 1802 (shown in FIG. 18A) is thinned to become a semiconductor layer 1809 having single crystalline silicon. Silicon substrate 1802 can be thinned by processes including, but not limited to, wafer grinding, dry etch, wet etch, CMP, any other suitable processes, or any combination thereof. In some implementations, as shown in FIG. 18BD, a handle substrate 1801 (a.k.a., carrier wafer) is attached to bonding layer 1822, for example, using adhesive bonding, prior to the thinning to allow the subsequent backside processes on silicon substrate 1802, such as thinning, contact formation, and bonding.

In some implementations, a first contact through the thinned second substrate is formed. As illustrated in FIG. 18B, one or more contacts 1817 each extending vertically through semiconductor layer 1809 (i.e., the thinned silicon substrate 1802) are formed. Contacts 1817 can be coupled to the interconnects in interconnect layer 1808. Contacts 1817 can be formed by first patterning contact holes through semiconductor layer 1809 using patterning process (e.g., photolithography and dry/wet etch of dielectric materials in the dielectric layer). The contact holes can be filled with a conductor (e.g., W or Cu). In some implementations, filling the contact holes includes depositing a spacer (e.g., a silicon oxide layer) before depositing the conductor. It is understood that in some examples, contacts 1817 may be formed in silicon substrate 1802 before thinning (the formation of semiconductor layer 1809, e.g., in FIG. 18A) and be exposed from the backside of silicon substrate 1802 (where the thinning occurs) after the thinning.

As illustrated in FIG. 18B, a semiconductor layer 1810, such as a single crystalline silicon layer, is formed on the backside (the side where the thinning occurs) of semiconductor layer 1809 (i.e., the thinned silicon substrate 1802). Semiconductor layer 1810 can be attached to the backside of semiconductor layer 1810 to form a bonding interface 1812 vertically between semiconductor layer 1810 and semiconductor layer 1809. In some implementations, to form semiconductor layer 1810, another silicon substrate (not shown in FIG. 18B) and semiconductor layer 1809 (i.e., the thinned silicon substrate 1802) are bonded in a face-to-back manner (flipping thinned silicon substrate 1802 upside down and having the components formed on silicon substrate 1802, such as transistors 1804 and 1806, facing away from the other silicon substrate) using transfer bonding, thereby forming bonding interface 1812. The other silicon substrate can then be thinned using any suitable processes to leave semiconductor layer 1810 attached to the backside of semiconductor layer 1809 (i.e., the thinned silicon substrate 1802). The details of various transfer bonding processes are described above with respect to FIGS. 48A-48D and FIGS. 49A-49D and thus, are not repeated for ease of description.

Referring to FIG. 20, method 2000 proceeds to operation 2008, in which a second transistor is formed on the semiconductor layer. As illustrated in FIG. 18C, a plurality of transistors 1814 and 1816 are formed on semiconductor layer 1810 having single crystalline silicon. Transistors 1814 and 1816 can be formed by a plurality of processes including, but not limited to, photolithography, dry/wet etch, thin film deposition, thermal growth, implantation, CMP, and any other suitable processes. In some implementations, doped regions are formed in semiconductor layer 1810 by ion implantation and/or thermal diffusion, which function, for example, as wells and source/drain regions of transistors 1814 and 1816. In some implementations, isolation regions (e.g., STIs) are also formed in semiconductor layer 1810 by wet/dry etch and thin film deposition. In some implementations, the thickness of gate dielectric of transistor 1814 is different from the thickness of gate dielectric of transistor 1816, for example, by depositing a thicker silicon oxide film in the region of transistor 1814 than the region of transistor 1816, or by etching back part of the silicon oxide film deposited in the region of transistor 1816. It is understood that the details of fabricating transistors 1814 and 1816 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer 1820 is formed above the transistor on the semiconductor layer. The interconnect layer can include a plurality of interconnects in one or more ILD layers. As illustrated in FIG. 18C, an interconnect layer 1820 can be formed above transistors 1814 and 1816. Interconnect layer 1820 can include interconnects of MEOL and/or BEOL in a plurality of ILD layers to make electrical connections with transistors 1814 and 1816. In some implementations, interconnect layer 1820 includes multiple ILD layers and interconnects therein formed in multiple processes. For example, the interconnects in interconnect layer 1820 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 18C can be collectively referred to as interconnect layer 1820. Different from interconnect layer 1808, in some implementations, the interconnects in interconnect layer 1820 include Cu, which has a relatively low resistivity among conductive metal materials. It is understood that although Cu has a relatively low thermal budget (incompatible with high-temperature processes), using Cu as the conductive materials of the interconnects in interconnect layer 1820 may become feasible since there is no more high temperature processes after the fabrication of interconnect layer 1820.

In some implementations, a second contact through the semiconductor layer and coupled to the first contact is formed. As illustrated in FIG. 18C, one or more contacts 1818 each extending vertically through semiconductor layer 1810 are formed. Contact 1818 can be aligned to be in contact with contact 1817 at bonding interface 1812. Contacts 1818 and 1817 can couple the interconnects in interconnect layers 1820 and 1808 across bonding interface 1812 and through semiconductor layers 1810 and 1809. Contacts 1818 can be formed by first patterning contact holes through semiconductor layer 1810 and aligned with contacts 1817 at bonding interface 1812 using patterning process (e.g., photolithography and dry/wet etch of dielectric materials in the dielectric layer). The contact holes can be filled with a conductor (e.g., W or Cu). In some implementations, filling the contact holes includes depositing a spacer (e.g., a silicon oxide layer) before depositing the conductor.

Method 2000 proceeds to operation 2010, as illustrated in FIG. 20, in which the first substrate and the second substrate are bonded in a face-to-face manner. The first bonding contact in the first bonding layer can be in contact with the second bonding contact in the second bonding layer at a bonding interface after bonding the first and second substrates. The bonding can include hybrid bonding.

Figure 18E:
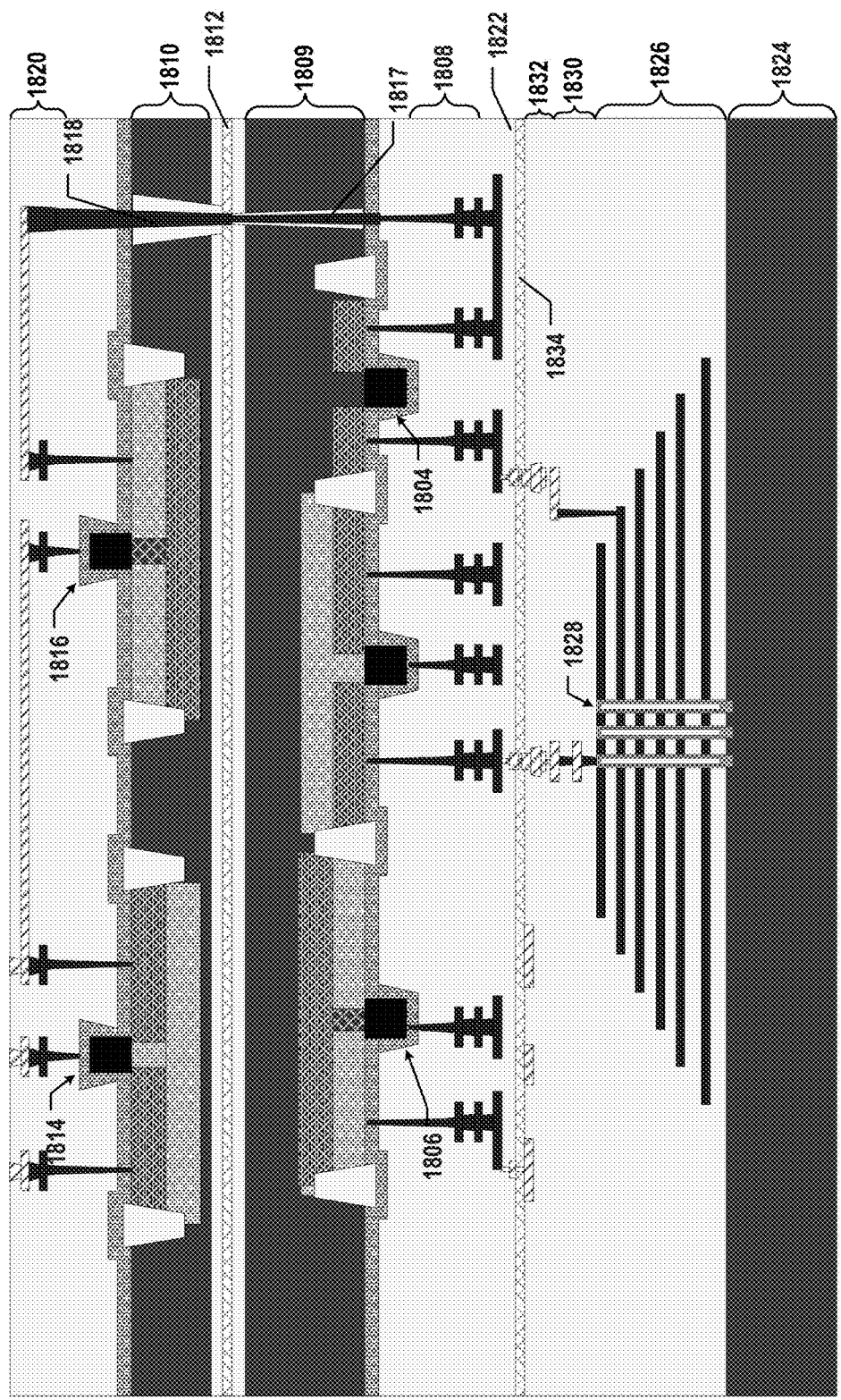

As illustrated in FIG. 18E, after removing handle substrate 1801 (e.g., shown in FIG. 18C) to expose bonding layer 1822, thinned silicon substrate 1802 (i.e., semiconductor layer 1809) and components formed thereon (e.g., transistors 1804 and 1806) are flipped upside down. Bonding layer 1822 facing down is bonded with bonding layer 1832 facing up, i.e., in a face-to-face manner, thereby forming a bonding interface 1834. That is, thinned silicon substrate 1802 and components formed thereon can be bonded with silicon substrate 1824 and components formed thereon in a face-to-face manner, such that the bonding contacts in bonding layer 1822 are in contact with the bonding contacts in bonding layer 1832 at bonding interface 1834. Transistors 1806 and 1804 and NAND memory strings 1828 can face toward each other after the bonding. In some implementations, a treatment process, e.g., plasma treatment, wet treatment and/or thermal treatment, is applied to bonding surfaces prior to bonding. Although not shown in FIG. 18E, it is understood that in some examples, silicon substrate 1824 and components formed thereon (e.g., memory stack 1826 and NAND memory strings 1828) can be flipped upside down, and bonding layer 1832 facing down can be bonded with bonding layer 1822 facing up, i.e., in a face-to-face manner, thereby forming bonding interface 1834 as well.

As a result of the bonding, e.g., hybrid bonding, the bonding contacts on opposite sides of bonding interface 1834 can be inter-mixed. After the bonding, the bonding contacts in bonding layer 1832 and the bonding contacts in bonding layer 1822 are aligned and in contact with one another, such that memory stack 1826 and NAND memory strings 1828 formed therethrough can be coupled to transistors 1814, 1816, 1804, and 1806 through the bonded bonding contacts across bonding interface 1834, according to some implementations. It is understood that in some examples, a bonding layer may be formed above interconnect layer 1820, instead of interconnect layer 1808, and thinned silicon substrate 1802 and components formed thereon can be bonded with silicon substrate 1824 and components formed thereon in a back-to-face manner, such that transistors 1816 and 1814 and NAND memory strings 1828 may face toward each other after the bonding.

It is understood that in some examples, operation 2010 may be performed before operations 2006 and 2008. That is, after the formation of the array of NAND memory strings on the first substrate at operation 2002 and the formation of the first transistor on the first side of the second substrate at operation 2004 (operations 2002 and 2004 may be performed in parallel), method 2000 may proceed to operation 2010 to bond the first and second substrates in a face-to-face matter. Method 2000 then may proceed to operation 2006 to form the semiconductor layer on the second side of the second substrate and operation 2008 to form the second transistor on the semiconductor layer. Accordingly, since the bonded first substrate (e.g., silicon substrate 1824 in FIG. 18D) can serve as the base substrate when performing operations 2006 and 2008, the attachment of the handle substrate (e.g., handle substrate 1801 in FIG. 18B) may not be needed to simplify the process.

Figure 18F:
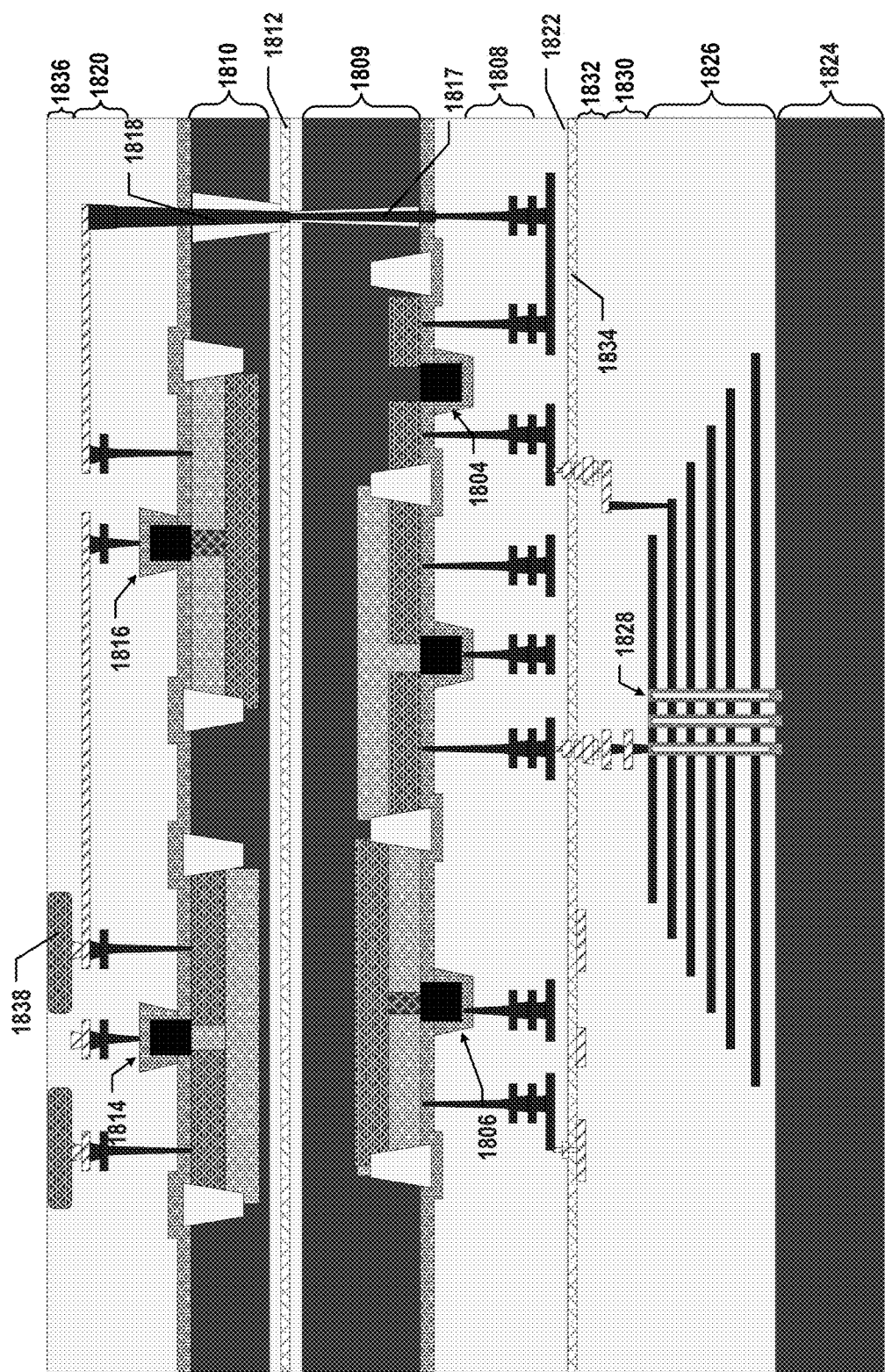

Method 2000 skips optional operation 2012 and proceeds to operation 2014, as illustrated in FIG. 20, in which a pad-out interconnect layer is formed. The pad-out interconnect layer can be formed above the second transistor. As illustrated in FIG. 18F, a pad-out interconnect layer 1836 is formed above interconnect layer 1820 and transistors 1814 and 1816 on semiconductor layer 1810. Pad-out interconnect layer 1836 can include interconnects, such as contact pads 1838, formed in one or more ILD layers. Contact pads 1838 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof.

In some implementations, to form a pad-out interconnect layer on the first substrate, after operation 2010, method 2000 proceeds to optional operation 2012, as illustrated in FIG. 20, in which the first substrate is thinned. It is understood that although not shown, in some examples, silicon substrate 1824 (shown in FIG. 18E) may be thinned to become a semiconductor layer having single crystalline silicon using processes including, but not limited to, wafer grinding, dry etch, wet etch, CMP, any other suitable processes, or any combination thereof. After the thinning, contacts may be formed extending vertically through the thinned silicon substrate 1824, for example, by wet/dry etching followed by depositing dielectric materials as spacers and conductive materials as conductors. It is understood that in some examples, the contacts may be formed in silicon substrate 1824 before thinning and be exposed from the backside of silicon substrate 1824 (where the thinning occurs) after the thinning.

Method 2000 proceeds to operation 2014, as illustrated in FIG. 20, in which a pad-out interconnect layer is formed. The pad-out interconnect layer can be formed on the thinned first substrate. It is understood that although not shown, in some examples, a pad-out interconnect layer having contact pads may be formed on the thinned silicon substrate 1824.

Figure 21:
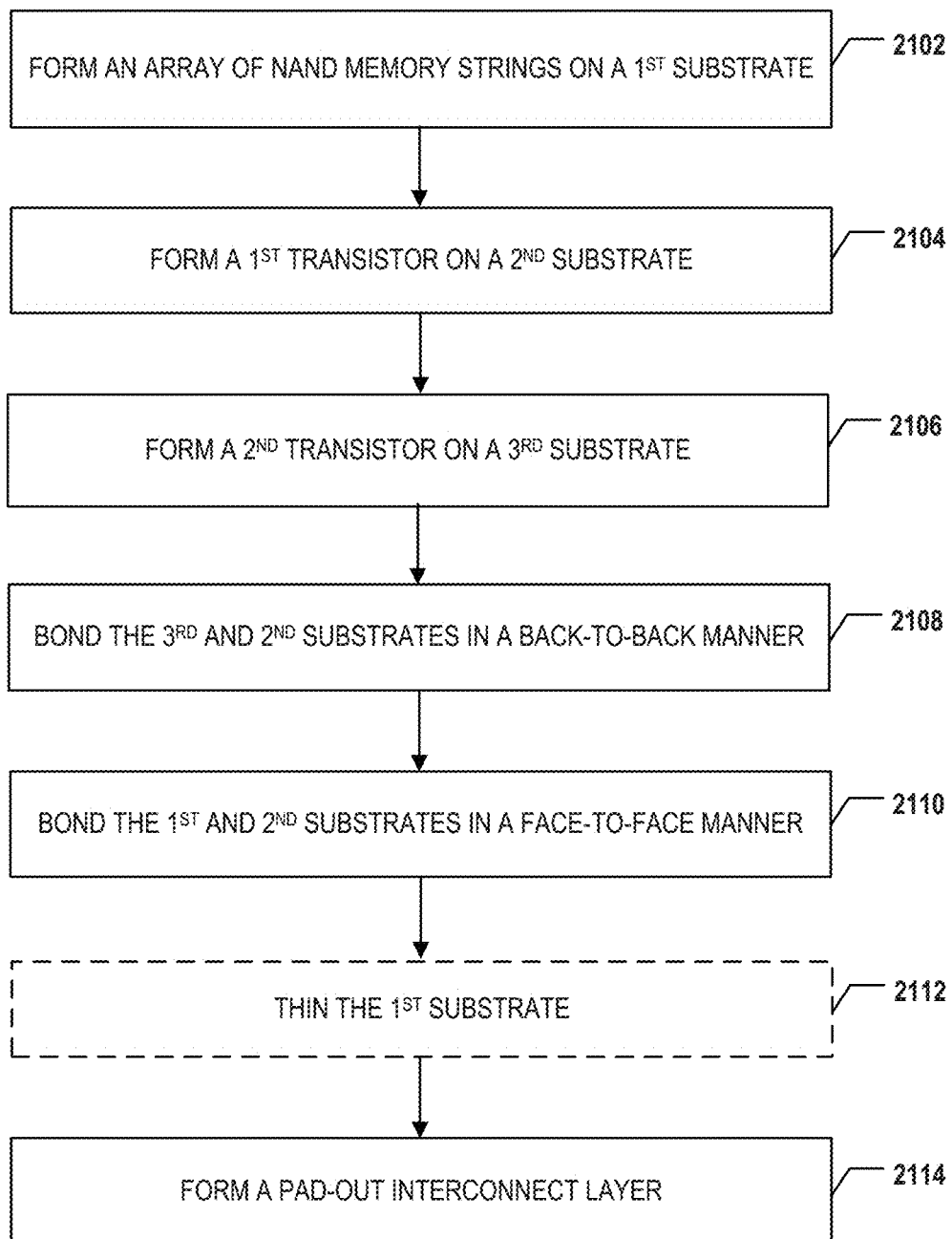
FIG. 21 illustrates a flowchart of a method for forming the 3D memory devices in FIGS. 16A and 16B, according to some aspects of the present disclosure.

FIGS. 19A-19F illustrate another fabrication process for forming the 3D memory devices in FIGS. 16A and 16B, according to some aspects of the present disclosure. FIG. 21 illustrates a flowchart of another method 2100 for forming the 3D memory devices in FIGS. 16A and 16B, according to some aspects of the present disclosure. Examples of the 3D memory devices depicted in FIGS. 19A-19F and 21 include 3D memory devices 1700, 1701, and 1703 depicted in FIGS. 17A-17C. FIGS. 19A-19F and 21 will be described together. It is understood that the operations shown in method 2100 are not exhaustive and that other operations can be performed as well before, after, or between any of the illustrated operations. Further, some of the operations may be performed simultaneously, or in a different order than shown in FIG. 21. In one example, operation 2102, 2104, and 2106 may be performed in parallel. In another example, operation 2110 may be performed before operation 2108.

Referring to FIG. 21, method 2100 starts at operation 2102, in which an array of NAND memory strings is formed on a first substrate. The first substrate can be a silicon substrate having single crystalline silicon. In some implementations, to form the array of NAND memory strings, a memory stack is formed on the first substrate.

Figure 19A:
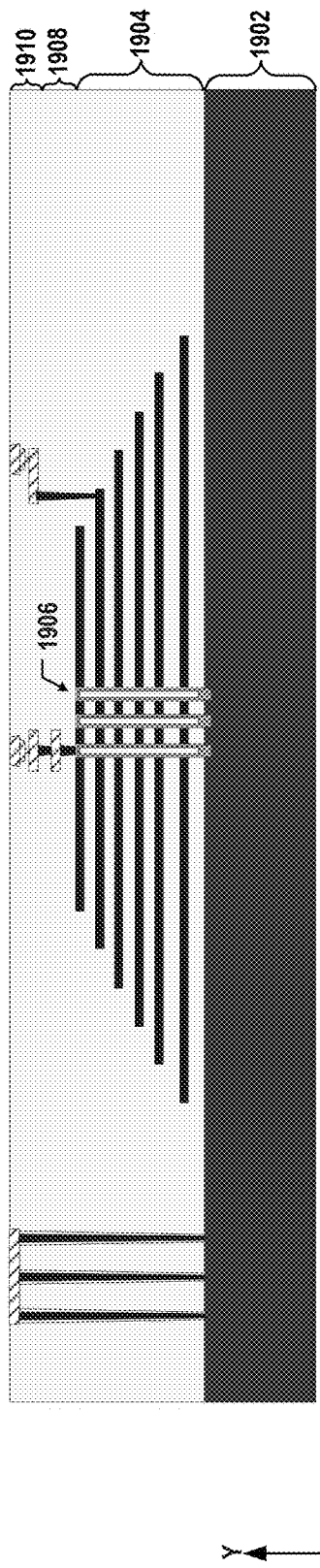
FIGS. 19A-19F illustrate another fabrication process for forming the 3D memory devices in FIGS. 16A and 16B, according to some aspects of the present disclosure.

As illustrated in FIG. 19A, a stack structure, such as a memory stack 1904 including interleaved conductive layers and dielectric layers, is formed on a silicon substrate 1902. To form memory stack 1904, in some implementations, a dielectric stack (not shown) including interleaved sacrificial layers (not shown) and the dielectric layers is formed on silicon substrate 1902. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. Memory stack 1904 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that memory stack 1904 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between memory stack 1904 and silicon substrate 1902.

As illustrated in FIG. 19A, NAND memory strings 1906 are formed above silicon substrate 1902, each of which extends vertically through memory stack 1904 to be in contact with silicon substrate 1902. In some implementations, fabrication processes to form NAND memory string 1906 include forming a channel hole through memory stack 1904 (or the dielectric stack) and into silicon substrate 1902 using dry etching/and or wet etching, such as DRIE, followed by subsequently filling the channel hole with a plurality of layers, such as a memory film (e.g., a tunneling layer, a storage layer, and a blocking layer) and a semiconductor layer, using thin film deposition processes such as ALD, CVD, PVD, or any combination thereof. It is understood that the details of fabricating NAND memory strings 1906 may vary depending on the types of channel structures of NAND memory strings 1906 (e.g., bottom plug channel structure 812A, sidewall plug channel structure 812B, or bottom open channel structure 812C in FIGS. 8A-8C) and thus, are not elaborated for ease of description.

In some implementations, an interconnect layer is formed above the array of NAND memory strings on the first substrate. The interconnect layer can include a first plurality of interconnects in one or more ILD layers. As illustrated in FIG. 19A, an interconnect layer 1908 is formed above memory stack 1904 and NAND memory strings 1906. Interconnect layer 1908 can include interconnects of MEOL and/or BEOL in a plurality of ILD layers to make electrical connections with NAND memory strings 1906. In some implementations, interconnect layer 1908 includes multiple ILD layers and interconnects therein formed in multiple processes. For example, the interconnects in interconnect layer 1908 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 19A can be collectively referred to as interconnect layer 1908.

In some implementations, a first bonding layer is formed above interconnect layer. The first bonding layer can include a plurality of first bonding contacts. As illustrated in FIG. 19A, a bonding layer 1910 is formed above interconnect layer 1308. Bonding layer 1910 can include a plurality of bonding contacts surrounded by dielectrics. In some implementations, a dielectric layer is deposited on the top surface of interconnect layer 1908 by one or more thin film deposition processes including, but not limited to, CVD, PVD, ALD, or any combination thereof. The bonding contacts can then be formed through the dielectric layer and in contact with the interconnects in interconnect layer 1908 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

Figure 19B:
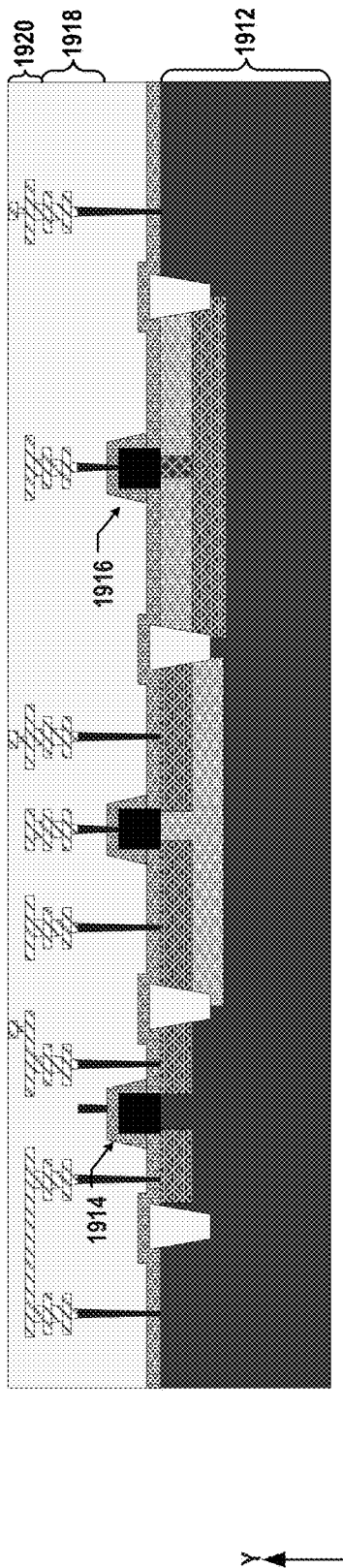

Method 2100 proceeds to operation 2104, as illustrated in FIG. 21, in which a first transistor is formed on a second substrate. The second substrate can be a silicon substrate having single crystalline silicon. As illustrated in FIG. 19B, a plurality of transistors 1914 and 1916 are formed on a silicon substrate 1912. Transistors 1914 and 1916 can be formed by a plurality of processes including, but not limited to, photolithography, dry/wet etch, thin film deposition, thermal growth, implantation, CMP, and any other suitable processes. In some implementations, doped regions are formed in silicon substrate 1912 by ion implantation and/or thermal diffusion, which function, for example, as wells and source/drain regions of transistors 1914 and 1916. In some implementations, isolation regions (e.g., STIs) are also formed in silicon substrate 1912 by wet/dry etch and thin film deposition. In some implementations, the thickness of gate dielectric of transistor 1914 is different from the thickness of gate dielectric of transistor 1916, for example, by depositing a thicker silicon oxide film in the region of transistor 1914 than the region of transistor 1916, or by etching back part of the silicon oxide film deposited in the region of transistor 1916. It is understood that the details of fabricating transistors 1914 and 1916 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer 1918 is formed above the transistor on the second substrate. The interconnect layer can include a plurality of interconnects in one or more ILD layers. As illustrated in FIG. 19B, an interconnect layer 1918 can be formed above transistors 1914 and 1916. Interconnect layer 1918 can include interconnects of MEOL and/or BEOL in a plurality of ILD layers to make electrical connections with transistors 1914 and 1916. In some implementations, interconnect layer 1918 includes multiple ILD layers and interconnects therein formed in multiple processes. For example, the interconnects in interconnect layer 1918 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 19B can be collectively referred to as interconnect layer 1918.

In some implementations, a second bonding layer is formed above interconnect layer. The second bonding layer can include a plurality of second bonding contacts. As illustrated in FIG. 19B, a bonding layer 1920 is formed above interconnect layer 1918. Bonding layer 1920 can include a plurality of bonding contacts surrounded by dielectrics. In some implementations, a dielectric layer is deposited on the top surface of interconnect layer 1918 by one or more thin film deposition processes including, but not limited to, CVD, PVD, ALD, or any combination thereof. The bonding contacts can then be formed through the dielectric layer and in contact with the interconnects in interconnect layer 1918 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

Method 2100 proceeds to operation 2106, as illustrated in FIG. 21, in which a second transistor is formed on a third substrate. The third substrate can be a silicon substrate having single crystalline silicon. In some implementations, any two or all of operations 2102, 2104, and 2106 are performed in parallel to reduce process time.

Figure 19C:
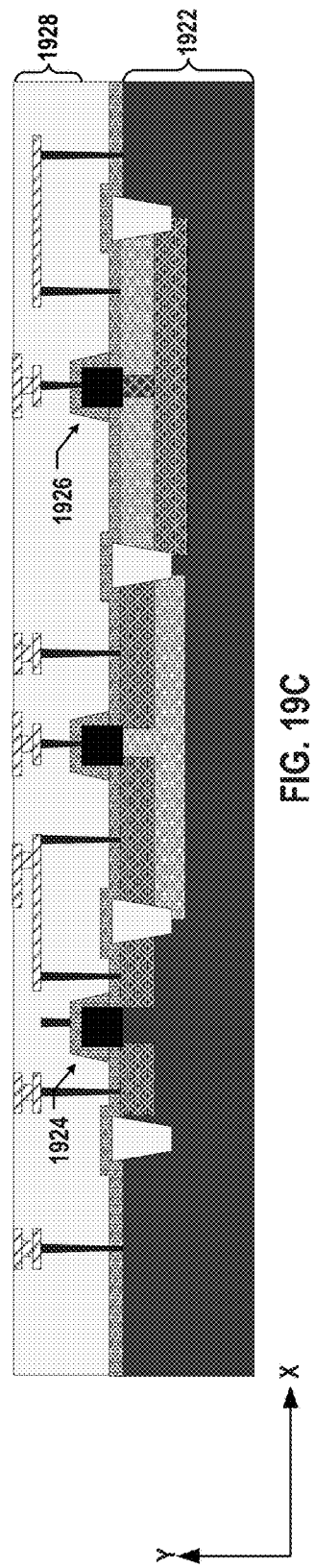

As illustrated in FIG. 19C, a plurality of transistors 1924 and 1926 are formed on a silicon substrate 1922. Transistors 1924 and 1926 can be formed by a plurality of processes including, but not limited to, photolithography, dry/wet etch, thin film deposition, thermal growth, implantation, CMP, and any other suitable processes. In some implementations, doped regions are formed in silicon substrate 1922 by ion implantation and/or thermal diffusion, which function, for example, as wells and source/drain regions of transistors 1924 and 1926. In some implementations, isolation regions (e.g., STIs) are also formed in silicon substrate 1922 by wet/dry etch and thin film deposition. In some implementations, the thickness of gate dielectric of transistor 1924 is different from the thickness of gate dielectric of transistor 1926, for example, by depositing a thicker silicon oxide film in the region of transistor 1924 than the region of transistor 1926, or by etching back part of the silicon oxide film deposited in the region of transistor 1926. It is understood that the details of fabricating transistors 1924 and 1926 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer 1928 is formed above the transistor on the third substrate. The interconnect layer can include a plurality of interconnects in one or more ILD layers. As illustrated in FIG. 19C, an interconnect layer 1928 can be formed above transistors 1924 and 1926. Interconnect layer 1928 can include interconnects of MEOL and/or BEOL in a plurality of ILD layers to make electrical connections with transistors 1924 and 1926. In some implementations, interconnect layer 1928 includes multiple ILD layers and interconnects therein formed in multiple processes. For example, the interconnects in interconnect layer 1928 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 19C can be collectively referred to as interconnect layer 1928.

Figure 19D:
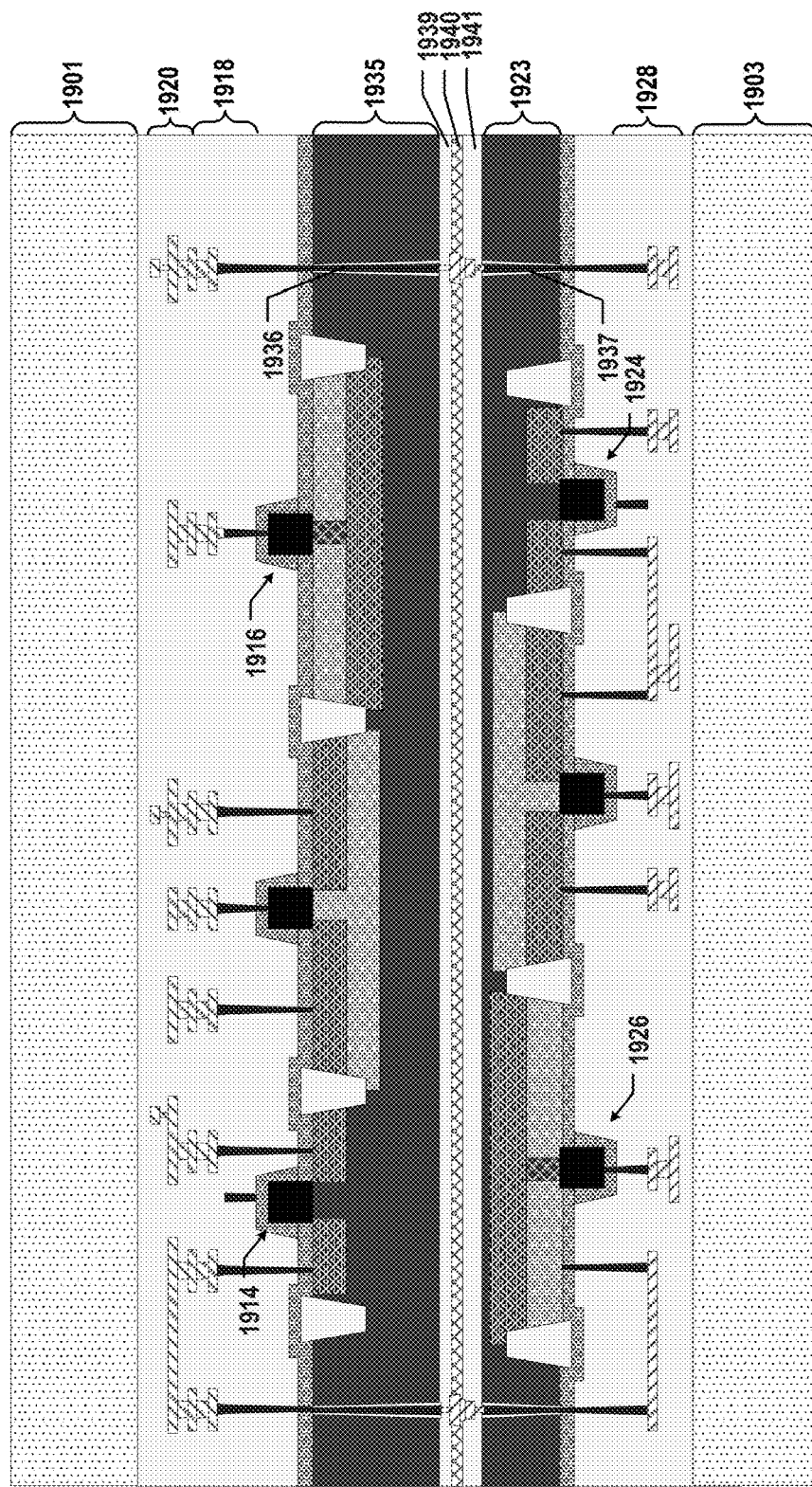

In some implementations, at least one of the second substrate or the third substrate is thinned. As illustrated in FIG. 19D, silicon substrate 1912 (shown in FIG. 19B) is thinned to become a semiconductor layer 1935 having single crystalline silicon. Similarly, silicon substrate 1922 (shown in FIG. 19C) is thinned to become a semiconductor layer 1923 having single crystalline silicon. Silicon substrate 1912 or 1922 can be thinned by processes including, but not limited to, wafer grinding, dry etch, wet etch, CMP, any other suitable processes, or any combination thereof. In some implementations, as shown in FIG. 19D, a handle substrate 1901 is attached to bonding layer 1920, and a handle substrate 1903 is attached to interconnect layer 1928, for example, using adhesive bonding, prior to the thinning to allow the subsequent backside processes on silicon substrates 1912 and 1922, such as thinning, contact formation, and bonding.

In some implementations, a first contact through the thinned second substrate is formed. In some implementations, a second contact through the thinned third substrate is formed, such that the second contact is coupled to the first contact after bonding the thinned third and second substrates. As illustrated in FIG. 19D, one or more contacts 1936 each extending vertically through semiconductor layer 1935 (i.e., the thinned silicon substrate 1912) are formed. Contacts 1936 can be coupled to the interconnects in interconnect layer 1918. Similarly, one or more contacts 1937 each extending vertically through semiconductor layer 1923

(i.e., the thinned silicon substrate 1922) are formed. Contacts 1937 can be coupled to the interconnects in interconnect layer 1928. Contact 1937 or 1936 can be formed by first patterning contact holes through semiconductor layer 1923 or 1935 using patterning process (e.g., photolithography and dry/wet etch of dielectric materials in the dielectric layer). The contact holes can be filled with a conductor (e.g., W or Cu). In some implementations, filling the contact holes includes depositing a spacer (e.g., a silicon oxide layer) before depositing the conductor. It is understood that in some examples, contacts 1936 may be formed in silicon substrate 1912 before thinning (the formation of semiconductor layer 1935, e.g., in FIG. 19B) and be exposed from the backside of silicon substrate 1912 (where the thinning occurs) after the thinning. Similarly, contacts 1937 may be formed in silicon substrate 1922 before thinning (the formation of semiconductor layer 1923, e.g., in FIG. 19C) and be exposed from the backside of silicon substrate 1922 (where the thinning occurs) after the thinning.

In some implementations, a third bonding layer is formed on a second side of the thinned second substrate opposite to a first side on which the transistor is formed, and a fourth bonding layer is formed on a second side of the thinned third substrate opposite to a first side on which the transistor is formed. The third bonding layer can include a plurality of third bonding contacts, and the fourth bonding layer can include a plurality of fourth bonding contacts. As illustrated in FIG. 19D, a bonding layer 1939 is formed on the backside of semiconductor layer 1935 (i.e., the thinned silicon substrate 1912), and a bonding layer 1941 is formed on the backside of semiconductor layer 1923 (i.e., the thinned silicon substrate 1922). Bonding layer 1939 or 1941 can include a plurality of bonding contacts surrounded by dielectrics. In some implementations, a dielectric layer is deposited on the surface of semiconductor layer 1935 or 1923 by one or more thin film deposition processes including, but not limited to, CVD, PVD, ALD, or any combination thereof. The bonding contacts can then be formed through the dielectric layer and in contact with contacts 1936 and 1937 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

Method 2100 proceeds to operation 2108, as illustrated in FIG. 21, in which the third substrate and the second substrate are bonded in a back-to-back manner. The third bonding contact in the third bonding layer can be in contact with the fourth bonding contact in the fourth bonding layer at a first bonding interface after bonding the third and second substrates. The bonding can include hybrid bonding.

As illustrated in FIG. 19D, thinned silicon substrate 1922 (i.e., semiconductor layer 1923) and components formed thereon (e.g., transistors 1924 and 1926) are flipped upside down. Bonding layer 1941 on the backside of thinned silicon substrate 1922 facing up is bonded with bonding layer 1939 on the backside of thinned silicon substrate 1912 facing down, i.e., in a back-to-back manner, thereby forming a bonding interface 1940. That is, thinned silicon substrate 1922 and components formed thereon can be bonded with thinned silicon substrate 1912 and components formed thereon in a back-to-back manner, such that the bonding contacts in bonding layer 1941 are in contact with the bonding contacts in bonding layer 1939 at bonding interface 1940. In some implementations, a treatment process, e.g., plasma treatment, wet treatment and/or thermal treatment, is applied to bonding surfaces prior to bonding. Although not shown in FIG. 13D, it is understood that in some examples, thinned silicon substrate 1912 and components formed thereon (e.g., transistors 1914 and 1916) can be flipped upside down, and bonding layer 1939 facing up can be bonded with bonding layer 1941 facing down, i.e., in a back-to-back manner, thereby forming bonding interface 1940 as well.

As a result of the bonding, e.g., hybrid bonding, the bonding contacts on opposite sides of bonding interface 1940 can be inter-mixed. After the bonding, the bonding contacts in bonding layer 1939 and the bonding contacts in bonding layer 1941 are aligned and in contact with one another, such that contacts 1936 can be coupled to contacts 1937, and transistors 1924 and 1926 can be coupled to transistors 1914 and 1916 through the bonded bonding contacts across bonding interface 1940 and contacts 1936 and 1937, according to some implementations. It is understood that in some examples, anodic bonding or fusion bonding, instead of hybrid bonding, may be performed to bond thinned silicon substrates 1912 and 1922 (and components formed thereon) at bonding interface 1940 in a back-to-back manner without bonding contacts in bonding layer 1939 and/or bonding layer 1941.

Method 2100 proceeds to operation 2110, as illustrated in FIG. 21, in which the first substrate and the second substrate are bonded in a face-to-face manner. The first bonding contact in the first bonding layer can be in contact with the second bonding contact in the second bonding layer at a first bonding interface after bonding the first and second substrates. The bonding can include hybrid bonding.

Figure 19E:
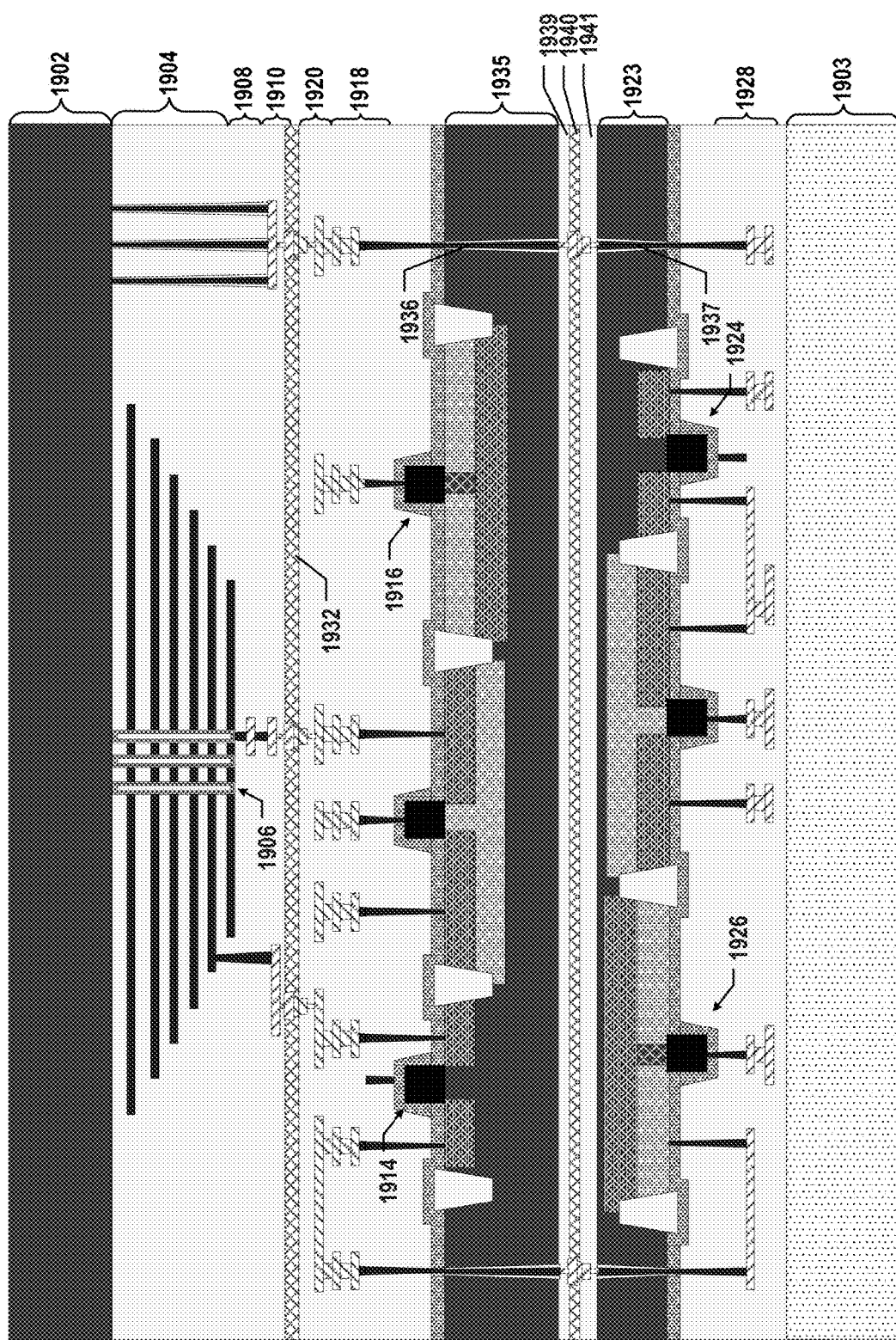

As illustrated in FIG. 19E, handle substrate 1901 (shown in FIG. 19D) attached to bonding layer 1920 is removed and expose bonding layer 1920, and silicon substrate 1902 and components formed thereon (e.g., memory stack 1904 and NAND memory strings 1906 formed therethrough) are flipped upside down. Bonding layer 1910 facing down is bonded with bonding layer 1920 facing up, i.e., in a face-to-face manner, thereby forming a bonding interface 1932. That is, silicon substrate 1902 and components formed thereon can be bonded with thinned silicon substrate 1912 (i.e., semiconductor layer 1935) and components formed thereon in a face-to-face manner, such that the bonding contacts in bonding layer 1910 are in contact with the bonding contacts in bonding layer 1920 at bonding interface 1932. Transistors 1914 and 1916 and NAND memory strings 1906 can face toward each other after the bonding. In some implementations, a treatment process, e.g., plasma treatment, wet treatment and/or thermal treatment, is applied to bonding surfaces prior to bonding. Although not shown in FIG. 19E, it is understood that in some examples, thinned silicon substrate 1912 and components formed thereon (e.g., transistors 1914 and 1916) can be flipped upside down, and bonding layer 1920 facing down can be bonded with bonding layer 1910 facing up, i.e., in a face-to-face manner, thereby forming bonding interface 1932 as well.

As a result of the bonding, e.g., hybrid bonding, the bonding contacts on opposite sides of bonding interface 1932 can be inter-mixed. After the bonding, the bonding contacts in bonding layer 1910 and the bonding contacts in bonding layer 1920 are aligned and in contact with one another, such that memory stack 1904 and NAND memory strings 1906 formed therethrough can be coupled to transistors 1914 and 1916 through the bonded bonding contacts across bonding interface 1932, according to some implementations. It is understood that in some examples, a bonding layer may be formed above interconnect layer 1928, instead of interconnect layer 1918, and thinned silicon substrate 1922 (i.e., semiconductor layer 1923) and components formed thereon can be bonded with silicon substrate 1902 and components formed thereon in a face-to-face manner, such that transistors 1926 and 1924 and NAND memory strings 1906 may face toward each other after the bonding.

It is understood that in some examples, operation 2110 may be performed before operation 2108. That is, after the formation of the array of NAND memory strings on the first substrate at operation 2102, the formation of the first transistor on the second substrate at operation 2104, and the formation of the second transistor on the third substrate at operation 2106 (operations 2102, 2104, and 2106 may be performed in parallel), method 2100 may perform operation 2110 to bond the first and second substrates in a face-to-face matter. Method 2100 then may proceed to operation 2108 to bond the third and second substrates in a back-to-back manner. Accordingly, since the bonded first substrate (e.g., silicon substrate 1902 in FIG. 19A) can serve as the base substrate when performing operation 2108, the attachment of the carrier substrate (e.g., carrier substrate 1901 in FIG. 19D) can be skipped to simplify the process.

Figure 19F:
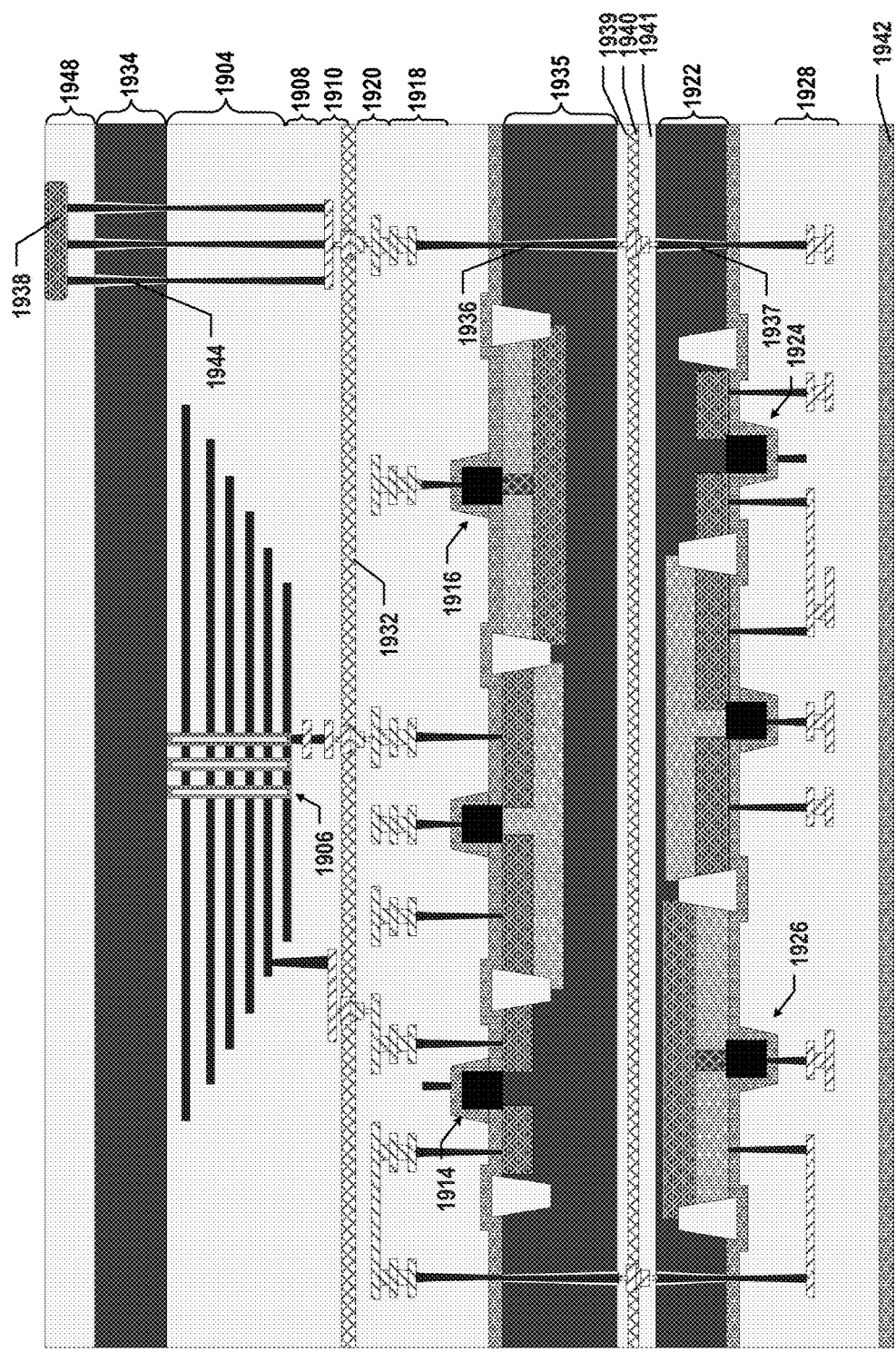

Method 2100 proceeds to optional operation 2112, as illustrated in FIG. 21, in which the first substrate is thinned. As illustrated in FIG. 19F, silicon substrate 1902 (shown in FIG. 19E) is thinned to become a semiconductor layer 1934 having single crystalline silicon. Silicon substrate 1902 can be thinned by processes including, but not limited to, wafer grinding, dry etch, wet etch, CMP, any other suitable processes, or any combination thereof.

Method 2100 proceeds to operation 2114, as illustrated in FIG. 21, in which a pad-out interconnect layer is formed. The pad-out interconnect layer can be formed on the thinned first substrate. As illustrated in FIG. 19F, a pad-out interconnect layer 1948 is formed on semiconductor layer 1934 (the thinned silicon substrate 1902). Pad-out interconnect layer 1948 can include interconnects, such as contact pads 1938, formed in one or more ILD layers. Contact pads 1938 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some implementations, after the bonding and thinning, contacts 1944 are formed extending vertically through semiconductor layer 1934, for example, by wet/dry etching followed by depositing dielectric materials as spacers and conductive materials as conductors. Contacts 1944 can couple contact pads 1938 in pad-out interconnect layer 1948 to the interconnects in interconnect layer 1908. In some implementations, handle substrate 1903 (e.g., shown in FIG. 19E) attached to interconnect layer 1928 is removed to expose interconnect layer 1928, and a passivation layer 1942 is then formed on interconnect layer 1928 by depositing dielectric materials, such as silicon nitride, using one or more thin film deposition processes including, but not limited to, CVD, PVD, ALD, or any combination thereof. It is understood that in some examples, contacts 1944 may be formed in silicon substrate 1902 before thinning (the formation of semiconductor layer 1934, e.g., in FIG. 19A) and be exposed from the backside of silicon substrate 1902 (where the thinning occurs) after the thinning.

In some implementations, after operation 2110, optional operation 2112 is skipped, and method 2100 proceeds to operation 2114, as illustrated in FIG. 21, in which a pad-out interconnect layer is formed. The pad-out interconnect layer can be formed above the second transistor. Although not shown in FIG. 19F, it is understood that in some examples, a pad-out interconnect layer having contact pads may be formed above interconnect layer 1908 and transistors 1926 and 1924 after removing handle substrate 1903. It is further understood that in some examples, the first substrate (e.g., silicon substrate 1902 or semiconductor layer 1934 after thinning) may be removed and replaced with a semiconductor layer having polysilicon in a similar manner as described above with respect to FIGS. 12G and 12H.

Figure 22A:
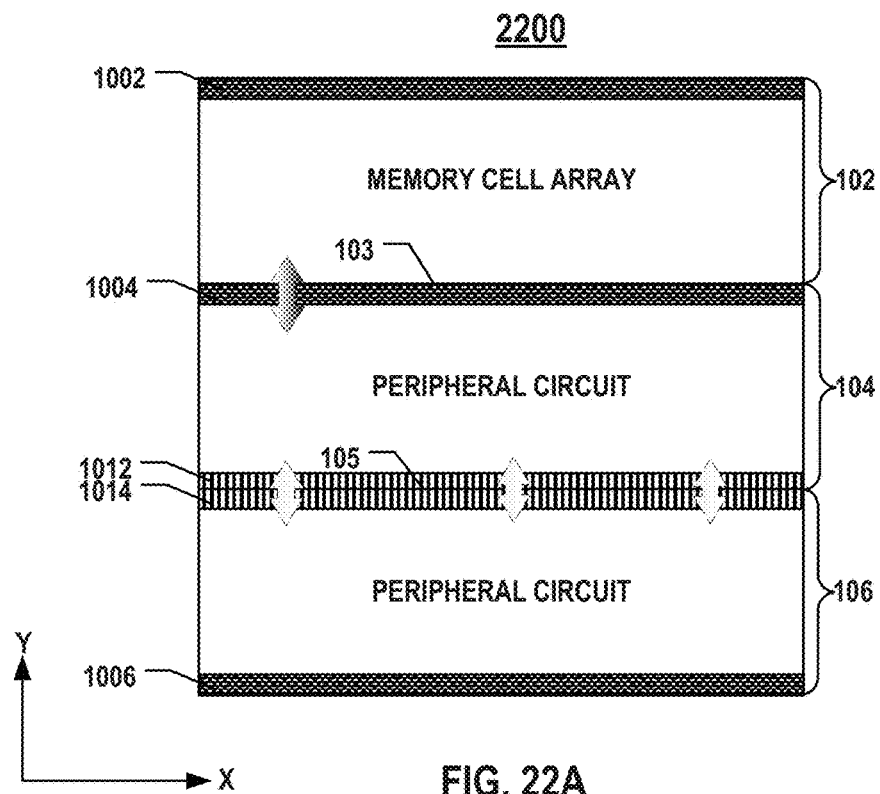
FIGS. 22A and 22B illustrate schematic views of cross-sections of the 3D memory devices in FIGS. 9A and 9B, according to various aspects of the present disclosure.
Figure 22B:
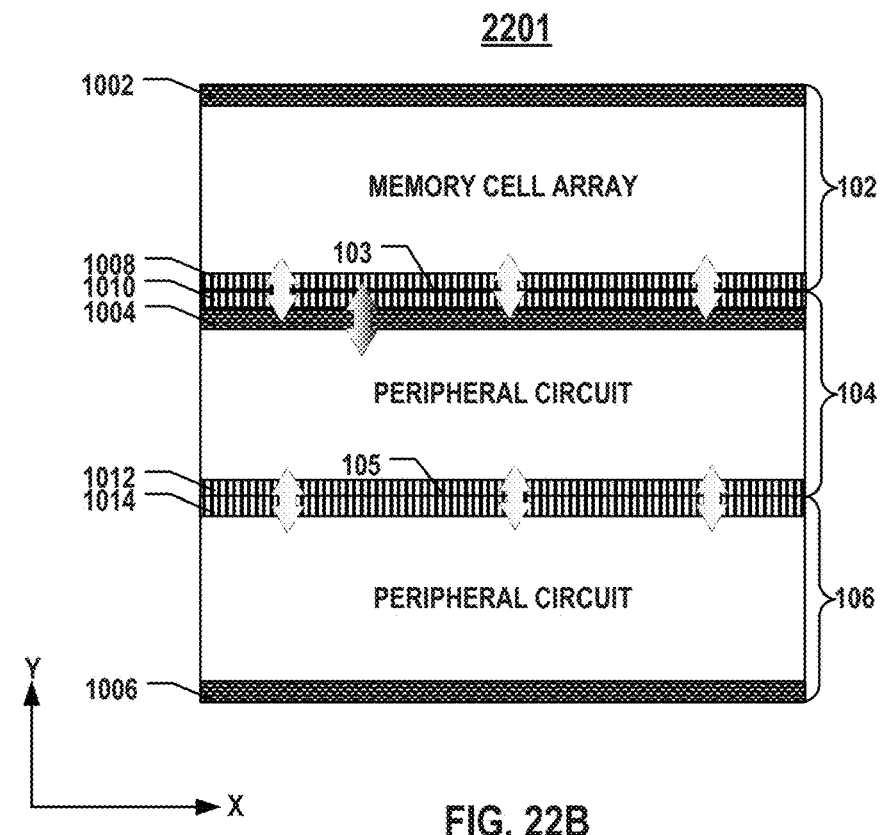

FIGS. 22A and 22B illustrate schematic views of cross-sections of the 3D memory devices in FIGS. 9A and 9B, according to various aspects of the present disclosure. 3D memory devices 2200 and 2201 may be examples of 3D memory devices 900 and 901 in FIGS. 9A and 9B. As shown in FIG. 22A, 3D memory device 2200 can include stacked first, second, and third semiconductor structures 102, 104, and 106. In some implementations, first semiconductor structure 102 on one side of 3D memory device 2200 includes semiconductor layer 1002 and a memory cell array vertically between semiconductor layer 1002 and bonding interface 103. The memory cell array can include an array of NAND memory strings (e.g., NAND memory strings 208 disclosed herein), and the sources of the array of NAND memory strings can be in contact with semiconductor layer 1002 (e.g., as shown in FIGS. 8A-8C). Semiconductor layer 1002 can include semiconductor materials, such as single crystalline silicon (e.g., a silicon substrate or a thinned silicon substrate) or polysilicon (e.g., a deposited layer), for example, depending on the types of channel structures of the NAND memory strings (e.g., bottom plug channel structure 812A, sidewall plug channel structure 812B, or bottom open channel structure 812C).

In some implementations, second semiconductor structure 104 in the intermediate of 3D memory device 2200 includes a semiconductor layer 1004, a bonding layer 1012, and some of the peripheral circuits of the memory cell array that are vertically between semiconductor layer 1004 and bonding layer 1012. In some implementations, semiconductor layer 1004 is disposed vertically between bonding interface 103 and the peripheral circuits of second semiconductor structure 104. The transistors (e.g., planar transistors 500 and 3D transistors 600) of the peripheral circuits can be in contact with semiconductor layer 1004. Semiconductor layer 1004 can include semiconductor materials, such as single crystalline silicon (e.g., a layer transferred from a silicon substrate or an SOI substrate). It is understood that in some examples, different from semiconductor layer 1002 in first semiconductor structure 102, semiconductor layer 1004 on which the transistors are formed may include single crystalline silicon, but not polysilicon, due to the superior carrier mobility of single crystalline silicon that is desirable for transistors' performance. Bonding interface 103 between first and second semiconductor structures 102 and 104 may result from transfer bonding. Through contacts (e.g., ILVs/TSVs) across bonding interface 103 and through semiconductor layer 1004 vertically between first and second semiconductor structures 102 and 104 can make direct, short-distance (e.g., submicron-level) electrical connections between adjacent semiconductor structures 102 and 104. Bonding layer 1012 can include conductive bonding contacts (not shown) and dielectrics electrically isolating the bonding contacts, which can be used, for example, for hybrid bonding.

In some implementations, third semiconductor structure 106 on another side of 3D memory device 2200 includes a semiconductor layer 1006, a bonding layer 1014, and some of the peripheral circuits of the memory cell array that are vertically between semiconductor layer 1006 and bonding interface 105. The transistors (e.g., planar transistors 500 and 3D transistors 600) of the peripheral circuits can be in contact with semiconductor layer 1006. Semiconductor layer 1006 can include semiconductor materials, such as single crystalline silicon (e.g., a silicon substrate or a thinned silicon substrate). It is understood that in some examples, different from semiconductor layer 1002 in first semiconductor structure 102, semiconductor layer 1006 on which the transistors are formed may include single crystalline silicon, but not polysilicon, due to the superior carrier mobility of single crystalline silicon that is desirable for transistors' performance. Similar to bonding layer 1012, bonding layer 1014 can also include conductive bonding contacts (not shown) and dielectrics electrically isolating the bonding contacts, which can be used, for example, for hybrid bonding. Bonding interface 105 is vertically between and in contact with bonding layers 1012 and 1014, respectively, according to some implementations. That is, bonding layers 1012 and 1014 can be disposed on opposite sides of bonding interface 105, and the bonding contacts of bonding layer 1012 can be in contact with the bonding contacts of bonding layer 1014 at bonding interface 105. As a result, a large number (e.g., millions) of bonding contacts across bonding interface 105 can make direct, short-distance (e.g., micron-level) electrical connections between adjacent semiconductor structures 102 and 104.

It is understood that in some examples, first and second semiconductor structures 102 and 104 may also include bonding layers 1008 and 1010, respectively, disposed on opposite sides of bonding interface 103, as shown in FIG. 22B. In FIG. 22B, second semiconductor structure 104 of a 3D memory device 2201 can include two bonding layers 1010 and 1012 on two sides thereof, and bonding layer 1010 can be disposed vertically between semiconductor layer 1004 and bonding interface 103. First semiconductor structure 102 of 3D memory device 2201 can include bonding layer 1008 disposed vertically between bonding interface 103 and semiconductor layer 1002. Each bonding layer 1008 or 1010 can include conductive bonding contacts (not shown) and dielectrics electrically isolating the bonding contacts. The bonding contacts of bonding layer 1008 can be in contact with the bonding contacts of bonding layer 1010 at bonding interface 103. As a result, bonding contacts across bonding interface 103 in conjunction with through contacts (e.g., ILVs/TSVs) through semiconductor layer 1004 can make direct, short-distance (e.g., micron-level) electrical connections between adjacent semiconductor structures 102 and 104.

As shown in FIGS. 22A and 22B, since third and second semiconductor structures 106 and 104 are bonded in a face-to-face manner (e.g., semiconductor layer 1006 being disposed on the bottom side of third semiconductor structure 106, while semiconductor layer 1004 being disposed on the top side of second semiconductor structure 104 in FIGS. 22A and 22B), the transistors in third semiconductor structure 106 and the transistors in second semiconductor structure 104 face toward each other, according to some implementations. In some implementations, semiconductor layer 1004 is disposed vertically between the transistors of the peripheral circuits in second semiconductor structure 104 and bonding interface 103, and the transistors of the peripheral circuits in third semiconductor structure 106 are disposed vertically between bonding interface 105 and semiconductor layer 1006. Moreover, since first and second semiconductor structures 102 and 104 are bonded in a face-to-back manner (e.g., semiconductor layers 1002 and 1004 being disposed on the top sides of first and second semiconductor structures 102 and 104, respectively, in FIGS. 22A and 22B), the transistors of peripheral circuits in second semiconductor structure 104 and the memory cell array in first semiconductor structure 102 face toward the same direction (e.g., the negative y-direction in FIGS. 22A and 22B), according to some implementations. It is understood that pad-out interconnect layer 902 in FIG. 9A or 9B is omitted from 3D memory devices 2200 and 2201 in FIGS. 22A and 22B for ease of illustration and may be included in 3D memory devices 2200 and 2201 as described above with respect to FIGS. 9A and 9B.

As described above, second and third semiconductor structures 104 and 106 can have peripheral circuits having transistors with different applied voltages. For example, second semiconductor structure 104 may be one example of semiconductor structure 408 including LLV circuits 402 (and LV circuits 404 in some examples) in FIG. 4B, and third semiconductor structure 106 may be one example of semiconductor structure 410 including HV circuits 406 (and LV circuits 404 in some examples) in FIG. 4B, or vice versa. Thus, in some implementations, semiconductor layers 1006 and 1004 in third and second semiconductor structures 106 and 104 have different thicknesses to accommodate the transistors with different applied voltages. In one example, third semiconductor structure 106 may include HV circuits 406 and second semiconductor structure 104 may include LLV circuits 402, and the thickness of semiconductor layer 1006 in third semiconductor structure 106 may be larger than the thickness of semiconductor layer 1004 in second semiconductor structure 104. Moreover, in some implementations, the gate dielectrics of the transistors in third and second semiconductor structures 106 and 104 have different thicknesses as well to accommodate the different applied voltages. In one example, third semiconductor structure 106 may include HV circuits 406 and second semiconductor structure 104 may include LLV circuits 402, and the thickness of the gate dielectrics of the transistors in third semiconductor structure 106 may be larger (e.g., at least 5-fold) than the thickness of the gate dielectrics of the transistors in second semiconductor structure 104.

Figure 23A:
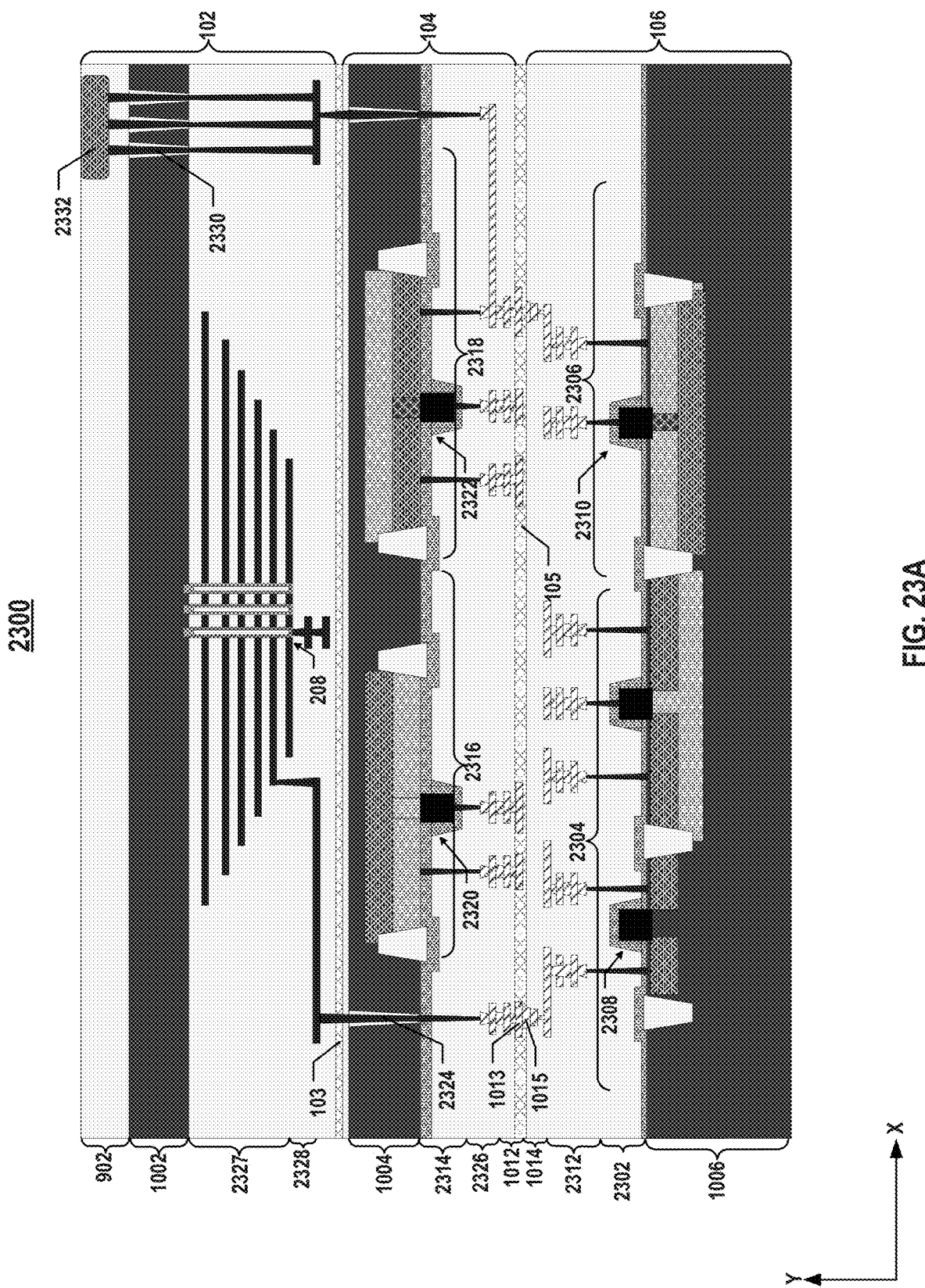
FIGS. 23A-23C illustrate side views of various examples of the 3D memory devices in FIGS. 16A and 16B, according to various aspects of the present disclosure.
Figure 23B:
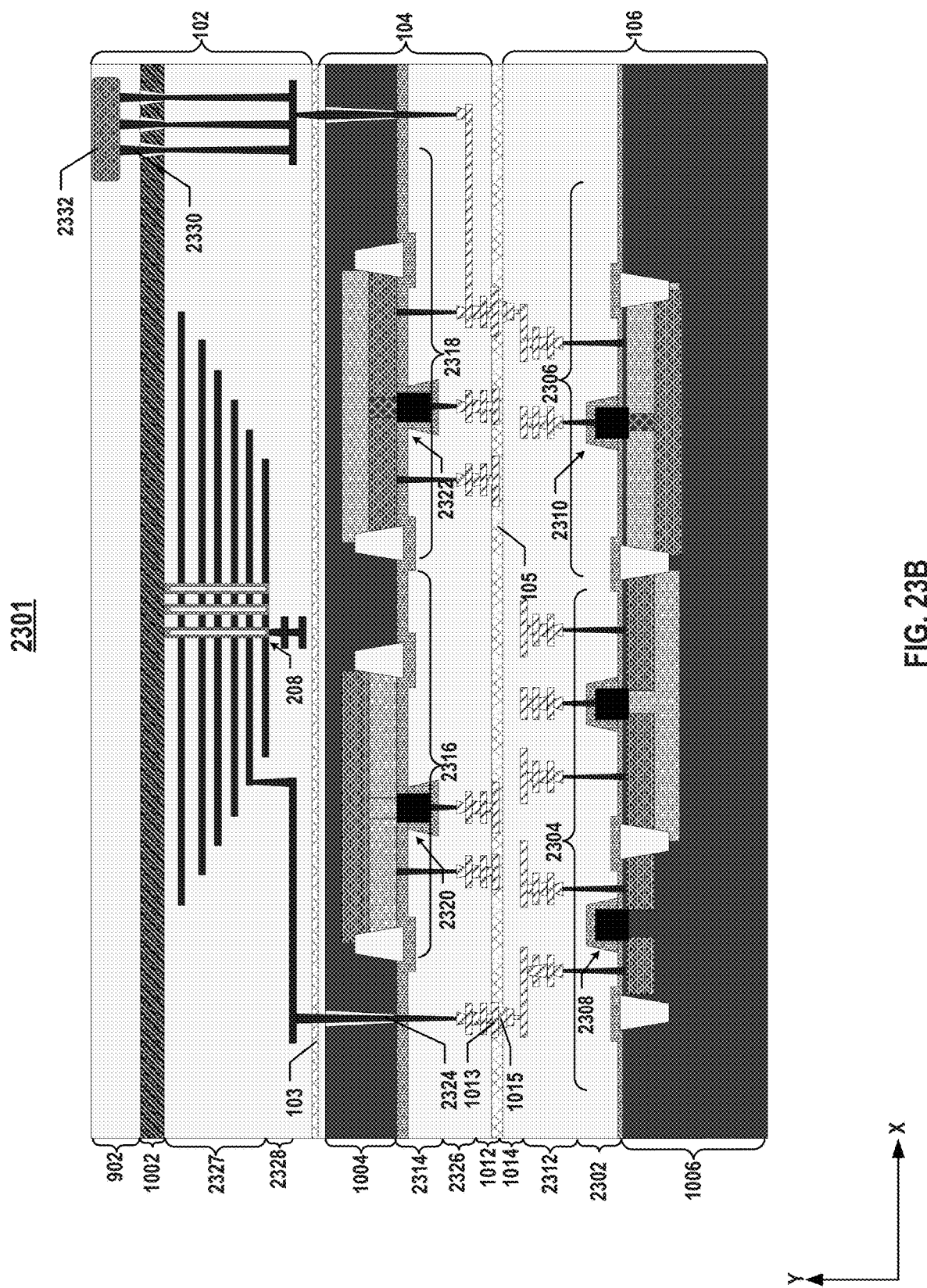
Figure 23C:
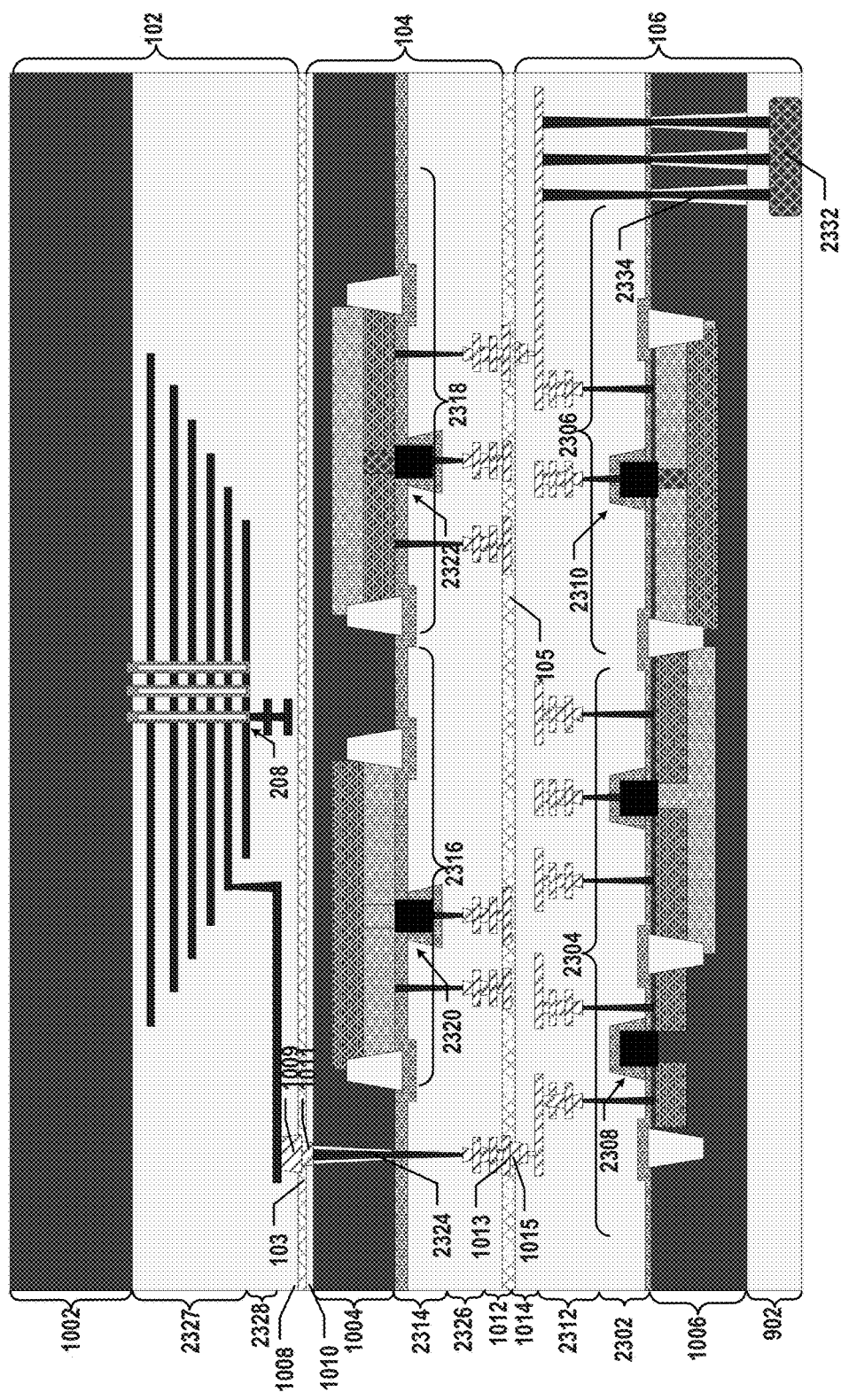

FIGS. 23A-23C illustrate side views of various examples of 3D memory devices 2200 and 2201 in FIGS. 22A and 22B, according to various aspects of the present disclosure. As shown in FIG. 23A, as one example of 3D memory devices 2200 and 2201 in FIGS. 22A and 22B, 3D memory device 2300 is a bonded chip including first semiconductor structure 102, second semiconductor structure 104, and third semiconductor structure 106, which are stacked over one another in different planes in the vertical direction (e.g., they-direction in FIG. 23A), according to some implementations. First and second semiconductor structures 102 and 104 are bonded at bonding interface 103 therebetween, and second and third semiconductor structures 104 and 106 are bonded at bonding interface 105 therebetween, according to some implementations.

As shown in FIG. 23A, third semiconductor structure 106 can include semiconductor layer 1006 having semiconductor materials. In some implementations, semiconductor layer 1006 is a silicon substrate having single crystalline silicon. Third semiconductor structure 106 can also include a device layer 2302 above and in contact with semiconductor layer 1006. In some implementations, device layer 2302 includes a first peripheral circuit 2304 and a second peripheral circuit 1106. First peripheral circuit 2304 can include HV circuits

406, such as driving circuits (e.g., string drivers 704 in row decoder/word line driver 308 and drivers in column decoder/bit line driver 306), and second peripheral circuit 2306 can include LV circuits 404, such as page buffer circuits (e.g., page buffer circuits 702 in page buffer 304) and logic circuits (e.g., in control logic 312). In some implementations, first peripheral circuit 2304 includes a plurality of transistors 2308 in contact with semiconductor layer 1006, and second peripheral circuit 2306 includes a plurality of transistors 2310 in contact with semiconductor layer 1006. Transistors 2308 and 2310 can include any transistors disclosed herein, such as planar transistors 500 and 3D transistors 600. As described above in detail with respect to transistors 500 and 600, in some implementations, each transistor 2308 or 2310 includes a gate dielectric, and the thickness of the gate dielectric of transistor 2308 (e.g., in HV circuit 406) is larger than the thickness of the gate dielectric of transistor 2310 (e.g., in LV circuit 404) due to the higher voltage applied to transistor 2308 than transistor 2310. Trench isolations (e.g., STIs) and doped regions (e.g., wells, sources, and drains of transistors 2308 and 2310) can be formed on or in semiconductor layer 1006 as well.

In some implementations, third semiconductor structure 106 further includes an interconnect layer 2312 above device layer 2302 to transfer electrical signals to and from peripheral circuits 2306 and 2304. As shown in FIG. 23A, interconnect layer 2312 can be vertically between bonding interface 105 and device layer 2302 (including transistors 2308 and 2310 of peripheral circuits 2304 and 2306). Interconnect layer 2312 can include a plurality of interconnects, such as MEOL interconnects and BEOL interconnects. The interconnects in interconnect layer 2312 can be coupled to transistors 2308 and 2310 of peripheral circuits 2304 and 2306 in device layer 2302. Interconnect layer 2312 can further include one or more ILD layers in which the lateral lines and vias can form. That is, interconnect layer 2312 can include lateral lines and vias in multiple ILD layers. In some implementations, the devices in device layer 2302 are coupled to one another through the interconnects in interconnect layer 2312. For example, peripheral circuit 2304 may be coupled to peripheral circuit 2306 through interconnect layer 2312. The interconnects in interconnect layer 2312 can include conductive materials including, but not limited to, W, Co, Cu, Al, silicides, or any combination thereof. The ILD layers in interconnect layer 2312 can include dielectric materials including, but not limited to, silicon oxide, silicon nitride, silicon oxynitride, low-k dielectrics, or any combination thereof.

In some implementations, the interconnects in interconnect layer 2312 include Cu, which has a relatively low resistivity (better electrical performance) among conductive metal materials. As described below with respect to the fabrication process, although Cu has a relatively low thermal budget (incompatible with high-temperature processes), since the fabrication of interconnect layer 2312 can be separated from the high-temperature processes in forming first and second semiconductor structures 102 and 104, the interconnects of interconnect layer 2312 having Cu can become feasible.

As shown in FIG. 23A, third semiconductor structure 106 can further include a bonding layer 1014 at bonding interface 105 and above and in contact with interconnect layer 2312. Bonding layer 1014 can include a plurality of bonding contacts 1015 and dielectrics electrically isolating bonding contacts 1015. Bonding contacts 1015 can include conductive materials including, but not limited to, W, Co, Cu, Al, silicides, or any combination thereof. In some implementations, bonding contacts 1015 of bonding layer 1014 include Cu. The remaining area of bonding layer 1014 can be formed with dielectrics including, but not limited to, silicon oxide, silicon nitride, silicon oxynitride, low-k dielectrics, or any combination thereof. Bonding contacts 1015 and surrounding dielectrics in bonding layer 1014 can be used for hybrid bonding (also known as "metal/dielectric hybrid bonding"), which is a direct bonding technology (e.g., forming bonding between surfaces without using intermediate layers, such as solder or adhesives) and can obtain metal-metal (e.g., Cu-to-Cu) bonding and dielectric-dielectric (e.g., $SiO_2$-to-$SiO_2$) bonding simultaneously.

As shown in FIG. 23A, second semiconductor structure 104 can also include a bonding layer 1012 at bonding interface 105, e.g., on the opposite side of bonding interface 105 with respect to bonding layer 1014 in third semiconductor structure 106. Bonding layer 1012 can include a plurality of bonding contacts 1013 and dielectrics electrically isolating bonding contacts 1013. Bonding contacts 1013 can include conductive materials, such as Cu. The remaining area of bonding layer 1012 can be formed with dielectric materials, such as silicon oxide. Bonding contacts 1013 and surrounding dielectrics in bonding layer 1012 can be used for hybrid bonding. In some implementations, bonding interface 105 is the place at which bonding layers 1014 and 1012 are met and bonded. In practice, bonding interface 105 can be a layer with a certain thickness that includes the top surface of bonding layer 1014 of third semiconductor structure 106 and the bottom surface of bonding layer 1012 of second semiconductor structure 104.

As shown in FIG. 23A, second semiconductor structure 104 further includes an interconnect layer 2326 above and in contact with bonding layer 1012 to transfer electrical signals. Interconnect layer 2326 can include a plurality of interconnects, such as MEOL interconnects and BEOL interconnects. Interconnect layer 2326 can further include one or more ILD layers in which the lateral lines and vias can form. The interconnects in interconnect layer 2326 can include conductive materials including, but not limited to, W, Co, Cu, Al, silicides, or any combination thereof. The ILD layers in interconnect layer 2326 can include dielectric materials including, but not limited to, silicon oxide, silicon nitride, silicon oxynitride, low-k dielectrics, or any combination thereof.

In some implementations, the interconnects in interconnect layer 2326 include Cu, which has a relatively low resistivity (better electrical performance) among conductive metal materials. As described below with respect to the fabrication process, although Cu has a relatively low thermal budget (incompatible with high-temperature processes), since the fabrication of interconnect layer 2326 can occur after the high-temperature processes in forming components (e.g., NAND memory strings 208) in first semiconductor structure 102 and components in a device layer 2314 in second semiconductor structure 104, as well as being separated from the high-temperature processes in forming third semiconductor structure 106, the interconnects of interconnect layer 2326 having Cu can become feasible.

As shown in FIG. 23A, second semiconductor structure 104 can further include device layer 2314 above and in contact with interconnect layer 2326. In some implementations, device layer 2314 includes a third peripheral circuit 2316 and a fourth peripheral circuit 2318. In some implementations, the devices in device layer 2314 are coupled to one another through the interconnects in interconnect layer 2326. For example, peripheral circuit 2316 may be coupled to peripheral circuit 2318 through interconnect layer 2326.

Third peripheral circuit 2316 can include LLV circuits 402, such as I/O circuits (e.g., in interface 316 and data bus 318), and fourth peripheral circuit 2318 can include LV circuits 404, such as page buffer circuits (e.g., page buffer circuits 702 in page buffer 304) and logic circuits (e.g., in control logic 312). In some implementations, third peripheral circuit 2316 includes a plurality of transistors 2320, and fourth peripheral circuit 2318 includes a plurality of transistors 2322 as well. Transistors 2320 and 2322 can include any transistors disclosed herein, such as planar transistors 500 and 3D transistors 600. As described above in detail with respect to transistors 500 and 600, in some implementations, each transistor 2320 or 2322 includes a gate dielectric, and the thickness of the gate dielectric of transistor 2320 (e.g., in LLV circuit 402) is smaller than the thickness of the gate dielectric of transistor 2322 (e.g., in LV circuit 404) due to the lower voltage applied to transistor 2320 than transistor 2322. Trench isolations (e.g., STIs) and doped regions (e.g., wells, sources, and drains of transistors 2320 and 2322) can be formed on or in semiconductor layer 1004 as well.

Moreover, the different voltages applied to different transistors 2320, 2322, 2308, and 2310 in second and third semiconductor structures 104 and 106 can lead to differences of device dimensions between second and third semiconductor structures 104 and 106. In some implementations, the thickness of the gate dielectric of transistor 2308 (e.g., in HV circuit 406) is larger than the thickness of the gate dielectric of transistor 2320 (e.g., in LLV circuit 402) due to the higher voltage applied to transistor 2308 than transistor 2320. In some implementations, the thickness of the gate dielectric of transistor 2322 (e.g., in LV circuit 404) is the same as the thickness of the gate dielectric of transistor 2310 (e.g., in LV circuit 404) due to the same voltage applied to transistor 2322 and transistor 2310. In some implementations, the thickness of semiconductor layer 1006 in which transistor 2308 (e.g., in HV circuit 406) is formed is larger than the thickness of semiconductor layer 1004 in which transistor 2320 (e.g., in LLV circuit 402) is formed due to the higher voltage applied to transistor 2308 than transistor 2320.

First semiconductor structure 102 can be bonded on top of second semiconductor structure 104 in a face-to-back manner at bonding interface 103. As shown in FIG. 23A, second semiconductor structure 104 can include semiconductor layer 1004 having semiconductor materials. In some implementations, semiconductor layer 1004 is a layer of single crystalline silicon transferred from a silicon substrate or an SOI substrate and attached to the top surface of first semiconductor structure 102 by transfer bonding. In some implementations, bonding interface 103 is disposed vertically between an interconnect layer 2328 of first semiconductor structure 102 and semiconductor layer 1004 as a result of transfer bonding, which transfers semiconductor layer 1004 from another substrate and bonds semiconductor layer 1004 onto first semiconductor structure 102 as described below in detail. In some implementations, bonding interface 103 is the place at which interconnect layer 2328 and semiconductor layer 1004 are met and bonded. In practice, bonding interface 103 can be a layer with a certain thickness that includes the bottom surface of interconnect layer 2328 of first semiconductor structure 102 and the top surface of semiconductor layer 1004 of second semiconductor structure 104. In some implementations, dielectric layer(s) (e.g., silicon oxide layer) are formed vertically between bonding interface 103 and semiconductor layer 1004 and/or between bonding interface 103 and interconnect layer 2328 to facilitate the transfer bonding of semiconductor layer 1004 onto interconnect layer 2328. Thus, it is understood that bonding interface 103 may include the surfaces of the dielectric layer(s) in some examples.

As shown in FIG. 23A, second semiconductor structure 104 can further include one or more contacts 2324 extending vertically through semiconductor layer 1004. Contact 2324 can extend vertically further through bonding interface 103 to be in contact with the interconnects in interconnect layer 2328. In some implementations, contact 2324 is coupled to the interconnects in interconnect layer 2326. Contact 2324 can include conductive materials including, but not limited to, W, Co, Cu, Al, silicides, or any combination thereof. In some implementations, contact 2324 includes W. In some implementations, contact 2324 includes a via surrounded by a dielectric spacer (e.g., having silicon oxide) to electrically separate the via from semiconductor layer 1004. Depending on the thickness of semiconductor layer 1004, contact 2324 can be an ILV having a depth in the submicron-level (e.g., between 10 nm and 1 µm), or a TSV having a depth in the micron- or tens micron-level (e.g., between 1 µm and 100 µm).

As shown in FIG. 23A, first semiconductor structure 102 can further include interconnect layer 2328 on the opposite side of bonding interface 103 with respect to semiconductor layer 1004 to transfer electrical signals. Interconnect layer 2328 can include a plurality of interconnects, such as MEOL interconnects and BEOL interconnects. In some implementations, the interconnects in interconnect layer 2328 also include local interconnects, such as bit line contacts and word line contacts. Contacts 2324 through semiconductor layer 1004 can couple the interconnects in interconnect layer 2328 to the interconnects in interconnect layer 2326. Interconnect layer 2328 can further include one or more ILD layers in which the lateral lines and vias can form. The interconnects in interconnect layer 2328 can include conductive materials including, but not limited to, W, Co, Cu, Al, silicides, or any combination thereof. The ILD layers in interconnect layer 2328 can include dielectric materials including, but not limited to, silicon oxide, silicon nitride, silicon oxynitride, low-k dielectrics, or any combination thereof.

As shown in FIG. 23A, first semiconductor structure 102 can include a memory cell array, such as an array of NAND memory strings 208 above and in contact with interconnect layer 2328. In some implementations, interconnect layer 2328 is vertically between NAND memory strings 208 and bonding interface 103. Each NAND memory string 208 extends vertically through a plurality of pairs each including a conductive layer and a dielectric layer, according to some implementations. The stacked and interleaved conductive layers and dielectric layers are also referred to herein as a stack structure, e.g., a memory stack 2327. Memory stack 2327 may be an example of memory stack 804 in FIGS. 8A-8C, and the conductive layer and dielectric layer in memory stack 2327 may be examples of gate conductive layers 806 and dielectric layer 808, respectively, in memory stack 804. The interleaved conductive layers and dielectric layers in memory stack 2327 alternate in the vertical direction, according to some implementations. Each conductive layer can include a gate electrode (gate line) surrounded by an adhesive layer and a gate dielectric layer. The gate electrode of the conductive layer can extend laterally as a word line, ending at one or more staircase structures of memory stack 2327.

In some implementations, each NAND memory string 208 is a "charge trap" type of NAND memory string including any suitable channel structures disclosed herein, such as bottom plug channel structure 812A, sidewall plug channel structure 812B, or bottom open channel structure 812C, described above in detail with respect to FIGS. 8A-8C. It is understood that NAND memory strings 208 are not limited to the "charge trap" type of NAND memory strings and may be "floating gate" type of NAND memory strings in other examples.

As shown in FIG. 23A, first semiconductor structure 102 can further include semiconductor layer 1002 disposed above memory stack 2327 and in contact with the sources of NAND memory strings 208. In some implementations, NAND memory strings 208 are disposed vertically between bonding interface 103 and semiconductor layer 1002. Semiconductor layer 1002 can include semiconductor materials. In some implementations, semiconductor layer 1002 is a thinned silicon substrate having single crystalline silicon on which memory stack 2327 and NAND memory strings 208 (e.g., including bottom plug channel structure 812A or sidewall plug channel structure 812B) are formed. It is understood that in some examples, trench isolations and doped regions (not shown) may be formed in semiconductor layer 1002 as well.

As shown in FIG. 23A, first semiconductor structure 102 can further include a pad-out interconnect layer 902 above and in contact with semiconductor layer 1002. In some implementations, semiconductor layer 1002 is disposed vertically between pad-out interconnect layer 902 and NAND memory strings 208. Pad-out interconnect layer 902 can include interconnects, e.g., contact pads 2332, in one or more ILD layers. Pad-out interconnect layer 902 and interconnect layer 2328 can be formed on opposite sides of semiconductor layer 1002. In some implementations, the interconnects in pad-out interconnect layer 902 can transfer electrical signals between 3D memory device 2300 and external devices, e.g., for pad-out purposes.

As shown in FIG. 11A, first semiconductor structure 102 can further include one or more contacts 2330 extending vertically through semiconductor layer 1002. In some implementations, contact 2330 couples the interconnects in interconnect layer 2328 to contact pads 2332 in pad-out interconnect layer 902 to make an electrical connection through semiconductor layer 1002. Contact 2330 can include conductive materials including, but not limited to, W, Co, Cu, Al, silicides, or any combination thereof. In some implementations, contact 1130 includes W. In some implementations, contact 2330 includes a via surrounded by a dielectric spacer (e.g., having silicon oxide) to electrically separate the via from semiconductor layer 1002. Depending on the thickness of semiconductor layer 1002, contact 2330 can be an ILV having a depth in the submicron-level (e.g., between 10 nm and 1 µm), or a TSV having a depth in the micron- or tens micron-level (e.g., between 1 µm and 100 µm).

As a result, peripheral circuits 2304, 2306, 2316, and 2318 in third and second semiconductor structures 106 and 104 can be coupled to NAND memory strings 208 in first semiconductor structure 102 through various interconnection structures, including interconnect layers 2312, 2326, and 2328, bonding layers 1014 and 1012, as well as contacts 2324. Moreover, peripheral circuits 2304, 2306, 2316, and 2318 and NAND memory strings 208 in 3D memory device 2300 can be further coupled to external devices through contacts 2330 and pad-out interconnect layer 902.

It is understood that the material of semiconductor layer 1002 in first semiconductor structure 102 is not limited to single crystalline silicon as described above with respect to FIG. 23A and may be any other suitable semiconductor materials. For example, as shown in FIG. 23B, a 3D memory device 2301 may include semiconductor layer 1002 having polysilicon in first semiconductor structure 102. NAND memory strings 208 of 3D memory device 2301 in contact with semiconductor layer 1002 having polysilicon can include any suitable channel structures disclosed herein that are in contact with a polysilicon layer, such as bottom open channel structure 812C. In some implementations, NAND memory strings 208 of 3D memory device 2301 are "floating gate" type of NAND memory strings, and semiconductor layer 1002 having polysilicon is in contact with the "floating gate" type of NAND memory strings as the source plate thereof. It is understood that the details of the same components (e.g., materials, fabrication process, functions, etc.) in both 3D memory devices 2300 and 2301 are not repeated for ease of description.

It is also understood that the pad-out of 3D memory devices is not limited to from first semiconductor structure 102 having NAND memory strings 208 as shown in FIGS. 23A and 23B (corresponding to FIG. 9B) and may be from third semiconductor structure 106 having peripheral circuit 2304 (corresponding to FIG. 9A). For example, as shown in FIG. 23C, a 3D memory device 2303 may include pad-out interconnect layer 902 in third semiconductor structure 106. Pad-out interconnect layer 902 can be in contact with semiconductor layer 1006 of third semiconductor structure 106 on which transistors 2308 of peripheral circuit 2304 are formed. In some implementations, third semiconductor structure 106 further includes one or more contacts 2334 extending vertically through semiconductor layer 1006. In some implementations, contact 2334 couples the interconnects in interconnect layer 2312 in third semiconductor structure 106 to contact pads 2332 in pad-out interconnect layer 902 to make an electrical connection through semiconductor layer 1006. Contact 2334 can include conductive materials including, but not limited to, W, Co, Cu, Al, silicides, or any combination thereof. In some implementations, contact 2334 includes W. In some implementations, contact 2334 includes a via surrounded by a dielectric spacer (e.g., having silicon oxide) to electrically separate the via from semiconductor layer 1006. Depending on the thickness of semiconductor layer 1006, contact 2334 can be an ILV having a depth in the submicron-level (e.g., between 10 nm and 1 µm), or a TSV having a depth in the micron- or tens micron-level (e.g., between 1 µm and 100 µm). It is understood that the details of the same components (e.g., materials, fabrication process, functions, etc.) in both 3D memory devices 2300 and 2303 are not repeated for ease of description.

It is further understood that in some examples, similar to bonding interface 105, bonding interface 103 may result from hybrid bonding and thus, be disposed vertically between two bonding layers each including bonding contacts in second and third semiconductor structures 104 and 106, respectively. For example, as shown in FIG. 23C, 3D memory device 2303 may include bonding layers 1008 and 1010 in first and second semiconductor structures 102 and 104, respectively, at bonding interface 103, i.e., on opposite sides of bonding interface 103. Bonding layer 1008 or 1010 can include a plurality of bonding contacts 1009 or 1011 and dielectrics electrically isolating bonding contacts 1009 or 1011. Bonding contacts 1009 and 1011 can include conductive materials, such as Cu. The remaining area of bonding layer 1008 or 1010 can be formed with dielectric materials, such as silicon oxide. Bonding contacts 1009 and 1011 and surrounding dielectrics in bonding layer 1008 or 1010 can be used for hybrid bonding. In some implementations, bonding interface 103 is the place at which bonding layers 1008 and 1010 are met and bonded. In practice, bonding interface 103 can be a layer with a certain thickness that includes the top surface of bonding layer 1010 of second semiconductor structure 104 and the bottom surface of bonding layer 1008 of first semiconductor structure 102. Contact 2324 can be coupled to bonding contacts 1011, and interconnect layer 2328 can be coupled to bonding contacts 1009.

Figure 26:
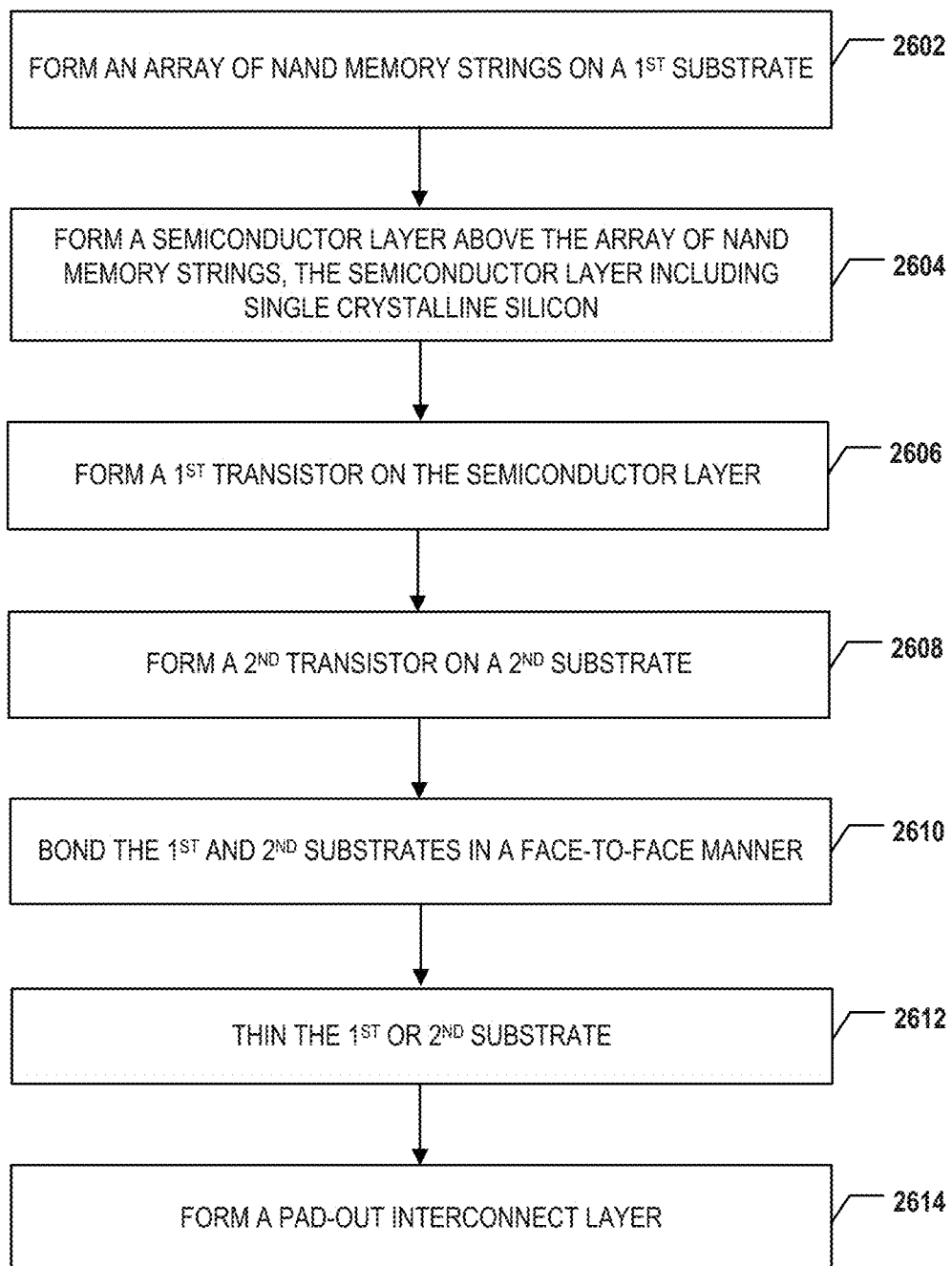
FIG. 26 illustrates a flowchart of a method for forming the 3D memory devices in FIGS. 22A and 22B, according to some aspects of the present disclosure.

FIGS. 24A-24F illustrate a fabrication process for forming the 3D memory devices in FIGS. 22A and 22B, according to some aspects of the present disclosure. FIG. 26 illustrates a flowchart of a method 2600 for forming the 3D memory devices in FIGS. 22A and 22B, according to some aspects of the present disclosure. Examples of the 3D memory devices depicted in FIGS. 24A-24F and 26 include 3D memory devices 2300, 2301, and 2303 depicted in FIGS. 23A-23C. FIGS. 24A-24F and 26 will be described together. It is understood that the operations shown in method 2600 are not exhaustive and that other operations can be performed as well before, after, or between any of the illustrated operations. Further, some of the operations may be performed simultaneously, or in a different order than shown in FIG. 26. For example, operation 2602 may be performed after operation 2608 or in parallel with operations 2604-2608.

Referring to FIG. 26, method 2600 starts at operation 2602, in which an array of NAND memory strings is formed on a first substrate. The first substrate can be a silicon substrate having single crystalline silicon. In some implementations, to form the array of NAND memory strings, a memory stack is formed on the first substrate.

As illustrated in FIG. 24A, a stack structure, such as a memory stack 2426 including interleaved conductive layers and dielectric layers, is formed on a silicon substrate 2424. To form memory stack 2426, in some implementations, a dielectric stack (not shown) including interleaved sacrificial layers (not shown) and the dielectric layers is formed on silicon substrate 2424. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. Memory stack 2426 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that memory stack 2426 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between memory stack 2426 and silicon substrate 2424.

As illustrated in FIG. 24A, NAND memory strings 2428 are formed above silicon substrate 2424, each of which extends vertically through memory stack 2426 to be in contact with silicon substrate 2424. In some implementations, fabrication processes to form NAND memory string 2428 include forming a channel hole through memory stack 2426 (or the dielectric stack) and into silicon substrate 2424 using dry etching/and or wet etching, such as DRIE, followed by subsequently filling the channel hole with a plurality of layers, such as a memory film (e.g., a tunneling layer, a storage layer, and a blocking layer) and a semiconductor layer, using thin film deposition processes such as ALD, CVD, PVD, or any combination thereof. It is understood that the details of fabricating NAND memory strings 2428 may vary depending on the types of channel structures of NAND memory strings 2428 (e.g., bottom plug channel structure 812A, sidewall plug channel structure 812B, or bottom open channel structure 812C in FIGS. 8A-8C) and thus, are not elaborated for ease of description.

In some implementations, an interconnect layer is formed above the array of NAND memory strings on the first substrate. The interconnect layer can include a first plurality of interconnects in one or more ILD layers. As illustrated in FIG. 24A, an interconnect layer 2430 is formed above memory stack 2426 and NAND memory strings 2428. Interconnect layer 2430 can include interconnects of MEOL and/or BEOL in a plurality of ILD layers to make electrical connections with NAND memory strings 2428. In some implementations, interconnect layer 2430 includes multiple ILD layers and interconnects therein formed in multiple processes. For example, the interconnects in interconnect layer 2430 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 24A can be collectively referred to as interconnect layer 2430.

Method 2600 proceeds to operation 2604, as illustrated in FIG. 26, in which a semiconductor layer is formed above the array of NAND memory strings. The semiconductor layer can include single crystalline silicon. In some implementations, to form the semiconductor layer, another substrate and the second substrate are bonded in a face-to-face manner, and the other substrate is thinned to leave the semiconductor layer. The bonding can include transfer bonding. The other substrate can be a silicon substrate having single crystalline silicon.

As illustrated in FIG. 24B, a semiconductor layer 2410, such as a single crystalline silicon layer, is formed above interconnect layer 2430 and NAND memory strings 2428. Semiconductor layer 2410 can be attached above interconnect layer 2430 to form a bonding interface 2412 vertically between semiconductor layer 2410 and interconnect layer 2430. In some implementations, to form semiconductor layer 2410, another silicon substrate (not shown in FIG. 24B) and silicon substrate 2424 are bonded in a face-to-face manner (having the components formed on silicon substrate 2424, such as NAND memory strings 2428, facing toward the other silicon substrate) using transfer bonding, thereby forming bonding interface 2412. The other silicon substrate can then be thinned using any suitable processes to leave semiconductor layer 2410 attached above interconnect layer 2430. The details of various transfer bonding processes are described above with respect to FIGS. 48A-48D and FIGS. 49A-49D and thus, are not repeated for ease of description.

Figure 24C:
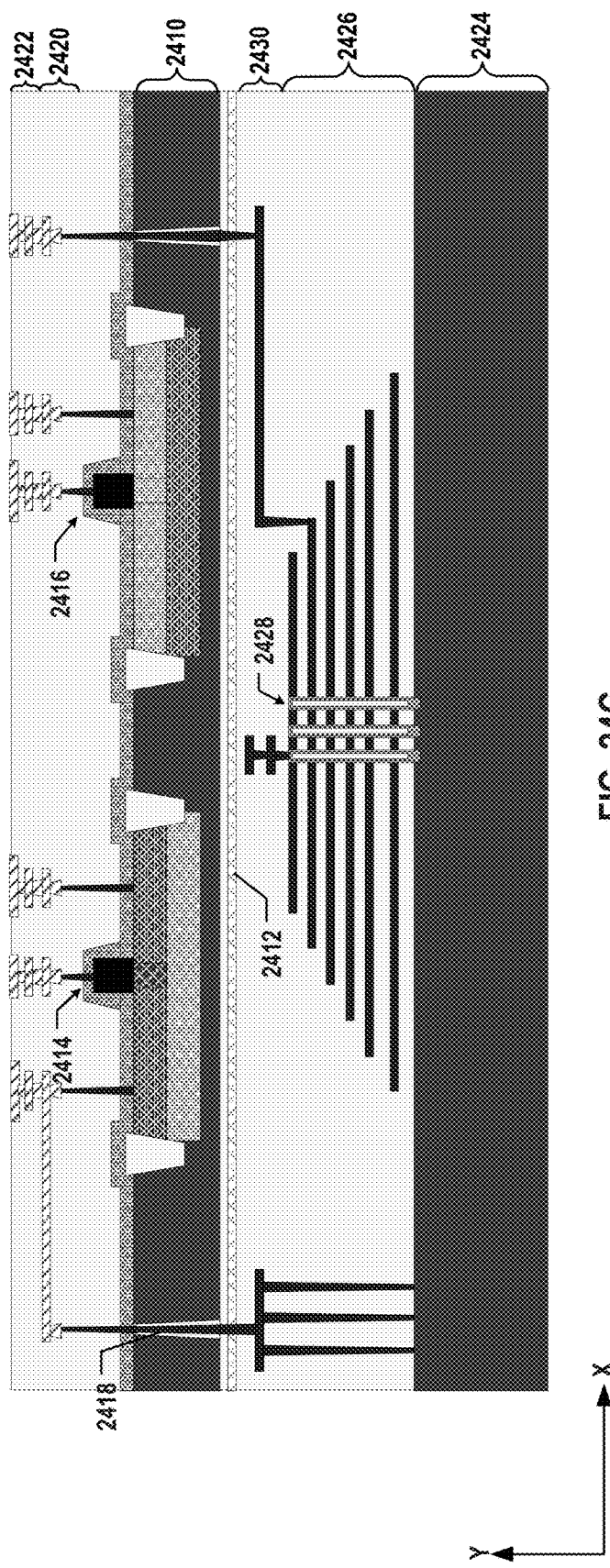

Referring to FIG. 26, method 2600 proceeds to operation 2606, in which a first transistor is formed on the semiconductor layer. As illustrated in FIG. 24C, a plurality of transistors 2414 and 2416 are formed on semiconductor layer 2410 having single crystalline silicon. Transistors 2414 and 2416 can be formed by a plurality of processes including, but not limited to, photolithography, dry/wet etch, thin film deposition, thermal growth, implantation, CMP, and any other suitable processes. In some implementations, doped regions are formed in semiconductor layer 2410 by ion implantation and/or thermal diffusion, which function, for example, as wells and source/drain regions of transistors 2414 and 2416. In some implementations, isolation regions (e.g., STIs) are also formed in semiconductor layer 2410 by wet/dry etch and thin film deposition. In some implementations, the thickness of gate dielectric of transistor 2414 is different from the thickness of gate dielectric of transistor 2416, for example, by depositing a thicker silicon oxide film in the region of transistor 2414 than the region of transistor 2416, or by etching back part of the silicon oxide film deposited in the region of transistor 2416. It is understood that the details of fabricating transistors 2414 and 2416 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer 2420 is formed above the transistor on the semiconductor layer. The interconnect layer can include a plurality of interconnects in one or more ILD layers. As illustrated in FIG. 24C, an interconnect layer 2420 can be formed above transistors 2414 and 2416. Interconnect layer 2420 can include interconnects of MEOL and/or BEOL in a plurality of ILD layers to make electrical connections with transistors 2414 and 2416. In some implementations, interconnect layer 2420 includes multiple ILD layers and interconnects therein formed in multiple processes. For example, the interconnects in interconnect layer 2420 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 24C can be collectively referred to as interconnect layer 2420. In some implementations, the interconnects in interconnect layer 2420 include Cu, which has a relatively low resistivity among conductive metal materials. It is understood that although Cu has a relatively low thermal budget (incompatible with high-temperature processes), using Cu as the conductive materials of the interconnects in interconnect layer 2420 may become feasible since there are no more high-temperature processes after the fabrication of interconnect layer 2420.

In some implementations, a contact through the semiconductor layer is formed. As illustrated in FIG. 24C, one or more contacts 2418 each extending vertically through semiconductor layer 2410 is formed. Contact 2418 can extend vertically further through bonding interface 2412 to be in contact with the interconnects in interconnect layer 2430. Contacts 2418 can couple the interconnects in interconnect layers 2420 and 2430. Contacts 2418 can be formed by first patterning contact holes through semiconductor layer 2410 using patterning process (e.g., photolithography and dry/wet etch of dielectric materials in the dielectric layer). The contact holes can be filled with a conductor (e.g., W or Cu). In some implementations, filling the contact holes includes depositing a spacer (e.g., a silicon oxide layer) before depositing the conductor.

In some implementations, a first bonding layer is formed above the interconnect layer. The first bonding layer can include a plurality of first bonding contacts. As illustrated in FIG. 24C, a bonding layer 2422 is formed above interconnect layer 2420. Bonding layer 2422 can include a plurality of bonding contacts surrounded by dielectrics. In some implementations, a dielectric layer is deposited on the top surface of interconnect layer 1220 by one or more thin film deposition processes including, but not limited to, CVD, PVD, ALD, or any combination thereof. The bonding contacts can then be formed through the dielectric layer and in contact with the interconnects in interconnect layer 2420 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

Figure 24D:
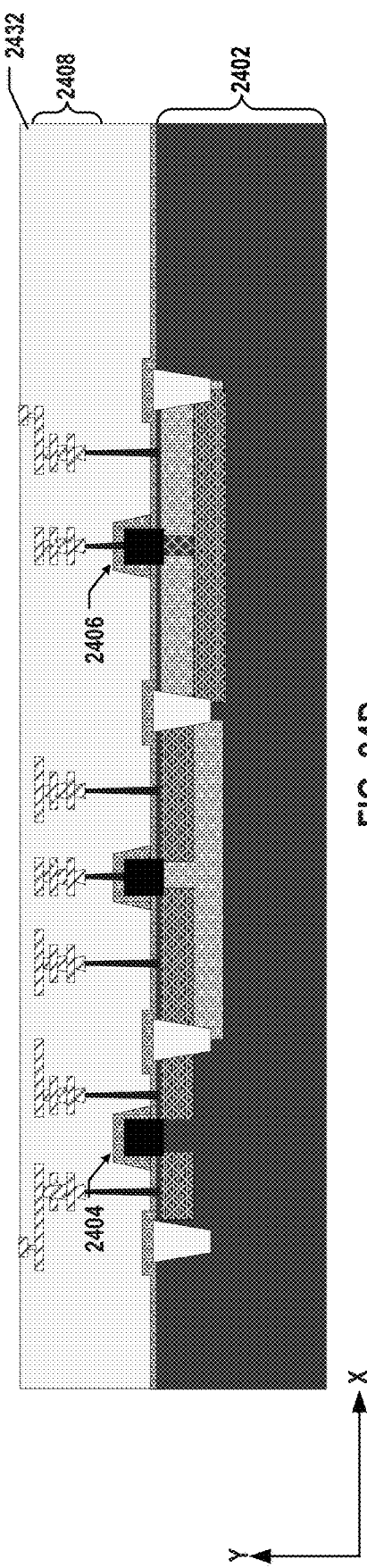

Method 2600 proceeds to operation 2608, as illustrated in FIG. 26, in which a second transistor is formed on a second substrate. The second substrate can be a silicon substrate having single crystalline silicon. As illustrated in FIG. 24D, a plurality of transistors 2404 and 2406 are formed on a silicon substrate 2402. Transistors 2404 and 2406 can be formed by a plurality of processes including, but not limited to, photolithography, dry/wet etch, thin film deposition, thermal growth, implantation, CMP, and any other suitable processes. In some implementations, doped regions are formed in silicon substrate 2402 by ion implantation and/or thermal diffusion, which function, for example, as wells and source/drain regions of transistors 2404 and 2406. In some implementations, isolation regions (e.g., STIs) are also formed in silicon substrate 2402 by wet/dry etch and thin film deposition. In some implementations, the thickness of gate dielectric of transistor 2404 is different from the thickness of gate dielectric of transistor 2406, for example, by depositing a thicker silicon oxide film in the region of transistor 2404 than the region of transistor 2406, or by etching back part of the silicon oxide film deposited in the region of transistor 2406. It is understood that the details of fabricating transistors 2404 and 2406 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer 2408 is formed above the transistor on the second substrate. The interconnect layer can include a plurality of interconnects in one or more ILD layers. As illustrated in FIG. 24D, an interconnect layer 2408 can be formed above transistors 2404 and 2406. Interconnect layer 2408 can include interconnects of MEOL and/or BEOL in a plurality of ILD layers to make electrical connections with transistors 2404 and 2406. In some implementations, interconnect layer 2408 includes multiple ILD layers and interconnects therein formed in multiple processes. For example, the interconnects in interconnect layer 2408 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 24D can be collectively referred to as interconnect layer 2408. In some implementations, the interconnects in interconnect layer 2408 include Cu, which has a relatively low resistivity among conductive metal materials. It is understood that although Cu has a relatively low thermal budget (incompatible with high-temperature processes), using Cu as the conductive materials of the interconnects in interconnect layer 2408 may become feasible since there are no more high-temperature processes after the fabrication of interconnect layer 2408.

In some implementations, a second bonding layer is formed above the interconnect layer. The second bonding layer can include a plurality of second bonding contacts. As illustrated in FIG. 24D, a bonding layer 2432 is formed above interconnect layer 2408. Bonding layer 2432 can include a plurality of bonding contacts surrounded by dielectrics. In some implementations, a dielectric layer is deposited on the top surface of interconnect layer 2408 by one or more thin film deposition processes including, but not limited to, CVD, PVD, ALD, or any combination thereof. The bonding contacts can then be formed through the dielectric layer and in contact with the interconnects in interconnect layer 2408 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

Method 2600 proceeds to operation 2610, as illustrated in FIG. 26, in which the first substrate and the second substrate are bonded in a face-to-face manner. The first bonding contact in the first bonding layer can be in contact with the second bonding contact in the second bonding layer at a bonding interface after bonding the first and second substrates. The bonding can include hybrid bonding.

Figure 24E:
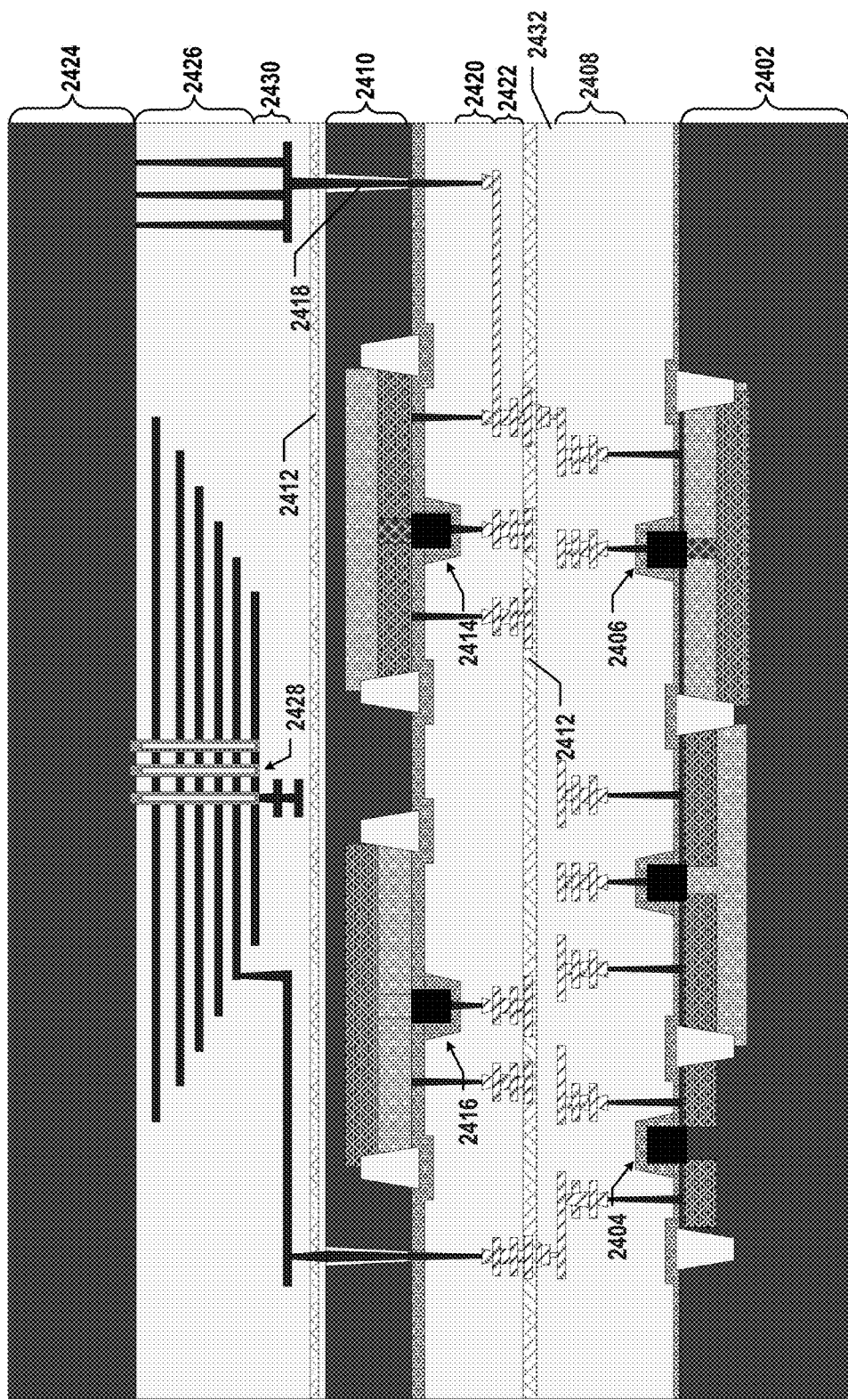

As illustrated in FIG. 24E, silicon substrate 2424 and components formed thereon (e.g., memory stack 2426, NAND memory strings 2428, and transistors 2416 and 2414) are flipped upside down. Bonding layer 2422 facing down is bonded with bonding layer 2432 facing up, i.e., in a face-to-face manner, thereby forming a bonding interface 2412. That is, silicon substrate 2424 and components formed thereon can be bonded with silicon substrate 2402 and components formed thereon in a face-to-face manner, such that the bonding contacts in bonding layer 2422 are in contact with the bonding contacts in bonding layer 2432 at bonding interface 2412. In some implementations, a treatment process, e.g., plasma treatment, wet treatment and/or thermal treatment, is applied to bonding surfaces prior to bonding. Although not shown in FIG. 24E, it is understood that in some examples, silicon substrate 2402 and components formed thereon (e.g., transistors 2404 and 2406) can be flipped upside down, and bonding layer 2432 facing down can be bonded with bonding layer 2422 facing up, i.e., in a face-to-face manner, thereby forming bonding interface 2412 as well.

As a result of the bonding, e.g., hybrid bonding, the bonding contacts on opposite sides of bonding interface 2412 can be inter-mixed. After the bonding, the bonding contacts in bonding layer 2422 and the bonding contacts in bonding layer 2432 are aligned and in contact with one another, such that memory stack 2426 and NAND memory strings 2428 formed therethrough and transistors 2416 and 2414 can be coupled to transistors 2404 and 2406 through the bonded bonding contacts across bonding interface 1237, according to some implementations.

Figure 24F:
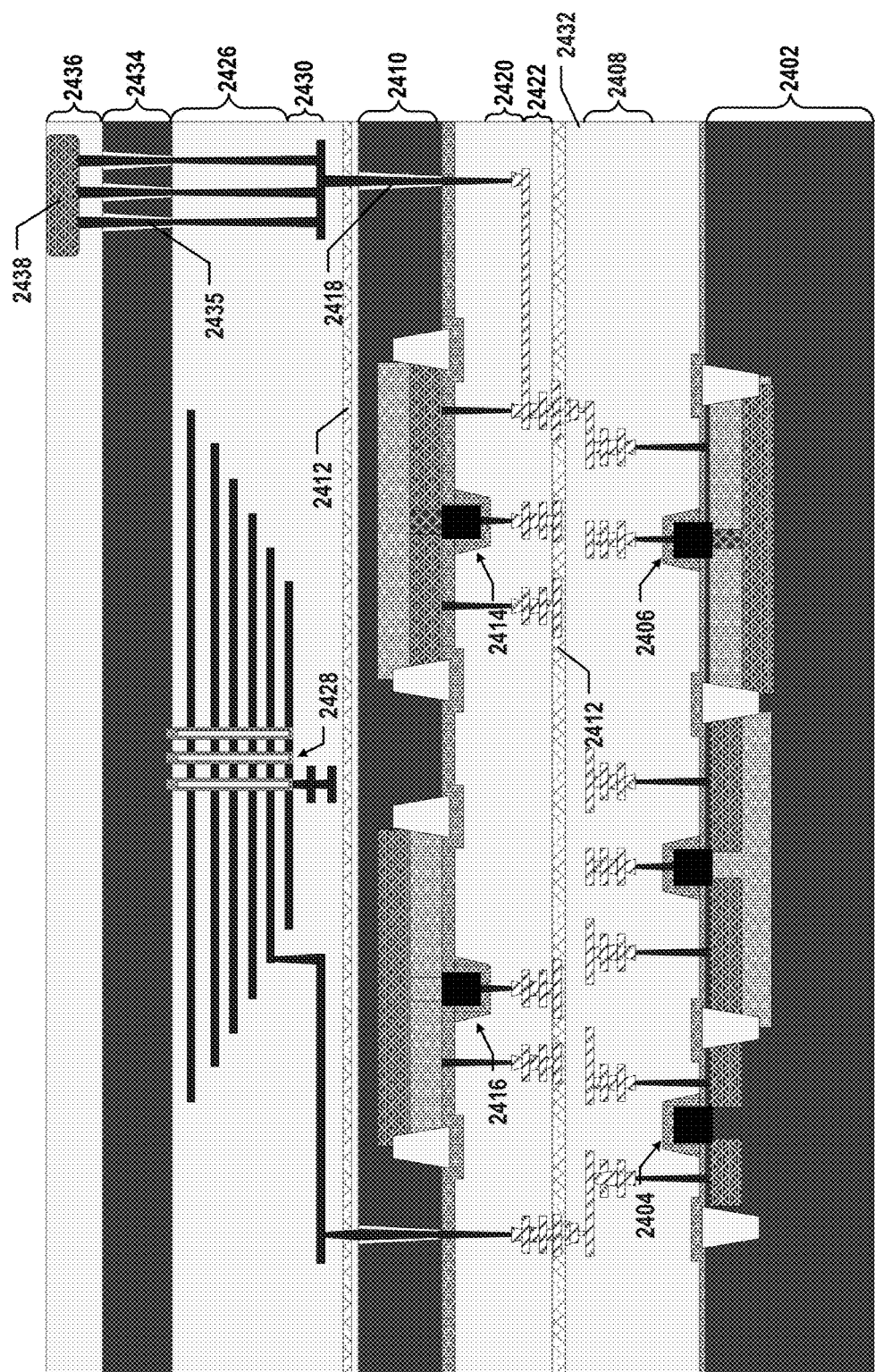

Method 2600 proceeds to operation 2612, as illustrated in FIG. 26, in which the first substrate or the second substrate is thinned. As illustrated in FIG. 24F, silicon substrate 2424 (shown in FIG. 24E) is thinned to become a semiconductor layer 2434 having single crystalline silicon. Silicon substrate 2424 can be thinned by processes including, but not limited to, wafer grinding, dry etch, wet etch, CMP, any other suitable processes, or any combination thereof. It is understood that although not shown in FIG. 24F, in some examples, silicon substrate 2402 may be thinned to become a semiconductor layer having single crystalline silicon.

Method 2600 proceeds to operation 2614, as illustrated in FIG. 26, in which a pad-out interconnect layer is formed. The pad-out interconnect layer can be formed on the thinned second substrate or above the array of NAND memory strings. As illustrated in FIG. 24F, a pad-out interconnect layer 2436 is formed on semiconductor layer 2434 (the thinned silicon substrate 2424) above NAND memory strings 2428. Pad-out interconnect layer 2436 can include interconnects, such as contact pads 2438, formed in one or more ILD layers. Contact pads 2438 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some implementations, after the bonding and thinning, contacts 2435 are formed, extending vertically through semiconductor layer 2434, for example, by wet/dry etching followed by depositing dielectric materials as spacers and conductive materials as conductors. Contacts 2435 can couple contact pads 2438 in pad-out interconnect layer 2436 to the interconnects in interconnect layer 2430. It is understood that in some examples, contacts 2435 may be formed in silicon substrate 2424 before thinning (the formation of semiconductor layer 2434) and be exposed from the backside of silicon substrate 2424 (where the thinning occurs) after the thinning. It is also understood that although not shown in FIG. 24F, in some examples, a pad-out interconnect layer may be formed on the thinned silicon substrate 2402, and contacts may be formed through the thinned silicon substrate 2402 to couple the pad-out interconnect layer and interconnect layer 2408 across the thinned silicon substrate 2402. It is further understood that in some examples, the first substrate (e.g., silicon substrate 2424 or semiconductor layer 2434 after thinning) may be removed and replaced with a semiconductor layer having polysilicon in a similar manner as described above with respect to FIGS. 12G and 12H.

Figure 27:
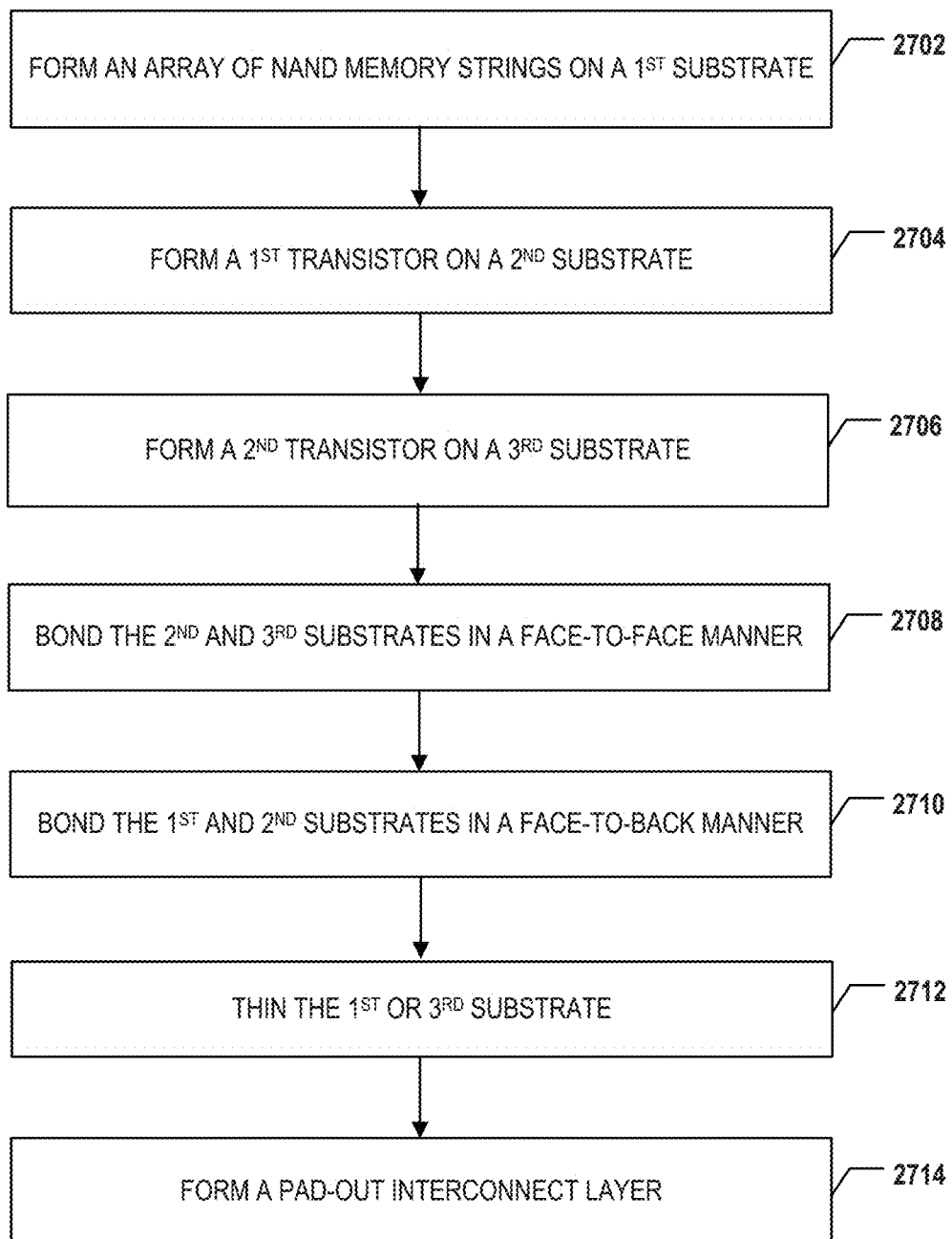
FIG. 27 illustrates a flowchart of a method for forming the 3D memory devices in FIGS. 22A and 22B, according to some aspects of the present disclosure.

FIGS. 25A-25F illustrate another fabrication process for forming the 3D memory devices in FIGS. 22A and 22B, according to some aspects of the present disclosure. FIG. 27 illustrates a flowchart of another method 2700 for forming the 3D memory devices in FIGS. 22A and 22B, according to some aspects of the present disclosure. Examples of the 3D memory devices depicted in FIGS. 25A-25F and 27 include 3D memory devices 2300, 2301, and 2303 depicted in FIGS. 23A-23C. FIGS. 25A-25F and 27 will be described together. It is understood that the operations shown in method 2700 are not exhaustive and that other operations can be performed as well before, after, or between any of the illustrated operations. Further, some of the operations may be performed simultaneously, or in a different order than shown in FIG. 27. For example, operation 2702, 2704, and 2706 may be performed in parallel.

Referring to FIG. 27, method 2700 starts at operation 2702, in which an array of NAND memory strings is formed on a first substrate. The first substrate can be a silicon substrate having single crystalline silicon. In some implementations, to form the array of NAND memory strings, a memory stack is formed on the first substrate.

Figure 25A:
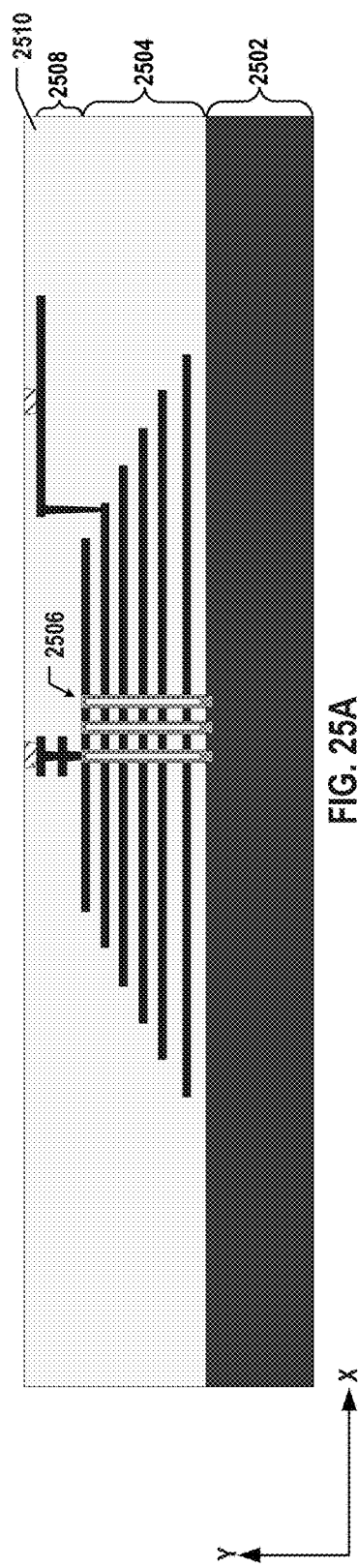
FIGS. 25A-25F illustrate another fabrication process for forming the 3D memory devices in FIGS. 22A and 22B, according to some aspects of the present disclosure.

As illustrated in FIG. 25A, a stack structure, such as a memory stack 2504 including interleaved conductive layers and dielectric layers, is formed on a silicon substrate 2502.

To form memory stack 2504, in some implementations, a dielectric stack (not shown) including interleaved sacrificial layers (not shown) and the dielectric layers is formed on silicon substrate 2502. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. Memory stack 2504 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that memory stack 2504 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between memory stack 2504 and silicon substrate 2502.

As illustrated in FIG. 25A, NAND memory strings 2506 are formed above silicon substrate 2502, each of which extends vertically through memory stack 2504 to be in contact with silicon substrate 2502. In some implementations, fabrication processes to form NAND memory string 2506 include forming a channel hole through memory stack 2504 (or the dielectric stack) and into silicon substrate 2502 using dry etching/and or wet etching, such as DRIE, followed by subsequently filling the channel hole with a plurality of layers, such as a memory film (e.g., a tunneling layer, a storage layer, and a blocking layer) and a semiconductor layer, using thin film deposition processes such as ALD, CVD, PVD, or any combination thereof. It is understood that the details of fabricating NAND memory strings 2506 may vary depending on the types of channel structures of NAND memory strings 2506 (e.g., bottom plug channel structure 812A, sidewall plug channel structure 812B, or bottom open channel structure 812C in FIGS. 8A-8C) and thus, are not elaborated for ease of description.

In some implementations, an interconnect layer is formed above the array of NAND memory strings on the first substrate. The interconnect layer can include a first plurality of interconnects in one or more ILD layers. As illustrated in FIG. 25A, an interconnect layer 2508 is formed above memory stack 2504 and NAND memory strings 2506. Interconnect layer 2508 can include interconnects of MEOL and/or BEOL in a plurality of ILD layers to make electrical connections with NAND memory strings 2506. In some implementations, interconnect layer 2508 includes multiple ILD layers and interconnects therein formed in multiple processes. For example, the interconnects in interconnect layer 2508 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 25A can be collectively referred to as interconnect layer 2508.

In some implementations, a first bonding layer is formed above the array of NAND memory strings. The first bonding layer can include a plurality of first bonding contacts. As illustrated in FIG. 25A, a bonding layer 2510 is formed above interconnect layer 2508. Bonding layer 2510 can include a plurality of bonding contacts surrounded by dielectrics. In some implementations, a dielectric layer is deposited on the top surface of interconnect layer 2508 by one or more thin film deposition processes including, but not limited to, CVD, PVD, ALD, or any combination thereof. The bonding contacts can then be formed through the dielectric layer by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor. It is understood that in some examples, bonding layer 2510 may be a dielectric layer (e.g., a silicon oxide layer) without bonding contacts for fusion bonding, instead of hybrid bonding.

Figure 25B:
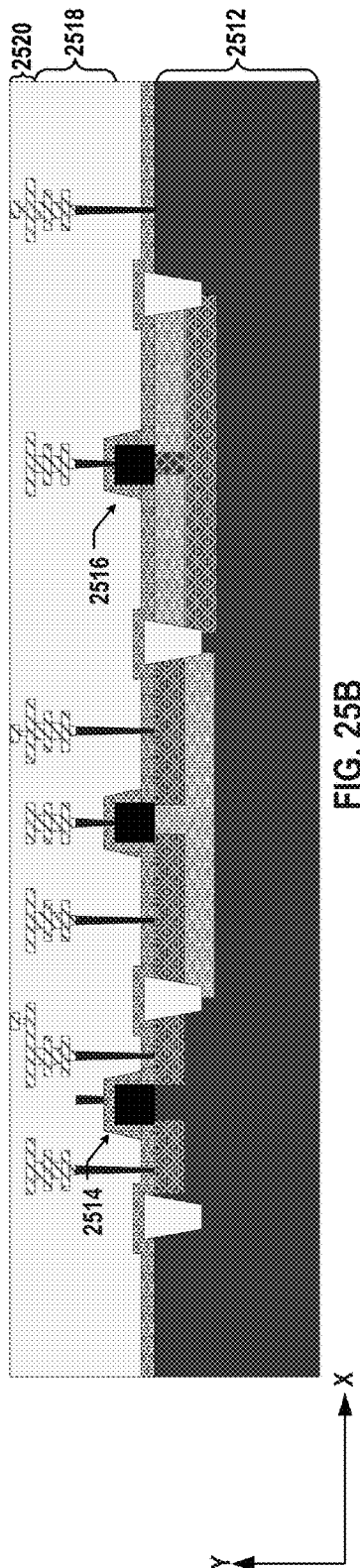

Method 2700 proceeds to operation 2704, as illustrated in FIG. 27, in which a first transistor is formed on a second substrate. The second substrate can be a silicon substrate having single crystalline silicon. As illustrated in FIG. 25B, a plurality of transistors 2514 and 2516 are formed on a silicon substrate 2512. Transistors 2514 and 2516 can be formed by a plurality of processes including, but not limited to, photolithography, dry/wet etch, thin film deposition, thermal growth, implantation, CMP, and any other suitable processes. In some implementations, doped regions are formed in silicon substrate 2512 by ion implantation and/or thermal diffusion, which function, for example, as wells and source/drain regions of transistors 2514 and 2516. In some implementations, isolation regions (e.g., STIs) are also formed in silicon substrate 2512 by wet/dry etch and thin film deposition. In some implementations, the thickness of gate dielectric of transistor 2514 is different from the thickness of gate dielectric of transistor 2516, for example, by depositing a thicker silicon oxide film in the region of transistor 2514 than the region of transistor 2516, or by etching back part of the silicon oxide film deposited in the region of transistor 2516. It is understood that the details of fabricating transistors 2514 and 2516 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer 2518 is formed above the transistor on the second substrate. The interconnect layer can include a plurality of interconnects in one or more ILD layers. As illustrated in FIG. 25B, an interconnect layer 2518 can be formed above transistors 2514 and 2516. Interconnect layer 2518 can include interconnects of MEOL and/or BEOL in a plurality of ILD layers to make electrical connections with transistors 2514 and 2516. In some implementations, interconnect layer 2518 includes multiple ILD layers and interconnects therein formed in multiple processes. For example, the interconnects in interconnect layer 2518 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 25B can be collectively referred to as interconnect layer 2518.

In some implementations, a second bonding layer is formed above interconnect layer. The second bonding layer can include a plurality of second bonding contacts. As illustrated in FIG. 25B, a bonding layer 2520 is formed above interconnect layer 2518. Bonding layer 2520 can include a plurality of bonding contacts surrounded by dielectrics. In some implementations, a dielectric layer is deposited on the top surface of interconnect layer 2518 by one or more thin film deposition processes including, but not limited to, CVD, PVD, ALD, or any combination thereof. The bonding contacts can then be formed through the dielectric layer and in contact with the interconnects in interconnect layer 2518 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

Method 2700 proceeds to operation 2706, as illustrated in FIG. 27, in which a second transistor is formed on a third substrate. The third substrate can be a silicon substrate having single crystalline silicon. In some implementations, any two or all of operations 2702, 2704, and 2706 are performed in parallel to reduce process time.

Figure 25C:
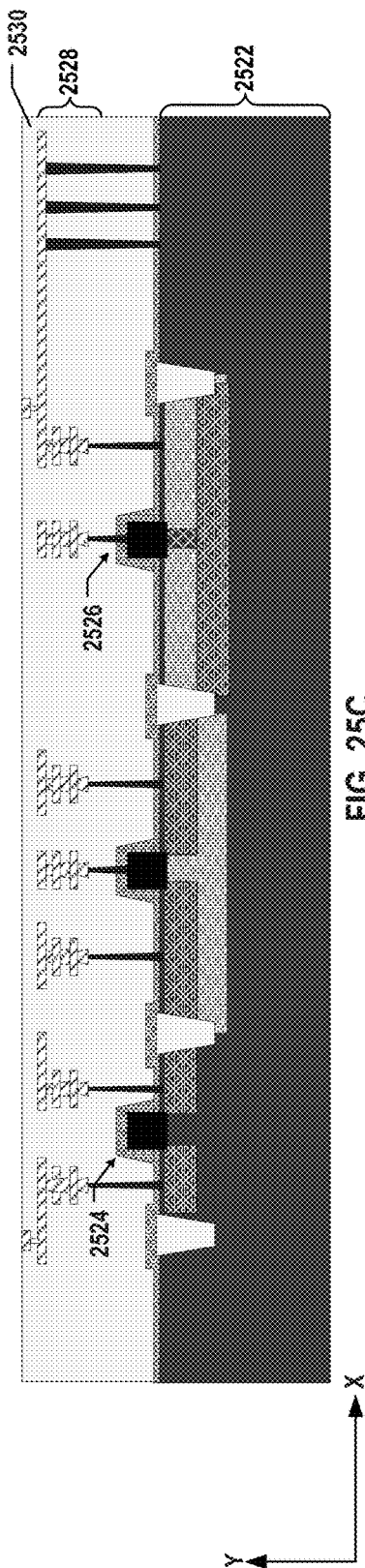

As illustrated in FIG. 25C, a plurality of transistors 2524 and 2526 are formed on a silicon substrate 2522. Transistors 2524 and 2526 can be formed by a plurality of processes including, but not limited to, photolithography, dry/wet etch, thin film deposition, thermal growth, implantation, CMP, and any other suitable processes. In some implementations, doped regions are formed in silicon substrate 2522 by ion implantation and/or thermal diffusion, which function, for example, as wells and source/drain regions of transistors 2524 and 2526. In some implementations, isolation regions (e.g., STIs) are also formed in silicon substrate 2522 by wet/dry etch and thin film deposition. In some implementations, the thickness of gate dielectric of transistor 2524 is different from the thickness of gate dielectric of transistor 2526, for example, by depositing a thicker silicon oxide film in the region of transistor 2524 than the region of transistor 2526, or by etching back part of the silicon oxide film deposited in the region of transistor 2526. It is understood that the details of fabricating transistors 2524 and 2526 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer 2528 is formed above the transistor on the third substrate. The interconnect layer can include a plurality of interconnects in one or more ILD layers. As illustrated in FIG. 25C, an interconnect layer 2528 can be formed above transistors 2524 and 2526. Interconnect layer 2528 can include interconnects of MEOL and/or BEOL in a plurality of ILD layers to make electrical connections with transistors 2524 and 2526. In some implementations, interconnect layer 2528 includes multiple ILD layers and interconnects therein formed in multiple processes. For example, the interconnects in interconnect layer 2528 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 25C can be collectively referred to as interconnect layer 2528.

In some implementations, a third bonding layer is formed above interconnect layer. The third bonding layer can include a plurality of third bonding contacts. As illustrated in FIG. 25C, a bonding layer 2530 is formed above interconnect layer 2530. Bonding layer 2530 can include a plurality of bonding contacts surrounded by dielectrics. In some implementations, a dielectric layer is deposited on the top surface of interconnect layer 2528 by one or more thin film deposition processes including, but not limited to, CVD, PVD, ALD, or any combination thereof. The bonding contacts can then be formed through the dielectric layer and in contact with the interconnects in interconnect layer 2528 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

Method 2700 proceeds to operation 2708, as illustrated in FIG. 27, in which the second substrate and the third substrate are bonded in a face-to-face manner. The second bonding contact in the second bonding layer can be in contact with the third bonding contact in the third bonding layer at a first bonding interface after bonding the first and second substrates. The bonding can include hybrid bonding.

Figure 25D:
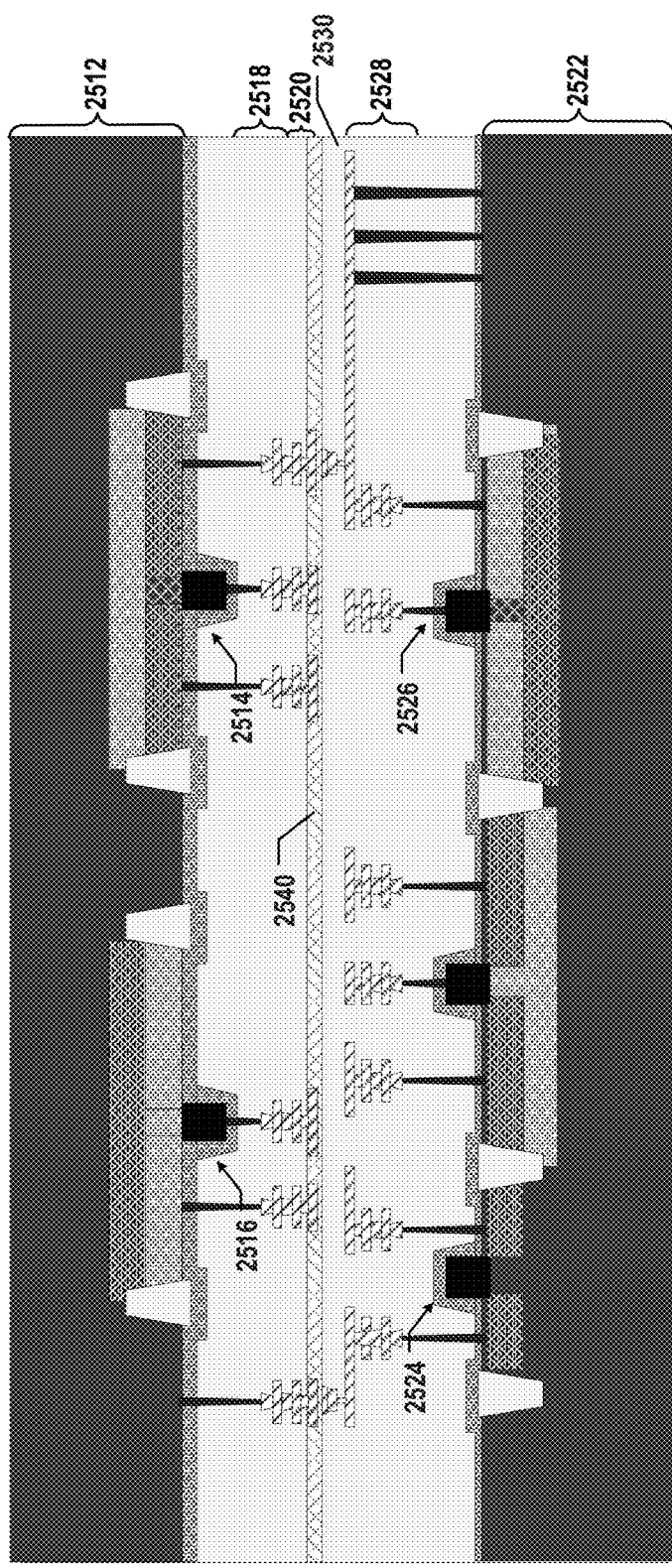

As illustrated in FIG. 25D, silicon substrate 2512 and components formed thereon (e.g., transistors 2514 and 2516) are flipped upside down. Bonding layer 2520 facing down is bonded with bonding layer 2530 facing up, i.e., in a face-to-face manner, thereby forming a bonding interface 2540. That is, silicon substrate 2512 and components formed thereon can be bonded with silicon substrate 2522 and components formed thereon in a face-to-face manner, such that the bonding contacts in bonding layer 2530 are in contact with the bonding contacts in bonding layer 2520 at bonding interface 2540. In some implementations, a treatment process, e.g., plasma treatment, wet treatment and/or thermal treatment, is applied to bonding surfaces prior to bonding. Although not shown in FIG. 25D, it is understood that in some examples, silicon substrate 2522 and components formed thereon (e.g., transistors 2524 and 2526) can be flipped upside down, and bonding layer 2530 facing down can be bonded with bonding layer 2520 facing up, i.e., in a face-to-face manner, thereby forming bonding interface 2540 as well.

As a result of the bonding, e.g., hybrid bonding, the bonding contacts on opposite sides of bonding interface 2540 can be inter-mixed. After the bonding, the bonding contacts in bonding layer 2520 and the bonding contacts in bonding layer 2530 are aligned and in contact with one another, such that transistors 2524 and 2526 can be coupled to transistors 2514 and 2516 through the bonded bonding contacts across bonding interface 2540, according to some implementations.

Figure 25E:
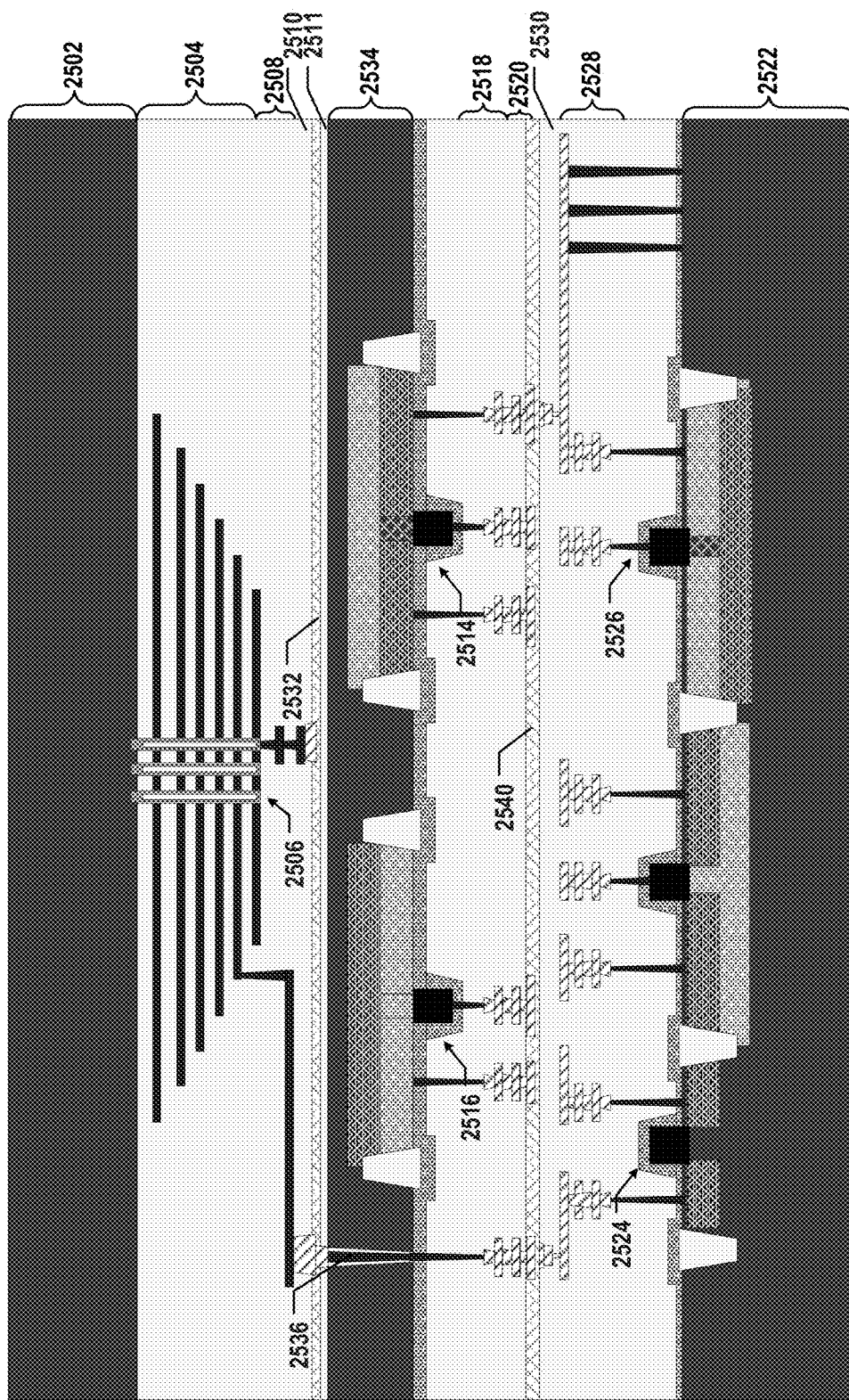

In some implementations, the second substrate is thinned, and a contact through the thinned second substrate is formed. As illustrated in FIG. 25E, silicon substrate 2512 (shown in FIG. 25D) is thinned to become a semiconductor layer 2534 having single crystalline silicon. Silicon substrate 2512 can be thinned by processes including, but not limited to, wafer grinding, dry etch, wet etch, CMP, any other suitable processes, or any combination thereof.

As illustrated in FIG. 25E, one or more contacts 2536 each extending vertically through semiconductor layer 2534 is formed. Contacts 2536 can be coupled to the interconnects in interconnect layer 2518. Contacts 2536 can be formed by first patterning contact holes through semiconductor layer 2534 using patterning process (e.g., photolithography and dry/wet etch of dielectric materials in the dielectric layer). The contact holes can be filled with a conductor (e.g., W or Cu). In some implementations, filling the contact holes includes depositing a spacer (e.g., a silicon oxide layer) before depositing the conductor. It is understood that in some examples, contacts 2536 may be formed in silicon substrate 2512 before thinning (the formation of semiconductor layer 2534, e.g., in FIG. 25B) and be exposed from the backside of silicon substrate 2512 (where the thinning occurs) after the thinning.

In some implementations, a fourth bonding layer is formed on the thinned second substrate. The fourth bonding layer can include a plurality of fourth bonding contacts. As shown in FIG. 25E, a bonding layer 2511 is formed on semiconductor layer 2534, i.e., the backside of silicon substrate 2512 (where the thinning occurs) after the thinning. Bonding layer 2511 can include a plurality of bonding contacts surrounded by dielectrics. In some implementations, a dielectric layer is deposited on the surface of semiconductor layer 2534 by one or more thin film deposition processes including, but not limited to, CVD, PVD, ALD, or any combination thereof. The bonding contacts can then be formed through the dielectric layer and in contact with contacts 2536 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor. It is understood that in some examples, bonding layer 2511 may be a dielectric layer (e.g., a silicon oxide layer) without bonding contacts for fusion bonding, instead of hybrid bonding. It is further understood that in some examples, the bonding layer may be omitted to expose the silicon surface of semiconductor layer 2534 for anodic bonding or fusion bonding, instead of hybrid bonding.

Method 2700 proceeds to operation 2710, as illustrated in FIG. 15, in which the first substrate and the second substrate are bonded in a face-to-back manner. The first bonding contact in the first bonding layer can be in contact with the fourth bonding contact in the fourth bonding layer at a second bonding interface after bonding the third and second substrates. The bonding can include hybrid bonding.

As illustrated in FIG. 25E, silicon substrate 2502 and components formed thereon (e.g., memory stack 2504 and NAND memory strings 2506) are flipped upside down. Bonding layer 2510 on interconnect layer 2508 facing down is bonded with bonding layer 2511 on semiconductor layer 2534 facing up, i.e., in a face-to-back manner, thereby forming a bonding interface 2532. That is, silicon substrate 2502 and components formed thereon can be bonded with thinned silicon substrate 2512 (i.e., semiconductor layer 2534) and components formed thereon after bonding with silicon 2522 in a face-to-back manner at bonding interface 2532. In some implementations, a treatment process, e.g., plasma treatment, wet treatment and/or thermal treatment, is applied to bonding surfaces prior to bonding. Although not shown in FIG. 25E, it is understood that in some examples, silicon substrate 2512 and components formed thereon (e.g., transistors 2516, 2514, 2524, and 2526) can be flipped upside down, and the bonding layer on semiconductor layer 2534 facing down can be bonded with the bonding layer on interconnect layer 2508 facing up, i.e., in a face-to-face manner, thereby forming bonding interface 2532 as well.

As a result of the bonding, e.g., hybrid bonding, the bonding contacts on opposite sides of bonding interface 2532 can be inter-mixed. After the bonding, the bonding contacts in bonding layer 2510 on interconnect layer 2508 and the bonding contacts in bonding layer 2511 on semiconductor layer 2534 are aligned and in contact with one another, such that memory stack 2504 and NAND memory strings 2506 can be coupled to transistors 2514, 2516, 2524, and 2526 through contacts 2536 through semiconductor layer 2534 and the bonded bonding contacts across bonding interface 2540, according to some implementations. It is understood that in some examples, anodic bonding or fusion bonding, instead of hybrid bonding, may be performed to bond silicon substrate 2502 and thinned silicon substrate 2512 (and components formed thereon) at bonding interface 2532 without bonding contacts in the bonding layers. It is further understood that in some examples, silicon substrate 2522, instead of silicon substrate 2512, may be thinned and bonded with silicon substrate 2502 in a similar face-to-back manner as described above.

Figure 25F:
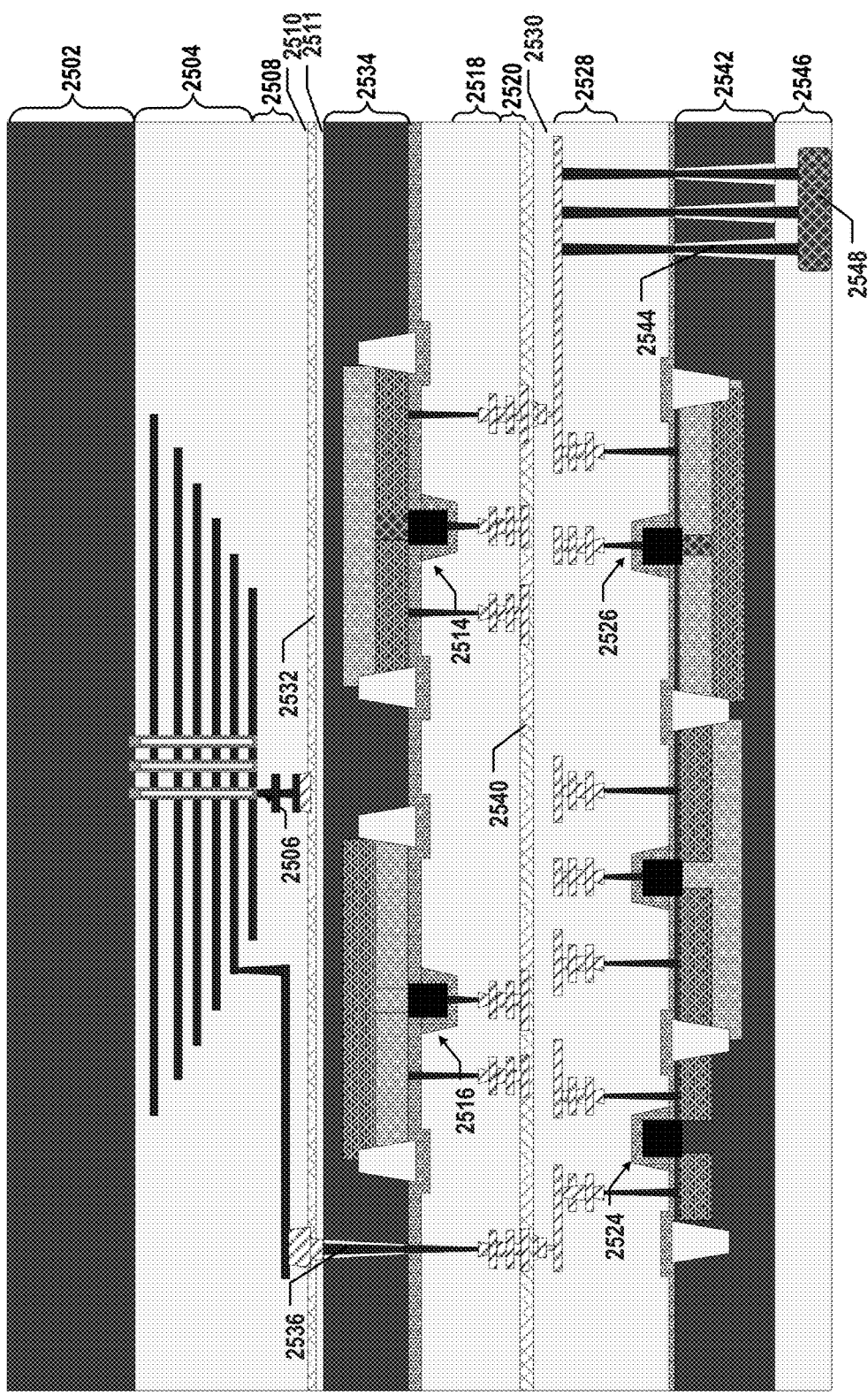

Method 2700 proceeds to operation 2712, as illustrated in FIG. 27, in which the first substrate or the third substrate is thinned. As illustrated in FIG. 25F, silicon substrate 2522 (shown in FIG. 25E) is thinned to become a semiconductor layer 2542 having single crystalline silicon. Silicon substrate 2522 can be thinned by processes including, but not limited to, wafer grinding, dry etch, wet etch, CMP, any other suitable processes, or any combination thereof. It is understood that although not shown in FIG. 25F, in some examples, silicon substrate 2502 may be thinned to become a semiconductor layer having single crystalline silicon.

Method 2700 proceeds to operation 2714, as illustrated in FIG. 27, in which a pad-out interconnect layer is formed. The pad-out interconnect layer can be formed on the thinned third substrate or above the array of NAND memory strings. As illustrated in FIG. 25F, a pad-out interconnect layer 2546 is formed on semiconductor layer 2542 (the thinned silicon substrate 2522). Pad-out interconnect layer 2546 can include interconnects, such as contact pads 2548, formed in one or more ILD layers. Contact pads 2548 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some implementations, after the bonding and thinning, contacts 2544 are formed, extending vertically through semiconductor layer 2542, for example, by wet/dry etching followed by depositing dielectric materials as spacers and conductive materials as conductors. Contacts 2544 can couple contact pads 2548 in pad-out interconnect layer 2546 to the interconnects in interconnect layer 2528. It is understood that in some examples, contacts 2544 may be formed in silicon substrate 2522 before thinning (the formation of semiconductor layer 2542, e.g., in FIG. 25C) and be exposed from the backside of silicon substrate 2522 (where the thinning occurs) after the thinning. It is further understood that although not shown in FIG. 25F, in some examples, a pad-out interconnect layer may be formed on the thinned silicon substrate 2502 above NAND memory strings 2506, and contacts may be formed through the thinned silicon substrate 2502 to couple the pad-out interconnect layer and interconnect layer 2508 across the thinned silicon substrate 2502.

Figure 28A:
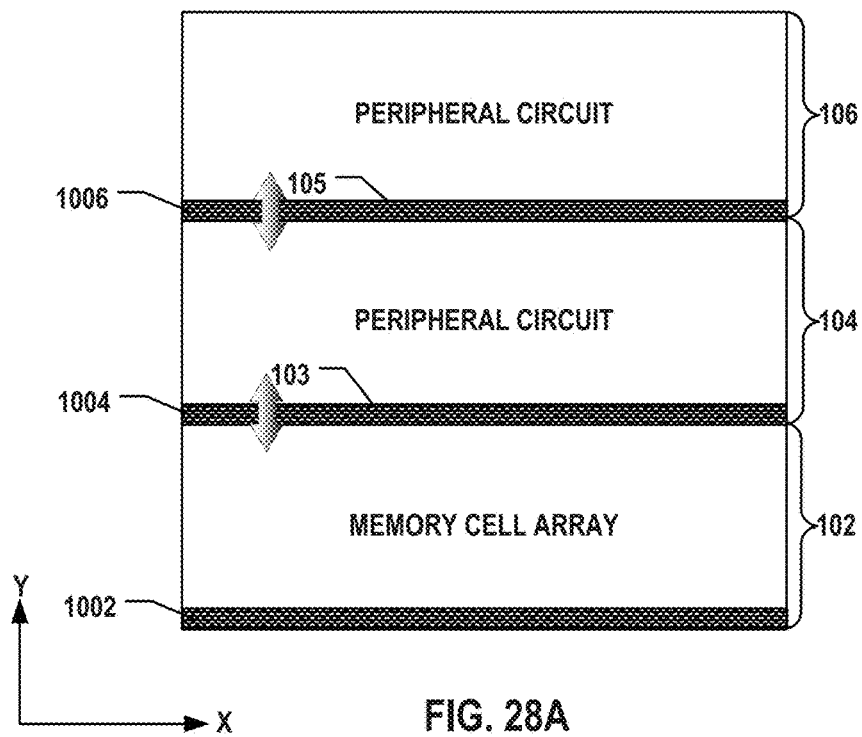
FIGS. 28A and 28B illustrate schematic views of cross-sections of the 3D memory devices in FIGS. 9A and 9B, according to various aspects of the present disclosure.
Figure 28B:
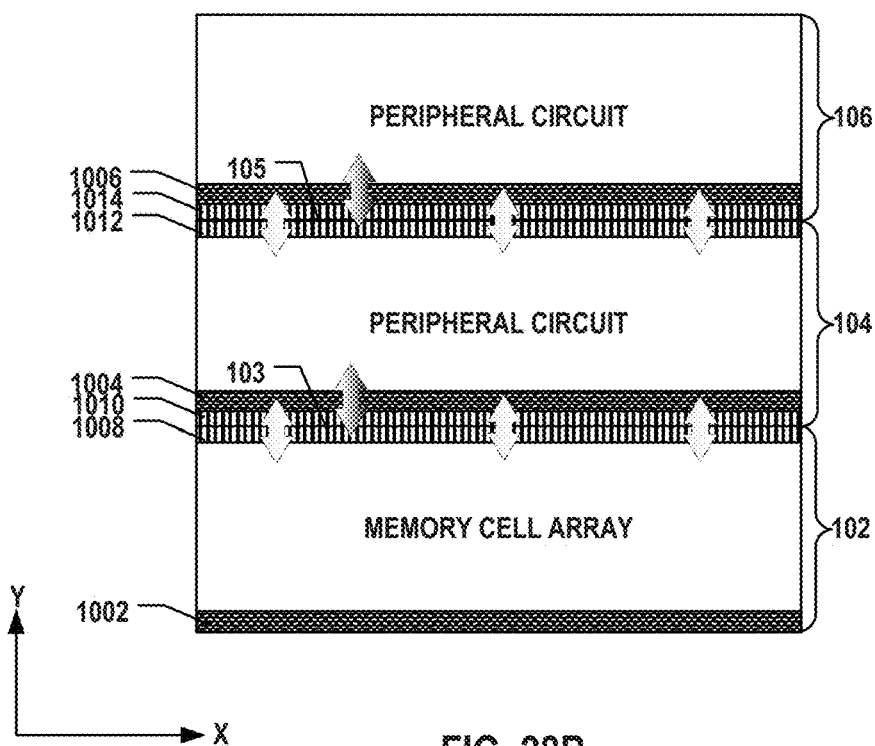

FIGS. 28A and 28B illustrate schematic views of cross-sections of the 3D memory devices in FIGS. 9A and 9B, according to various aspects of the present disclosure. 3D memory devices 2800 and 2801 may be examples of 3D memory devices 900 and 901 in FIGS. 9A and 9B. As shown in FIG. 28A, 3D memory device 2800 can include stacked first, second, and third semiconductor structures 102, 104, and 106. In some implementations, first semiconductor structure 102 on one side of 3D memory device 2800 includes semiconductor layer 1002 and a memory cell array vertically between semiconductor layer 1002 and bonding interface 103. The memory cell array can include an array of NAND memory strings (e.g., NAND memory strings 208 disclosed herein), and the sources of the array of NAND memory strings can be in contact with semiconductor layer 1002 (e.g., as shown in FIGS. 8A-8C). Semiconductor layer 1002 can include semiconductor materials, such as single crystalline silicon (e.g., a silicon substrate or a thinned silicon substrate) or polysilicon (e.g., a deposited layer), for example, depending on the types of channel structures of the NAND memory strings (e.g., bottom plug channel structure 812A, sidewall plug channel structure 812B, or bottom open channel structure 812C).

In some implementations, second semiconductor structure 104 in the intermediate of 3D memory device 2800 includes a semiconductor layer 1004 and some of the peripheral circuits of the memory cell array. In some implementations, bonding interface 103 is disposed vertically between semiconductor layer 1004 and the peripheral circuits of second semiconductor structure 104. The transistors (e.g., planar transistors 500 and 3D transistors 600) of the peripheral circuits can be in contact with semiconductor layer 1004. Semiconductor layer 1004 can include semiconductor materials, such as single crystalline silicon (e.g., a layer transferred from a silicon substrate or an SOI substrate). It is understood that in some examples, different from semiconductor layer 1002 in first semiconductor structure 102, semiconductor layer 1004 on which the transistors are formed may include single crystalline silicon, but not polysilicon, due to the superior carrier mobility of single crystalline silicon that is desirable for transistors' performance. Bonding interface 103 between first and second semiconductor structures 102 and 104 may result from transfer bonding. Through contacts (e.g., ILVs/TSVs) across bonding interface 103 and through semiconductor layer 1004 vertically between first and second semiconductor structures 102 and 104 can make direct, short-distance (e.g., submicron-level) electrical connections between adjacent semiconductor structures 102 and 104.

In some implementations, third semiconductor structure 106 on another side of 3D memory device 2800 includes a semiconductor layer 1006 and some of the peripheral circuits of the memory cell array. In some implementations, bonding interface 105 is disposed vertically between semiconductor layer 1006 and the peripheral circuits of third semiconductor structure 106. The transistors (e.g., planar transistors 500 and 3D transistors 600) of the peripheral circuits can be in contact with semiconductor layer 1006. Semiconductor layer 1006 can include semiconductor materials, such as single crystalline silicon (e.g., a layer transferred from a silicon substrate or an SOI substrate). It is understood that in some examples, different from semiconductor layer 1002 in first semiconductor structure 102, semiconductor layer 1006 on which the transistors are formed may include single crystalline silicon, but not polysilicon, due to the superior carrier mobility of single crystalline silicon that is desirable for transistors' performance. Bonding interface 105 between third and second semiconductor structures 106 and 104 may result from transfer bonding. Through contacts (e.g., ILVs/TSVs) across bonding interface 105 and through semiconductor layer 1006 vertically between third and second semiconductor structures 106 and 104 can make direct, short-distance (e.g., submicron-level) electrical connections between adjacent semiconductor structures 106 and 104.

It is understood that in some examples, first and second semiconductor structures 102 and 104 may also include bonding layers 1008 and 1010, respectively, disposed on opposite sides of bonding interface 103, and third and second semiconductor structures 106 and 104 may also include bonding layers 1014 and 1012, respectively, disposed on opposite sides of bonding interface 105, as shown in FIG. 28B. In FIG. 28B, second semiconductor structure 104 of a 3D memory device 2801 can include two bonding layers 1010 and 1012 on two sides thereof. Bonding layer 1010 can be disposed vertically between semiconductor layer 1004 and bonding interface 103, and bonding layer 1012 can be disposed vertically between the peripheral circuits of second semiconductor structure 104 and bonding interface 105. First semiconductor structure 102 of 3D memory device 2801 can include bonding layer 1008 disposed vertically between bonding interface 103 and semiconductor layer 1002. Third semiconductor structure 106 of 3D memory device 2801 can include bonding layer 1014 disposed vertically between bonding interface 105 and semiconductor layer 1006. Each bonding layer 1008, 1010, 1012, or 1014 can include conductive bonding contacts (not shown) and dielectrics electrically isolating the bonding contacts. The bonding contacts of bonding layer 1008 can be in contact with the bonding contacts of bonding layer 1010 at bonding interface 103. As a result, bonding contacts across bonding interface 103 in conjunction with through contacts (e.g., ILVs/TSVs) through semiconductor layer 1004 can make direct, short-distance (e.g., micron-level) electrical connections between adjacent semiconductor structures 102 and 104. Similarly, the bonding contacts of bonding layer 1012 can be in contact with the bonding contacts of bonding layer 1014 at bonding interface 105. As a result, bonding contacts across bonding interface 105 in conjunction with through contacts (e.g., ILVs/TSVs) through semiconductor layer 1006 can make direct, short-distance (e.g., micron-level) electrical connections between adjacent semiconductor structures 106 and 104.

As shown in FIGS. 28A and 28B, since third and second semiconductor structures 106 and 104 are bonded in a back-to-face manner (e.g., semiconductor layers 1006 and 1004 being disposed on the bottom sides of third and second semiconductor structures 106 and 104, respectively, in FIGS. 28A and 28B), the transistors in third semiconductor structure 106 and the transistors in second semiconductor structure 104 face toward the same direction (e.g., the positive y-direction in FIGS. 28A and 28B), according to some implementations. In some implementations, semiconductor layer 1004 is disposed vertically between the transistors of the peripheral circuits in second semiconductor structure 104 and bonding interface 103, and semiconductor layer 1006 is disposed vertically between the transistors of the peripheral circuits in third semiconductor structure 106 and bonding interface 105. Moreover, since first and second semiconductor structures 102 and 104 are bonded in a face-to-back manner (e.g., semiconductor layers 1002 and 1004 being disposed on the bottom sides of first and second semiconductor structures 102 and 104, respectively, in FIGS. 28A and 228), the transistors of peripheral circuits in second and third semiconductor structures 104 and 106 and the memory cell array in first semiconductor structure 102 face toward the same direction (e.g., the positive y-direction in FIGS. 28A and 28B), according to some implementations. It is understood that pad-out interconnect layer 902 in FIG. 9A or 9B is omitted from 3D memory devices 2800 and 2801 in FIGS. 28A and 28B for ease of illustration and may be included in 3D memory devices 2800 and 2801 as described above with respect to FIGS. 9A and 9B.

As described above, second and third semiconductor structures 104 and 106 can have peripheral circuits having transistors with different applied voltages. For example, third semiconductor structure 106 may be one example of semiconductor structure 408 including LLV circuits 402 (and LV circuits 404 in some examples) in FIG. 4B, and second semiconductor structure 104 may be one example of semiconductor structure 410 including HV circuits 406 (and LV circuits 404 in some examples) in FIG. 4B, or vice versa. Thus, in some implementations, semiconductor layers 1006 and 1004 in third and second semiconductor structures 106 and 104 have different thicknesses to accommodate the transistors with different applied voltages. In one example, second semiconductor structure 104 may include HV circuits 406 and third semiconductor structure 106 may include LLV circuits 402, and the thickness of semiconductor layer 1004 in second semiconductor structure 104 may be larger than the thickness of semiconductor layer 1006 in third semiconductor structure 106. Moreover, in some implementations, the gate dielectrics of the transistors in third and second semiconductor structures 106 and 104 have different thicknesses as well to accommodate the different applied voltages. In one example, second semiconductor structure 104 may include HV circuits 406 and third semiconductor structure 106 may include LLV circuits 402, and the thickness of the gate dielectrics of the transistors in second semiconductor structure 104 may be larger (e.g., at least 5-fold) than the thickness of the gate dielectrics of the transistors in third semiconductor structure 106.

Figure 29A:
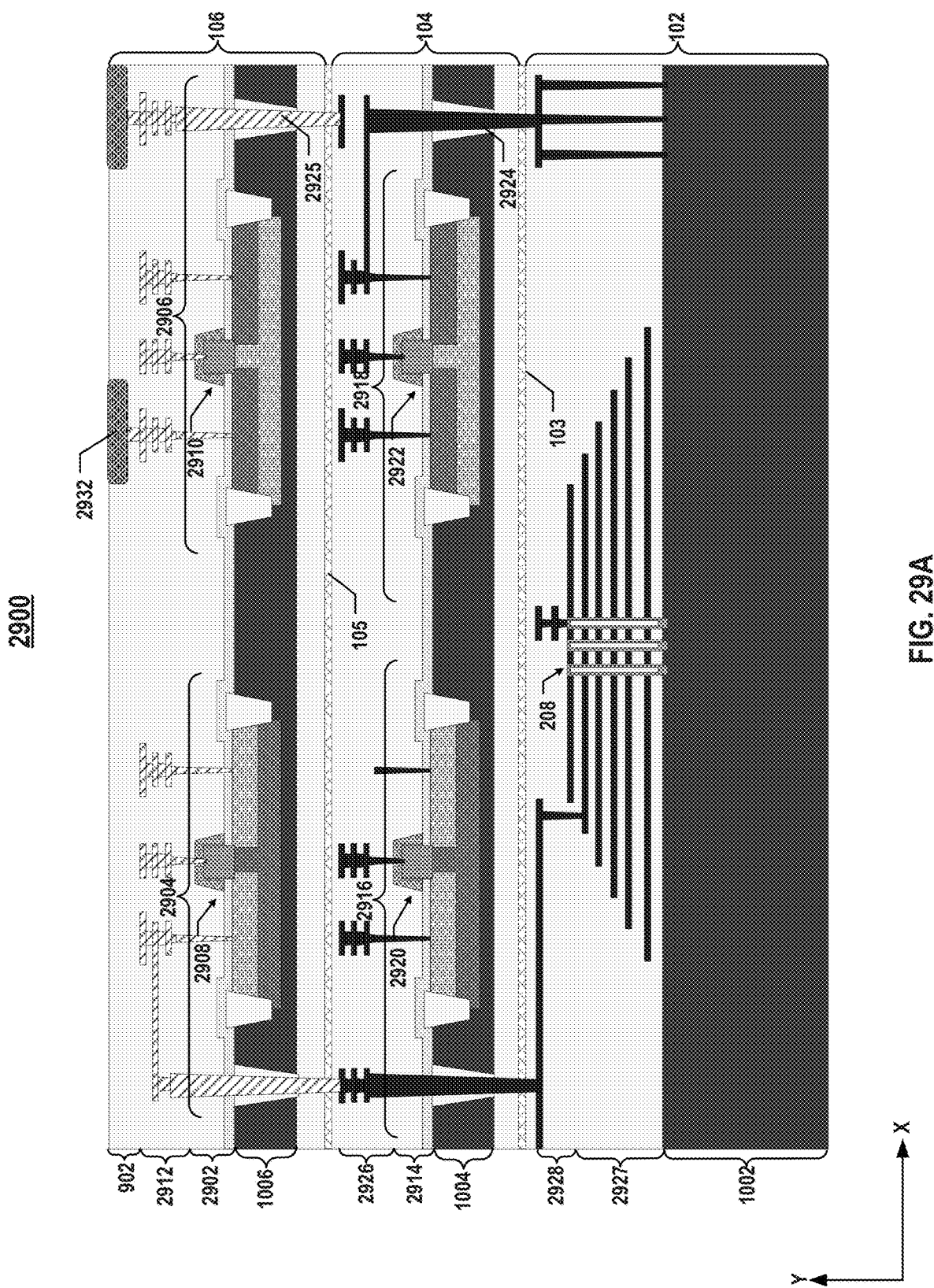
FIGS. 29A and 29B illustrate side views of various examples of the 3D memory devices in FIGS. 28A and 28B, according to various aspects of the present disclosure.
Figure 29B:
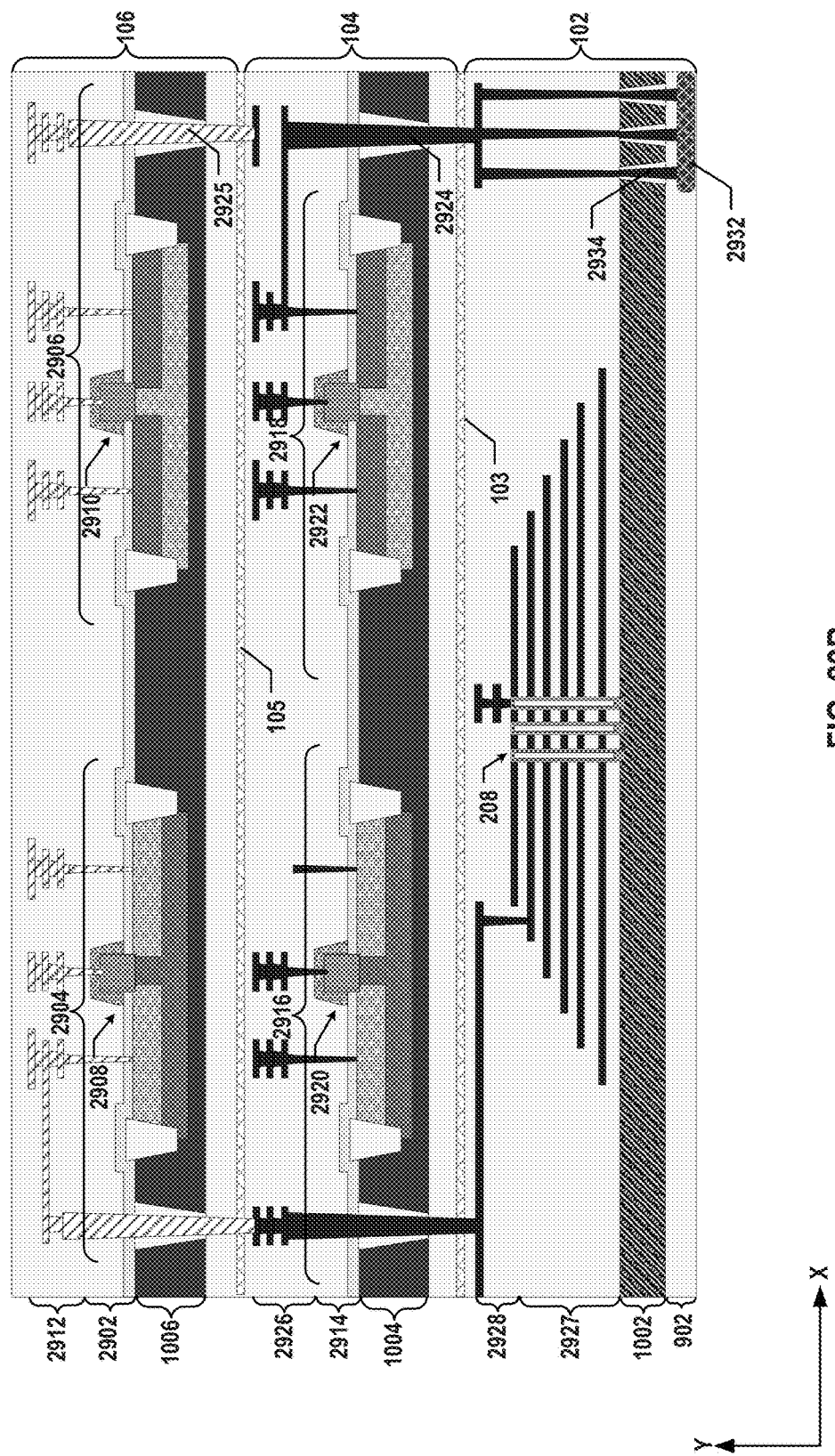

FIGS. 29A and 29B illustrate side views of various examples of 3D memory devices 2800 and 2801 in FIGS. 28A and 28B, according to various aspects of the present disclosure. As shown in FIG. 29A, as one example of 3D memory devices 2800 and 2801 in FIGS. 28A and 28B, 3D memory device 2900 is a bonded chip including first semiconductor structure 102, second semiconductor structure 104, and third semiconductor structure 106, which are stacked over one another in different planes in the vertical direction (e.g., the y-direction in FIG. 29A), according to some implementations. First and second semiconductor structures 102 and 104 are bonded at bonding interface 103 therebetween, and second and third semiconductor structures 104 and 106 are bonded at bonding interface 105 therebetween, according to some implementations.

As shown in FIG. 29A, first semiconductor structure 102 can include semiconductor layer 1002 having semiconductor materials. In some implementations, semiconductor layer 1006 is a silicon substrate having single crystalline silicon. First semiconductor structure 102 can include a memory cell array, such as an array of NAND memory strings 208 on semiconductor layer 1002. The sources of NAND memory strings 208 can be in contact with semiconductor layer 1002. In some implementations, NAND memory strings 208 are disposed vertically between bonding interface 103 and semiconductor layer 1002. Each NAND memory string 208 extends vertically through a plurality of pairs each including a conductive layer and a dielectric layer, according to some implementations. The stacked and interleaved conductive layers and dielectric layers are also referred to herein as a stack structure, e.g., a memory stack 2927. Memory stack 2927 may be an example of memory stack 804 in FIGS. 8A-8C, and the conductive layer and dielectric layer in memory stack 2927 may be examples of gate conductive layers 806 and dielectric layer 808, respectively, in memory stack 804. The interleaved conductive layers and dielectric layers in memory stack 2927 alternate in the vertical direction, according to some implementations. Each conductive layer can include a gate electrode (gate line) surrounded by an adhesive layer and a gate dielectric layer. The gate electrode of the conductive layer can extend laterally as a word line, ending at one or more staircase structures of memory stack 2927. It is understood that in some examples, trench isolations and doped regions (not shown) may be formed in semiconductor layer 1002 as well.

In some implementations, each NAND memory string 208 is a "charge trap" type of NAND memory string including any suitable channel structures disclosed herein, such as bottom plug channel structure 812A, sidewall plug channel structure 812B, or bottom open channel structure 812C, described above in detail with respect to FIGS. 8A-8C. It is understood that NAND memory strings 208 are not limited to the "charge trap" type of NAND memory strings and may be "floating gate" type of NAND memory strings in other examples.

As shown in FIG. 29A, first semiconductor structure 102 can further include an interconnect layer 2928 above and in contact with NAND memory strings 208 to transfer electrical signals to and from NAND memory strings 208. Interconnect layer 2928 can include a plurality of interconnects, such as MEOL interconnects and BEOL interconnects. In some implementations, the interconnects in interconnect layer 2928 also include local interconnects, such as bit line contacts and word line contacts. Interconnect layer 2928 can further include one or more ILD layers in which the lateral lines and vias can form. The interconnects in interconnect layer 2928 can include conductive materials including, but not limited to 2928 W, Co, Cu, Al, silicides, or any combination thereof. The ILD layers in interconnect layer 1128 can include dielectric materials including, but not limited to, silicon oxide, silicon nitride, silicon oxynitride, low-k dielectrics, or any combination thereof.

Second semiconductor structure 104 can be bonded on top of first semiconductor structure 102 in a back-to-face manner at bonding interface 103. Second semiconductor structure 104 can include semiconductor layer 1004 having semiconductor materials. In some implementations, semiconductor layer 1004 is a layer of single crystalline silicon transferred from a silicon substrate or a SOI substrate and attached to the top surface of first semiconductor structure 102 by transfer bonding. In some implementations, bonding interface 103 is disposed vertically between interconnect layer 2928 and semiconductor layer 1004 as a result of transfer bonding, which transfers semiconductor layer 1004 from another substrate and bonds semiconductor layer 1004 onto first semiconductor structure 102 as described below in detail. In some implementations, bonding interface 103 is the place at which interconnect layer 2928 and semiconductor layer 1004 are met and bonded. In practice, bonding interface 103 can be a layer with a certain thickness that includes the top surface of interconnect layer 2928 of first semiconductor structure 102 and the bottom surface of semiconductor layer 1004 of second semiconductor structure 104. In some implementations, dielectric layer(s) (e.g., silicon oxide layer) are formed vertically between bonding interface 105 and semiconductor layer 1004 and/or between bonding interface 105 and interconnect layer 2928 to facilitate the transfer bonding of semiconductor layer 1004 onto interconnect layer 1112. Thus, it is understood that bonding interface 103 may include the surfaces of the dielectric layer(s) in some examples.

As shown in FIG. 29A, second semiconductor structure 104 can also include a device layer 2914 above and in contact with semiconductor layer 1006. In some implementations, device layer 2914 includes a first peripheral circuit 2916 and a second peripheral circuit 2918. First peripheral circuit 2916 can include HV circuits 406, such as driving circuits (e.g., string drivers 704 in row decoder/word line driver 308 and drivers in column decoder/bit line driver 306), and second peripheral circuit 2918 can include LV circuits 404, such as page buffer circuits (e.g., page buffer circuits 702 in page buffer 304) and logic circuits (e.g., in control logic 312). In some implementations, first peripheral circuit 2916 includes a plurality of transistors 2920 in contact with semiconductor layer 1004, and second peripheral circuit 2918 includes a plurality of transistors 2922 in contact with semiconductor layer 1006. Transistors 2920 and 2922 can include any transistors disclosed herein, such as planar transistors 500 and 3D transistors 600. As described above in detail with respect to transistors 500 and 600, in some implementations, each transistor 2920 or 2922 includes a gate dielectric, and the thickness of the gate dielectric of transistor 2920 (e.g., in HV circuit 406) is larger than the thickness of the gate dielectric of transistor 2922 (e.g., in LV circuit 404) due to the higher voltage applied to transistor 2920 than transistor 2922. Trench isolations (e.g., STIs) and doped regions (e.g., wells, sources, and drains of transistors 2920 and 2922) can be formed on or in semiconductor layer 1004 as well.

In some implementations, second semiconductor structure 104 further includes an interconnect layer 2926 above device layer 2914 to transfer electrical signals to and from peripheral circuits 2916 and 2918. As shown in FIG. 29A, interconnect layer 2926 can be vertically between bonding interface 105 and device layer 2914 (including transistors 2920 and 2922 of peripheral circuits 2916 and 2918). Interconnect layer 2926 can include a plurality of interconnects, such as MEOL interconnects and BEOL interconnects. The interconnects in interconnect layer 2926 can be coupled to transistors 2920 and 2922 of peripheral circuits 2916 and 2918 in device layer 2914. Interconnect layer 2926 can further include one or more ILD layers in which the lateral lines and vias can form. That is, interconnect layer 2926 can include lateral lines and vias in multiple ILD layers. In some implementations, the devices in device layer 2914 are coupled to one another through the interconnects in interconnect layer 2926. For example, peripheral circuit 2916 may be coupled to peripheral circuit 2918 through interconnect layer 2926. The interconnects in interconnect layer 2926 can include conductive materials including, but not limited to, W, Co, Cu, Al, silicides, or any combination thereof. The ILD layers in interconnect layer 2926 can include dielectric materials including, but not limited to, silicon oxide, silicon nitride, silicon oxynitride, low-k dielectrics, or any combination thereof. In some implementations, the interconnects in interconnect layer 2926 include W, which has a relatively high thermal budget (compatible with high-temperature processes) and good quality (fewer detects, e.g., voids) among conductive metal materials.

As shown in FIG. 29A, second semiconductor structure 104 can further include one or more contacts 2924 extending vertically through semiconductor layer 1004. In some implementations, contact 2924 couples the interconnects in interconnect layer 2926 to the interconnects in interconnect layer 2928 to make an electrical connection across bonding interface 103 between second and first semiconductor structures 104 and 102. Contact 2924 can include conductive materials including, but not limited to, W, Co, Cu, Al, silicides, or any combination thereof. In some implementations, contact 2924 includes W. In some implementations, contact 2924 includes a via surrounded by a dielectric spacer (e.g., having silicon oxide) to electrically separate the via from semiconductor layer 1004. Depending on the thickness of semiconductor layer 1004, contact 2924 can be an ILV having a depth in the submicron-level (e.g., between 10 nm and 1 μm), or a TSV having a depth in the micron- or tens micron-level (e.g., between 1 μm and 100 μm).

Third semiconductor structure 106 can be bonded on top of second semiconductor structure 104 in a back-to-face manner at bonding interface 105. Third semiconductor structure 106 can include semiconductor layer 1006 having semiconductor materials. In some implementations, semiconductor layer 1006 is a layer of single crystalline silicon transferred from a silicon substrate or an SOI substrate and attached to the top surface of second semiconductor structure 104 by transfer bonding. In some implementations, bonding interface 105 is disposed vertically between interconnect layer 2926 and semiconductor layer 1006 as a result of transfer bonding, which transfers semiconductor layer 1006 from another substrate and bonds semiconductor layer 1006 onto second semiconductor structure 104 as described below in detail. In some implementations, bonding interface 105 is the place at which interconnect layer 2926 and semiconductor layer 1006 are met and bonded. In practice, bonding interface 105 can be a layer with a certain thickness that includes the top surface of interconnect layer 2926 of second semiconductor structure 104 and the bottom surface of semiconductor layer 1006 of third semiconductor structure 106. In some implementations, dielectric layer(s) (e.g., silicon oxide layer) are formed vertically between bonding interface 105 and semiconductor layer 1006 and/or between bonding interface 105 and interconnect layer 2926 to facilitate the transfer bonding of semiconductor layer 1006 onto interconnect layer 2926. Thus, it is understood that bonding interface 105 may include the surfaces of the dielectric layer(s) in some examples.

Third semiconductor structure 106 can include a device layer 2902 above and in contact with semiconductor layer 1006. In some implementations, device layer 2902 includes a third peripheral circuit 2904 and a fourth peripheral circuit 2906. Third peripheral circuit 2904 can include LLV circuits 402, such as I/O circuits (e.g., in interface 316 and data bus 318), and fourth peripheral circuit 2906 can include LV circuits 404, such as page buffer circuits (e.g., page buffer circuits 702 in page buffer 304) and logic circuits (e.g., in control logic 312). In some implementations, third peripheral circuit 2904 includes a plurality of transistors 2908, and fourth peripheral circuit 2906 includes a plurality of transistors 2910 as well. Transistors 2908 and 2910 can include any transistors disclosed herein, such as planar transistors 500 and 3D transistors 600. As described above in detail with respect to transistors 500 and 600, in some implementations, each transistor 2908 or 2910 includes a gate dielectric, and the thickness of the gate dielectric of transistor 2908 (e.g., in LLV circuit 402) is smaller than the thickness of the gate dielectric of transistor 2910 (e.g., in LV circuit 404) due to the lower voltage applied to transistor 2908 than transistor 2910. Trench isolations (e.g., STIs) and doped regions (e.g., wells, sources, and drains of transistors 2908 and 2910) can be formed on or in semiconductor layer 1006 as well.

Moreover, the different voltages applied to different transistors 2920, 2922, 2908, and 2910 in second and third semiconductor structures 104 and 106 can lead to differences of device dimensions between second and third semiconductor structures 104 and 106. In some implementations, the thickness of the gate dielectric of transistor 2920 (e.g., in HV circuit 406) is larger than the thickness of the gate dielectric of transistor 2908 (e.g., in LLV circuit 402) due to the higher voltage applied to transistor 2920 than transistor 2908. In some implementations, the thickness of the gate dielectric of transistor 2922 (e.g., in LV circuit 404) is the same as the thickness of the gate dielectric of transistor 2910 (e.g., in LV circuit 404) due to the same voltage applied to transistor 2922 and transistor 2910. In some implementations, the thickness of semiconductor layer 1004 in which transistor 2920 (e.g., in HV circuit 406) is formed is larger than the thickness of semiconductor layer 1006 in which transistor 2908 (e.g., in LLV circuit 402) is formed due to the higher voltage applied to transistor 2920 than transistor 2908.

As shown in FIG. 29A, third semiconductor structure 106 can further include an interconnect layer 2912 above device layer 2902 to transfer electrical signals to and from peripheral circuits 2904 and 2906. As shown in FIG. 29A, device layer 1114 (including transistors 1120 and 1122 of peripheral circuits 1116 and 1118) can be vertically between bonding interface 105 and interconnect layer 2912. Interconnect layer 2912 can include a plurality of interconnects coupled to transistors 2908 and 2910 of peripheral circuits 2904 and 2906 in device layer 2902. Interconnect layer 2912 can further include one or more ILD layers in which the interconnects can form. That is, interconnect layer 2912 can include lateral lines and vias in multiple ILD layers. In some implementations, the devices in device layer 2902 are coupled to one another through the interconnects in interconnect layer 2912. For example, peripheral circuit 2904 may be coupled to peripheral circuit 2906 through interconnect layer 2912. The interconnects in interconnect layer 2912 can include conductive materials including, but not limited to, W, Co, Cu, Al, silicides, or any combination thereof. The ILD layers in interconnect layer 1126 can include dielectric materials including, but not limited to, silicon oxide, silicon nitride, silicon oxynitride, low-k dielectrics, or any combination thereof.

In some implementations, the interconnects in interconnect layer 2912 include Cu, which has a relatively low resistivity (better electrical performance) among conductive metal materials. As described below with respect to the fabrication process, although Cu has a relatively low thermal budget (incompatible with high-temperature processes), since the fabrication of interconnect layer 2912 can occur after the high-temperature processes in forming device layers 1114 and 1102 in second and third semiconductor structures 104 and 106, as well as after the high-temperature processes in forming first semiconductor structure 102, the interconnects of interconnect layer 2912 having Cu can become feasible. In some implementations, the interconnects in interconnect layer 2912 includes Cu as the conductive metal material, but not other conductive metal materials, such as W.

As shown in FIG. 29A, third semiconductor structure 106 can further include one or more contacts 2925 extending vertically through semiconductor layer 1006. In some implementations, contact 2925 couples the interconnects in interconnect layer 2912 to the interconnects in interconnect layer 2926 to make an electrical connection across bonding interface 105 between second and third semiconductor structures 104 and 106. Contact 2925 can include conductive materials including, but not limited to, W, Co, Cu, Al, silicides, or any combination thereof. In some implementations, contact 2925 includes Cu. For example, contact 2925 may include Cu as the conductive metal material, but not other conductive metal materials, such as W. In some implementations, contact 2925 includes a via surrounded by a dielectric spacer (e.g., having silicon oxide) to electrically separate the via from semiconductor layer 1006. Depending on the thickness of semiconductor layer 1006, contact 2925 can be an ILV having a depth in the submicron-level (e.g., between 10 nm and 1 μm), or a TSV having a depth in the micron- or tens micron-level (e.g., between 1 μm and 100 μm).

As shown in FIG. 29A, third semiconductor structure 106 can further include a pad-out interconnect layer 902 above and in contact with interconnect layer 2912. In some implementations, interconnect layer 2912 is disposed vertically between pad-out interconnect layer 902 and device layer 2902 including transistors 2908 and 2910. Pad-out interconnect layer 902 can include interconnects, e.g., contact pads 2932, in one or more ILD layers. In some implementations, the interconnects in pad-out interconnect layer 902 can transfer electrical signals between 3D memory device 2900 and external devices, e.g., for pad-out purposes.

As a result, peripheral circuits 2904, 2906, 2916, and 2918 in third and second semiconductor structures 106 and 104 can be coupled to NAND memory strings 208 in first semiconductor structure 102 through various interconnection structures, including interconnect layers 2912, 2926, and 2928, as well as contacts 2925 and 2924. Moreover, peripheral circuits 2904, 2906, 2916, and 2918 and NAND memory strings 208 in 3D memory device 2900 can be further coupled to external devices through pad-out interconnect layer 902.

It is understood that the material of semiconductor layer 1002 in first semiconductor structure 102 is not limited to single crystalline silicon as described above with respect to FIG. 29A and may be any other suitable semiconductor materials. For example, as shown in FIG. 29B, a 3D memory device 2901 may include semiconductor layer 1002 having polysilicon in first semiconductor structure 102. NAND memory strings 208 of 3D memory device 2901 in contact with semiconductor layer 1002 having polysilicon can include any suitable channel structures disclosed herein that are in contact with a polysilicon layer, such as bottom open channel structure 812C. In some implementations, NAND memory strings 208 of 3D memory device 2901 are "floating gate" type of NAND memory strings, and semiconductor layer 1002 having polysilicon is in contact with the "floating gate" type of NAND memory strings as the source plate thereof.

It is also understood that the pad-out of 3D memory devices is not limited to from third semiconductor structure 106 having peripheral circuits 2904 and 2906 as shown in FIG. 29A (corresponding to FIG. 9A) and may be from first semiconductor structure 102 having NAND memory strings 208 (corresponding to FIG. 9B). For example, as shown in FIG. 29B, 3D memory device 2901 may include pad-out interconnect layer 902 in first semiconductor structure 102. Pad-out interconnect layer 902 can be in contact with semiconductor layer 1002 of first semiconductor structure 102 on which NAND memory strings 208 are formed. In some implementations, first semiconductor structure 102 further includes one or more contacts 2934 extending vertically through semiconductor layer 1002. In some implementations, contact 2934 couples the interconnects in interconnect layer 2928 in first semiconductor structure 102 to contact pads 2932 in pad-out interconnect layer 902 to make an electrical connection through semiconductor layer 1002. Contact 2934 can include conductive materials including, but not limited to, W, Co, Cu, Al, silicides, or any combination thereof. In some implementations, contact 2934 includes W. In some implementations, contact 2934 includes a via surrounded by a dielectric spacer (e.g., having silicon oxide) to electrically separate the via from semiconductor layer 1002. Depending on the thickness of semiconductor layer 1002, contact 2934 can be an ILV having a depth in the submicron-level (e.g., between 10 nm and 1 μm), or a TSV having a depth in the micron- or tens micron-level (e.g., between 1 μm and 100 μm). It is understood that the details of the same components (e.g., materials, fabrication process, functions, etc.) in both 3D memory devices 2900 and 2901 are not repeated for ease of description.

Although not shown in FIGS. 29A and 29B, it is understood that in some examples, bonding interface 105 may result from hybrid bonding and thus, be disposed vertically between two bonding layers each including bonding contacts in second and third semiconductor structures 104 and 106, respectively, as described above in detail. Similarly, in some examples, bonding interface 103 may result from hybrid bonding and thus, be disposed vertically between two bonding layers each including bonding contacts in second and first semiconductor structures 104 and 102, respectively, as described above in detail.

Figure 32:
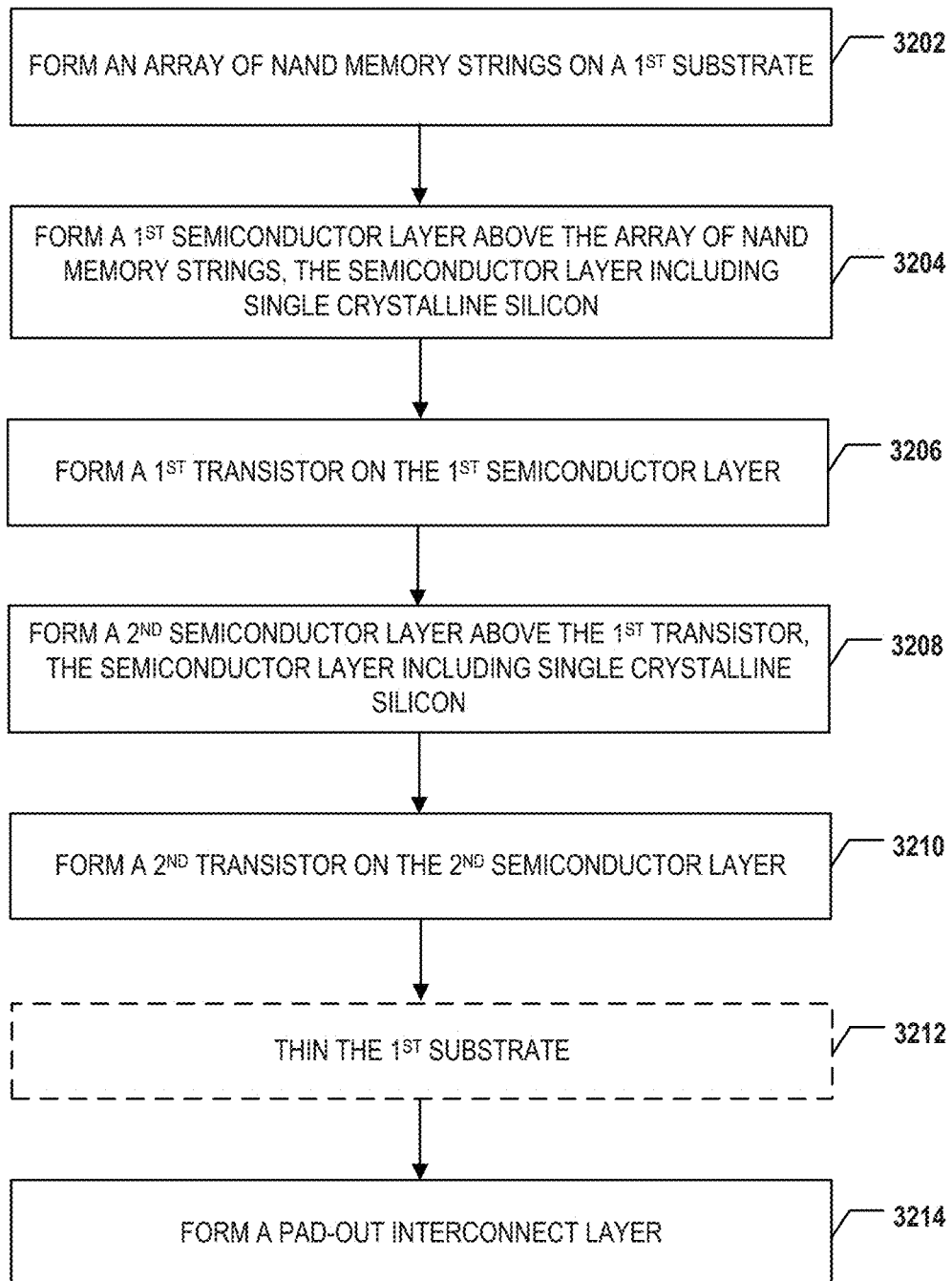
FIG. 32 illustrates a flowchart of a method for forming the 3D memory devices in FIGS. 28A and 28B, according to some aspects of the present disclosure.

FIGS. 30A-30F illustrate a fabrication process for forming the 3D memory devices in FIGS. 28A and 28B, according to some aspects of the present disclosure. FIG. 32 illustrates a flowchart of a method 3200 for forming the 3D memory devices in FIGS. 28A and 28B, according to some aspects of the present disclosure. Examples of the 3D memory devices depicted in FIGS. 30A-30F and 32 include 3D memory devices 2900 and 2901 depicted in FIGS. 29A and 29B. FIGS. 30A-30F and 32 will be described together. It is understood that the operations shown in method 3200 are not exhaustive and that other operations can be performed as well before, after, or between any of the illustrated operations. Further, some of the operations may be performed simultaneously, or in a different order than shown in FIG. 32.

Referring to FIG. 32, method 3200 starts at operation 3202, in which an array of NAND memory strings is formed on a first substrate. The first substrate can be a silicon substrate having single crystalline silicon. In some implementations, to form the array of NAND memory strings, a memory stack is formed on the first substrate.

As illustrated in FIG. 30A, a stack structure, such as a memory stack 3026 including interleaved conductive layers and dielectric layers, is formed on a silicon substrate 3024. To form memory stack 3026, in some implementations, a dielectric stack (not shown) including interleaved sacrificial layers (not shown) and the dielectric layers is formed on silicon substrate 3024. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. Memory stack 3026 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that memory stack 3026 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between memory stack 3026 and silicon substrate 3024.

As illustrated in FIG. 30A, NAND memory strings 3028 are formed above silicon substrate 3024, each of which extends vertically through memory stack 3026 to be in contact with silicon substrate 3024. In some implementations, fabrication processes to form NAND memory string 3028 include forming a channel hole through memory stack 3026 (or the dielectric stack) and into silicon substrate 3024 using dry etching/and or wet etching, such as DRIE, followed by subsequently filling the channel hole with a plurality of layers, such as a memory film (e.g., a tunneling layer, a storage layer, and a blocking layer) and a semiconductor layer, using thin film deposition processes such as ALD, CVD, PVD, or any combination thereof. It is understood that the details of fabricating NAND memory strings 3028 may vary depending on the types of channel structures of NAND memory strings 3028 (e.g., bottom plug channel structure 812A, sidewall plug channel structure 812B, or bottom open channel structure 812C in FIGS. 8A-8C) and thus, are not elaborated for ease of description.

In some implementations, an interconnect layer is formed above the array of NAND memory strings on the first substrate. The interconnect layer can include a first plurality of interconnects in one or more ILD layers. As illustrated in FIG. 30A, an interconnect layer 3030 is formed above memory stack 3026 and NAND memory strings 3028. Interconnect layer 3030 can include interconnects of MEOL and/or BEOL in a plurality of ILD layers to make electrical connections with NAND memory strings 3028. In some implementations, interconnect layer 3030 includes multiple ILD layers and interconnects therein formed in multiple processes. For example, the interconnects in interconnect layer 3030 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 30A can be collectively referred to as interconnect layer 3030.

Method 3200 proceeds to operation 3204, as illustrated in FIG. 32, in which a first semiconductor layer is formed above the array of NAND memory strings. The first semiconductor layer can include single crystalline silicon. In some implementations, to form the first semiconductor layer, another substrate and the first substrate are bonded in a face-to-face manner, and the other substrate is thinned to leave the first semiconductor layer. The bonding can include transfer bonding. The other substrate can be a silicon substrate having single crystalline silicon.

As illustrated in FIG. 30B, a semiconductor layer 3010, such as a single crystalline silicon layer, is formed above interconnect layer 3030 and NAND memory strings 3028. Semiconductor layer 3010 can be attached above interconnect layer 3030 to form a bonding interface 3012 vertically between semiconductor layer 3010 and interconnect layer 3030. In some implementations, to form semiconductor layer 3010, another silicon substrate (not shown in FIG. 30B) and silicon substrate 3024 are bonded in a face-to-face manner (having the components formed on silicon substrate 3024, such as NAND memory strings 3028, facing toward the other silicon substrate) using transfer bonding, thereby forming bonding interface 3012. The other silicon substrate can then be thinned using any suitable processes to leave semiconductor layer 3010 attached above interconnect layer 3030. The details of various transfer bonding processes are described above with respect to FIGS. 48A-48D and FIGS. 49A-49D and thus, are not repeated for ease of description.

Figure 30C:
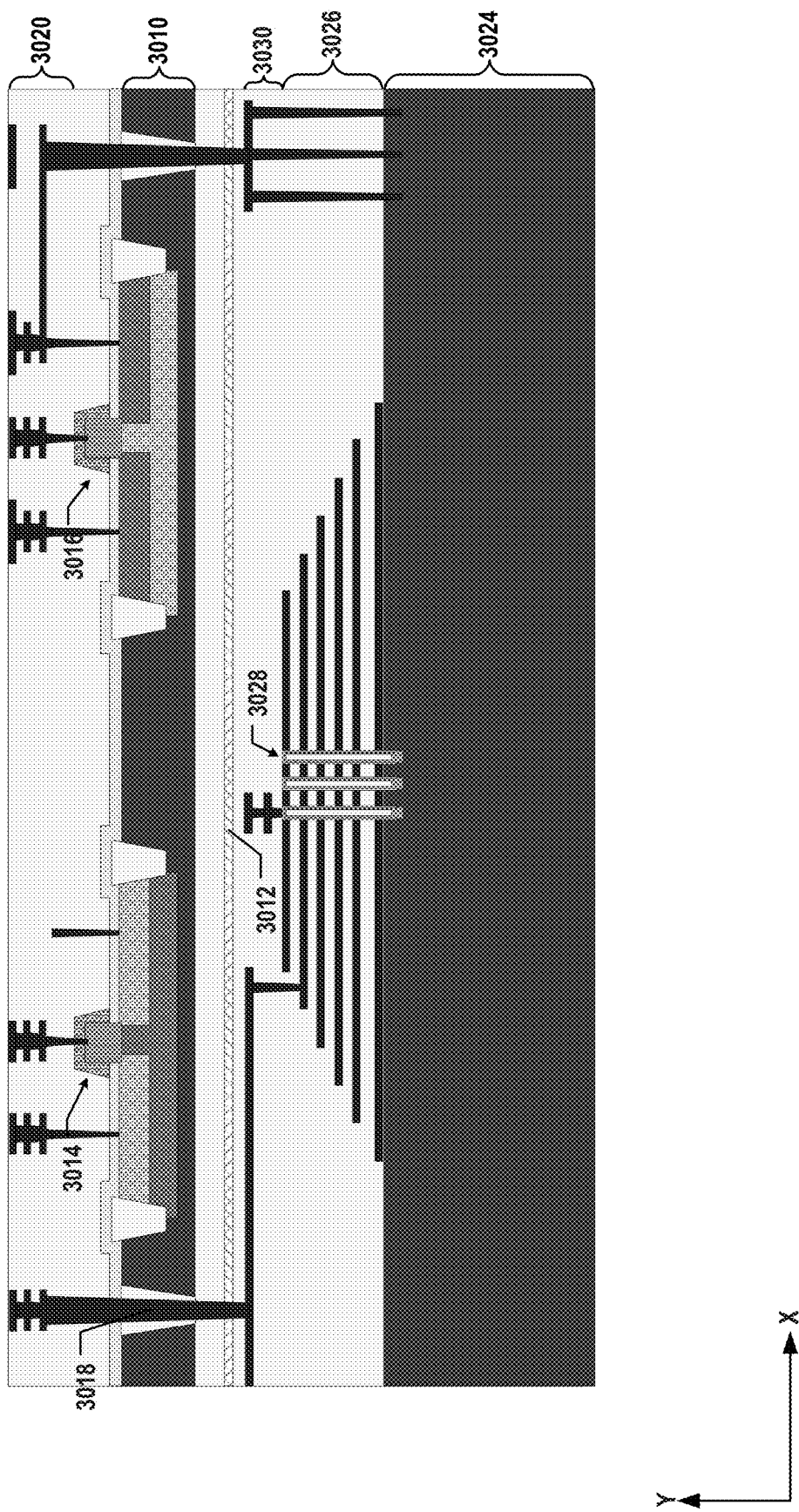

Referring to FIG. 32, method 3200 proceeds to operation 3206 in which a first transistor is formed on the first semiconductor layer. As illustrated in FIG. 30C, a plurality of transistors 3014 and 3016 are formed on semiconductor layer 3010 having single crystalline silicon. Transistors 3014 and 3016 can be formed by a plurality of processes including, but not limited to, photolithography, dry/wet etch, thin film deposition, thermal growth, implantation, CMP, and any other suitable processes. In some implementations, doped regions are formed in semiconductor layer 3010 by ion implantation and/or thermal diffusion, which function, for example, as wells and source/drain regions of transistors 3014 and 3016. In some implementations, isolation regions (e.g., STIs) are also formed in semiconductor layer 3010 by wet/dry etch and thin film deposition. In some implementations, the thickness of gate dielectric of transistor 3014 is different from the thickness of gate dielectric of transistor 3016, for example, by depositing a thicker silicon oxide film in the region of transistor 3014 than the region of transistor 3016, or by etching back part of the silicon oxide film deposited in the region of transistor 3016. It is understood that the details of fabricating transistors 3014 and 3016 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer 3020 is formed above the transistor on the semiconductor layer. The interconnect layer can include a plurality of interconnects in one or more ILD layers. As illustrated in FIG. 30C, an interconnect layer 3020 can be formed above transistors 3014 and 3016. Interconnect layer 3020 can include interconnects of MEOL and/or BEOL in a plurality of ILD layers to make electrical connections with transistors 3014 and 3016. In some implementations, interconnect layer 3020 includes multiple ILD layers and interconnects therein formed in multiple processes. For example, the interconnects in interconnect layer 3020 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 30C can be collectively referred to as interconnect layer 3020.

In some implementations, a contact through the semiconductor layer is formed. As illustrated in FIG. 30C, one or more contacts 3018 each extending vertically through semiconductor layer 3010 is formed. Contacts 3018 can couple the interconnects in interconnect layers 3020 and 3030. Contacts 3018 can be formed by first patterning contact holes through semiconductor layer 3010 using patterning process (e.g., photolithography and dry/wet etch of dielectric materials in the dielectric layer). The contact holes can be filled with a conductor (e.g., W or Cu). In some implementations, filling the contact holes includes depositing a spacer (e.g., a silicon oxide layer) before depositing the conductor.

Method 3200 proceeds to operation 3208, as illustrated in FIG. 32, in which a second semiconductor layer is formed above the first transistor. The second semiconductor layer can include single crystalline silicon. In some implementations, to form the second semiconductor layer, another substrate and the first substrate are bonded in a face-to-face manner, and the other substrate is thinned to leave the second semiconductor layer. The bonding can include transfer bonding. The other substrate can be a silicon substrate having single crystalline silicon.

Figure 30D:
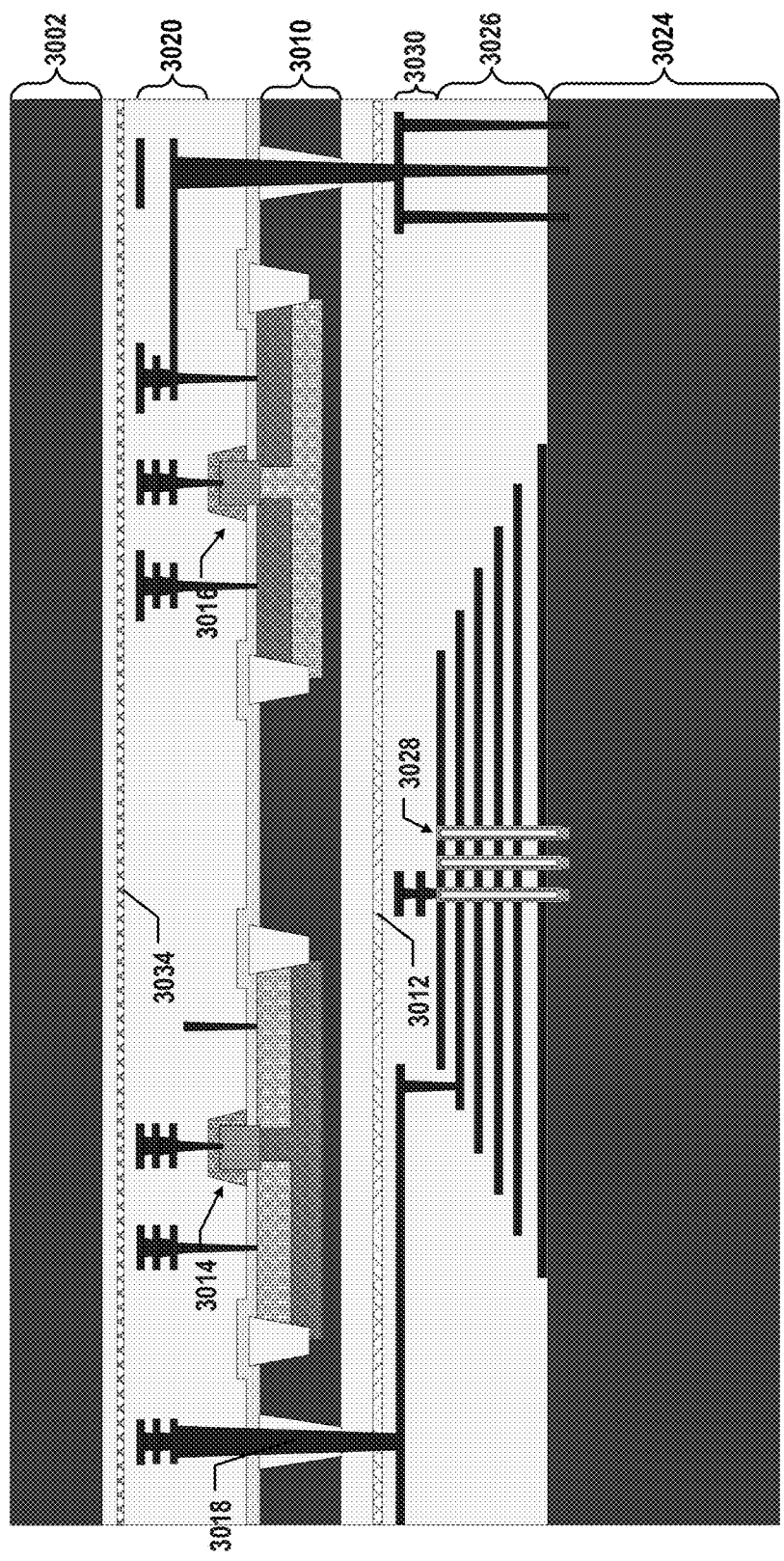

As illustrated in FIG. 30D, a semiconductor layer 3002, such as a single crystalline silicon layer, is formed above interconnect layer 3020 and transistors 3014 and 3016. Semiconductor layer 3002 can be attached above interconnect layer 3020 to form a bonding interface 3034 vertically between semiconductor layer 3002 and interconnect layer 3020. In some implementations, to form semiconductor layer 3002, another silicon substrate (not shown in FIG. 30D) and silicon substrate 3024 are bonded in a face-to-face manner (having the components formed on silicon substrate 3024, such as NAND memory strings 3028 and transistors 3014 and 3016, facing toward the other silicon substrate) using transfer bonding, thereby forming bonding interface 3034. The other silicon substrate can then be thinned using any suitable processes to leave semiconductor layer 3002 attached above interconnect layer 3020. The details of various transfer bonding processes are described above with respect to FIGS. 48A-48D and FIGS. 49A-49D and thus, are not repeated for ease of description.

Figure 30E:
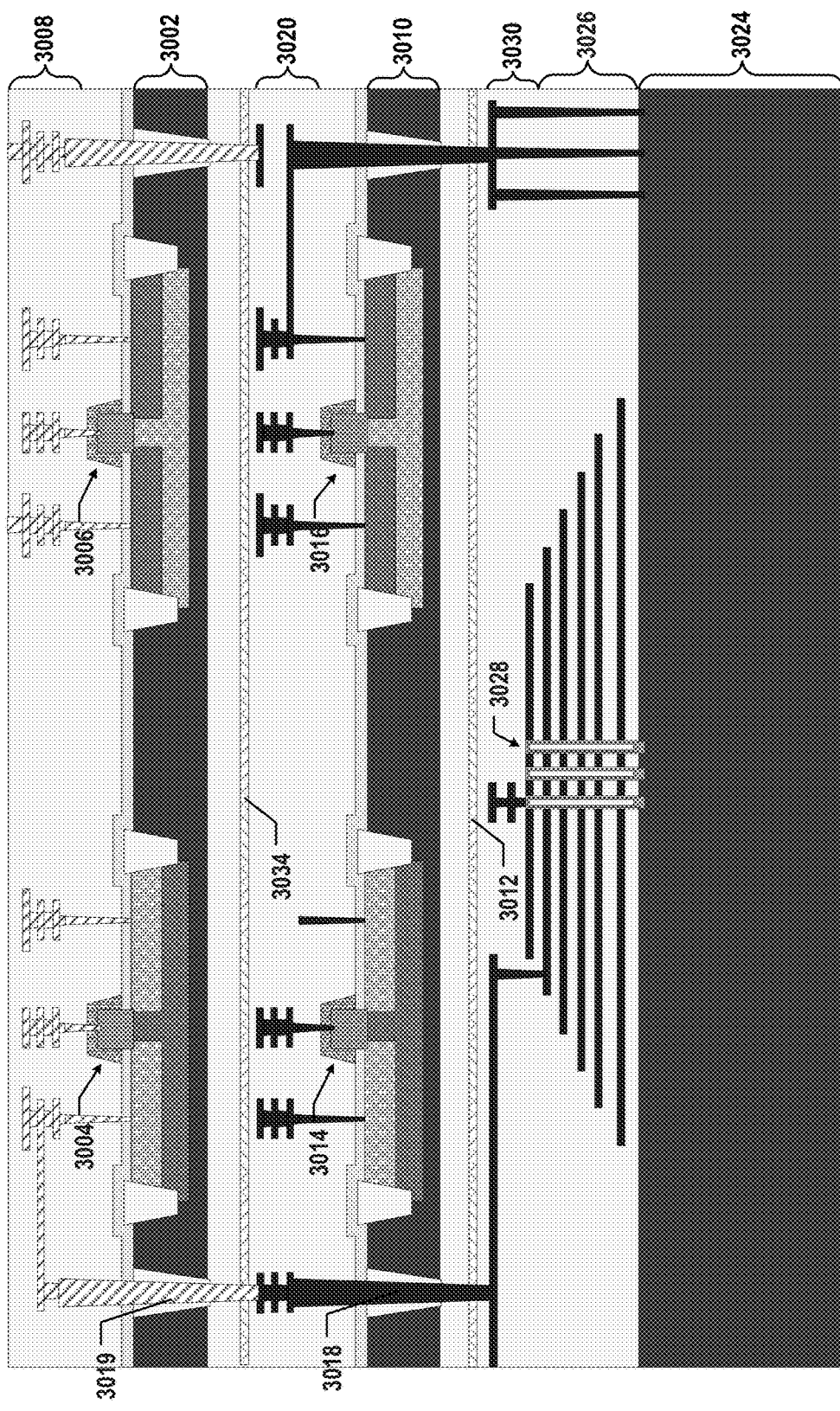

Referring to FIG. 32, method 3200 proceeds to operation 3206 in which a second transistor is formed on the second semiconductor layer. As illustrated in FIG. 30E, a plurality of transistors 3004 and 3006 are formed on semiconductor layer 3002 having single crystalline silicon. Transistors 3004 and 3006 can be formed by a plurality of processes including, but not limited to, photolithography, dry/wet etch, thin film deposition, thermal growth, implantation, CMP, and any other suitable processes. In some implementations, doped regions are formed in semiconductor layer 3002 by ion implantation and/or thermal diffusion, which function, for example, as wells and source/drain regions of transistors 3004 and 3006. In some implementations, isolation regions (e.g., STIs) are also formed in semiconductor layer 3002 by wet/dry etch and thin film deposition. In some implementations, the thickness of gate dielectric of transistor 3004 is different from the thickness of gate dielectric of transistor 3006, for example, by depositing a thicker silicon oxide film in the region of transistor 3004 than the region of transistor 3006, or by etching back part of the silicon oxide film deposited in the region of transistor 3006. It is understood that the details of fabricating transistors 3004 and 3006 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer 3008 is formed above the transistor on the semiconductor layer. The interconnect layer can include a plurality of interconnects in one or more ILD layers. As illustrated in FIG. 30E, an interconnect layer 3008 can be formed above transistors 3004 and 3006. Interconnect layer 3008 can include interconnects of MEOL and/or BEOL in a plurality of ILD layers to make electrical connections with transistors 3004 and 3006. In some implementations, interconnect layer 3008 includes multiple ILD layers and interconnects therein formed in multiple processes. For example, the interconnects in interconnect layer 3008 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 30C can be collectively referred to as interconnect layer 3008. Different from interconnect layer 3020, in some implementations, the interconnects in interconnect layer 3008 include Cu, which has a relatively low resistivity among conductive metal materials. It is understood that although Cu has a relatively low thermal budget (incompatible with high-temperature processes), using Cu as the conductive materials of the interconnects in interconnect layer 3008 may become feasible since there are no more high-temperature processes after the fabrication of interconnect layer 3008.

In some implementations, a contact through the semiconductor layer is formed. As illustrated in FIG. 30E, one or more contacts 3019 each extending vertically through semiconductor layer 3002 is formed. Contacts 3019 can couple the interconnects in interconnect layers 3008 and 3020. Contacts 3019 can be formed by first patterning contact holes through semiconductor layer 3002 using patterning process (e.g., photolithography and dry/wet etch of dielectric materials in the dielectric layer). The contact holes can be filled with a conductor (e.g., Cu). In some implementations, filling the contact holes includes depositing a spacer (e.g., a silicon oxide layer) before depositing the conductor.

Figure 30F:
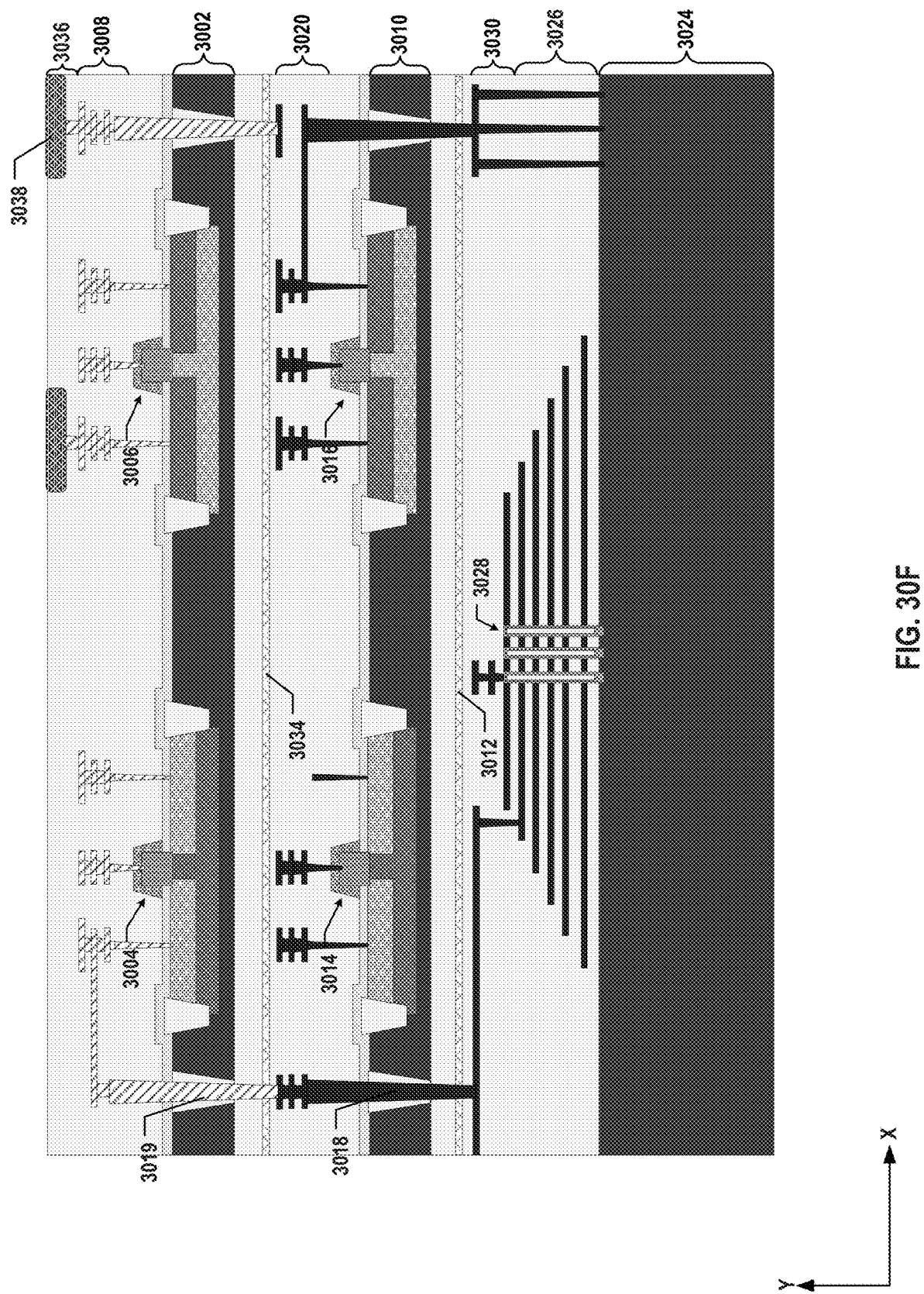

Method 3200 skips optional operation 3212 and proceeds to operation 3214, as illustrated in FIG. 32, in which a pad-out interconnect layer is formed. The pad-out interconnect layer can be formed above the second transistor. As illustrated in FIG. 30F, a pad-out interconnect layer 3036 is formed above interconnect layer 3008 and transistors 3004 and 3006 on semiconductor layer 3002. Pad-out interconnect layer 3036 can include interconnects, such as contact pads 3038, formed in one or more ILD layers. Contact pads 3038 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof.

In some implementations, to form a pad-out interconnect layer on the first substrate, after operation 3210, method 3200 proceeds to optional operation 3212, as illustrated in FIG. 32, in which the first substrate is thinned. It is understood that although not shown, in some examples, silicon substrate 3024 (shown in FIG. 30E) may be thinned to become a semiconductor layer having single crystalline silicon using processes including, but not limited to, wafer grinding, dry etch, wet etch, CMP, any other suitable processes, or any combination thereof. After the thinning, contacts may be formed extending vertically through the thinned silicon substrate 3024, for example, by wet/dry etching followed by depositing dielectric materials as spacers and conductive materials as conductors. It is understood that in some examples, the contacts may be formed in silicon substrate 3024 before thinning and be exposed from the backside of silicon substrate 3024 (where the thinning occurs) after the thinning.

Method 3200 proceeds to operation 3214, as illustrated in FIG. 32, in which a pad-out interconnect layer is formed. The pad-out interconnect layer can be formed on the thinned first substrate. It is understood that although not shown, in some examples, a pad-out interconnect layer having contact pads may be formed on the thinned silicon substrate 3024.

Figure 33:
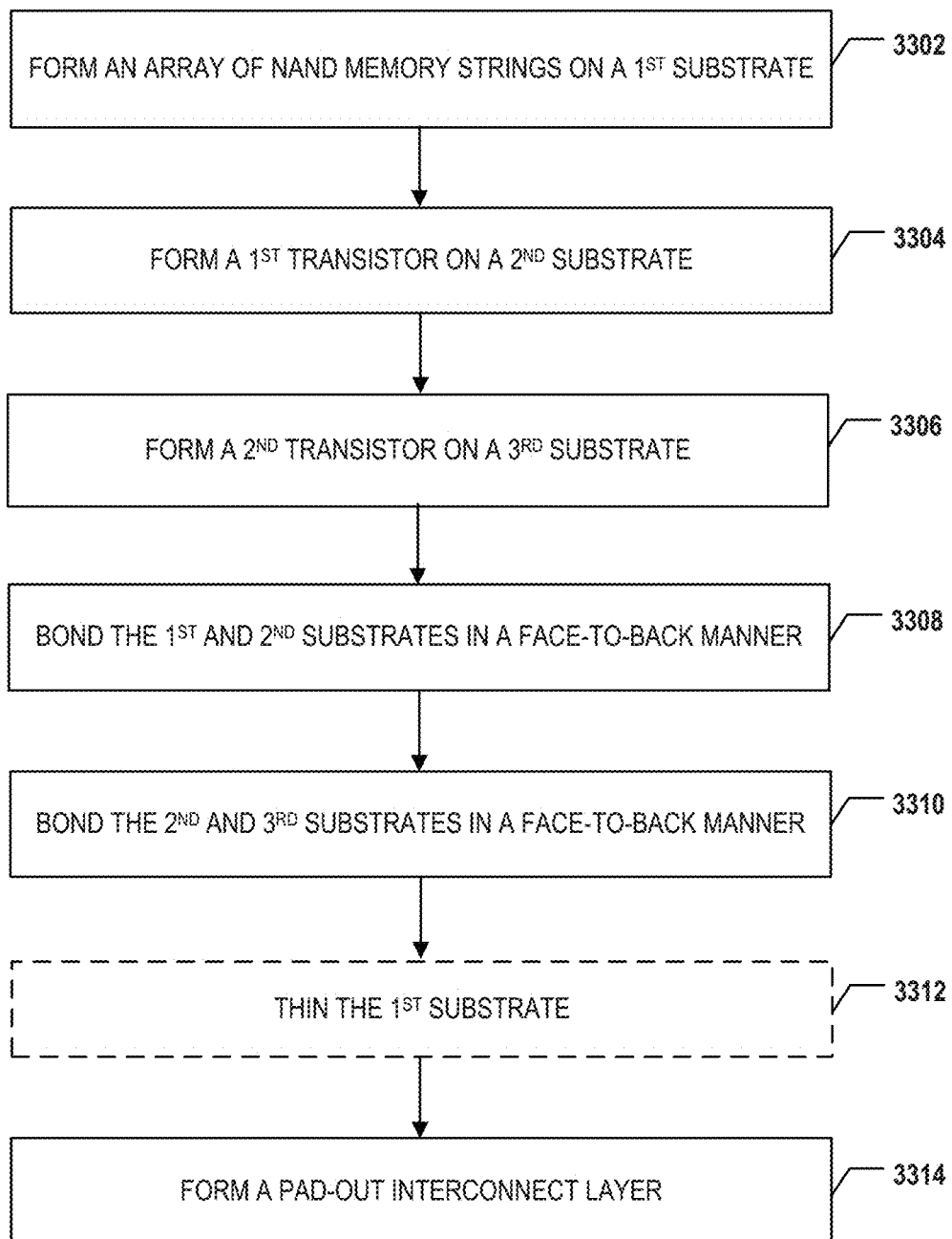
FIG. 33 illustrates a flowchart of a method for forming the 3D memory devices in FIGS. 28A and 28B, according to some aspects of the present disclosure.

FIGS. 31A-31F illustrate another fabrication process for forming the 3D memory devices in FIGS. 28A and 28B, according to some aspects of the present disclosure. FIG. 33 illustrates a flowchart of another method 3300 for forming the 3D memory devices in FIGS. 28A and 28B, according to some aspects of the present disclosure. Examples of the 3D memory devices depicted in FIGS. 31A-31F and 33 include 3D memory devices 2900 and 2901 depicted in FIGS. 29A and 29B. FIGS. 31A-31F and 33 will be described together. It is understood that the operations shown in method 3300 are not exhaustive and that other operations can be performed as well before, after, or between any of the illustrated operations. Further, some of the operations may be performed simultaneously, or in a different order than shown in FIG. 33. For example, operation 3302, 3304, and 3306 may be performed in parallel.

Referring to FIG. 33, method 3300 starts at operation 3302, in which an array of NAND memory strings is formed on a first substrate. The first substrate can be a silicon substrate having single crystalline silicon. In some implementations, to form the array of NAND memory strings, a memory stack is formed on the first substrate.

As illustrated in FIG. 31A, a stack structure, such as a memory stack 3104 including interleaved conductive layers and dielectric layers, is formed on a silicon substrate 3102. To form memory stack 3104, in some implementations, a dielectric stack (not shown) including interleaved sacrificial layers (not shown) and the dielectric layers is formed on silicon substrate 3102. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. Memory stack 3104 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that memory stack 3104 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between memory stack 3104 and silicon substrate 3102.

As illustrated in FIG. 31A, NAND memory strings 3106 are formed above silicon substrate 3102, each of which extends vertically through memory stack 3104 to be in contact with silicon substrate 3102. In some implementations, fabrication processes to form NAND memory string 3106 include forming a channel hole through memory stack 3104 (or the dielectric stack) and into silicon substrate 3102 using dry etching/and or wet etching, such as DRIE, followed by subsequently filling the channel hole with a plurality of layers, such as a memory film (e.g., a tunneling layer, a storage layer, and a blocking layer) and a semiconductor layer, using thin film deposition processes such as ALD, CVD, PVD, or any combination thereof. It is understood that the details of fabricating NAND memory strings

3106 may vary depending on the types of channel structures of NAND memory strings 3106 (e.g., bottom plug channel structure 812A, sidewall plug channel structure 812B, or bottom open channel structure 812C in FIGS. 8A-8C) and thus, are not elaborated for ease of description.

In some implementations, an interconnect layer is formed above the array of NAND memory strings on the first substrate. The interconnect layer can include a first plurality of interconnects in one or more ILD layers. As illustrated in FIG. 31A, an interconnect layer 3108 is formed above memory stack 3104 and NAND memory strings 3106. Interconnect layer 3108 can include interconnects of MEOL and/or BEOL in a plurality of ILD layers to make electrical connections with NAND memory strings 3106. In some implementations, interconnect layer 3108 includes multiple ILD layers and interconnects therein formed in multiple processes. For example, the interconnects in interconnect layer 3108 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 31A can be collectively referred to as interconnect layer 3108.

Method 3300 proceeds to operation 3304, as illustrated in FIG. 33, in which a first transistor is formed on a second substrate. The second substrate can be a silicon substrate having single crystalline silicon. As illustrated in FIG. 31B, a plurality of transistors 3114 and 3116 are formed on a silicon substrate 3112. Transistors 3114 and 3116 can be formed by a plurality of processes including, but not limited to, photolithography, dry/wet etch, thin film deposition, thermal growth, implantation, CMP, and any other suitable processes. In some implementations, doped regions are formed in silicon substrate 3112 by ion implantation and/or thermal diffusion, which function, for example, as wells and source/drain regions of transistors 3114 and 3116. In some implementations, isolation regions (e.g., STIs) are also formed in silicon substrate 3112 by wet/dry etch and thin film deposition. In some implementations, the thickness of gate dielectric of transistor 3114 is different from the thickness of gate dielectric of transistor 3116, for example, by depositing a thicker silicon oxide film in the region of transistor 3114 than the region of transistor 3116, or by etching back part of the silicon oxide film deposited in the region of transistor 3116. It is understood that the details of fabricating transistors 3114 and 3116 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer 3118 is formed above the transistor on the second substrate. The interconnect layer can include a plurality of interconnects in one or more ILD layers. As illustrated in FIG. 31B, an interconnect layer 3118 can be formed above transistors 3114 and 3116. Interconnect layer 3118 can include interconnects of MEOL and/or BEOL in a plurality of ILD layers to make electrical connections with transistors 3114 and 3116. In some implementations, interconnect layer 3118 includes multiple ILD layers and interconnects therein formed in multiple processes. For example, the interconnects in interconnect layer 3118 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 31B can be collectively referred to as interconnect layer 3118.

Method 3300 proceeds to operation 3306, as illustrated in FIG. 33, in which a second transistor is formed on a third substrate. The third substrate can be a silicon substrate having single crystalline silicon. In some implementations, any two or all of operations 3302, 3304, and 3306 are performed in parallel to reduce process time.

As illustrated in FIG. 31C, a plurality of transistors 3124 and 3126 are formed on a silicon substrate 3122. Transistors 3124 and 3126 can be formed by a plurality of processes including, but not limited to, photolithography, dry/wet etch, thin film deposition, thermal growth, implantation, CMP, and any other suitable processes. In some implementations, doped regions are formed in silicon substrate 3122 by ion implantation and/or thermal diffusion, which function, for example, as wells and source/drain regions of transistors 3124 and 3126. In some implementations, isolation regions (e.g., STIs) are also formed in silicon substrate 3122 by wet/dry etch and thin film deposition. In some implementations, the thickness of gate dielectric of transistor 3124 is different from the thickness of gate dielectric of transistor 3126, for example, by depositing a thicker silicon oxide film in the region of transistor 3124 than the region of transistor 3126, or by etching back part of the silicon oxide film deposited in the region of transistor 3126. It is understood that the details of fabricating transistors 3124 and 3126 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer 3128 is formed above the transistor on the third substrate. The interconnect layer can include a plurality of interconnects in one or more ILD layers. As illustrated in FIG. 31C, an interconnect layer 3128 can be formed above transistors 3124 and 3126. Interconnect layer 3128 can include interconnects of MEOL and/or BEOL in a plurality of ILD layers to make electrical connections with transistors 3124 and 3126. In some implementations, interconnect layer 3128 includes multiple ILD layers and interconnects therein formed in multiple processes. For example, the interconnects in interconnect layer 1928 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 31C can be collectively referred to as interconnect layer 3128.

Figure 31D:
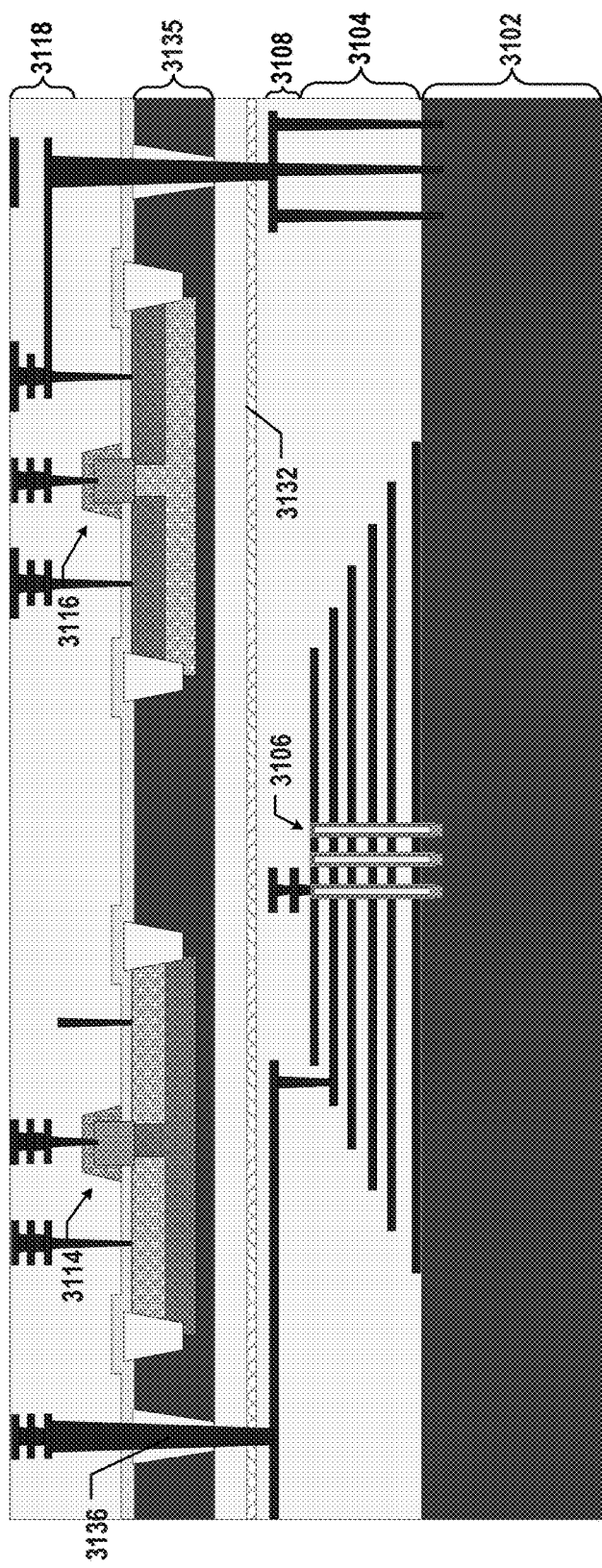
Figure 31E:
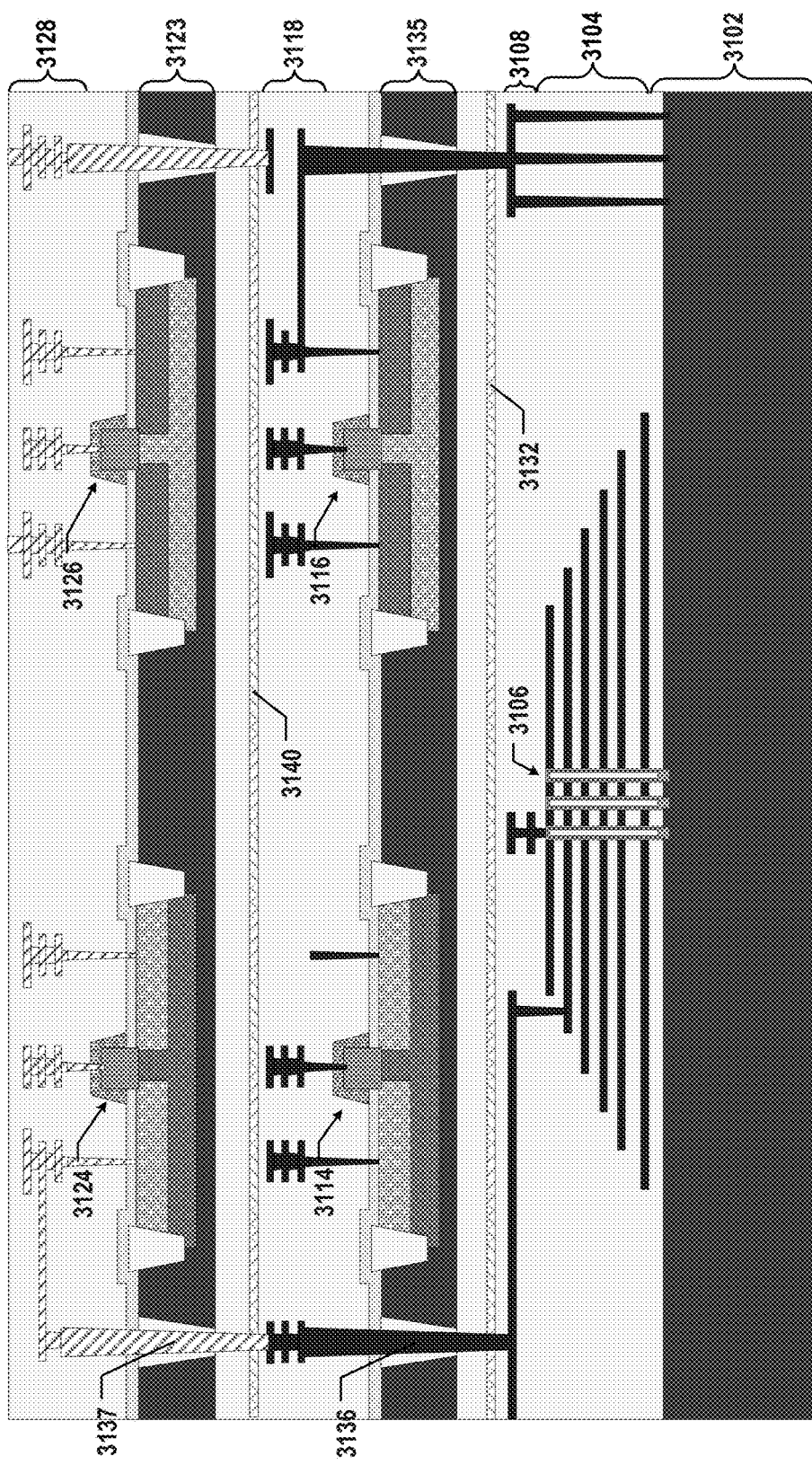

In some implementations, at least one of the second substrate or the third substrate is thinned. As illustrated in FIG. 31D, silicon substrate 3112 (shown in FIG. 31B) is thinned to become a semiconductor layer 3135 having single crystalline silicon. Similarly, as illustrated in FIG. 31E, silicon substrate 3122 (shown in FIG. 31C) is thinned to become a semiconductor layer 3123 having single crystalline silicon. Silicon substrate 3112 or 3122 can be thinned by processes including, but not limited to, wafer grinding, dry etch, wet etch, CMP, any other suitable processes, or any combination thereof. In some implementations, handle substrates (not shown) are attached to interconnect layers 3118 and 3128, for example, using adhesive bonding, prior to the thinning to allow the subsequent backside processes on silicon substrates 3112 and 3122, such as thinning, contact formation, and bonding.

In some implementations, a first contact through the thinned second substrate and coupled to the interconnect layer is formed. In some implementations, a second contact through the thinned third substrate and coupled to the interconnect layer is formed. As illustrated in FIG. 31D, one or more contacts 3136 each extending vertically through semiconductor layer 3135 (i.e., the thinned silicon substrate 3112) are formed. Contacts 3136 can be coupled to the interconnects in interconnect layer 3118. Similarly, as illustrated in FIG. 31E, one or more contacts 3137 each extending vertically through semiconductor layer 3123 (i.e., the thinned silicon substrate 3122) are formed. Contacts 3137 can be coupled to the interconnects in interconnect layer 3128. Contact 3137 or 3136 can be formed by first patterning contact holes through semiconductor layer 3123 or 3135 using patterning process (e.g., photolithography and dry/wet etch of dielectric materials in the dielectric layer). The contact holes can be filled with a conductor (e.g., W or Cu). In some implementations, filling the contact holes includes depositing a spacer (e.g., a silicon oxide layer) before depositing the conductor. It is understood that in some examples, contacts 3136 may be formed in silicon substrate 3112 before thinning (the formation of semiconductor layer 3135, e.g., in FIG. 31B) and be exposed from the backside of silicon substrate 3112 (where the thinning occurs) after the thinning. Similarly, contacts 3137 may be formed in silicon substrate 3122 before thinning (the formation of semiconductor layer 3123, e.g., in FIG. 31C) and be exposed from the backside of silicon substrate 3122 (where the thinning occurs) after the thinning.

Method 3300 proceeds to operation 3308, as illustrated in FIG. 33, in which the first substrate and the second substrate are bonded in a face-to-back manner. As illustrated in FIG. 31D, silicon substrate 3102 and components formed thereon (e.g., memory stack 3104 and NAND memory strings 3106) is bonded to thinned silicon substrate 3112 (i.e., semiconductor layer 3135) and components formed thereon (e.g., transistors 3114 and 3116) in a face-to-back manner, i.e., the frontside of silicon substrate 3102 facing toward the backside of thinned silicon substrate 3112, to form a bonding interface 3132. The bonding can be performed using fusion bonding or anodic bonding depending on the materials at bonding interface 3132, e.g., $SiO_2$—Si or $SiO_2$—$SiO_2$. As a result of the bonding, contacts 3136 couple the interconnects in interconnect layer 3118 to the interconnects in interconnect layer 3108.

Method 3300 proceeds to operation 3310, as illustrated in FIG. 33, in which the second substrate and the third substrate are bonded in a face-to-back manner. As illustrated in FIG. 31E, thinned silicon substrate 3112 (i.e., semiconductor layer 3135) and components formed thereon (e.g., transistors 3114 and 3116) is bonded to thinned silicon substrate 3122 (i.e., semiconductor layer 3123) and components formed thereon (e.g., transistors 3124 and 3126) in a face-to-back manner, i.e., the frontside of thinned silicon substrate 3112 facing toward the backside of thinned silicon substrate 3122, to form a bonding interface 3140. The bonding can be performed using fusion bonding or anodic bonding depending on the materials at bonding interface 3140, e.g., $SiO_2$—Si or $SiO_2$—$SiO_2$. As a result of the bonding, contacts 3137 couple the interconnects in interconnect layer 3128 to the interconnects in interconnect layer 3118. It is understood that the sequence of bonding silicon substrates 3102, 3112, and 3222 may switch to any suitable order in other examples.

Figure 31F:
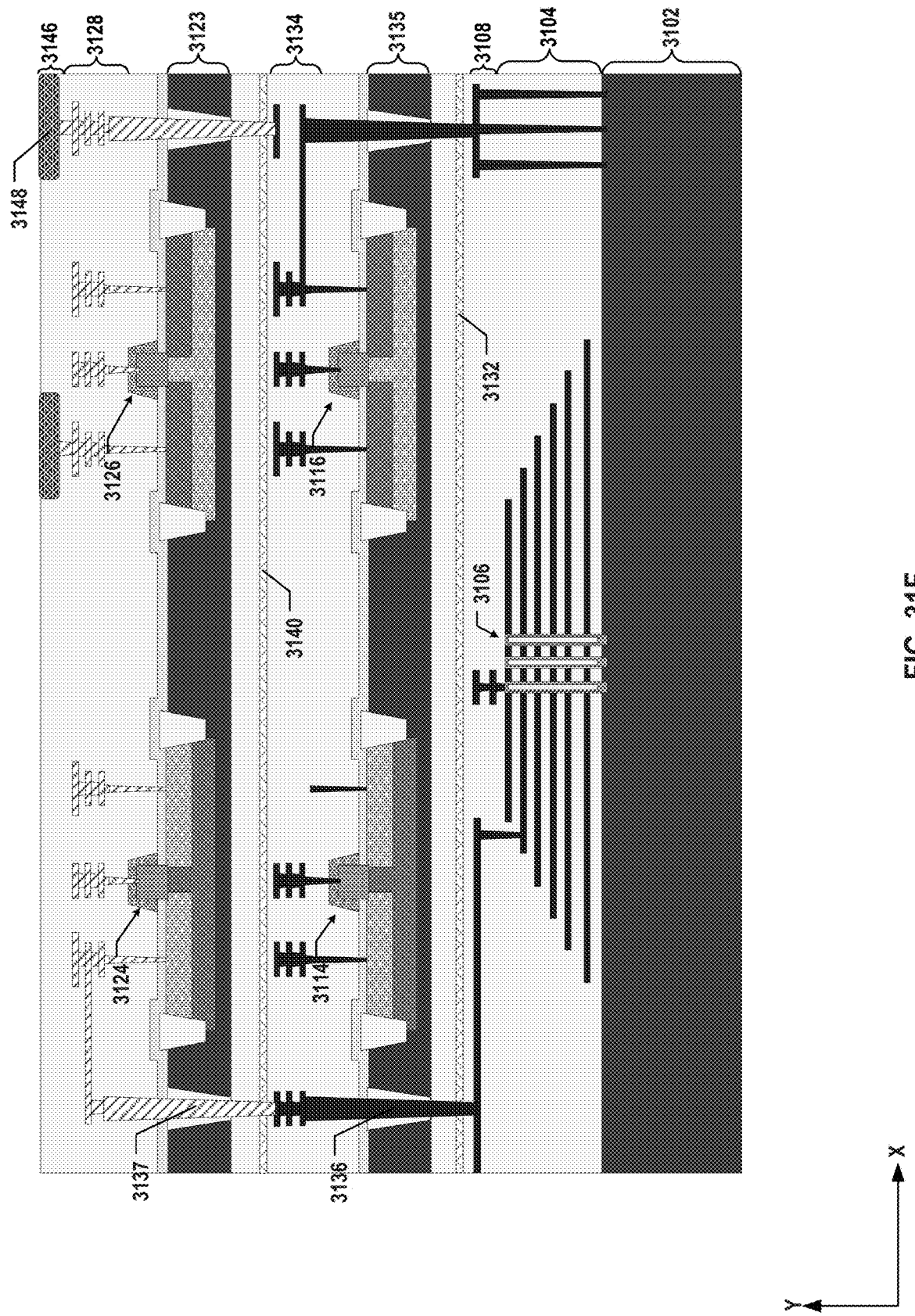

Method 3300 skips optional operation 3312 and proceeds to operation 3314, as illustrated in FIG. 33, in which a pad-out interconnect layer is formed. The pad-out interconnect layer can be formed above the second transistor. As illustrated in FIG. 31F, a pad-out interconnect layer 3146 is formed above interconnect layer 3128 and transistors 3124 and 3126 on semiconductor layer 3123. Pad-out interconnect layer 3146 can include interconnects, such as contact pads 3148, formed in one or more ILD layers. Contact pads 3148 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof.

In some implementations, to form a pad-out interconnect layer on the first substrate, after operation 3310, method 3300 proceeds to optional operation 3312, as illustrated in FIG. 33, in which the first substrate is thinned. It is understood that although not shown, in some examples, silicon substrate 3102 (shown in FIG. 31E) may be thinned to become a semiconductor layer having single crystalline silicon using processes including, but not limited to, wafer grinding, dry etch, wet etch, CMP, any other suitable processes, or any combination thereof. After the thinning, contacts may be formed extending vertically through the thinned silicon substrate 3102, for example, by wet/dry etching followed by depositing dielectric materials as spacers and conductive materials as conductors. It is understood that in some examples, the contacts may be formed in silicon substrate 3102 before thinning and be exposed from the backside of silicon substrate 3102 (where the thinning occurs) after the thinning.

Method 3300 proceeds to operation 3314, as illustrated in FIG. 33, in which a pad-out interconnect layer is formed. The pad-out interconnect layer can be formed on the thinned first substrate. It is understood that although not shown, in some examples, a pad-out interconnect layer having contact pads may be formed on the thinned silicon substrate 3102.

Figure 34A:
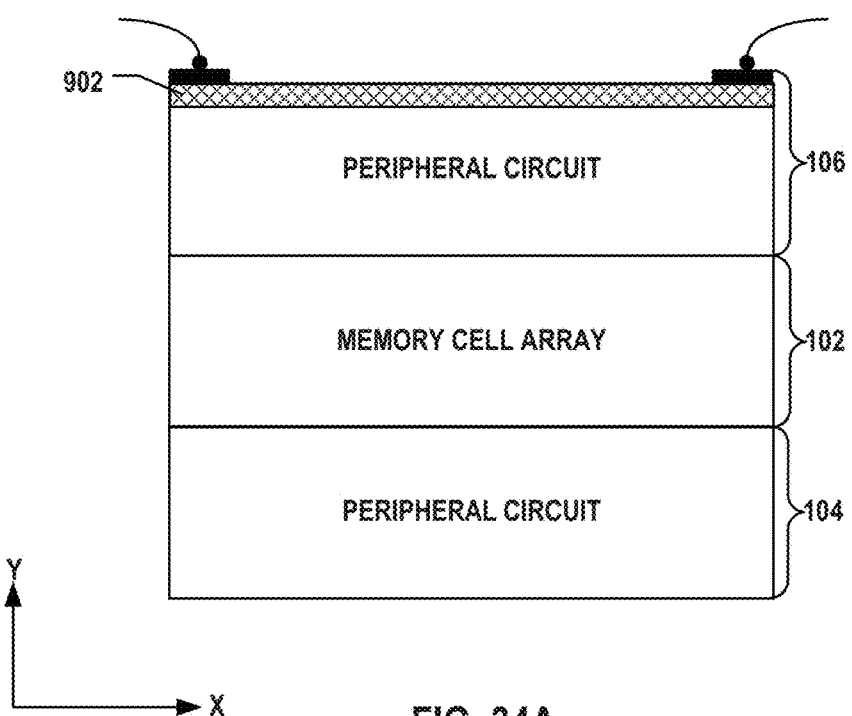
FIGS. 34A and 34B illustrate schematic views of cross-sections of 3D memory devices having three stacked semiconductor structures, according to various aspects of the present disclosure.
Figure 34B:
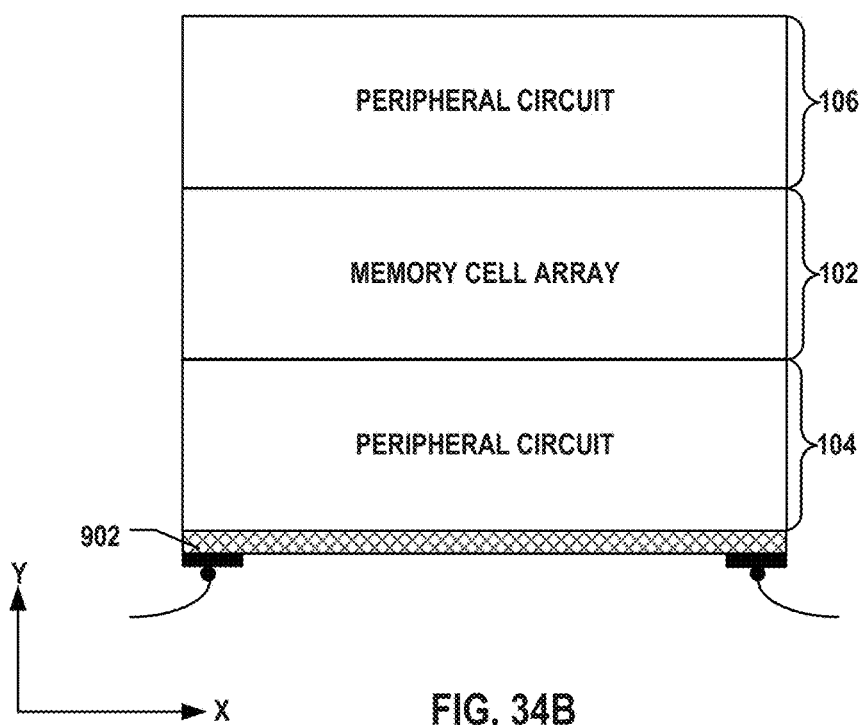

FIGS. 34A and 34B illustrate schematic views of cross-sections of 3D memory devices 3400 and 3401 having three stacked semiconductor structures, according to various aspects of the present disclosure. 3D memory devices 3400 and 3401 may be examples of 3D memory device 101 in FIG. 1B in which first semiconductor structure 102 including the memory cell array is disposed vertically between second semiconductor structure 104 including some of the peripheral circuits and third semiconductor structure 106 including some of the peripheral circuits. In other words, as shown in FIGS. 34A and 34B, first semiconductor structure 102 including the memory cell array of 3D memory devices 900 and 901 is disposed in the intermediate of 3D memory devices 3400 and 3401, second semiconductor structure 104 including some of the peripheral circuits is disposed on one side of 3D memory devices 3400 and 3401, and third semiconductor structure 106 including some of the peripheral circuits is disposed on another side of 3D memory devices 3400 and 3401 in the vertical direction, according to some implementations. Second and third semiconductor structures 104 and 106 each including peripheral circuits can be separated by first semiconductor structure 102 including the memory cell array in three stacked semiconductor structures 102, 104, and 106.

Moreover, as shown in FIGS. 34A and 34B, 3D memory device 3400 or 3401 can further include a pad-out interconnect layer 902 for pad-out purposes, i.e., interconnecting with external devices using contact pads on which bonding wires can be soldered. In one example shown in FIG. 34A, third semiconductor structure 106 including some of the peripheral circuits on one side of 3D memory device 3400 may include pad-out interconnect layer 902. In another example shown in FIG. 34B, second semiconductor structure 104 including some of the peripheral circuits on one side of 3D memory device 3401 may include pad-out interconnect layer 902. In either example, 3D memory device 3400 or 3401 may be pad-out from one peripheral circuit side to reduce the interconnect distance between contact pads and the peripheral circuits, thereby decreasing the parasitic capacitance from the interconnects and improving the electrical performance of 3D memory devices 3400 and 3401.

Figure 35A:
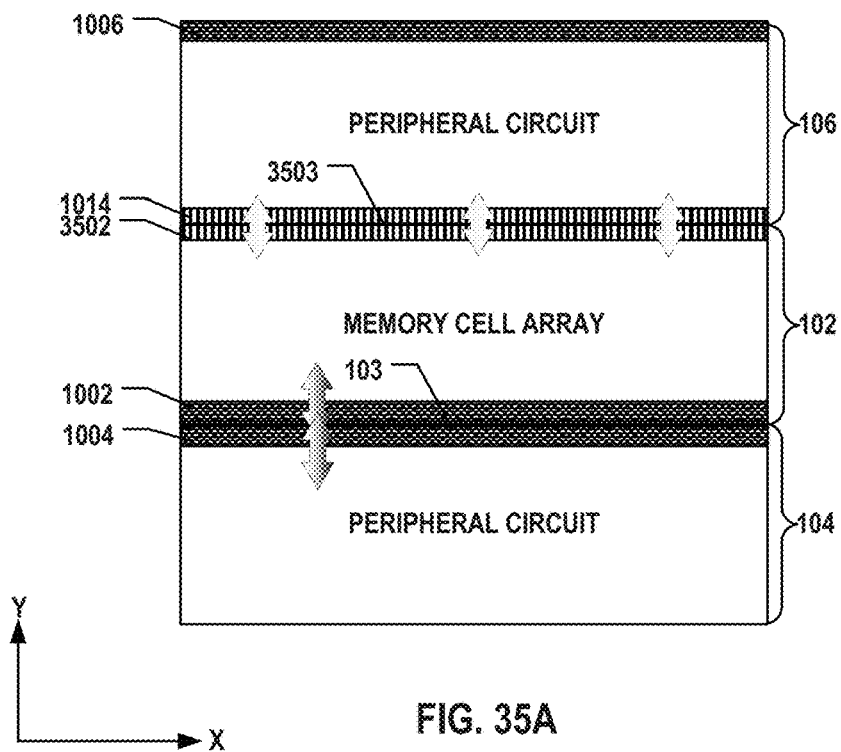
FIGS. 35A and 35B illustrate schematic views of cross-sections of the 3D memory devices in FIGS. 34A and 34B, according to some aspects of the present disclosure.
Figure 35B:
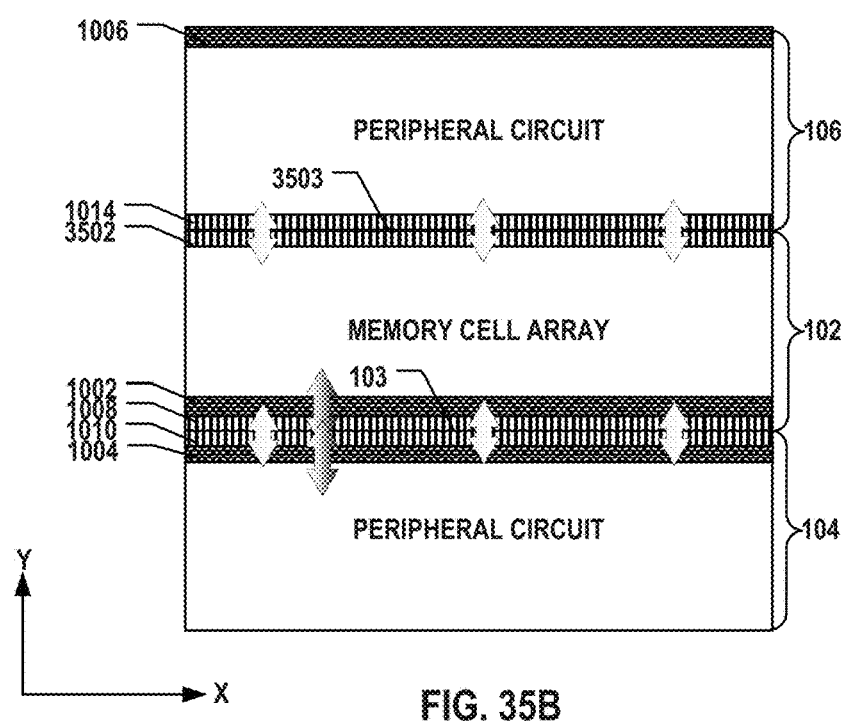

FIGS. 35A and 35B illustrate schematic views of cross-sections of 3D memory devices 3400 and 3401 in FIGS. 34A and 34B, according to some aspects of the present disclosure. 3D memory devices 3500 and 3501 may be examples of 3D memory devices 3400 and 3401 in FIGS. 34A and 34B. As shown in FIG. 35A, 3D memory device 3500 can include stacked first, second, and third semiconductor structures 102, 104, and 106. In some implementations, first semiconductor structure 102 in the intermediate of 3D memory device 3500 includes semiconductor layer 1002, a bonding layer 3502, and a memory cell array vertically between bonding layer 3502 and semiconductor layer 1002. The memory cell array can include an array of NAND memory strings (e.g., NAND memory strings 208 disclosed herein), and the sources of the array of NAND memory strings can be in contact with semiconductor layer 1002 (e.g., as shown in FIGS. 8A-8C). Semiconductor layer 1002 can include semiconductor materials, such as single crystalline silicon (e.g., a silicon substrate or a thinned silicon substrate) or polysilicon (e.g., a deposited layer), for example, depending on the types of channel structures of the NAND memory strings (e.g., bottom plug channel structure 812A, sidewall plug channel structure 812B, or bottom open channel structure 812C). Through contacts (e.g., ILVs/TSVs) can make direct, short-distance (e.g., submicron-level) electrical connections through semiconductor layer 1002. Bonding layer 3502 can include conductive bonding contacts (not shown) and dielectrics electrically isolating the bonding contacts, which can be used, for example, for hybrid bonding. In some implementations, bonding layer 3502 is disposed vertically between bonding interface 3503 and the memory cell array in first semiconductor structure 102.

In some implementations, second semiconductor structure 104 on one side of 3D memory device 3500 includes a semiconductor layer 1004 and some of the peripheral circuits of the memory cell array. In some implementations, semiconductor layer 1004 is disposed vertically between bonding interface 103 and the peripheral circuits of second semiconductor structure 104. The transistors (e.g., planar transistors 500 and 3D transistors 600) of the peripheral circuits can be in contact with semiconductor layer 1004. Semiconductor layer 1004 can include semiconductor materials, such as single crystalline silicon (e.g., a layer transferred from a silicon substrate or an SOI substrate). It is understood that in some examples, different from semiconductor layer 1002 in first semiconductor structure 102, semiconductor layer 1004 on which the transistors are formed may include single crystalline silicon, but not polysilicon, due to the superior carrier mobility of single crystalline silicon that is desirable for transistors' performance. Through contacts (e.g., ILVs/TSVs) can make direct, short-distance (e.g., submicron-level) electrical connections through semiconductor layer 1004.

Bonding interface 103 is vertically between and in contact with bonding layers 1008 and 1010, respectively, according to some implementations. Through contacts (e.g., ILVs/TSVs) through semiconductor layers 1002 and 1004 and in contact with each other at bonding interface 103 can make direct, short-distance (e.g., micron-level) electrical connections between adjacent semiconductor structures 102 and 104.

In some implementations, third semiconductor structure 106 on another side of 3D memory device 3500 includes a semiconductor layer 1006, a bonding layer 1014, and some of the peripheral circuits of the memory cell array that are vertically between semiconductor layer 1006 and bonding interface 3503. The transistors (e.g., planar transistors 500 and 3D transistors 600) of the peripheral circuits can be in contact with semiconductor layer 1006. Semiconductor layer 1006 can include semiconductor materials, such as single crystalline silicon (e.g., a silicon substrate or a thinned silicon substrate). It is understood that in some examples, different from semiconductor layer 1002 in first semiconductor structure 102, semiconductor layer 1006 on which the transistors are formed may include single crystalline silicon, but not polysilicon, due to the superior carrier mobility of single crystalline silicon that is desirable for transistors' performance. Bonding layer 1014 can also include conductive bonding contacts (not shown) and dielectrics electrically isolating the bonding contacts, which can be used, for example, for hybrid bonding.

Bonding interface 3503 is vertically between and in contact with bonding layers 3502 and 1014, respectively, according to some implementations. That is, bonding layers 3502 and 1014 can be disposed on opposite sides of bonding interface 3503, and the bonding contacts of bonding layer 3502 can be in contact with the bonding contacts of bonding layer 1014 at bonding interface 3503. As a result, a large number (e.g., millions) of bonding contacts across bonding interface 3503 can make direct, short-distance (e.g., micron-level) electrical connections between adjacent semiconductor structures 102 and 106.

It is understood that in some examples, first and second semiconductor structures 102 and 104 may also include bonding layers 1008 and 1010, respectively, disposed on opposite sides of bonding interface 103, as shown in FIG. 35B. In FIG. 35B, first semiconductor structure 102 of a 3D memory device 3501 can include two bonding layers 1008 and 3502 on two sides thereof, and bonding layer 1008 can be disposed vertically between semiconductor layer 1002 and bonding interface 103. Second semiconductor structure 104 of 3D memory device 3501 can include bonding layer 1010 disposed vertically between bonding interface 103 and semiconductor layer 1004. Each bonding layer 1008 or 1010 can include conductive bonding contacts (not shown) and dielectrics electrically isolating the bonding contacts. The bonding contacts of bonding layer 1008 can be in contact with the bonding contacts of bonding layer 1010 at bonding interface 103. As a result, bonding contacts across bonding interface 103 in conjunction with through contacts (e.g., ILVs/TSVs) through semiconductor layers 1002 and 1004 can make direct, short-distance (e.g., micron-level) electrical connections between adjacent semiconductor structures 104 and 102.

As shown in FIGS. 35A and 35B, since third and first semiconductor structures 106 and 102 are bonded in a face-to-face manner (e.g., semiconductor layer 1006 being disposed on the top side of third semiconductor structure 106, while semiconductor layer 1002 being disposed on the bottom side of first semiconductor structure 102 in FIGS. 35A and 35B), the transistors in third semiconductor structure 106 and the memory cell array in first semiconductor structure 102 face toward each other, according to some implementations. In some implementations, semiconductor layer 1004 is disposed vertically between the transistors of the peripheral circuits in second semiconductor structure 104 and bonding interface 103, and the transistors of the peripheral circuits in third semiconductor structure 106 are disposed vertically between bonding interface 105 and semiconductor layer 1006. Moreover, since first and second semiconductor structures 102 and 104 are bonded in a back-to-back manner (e.g., semiconductor layer 1004 being disposed on the top side of second semiconductor structure 104, while semiconductor layer 1002 being disposed on the bottom side of first semiconductor structure 102 in FIGS. 35A and 35B), the transistors of peripheral circuits in second semiconductor structure 104 and the memory cell array in first semiconductor structure 102 face away from each other, according to some implementations. It is understood that pad-out interconnect layer 902 in FIGS. 9A and 9B is omitted from 3D memory device 3500 in FIG. 35 for ease of illustration and may be included in 3D memory device 3500 as described above with respect to FIGS. 9A and 9B.

As described above, second and third semiconductor structures 104 and 106 can have peripheral circuits having transistors with different applied voltages. For example, second semiconductor structure 104 may be one example of semiconductor structure 408 including LLV circuits 402 (and LV circuits 404 in some examples) in FIG. 4B, and third semiconductor structure 106 may be one example of semiconductor structure 410 including HV circuits 406 (and LV circuits 404 in some examples) in FIG. 4B, or vice versa. Thus, in some implementations, semiconductor layers 1006 and 1004 in third and second semiconductor structures 106 and 104 have different thicknesses to accommodate the transistors with different applied voltages. In one example, third semiconductor structure 106 may include HV circuits 406 and second semiconductor structure 104 may include LLV circuits 402, and the thickness of semiconductor layer 1006 in third semiconductor structure 106 may be larger than the thickness of semiconductor layer 1004 in second semiconductor structure 104. Moreover, in some implementations, the gate dielectrics of the transistors in third and second semiconductor structures 106 and 104 have different thicknesses as well to accommodate the different applied voltages. In one example, third semiconductor structure 106 may include HV circuits 406 and second semiconductor structure 104 may include LLV circuits 402, and the thickness of the gate dielectrics of the transistors in third semiconductor structure 106 may be larger (e.g., at least 5-fold) than the thickness of the gate dielectrics of the transistors in second semiconductor structure 104.

Figure 36A:
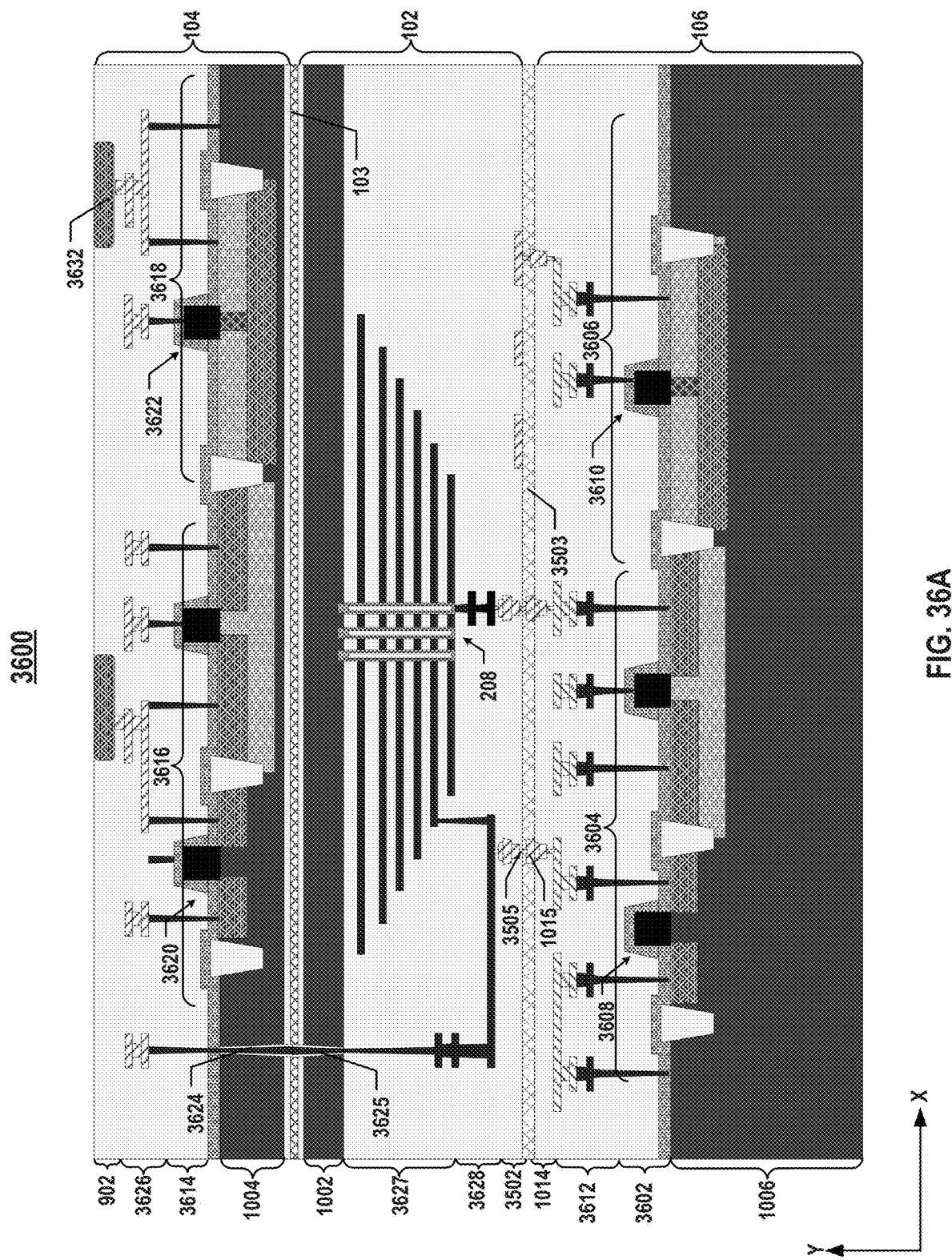
FIGS. 36A and 36B illustrate side views of various examples of the 3D memory devices in FIGS. 35A and 35B, according to various aspects of the present disclosure.
Figure 36B:
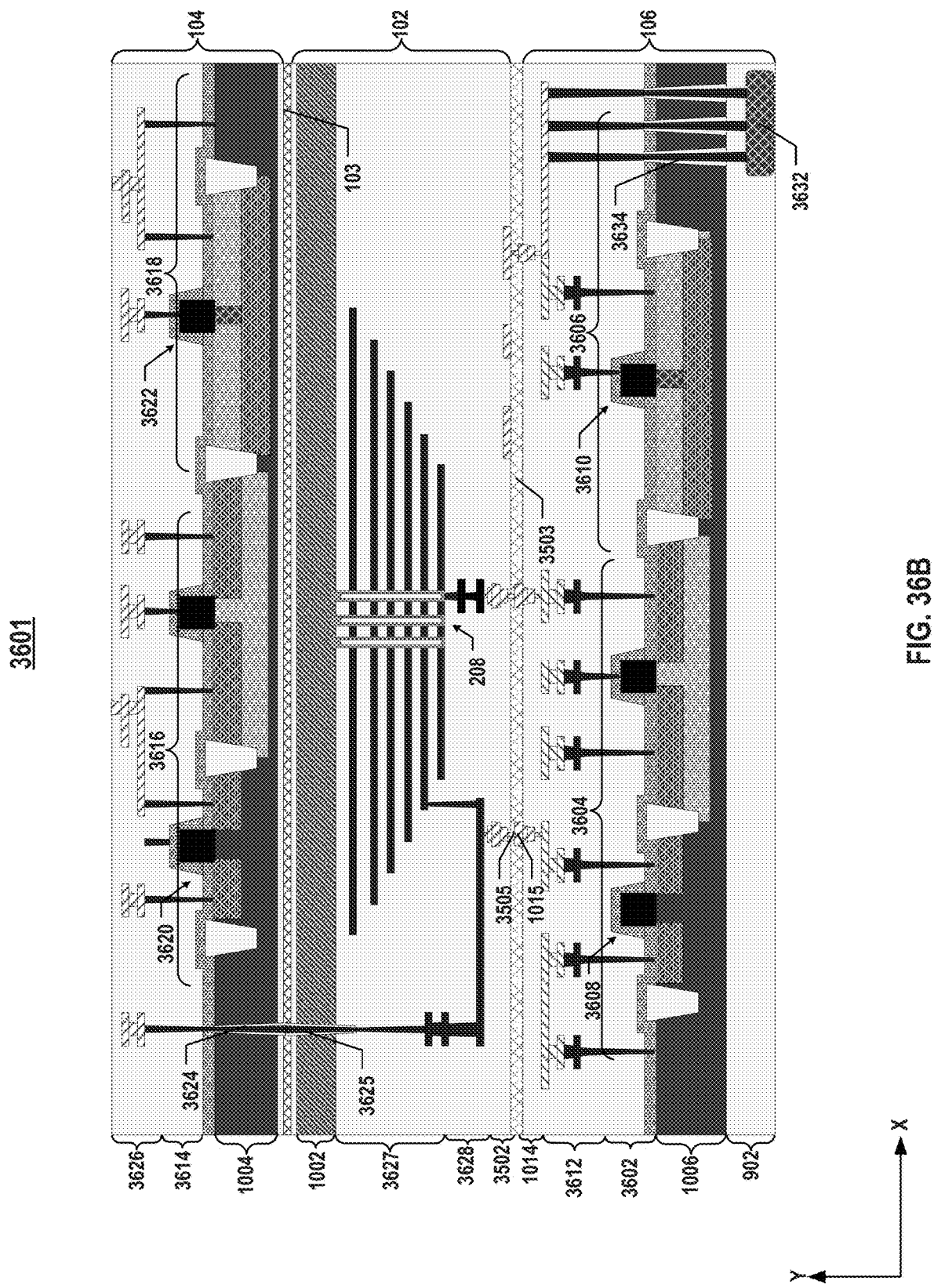

FIGS. 36A and 36B illustrate side views of various examples of 3D memory devices 3500 and 3501 in FIGS. 35A and 35B, according to various aspects of the present disclosure. As shown in FIG. 36A, as one example of 3D memory devices 3500 and 3501 in FIGS. 35A and 35B, 3D memory device 3600 is a bonded chip including first semiconductor structure 102, second semiconductor structure 104, and third semiconductor structure 106, which are stacked over one another in different planes in the vertical direction (e.g., they-direction in FIG. 36A), according to some implementations. First and second semiconductor structures 102 and 104 are bonded at bonding interface 103 therebetween, and first and third semiconductor structures 102 and 106 are bonded at bonding interface 3503 therebetween, according to some implementations.

As shown in FIG. 36A, third semiconductor structure 106 can include semiconductor layer 1006 having semiconductor materials. In some implementations, semiconductor layer 1006 is a silicon substrate having single crystalline silicon. Third semiconductor structure 106 can also include a device layer 3602 above and in contact with semiconductor layer 1006. In some implementations, device layer 3602 includes a first peripheral circuit 3604 and a second peripheral circuit 3606. First peripheral circuit 3604 can include HV circuits 406, such as driving circuits (e.g., string drivers 704 in row decoder/word line driver 308 and drivers in column decoder/bit line driver 306), and second peripheral circuit 3606 can include LV circuits 404, such as page buffer circuits (e.g., page buffer circuits 702 in page buffer 304) and logic circuits (e.g., in control logic 312). In some implementations, first peripheral circuit 3604 includes a plurality of transistors 3608 in contact with semiconductor layer 1006, and second peripheral circuit 3606 includes a plurality of transistors 3610 in contact with semiconductor layer 1006. Transistors 3608 and 3610 can include any transistors disclosed herein, such as planar transistors 500 and 3D transistors 600. As described above in detail with respect to transistors 500 and 600, in some implementations, each transistor 3608 or 3610 includes a gate dielectric, and the thickness of the gate dielectric of transistor 3608 (e.g., in HV circuit 406) is larger than the thickness of the gate dielectric of transistor 3610 (e.g., in LV circuit 404) due to the higher voltage applied to transistor 3608 than transistor 3610. Trench isolations (e.g., STIs) and doped regions (e.g., wells, sources, and drains of transistors 3608 and 3610) can be formed on or in semiconductor layer 1006 as well.

In some implementations, third semiconductor structure 106 further includes an interconnect layer 3612 above device layer 3602 to transfer electrical signals to and from peripheral circuits 3606 and 3604. As shown in FIG. 36A, interconnect layer 3612 can be disposed vertically between bonding interface 3503 and device layer 3602 (including transistors 3608 and 3610 of peripheral circuits 3604 and 3606). Interconnect layer 3612 can include a plurality of interconnects. The interconnects in interconnect layer 3612 can be coupled to transistors 3608 and 3610 of peripheral circuits 3604 and 3606 in device layer 3602. Interconnect layer 3612 can further include one or more ILD layers in which the lateral lines and vias can form. That is, interconnect layer 3612 can include lateral lines and vias in multiple ILD layers. In some implementations, the devices in device layer 3602 are coupled to one another through the interconnects in interconnect layer 3612. For example, peripheral circuit 3604 may be coupled to peripheral circuit 3606 through interconnect layer 3612. The interconnects in interconnect layer 3612 can include conductive materials including, but not limited to, W, Co, Cu, Al, silicides, or any combination thereof. The ILD layers in interconnect layer 3612 can include dielectric materials including, but not limited to, silicon oxide, silicon nitride, silicon oxynitride, low-k dielectrics, or any combination thereof.

As shown in FIG. 36A, third semiconductor structure 106 can further include a bonding layer 1014 at bonding interface 3503 and above and in contact with interconnect layer 3612. Bonding layer 1014 can include a plurality of bonding contacts 1015 and dielectrics electrically isolating bonding contacts 1015. Bonding contacts 1015 can include conductive materials including, but not limited to, W, Co, Cu, Al, silicides, or any combination thereof. In some implementations, the bonding contacts of bonding layer 1014 include Cu. The remaining area of bonding layer 1014 can be formed with dielectrics including, but not limited to, silicon oxide, silicon nitride, silicon oxynitride, low-k dielectrics, or any combination thereof. Bonding contacts 1015 and surrounding dielectrics in bonding layer 1014 can be used for hybrid bonding (also known as "metal/dielectric hybrid bonding"), which is a direct bonding technology (e.g., forming bonding between surfaces without using intermediate layers, such as solder or adhesives) and can obtain metal-metal (e.g., Cu-to-Cu) bonding and dielectric-dielectric (e.g., $SiO_2$-to-$SiO_2$) bonding simultaneously.

As shown in FIG. 36A, first semiconductor structure 102 can also include a bonding layer 3502 at bonding interface 3503, e.g., on the opposite side of bonding interface 3503 with respect to bonding layer 1014 in third semiconductor structure 106. Bonding layer 3502 can include a plurality of bonding contacts 3505 and dielectrics electrically isolating bonding contacts 3505. Bonding contacts 3505 can include conductive materials, such as Cu. The remaining area of bonding layer 3502 can be formed with dielectric materials, such as silicon oxide. Bonding contacts 3505 and surrounding dielectrics in bonding layer 3502 can be used for hybrid bonding. In some implementations, bonding interface 3503 is the place at which bonding layers 3502 and 1014 are met and bonded. In practice, bonding interface 3503 can be a layer with a certain thickness that includes the top surface of bonding layer 1014 of third semiconductor structure 106 and the bottom surface of bonding layer 3502 of first semiconductor structure 102.

As shown in FIG. 36A, first semiconductor structure 102 can further include an interconnect layer 3628 above and in contact with bonding layer 3502 to transfer electrical signals. Interconnect layer 3628 can include a plurality of interconnects, such as MEOL interconnects and BEOL interconnects. In some implementations, the interconnects in interconnect layer 3628 also include local interconnects, such as bit line contacts and word line contacts. Interconnect layer 3628 can further include one or more ILD layers in which the lateral lines and vias can form. The interconnects in interconnect layer 3628 can include conductive materials including, but not limited to, W, Co, Cu, Al, silicides, or any combination thereof. The ILD layers in interconnect layer 3628 can include dielectric materials including, but not limited to, silicon oxide, silicon nitride, silicon oxynitride, low-k dielectrics, or any combination thereof.

As shown in FIG. 36A, first semiconductor structure 102 can further include a memory cell array, such as an array of NAND memory strings 208 above and in contact with interconnect layer 3628. In some implementations, interconnect layer 3628 is vertically between NAND memory strings 208 and bonding interface 3503. Each NAND memory string 208 extends vertically through a plurality of pairs each including a conductive layer and a dielectric layer, according to some implementations. The stacked and interleaved conductive layers and dielectric layers are also referred to herein as a stack structure, e.g., a memory stack 3627. Memory stack 3627 may be an example of memory stack 804 in FIGS. 8A-8C, and the conductive layer and dielectric layer in memory stack 3627 may be examples of gate conductive layers 806 and dielectric layer 808, respectively, in memory stack 804. The interleaved conductive layers and dielectric layers in memory stack 3627 alternate in the vertical direction, according to some implementations. Each conductive layer can include a gate electrode (gate line) surrounded by an adhesive layer and a gate dielectric layer. The gate electrode of the conductive layer can extend laterally as a word line, ending at one or more staircase structures of memory stack 3627.

In some implementations, each NAND memory string 208 is a "charge trap" type of NAND memory string including any suitable channel structures disclosed herein, such as bottom plug channel structure 812A, sidewall plug channel structure 812B, or bottom open channel structure 812C, described above in detail with respect to FIGS. 8A-8C. It is understood that NAND memory strings 208 are not limited to the "charge trap" type of NAND memory strings and may be "floating gate" type of NAND memory strings in other examples.

As shown in FIG. 36A, first semiconductor structure 102 can further include semiconductor layer 1002 disposed above memory stack 3627 and in contact with the sources of NAND memory strings 208. In some implementations, semiconductor layer 1002 is disposed vertically between bonding interface 103 and NAND memory strings 208. Semiconductor layer 1002 can include semiconductor materials. In some implementations, semiconductor layer 1002 is a thinned silicon substrate having single crystalline silicon on which memory stack 3627 and NAND memory strings 208 (e.g., including bottom plug channel structure 812A or sidewall plug channel structure 812B) are formed. It is understood that in some examples, trench isolations and doped regions (not shown) may be formed in semiconductor layer 1002 as well.

As shown in FIG. 36A, first semiconductor structure 102 can further include one or more contacts 3625 extending vertically through semiconductor layer 1002. In some implementations, contacts 3625 are coupled to the interconnects in interconnect layer 3628. Contact 3625 can include conductive materials including, but not limited to, W, Co, Cu, Al, silicides, or any combination thereof. In some implementations, contact 3625 includes W. In some implementations, contact 3625 includes a via surrounded by a dielectric spacer (e.g., having silicon oxide) to electrically separate the via from semiconductor layer 1002. Depending on the thickness of semiconductor layer 1002, contact 3625 can be an ILV having a depth in the submicron-level (e.g., between 10 nm and 1 µm), or a TSV having a depth in the micron- or tens micron-level (e.g., between 1 µm and 100 µm).

Second semiconductor structure 104 can be bonded with first semiconductor structure 102 in a back-to-back manner at bonding interface 103. Second semiconductor structure 104 can include semiconductor layer 1004 having semiconductor materials. In some implementations, bonding interface 103 is disposed vertically between semiconductor layer 1002 and semiconductor layer 1004 as a result of anodic bonding or fusion bonding as described below in detail. In some implementations, bonding interface 103 is the place at which semiconductor layer 1002 and semiconductor layer 1004 are met and bonded. In practice, bonding interface 103 can be a layer with a certain thickness that includes the top surface of semiconductor layer 1002 of first semiconductor structure 102 and the bottom surface of semiconductor layer 1004 of second semiconductor structure 104. In some implementations, dielectric layer(s) (e.g., silicon oxide layer) are formed vertically between bonding interface 103 and semiconductor layer 1004 and/or between bonding interface 103 and semiconductor layer 1002 to facilitate the fusion bonding or anodic bonding of semiconductor layers 1002 and 1004. Thus, it is understood that bonding interface 103 may include the surfaces of the dielectric layer(s) in some examples. It is further understood that in some examples, bonding layers having bonding contacts (e.g., Cu contacts) may be formed vertically between bonding interface 103 and semiconductor layer 1004 and between bonding interface 103 and semiconductor layer 1002 to achieve hybrid bonding of semiconductor layers 1002 and 1004. In other words, a dielectric layer (e.g., silicon oxide layer) may be disposed vertically between semiconductor layer 1004 and semiconductor layer 1002 in some examples, which can serve as a shielding layer between the components formed on semiconductor layer 1002 and the components formed on semiconductor layer 1004, for example, for reducing the impact across bonding interface 103 on the threshold voltage of transistors 3620 and 3622 caused by memory stack 3627 and NAND memory strings 208.

Second semiconductor structure 104 can include a device layer 3614 above and in contact with semiconductor layer 1004. In some implementations, device layer 3614 includes a third peripheral circuit 3616 and a fourth peripheral circuit 3618. Third peripheral circuit 3616 can include LLV circuits 402, such as I/O circuits (e.g., in interface 316 and data bus 318), and fourth peripheral circuit 3618 can include LV circuits 404, such as page buffer circuits (e.g., page buffer circuits 702 in page buffer 304) and logic circuits (e.g., in control logic 312). In some implementations, third peripheral circuit 3616 includes a plurality of transistors 3620, and fourth peripheral circuit 3618 includes a plurality of transistors 3622 as well. Transistors 3620 and 3622 can include any transistors disclosed herein, such as planar transistors 500 and 3D transistors 600. As described above in detail with respect to transistors 500 and 600, in some implementations, each transistor 3620 or 3622 includes a gate dielectric, and the thickness of the gate dielectric of transistor 3620 (e.g., in LLV circuit 402) is smaller than the thickness of the gate dielectric of transistor 3622 (e.g., in LV circuit 404) due to the lower voltage applied to transistor 3620 than transistor 3622. Trench isolations (e.g., STIs) and doped regions (e.g., wells, sources, and drains of transistors 3620 and 3622) can be formed on or in semiconductor layer 1004 as well.

Moreover, the different voltages applied to different transistors 3620, 3622, 3608, and 3610 in second and third semiconductor structures 104 and 106 can lead to differences of device dimensions between second and third semiconductor structures 104 and 106. In some implementations, the thickness of the gate dielectric of transistor 3608 (e.g., in HV circuit 406) is larger than the thickness of the gate dielectric of transistor 3620 (e.g., in LLV circuit 402) due to the higher voltage applied to transistor 3608 than transistor 3620. In some implementations, the thickness of the gate dielectric of transistor 3622 (e.g., in LV circuit 404) is the same as the thickness of the gate dielectric of transistor 3610 (e.g., in LV circuit 404) due to the same voltage applied to transistor 3622 and transistor 3610. In some implementations, the thickness of semiconductor layer 1006 in which transistor 3608 (e.g., in HV circuit 406) is formed is larger than the thickness of semiconductor layer 1004 in which transistor 3620 (e.g., in LLV circuit 402) is formed due to the higher voltage applied to transistor 3608 than transistor 3620.

As shown in FIG. 36A, second semiconductor structure 104 can further include an interconnect layer 3626 above and in contact with device layer 3614 to transfer electrical signals to and from peripheral circuits 3616 and 3618. As shown in FIG. 36A, device layer 1714 (including transistors 1720 and 1722 of peripheral circuits 1716 and 1718) can be vertically between bonding interface 103 and interconnect layer 3626. Interconnect layer 3626 can include a plurality of interconnects coupled to transistors 3620 and 3622 of peripheral circuits 3616 and 3618 in device layer 3614. Interconnect layer 3626 can further include one or more ILD layers in which the interconnects can form. That is, interconnect layer 3626 can include lateral lines and vias in multiple ILD layers. In some implementations, the devices in device layer 3614 are coupled to one another through the interconnects in interconnect layer 3626. For example, peripheral circuit 3616 may be coupled to peripheral circuit 3618 through interconnect layer 3626. The interconnects in interconnect layer 3626 can include conductive materials including, but not limited to, W, Co, Cu, Al, silicides, or any combination thereof. The ILD layers in interconnect layer 3626 can include dielectric materials including, but not limited to, silicon oxide, silicon nitride, silicon oxynitride, low-k dielectrics, or any combination thereof.

In some implementations, the interconnects in interconnect layer 3626 include Cu, which has a relatively low resistivity (better electrical performance) among conductive metal materials. As described below with respect to the fabrication process, although Cu has a relatively low thermal budget (incompatible with high-temperature processes), since the fabrication of interconnect layer 3626 can occur after the high-temperature processes in forming device layer 3614 in second semiconductor structure 104 and devices in first semiconductor structure 102, as well as being separated from the high temperature processes in forming third semiconductor structure 106, the interconnects of interconnect layer 3626 having Cu can become feasible.

As shown in FIG. 36A, second semiconductor structure 104 can further include one or more contacts 3624 extending vertically through semiconductor layer 1004. In some implementations, contacts 3624 are coupled to the interconnects in interconnect layer 3626. In some implementations, contact 3624 is in contact with contact 3625, such that contacts 3624 and 3625 couple the interconnects in interconnect layer 3626 to the interconnects in interconnect layer 3628 to make an electrical connection across bonding interface 103 between second and first semiconductor structures 104 and 102 and through semiconductor layers 1004 and 1002. Contact 3624 can include conductive materials including, but not limited to, W, Co, Cu, Al, silicides, or any combination thereof. In some implementations, contact 3624 includes a via surrounded by a dielectric spacer (e.g., having silicon oxide) to electrically separate the via from semiconductor layer 1004. Depending on the thickness of semiconductor layer 1004, contact 3624 can be an ILV having a depth in the submicron-level (e.g., between 10 nm and 1 μm), or a TSV having a depth in the micron- or tens micron-level (e.g., between 1 μm and 100 μm).

As shown in FIG. 36A, second semiconductor structure 104 can further include a pad-out interconnect layer 902 above and in contact with interconnect layer 3626. In some implementations, device layer 3614 having transistors 3620 and 3622 is disposed vertically between pad-out interconnect layer 902 and semiconductor layer 1004. Pad-out interconnect layer 902 can include interconnects, e.g., contact pads 3632, in one or more ILD layers. Pad-out interconnect layer 902 and interconnect layer 3626 can be formed on the same side of semiconductor layer 1004. In some implementations, the interconnects in pad-out interconnect layer 902 can transfer electrical signals between 3D memory device 3600 and external devices, e.g., for pad-out purposes.

As a result, peripheral circuits 3604, 3606, 3616, and 3618 in third and second semiconductor structures 106 and 104 can be coupled to NAND memory strings 208 in first semiconductor structure 102 through various interconnection structures, including interconnect layers 3612, 3626, and 3628 and contacts 3624 and 3625. Moreover, peripheral circuits 3604, 3606, 3616, and 3618 and NAND memory strings 208 in 3D memory device 3600 can be further coupled to external devices through pad-out interconnect layer 902.

It is understood that the pad-out of 3D memory devices is not limited to from second semiconductor structure 104 having transistors 3620 and 3622 as shown in FIG. 36A (corresponding to FIG. 34B) and may be from third semiconductor structure 106 having transistors 3608 and 3610 (corresponding to FIG. 34A). For example, as shown in FIG. 36B, 3D memory device 3601 may include pad-out interconnect layer 902 in third semiconductor structure 106. Pad-out interconnect layer 902 can be in contact with semiconductor layer 1006 of third semiconductor layer 1006 on which transistors 3608 and 3610 are formed. In some implementations, third semiconductor structure 106 further includes one or more contacts 3634 extending vertically through semiconductor layer 1006. In some implementations, contact 3634 couples the interconnects in interconnect layer 3612 in third semiconductor structure 106 to contact pads 3632 in pad-out interconnect layer 902 to make an electrical connection through semiconductor layer 1006. Contact 3634 can include conductive materials including, but not limited to, W, Co, Cu, Al, silicides, or any combination thereof. In some implementations, contact 3634 includes W. In some implementations, contact 3634 includes a via surrounded by a dielectric spacer (e.g., having silicon oxide) to electrically separate the via from semiconductor layer 1006. Depending on the thickness of semiconductor layer 1006, contact 3634 can be an ILV having a depth in the submicron-level (e.g., between 10 nm and 1 µm), or a TSV having a depth in the micron- or tens micron-level (e.g., between 1 µm and 100 µm).

It is further understood that the material of semiconductor layer 1002 in first semiconductor structure 102 is not limited to single crystalline silicon as described above with respect to FIG. 36A and may be any other suitable semiconductor materials. For example, as shown in FIG. 36B, 3D memory device 3601 may include semiconductor layer 1002 having polysilicon in first semiconductor structure 102. NAND memory strings 208 of 3D memory device 3601 in contact with semiconductor layer 1002 having polysilicon can include any suitable channel structures disclosed herein that are in contact with a polysilicon layer, such as bottom open channel structure 812C. In some implementations, NAND memory strings 208 of 3D memory device 3601 are "floating gate" type of NAND memory strings, and semiconductor layer 1002 having polysilicon is in contact with the "floating gate" type of NAND memory strings as the source plate thereof. It is understood that the details of the same components (e.g., materials, fabrication process, functions, etc.) in both 3D memory devices 3600 and 3601 are not repeated for ease of description.

FIGS. 37A-37G illustrate a fabrication process for forming the 3D memory device in FIGS. 35A and 35B, according to some aspects of the present disclosure. FIG. 38 illustrates a flowchart of another method 3800 for forming the 3D memory devices in FIGS. 35A and 35B, according to some aspects of the present disclosure. Examples of the 3D memory devices depicted in FIGS. 37A-37G and 38 include 3D memory devices 3600 and 3601 depicted in FIGS. 36A and 36B. FIGS. 37A-37G and 38 will be described together. It is understood that the operations shown in method 3800 are not exhaustive and that other operations can be performed as well before, after, or between any of the illustrated operations. Further, some of the operations may be performed simultaneously, or in a different order than shown in FIG. 38. For example, operation 3802, 3804, and 3806 may be performed in parallel.

Referring to FIG. 38, method 3800 starts at operation 3802, in which an array of NAND memory strings is formed on a first substrate. The first substrate can be a silicon substrate having single crystalline silicon. In some implementations, to form the array of NAND memory strings, a memory stack is formed on the first substrate.

Figure 37A:
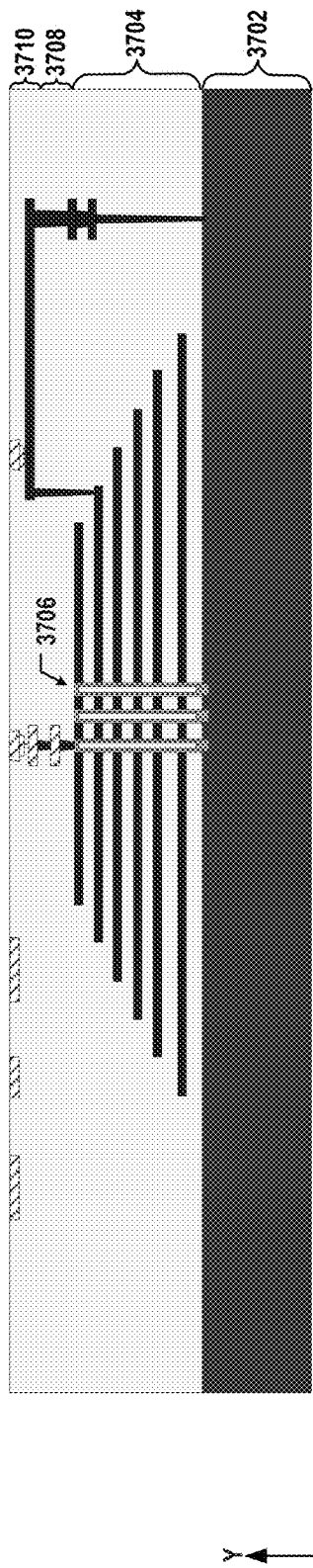
FIGS. 37A-37G illustrate a fabrication process for forming the 3D memory device in FIGS. 35A and 35B, according to some aspects of the present disclosure.
Figure 38:
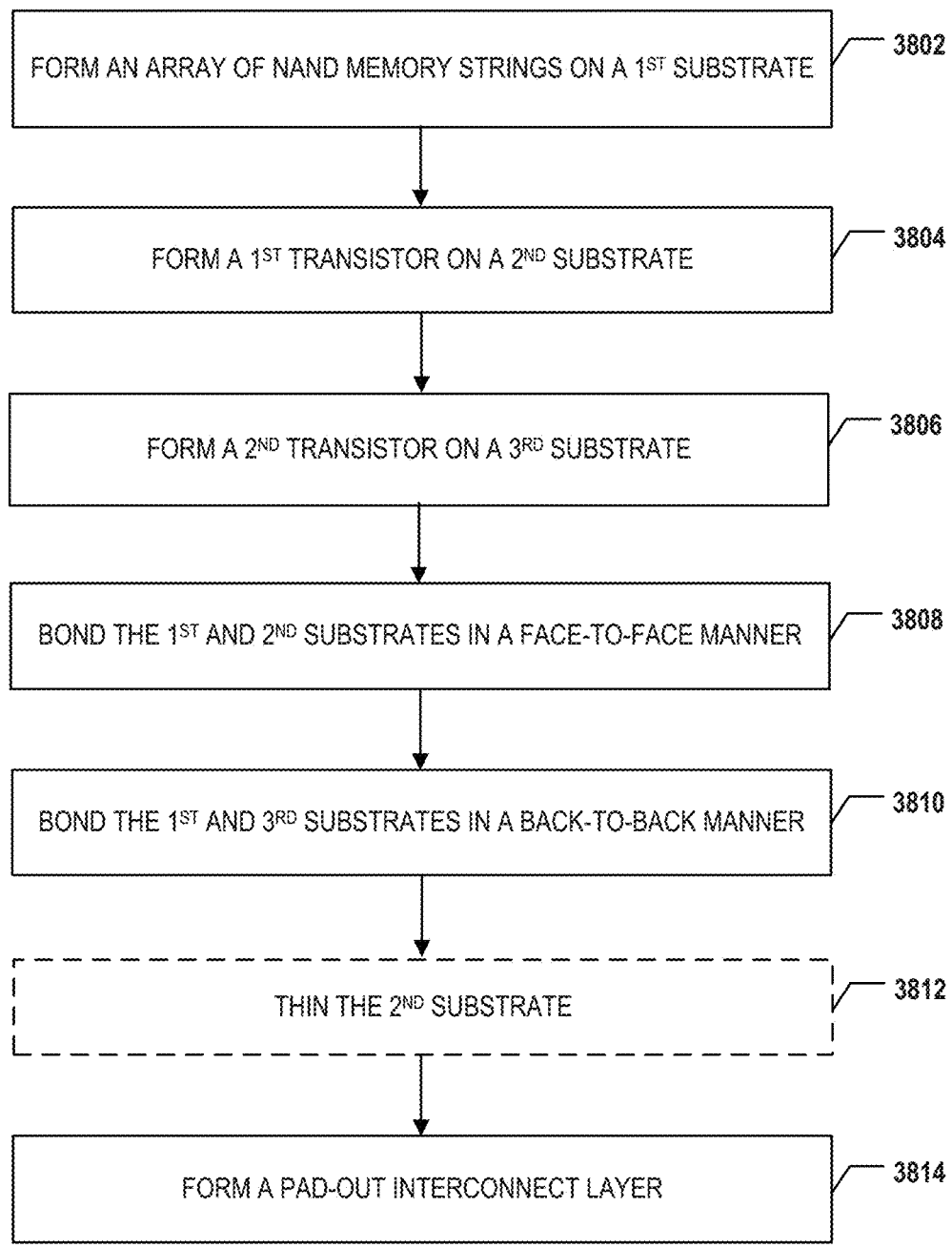
FIG. 38 illustrates a flowchart of a method for forming the 3D memory device in FIGS. 35A and 35B, according to some aspects of the present disclosure.

As illustrated in FIG. 37A, a stack structure, such as a memory stack 3704 including interleaved conductive layers and dielectric layers, is formed on a silicon substrate 3702. To form memory stack 3704, in some implementations, a dielectric stack (not shown) including interleaved sacrificial layers (not shown) and the dielectric layers is formed on silicon substrate 3702. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. Memory stack 3704 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that memory stack 3704 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between memory stack 3704 and silicon substrate 3702.

As illustrated in FIG. 37A, NAND memory strings 3706 are formed above silicon substrate 3702, each of which extends vertically through memory stack 3704 to be in contact with silicon substrate 3702. In some implementations, fabrication processes to form NAND memory string 3706 include forming a channel hole through memory stack 3704 (or the dielectric stack) and into silicon substrate 3702 using dry etching/and or wet etching, such as DRIE, followed by subsequently filling the channel hole with a plurality of layers, such as a memory film (e.g., a tunneling layer, a storage layer, and a blocking layer) and a semiconductor layer, using thin film deposition processes such as ALD, CVD, PVD, or any combination thereof. It is understood that the details of fabricating NAND memory strings 3706 may vary depending on the types of channel structures of NAND memory strings 3706 (e.g., bottom plug channel structure 812A, sidewall plug channel structure 812B, or bottom open channel structure 812C in FIGS. 8A-8C) and thus, are not elaborated for ease of description.

In some implementations, an interconnect layer is formed above the array of NAND memory strings on the first substrate. The interconnect layer can include a first plurality of interconnects in one or more ILD layers. As illustrated in FIG. 37A, an interconnect layer 3708 is formed above memory stack 3704 and NAND memory strings 3706. Interconnect layer 3708 can include interconnects of MEOL and/or BEOL in a plurality of ILD layers to make electrical connections with NAND memory strings 3706. In some implementations, interconnect layer 3708 includes multiple ILD layers and interconnects therein formed in multiple processes. For example, the interconnects in interconnect layer 3708 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 37A can be collectively referred to as interconnect layer 3708.

In some implementations, a first bonding layer is formed above interconnect layer. The first bonding layer can include a plurality of first bonding contacts. As illustrated in FIG. 37A, a bonding layer 3710 is formed above interconnect layer 3708. Bonding layer 3710 can include a plurality of bonding contacts surrounded by dielectrics. In some implementations, a dielectric layer is deposited on the top surface of interconnect layer 3708 by one or more thin film deposition processes including, but not limited to, CVD, PVD, ALD, or any combination thereof. The bonding contacts can then be formed through the dielectric layer and in contact with the interconnects in interconnect layer 3708 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

Figure 37B:
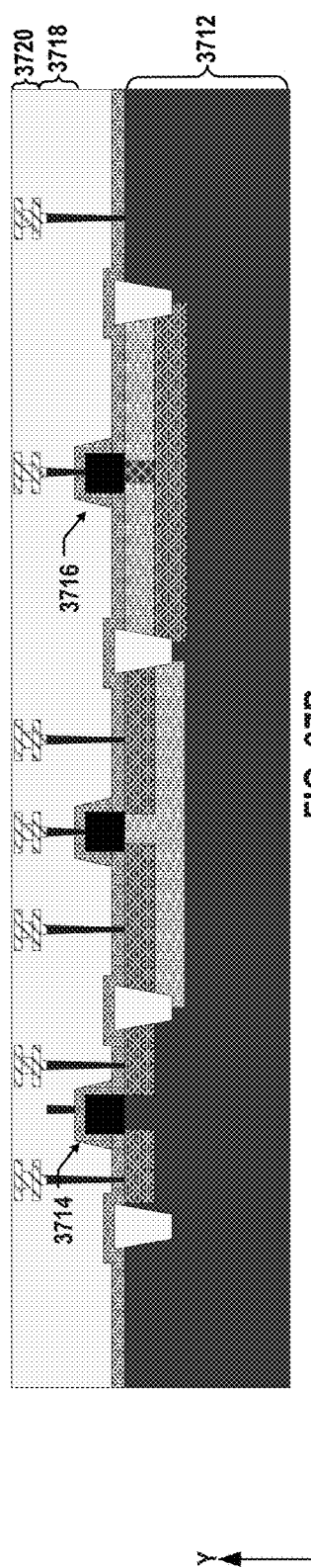

Method 3800 proceeds to operation 3804, as illustrated in FIG. 38, in which a first transistor is formed on a second substrate. The second substrate can be a silicon substrate having single crystalline silicon. As illustrated in FIG. 37B, a plurality of transistors 3714 and 3716 are formed on a silicon substrate 3712. Transistors 3714 and 3716 can be formed by a plurality of processes including, but not limited to, photolithography, dry/wet etch, thin film deposition, thermal growth, implantation, CMP, and any other suitable processes. In some implementations, doped regions are formed in silicon substrate 3712 by ion implantation and/or thermal diffusion, which function, for example, as wells and source/drain regions of transistors 3714 and 3716. In some implementations, isolation regions (e.g., STIs) are also formed in silicon substrate 3712 by wet/dry etch and thin film deposition. In some implementations, the thickness of gate dielectric of transistor 3714 is different from the thickness of gate dielectric of transistor 3716, for example, by depositing a thicker silicon oxide film in the region of transistor 3714 than the region of transistor 3716, or by etching back part of the silicon oxide film deposited in the region of transistor 3716. It is understood that the details of fabricating transistors 3714 and 3716 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer 3718 is formed above the transistor on the second substrate. The interconnect layer can include a plurality of interconnects in one or more ILD layers. As illustrated in FIG. 37B, an interconnect layer 3718 can be formed above transistors 3714 and 3716. Interconnect layer 3718 can include interconnects of MEOL and/or BEOL in a plurality of ILD layers to make electrical connections with transistors 3714 and 3716. In some implementations, interconnect layer 3718 includes multiple ILD layers and interconnects therein formed in multiple processes. For example, the interconnects in interconnect layer 3718 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 37B can be collectively referred to as interconnect layer 3718.

In some implementations, a second bonding layer is formed above interconnect layer. The second bonding layer can include a plurality of second bonding contacts. As illustrated in FIG. 37B, a bonding layer 3720 is formed above interconnect layer 3718. Bonding layer 3720 can include a plurality of bonding contacts surrounded by dielectrics. In some implementations, a dielectric layer is deposited on the top surface of interconnect layer 3718 by one or more thin film deposition processes including, but not limited to, CVD, PVD, ALD, or any combination thereof. The bonding contacts can then be formed through the dielectric layer and in contact with the interconnects in interconnect layer 3718 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

Method 3800 proceeds to operation 3806, as illustrated in FIG. 38, in which a second transistor is formed on a third substrate. The third substrate can be a silicon substrate having single crystalline silicon. In some implementations, any two or all of operations 3802, 3804, and 3806 are performed in parallel to reduce process time.

Figure 37C:
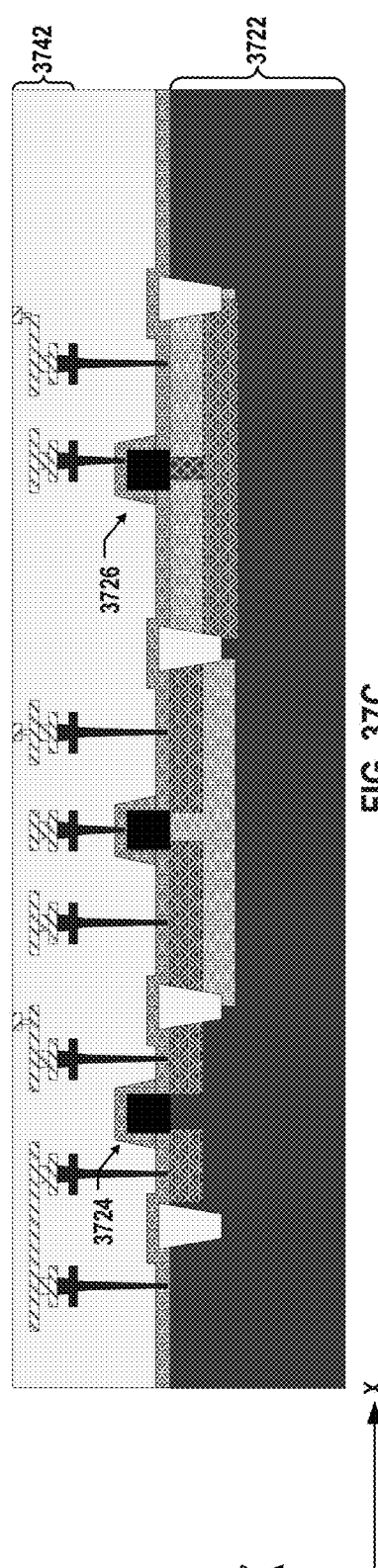

As illustrated in FIG. 37C, a plurality of transistors 3724 and 3726 are formed on a silicon substrate 3722. Transistors 3724 and 3726 can be formed by a plurality of processes including, but not limited to, photolithography, dry/wet etch, thin film deposition, thermal growth, implantation, CMP, and any other suitable processes. In some implementations, doped regions are formed in silicon substrate 3722 by ion implantation and/or thermal diffusion, which function, for example, as wells and source/drain regions of transistors 3724 and 3726. In some implementations, isolation regions (e.g., STIs) are also formed in silicon substrate 3722 by wet/dry etch and thin film deposition. In some implementations, the thickness of gate dielectric of transistor 3724 is different from the thickness of gate dielectric of transistor 3726, for example, by depositing a thicker silicon oxide film in the region of transistor 3724 than the region of transistor 3726, or by etching back part of the silicon oxide film deposited in the region of transistor 3726. It is understood that the details of fabricating transistors 3724 and 3726 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer is formed above the transistor on the third substrate. The interconnect layer can include a plurality of interconnects in one or more ILD layers. As illustrated in FIG. 37C, an interconnect layer 3742 can be formed above transistors 3724 and 3726.

Interconnect layer 3742 can include interconnects of MEOL and/or BEOL in a plurality of ILD layers to make electrical connections with transistors 3724 and 3726. In some implementations, interconnect layer 3742 includes multiple ILD layers and interconnects therein formed in multiple processes. For example, the interconnects in interconnect layer 3742 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 37C can be collectively referred to as interconnect layer 3742. In some implementations, the interconnects in interconnect layer 3742 include Cu, which has a relatively low resistivity among conductive metal materials. It is understood that although Cu has a relatively low thermal budget (incompatible with high-temperature processes), using Cu as the conductive materials of the interconnects in interconnect layer 3742 may become feasible since there are no more high-temperature processes after the fabrication of interconnect layer 3742.

Method 3800 proceeds to operation 3808, as illustrated in FIG. 38, in which the first substrate and the second substrate are bonded in a face-to-face manner. The first bonding contact in the first bonding layer can be in contact with the second bonding contact in the second bonding layer at a first bonding interface after bonding the first and second substrates. The bonding can include hybrid bonding.

Figure 37D:
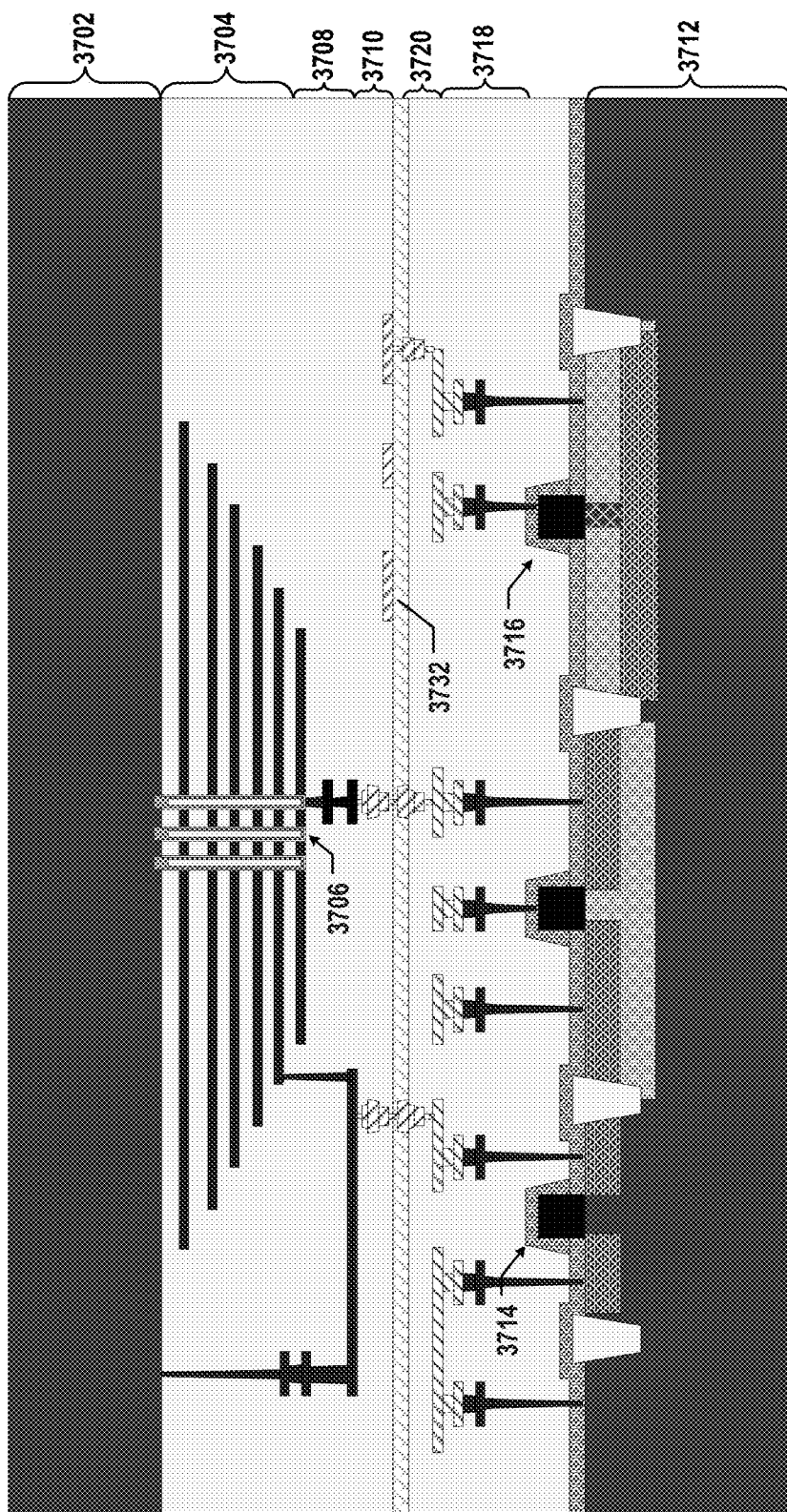

As illustrated in FIG. 37D, silicon substrate 3702 and components formed thereon (e.g., memory stack 3704 and NAND memory strings 3706 formed therethrough) are flipped upside down. Bonding layer 3710 facing down is bonded with bonding layer 3720 facing up, i.e., in a face-to-face manner, thereby forming a bonding interface 3732. That is, silicon substrate 3702 and components formed thereon can be bonded with silicon substrate 3712 and components formed thereon in a face-to-face manner, such that the bonding contacts in bonding layer 3710 are in contact with the bonding contacts in bonding layer 3720 at bonding interface 3732. Transistors 3714 and 3716 and NAND memory strings 3706 can face toward each other after the bonding. In some implementations, a treatment process, e.g., plasma treatment, wet treatment and/or thermal treatment, is applied to bonding surfaces prior to bonding. Although not shown in FIG. 37D, it is understood that in some examples, silicon substrate 3712 and components formed thereon (e.g., transistors 3714 and 3716) can be flipped upside down, and bonding layer 3720 facing down can be bonded with bonding layer 3710 facing up, i.e., in a face-to-face manner, thereby forming bonding interface 3732 as well.

As a result of the bonding, e.g., hybrid bonding, the bonding contacts on opposite sides of bonding interface 3732 can be inter-mixed. After the bonding, the bonding contacts in bonding layer 3710 and the bonding contacts in bonding layer 3720 are aligned and in contact with one another, such that memory stack 3704 and NAND memory strings 3706 formed therethrough can be coupled to transistors 3714 and 3716 through the bonded bonding contacts across bonding interface 3732, according to some implementations.

Figure 37E:
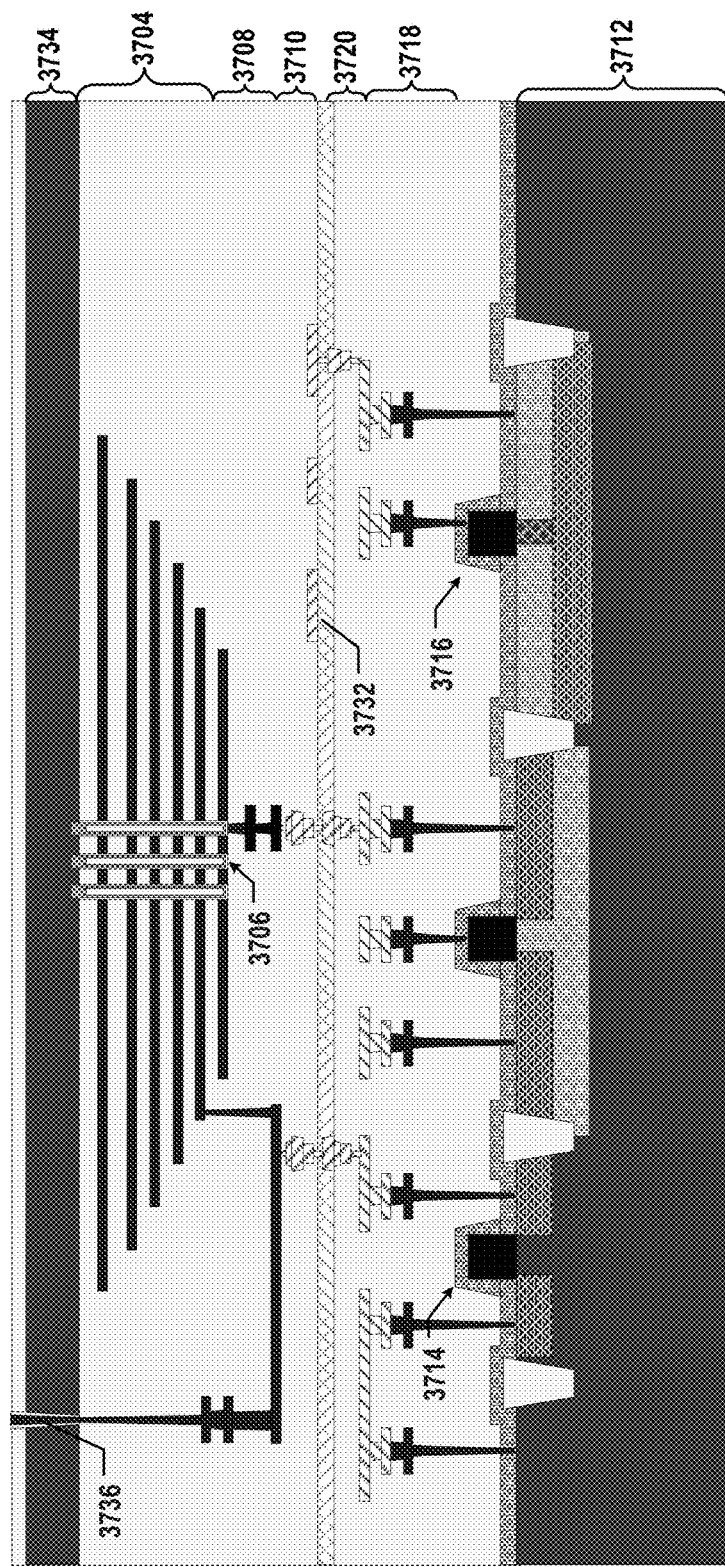

In some implementations, the first substrate is thinned. As illustrated in FIG. 37E, silicon substrate 3702 (shown in FIG. 37D) is thinned to become a semiconductor layer 3734 having single crystalline silicon. Silicon substrate 3702 can be thinned by processes including, but not limited to, wafer grinding, dry etch, wet etch, CMP, any other suitable processes, or any combination thereof.

In some implementations, a first contact through the thinned first substrate is formed. As illustrated in FIG. 37E, one or more contacts 3736 each extending vertically through semiconductor layer 3734 (i.e., the thinned silicon substrate 3702) are formed. Contacts 3736 can be coupled to the interconnects in interconnect layer 3708. Contact 3736 can be formed by first patterning contact holes through semiconductor layer 3734 using patterning process (e.g., photolithography and dry/wet etch of dielectric materials in the dielectric layer). The contact holes can be filled with a conductor (e.g., W or Cu). In some implementations, filling the contact holes includes depositing a spacer (e.g., a silicon oxide layer) before depositing the conductor. It is understood that in some examples, contacts 3736 may be formed in silicon substrate 3702 before thinning (the formation of semiconductor layer 3734, e.g., in FIG. 37A) and be exposed from the backside of silicon substrate 3702 (where the thinning occurs) after the thinning.

Figure 37F:
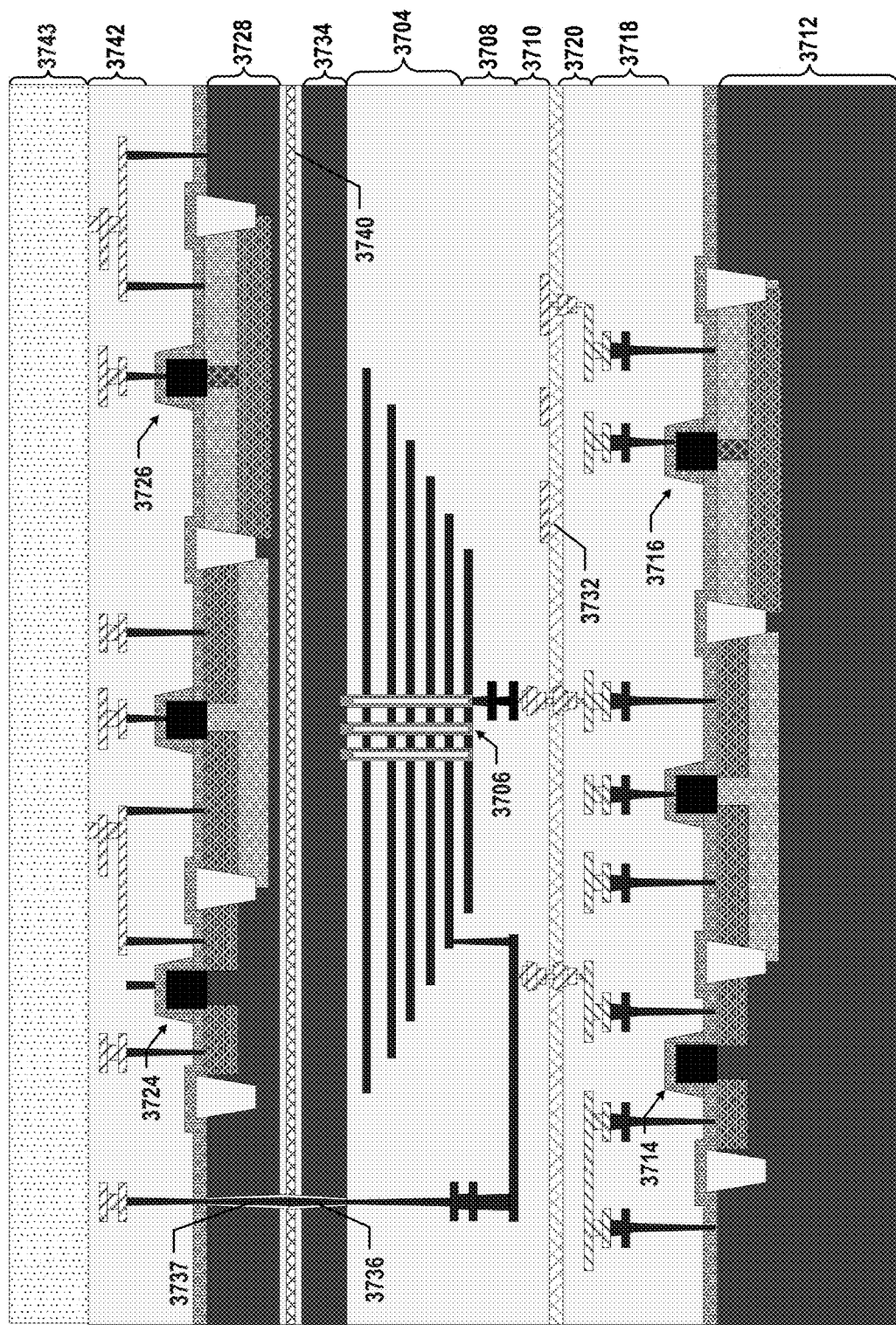

In some implementations, the third substrate is thinned. As illustrated in FIG. 37F, silicon substrate 3722 (shown in FIG. 37C) is thinned to become a semiconductor layer 3728 having single crystalline silicon. Silicon substrate 3722 can be thinned by processes including, but not limited to, wafer grinding, dry etch, wet etch, CMP, any other suitable processes, or any combination thereof. In some implementations, as shown in FIG. 37F, a handle substrate 3743 is attached to interconnect layer 3742, for example, using adhesive bonding, prior to the thinning to allow the subsequent backside processes on silicon substrate 3722, such as thinning, contact formation, and bonding.

In some implementations, a second contact through the thinned third substrate is formed. As illustrated in FIG. 37F, one or more contacts 3737 each extending vertically through semiconductor layer 3728 (i.e., the thinned silicon substrate 3722) are formed. Contacts 3737 can be coupled to the interconnects in interconnect layer 3708. Contact 3736 can be formed by first patterning contact holes through semiconductor layer 3734 using patterning process (e.g., photolithography and dry/wet etch of dielectric materials in the dielectric layer). The contact holes can be filled with a conductor (e.g., W or Cu). In some implementations, filling the contact holes includes depositing a spacer (e.g., a silicon oxide layer) before depositing the conductor. It is understood that in some examples, contacts 3737 may be formed in silicon substrate 3722 before thinning (the formation of semiconductor layer 3728, e.g., in FIG. 37C) and be exposed from the backside of silicon substrate 3722 (where the thinning occurs) after the thinning.

Method 3800 proceeds to operation 3810, as illustrated in FIG. 38, in which the first substrate and the third substrate are bonded in a back-to-back manner. As illustrated in FIG. 37F, thinned silicon substrate 3702 (i.e., semiconductor layer 3734) and components formed thereon (e.g., memory stack 3704 and NAND memory strings 3706) is bonded to thinned silicon substrate 3722 (i.e., semiconductor layer 3728) and components formed thereon (e.g., transistors 3724 and 3726) in a face-to-back manner, i.e., the backside of thinned silicon substrate 3702 facing toward the backside of thinned silicon substrate 3722, to form a bonding interface 3740. The bonding can be performed using fusion bonding or anodic bonding depending on the materials at bonding interface 3132, e.g., $SiO_2$—Si or $SiO_2$—$SiO_2$. As a result of the bonding, contact 3736 is aligned and in contact with contact 3736 at bonding interface 3740, and bonded contacts 3736 and 3737 couple the interconnects in interconnect layer 3742 to the interconnects in interconnect layer 3708, according to some implementations.

In some implementations, a third bonding layer is formed on a second side of the thinned first substrate opposite to a first side on which the array of NAND memory strings is formed, and a fourth bonding layer is formed on a second side of the thinned third substrate opposite to a first side on which the transistor is formed. The third bonding layer can include a plurality of third bonding contacts, and the fourth bonding layer can include a plurality of fourth bonding contacts. Although not shown in FIG. 37F, it is understood that the first substrate and the third substrate may be bonded in a back-to-back manner using hybrid bonding, such that the third bonding contacts in the third bonding layer are aligned and in contact with the fourth bonding contacts in the fourth bonding layer at bonding interface 3740 as described above in detail. Although not shown, in some implementations, semiconductor layer 3734 having single crystalline silicon (i.e., thinned silicon substrate 3702) is replaced with a semiconductor layer having a different material (e.g., a polysilicon layer) before forming the third bonding layer, such that the third bonding layer is formed on the replaced semiconductor layer (e.g., the polysilicon layer). As a result, the third and fourth bonding layers can be in contact with semiconductor layers with different materials, such as polysilicon and single crystalline silicon, respectively.

Figure 37G:
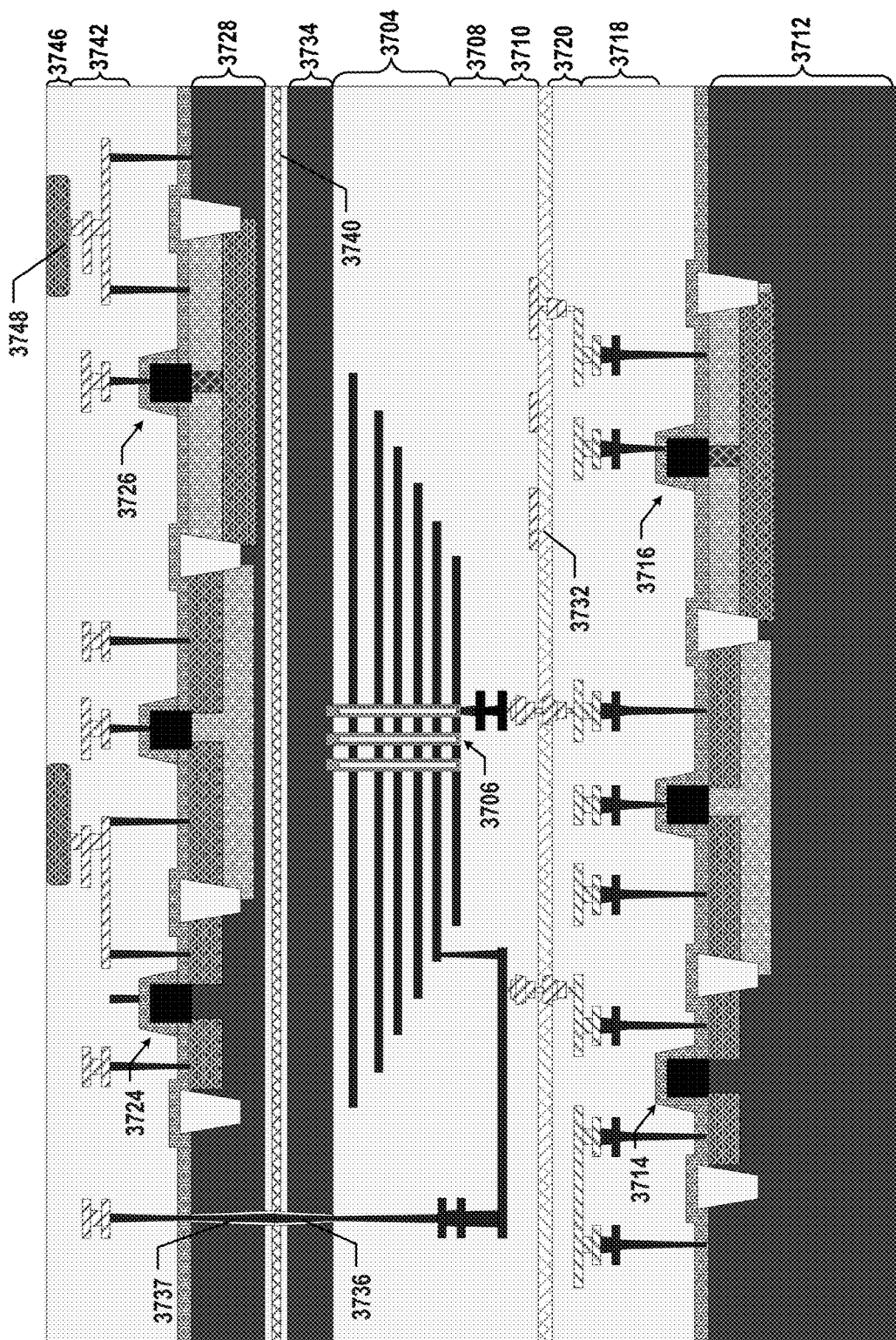

Method 3800 skips optional operation 3812 and proceeds to operation 3814, as illustrated in FIG. 38, in which a pad-out interconnect layer is formed. The pad-out interconnect layer can be formed above the second transistor. As illustrated in FIG. 37G, handle substrate 3743 (shown in FIG. 37F) is removed, and a pad-out interconnect layer 3746 is formed above interconnect layer 3742 and transistors 3724 and 3726 on semiconductor layer 3728. Pad-out interconnect layer 3746 can include interconnects, such as contact pads 3748, formed in one or more ILD layers. Contact pads 3748 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof.

In some implementations, to form a pad-out interconnect layer on the second substrate, after operation 3810, method 3800 proceeds to optional operation 3812, as illustrated in FIG. 38, in which the second substrate is thinned. It is understood that although not shown, in some examples, silicon substrate 3702 (shown in FIG. 37F) may be thinned to become a semiconductor layer having single crystalline silicon using processes including, but not limited to, wafer grinding, dry etch, wet etch, CMP, any other suitable processes, or any combination thereof. After the thinning, contacts may be formed extending vertically through the thinned silicon substrate 3712, for example, by wet/dry etching followed by depositing dielectric materials as spacers and conductive materials as conductors. It is understood that in some examples, the contacts may be formed in silicon substrate 3712 before thinning and be exposed from the backside of silicon substrate 3712 (where the thinning occurs) after the thinning.

Method 3800 proceeds to operation 3814, as illustrated in FIG. 38, in which a pad-out interconnect layer is formed. The pad-out interconnect layer can be formed on the thinned second substrate. It is understood that although not shown, in some examples, a pad-out interconnect layer having contact pads may be formed on the thinned silicon substrate 3712. It is further understood that in some examples, the first substrate (e.g., silicon substrate 3702 or semiconductor layer 3734 after thinning) may be removed and replaced with a semiconductor layer having polysilicon in a similar manner as described above with respect to FIGS. 12G and 12H.

Figure 39A:
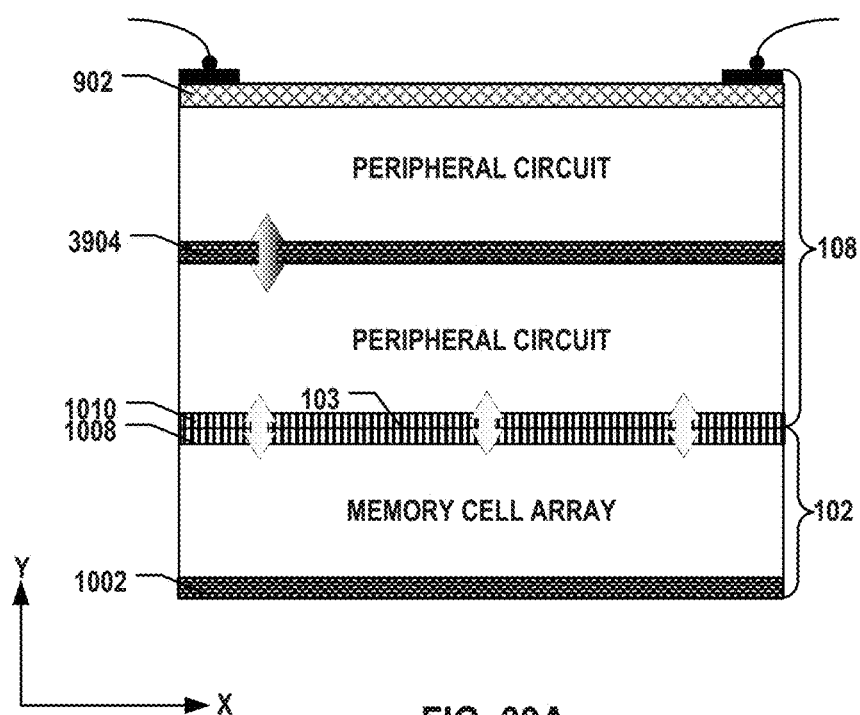
FIGS. 39A and 39B illustrate schematic views of cross-sections of 3D memory devices having two stacked semiconductor structures, according to various aspects of the present disclosure.
Figure 39B:
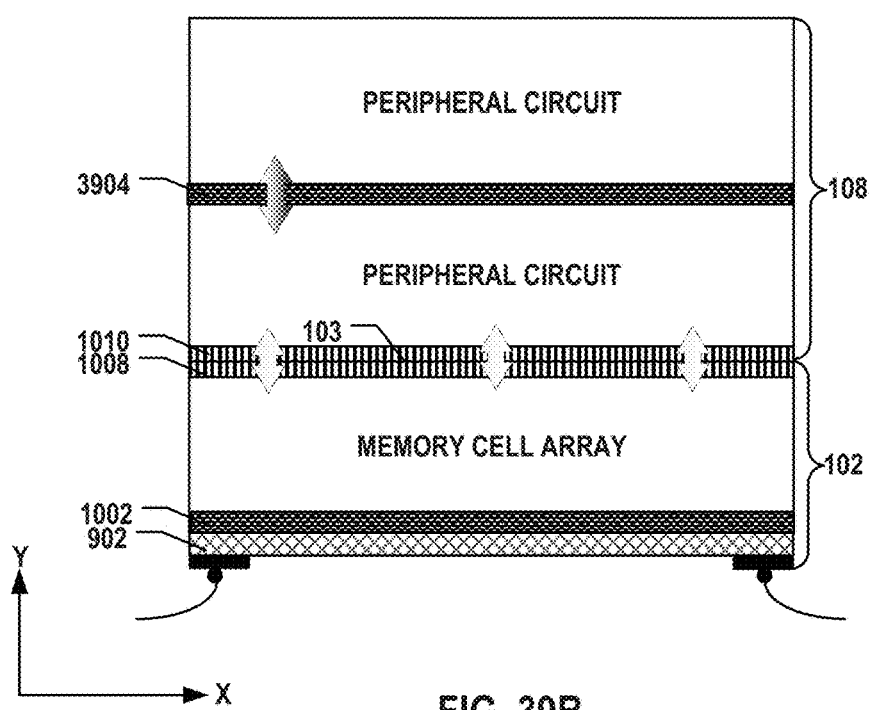

FIGS. 39A and 39B illustrate schematic views of cross-sections of 3D memory devices 3900 and 3901 having two stacked semiconductor structures, according to various aspects of the present disclosure. 3D memory devices 3900 and 3901 may be examples of 3D memory device 120 in FIG. 1C in which first semiconductor structure 102 including the memory cell array is bonded to fourth semiconductor structure 108 including at least two separate portions of the peripheral circuits of the memory cell array disposed in different planes. In other words, as shown in FIGS. 39A and 39B, first semiconductor structure 102 including the memory cell array of 3D memory devices 3900 and 3901 is disposed on one side of 3D memory devices 3900 and 3901 in the vertical direction, according to some implementations.

In some implementations, first semiconductor structure 102 includes a semiconductor layer 1002, a bonding layer 1008, and a memory cell array vertically between semiconductor layer 1002 and bonding layer 1008. The memory cell array can include an array of NAND memory strings (e.g., NAND memory strings 208 disclosed herein), and the sources of the array of NAND memory strings can be in contact with semiconductor layer 1002 (e.g., as shown in FIGS. 8A-8C). Semiconductor layer 1002 can include semiconductor materials, such as single crystalline silicon (e.g., a silicon substrate or a thinned silicon substrate) or polysilicon (e.g., a deposited layer), for example, depending on the types of channel structures of the NAND memory strings (e.g., bottom plug channel structure 812A, sidewall plug channel structure 812B, or bottom open channel structure 812C). Bonding layer 1008 can include conductive bonding contacts (not shown) and dielectrics electrically isolating the bonding contacts, which can be used, for example, for hybrid bonding as described below in detail.

In some implementations, fourth semiconductor structure 108 includes a semiconductor layer 3904, a bonding layer 1010, a first portion of the peripheral circuits of the memory cell array vertically between bonding layer 1010 and a first side of semiconductor layer 3904, and a second portion of the peripheral circuits of the memory cell array in contact with a second side of semiconductor layer 3904 opposite to the first side. That is, the transistors (e.g., planar transistors 500 and 3D transistors 600) of the first portion of the peripheral circuits and the transistors (e.g., planar transistors 500 and 3D transistors 600) of the second portion of the peripheral circuits can be in contact with opposite sides of semiconductor layer 3904. Thus, the transistors of the two separate portions of the peripheral circuits are stacked over each other in different planes across semiconductor layer 3904, according to some implementations. It is understood that in some examples, different from semiconductor layer 1002 in first semiconductor structure 102, semiconductor layer 3904 on which the transistors are formed may include single crystalline silicon, but not polysilicon, due to the superior carrier mobility of single crystalline silicon that is desirable for transistors' performance. Through contacts (e.g., ILVs/TSVs) through semiconductor layer 3904 can make direct, short-distance (e.g., submicron-level) electrical connections between the two portions of the peripheral circuits on opposite sides of semiconductor layer 3904.

Similar to bonding layer 1008 in first semiconductor structure 102, bonding layer 1010 in fourth semiconductor structure 108 can also include conductive bonding contacts (not shown) and dielectrics electrically isolating the bonding contacts. Bonding interface 103 is vertically between and in contact with bonding layers 1008 and 1010, respectively, according to some implementations. That is, bonding layers 1008 and 1010 can be disposed on opposite sides of bonding interface 103, and the bonding contacts of bonding layer 1008 can be in contact with the bonding contacts of bonding layer 1010 at bonding interface 103. As a result, a large number (e.g., millions) of bonding contacts across bonding interface 103 can make direct, short-distance (e.g., micron-level) electrical connections between adjacent semiconductor structures 102 and 108.

Moreover, as shown in FIGS. 39A and 39B, 3D memory device 3900 or 3901 can further include a pad-out interconnect layer 902 for pad-out purposes, i.e., interconnecting with external devices using contact pads on which bonding wires can be soldered. In one example shown in FIG. 39A, fourth semiconductor structure 108 including peripheral circuits may include pad-out interconnect layer 902. In this example, 3D memory device 3900 may be pad-out from the peripheral circuit side to reduce the interconnect distance between contact pads and the peripheral circuits, thereby decreasing the parasitic capacitance from the interconnects and improving the electrical performance of 3D memory device 3900. In another example shown in FIG. 39B, first semiconductor structure 102 including memory cell array may include pad-out interconnect layer 902.

As shown in FIGS. 39A and 39B, 3D memory device 3900 or 3901 can include the memory cell array, a first peripheral circuit including a first transistor, a second peripheral circuit include a second transistor, a first semiconductor layer 3904 including a first side and a second side, and a second semiconductor layer 1002 including a third side and a fourth side. The memory cell array, the first transistor, and the second transistor can be in contact with three of the first, second, third, and fourth sides. The second and third sides can be disposed between the first and fourth sides, and the first transistor and the memory cell array can be in contact with the second and third sides, respectively. For example, as shown in FIGS. 39A and 39B, the memory cell array is in contact with the third side of second semiconductor layer 1002, the first transistor is in contact with the second side of first semiconductor layer 3904, and the second transistor is in contact with the first side of first semiconductor layer 3904.

Moreover, as described below in detail, semiconductor layer 3904 can be a single silicon substrate (e.g., a thinned double side silicon substrate), and the peripheral circuits in fourth semiconductor structure 108 can be formed on both sides (e.g., the front side and the backside) of the single silicon substrate, thereby reducing the device cost comparing with the architecture of using two silicon substrates and having the peripheral circuits formed on the front side of each silicon substrate.

Figure 40A:
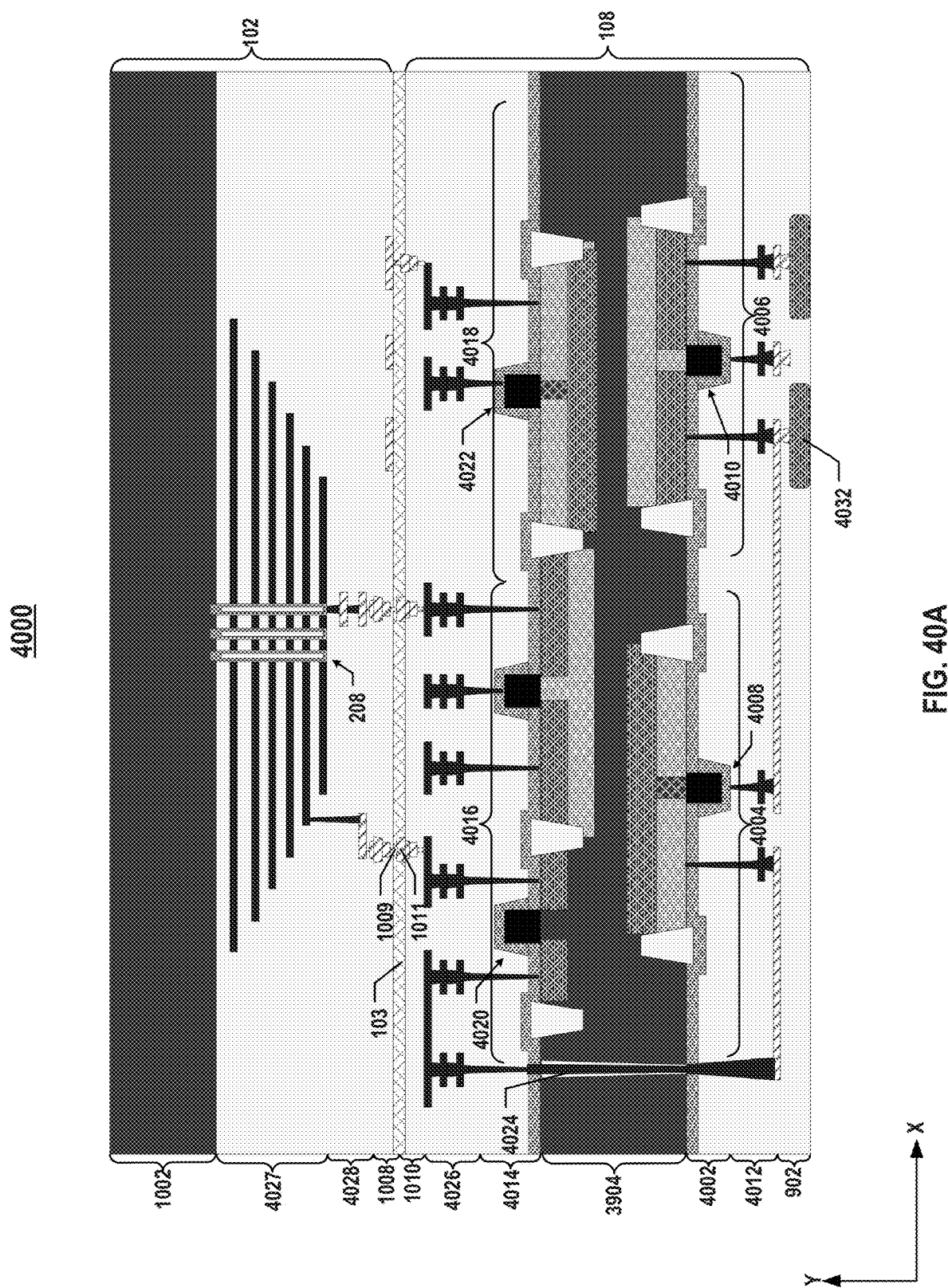
FIGS. 40A and 40B illustrate side views of various examples of the 3D memory devices in FIGS. 39A and 39B, according to various aspects of the present disclosure.
Figure 40B:
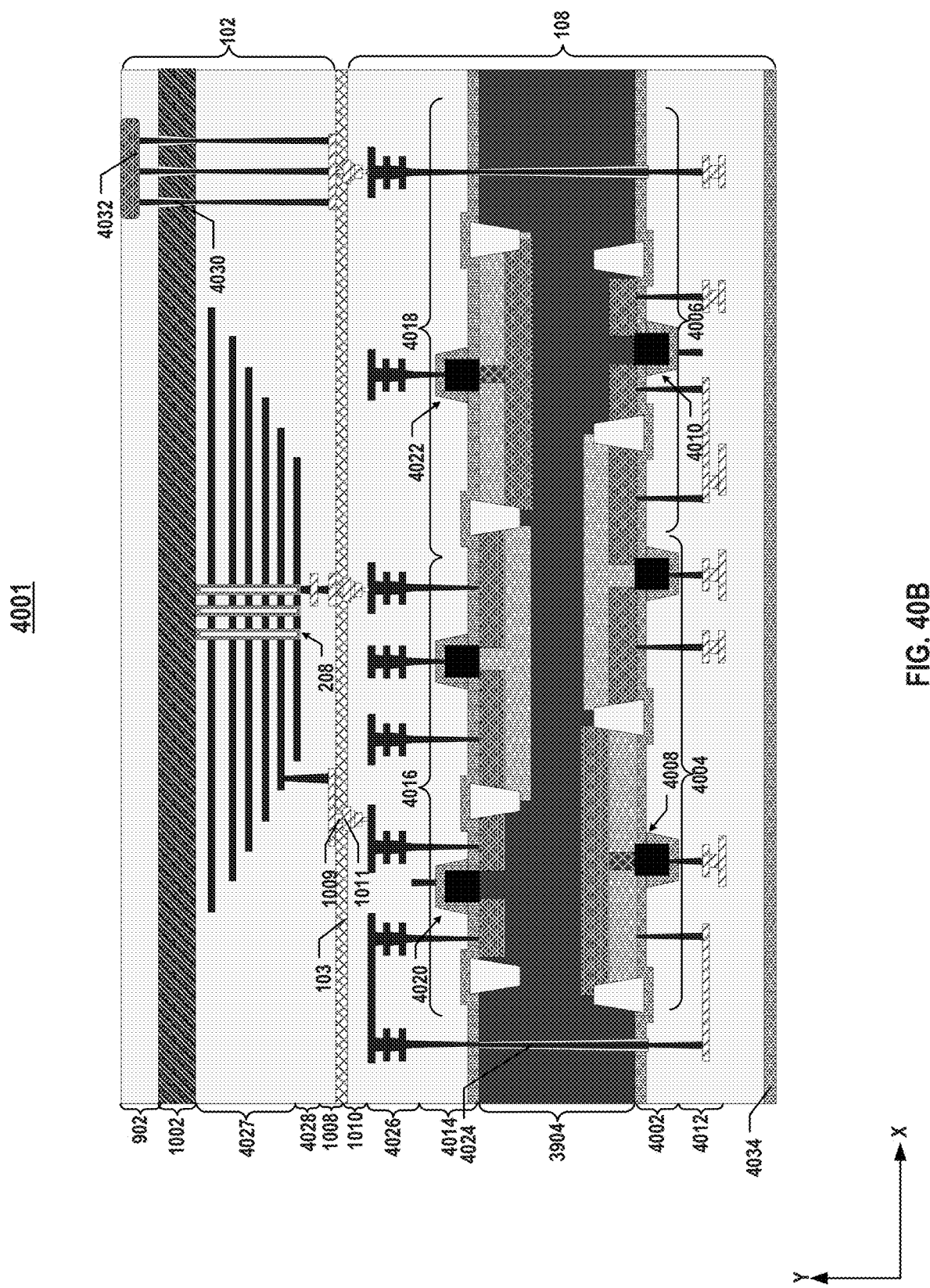

FIGS. 40A and 40B illustrate side views of various examples of 3D memory devices 3900 and 3901 in FIGS. 39A and 39B, according to various aspects of the present disclosure. As shown in FIG. 40A, as one example of 3D memory devices 3900 and 3901 in FIGS. 39A and 39B, 3D memory device 4000 is a bonded chip including first semiconductor structure 102 and fourth semiconductor structure 108, which are stacked over each another in different planes in the vertical direction (e.g., the y-direction in FIG. 40A), according to some implementations. First and fourth semiconductor structures 102 and 108 are bonded at bonding interface 103 therebetween, and fourth semiconductor structure 108 includes two separate device layers 4002 and 4014 on opposite sides thereof in the vertical direction (e.g., the y-direction in FIG. 40A), according to some implementations.

As shown in FIG. 40A, fourth semiconductor structure 108 can include semiconductor layer 3904 having semiconductor materials. In some implementations, semiconductor layer 3904 is a silicon substrate having single crystalline silicon. Devices, such as transistors, can be formed on both sides of semiconductor layer 3904. In some implementations, the thickness of semiconductor layer 3904 is between 1 μm and 10 μm. Fourth semiconductor structure 108 can also include a device layer 4002 above and in contact with a first side (e.g., toward the negative y-direction in FIG. 40A) of semiconductor layer 3904. In some implementations, device layer 4002 includes a first peripheral circuit 4004 and a second peripheral circuit 4006. First peripheral circuit 4004 can include LLV circuits 402, such as I/O circuits (e.g., in interface 316 and data bus 318), and second peripheral circuit 4006 can include LV circuits 404, such as page buffer circuits (e.g., page buffer circuits 702 in page buffer 304) and logic circuits (e.g., in control logic 312). In some implementations, first peripheral circuit 4004 includes a plurality of transistors 4008 in contact with the first side of semiconductor layer 3904, and second peripheral circuit 4006 includes a plurality of transistors 4010 in contact with the first side of semiconductor layer 1006. Transistors 4008 and 4010 can include any transistors disclosed herein, such as planar transistors 500 and 3D transistors 600. As described above in detail with respect to transistors 500 and 600, in some implementations, each transistor 4008 or 4010 includes a gate dielectric, and the thickness of the gate dielectric of transistor 4008 (e.g., in LLV circuit 402) is smaller than the thickness of the gate dielectric of transistor 4010 (e.g., in LV circuit 404) due to the lower voltage applied to transistor 4008 than transistor 4010. Trench isolations (e.g., STIs) and doped regions (e.g., wells, sources, and drains of transistors 4008 and 4010) can be formed on the first side of semiconductor layer 3904 as well.

In some implementations, fourth semiconductor structure 108 further includes an interconnect layer 4012 above device layer 4002 to transfer electrical signals to and from peripheral circuits 4006 and 4004. As shown in FIG. 40A, device layer 4002 (including transistors 4008 and 4010 of peripheral circuits 4004 and 4006) can be disposed vertically between semiconductor layer 3904 and interconnect layer 4012. Interconnect layer 4012 can include a plurality of interconnects. The interconnects in interconnect layer 4012 can be coupled to transistors 4008 and 4010 of peripheral circuits 4004 and 4006 in device layer 4002. Interconnect layer 4012 can further include one or more ILD layers in which the lateral lines and vias can form. That is, interconnect layer 4012 can include lateral lines and vias in multiple ILD layers. In some implementations, the devices in device layer 4002 are coupled to one another through the interconnects in interconnect layer 4012. For example, peripheral circuit 4004 may be coupled to peripheral circuit 4006 through interconnect layer 4012. The interconnects in interconnect layer 4012 can include conductive materials including, but not limited to, W, Co, Cu, Al, silicides, or any combination thereof. The ILD layers in interconnect layer 4012 can include dielectric materials including, but not limited to, silicon oxide, silicon nitride, silicon oxynitride, low-k dielectrics, or any combination thereof.

In some implementations, the interconnects in interconnect layer 4012 include Cu, which has a relatively low resistivity (better electrical performance) among conductive metal materials. As described below with respect to the fabrication process, although Cu has a relatively low thermal budget (incompatible with high-temperature processes), since the fabrication of interconnect layer 4012 can occur after the high-temperature processes in forming device layers 4014 and 4002 in fourth semiconductor structure 108, as well as being separated from the high-temperature processes in forming first semiconductor structure 102, the interconnects of interconnect layer 4012 having Cu can become feasible.

Fourth semiconductor structure 108 can also include another device layer 4014 below and in contact with a second side (e.g., toward the positive y-direction in FIG. 40A) of semiconductor layer 3904 opposite to the first side. Device layers 4014 and 4002 can thus be disposed in different planes in the vertical direction, i.e., stacked over one another on opposite sides of semiconductor layer 3904 in fourth semiconductor structure 108. In some implementations, device layer 4014 includes a third peripheral circuit 4016 and a fourth peripheral circuit 4018. Third peripheral circuit 4016 can include HV circuits 406, such as driving circuits (e.g., string drivers 704 in row decoder/word line driver 308 and drivers in column decoder/bit line driver 306), and fourth peripheral circuit 4018 can include LV circuits 404, such as page buffer circuits (e.g., page buffer circuits 702 in page buffer 304) and logic circuits (e.g., in control logic 312). In some implementations, third peripheral circuit 4016 includes a plurality of transistors 4020, and fourth peripheral circuit 4018 includes a plurality of transistors 4022 as well. Transistors 4020 and 4022 can include any transistors disclosed herein, such as planar transistors 500 and 3D transistors 600. As described above in detail with respect to transistors 500 and 600, in some implementations, each transistor 4020 or 4022 includes a gate dielectric, and the thickness of the gate dielectric of transistor 4020 (e.g., in HV circuit 406) is larger than the thickness of the gate dielectric of transistor 4022 (e.g., in LV circuit 404) due to the higher voltage applied to transistor 4020 than transistor 4022. In some implementations, the thickness of the gate dielectric of transistor 4020 (e.g., in HV circuit 406) is larger than the thickness of the gate dielectric of transistor 4008 (e.g., in LLV circuit 402) due to the higher voltage applied to transistor 4020 than transistor 4008. In some implementations, the thickness of the gate dielectric of transistor 4022 (e.g., in LV circuit 404) is the same as the thickness of the gate dielectric of transistor 4010 (e.g., in LV circuit 404) due to the same voltage applied to transistor 4022 and transistor 4010. Trench isolations (e.g., STIs) and doped regions (e.g., wells, sources, and drains of transistors 1720 and 1722) can be formed on the second side of semiconductor layer 3904 as well.

As shown in FIG. 40A, fourth semiconductor structure 108 can further include an interconnect layer 4026 below device layer 4014 to transfer electrical signals to and from peripheral circuits 4016 and 4018. As shown in FIG. 40A, interconnect layer 4026 can be vertically between bonding interface 103 and device layer 4014 (including transistors 4020 and 4022 of peripheral circuits 4016 and 4018). Interconnect layer 4026 can include a plurality of interconnects coupled to transistors 4020 and 4022 of peripheral circuits 4016 and 4018 in device layer 4014. Interconnect layer 4026 can further include one or more ILD layers in which the interconnects can form. That is, interconnect layer 4026 can include lateral lines and vias in multiple ILD layers. In some implementations, the devices in device layer 4014 are coupled to one another through the interconnects in interconnect layer 4026. For example, peripheral circuit 4016 may be coupled to peripheral circuit 4018 through interconnect layer 4026. The interconnects in interconnect layer 4026 can include conductive materials including, but not limited to, W, Co, Cu, Al, silicides, or any combination thereof. The ILD layers in interconnect layer 4026 can include dielectric materials including, but not limited to, silicon oxide, silicon nitride, silicon oxynitride, low-k dielectrics, or any combination thereof. In some implementations, the interconnects in interconnect layer 4026 include W, which has a relatively high thermal budget (compatible with high-temperature processes) and good quality (fewer detects, e.g., voids) among conductive metal materials.

As shown in FIG. 40A, fourth semiconductor structure 108 can further include one or more contacts 4024 extending vertically through semiconductor layer 3904. In some implementations, contacts 4024 couples the interconnects in interconnect layer 4026 to the interconnects in interconnect layer 4012 to make an electrical connection between opposite sides of semiconductor layer 3904. Contact 4024 can include conductive materials including, but not limited to, W, Co, Cu, Al, silicides, or any combination thereof. In some implementations, contact 4024 includes a via surrounded by a dielectric spacer (e.g., having silicon oxide) to electrically separate the via from semiconductor layer 3904. Depending on the thickness of semiconductor layer 3904, contact 4024 can be an ILV having a depth in the submicron-level (e.g., between 10 nm and 1 μm), or a TSV having a depth in the micron- or tens micron-level (e.g., between 1 μm and 100 μm).

As shown in FIG. 40A, fourth semiconductor structure 108 can further include a bonding layer 1010 at bonding interface 103 and below and in contact with interconnect layer 4026. Bonding layer 1010 can include a plurality of bonding contacts 1011 and dielectrics electrically isolating bonding contacts 1011. Bonding contacts 1011 can include conductive materials including, but not limited to, W, Co, Cu, Al, silicides, or any combination thereof. In some implementations, bonding contacts 1011 of bonding layer 1010 include Cu. The remaining area of bonding layer 1010 can be formed with dielectrics including, but not limited to, silicon oxide, silicon nitride, silicon oxynitride, low-k dielectrics, or any combination thereof. Bonding contacts 1011 and surrounding dielectrics in bonding layer 1010 can be used for hybrid bonding (also known as "metal/dielectric hybrid bonding"), which is a direct bonding technology (e.g., forming bonding between surfaces without using intermediate layers, such as solder or adhesives) and can obtain metal-metal (e.g., Cu-to-Cu) bonding and dielectric-dielectric (e.g., $SiO_2$-to-$SiO_2$) bonding simultaneously.

As shown in FIG. 40A, first semiconductor structure 102 can also include a bonding layer 1008 at bonding interface 103, e.g., on the opposite side of bonding interface 103 with respect to bonding layer 1010 in fourth semiconductor structure 108. Bonding layer 1008 can include a plurality of bonding contacts 1009 and dielectrics electrically isolating bonding contacts 1009. Bonding contacts 1009 can include conductive materials, such as Cu. The remaining area of bonding layer 1008 can be formed with dielectric materials, such as silicon oxide. Bonding contacts 1009 and surrounding dielectrics in bonding layer 1008 can be used for hybrid bonding. In some implementations, bonding interface 103 is the place at which bonding layers 1008 and 1010 are met and bonded. In practice, bonding interface 103 can be a layer with a certain thickness that includes the top surface of bonding layer 1010 of second semiconductor structure 104 and the bottom surface of bonding layer 1008 of first semiconductor structure 102.

As shown in FIG. 40A, first semiconductor structure 102 can further include an interconnect layer 4028 above and in contact with bonding layer 1008 to transfer electrical signals. Interconnect layer 4028 can include a plurality of interconnects, such as MEOL interconnects and BEOL interconnects. In some implementations, the interconnects in interconnect layer 4028 also include local interconnects, such as bit line contacts and word line contacts. Interconnect layer 4028 can further include one or more ILD layers in which the lateral lines and vias can form. The interconnects in interconnect layer 4028 can include conductive materials including, but not limited to, W, Co, Cu, Al, silicides, or any combination thereof. The ILD layers in interconnect layer 4028 can include dielectric materials including, but not limited to, silicon oxide, silicon nitride, silicon oxynitride, low-k dielectrics, or any combination thereof.

As shown in FIG. 40A, first semiconductor structure 102 can further include a memory cell array, such as an array of NAND memory strings 208 below and in contact with interconnect layer 4028. In some implementations, interconnect layer 4028 is vertically between NAND memory strings 208 and bonding interface 103. Each NAND memory string 208 extends vertically through a plurality of pairs each including a conductive layer and a dielectric layer, according to some implementations. The stacked and interleaved conductive layers and dielectric layers are also referred to herein as a stack structure, e.g., a memory stack 4027. Memory stack 4027 may be an example of memory stack 804 in FIGS. 8A-8C, and the conductive layer and dielectric layer in memory stack 4027 may be examples of gate conductive layers 806 and dielectric layer 808, respectively, in memory stack 4027. The interleaved conductive layers and dielectric layers in memory stack 4027 alternate in the vertical direction, according to some implementations. Each conductive layer can include a gate electrode (gate line) surrounded by an adhesive layer and a gate dielectric layer. The gate electrode of the conductive layer can extend laterally as a word line, ending at one or more staircase structures of memory stack 4027.

In some implementations, each NAND memory string 208 is a "charge trap" type of NAND memory string including any suitable channel structures disclosed herein, such as bottom plug channel structure 812A, sidewall plug channel structure 812B, or bottom open channel structure 812C, described above in detail with respect to FIGS. 8A-8C. It is understood that NAND memory strings 208 are not limited to the "charge trap" type of NAND memory strings and may be "floating gate" type of NAND memory strings in other examples.

As shown in FIG. 40A, first semiconductor structure 102 can further include semiconductor layer 1002 disposed below memory stack 4027 and in contact with the sources of NAND memory strings 208. In some implementations, NAND memory strings 208 are disposed vertically between bonding interface 103 and semiconductor layer 1002. Semiconductor layer 1002 can include semiconductor materials. In some implementations, semiconductor layer 1002 is a thinned silicon substrate having single crystalline silicon on which memory stack 4027 and NAND memory strings 208 (e.g., including bottom plug channel structure 812A or sidewall plug channel structure 812B) are formed. It is understood that in some examples, trench isolations and doped regions (not shown) may be formed in semiconductor layer 1002 as well.

As shown in FIG. 40A, fourth semiconductor structure 108 can further include a pad-out interconnect layer 902 above and in contact with interconnect layer 4012. In some implementations, device layer 4002 having transistors 4008 and 4010 is disposed vertically between pad-out interconnect layer 902 and semiconductor layer 3904. Pad-out interconnect layer 902 can include interconnects, e.g., contact pads 4032, in one or more ILD layers. Pad-out interconnect layer 902 and interconnect layer 4012 can be formed on the same side of semiconductor layer 3904. In some implementations, the interconnects in pad-out interconnect layer 902 can transfer electrical signals between 3D memory device 3900 and external devices, e.g., for pad-out purposes.

As a result, peripheral circuits 4004, 4006, 4016, and 4018 on different sides of fourth semiconductor structure 108 can be coupled to NAND memory strings 208 in first semiconductor structure 102 through various interconnection structures, including interconnect layers 4012, 4026, and 4028, bonding layers 1008 and 1010, as well as contacts 4024. Moreover, peripheral circuits 4004, 4006, 4016, and 4018 and NAND memory strings 208 in 3D memory device 3900 can be further coupled to external devices through pad-out interconnect layer 902.

It is understood that the pad-out of 3D memory devices is not limited to from fourth semiconductor structure 108 having transistors 4008, 4010, 4020, and 4022 as shown in FIG. 40A (corresponding to FIG. 39A) and may be from first semiconductor structure 102 having NAND memory strings 208 (corresponding to FIG. 39B). For example, as shown in FIG. 40B, 3D memory device 4001 may include pad-out interconnect layer 902 in first semiconductor structure 102. Pad-out interconnect layer 902 can be in contact with semiconductor layer 1002 of first semiconductor structure 102 on which NAND memory strings 208 are formed. In some implementations, first semiconductor structure 102 further includes one or more contacts 4030 extending vertically through semiconductor layer 1002. In some implementations, contact 4030 couples the interconnects in interconnect layer 4028 in first semiconductor structure 102 to contact pads 4032 in pad-out interconnect layer 902 to make an electrical connection through semiconductor layer 1002. Contact 4030 can include conductive materials including, but not limited to, W, Co, Cu, Al, silicides, or any combination thereof. In some implementations, contact 4030 includes a via surrounded by a dielectric spacer (e.g., having silicon oxide) to electrically separate the via from semiconductor layer 1002. Depending on the thickness of semiconductor layer 1002, contact 4030 can be an ILV having a depth in the submicron-level (e.g., between 10 nm and 1 µm), or a TSV having a depth in the micron- or tens micron-level (e.g., between 1 µm and 100 µm). In some implementations, in FIG. 40B, fourth semiconductor structure 108 of 3D memory device 4001 further includes a passivation layer 4034, replacing pad-out interconnect layer 902 in FIG. 40A. Passivation layer 4034 can include dielectric materials, such as silicon nitride and/or silicon oxide.

It is also understood that the material of semiconductor layer 1002 in first semiconductor structure 102 is not limited to single crystalline silicon as described above with respect to FIG. 40A and may be any other suitable semiconductor materials. For example, as shown in FIG. 40B, 3D memory device 4001 may include semiconductor layer 1002 having polysilicon in first semiconductor structure 102. NAND memory strings 208 of 3D memory device 4001 in contact with semiconductor layer 1002 having polysilicon can include any suitable channel structures disclosed herein that are in contact with a polysilicon layer, such as bottom open channel structure 812C. In some implementations, NAND memory strings 208 of 3D memory device 4001 are "floating gate" type of NAND memory strings, and semiconductor layer 1002 having polysilicon is in contact with the "floating gate" type of NAND memory strings as the source plate thereof. It is understood that the details of the same components (e.g., materials, fabrication process, functions, etc.) in both 3D memory devices 4000 and 4001 are not repeated for ease of description.

Figure 41C:
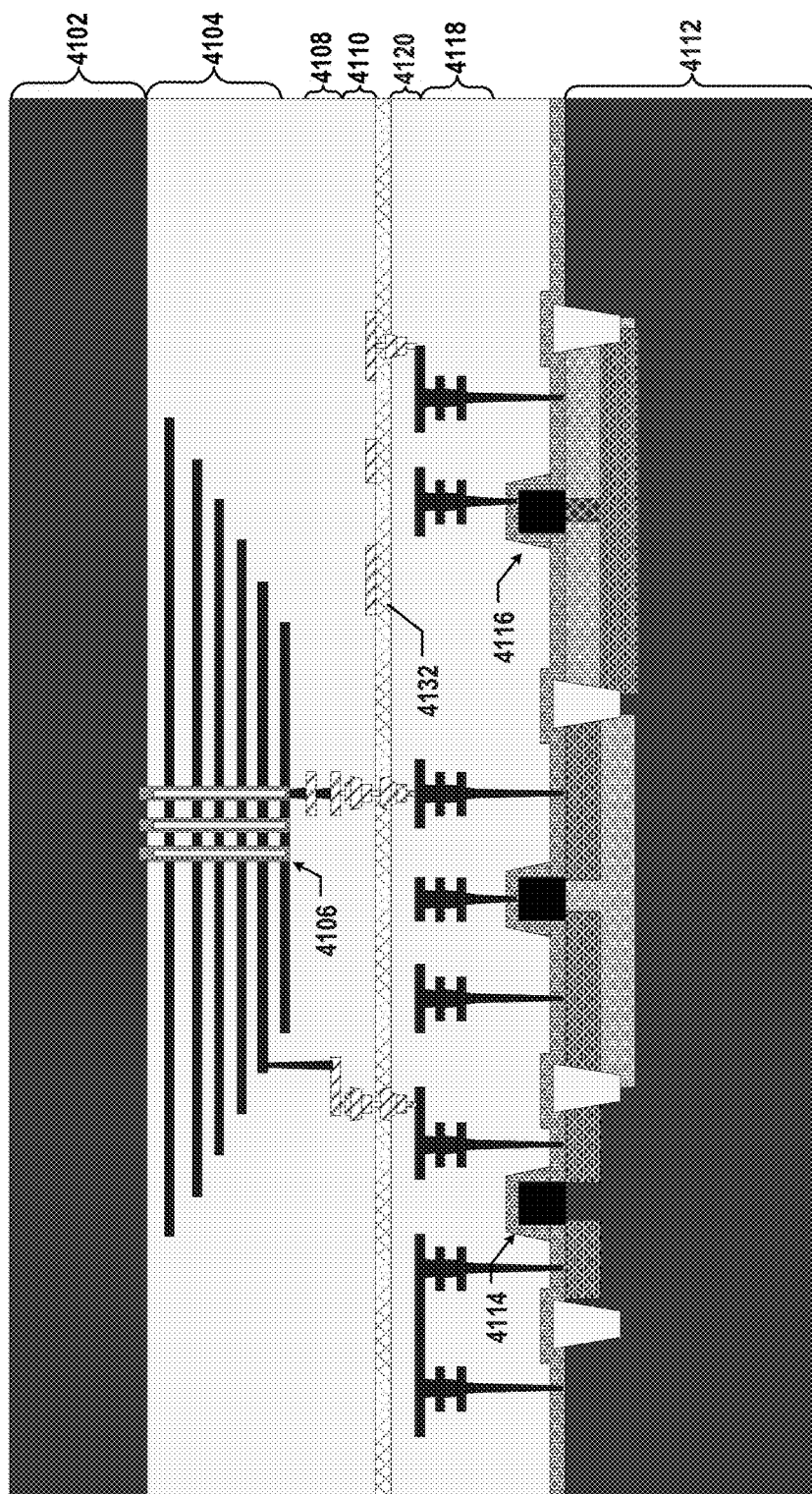
Figure 41D:
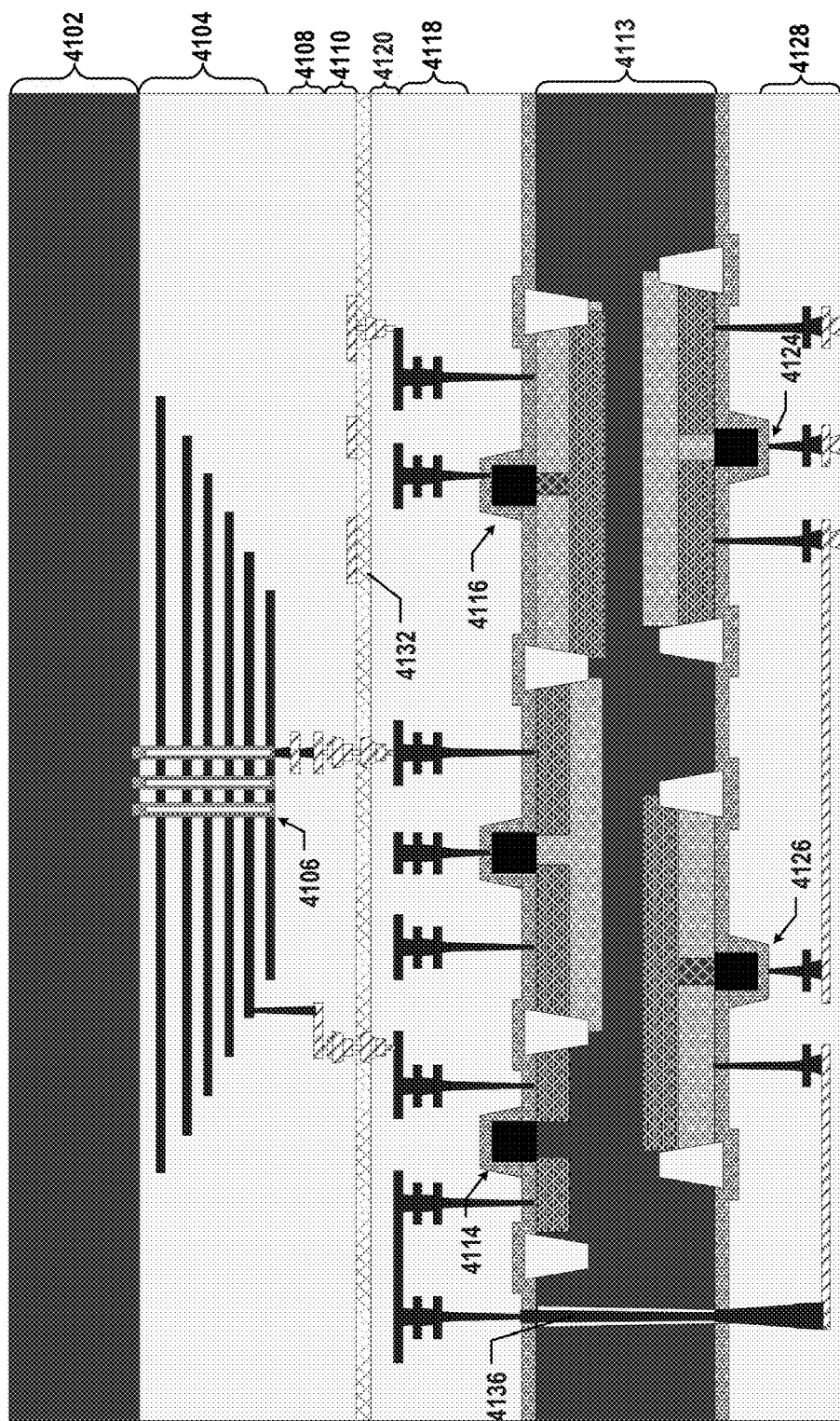
Figure 41E:
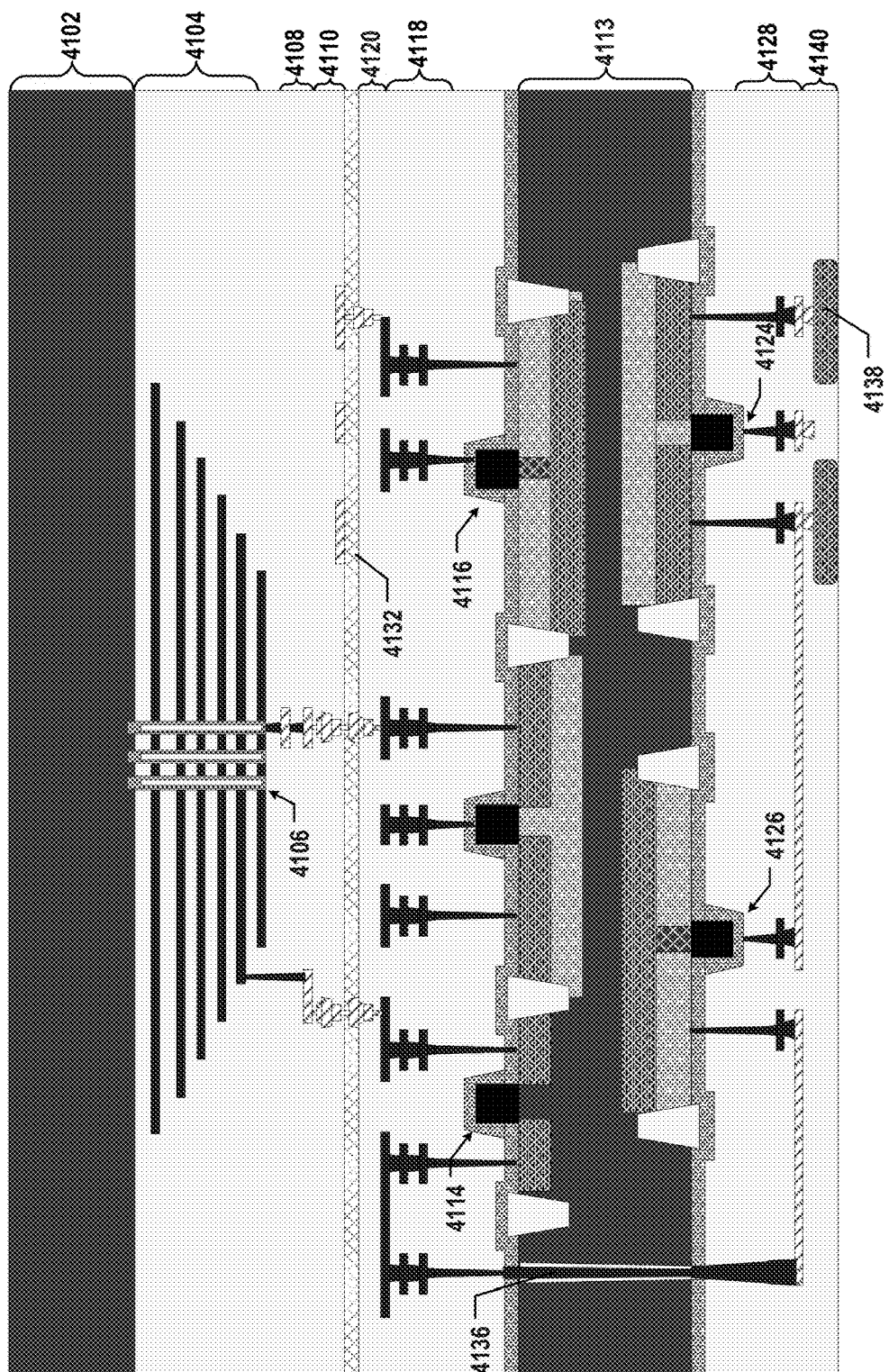
Figure 42A:
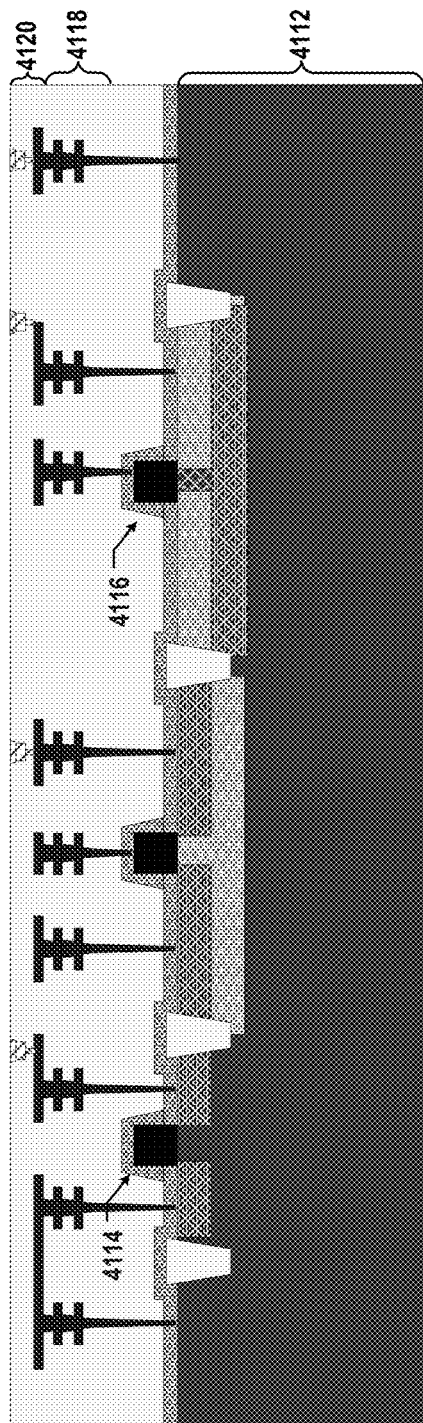
Figure 42B:
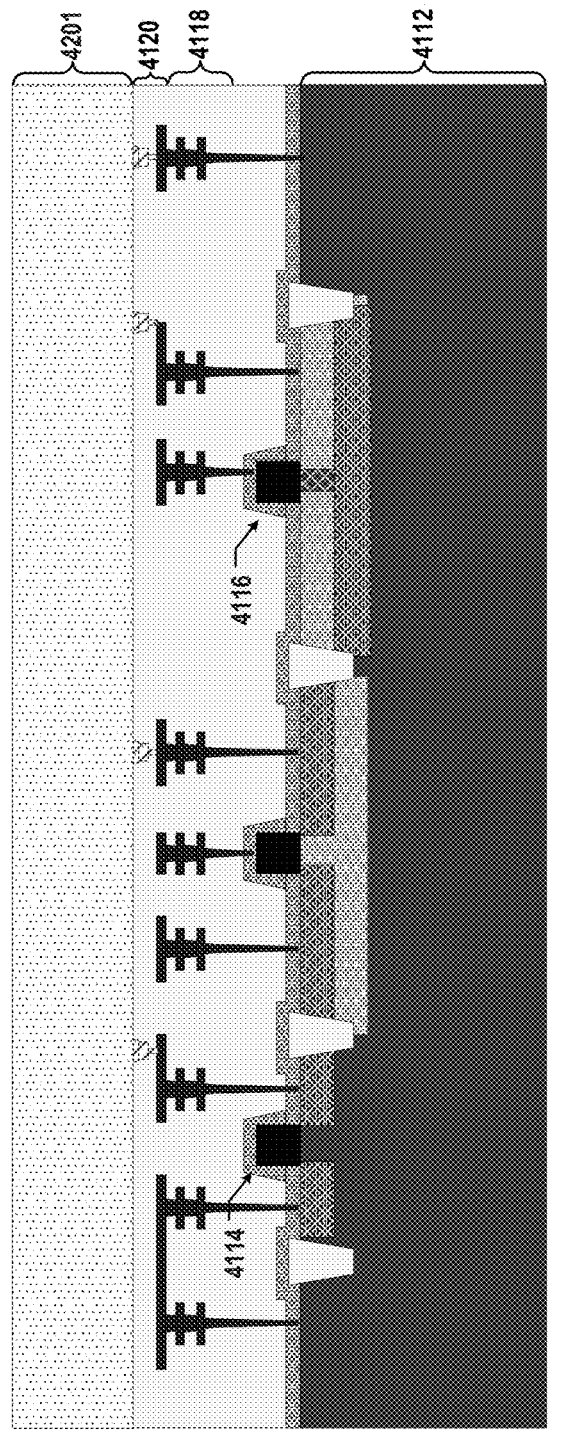

FIGS. 41A-41E illustrate a fabrication process for forming the 3D memory devices in FIGS. 39A and 39B, according to some aspects of the present disclosure. FIGS. 42A-42I illustrate another fabrication process for forming the 3D memory devices in FIGS. 39A and 39B, according to some aspects of the present disclosure. FIG. 43 illustrates a flowchart of a method 4300 for forming the 3D memory devices in FIGS. 39A and 39B, according to some aspects of the present disclosure. Examples of the 3D memory devices depicted in FIGS. 41A-41E, 42A-42F, and 43 include 3D memory devices 4000 and 4001 depicted in FIGS. 40A and 40B. FIGS. 41A-41E, 42A-42I, and 43 will be described together. It is understood that the operations shown in method 4300 are not exhaustive and that other operations can be performed as well before, after, or between any of the illustrated operations. Further, some of the operations may be performed simultaneously, or in a different order than shown in FIG. 43. For example, operation 4302 and 4304 may be performed in parallel.

Referring to FIG. 43, method 4300 starts at operation 4302, in which an array of NAND memory strings is formed on a first substrate. The first substrate can be a silicon substrate having single crystalline silicon. In some implementations, to form the array of NAND memory strings, a memory stack is formed on the first substrate.

Figure 42E:
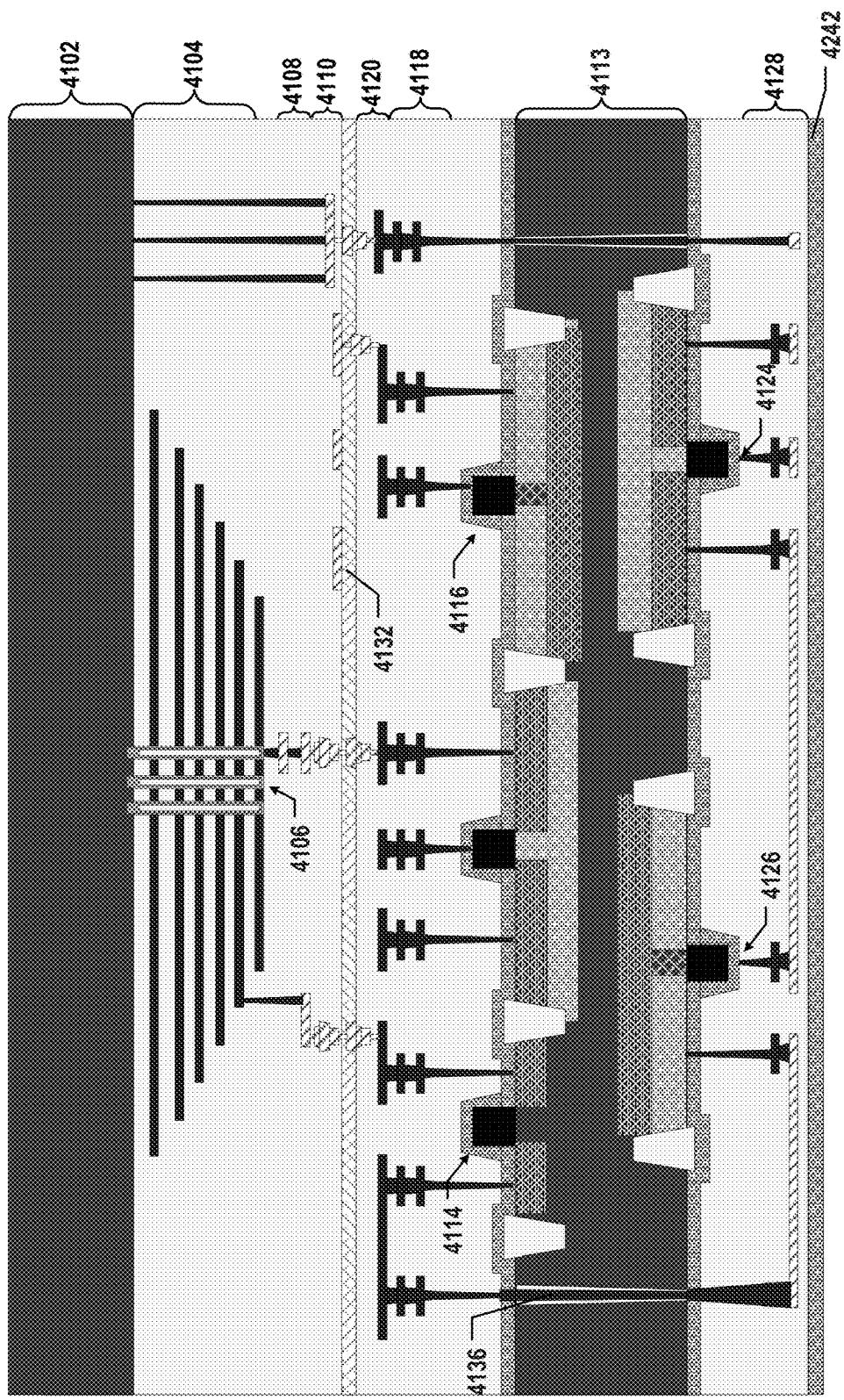
Figure 43:
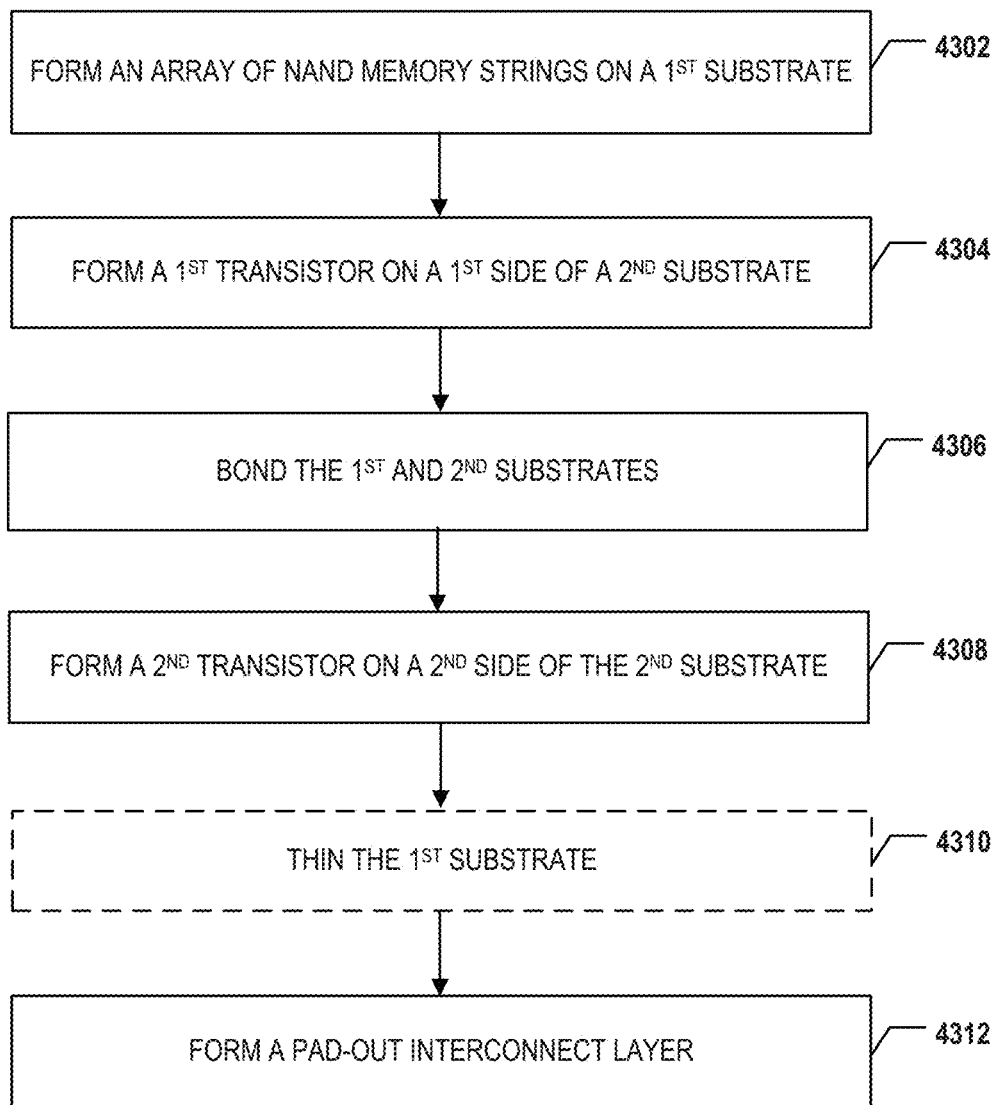
FIG. 43 illustrates a flowchart of a method for forming the 3D memory devices in FIGS. 39A and 39B, according to some aspects of the present disclosure.

As illustrated in FIGS. 41A and 42E, a stack structure, such as a memory stack 4104 including interleaved conductive layers and dielectric layers, is formed on a silicon substrate 4102. To form memory stack 4104, in some implementations, a dielectric stack (not shown) including interleaved sacrificial layers (not shown) and the dielectric layers is formed on silicon substrate 4102. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. Memory stack 4104 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that memory stack 4104 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between memory stack 4104 and silicon substrate 4102.

As illustrated in FIGS. 41A and 42E, NAND memory strings 4106 are formed above silicon substrate 4102, each of which extends vertically through memory stack 4104 to be in contact with silicon substrate 4102. In some implementations, fabrication processes to form NAND memory string 4106 include forming a channel hole through memory stack 4104 (or the dielectric stack) and into silicon substrate 4102 using dry etching/and or wet etching, such as DRIE, followed by subsequently filling the channel hole with a plurality of layers, such as a memory film (e.g., a tunneling layer, a storage layer, and a blocking layer) and a semiconductor layer, using thin film deposition processes such as ALD, CVD, PVD, or any combination thereof. It is understood that the details of fabricating NAND memory strings 4106 may vary depending on the types of channel structures of NAND memory strings 4106 (e.g., bottom plug channel structure 812A, sidewall plug channel structure 812B, or bottom open channel structure 812C in FIGS. 8A-8C) and thus, are not elaborated for ease of description.

In some implementations, an interconnect layer is formed above the array of NAND memory strings on the first substrate. The interconnect layer can include a first plurality of interconnects in one or more ILD layers. As illustrated in FIGS. 41A and 42E, an interconnect layer 4108 is formed above memory stack 4104 and NAND memory strings 4106. Interconnect layer 4108 can include interconnects of MEOL and/or BEOL in a plurality of ILD layers to make electrical connections with NAND memory strings 4106. In some implementations, interconnect layer 4108 includes multiple ILD layers and interconnects therein formed in multiple processes. For example, the interconnects in interconnect layer 4108 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIGS. 41A and 42E can be collectively referred to as interconnect layer 4108.

In some implementations, a first bonding layer is formed above interconnect layer. The first bonding layer can include a plurality of first bonding contacts. As illustrated in FIGS. 41A and 42E, a bonding layer 4110 is formed above interconnect layer 4108. Bonding layer 4110 can include a plurality of bonding contacts surrounded by dielectrics. In some implementations, a dielectric layer is deposited on the top surface of interconnect layer 4108 by one or more thin film deposition processes including, but not limited to, CVD, PVD, ALD, or any combination thereof. The bonding contacts can then be formed through the dielectric layer and in contact with the interconnects in interconnect layer 4108 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

Method 4300 proceeds to operation 4304, as illustrated in FIG. 43, in which a first transistor is formed on a first side of a second substrate. The second substrate can be a silicon substrate having single crystalline silicon. As illustrated in FIGS. 41B and 42A, a plurality of transistors 4114 and 4116 are formed on one side of a silicon substrate 4112. Transistors 4114 and 4116 can be formed by a plurality of processes including, but not limited to, photolithography, dry/wet etch, thin film deposition, thermal growth, implantation, CMP, and any other suitable processes. In some implementations, doped regions are formed in silicon substrate 4112 by ion implantation and/or thermal diffusion, which function, for example, as wells and source/drain regions of transistors 4114 and 4116. In some implementations, isolation regions (e.g., STIs) are also formed in silicon substrate 4112 by wet/dry etch and thin film deposition. In some implementations, the thickness of gate dielectric of transistor 4114 is different from the thickness of gate dielectric of transistor 4116, for example, by depositing a thicker silicon oxide film in the region of transistor 4114 than the region of transistor 4116, or by etching back part of the silicon oxide film deposited in the region of transistor 4116. It is understood that the details of fabricating transistors 4114 and 4116 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer is formed above the transistor on the second substrate. The interconnect layer can include a plurality of interconnects in one or more ILD layers. As illustrated in FIGS. 41B and 42A, an interconnect layer 4118 can be formed above transistors 4114 and 4116. Interconnect layer 4118 can include interconnects of MEOL and/or BEOL in a plurality of ILD layers to make electrical connections with transistors 4114 and 4116. In some implementations, interconnect layer 4118 includes multiple ILD layers and interconnects therein formed in multiple processes. For example, the interconnects in interconnect layer 4118 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIGS. 41B and 42A can be collectively referred to as interconnect layer 4118. In some implementations, the interconnects in interconnect layer 4118 include W, which has a relatively high thermal budget among conductive metal materials to sustain later high-temperature processes.

In some implementations, a second bonding layer is formed above the interconnect layer. The second bonding layer can include a plurality of second bonding contacts. As illustrated in FIGS. 41B and 42A, a bonding layer 4120 is formed above interconnect layer 4118. Bonding layer 4120 can include a plurality of bonding contacts surrounded by dielectrics. In some implementations, a dielectric layer is deposited on the top surface of interconnect layer 4118 by one or more thin film deposition processes including, but not limited to, CVD, PVD, ALD, or any combination thereof. The bonding contacts can then be formed through the dielectric layer and in contact with the interconnects in interconnect layer 4118 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

Method 4300 proceeds to operation 4306, as illustrated in FIG. 43, in which the first substrate and the second substrate are bonded in a face-to-face manner. The first bonding contact in the first bonding layer can be in contact with the second bonding contact in the second bonding layer at a bonding interface after bonding the first and second substrates. The bonding can include hybrid bonding.

As illustrated in FIG. 41C, silicon substrate 4102 and components formed thereon (e.g., memory stack 4104 and NAND memory strings 4106) are flipped upside down. Bonding layer 4110 facing down is bonded with bonding layer 4120 facing up, i.e., in a face-to-face manner, thereby forming a bonding interface 4132. That is, silicon substrate 4102 and components formed thereon can be bonded with silicon substrate 4112 and components formed thereon in a face-to-face manner, such that the bonding contacts in bonding layer 4110 are in contact with the bonding contacts in bonding layer 4120 at bonding interface 4132. In some implementations, a treatment process, e.g., plasma treatment, wet treatment and/or thermal treatment, is applied to bonding surfaces prior to bonding. Although not shown in FIG. 41C, it is understood that in some examples, silicon substrate 4112 and components formed thereon (e.g., transistors 4114 and 4116) can be flipped upside down, and bonding layer 4120 facing down can be bonded with bonding layer 4110 facing up, i.e., in a face-to-face manner, thereby forming bonding interface 4132 as well.

As a result of the bonding, e.g., hybrid bonding, the bonding contacts on opposite sides of bonding interface 4132 can be inter-mixed. After the bonding, the bonding contacts in bonding layer 4110 and the bonding contacts in bonding layer 4120 are aligned and in contact with one another, such that memory stack 4104 and NAND memory strings 4106 formed therethrough can be coupled to transistors 4114 and 4116 through the bonded bonding contacts across bonding interface 4132, according to some implementations.

In some implementations, the second substrate is thinned after the bonding from the second side opposite to the first side. As illustrated in FIG. 41D, silicon substrate 4112 (shown in FIG. 41C) is thinned from another side opposite to the side on which transistors 4114 and 4116 are formed to become a semiconductor layer 4113 having single crystalline silicon. Silicon substrate 4112 can be thinned by processes including, but not limited to, wafer grinding, dry etch, wet etch, CMP, any other suitable processes, or any combination thereof.

Method 4300 proceeds to operation 4308, as illustrated in FIG. 43, in which a second transistor is formed on a second side of the second substrate opposite to the first side. As illustrated in FIG. 41D, a plurality of transistors 4124 and 4126 are formed on the other side of thinned silicon substrate 4112 (i.e., semiconductor layer 4113) opposite to the side on which transistors 4114 and 4116 are formed. Transistors 4124 and 4126 can be formed by a plurality of processes including, but not limited to, photolithography, dry/wet etch, thin film deposition, thermal growth, implantation, CMP, and any other suitable processes. In some implementations, doped regions are formed on the other side of semiconductor layer 4113 by ion implantation and/or thermal diffusion, which function, for example, as wells and source/drain regions of transistors 4124 and 4126. In some implementations, isolation regions (e.g., STIs) are also formed on the other side of semiconductor layer 4113 by wet/dry etch and thin film deposition. In some implementations, the thickness of gate dielectric of transistor 4124 is different from the thickness of gate dielectric of transistor 4126, for example, by depositing a thicker silicon oxide film in the region of transistor 4124 than the region of transistor 4126, or by etching back part of the silicon oxide film deposited in the region of transistor 4126. It is understood that the details of fabricating transistors 4124 and 4126 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer 4128 is formed above the transistor. The interconnect layer can include a plurality of interconnects in one or more ILD layers. As illustrated in FIG. 41D, an interconnect layer 4128 can be formed above transistors 4124 and 4126. Interconnect layer 4128 can include interconnects of MEOL and/or BEOL in a plurality of ILD layers to make electrical connections with transistors 4124 and 4126. In some implementations, interconnect layer 4128 includes multiple ILD layers and interconnects therein formed in multiple processes. For example, the interconnects in interconnect layer 4128 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 41D can be collectively referred to as interconnect layer 4128.

Different from interconnect layer 4118, in some implementations, the interconnects in interconnect layer 4128 include Cu, which has a relatively low resistivity among conductive metal materials. It is understood that although Cu has a relatively low thermal budget (incompatible with high-temperature processes), using Cu as the conductive materials of the interconnects in interconnect layer 4128 may become feasible since there are no more high-temperature processes after the fabrication of interconnect layer 4128.

In some implementations, a contact through the thinned second substrate is formed. As illustrated in FIG. 41D, one or more contacts 4136 each extending vertically through semiconductor layer 4113 (i.e., the thinned silicon substrate 4112) are formed. Contacts 4136 can couple the interconnects in interconnect layer 4118 and the interconnects in interconnect layer 4128. Contact 4136 can be formed by first patterning contact holes through semiconductor layer 4113 using patterning process (e.g., photolithography and dry/wet etch of dielectric materials in the dielectric layer). The contact holes can be filled with a conductor (e.g., W or Cu). In some implementations, filling the contact holes includes depositing a spacer (e.g., a silicon oxide layer) before depositing the conductor.

Method 4300 skips optional operation 4310 and proceeds to operation 4312, as illustrated in FIG. 43, in which a pad-out interconnect layer is formed. The pad-out interconnect layer can be formed above the second transistor. As illustrated in FIG. 41E, a pad-out interconnect layer 4140 is formed above interconnect layer 4128 and transistors 4126 and 4124 on semiconductor layer 4113. Pad-out interconnect layer 4140 can include interconnects, such as contact pads 4138, formed in one or more ILD layers. Contact pads 4138 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. It is understood that although not shown in FIG. 41E, in some examples, silicon substrate 4102 may be thinned, and pad-out interconnect layer 4140 may be formed on thinned silicon substrate 4102, instead of above transistors 4124 and 4126.

It is understood that in some examples, the sequence of operation 4306 and 4308 in method 4300 may be switched. In some implementations, after operation 4304, method 4300 skips operation 4306 and proceeds to operation 4308, as illustrated in FIG. 43, in which a second transistor is formed on a second side of the second substrate opposite to the first side.

In some implementations, the second substrate is thinned before the bonding from the second side opposite to the first side. As illustrated in FIG. 42C, silicon substrate 4112 (shown in FIG. 42B) is thinned from another side opposite to the side on which transistors 4114 and 4116 are formed to become semiconductor layer 4113 having single crystalline silicon. Silicon substrate 4112 can be thinned by processes including, but not limited to, wafer grinding, dry etch, wet etch, CMP, any other suitable processes, or any combination thereof. In some implementations, as illustrated in FIG. 42B, a handle substrate 4201 is attached to bonding layer 4120, for example, using adhesive bonding, to allow the subsequent backside processes on silicon substrates 4112, such as thinning, contact formation, and bonding.

As illustrated in FIG. 42D, transistors 4124 and 4126 are formed on the other side of thinned silicon substrate 4112 (i.e., semiconductor layer 4113) opposite to the side on which transistors 4114 and 4116 are formed. Transistors 4124 and 4126 can be formed by a plurality of processes including, but not limited to, photolithography, dry/wet etch, thin film deposition, thermal growth, implantation, CMP, and any other suitable processes. In some implementations, doped regions are formed on the other side of semiconductor layer 4113 by ion implantation and/or thermal diffusion, which function, for example, as wells and source/drain regions of transistors 4124 and 4126. In some implementations, isolation regions (e.g., STIs) are also formed on the other side of semiconductor layer 4113 by wet/dry etch and thin film deposition. In some implementations, the thickness of gate dielectric of transistor 4124 is different from the thickness of gate dielectric of transistor 4126, for example, by depositing a thicker silicon oxide film in the region of transistor 4124 than the region of transistor 4126, or by etching back part of the silicon oxide film deposited in the region of transistor 4126. It is understood that the details of fabricating transistors 4124 and 4126 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer 4128 is formed above the transistor. The interconnect layer can include a plurality of interconnects in one or more ILD layers. As illustrated in FIG. 42D, an interconnect layer 4128 can be formed above transistors 4124 and 4126. Interconnect layer 4128 can include interconnects of MEOL and/or BEOL in a plurality of ILD layers to make electrical connections with transistors 4124 and 4126. In some implementations, interconnect layer 4128 includes multiple ILD layers and interconnects therein formed in multiple processes. For example, the interconnects in interconnect layer 4128 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 42D can be collectively referred to as interconnect layer 4128.

Different from interconnect layer 4118, in some implementations, the interconnects in interconnect layer 4128 include Cu, which has a relatively low resistivity among conductive metal materials. It is understood that although Cu has a relatively low thermal budget (incompatible with high-temperature processes), using Cu as the conductive materials of the interconnects in interconnect layer 4128 may become feasible since there are no more high-temperature processes after the fabrication of interconnect layer 4128.

In some implementations, a contact through the thinned second substrate is formed. As illustrated in FIG. 42D, one or more contacts 4136 each extending vertically through semiconductor layer 4113 (i.e., the thinned silicon substrate 4112) are formed after thinning silicon substrate 3112. Contacts 4136 can couple the interconnects in interconnect layer 4118 and the interconnects in interconnect layer 4128. Contact 4136 can be formed after thinning silicon substrate 3112 by first patterning contact holes through semiconductor layer 4113 using patterning process (e.g., photolithography and dry/wet etch of dielectric materials in the dielectric layer). The contact holes can be filled with a conductor (e.g., W or Cu). In some implementations, filling the contact holes includes depositing a spacer (e.g., a silicon oxide layer) before depositing the conductor. It is understood that in some examples, contacts 4136 may be formed in silicon substrate 4112 before thinning (i.e., before the formation of semiconductor layer 4113, e.g., in FIG. 42B) without fully penetrating through silicon substrate 4112 and be exposed from the backside of silicon substrate 4112 (where the thinning occurs) after the thinning. In some examples, the contact hole and the spacer of contact 4136 may be sequentially formed in silicon substrate 4112 before thinning and may be thinned along with silicon substrate 4112 by the thinning process. The conductor of contact 4136 then may be formed through the thinned spacer after the thinning process.

After operation 4308, method 4300 returns to operation 4306, as illustrated in FIG. 43, in which the first substrate and the second substrate are bonded in a face-to-face manner. The first bonding contact in the first bonding layer can be in contact with the second bonding contact in the second bonding layer at a bonding interface after bonding the first and second substrates. The bonding can include hybrid bonding.

As illustrated in FIG. 42D, handle substrate 4201 (shown in FIG. 42C) is removed to expose bonding layer 4120. In some implementations, another substrate (not shown) is attached to interconnect layer 4128 to provide support for the subsequent bonding process. As illustrated in FIG. 42E, silicon substrate 4102 and components formed thereon (e.g., memory stack 4104 and NAND memory strings 4106) are flipped upside down. Bonding layer 4110 facing down is bonded with bonding layer 4120 facing up, i.e., in a face-to-face manner, thereby forming a bonding interface 4132. That is, silicon substrate 4102 and components formed thereon can be bonded with the first side (on which transistors 4114 and 4116 are formed) of thinned silicon substrate 4112 (semiconductor layer 4113) and components formed thereon in a face-to-face manner, such that the bonding contacts in bonding layer 4110 are in contact with the bonding contacts in bonding layer 4120 at bonding interface 4132. In some implementations, a treatment process, e.g., plasma treatment, wet treatment and/or thermal treatment, is applied to bonding surfaces prior to bonding. Although not shown in FIG. 42E, it is understood that in some examples, thinned silicon substrate 4112 and components formed thereon (e.g., transistors 4114, 4116, 4124, and 4126) can be flipped upside down, and bonding layer 4120 facing down can be bonded with bonding layer 4110 facing up, i.e., in a face-to-face manner, thereby forming bonding interface 4132 as well.

As a result of the bonding, e.g., hybrid bonding, the bonding contacts on opposite sides of bonding interface 4132 can be inter-mixed. After the bonding, the bonding contacts in bonding layer 4110 and the bonding contacts in bonding layer 4120 are aligned and in contact with one another, such that memory stack 4104 and NAND memory strings 4106 formed therethrough can be coupled to transistors 4114, 4116, 4124, and 4126 through the bonded bonding contacts across bonding interface 4132, according to some implementations. As illustrated in FIG. 42E, in some implementations, after the bonding, a passivation layer 4242 is formed on interconnect layer 4128 by depositing dielectric materials, such as silicon nitride, using one or more thin film deposition processes including, but not limited to, CVD, PVD, ALD, or any combination thereof.

Figure 42F:
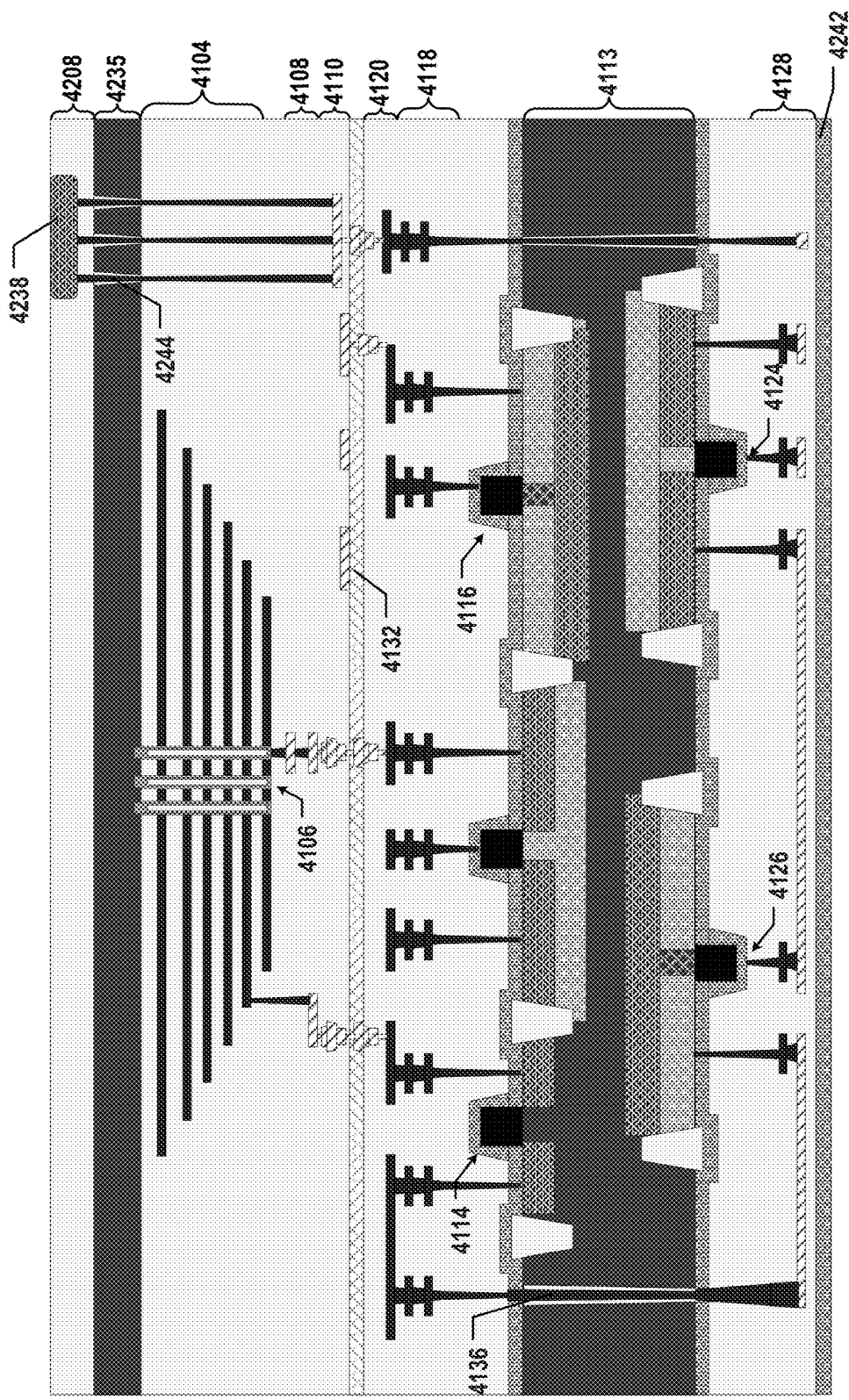

Method 4300 proceeds to optional operation 4310, as illustrated in FIG. 43, in which the first substrate is thinned. As illustrated in FIG. 42F, silicon substrate 4102 (shown in FIG. 42E) is thinned to become a semiconductor layer 4235 having single crystalline silicon. Silicon substrate 4102 can be thinned by processes including, but not limited to, wafer grinding, dry etch, wet etch, CMP, any other suitable processes, or any combination thereof.

Method 4300 proceeds to operation 4312, as illustrated in FIG. 43, in which a pad-out interconnect layer is formed. The pad-out interconnect layer can be formed on the thinned first substrate. As illustrated in FIG. 42F, a pad-out interconnect layer 4208 is formed on semiconductor layer 4235 (the thinned silicon substrate 4102). Pad-out interconnect layer 4208 can include interconnects, such as contact pads 4238, formed in one or more ILD layers. Contact pads 4238 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some implementations, after the bonding and thinning, contacts 4244 are formed, extending vertically through semiconductor layer 4235, for example, by wet/dry etching followed by depositing dielectric materials as spacers and conductive materials as conductors. Contacts 4244 can couple contact pads 4238 in pad-out interconnect layer 4208 to the interconnects in interconnect layer 4108. It is understood that in some examples, contacts 4244 may be formed in silicon substrate 4102 before thinning (the formation of semiconductor layer 4235, e.g., in FIG. 42E) and be exposed from the backside of silicon substrate 4102 (where the thinning occurs) after the thinning.

It is understood that in some examples, the first substrate (e.g., silicon substrate 4102 or semiconductor layer 4235 after thinning) may be removed and replaced with a semiconductor layer having polysilicon in a similar manner as described above with respect to FIGS. 12G and 12H.

After operation 4308, as the first and second transistors are formed on both sides of the second substrate, respectively, the first substrate can be bonded with either the first side or the second side of the second substrate at operation 4306. FIGS. 42D-42F show a process in which the first substrate is bonded with the first side of the second substrate on which the first transistor is formed, e.g., bonding first substrate 4102 and components thereon (e.g., NAND memory strings 4106) to one side of thinned second substrate 4112 (i.e., semiconductor layer 4113) on which transistors 4114 and 4116 are formed. In some implementations, the first substrate is bonded with the second side of the second substrate on which the second transistor is formed.

Figure 42G:
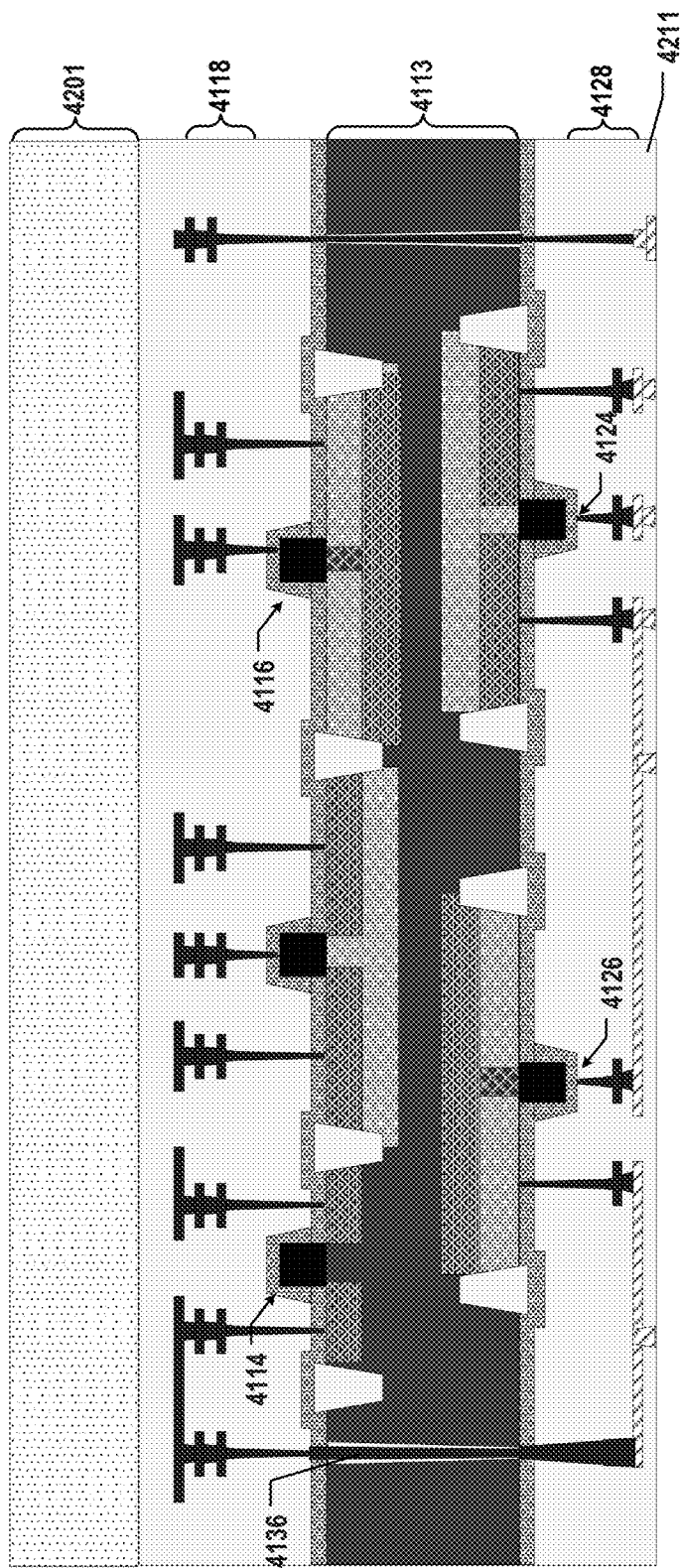

To bond the first substrate with the second side of the second substrate, in some implementations, the second bonding layer is formed above the interconnect layer above the second transistor, as opposed to the interconnect layer above the first transistor. The second bonding layer can include a plurality of second bonding contacts. As illustrated in FIG. 42G, bonding layer 4120 (e.g., shown in FIG. 42C) is not formed above interconnect layer 4118, and handle substrate 4201 is attached onto interconnect layer 4118, as opposed to bonding layer 4120. Instead, a bonding layer 4211 is formed above interconnect layer 4128. Bonding layer 4211 can include a plurality of bonding contacts surrounded by dielectrics. In some implementations, a dielectric layer is deposited on the top surface of interconnect layer 4128 by one or more thin film deposition processes including, but not limited to, CVD, PVD, ALD, or any combination thereof. The bonding contacts can then be formed through the dielectric layer and in contact with the interconnects in interconnect layer 4128 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

As shown in FIGS. 42B, 42C, and 42G, in some implementations, handle substrate 4201 is bonded to interconnect layer 4118 before thinning silicon substrate 4112 and forming transistors 4124 and 4126 and interconnect layer 4128 and bonding layer 4211 on the backside of thinned silicon substrate 4112. That is, handle substrate 4201 can remain being bonded to interconnect layer 4118 without being removed and introducing another handle substrate 4201 on the opposite side of semiconductor layer 4113 (i.e., thinned silicon substrate 4112), thereby simplifying the fabrication process and reducing the production cost.

In some implementations, the thickness of the gate dielectric of transistor 4114 is larger than the thickness of the gate dielectric of transistor 4126. For example, transistor 4114 may be one example of the transistors forming HV circuits 406, and transistor 4126 may be one example of the transistors forming LLV circuits 402. That is, transistors 4114 of HV circuits 406 may be formed on the front side of silicon substrate 4112 before the formation of transistors 4126 of LLV circuits 402 on the backside of silicon substrate 4112, which may reduce the impact of the formation of transistor 4114 on transistor 4126 in a reversed order, thereby reducing the device defects of transistors 4126.

Figure 42H:
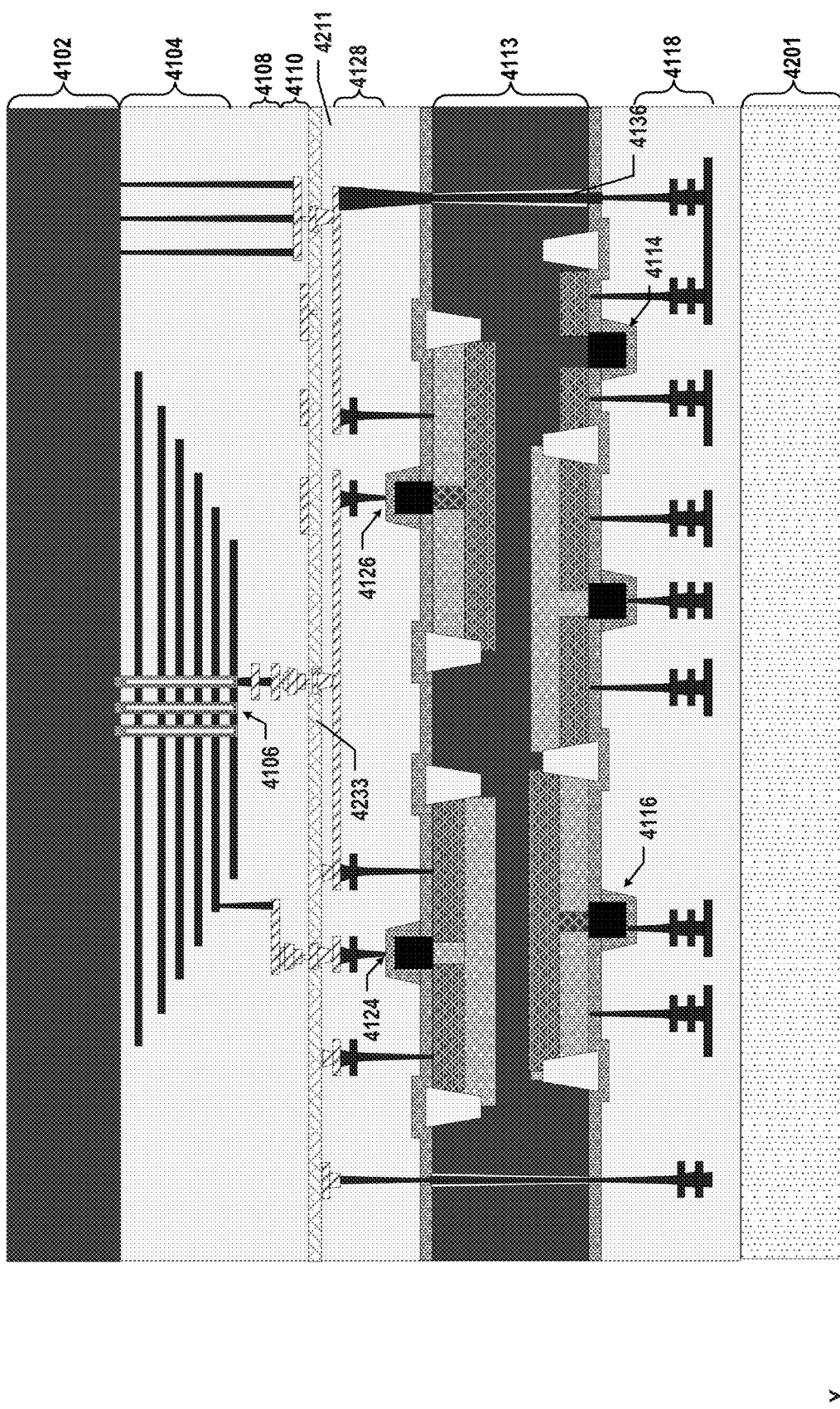

As illustrated in FIG. 42H, silicon substrate 4102 and components formed thereon (e.g., memory stack 4104 and NAND memory strings 4106) are flipped upside down. Bonding layer 4110 facing down is bonded with bonding layer 4211 facing up, i.e., in a face-to-face manner, thereby forming a bonding interface 4233. That is, silicon substrate 4102 and components formed thereon can be bonded with the second side (on which transistors 4124 and 4126 are formed) of thinned silicon substrate 4112 (semiconductor layer 4113) and components formed thereon in a face-to-face manner, such that the bonding contacts in bonding layer 4110 are in contact with the bonding contacts in bonding layer 4211 at bonding interface 4233. In some implementations, a treatment process, e.g., plasma treatment, wet treatment and/or thermal treatment, is applied to bonding surfaces prior to bonding. Although not shown in FIG. 42H, it is understood that in some examples, thinned silicon substrate 4112 and components formed thereon (e.g., transistors 4114, 4116, 4124, and 4126) can be flipped upside down, and bonding layer 4211 facing down can be bonded with bonding layer 4110 facing up, i.e., in a face-to-face manner, thereby forming bonding interface 4233 as well.

As a result of the bonding, e.g., hybrid bonding, the bonding contacts on opposite sides of bonding interface 4233 can be inter-mixed. After the bonding, the bonding contacts in bonding layer 4110 and the bonding contacts in bonding layer 4211 are aligned and in contact with one another, such that memory stack 4104 and NAND memory strings 4106 formed therethrough can be coupled to transistors 4114, 4116, 4124, and 4126 through the bonded bonding contacts across bonding interface 4233, according to some implementations.

Figure 42I:
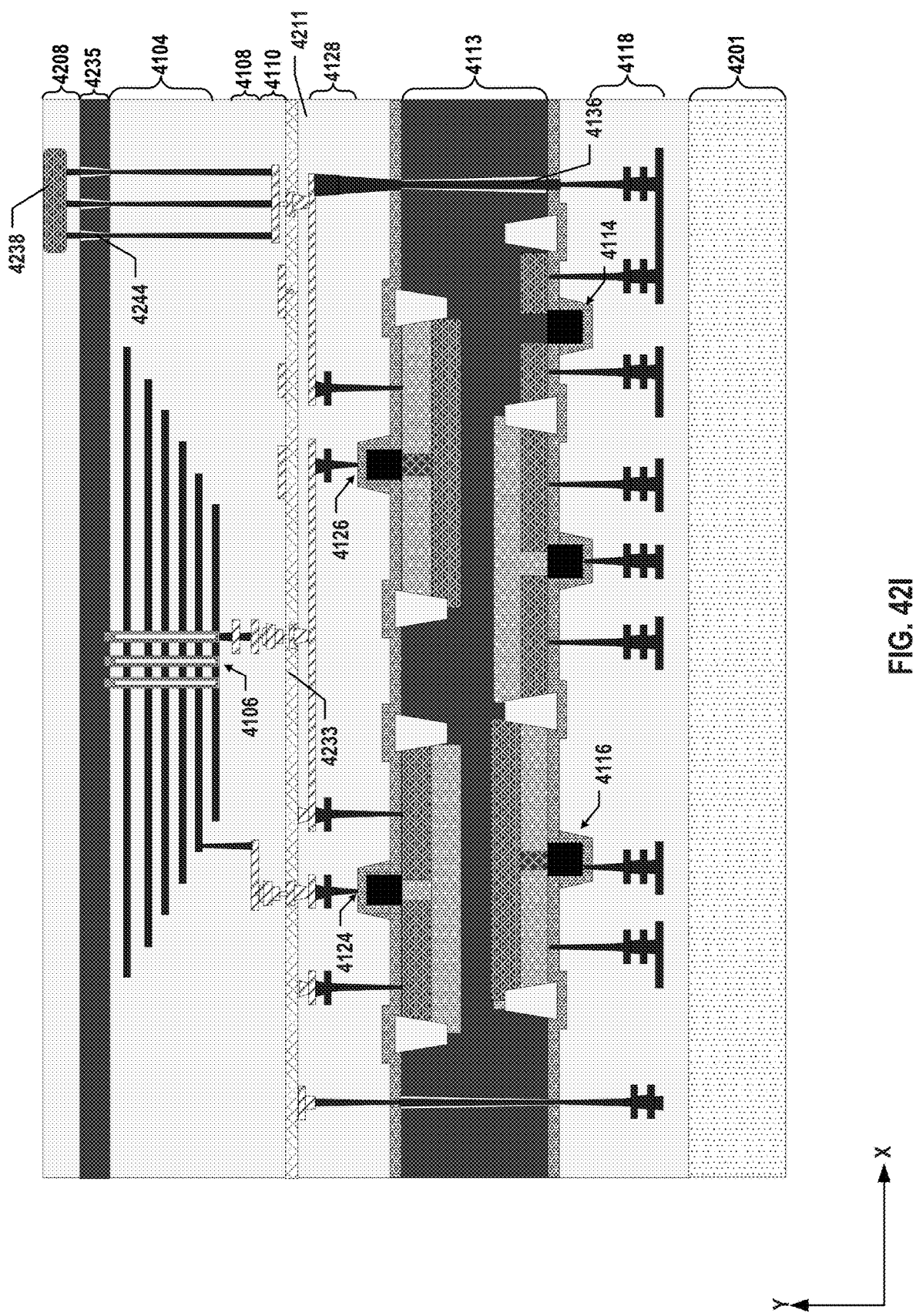

As illustrated in FIG. 42I, silicon substrate 4102 (shown in FIG. 42H) is thinned to become semiconductor layer 4235 having single crystalline silicon. Silicon substrate 4102 can be thinned by processes including, but not limited to, wafer grinding, dry etch, wet etch, CMP, any other suitable processes, or any combination thereof.

As illustrated in FIG. 42I, pad-out interconnect layer 4208 is formed on semiconductor layer 4235 (the thinned silicon substrate 4102). Pad-out interconnect layer 4208 can include interconnects, such as contact pads 4238, formed in one or more ILD layers. In some implementations, after the bonding and thinning, contacts 4244 are formed, extending vertically through semiconductor layer 4235, for example, by wet/dry etching followed by depositing dielectric materials as spacers and conductive materials as conductors. Contacts 4244 can couple contact pads 4238 in pad-out interconnect layer 4208 to the interconnects in interconnect layer 4108. It is understood that in some examples, contacts 4244 may be formed in silicon substrate 4102 before thinning (the formation of semiconductor layer 4235, e.g., in FIG. 42E) and be exposed from the backside of silicon substrate 4102 (where the thinning occurs) after the thinning.

It is understood that in some examples, the first substrate (e.g., silicon substrate 4102 or semiconductor layer 4235 after thinning) may be removed and replaced with a semiconductor layer having polysilicon in a similar manner as described above with respect to FIGS. 12G and 12H.

Figure 44A:
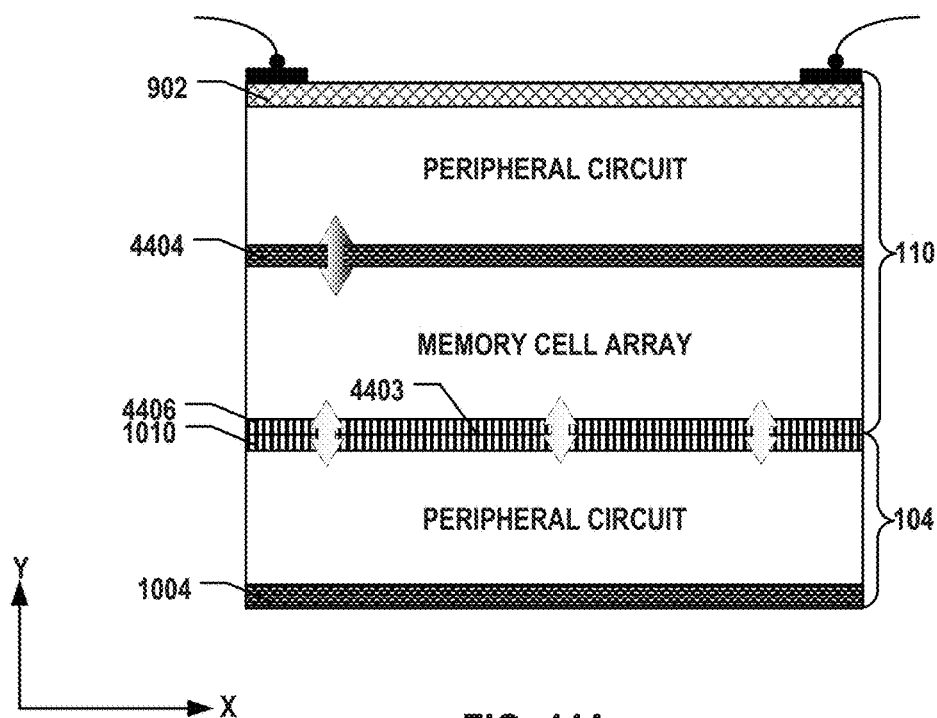
FIGS. 44A and 44B illustrate schematic views of cross-sections of 3D memory devices having two stacked semiconductor structures, according to some aspects of the present disclosure.
Figure 44B:
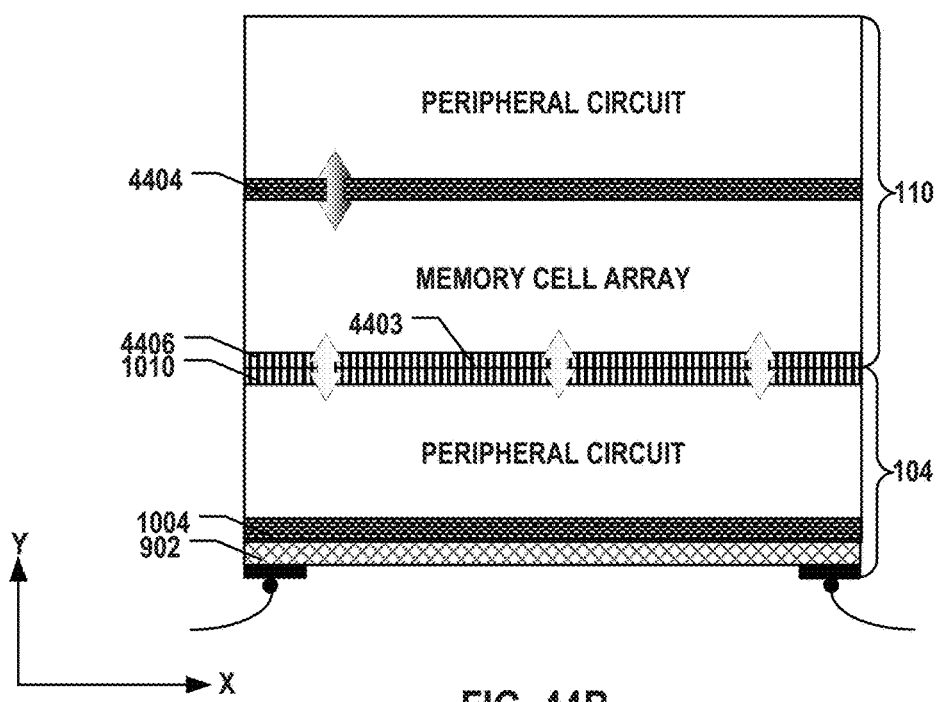

FIGS. 44A and 44B illustrate schematic views of cross-sections of 3D memory devices 4400 and 4401 having two stacked semiconductor structures 104 and 110, according to some aspects of the present disclosure. 3D memory devices 4400 and 4401 may be examples of 3D memory device 121 in FIG. 1D in which second semiconductor structure 104 including some of the peripheral circuits is bonded to a fifth semiconductor structure 110 including a memory cell array and some of the peripheral circuits of the memory cell array disposed in different planes. In other words, as shown in FIGS. 44A and 44B, the memory cell array in fifth semiconductor structure 110 is disposed in the intermediate of 3D memory devices 4400 and 4401 in the vertical direction, according to some implementations.

In some implementations, second semiconductor structure 104 includes a semiconductor layer 1004, a bonding layer 1010, and some of the peripheral circuits vertically between semiconductor layer 1004 and bonding layer 1010. The transistors (e.g., planar transistors 500 and 3D transistors 600) of the peripheral circuits in second semiconductor structure 104 can be in contact with semiconductor layer 1004. Semiconductor layer 1004 can include semiconductor materials. In some implementations, semiconductor layer 1004 on which the transistors are formed includes single crystalline silicon, but not polysilicon, due to the superior carrier mobility of single crystalline silicon that is desirable for transistors' performance. Bonding layer 1010 can include conductive bonding contacts (not shown) and dielectrics electrically isolating the bonding contacts, which can be used, for example, for hybrid bonding as described below in detail.

In some implementations, fifth semiconductor structure 110 includes a pad-out interconnect layer 902, a semiconductor layer 4404, a bonding layer 4406, a memory cell array vertically between bonding layer 4406 and a first side of semiconductor layer 4404, and some of the peripheral circuits of the memory cell array vertically between pad-out interconnect layer 902 and a second side of semiconductor layer 4404 opposite to the first side. That is, the transistors of some of the peripheral circuits and the memory cell array can be in contact with opposite sides of semiconductor layer 4404. Thus, the transistors of the two separate portions of the peripheral circuits are stacked over each other in different planes and separated by the memory cell array in the vertical direction, according to some implementations.

The memory cell array can include an array of NAND memory strings (e.g., NAND memory strings 208 disclosed herein), and the sources of the array of NAND memory strings can be in contact with the first side of semiconductor layer 4404 (e.g., as shown in FIGS. 8A-8C). The transistors (e.g., planar transistors 500 and 3D transistors 600) of the peripheral circuits in fifth semiconductor structure 110 can be in contact with the second side of semiconductor layer 1004. Semiconductor layer 4404 can include semiconductor materials, such as single crystalline silicon (e.g., a silicon substrate or a thinned silicon substrate). In some implementations, semiconductor layer 4404 on which both the transistors and the memory cell array are formed includes single crystalline silicon, but not polysilicon, due to the superior carrier mobility of single crystalline silicon that is desirable for transistors' performance.

Similar to bonding layer 1010 in second semiconductor structure 104, bonding layer 4406 in fifth semiconductor structure 110 can also include conductive bonding contacts (not shown) and dielectrics electrically isolating the bonding contacts. A bonding interface 4403 is vertically between and in contact with bonding layers 1010 and 4406, respectively, according to some implementations. That is, bonding layers 1010 and 4406 can be disposed on opposite sides of bonding interface 4403, and the bonding contacts of bonding layer 4406 can be in contact with the bonding contacts of bonding layer 1010 at bonding interface 4403. As a result, a large number (e.g., millions) of bonding contacts across bonding interface 103 can make direct, short-distance (e.g., micron-level) electrical connections between adjacent semiconductor structures 104 and 110.

As shown in FIGS. 44A and 44B, 3D memory devices 4400 and 4401 can further include a pad-out interconnect layer 902 for pad-out purposes, i.e., interconnecting with external devices using contact pads on which bonding wires can be soldered. In one example shown in FIG. 44A, fifth semiconductor structure 110 including some of the peripheral circuits may include pad-out interconnect layer 902. In another example shown in FIG. 44B, second semiconductor structure 104 including some of the peripheral circuits may include pad-out interconnect layer 902. In either example, 3D memory device 4400 or 4401 may be pad-out from one of the peripheral circuit sides to reduce the interconnect distance between contact pads and the peripheral circuits, thereby decreasing the parasitic capacitance from the interconnects and improving the electrical performance of 3D memory device 4400 or 4401.

As shown in FIGS. 44A and 44B, 3D memory device 4400 or 4401 can include the memory cell array, a first peripheral circuit including a first transistor, a second peripheral circuit include a second transistor, a first semiconductor layer 1004 including a first side and a second side, and a second semiconductor layer 4404 including a third side and a fourth side. The memory cell array, the first transistor, and the second transistor can be in contact with three of the first, second, third and fourth sides. The second and third sides can be disposed between the first and fourth sides, and the first transistor and the memory cell array can be in contact with the second and third sides, respectively. For example, as shown in FIGS. 44A and 44B, the memory cell array is in contact with the third side of second semiconductor layer 4404, the first transistor is in contact with the second side of first semiconductor layer 1004, and the second transistor is in contact with the fourth side of second semiconductor layer 4404.

Figure 45A:
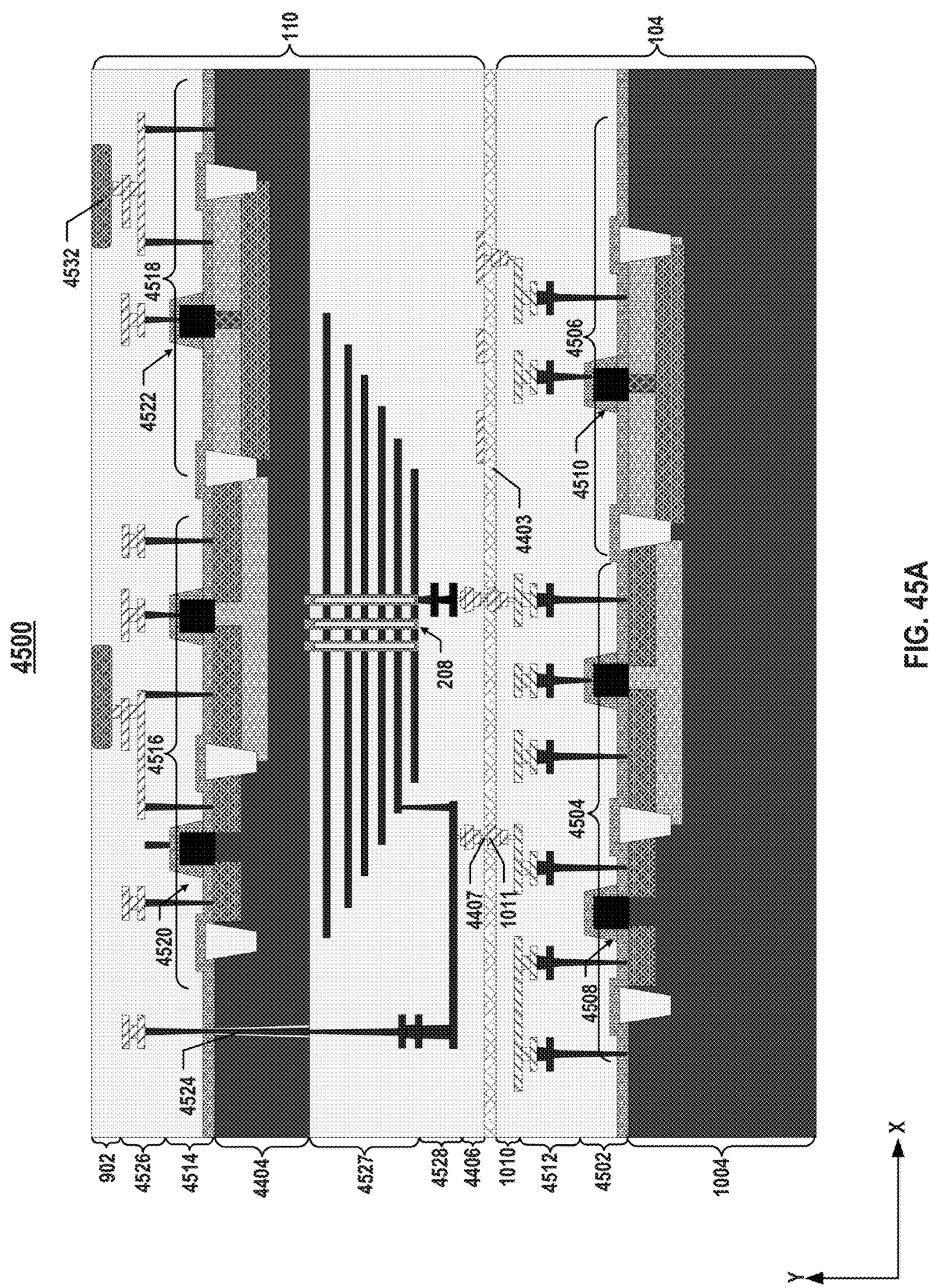
FIGS. 45A and 45B illustrate schematic views of cross-sections of the 3D memory devices in FIGS. 44A and 44B, according to some various of the present disclosure.
Figure 45B:
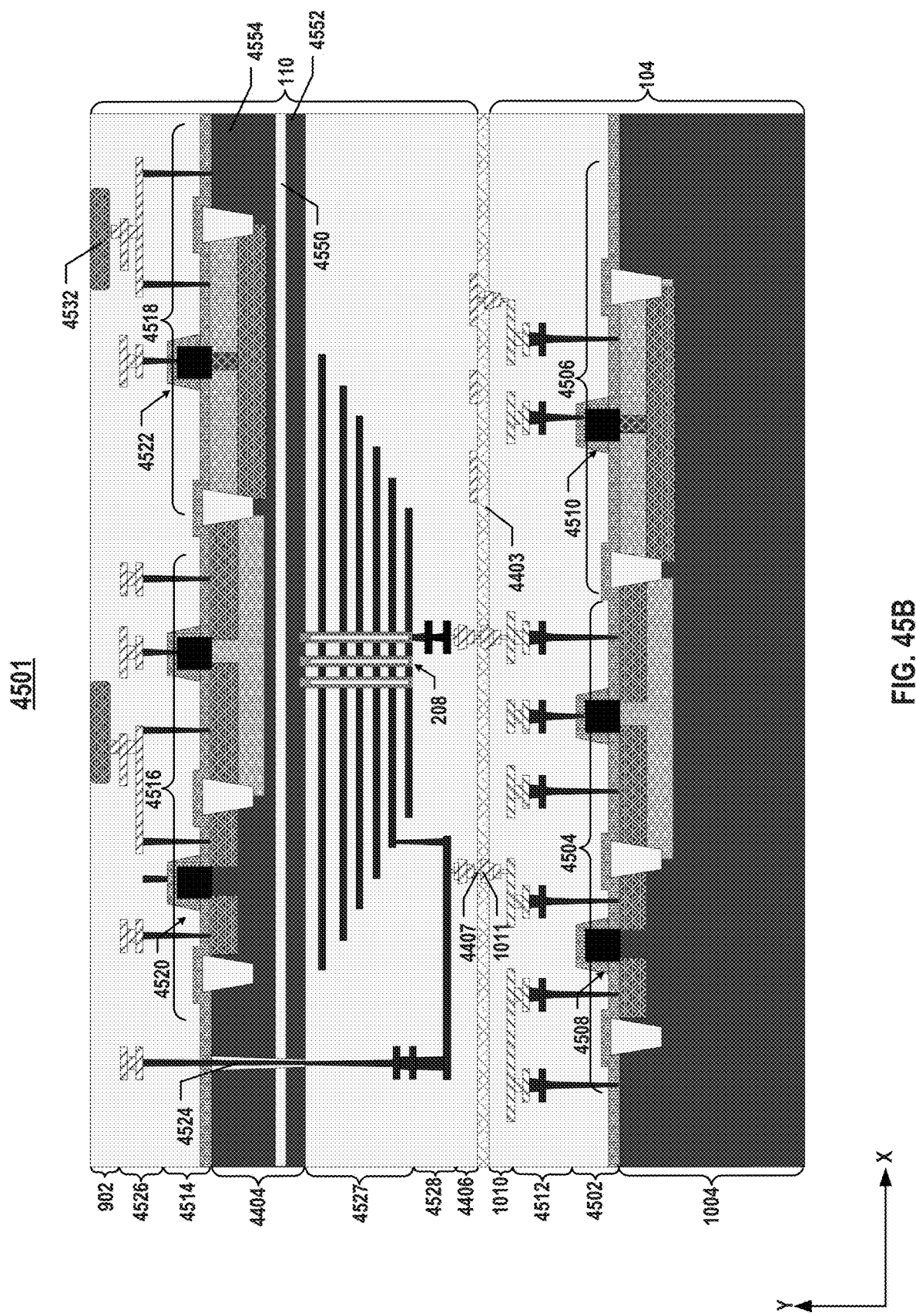

FIGS. 45A and 45B illustrate side views of example of 3D memory devices 4400 and 4401 in FIGS. 44A and 44B, according to various aspects of the present disclosure. As shown in FIG. 45A, as one example of 3D memory devices 4400 and 4401 in FIGS. 44A and 44B, 3D memory device 4500 is a bonded chip including second semiconductor structure 104 and fifth semiconductor structure 110, which are stacked over one another in different planes in the vertical direction (e.g., they-direction in FIG. 45A), according to some implementations. Fifth and second semiconductor structures 110 and 104 are bonded at bonding interface 4403 therebetween, and fifth semiconductor structure 110 includes two device layers 4514 and a memory stack 4527 (and NAND memory strings 208 therethrough) on opposite sides thereof in the vertical direction (e.g., the y-direction in FIG. 45A), according to some implementations.

As shown in FIG. 45A, second semiconductor structure 104 can include semiconductor layer 1004 having semiconductor materials. In some implementations, semiconductor layer 1004 is a silicon substrate having single crystalline silicon. Second semiconductor structure 104 can also include a device layer 4502 above and in contact with semiconductor layer 1004. In some implementations, device layer 4502 includes a first peripheral circuit 4504 and a second peripheral circuit 4506. First peripheral circuit 4504 can include HV circuits 406, such as driving circuits (e.g., string drivers 704 in row decoder/word line driver 308 and drivers in column decoder/bit line driver 306), and second peripheral circuit 4506 can include LV circuits 404, such as page buffer circuits (e.g., page buffer circuits 702 in page buffer 304) and logic circuits (e.g., in control logic 312). In some implementations, first peripheral circuit 4504 includes a plurality of transistors 4508 in contact with semiconductor layer 1004, and second peripheral circuit 4506 includes a plurality of transistors 4510 in contact with semiconductor layer 1004. Transistors 4508 and 4510 can include any transistors disclosed herein, such as planar transistors 500 and 3D transistors 600. As described above in detail with respect to transistors 500 and 600, in some implementations, each transistor 4508 and 4510 includes a gate dielectric, and the thickness of the gate dielectric of transistor 4508 (e.g., in HV circuit 406) is larger than the thickness of the gate dielectric of transistor 4510 (e.g., in LV circuit 404) due to the higher voltage applied to transistor 4508 than transistor 4510. Trench isolations (e.g., STIs) and doped regions (e.g., wells, sources, and drains of transistors 4508 and 4510) can be formed on or in semiconductor layer 1004 as well.

In some implementations, second semiconductor structure 104 further includes an interconnect layer 4512 above device layer 4502 to transfer electrical signals to and from peripheral circuits 4506 and 4504. As shown in FIG. 45A, interconnect layer 4512 can be disposed vertically between bonding interface 4403 and device layer 4502 (including transistors 4508 and 4510 of peripheral circuits 4504 and 4506). Interconnect layer 4512 can include a plurality of interconnects. The interconnects in interconnect layer 4512 can be coupled to transistors 4508 and 4510 of peripheral circuits 4504 and 4506 in device layer 4502. Interconnect layer 4512 can further include one or more ILD layers in which the lateral lines and vias can form. That is, interconnect layer 4512 can include lateral lines and vias in multiple ILD layers. In some implementations, the devices in device layer 4502 are coupled to one another through the interconnects in interconnect layer 4512. For example, peripheral circuit 4504 may be coupled to peripheral circuit 4506 through interconnect layer 4512. The interconnects in interconnect layer 4512 can include conductive materials including, but not limited to, W, Co, Cu, Al, silicides, or any combination thereof. The ILD layers in interconnect layer 4512 can include dielectric materials including, but not limited to, silicon oxide, silicon nitride, silicon oxynitride, low-k dielectrics, or any combination thereof.

As shown in FIG. 45A, second semiconductor structure 104 can further include a bonding layer 1010 at bonding interface 4403 and above and in contact with interconnect layer 4512. Bonding layer 1010 can include a plurality of bonding contacts 1011 and dielectrics electrically isolating the bonding contacts. Bonding contacts 1011 can include conductive materials including, but not limited to, W, Co, Cu, Al, silicides, or any combination thereof. In some implementations, bonding contacts 1011 of bonding layer 1010 include Cu. The remaining area of bonding layer 1010 can be formed with dielectrics including, but not limited to, silicon oxide, silicon nitride, silicon oxynitride, low-k dielectrics, or any combination thereof. Bonding contacts 1011 and surrounding dielectrics in bonding layer 1010 can be used for hybrid bonding (also known as "metal/dielectric hybrid bonding"), which is a direct bonding technology (e.g., forming bonding between surfaces without using intermediate layers, such as solder or adhesives) and can obtain metal-metal (e.g., Cu-to-Cu) bonding and dielectric-dielectric (e.g., $SiO_2$-to-$SiO_2$) bonding simultaneously.

As shown in FIG. 45A, fifth semiconductor structure 110 can also include a bonding layer 4406 at bonding interface 4403, e.g., on the opposite side of bonding interface 4403 with respect to bonding layer 1010 in second semiconductor structure 104. Bonding layer 4406 can include a plurality of bonding contacts 4407 and dielectrics electrically isolating bonding contacts 4407. Bonding contacts 4407 can include conductive materials, such as Cu. The remaining area of bonding layer 4406 can be formed with dielectric materials, such as silicon oxide. Bonding contacts 4407 and surrounding dielectrics in bonding layer 4406 can be used for hybrid bonding. In some implementations, bonding interface 4403 is the place at which bonding layers 4406 and 1010 are met and bonded. In practice, bonding interface 4403 can be a layer with a certain thickness that includes the top surface of bonding layer 1010 of second semiconductor structure 104 and the bottom surface of bonding layer 4406 of fifth semiconductor structure 110.

As shown in FIG. 45A, fifth semiconductor structure 110 can further include an interconnect layer 4528 above and in contact with bonding layer 4406 to transfer electrical signals. Interconnect layer 4528 can include a plurality of interconnects, such as MEOL interconnects and BEOL interconnects. In some implementations, the interconnects in interconnect layer 4528 also include local interconnects, such as bit line contacts and word line contacts. Interconnect layer 4528 can further include one or more ILD layers in which the lateral lines and vias can form. The interconnects in interconnect layer 4528 can include conductive materials including, but not limited to, W, Co, Cu, Al, silicides, or any combination thereof. The ILD layers in interconnect layer 4528 can include dielectric materials including, but not limited to, silicon oxide, silicon nitride, silicon oxynitride, low-k dielectrics, or any combination thereof.

As shown in FIG. 45A, fifth semiconductor structure 110 can further include a memory cell array, such as an array of NAND memory strings 208 above and in contact with interconnect layer 4528. In some implementations, interconnect layer 4528 is vertically between NAND memory strings 208 and bonding interface 4403. Each NAND memory string 208 extends vertically through a plurality of pairs each including a conductive layer and a dielectric layer, according to some implementations. The stacked and interleaved conductive layers and dielectric layers are also referred to herein as a stack structure, e.g., a memory stack 4527. Memory stack 4527 may be an example of memory stack 804 in FIGS. 8A-8C, and the conductive layer and dielectric layer in memory stack 4527 may be examples of gate conductive layers 806 and dielectric layer 808, respectively, in memory stack 804. The interleaved conductive layers and dielectric layers in memory stack 4527 alternate in the vertical direction, according to some implementations. Each conductive layer can include a gate electrode (gate line) surrounded by an adhesive layer and a gate dielectric layer. The gate electrode of the conductive layer can extend laterally as a word line, ending at one or more staircase structures of memory stack 4527.

In some implementations, each NAND memory string 208 is a "charge trap" type of NAND memory string including any suitable channel structures disclosed herein, such as bottom plug channel structure 812A, sidewall plug channel structure 812B, or bottom open channel structure 812C, described above in detail with respect to FIGS. 8A-8C. It is understood that NAND memory strings 208 are not limited to the "charge trap" type of NAND memory strings and may be "floating gate" type of NAND memory strings in other examples.

As shown in FIG. 45A, fifth semiconductor structure 110 can further include semiconductor layer 4404 disposed above memory stack 4527 and in contact with the sources of NAND memory strings 208 on one side thereof. Semiconductor layer 1002 can include semiconductor materials. Devices, such as NAND memory strings 208 and transistors, can be formed on both sides of semiconductor layer 4404. The sources of NAND memory strings 208 can be in contact with a first side (e.g., toward the negative y-direction in FIG. 45A) of semiconductor layer 4404. In some implementations, semiconductor layer 1002 is a thinned silicon substrate having single crystalline silicon on which memory stack 3627 and NAND memory strings 208 (e.g., including bottom plug channel structure 812A or sidewall plug channel structure 812B) are formed on the first side thereof. It is understood that in some examples, trench isolations and doped regions (not shown) may be formed on one side of semiconductor layer 4404 as well.

As shown in FIG. 45A, fifth semiconductor structure 110 can also include another device layer 4514 above and in contact with a second side (e.g., toward the positive y-direction in FIG. 45A) of semiconductor layer 4404 opposite to the first side. Device layer 4514 and memory stack 4527 and NAND memory strings 208 can thus be disposed in different planes in the vertical direction, i.e., stacked over one another on opposite sides of semiconductor layer 4404 in fifth semiconductor structure 110. Further, device layers 4514 and 4502 can also be disposed in different planes in the vertical direction, i.e., stacked over one another, and separated by semiconductor layer 4404 and memory stack 4527 and NAND memory strings 208 in the vertical direction. In some implementations, device layer 4514 includes a first peripheral circuit 4516 and a second peripheral circuit 4518. First peripheral circuit 4516 can include LLV circuits 402, such as I/O circuits (e.g., in interface 316 and data bus 318), and second peripheral circuit 4518 can include LV circuits 404, such as page buffer circuits (e.g., page buffer circuits 702 in page buffer 304) and logic circuits (e.g., in control logic 312). In some implementations, first peripheral circuit 4516 includes a plurality of transistors 4520 in contact with the second side of semiconductor layer 4404, and second peripheral circuit 4518 includes a plurality of transistors 4522 in contact with the second side of semiconductor layer 4404. Transistors 4520 and 4522 can include any transistors disclosed herein, such as planar transistors 500 and 3D transistors 600. As described above in detail with respect to transistors 500 and 600, in some implementations, each transistor 4520 or 4522 includes a gate dielectric, and the thickness of the gate dielectric of transistor 4520 (e.g., in LLV circuit 402) is smaller than the thickness of the gate dielectric of transistor 4522 (e.g., in LV circuit 404) due to the lower voltage applied to transistor 4520 than transistor 4522. Trench isolations (e.g., STIs) and doped regions (e.g., wells, sources, and drains of transistors 4520 and 4522) can be formed on the second side of semiconductor layer 3904 as well.

Moreover, the different voltages applied to different transistors 4520, 4522, 4508, and 4510 in fifth and second semiconductor structures 110 and 104 can lead to differences of device dimensions between fifth and second semiconductor structures 110 and 104. In some implementations, the thickness of the gate dielectric of transistor 4508 (e.g., in HV circuit 406) is larger than the thickness of the gate dielectric of transistor 4520 (e.g., in LLV circuit 402) due to the higher voltage applied to transistor 4508 than transistor 4520. In some implementations, the thickness of the gate dielectric of transistor 4522 (e.g., in LV circuit 404) is the same as the thickness of the gate dielectric of transistor 4510 (e.g., in LV circuit 404) due to the same voltage applied to transistor 4522 and transistor 4510. In some implementations, the thickness of semiconductor layer 1004 in which transistor 4508 (e.g., in HV circuit 406) is formed is larger than the thickness of semiconductor layer 4404 in which transistor 4520 (e.g., in LLV circuit 402) is formed due to the higher voltage applied to transistor 4508 than transistor 4520.

In some implementations, fifth semiconductor structure 110 further includes an interconnect layer 4526 above device layer 4514 to transfer electrical signals to and from peripheral circuits 4516 and 4518. As shown in FIG. 45A, device layer 4514 (including transistors 4520 and 4522 of peripheral circuits 4516 and 4518) can be disposed vertically between semiconductor layer 4404 and interconnect layer 4526. Interconnect layer 4526 can include a plurality of interconnects. The interconnects in interconnect layer 4012 can be coupled to transistors 4520 and 4522 of peripheral circuits 4518 and 4518 in device layer 4514. Interconnect layer 4526 can further include one or more ILD layers in which the lateral lines and vias can form. That is, interconnect layer 4526 can include lateral lines and vias in multiple ILD layers. In some implementations, the devices in device layer 4514 are coupled to one another through the interconnects in interconnect layer 4526. For example, peripheral circuit 4516 may be coupled to peripheral circuit 4518 through interconnect layer 4526. The interconnects in interconnect layer 4526 can include conductive materials including, but not limited to, W, Co, Cu, Al, silicides, or any combination thereof. The ILD layers in interconnect layer 4526 can include dielectric materials including, but not limited to, silicon oxide, silicon nitride, silicon oxynitride, low-k dielectrics, or any combination thereof.

In some implementations, the interconnects in interconnect layer 4526 include Cu, which has a relatively low resistivity (better electrical performance) among conductive metal materials. As described below with respect to the fabrication process, although Cu has a relatively low thermal budget (incompatible with high-temperature processes), since the fabrication of interconnect layer 4526 can occur after the high-temperature processes in forming device layer 4514 and memory stack 4527 and NAND memory strings 208 in fifth semiconductor structure 110, as well as being separated from the high-temperature processes in forming second semiconductor structure 104, the interconnects of interconnect layer 4526 having Cu can become feasible.

As shown in FIG. 45A, fifth semiconductor structure 110 can further include one or more contacts 4524 extending vertically through semiconductor layer 4404. In some implementations, contacts 4524 couple the interconnects in interconnect layer 4526 and the interconnects in interconnect layer 4528. Contact 4524 can include conductive materials including, but not limited to, W, Co, Cu, Al, silicides, or any combination thereof. In some implementations, contact 4524 includes a via surrounded by a dielectric spacer (e.g., having silicon oxide) to electrically separate the via from semiconductor layer 4404. Depending on the thickness of semiconductor layer 4404, contact 4524 can be an ILV having a depth in the submicron-level (e.g., between 10 nm and 1 μm), or a TSV having a depth in the micron- or tens micron-level (e.g., between 1 μm and 100 μm).

As shown in FIG. 45A, fifth semiconductor structure 110 can further include a pad-out interconnect layer 902 above and in contact with interconnect layer 4526. In some implementations, device layer 4514 having transistors 4520 and 4522 is disposed vertically between pad-out interconnect layer 902 and semiconductor layer 4404. Pad-out interconnect layer 902 can include interconnects, e.g., contact pads 4532, in one or more ILD layers. Pad-out interconnect layer 902 and interconnect layer 4526 can be formed on the same side of semiconductor layer 4404. In some implementations, the interconnects in pad-out interconnect layer 902 can transfer electrical signals between 3D memory device 4500 and external devices, e.g., for pad-out purposes.

As a result, peripheral circuits 4516 and 4518 and NAND memory strings 208 on different sides of semiconductor layer 4404 in fifth semiconductor structure 110 can be coupled to peripheral circuits 4504 and 4506 in second semiconductor structure 104 through various interconnection structures, including interconnect layers 4512, 4526, and 4528, bonding layers 1010 and 4406, and contacts 4524. Moreover, peripheral circuits 4504, 4506, 4516, and 4518 and NAND memory strings 208 in 3D memory device 4500 can be further coupled to external devices through pad-out interconnect layer 902.

It is understood that the pad-out of 3D memory devices is not limited to from fifth semiconductor structure 110 having transistors 4520 and 4522 as shown in FIG. 45A (corresponding to FIG. 44A) and may be from second semiconductor structure 104 having transistors 4508 and 4510 (corresponding to FIG. 44B) as described above in detail. It is also understood that in some examples, since transistors 4520 and 4522 are formed on semiconductor layer 4404, semiconductor layer 4404 may include single crystalline silicon, but not polysilicon, due to the superior carrier mobility of single crystalline silicon that is desirable for transistors' performance. In those examples, the channel structures of NAND memory string 208, which are in contact with semiconductor layer 4404 as well, may include channel structures that are suitable to be formed on single crystalline silicon, but not polysilicon, such as bottom plug channel structure 812A and sidewall plug channel structure 812B, described above in detail with respect to FIGS. 8A and 8B.

It is also understood that in some examples, a dielectric layer (e.g., silicon oxide layer) may be formed in semiconductor layer 4404. For example, as shown in FIG. 45B, semiconductor layer 4404 in a 3D memory device 4501 may include a dielectric layer 4550 (e.g., a silicon oxide layer). Dielectric layer 4550 can extend laterally and be disposed vertically between device layer 4514 and memory stack 4527 and NAND memory strings 208, which can serve as a shielding layer between the components formed on opposite sides of semiconductor layer 4404, for example, for reducing the impact across semiconductor layer 4404 on the threshold voltages of transistors 4520 and 4522 caused by memory stack 4527 and NAND memory strings 208. As shown in FIG. 45B, semiconductor layer 4404 may include multiple sublayers 4552 and 4554 on opposite sides of dielectric layer 4550. In some implementations, sublayers 4552 and 4554 are two single crystalline silicon sublayers on opposite sides of dielectric layer 4550 (e.g., semiconductor layer 4404 being an SOI substrate). In some implementations, sublayers 4554 and 4552 are a single crystalline silicon sublayer and a polysilicon sublayer, respectively, on opposite sides of dielectric layer 4550 (e.g., by sequentially depositing a silicon oxide layer and a polysilicon layer on a silicon substrate or by transfer bonding). For example, sublayer 4554 may be a single crystalline silicon sublayer, sublayer 4552 may be a polysilicon sublayer, NAND memory strings 208 may be in contact with sublayer 4552, and transistors 4520 and 4522 may be in contact with sublayer 4554.

FIGS. 46A-46G illustrate a fabrication process for forming the 3D memory devices in FIGS. 44A and 44B, according to some aspects of the present disclosure. FIG. 47 illustrates a flowchart of a method 4700 for forming the 3D memory devices in FIGS. 44A and 44B, according to some aspects of the present disclosure. Examples of the 3D memory devices depicted in FIGS. 46A-46G and 47 include 3D memory devices 4500 and 4501 depicted in FIGS. 45A and 45B. FIGS. 46A-46G and 47 will be described together. It is understood that the operations shown in method 4700 are not exhaustive and that other operations can be performed as well before, after, or between any of the illustrated operations. Further, some of the operations may be performed simultaneously, or in a different order than shown in FIG. 47. For example, operation 4702 and 4704 may be performed in parallel.

Referring to FIG. 47, method 4700 starts at operation 4702, in which an array of NAND memory strings is formed on a first substrate. The first substrate can be a silicon substrate having single crystalline silicon. In some implementations, to form the array of NAND memory strings, a memory stack is formed on the first substrate.

Figure 46A:
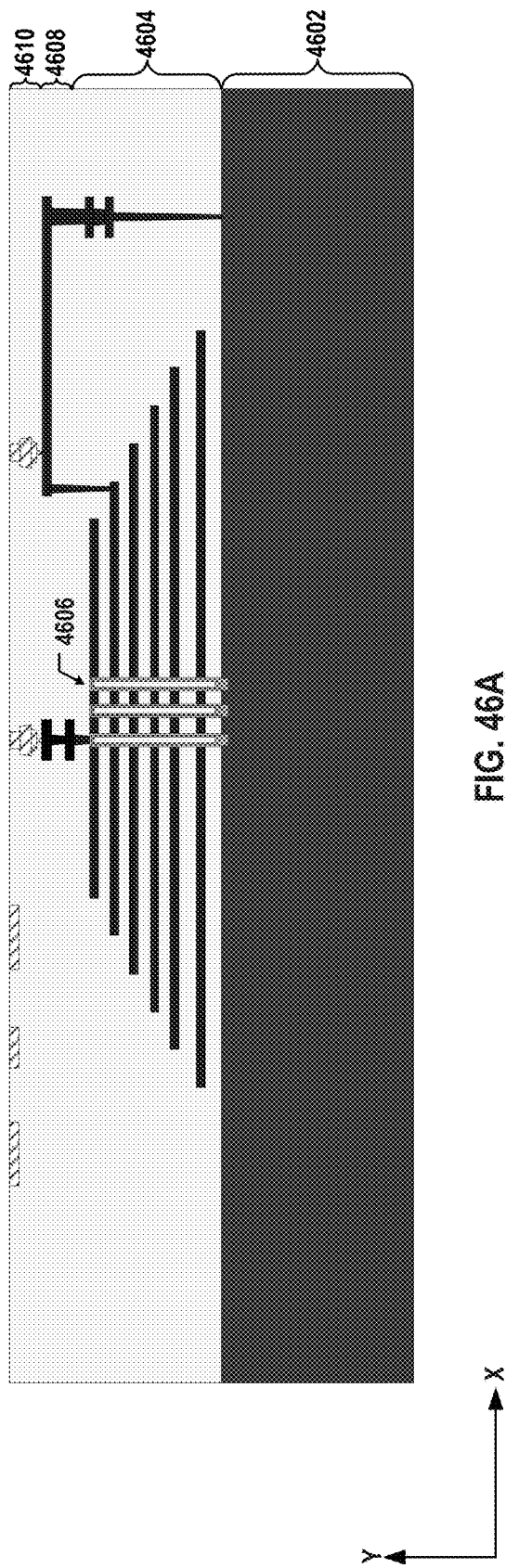
FIGS. 46A-46G illustrate a fabrication process for forming the 3D memory devices in FIGS. 44A and 44B, according to some aspects of the present disclosure.
Figure 47:
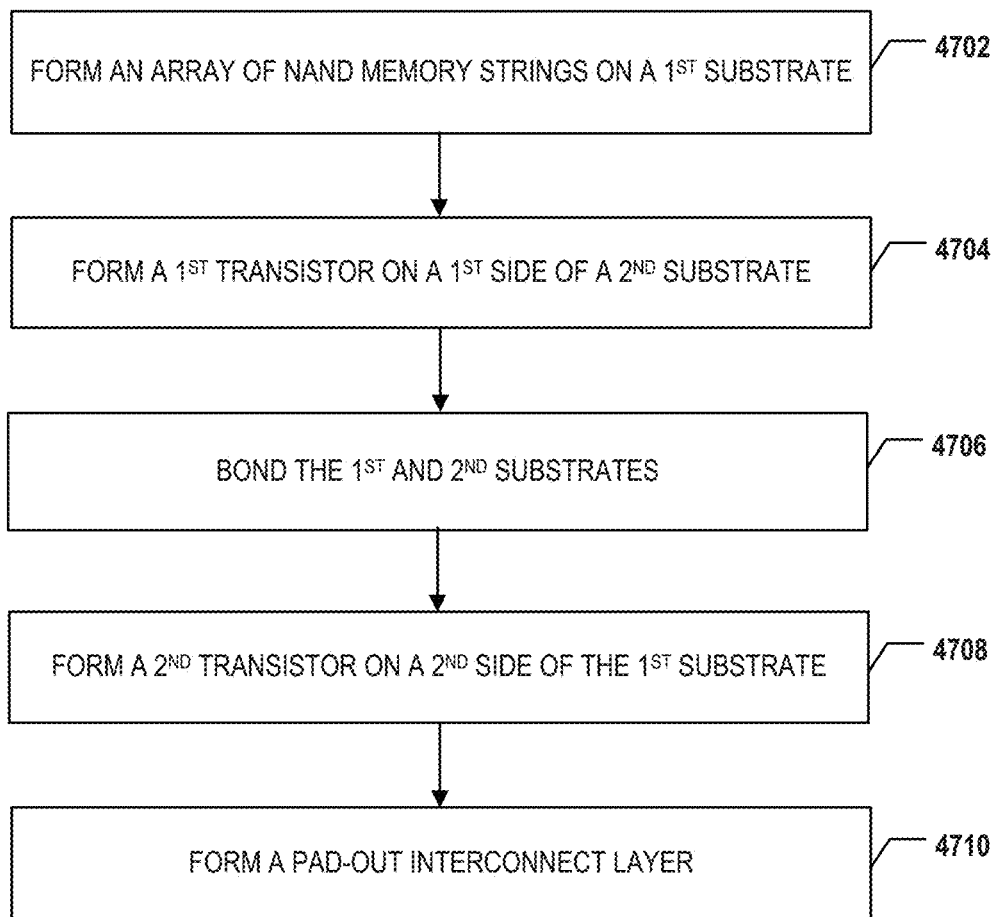
FIG. 47 illustrates a flowchart of a method for forming the 3D memory devices in FIGS. 44A and 44B, according to some aspects of the present disclosure.

As illustrated in FIG. 46A, a stack structure, such as a memory stack 4604 including interleaved conductive layers and dielectric layers, is formed on a silicon substrate 4602. To form memory stack 4604, in some implementations, a dielectric stack (not shown) including interleaved sacrificial layers (not shown) and the dielectric layers is formed on silicon substrate 4602. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, CVD, PVD, ALD, or any combination thereof. Memory stack 4604 can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that memory stack 4604 may be formed by alternatingly depositing conductive layers (e.g., doped polysilicon layers) and dielectric layers (e.g., silicon oxide layers) without the gate replacement process in some examples. In some implementations, a pad oxide layer including silicon oxide is formed between memory stack 4604 and silicon substrate 4102.

As illustrated in FIG. 41A, NAND memory strings 4606 are formed above silicon substrate 4602, each of which extends vertically through memory stack 4604 to be in contact with silicon substrate 4602. In some implementations, fabrication processes to form NAND memory string 4606 include forming a channel hole through memory stack 4604 (or the dielectric stack) and into silicon substrate 4602 using dry etching/and or wet etching, such as DRIE, followed by subsequently filling the channel hole with a plurality of layers, such as a memory film (e.g., a tunneling layer, a storage layer, and a blocking layer) and a semiconductor layer, using thin film deposition processes such as ALD, CVD, PVD, or any combination thereof. It is understood that the details of fabricating NAND memory strings 4606 may vary depending on the types of channel structures of NAND memory strings 4606 (e.g., bottom plug channel structure 812A, sidewall plug channel structure 812B, or bottom open channel structure 812C in FIGS. 8A-8C) and thus, are not elaborated for ease of description.

In some implementations, an interconnect layer is formed above the array of NAND memory strings on the first substrate. The interconnect layer can include a first plurality of interconnects in one or more ILD layers. As illustrated in FIG. 41A, an interconnect layer 4608 is formed above memory stack 4604 and NAND memory strings 4606. Interconnect layer 4608 can include interconnects of MEOL and/or BEOL in a plurality of ILD layers to make electrical connections with NAND memory strings 4606. In some implementations, interconnect layer 4608 includes multiple ILD layers and interconnects therein formed in multiple processes. For example, the interconnects in interconnect layer 4608 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 46A can be collectively referred to as interconnect layer 4608.

In some implementations, a first bonding layer is formed above interconnect layer. The first bonding layer can include a plurality of first bonding contacts. As illustrated in FIG. 46A, a bonding layer 4610 is formed above interconnect layer 4608. Bonding layer 4610 can include a plurality of bonding contacts surrounded by dielectrics. In some implementations, a dielectric layer is deposited on the top surface of interconnect layer 4608 by one or more thin film deposition processes including, but not limited to, CVD, PVD, ALD, or any combination thereof. The bonding contacts can then be formed through the dielectric layer and in contact with the interconnects in interconnect layer 4608 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

Figure 46B:
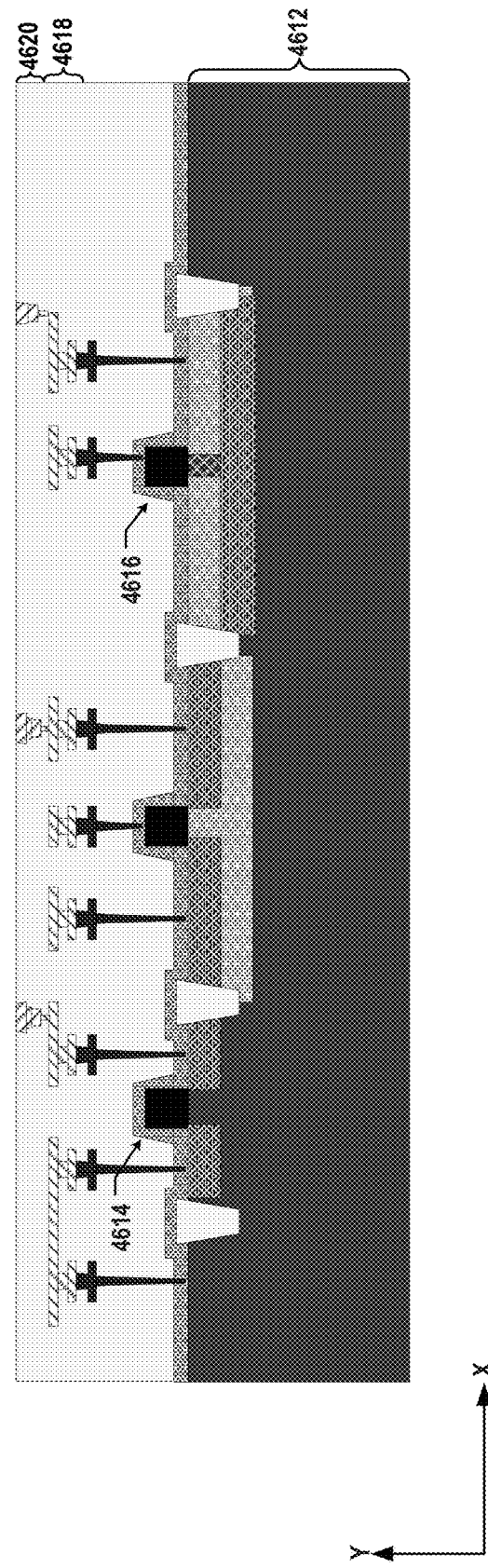

Method 4700 proceeds to operation 4704, as illustrated in FIG. 47, in which a first transistor is formed on a first side of a second substrate. The second substrate can be a silicon substrate having single crystalline silicon. As illustrated in FIG. 46B, a plurality of transistors 4614 and 4616 are formed on one side of a silicon substrate 4612. Transistors 4614 and 4616 can be formed by a plurality of processes including, but not limited to, photolithography, dry/wet etch, thin film deposition, thermal growth, implantation, CMP, and any other suitable processes. In some implementations, doped regions are formed in silicon substrate 4612 by ion implantation and/or thermal diffusion, which function, for example, as wells and source/drain regions of transistors 4614 and 4616. In some implementations, isolation regions (e.g., STIs) are also formed in silicon substrate 4612 by wet/dry etch and thin film deposition. In some implementations, the thickness of gate dielectric of transistor 4614 is different from the thickness of gate dielectric of transistor 4616, for example, by depositing a thicker silicon oxide film in the region of transistor 4614 than the region of transistor 4616, or by etching back part of the silicon oxide film deposited in the region of transistor 4616. It is understood that the details of fabricating transistors 4614 and 4616 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer is formed above the transistor on the second substrate. The interconnect layer can include a plurality of interconnects in one or more ILD layers. As illustrated in FIG. 41B, an interconnect layer 4618 can be formed above transistors 4614 and 4616. Interconnect layer 4618 can include interconnects of MEOL and/or BEOL in a plurality of ILD layers to make electrical connections with transistors 4614 and 4616. In some implementations, interconnect layer 4618 includes multiple ILD layers and interconnects therein formed in multiple processes. For example, the interconnects in interconnect layer 4618 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 46B can be collectively referred to as interconnect layer 4618.

In some implementations, a second bonding layer is formed above interconnect layer. The second bonding layer can include a plurality of second bonding contacts. As illustrated in FIG. 46B, a bonding layer 4620 is formed above interconnect layer 4618. Bonding layer 4620 can include a plurality of bonding contacts surrounded by dielectrics. In some implementations, a dielectric layer is deposited on the top surface of interconnect layer 4618 by one or more thin film deposition processes including, but not limited to, CVD, PVD, ALD, or any combination thereof. The bonding contacts can then be formed through the dielectric layer and in contact with the interconnects in interconnect layer 4618 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

Method 4700 proceeds to operation 4706, as illustrated in FIG. 47, in which the first substrate and the second substrate are bonded in a face-to-face manner. The first bonding contact in the first bonding layer can be in contact with the second bonding contact in the second bonding layer at a bonding interface after bonding the first and second substrates. The bonding can include hybrid bonding.

Figure 46C:
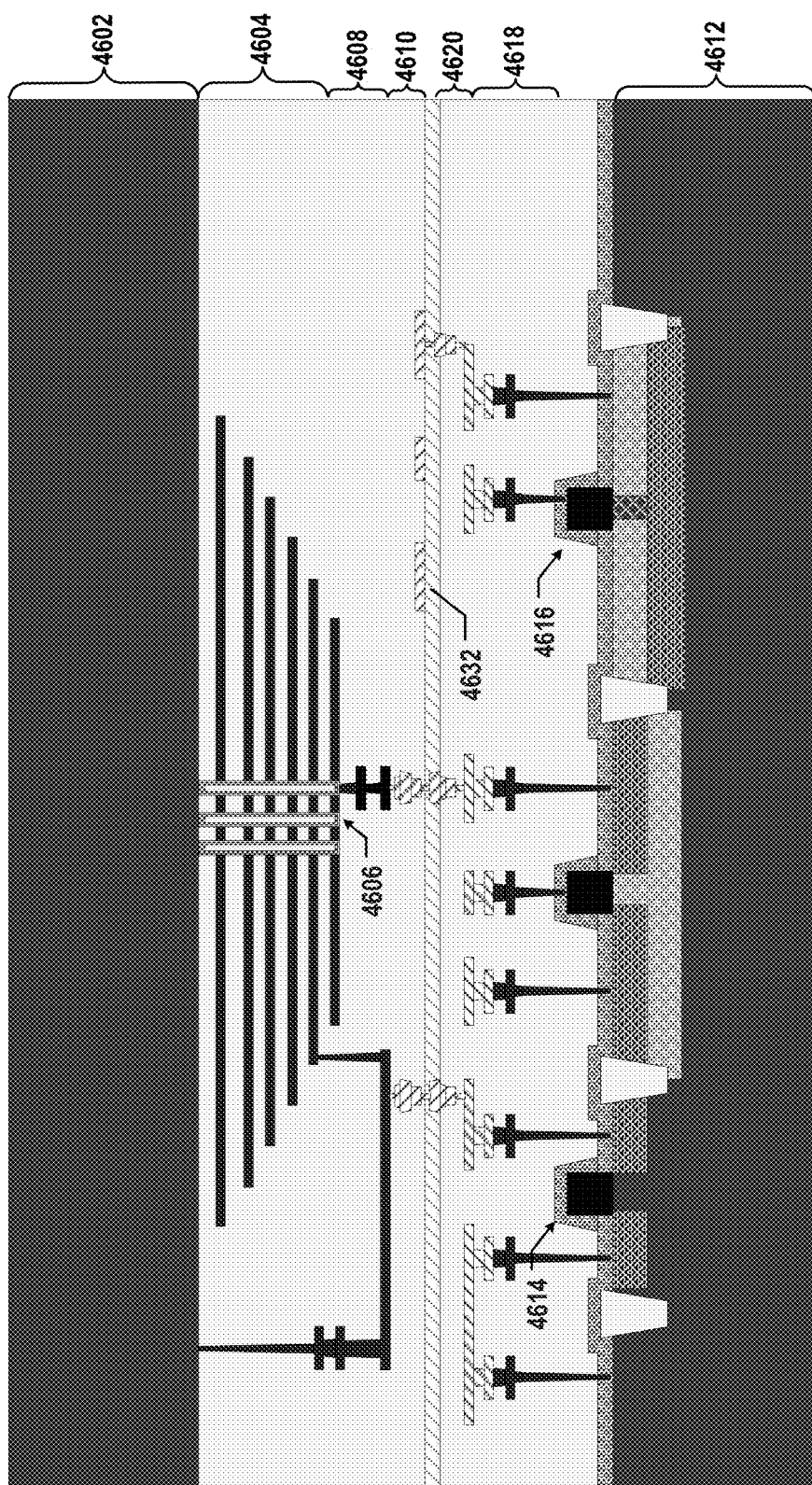

As illustrated in FIG. 46C, silicon substrate 4602 and components formed thereon (e.g., memory stack 4604 and NAND memory strings 4606) are flipped upside down. Bonding layer 4610 facing down is bonded with bonding layer 4620 facing up, i.e., in a face-to-face manner, thereby forming a bonding interface 4632. That is, silicon substrate 4602 and components formed thereon can be bonded with silicon substrate 4612 and components formed thereon in a face-to-face manner, such that the bonding contacts in bonding layer 4610 are in contact with the bonding contacts in bonding layer 4620 at bonding interface 4632. In some implementations, a treatment process, e.g., plasma treatment, wet treatment and/or thermal treatment, is applied to bonding surfaces prior to bonding. Although not shown in FIG. 46C, it is understood that in some examples, silicon substrate 4612 and components formed thereon (e.g., transistors 4614 and 4616) can be flipped upside down, and bonding layer 4620 facing down can be bonded with bonding layer 4610 facing up, i.e., in a face-to-face manner, thereby forming bonding interface 4632 as well.

As a result of the bonding, e.g., hybrid bonding, the bonding contacts on opposite sides of bonding interface 4632 can be inter-mixed. After the bonding, the bonding contacts in bonding layer 4610 and the bonding contacts in bonding layer 4620 are aligned and in contact with one another, such that memory stack 4604 and NAND memory strings 4606 formed therethrough can be coupled to transistors 4614 and 4616 through the bonded bonding contacts across bonding interface 4632, according to some implementations.

Figure 46D:
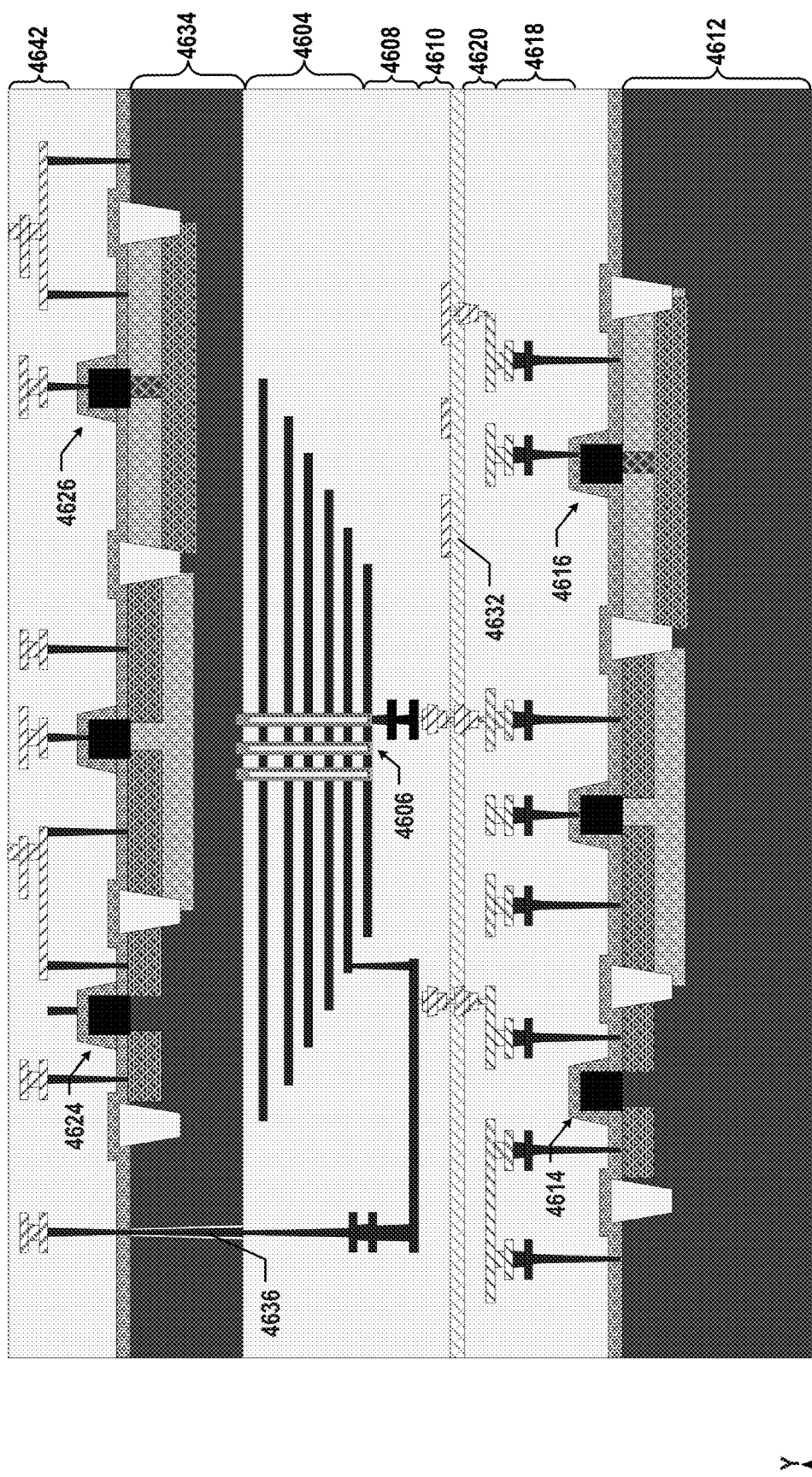

In some implementations, the first substrate is thinned after the bonding from the second side opposite to the first side. As illustrated in FIG. 46D, silicon substrate 4602 (shown in FIG. 46C) is thinned from another side opposite to the side on which transistors 4614 and 4616 are formed to become a semiconductor layer 4634 having single crystalline silicon. Silicon substrate 4602 can be thinned by processes including, but not limited to, wafer grinding, dry etch, wet etch, CMP, any other suitable processes, or any combination thereof.

Method 4700 proceeds to operation 4708, as illustrated in FIG. 43, in which a second transistor is formed on a second side of the first substrate opposite to the first side. As illustrated in FIG. 46D, a plurality of transistors 4624 and 4626 are formed on the other side of thinned silicon substrate 4602 (i.e., semiconductor layer 4634) opposite to the side on which transistors 4614 and 4616 are formed. Transistors 4624 and 4626 can be formed by a plurality of processes including, but not limited to, photolithography, dry/wet etch, thin film deposition, thermal growth, implantation, CMP, and any other suitable processes. In some implementations, doped regions are formed on the other side of semiconductor layer 4634 by ion implantation and/or thermal diffusion, which function, for example, as wells and source/drain regions of transistors 4624 and 4626. In some implementations, isolation regions (e.g., STIs) are also formed on the other side of semiconductor layer 4634 by wet/dry etch and thin film deposition. In some implementations, the thickness of gate dielectric of transistor 4624 is different from the thickness of gate dielectric of transistor 4626, for example, by depositing a thicker silicon oxide film in the region of transistor 4624 than the region of transistor 4626, or by etching back part of the silicon oxide film deposited in the region of transistor 4626. It is understood that the details of fabricating transistors 4624 and 4626 may vary depending on the types of the transistors (e.g., planar transistors 500 or 3D transistors 600 in FIGS. 5A, 5B, 6A, and 6B) and thus, are not elaborated for ease of description.

In some implementations, an interconnect layer is formed above the transistor. The interconnect layer can include a plurality of interconnects in one or more ILD layers. As illustrated in FIG. 46D, an interconnect layer 4642 can be formed above transistors 4624 and 4626. Interconnect layer 4642 can include interconnects of MEOL and/or BEOL in a plurality of ILD layers to make electrical connections with transistors 4624 and 4626. In some implementations, interconnect layer 4642 includes multiple ILD layers and interconnects therein formed in multiple processes. For example, the interconnects in interconnect layer 4642 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 46D can be collectively referred to as interconnect layer 4642.

In some implementations, the interconnects in interconnect layer 4642 include Cu, which has a relatively low resistivity among conductive metal materials. It is understood that although Cu has a relatively low thermal budget (incompatible with high-temperature processes), using Cu as the conductive materials of the interconnects in interconnect layer 4642 may become feasible since there are no more high-temperature processes after the fabrication of interconnect layer 4642.

In some implementations, a contact through the thinned first substrate is formed. As illustrated in FIG. 46D, one or more contacts 4636 each extending vertically through semiconductor layer 4634 (i.e., the thinned silicon substrate 4602) are formed. Contacts 4636 can couple the interconnects in interconnect layer 4608 and the interconnects in interconnect layer 4642. Contact 4636 can be formed by first patterning contact holes through semiconductor layer 4634 using patterning process (e.g., photolithography and dry/wet etch of dielectric materials in the dielectric layer). The contact holes can be filled with a conductor (e.g., W or Cu). In some implementations, filling the contact holes includes depositing a spacer (e.g., a silicon oxide layer) before depositing the conductor.

Figure 46E:
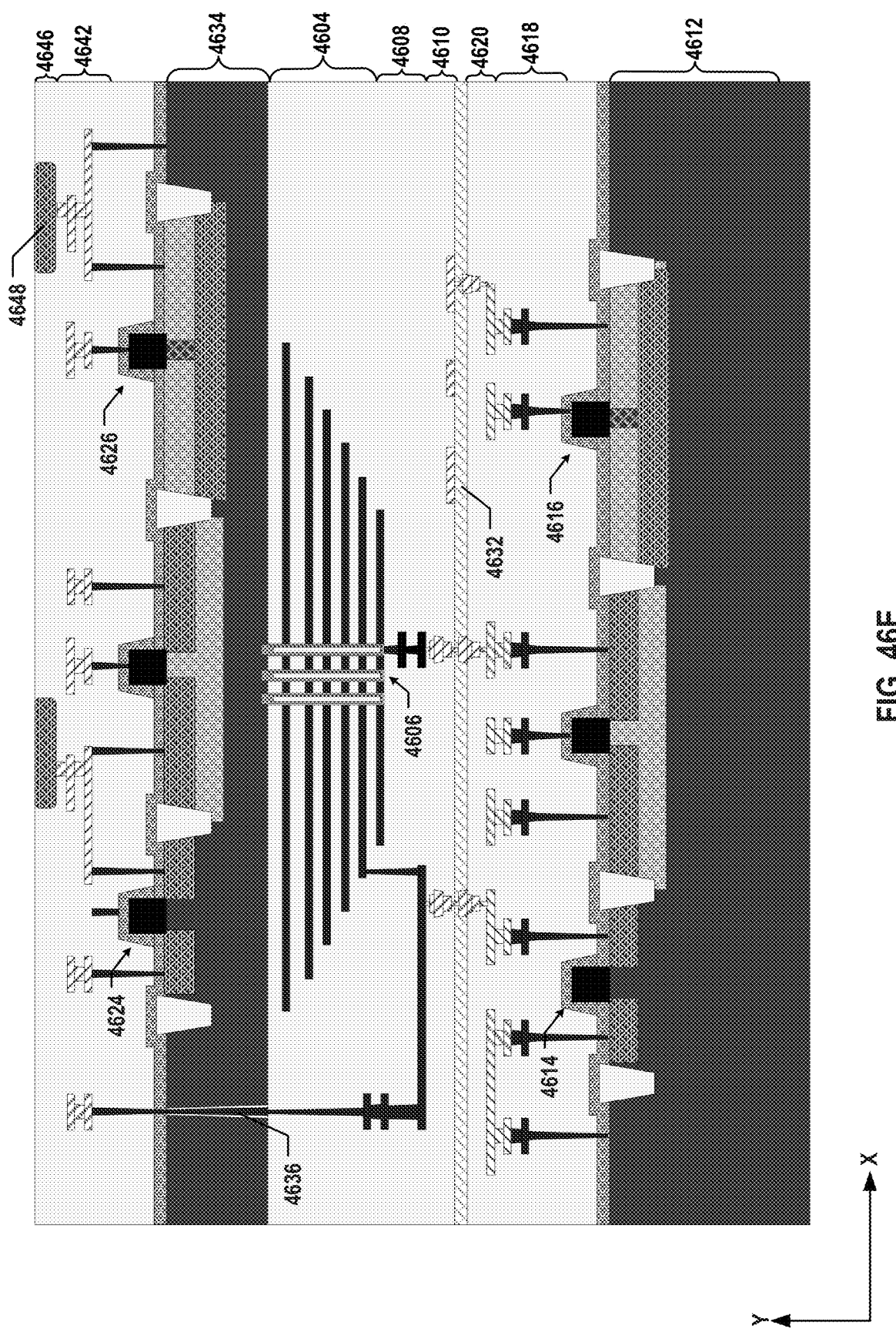

Method 4700 proceeds to operation 4710, as illustrated in FIG. 47, in which a pad-out interconnect layer is formed. The pad-out interconnect layer can be formed above the second transistor. As illustrated in FIG. 46E, a pad-out interconnect layer 4646 is formed above interconnect layer 4642 and transistors 4626 and 4624 on semiconductor layer 4634. Pad-out interconnect layer 4646 can include interconnects, such as contact pads 4648, formed in one or more ILD layers. Contact pads 4648 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof.

It is understood that in some examples, the sequence of operation 4706 and 4708 in method 4700 may be switched. In some implementations, after operation 4704, method 4700 skips operation 4706 and proceeds to operation 4708, as illustrated in FIG. 47, in which a second transistor is formed on a second side of the first substrate opposite to the first side. After operation 4708, method 4700 returns to operation 4706, as illustrated in FIG. 47, in which the first substrate and the second substrate are bonded in a face-to-face manner.

Figure 46F:
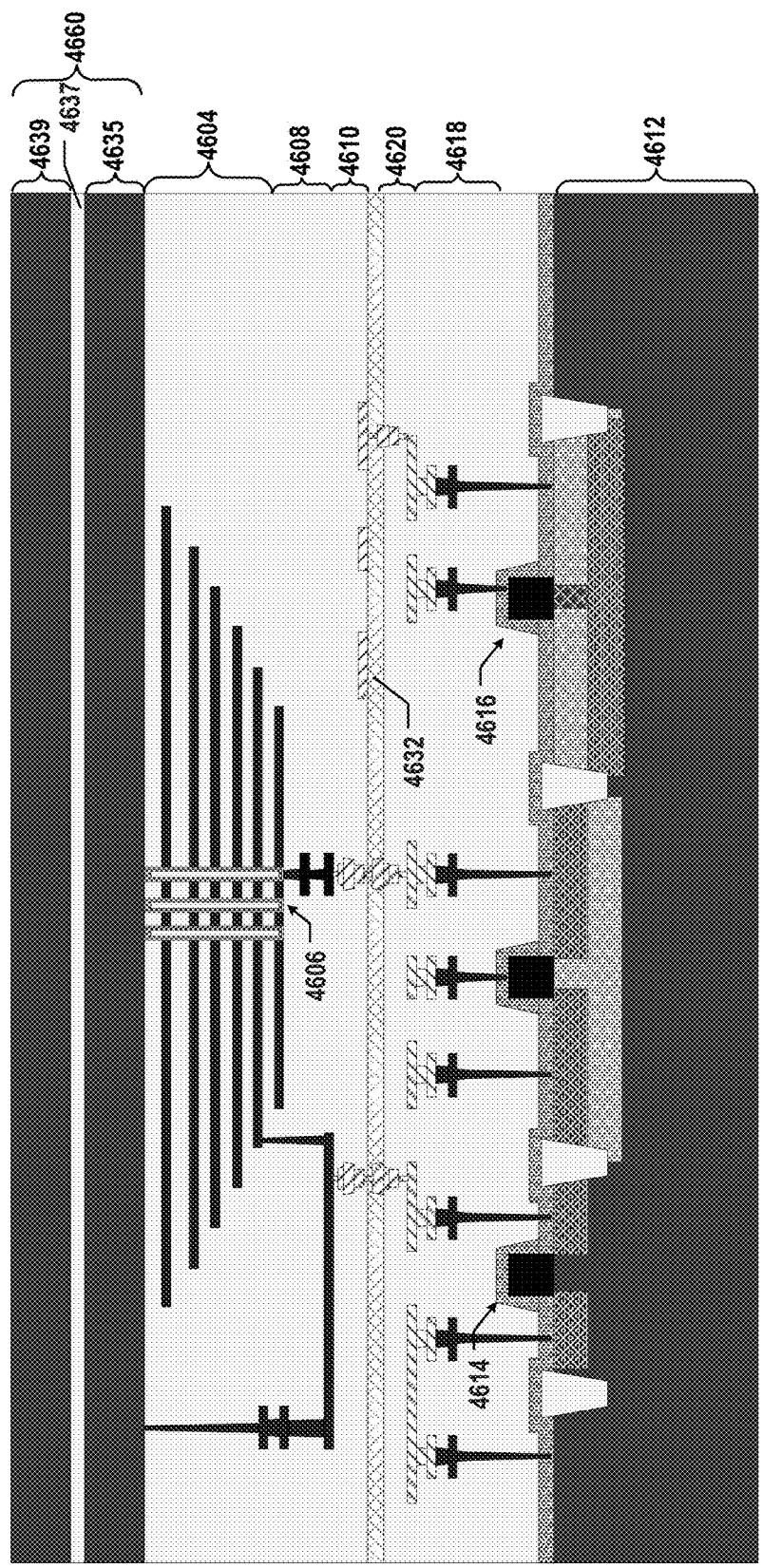
Figure 46G:
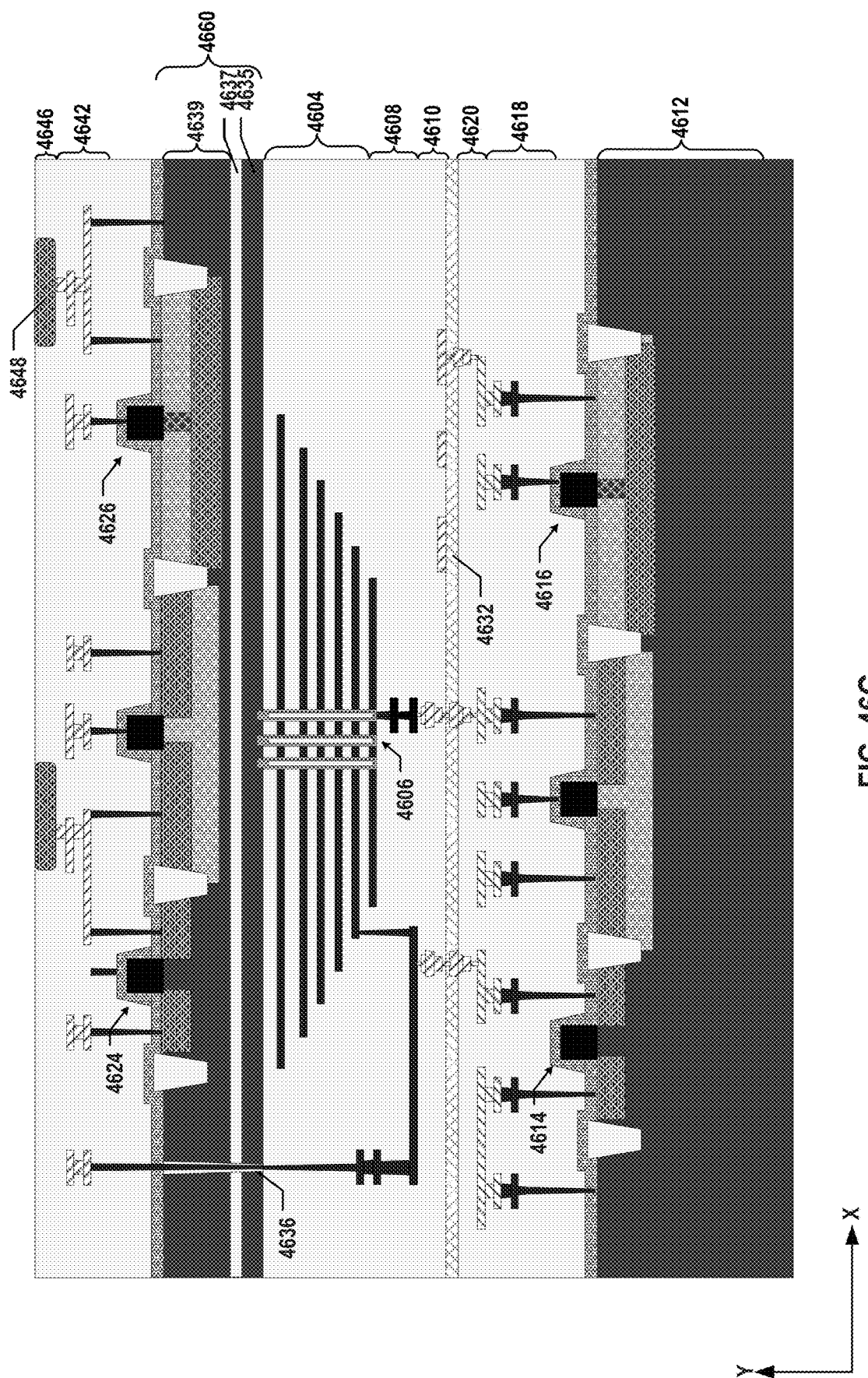

In some implementations, to form 3D memory device 4501 in FIG. 45B, after bonding the first and second substrates in a face-to-face manner at operation 4706, a semiconductor layer including a dielectric layer vertically between two semiconductor sublayers is formed to replace the first substrate, such that at operation 4708, the second transistor is formed on the semiconductor layer, as opposed to the first substrate. As illustrated in FIG. 46F, silicon substrate 4602 (shown in FIG. 46C) is replaced by a semiconductor layer 4660 having a first sublayer 4635, a dielectric layer 4637, and a second sublayer 4639. In some implementations, sublayer 4635 is formed by thinning silicon substrate 4602 and thus have the same material as silicon substrate 4602, i.e., single crystalline silicon. In some implementations, sublayer 4635 is formed by removing silicon substrate 4602 and depositing another layer of semiconductor material, such as polysilicon, in contact with the sources of NAND memory strings 4606. Dielectric layer 4637 can be formed by depositing a layer of dielectric material, such as silicon oxide, on sublayer 4635 or by oxidizing part of sublayer 4635 (e.g., having single crystalline silicon). Sublayer 4639 can be formed on dielectric layer 4637 using transfer bonding as described above in detail. It is understood that in some examples, dielectric layer 4637 and sublayer 4639 may be transferred together and bonded onto sublayer 4635 by transfer bonding. As illustrated in FIG. 46G, transistors 4624 and 4626 can be formed on sublayer 4639 of semiconductor layer 4660 using the similar processes as described above in detail. Contacts 4636 can be formed to extend vertically through sublayers 4639, dielectric layer 4637, and sublayer 4635 of semiconductor layer 4660 to be coupled to the interconnects of interconnect layer 4608.

Figure 50:
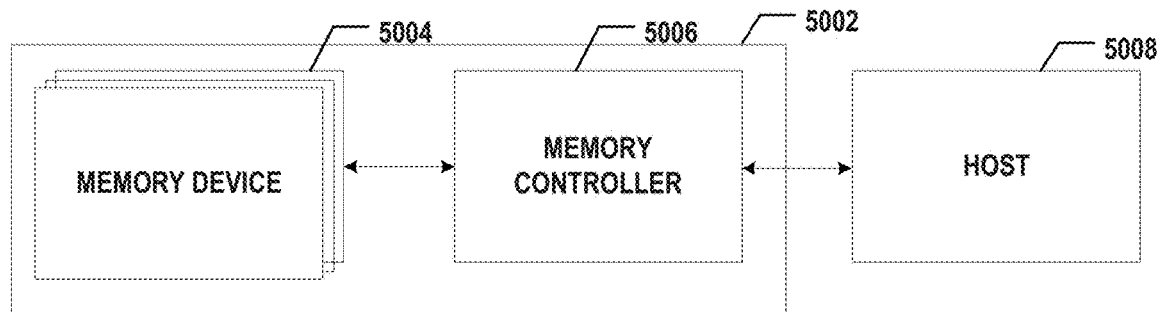
FIG. 50 illustrates a block diagram of an exemplary system having a memory device, according to some aspects of the present disclosure.

FIG. 50 illustrates a block diagram of a system 5000 having a memory device, according to some aspects of the present disclosure. System 5000 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 50, system 5000 can include a host 5008 and a memory system 5002 having one or more memory devices 5004 and a memory controller 5006. Host 5008 can be a processor of an electronic device, such as a central processing unit (CPU), or a system-on-chip (SoC), such as an application processor (AP). Host 5008 can be configured to send or receive the data to or from memory devices 5004.

Memory device 5004 can be any memory devices disclosed herein, such as 3D memory devices 100, 101, 120, and 121. In some implementations, each memory device 5004 includes an array of memory cells, a first peripheral circuit of the array of memory cells, and a second peripheral circuit of the array of memory cells, which are stacked over one another in different planes, as described above in detail.

Memory controller 5006 is coupled to memory device 5004 and host 5008 and is configured to control memory device 5004, according to some implementations. Memory controller 5006 can manage the data stored in memory device 5004 and communicate with host 5008. In some implementations, memory controller 5006 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 5006 is designed for operating in a high duty-cycle environment SSDs or embedded multi-media-cards (eMMCs) used as data storage for mobile devices, such as smartphones, tablets, laptop computers, etc., and enterprise storage arrays. Memory controller 5006 can be configured to control operations of memory device 5004, such as read, erase, and program operations. In some implementations, memory controller 5006 is configured to control the array of memory cells through the first peripheral circuit and the second peripheral circuit. Memory controller 5006 can also be configured to manage various functions with respect to the data stored or to be stored in memory device 5004 including, but not limited to bad-block management, garbage collection, logical-to-physical address conversion, wear leveling, etc. In some implementations, memory controller 5006 is further configured to process error correction codes (ECCs) with respect to the data read from or written to memory device 5004. Any other suitable functions may be performed by memory controller 5006 as well, for example, formatting memory device 5004. Memory controller 5006 can communicate with an external device (e.g., host 5008) according to a particular communication protocol. For example, memory controller 5006 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 51A:
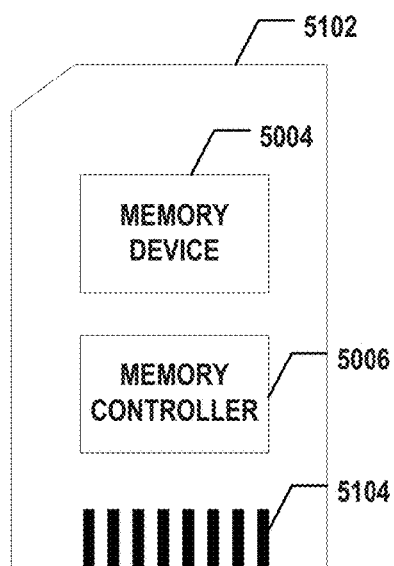
FIG. 51A illustrates a diagram of an exemplary memory card having a memory device, according to some aspects of the present disclosure.
Figure 51B:
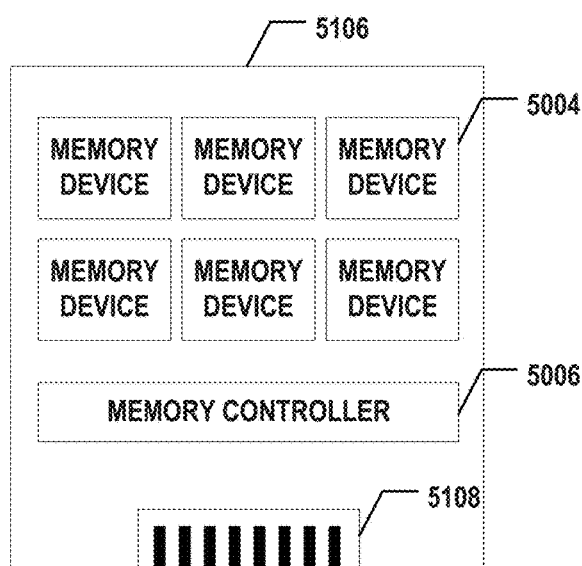
FIG. 51B illustrates a diagram of an exemplary solid-state drive (SSD) having a memory device, according to some aspects of the present disclosure.

Memory controller 5006 and one or more memory devices 5004 can be integrated into various types of storage devices, for example, be included in the same package, such as a universal Flash storage (UFS) package or an eMMC package. That is, memory system 5002 can be implemented and packaged into different types of end electronic products. In one example as shown in FIG. 51A, memory controller 5006 and a single memory device 5004 may be integrated into a memory card 5102. Memory card 5102 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 5102 can further include a memory card connector 5104 coupling memory card 5102 with a host (e.g., host 5008 in FIG. 50). In another example as shown in FIG. 51B, memory controller 5006 and multiple memory devices 5004 may be integrated into an SSD 5106. SSD 5106 can further include an SSD connector 5108 coupling SSD 5106 with a host (e.g., host 5008 in FIG. 50). In some implementations, the storage capacity and/or the operation speed of SSD 5106 is greater than those of memory card 5102.

According to one aspect of the present disclosure, a 3D memory device includes a first semiconductor structure, a second semiconductor structure, a third semiconductor structure, a first bonding interface between the first semiconductor structure and the second semiconductor structure, and a second bonding interface between the second semiconductor structure and the third semiconductor structure. The first semiconductor structure includes an array of NAND memory strings and a first semiconductor layer in contact with sources of the array of NAND memory strings. The second semiconductor structure includes a first peripheral circuit of the array of NAND memory strings including a first transistor, and a second semiconductor layer in contact with the first transistor. A third semiconductor structure includes a second peripheral circuit of the array of NAND memory strings including a second transistor, and a third semiconductor layer in contact with the second transistor. The first peripheral circuit is between the first bonding interface and the second semiconductor layer. The third semiconductor layer is between the second peripheral circuit and the second bonding interface.

In some implementations, the first semiconductor layer includes single crystalline silicon.

In some implementations, the first semiconductor layer includes polysilicon.

In some implementations, the second semiconductor structure further includes a handle substrate on a side of the second semiconductor structure away from the first semiconductor structure.

In some implementations, a thickness of the second semiconductor layer is greater than a thickness of the third semiconductor layer.

In some implementations, the first transistor includes a first gate dielectric, the second transistor includes a second gate dielectric, and a thickness of the first gate dielectric is greater than a thickness of the second gate dielectric.

In some implementations, a difference between the thicknesses of the first and second gate dielectrics is at least 5-fold.

In some implementations, the second semiconductor structure further includes a third peripheral circuit of the array of NAND memory strings, and the third peripheral circuit includes a third transistor including a third gate dielectric. In some implementations, the third semiconductor structure further includes a fourth peripheral circuit of the array of NAND memory strings, and the fourth peripheral circuit including a fourth transistor including a fourth gate dielectric. In some implementations, the third and fourth gate dielectrics have a same thickness.

In some implementations, the thickness of the third and fourth gate dielectrics is between the thicknesses of the first and second gate dielectrics.

In some implementations, the third and fourth peripheral circuits include at least one of a page buffer circuit or a logic circuit.

In some implementations, the second semiconductor structure further includes a first interconnect layer including a first interconnect coupled to the first transistor and between the first bonding interface and the first peripheral circuit. In some implementations, the third semiconductor structure further includes a second interconnect layer including a second interconnect coupled to the second transistor such that the second peripheral circuit is between the second bonding interface and the second interconnect layer.

In some implementations, the second interconnect includes copper, and the first interconnect includes tungsten.

In some implementations, the second semiconductor structure further includes a first contact through the second semiconductor layer, and the third semiconductor structure further includes a second contact through the third semiconductor layer and coupled to the first contact.

In some implementations, the second contact includes copper, and the first contact includes tungsten.

In some implementations, the third semiconductor structure further includes a pad-out interconnect layer such that the second peripheral circuit is between the pad-out interconnect layer and the third semiconductor layer.

In some implementations, the second peripheral circuit includes an I/O circuit, and the first peripheral circuit includes a driving circuit.

In some implementations, the 3D memory device further includes a first voltage source coupled to the first peripheral circuit and configured to provide a first voltage to the first peripheral circuit, and a second voltage source coupled to the second peripheral circuit and configured to provide a second voltage to the second peripheral circuit. In some implementations, the first voltage is greater than the second voltage.

In some implementations, the first semiconductor structure further includes a first bonding layer at the first bonding interface and comprising a first bonding contact, the second semiconductor structure further includes a second bonding layer at the first bonding interface and comprising a second bonding contact, and the first bonding contact is in contact with the second bonding contact at the first bonding interface.

In some implementations, the array of NAND memory strings is between the first bonding interface and the first semiconductor layer.

According to another aspect of the present disclosure, a system includes a memory device configured to store data. The memory device includes a first semiconductor structure, a second semiconductor structure, a third semiconductor structure, a first bonding interface between the first semiconductor structure and the second semiconductor structure, and a second bonding interface between the second semiconductor structure and the third semiconductor structure. The first semiconductor structure includes an array of NAND memory strings and a first semiconductor layer in contact with sources of the array of NAND memory strings. The second semiconductor structure includes a first peripheral circuit of the array of NAND memory strings including a first transistor, and a second semiconductor layer in contact with the first transistor. A third semiconductor structure includes a second peripheral circuit of the array of NAND memory strings including a second transistor, and a third semiconductor layer in contact with the second transistor. The first peripheral circuit is between the first bonding interface and the second semiconductor layer. The third semiconductor layer is between the second peripheral circuit and the second bonding interface. The system also includes a memory controller coupled to the memory device and configured to control the array of memory cells through the first peripheral circuit and the second peripheral circuit.

According to still another aspect of the present disclosure, a method for forming a 3D memory device is disclosed. An array of NAND memory strings is formed on a first substrate. A first transistor is formed on a second substrate. A second transistor is formed on a third substrate. The first substrate and second substrate are bonded in a face-to-face manner. The third substrate and the second substrate are bonded in a back-to-back manner.

In some implementations, a pad-out interconnect layer is formed above the second transistor after bonding the third and second substrates.

In some implementations, the first substrate is thinned after bonding the third and second substrates, and a pad-out interconnect layer is formed above the array of NAND memory strings.

In some implementations, the first substrate is replaced with a polysilicon layer after bonding the first and second substrates and bonding the third and second substrates, and a pad-out interconnect layer is formed on the polysilicon layer.

In some implementations, bonding the first and second substrates includes hybrid bonding.

In some implementations, a first bonding layer including a first bonding contact is formed above the array of NAND memory strings on the first substrate, a second bonding layer including a second bonding contact is formed above the first transistor on the second substrate, and the first bonding contact is in contact with the second bonding contact at a first bonding interface after bonding the first and second substrates.

In some implementations, the second substrate is thinned before bonding the third and second substrates, and a first contact is formed through the thinned second substrate.

In some implementations, the third substrate is thinned before bonding the third and second substrates, and a second contact is formed through the thinned third substrate, such that the second contact is coupled to the first contact after bonding the thinned third and second substrates.

In some implementations, to form the first transistor, a first gate dielectric is formed, to form the second transistor, a second gate dielectric is formed, and a thickness of the first gate dielectric is greater than a thickness of the second gate dielectric.

In some implementations, bonding the first substrate and second substrate is before bonding the third substrate and the second substrate.

In some implementations, bonding the first substrate and second substrate is after bonding the third substrate and the second substrate.

According to yet another aspect of the present disclosure, a method for forming a 3D memory device is disclosed. An array of NAND memory strings is formed on a first substrate. A first transistor is formed on a first side of a second substrate. A semiconductor layer is formed on a second side of the second substrate opposite to the first side. The semiconductor layer includes single crystalline silicon. A second transistor is formed on the semiconductor layer. The first substrate and the second substrate are bonded in a face-to-face manner.

In some implementations, a pad-out interconnect layer is formed above the second transistor after bonding the first and second substrates.

In some implementations, the first substrate is thinned after bonding the first and second substrates, and a pad-out interconnect layer is formed above the array of NAND memory strings.

In some implementations, bonding the first and second substrates includes hybrid bonding.

In some implementations, a first bonding layer including a first bonding contact is formed above the array of NAND memory strings on the first substrate, a second bonding layer including a second bonding contact is formed above the first transistor, and the first bonding contact is in contact with the second bonding contact at a bonding interface after bonding the first and second substrates.

In some implementations, the second substrate is thinned prior to forming the semiconductor layer, a first contact is formed through the thinned second substrate, and a second contact is formed through the semiconductor layer and coupled to the first contact.

In some implementations, to form the second semiconductor layer, a third substrate and the second substrate are bonded, and the third substrate is thinned to leave the second semiconductor layer.

In some implementations, bonding the third and second substrates includes transfers bonding.

In some implementations, to form the first transistor, a first gate dielectric is formed, to form the second transistor, a second gate dielectric is formed, and a thickness of the first gate dielectric is greater than a thickness of the second gate dielectric.

In some implementations, the first and second substrates are bonded prior to forming the semiconductor layer on the second side of the second substrate.

In some implementations, the first and second substrates are bonded after forming the second transistor.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:
a first semiconductor structure comprising:
an array of NAND memory strings; and
a first semiconductor layer in contact with sources of the array of NAND memory strings;
a second semiconductor structure comprising:
a third peripheral circuit of the array of NAND memory strings, the third peripheral circuit comprising a third transistor; and
a second semiconductor layer in contact with the third transistor;
a third semiconductor structure comprising:
a second peripheral circuit of the array of NAND memory strings, the second peripheral circuit comprising a second transistor; and
a third semiconductor layer in contact with the second transistor;
a first bonding interface between the first semiconductor structure and the second semiconductor structure, wherein the third peripheral circuit is between the first bonding interface and the second semiconductor layer; and
a second bonding interface between the second semiconductor structure and the third semiconductor structure, wherein the third semiconductor layer is between the second peripheral circuit and the second bonding interface.

2. The 3D memory device of claim 1, wherein the first semiconductor layer comprises single crystalline silicon.

3. The 3D memory device of claim 1, wherein the first semiconductor layer comprises polysilicon.

4. The 3D memory device of claim 3, wherein the second semiconductor structure further comprises a handle substrate on a side of the second semiconductor structure away from the first semiconductor structure.

5. The 3D memory device of claim 1, wherein a thickness of the second semiconductor layer is greater than a thickness of the third semiconductor layer.

6. The 3D memory device of claim 1, wherein
the third transistor comprises a third gate dielectric;
the second transistor comprises a second gate dielectric; and
a thickness of the third gate dielectric is greater than a thickness of the second gate dielectric.

7. The 3D memory device of claim 6, wherein a difference between the thicknesses of the third and second gate dielectrics is at least 5-fold.

8. The 3D memory device of claim 6, wherein
the second semiconductor structure further comprises a fourth peripheral circuit of the array of NAND memory strings, the fourth peripheral circuit comprising a fourth transistor comprising a third gate dielectric;
the third semiconductor structure further comprises a first peripheral circuit of the array of NAND memory strings, the first peripheral circuit comprising a first transistor comprising a first gate dielectric; and
the first and fourth gate dielectrics have a same thickness.

9. The 3D memory device of claim 8, wherein the thickness of the first and fourth gate dielectrics is between the thicknesses of the third and second gate dielectrics.

10. The 3D memory device of claim 8, wherein the first and fourth peripheral circuits comprise at least one of a page buffer circuit or a logic circuit.

11. The 3D memory device of claim 1, wherein
the second semiconductor structure further comprises a first interconnect layer between the first bonding interface and the third peripheral circuit, the first interconnect layer comprising a first interconnect coupled to the third transistor; and
the third semiconductor structure further comprises a second interconnect layer such that the second peripheral circuit is between the second bonding interface and the second interconnect layer, the second interconnect layer comprising a second interconnect coupled to the second transistor.

12. The 3D memory device of claim 11, wherein the second interconnect comprises copper, and the first interconnect comprises tungsten.

13. The 3D memory device of claim 1, wherein
the second semiconductor structure further comprises a first contact through the second semiconductor layer; and
the third semiconductor structure further comprises a second contact through the third semiconductor layer and coupled to the first contact.

14. The 3D memory device of claim 1, wherein the third semiconductor structure further comprises a pad-out interconnect layer such that the second peripheral circuit is between the pad-out interconnect layer and the third semiconductor layer.

15. The 3D memory device of claim 1, wherein the second peripheral circuit comprises an input/output (I/O) circuit, and the third peripheral circuit comprises a driving circuit.

16. The 3D memory device of claim 1, further comprising:
a third voltage source coupled to the third peripheral circuit and configured to provide a third voltage to the first peripheral circuit; and
a second voltage source coupled to the second peripheral circuit and configured to provide a second voltage to the second peripheral circuit,
wherein the third voltage is greater than the second voltage.

17. The 3D memory device of claim 1, wherein
the first semiconductor structure further comprises a first bonding layer at the first bonding interface and comprising a first bonding contact;
the second semiconductor structure further comprises a second bonding layer at the first bonding interface and comprising a second bonding contact; and
the first bonding contact is in contact with the second bonding contact at the first bonding interface.

18. The 3D memory device of claim 1, wherein the array of NAND memory strings is between the first bonding interface and the first semiconductor layer.

19. A three-dimensional (3D) memory device, comprising:
a first semiconductor structure comprising:
an array of NAND memory strings, and
a first semiconductor layer in contact with ends of the array of NAND memory strings;
a second semiconductor structure comprising:
a third peripheral circuit of the array of NAND memory strings comprising third transistors, and
a second semiconductor layer in contact with the third transistors; and
a third semiconductor structure comprising:
a second peripheral circuit of the array of NAND memory strings comprising second transistors, and
a third semiconductor layer in contact with the second transistors,
wherein the first semiconductor structure, the second semiconductor structure and the third semiconductor structure are stacked in a vertical direction, and
the second semiconductor layer and the third semiconductor layer are between the third peripheral circuit and the second peripheral circuit.

20. The 3D memory device of claim 19, wherein the second semiconductor layer and the third semiconductor layer are separated from each other by a bonding interface.

* * * * *